US006753253B1

(12) United States Patent
Takahashi et al.

(10) Patent No.: US 6,753,253 B1
(45) **Date of Patent: *Jun. 22, 2004**

(54) METHOD OF MAKING WIRING AND LOGIC CORRECTIONS ON A SEMICONDUCTOR DEVICE BY USE OF FOCUSED ION BEAMS

(75) Inventors: Takahiko Takahashi, Iruma (JP); Fumikazu Itoh, Fujisawa (JP); Akira Shimase, Yokohama (JP); Mikio Hongo, Yokohama (JP); Satoshi Haraichi, Yokohama (JP); Hiroshi Yamaguchi, Fujisawa (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 07/584,180

(22) Filed: Sep. 18, 1990

Related U.S. Application Data

(62) Division of application No. 07/448,912, filed on Dec. 12, 1989, now abandoned, which is a division of application No. 07/406,959, filed on Sep. 12, 1989, now abandoned, and a division of application No. 07/389,875, filed on Aug. 4, 1989, now abandoned, and a division of application No. 07/205,061, filed on Jun. 8, 1988, now abandoned, and a division of application No. 07/134,460, filed on Dec. 17, 1997, now Pat. No. 4,900,695.

(30) Foreign Application Priority Data

| | | |
|---|---|---|
| Jun. 18, 1986 | (JP) | 61-140055 |
| Dec. 17, 1986 | (JP) | 61-298731 |
| Dec. 22, 1986 | (JP) | 61-303719 |
| Jun. 10, 1987 | (JP) | 62-143065 |
| Jul. 21, 1987 | (JP) | 62-181460 |
| Jul. 29, 1987 | (JP) | 62-187507 |
| Aug. 31, 1987 | (JP) | 62-217030 |
| Aug. 10, 1988 | (JP) | 63-199686 |
| Sep. 19, 1988 | (JP) | 63-235587 |
| Sep. 20, 1988 | (JP) | 63-236158 |
| Feb. 16, 1989 | (JP) | 1-37048 |
| Jun. 2, 1989 | (JP) | 1-140740 |
| Jun. 19, 1989 | (JP) | 1-156168 |
| Jun. 21, 1989 | (JP) | 1-156803 |
| Jun. 23, 1989 | (JP) | 1-159582 |
| Jun. 23, 1989 | (JP) | 1-161730 |
| Jul. 4, 1989 | (JP) | 1-172733 |

(51) Int. Cl.[7] ........ H01L 21/44
(52) U.S. Cl. ........ 438/676; 438/940
(58) Field of Search ........ 438/625, 637, 438/641, 676, 940

(56) References Cited

U.S. PATENT DOCUMENTS

| | | | | |
|---|---|---|---|---|
| 4,609,809 A | * | 9/1986 | Yamaguchi et al. | 204/192.34 |
| 4,675,979 A | * | 6/1987 | Lade et al. | 457/195 |
| 4,868,068 A | * | 9/1989 | Yamaguchi et al. | 437/192 |
| 4,900,675 A | * | 2/1990 | Takahashi et al. | 437/195 |

FOREIGN PATENT DOCUMENTS

| | | | |
|---|---|---|---|
| JP | 0062751 | * | 5/1980 |
| JP | 0202038 | * | 11/1983 |
| JP | 0136315 | * | 12/1983 |
| JP | 0066124 | * | 4/1984 |
| JP | 0163505 | * | 9/1984 |
| JP | 0168652 | * | 9/1984 |
| JP | 59-163505 | | 9/1984 |
| JP | 0208830 | * | 11/1984 |
| JP | 0126834 | * | 7/1985 |
| JP | 0220330 | * | 9/1986 |
| JP | 0224319 | * | 10/1986 |
| JP | 0281447 | * | 12/1986 |
| JP | 0005548 | * | 1/1987 |
| JP | 0015833 | * | 1/1987 |
| JP | 0075533 | * | 4/1987 |
| JP | 0084518 | * | 4/1987 |
| WO | PCT/US/84/01106 | | 7/1984 |

OTHER PUBLICATIONS

Sze, S.M., VLSI Technology, pp. 93–94, 359–361; 1983.*

Wolf, S., Silicon Processing For the VLSI era, pp. 113–119, 174–175; 1986.*

McIngailis et al., "The Focused ion beam as an integrated circuit restructuring tool", J. Vac. Sci Tech. B4 (1), Jan./Feb. 1986, pp. 176–180.*

"Semiconductor World", May 9, 1989, pp. 163–173.
"Electronic Materials, extra issue of 1988", pp. 94–99.
"Clean Room Handbook", pp. 77–108, 1–89.

* cited by examiner

*Primary Examiner*—Chandra Chaudhari
(74) *Attorney, Agent, or Firm*—Antonelli, Terry Stout & Kraus

(57) ABSTRACT

Herein disclosed are a variety of techniques relating to the wiring and logic corrections on a chip by making use of the focused ion beam (which is shortly referred to as "FIB") or the laser selection metal CVD. The time periods for the wiring corrections and for debugging and developing an electronic system are shortened by making use of the processing characteristics of the FIB. Illustratively, a hole is bored in an insulating film above a portion of a wiring which is to be connected to another wiring by means of a focused ion beam. The inside of the hole and a predetermined region on the insulating film are irradiated with either a laser beam or an ion beam in a metal compound gas to deposit metal in the hole and on said region and a connecting wiring is formed by means of optically pumped CVD. The present invention also relates to an IC or VLSI structure having a trial cutting region, at test etching region and an auxiliary wiring or pad, suitable for the application of such defect correction and circuit change, as well as a method of making same, a designing method using such technique, and a focused ion beam system and other systems for use in those methods.

19 Claims, 225 Drawing Sheets

FIG. 9A

| SORTS | POLICIES | CONTENTS | REASONS |
|---|---|---|---|
| CUTTING | POLICY 1 | CUT AN INTERCONNECTION LINE IN AN AL-4 POWER SOURCE SPACE AS FAR AS POSSIBLE | THE VERTICAL WIRING SHORT-CIRCUIT BETWEEN THE PROCESSED LINE AND AN AL-4 POWER SOURCE IS PREVENTED |
| | POLICY 2 | IN CASE OF CUTTING AN INTERCONNECTION LINE DIRECTLY UNDER THE AL-4 POWER SOURCE, SEEK AN AL-2 INTERCONNECTION LINE RATHER THAN AN AL-3 ONE | THE VERTICAL WIRING SHORT-CIRCUIT BETWEEN THE PROCESSED LINE AND AN AL-4 POWER SOURCE IS PREVENTED |
| | POLICY 3 | IN CASE OF CUTTING THE AL-3 INTERCONNECTION LINE DIRECTLY UNDER THE AL-4 POWER SOURCE, SEEK THE FLAT PLACE OF AN UNDERLYING FILM | THE VERTICAL WIRING SHORT-CIRCUIT BETWEEN THE AL-3 LINE AND THE UNDERLYING AL-2 LINE IS PREVENTED |
| CONNECTION | POLICY 4 | CONNECT LINES IN THE AL-4 POWER SOURCE SPACE AS FAR AS POSSIBLE | IT IS DISPENSED WITH TO CUT AWAY THE AL-4 POWER SOURCE |
| | POLICY 5 | PREFER AL-3 CONNECTION TO AL-2 ONE | A HOLE BECOMES SHALLOWER, AND IS FILLED UP MORE RELIABLY |
| CUTTING AWAY AL-4 | POLICY 6 | SHORTEN A LENGTH TO-BE-CUT-AWAY AS FAR AS POSSIBLE | AN AVAILABLE PERCENTAGE CONCERNING THE CUTTING-AWAY OPERATION IS ENHANCED, AND A PROCESSING PERIOD OF TIME IS SHORTENED |
| JUMPER WIRE | POLICY 7 | AS REGARDS WIRED-OR INTERCONNECTION, SHORTEN THE DISTANCE BETWEEN A SOURCE AND A SPARE TERMINATING RESISTOR | INCREASE IN THE WIRING RESISTANCE OF A JUMPER WIRE IS PREVENTED |

FIG. 59A

| SORTS | POLICIES | CONTENTS | REASONS |
|---|---|---|---|
| CUTTING | POLICY 1 | CUT AN INTERCONNECTION LINE IN AN AL-4 POWER SOURCE SPACE AS FAR AS POSSIBLE | THE VERTICAL WIRING SHORT-CIRCUIT BETWEEN THE PROCESSED LINE AND AN AL-4 POWER SOURCE IS PREVENTED |
| | POLICY 2 | IN CASE OF CUTTING AN INTERCONNECTION LINE DIRECTLY UNDER THE AL-4 POWER SOURCE, SEEK AN AL-2 INTERCONNECTION LINE RATHER THAN AN AL-3 ONE | THE VERTICAL WIRING SHORT-CIRCUIT BETWEEN THE PROCESSED LINE AND AN AL-4 POWER SOURCE IS PREVENTED |
| | POLICY 3 | IN CASE OF CUTTING THE AL-3 INTERCONNECTION LINE DIRECTLY UNDER THE AL-4 POWER SOURCE, SEEK THE FLAT PLACE OF AN UNDERLYING FILM | THE VERTICAL WIRING SHORT-CIRCUIT BETWEEN THE AL-3 LINE AND THE UNDERLYING AL-2 LINE IS PREVENTED |
| CONNECTION | POLICY 4 | CONNECT LINES IN THE AL-4 POWER SOURCE SPACE AS FAR AS POSSIBLE | IT IS DISPENSED WITH TO CUT AWAY THE AL-4 POWER SOURCE |
| | POLICY 5 | PREFER AL-3 CONNECTION TO AL-2 ONE | A HOLE BECOMES SHALLOWER, AND IS FILLED UP MORE RELIABLY |
| CUTTING AWAY AL-4 | POLICY 6 | SHORTEN A LENGTH TO-BE-CUT-AWAY AS FAR AS POSSIBLE | AN AVAILABLE PERCENTAGE CONCERNING THE CUTTING-AWAY OPERATION IS ENHANCED, AND A PROCESSING PERIOD OF TIME IS SHORTENED |
| JUMPER WIRE | POLICY 7 | AS REGARDS WIRED-OR INTERCONNECTION, SHORTEN THE DISTANCE BETWEEN A SOURCE AND A SPARE TERMINATING RESISTOR | INCREASE IN THE WIRING RESISTANCE OF A JUMPER WIRE IS PREVENTED |

METHOD OF MAKING WIRING AND LOGIC CORRECTIONS ON A SEMICONDUCTOR DEVICE BY USE OF FOCUSED ION BEAMS

BACKGROUND OF THE INVENTION

This application is a continuation-in-part application of (1) application Ser. No. 07/448,912, abandoned, filed Dec. 12, 1989, which is a Divisional application of application Ser. No. 07/134,460, U.S. Pat. No. 4,900,695 filed Dec. 17, 1987; (2) application Ser. No. 07/205,061, abandoned filed Jun. 8, 1988; (3) application Ser. No. 07/389,875, abandoned filed Aug. 4, 1989; and (4) application Ser. No. 07/406,959, abandoned filed Sep. 12, 1989. The contents of each of application Ser. No. 07/448,912, filed Dec. 12, 1989; Ser. No. 07/205,061, filed Jun. 8, 1988; Ser. No. 07/389,875, filed Aug. 4, 1989; and Ser. No. 07/406,959, filed Sep. 12, 1989 are incorporated herein by reference in their entirety.

First Aspect of the Present Invention

The present invention, in one aspect thereof, relates to techniques for manufacturing and testing a semiconductor integrated circuit device, and more particularly to techniques which are effective for enhancing a productivity in the development of a large-scale logic integrated circuit device.

In the developments of, for example, a general purpose electronic computer system and a large-scale logic integrated circuit device for use in the system, it is actually difficult to fabricate the large-scale logic integrated circuit device having errorless perfect logical functions at the stage which precedes the assemblage of the circuit device into the system. Further, the corrections of the logical functions of the circuit device become indispensable due to the alteration of the specification of the system, or the like.

Therefore, the following methods are considered for coping with the logical defects of the large-scale logic integrated circuit device found out after the assemblage of the actual system and the corrections of the logical functions requested on the basis of the specification alteration or the like:

The request for the corrections of the logical functions is coped with by changing a mask pattern relative to wiring in accordance with a so-called master slice system wherein a large-scale logic integrated circuit device having desired logical functions is obtained merely by adding the design of the wiring among basic cells to a semiconductor wafer in the state in which the formation of the basic cells has been completed.

Besides, a test after the logic corrections is usually conducted for the large-scale logic integrated circuit device held in the wafer state, by the use of a so-called wafer prober.

By the way, techniques for manufacturing the large-scale logic integrated circuit device in accordance with the master slice system are contained in "LSI HANDBOOK", p. 204–p. 205, edited by the Japan Society of Electronics and Communications, issued on Nov. 30, 1984 by the Ohm-Sha, Ltd.

Also, techniques for testing the semiconductor integrated circuit device in a chip state with the wafer prober are contained in the official gazette of Japanese Patent Application Laid-Open No. 116144/1985.

Second Aspect of the Present Invention

As a second aspect of the present invention, this aspect relates to a cutting depth controlling technique used in applying a cutting work to an LSI on a mask for exposure, using a focused ion beam or the like.

This second aspect of the present invention also relates to a cutting technique of a high accuracy which is carried out under radiation of an ion beam, and particularly to a technique of cutting with a high accuracy an internal layer of, for example, an LSI having a multilayer structure.

This second aspect of the present invention further relates to a semiconductor device and a cutting technique using an ion beam for making same, and particularly to a technique effective in its application to cutting and exposure of wiring using an ion beam to effect logical correction in a logical element, take measures against a defective design or make analysis of a defect.

Further, this second aspect of the present invention relates to a semiconductor integrated circuit device and particularly to a technique effective in its application to the analysis of defects.

Further, this second aspect of the present invention relates to a cutting depth monitoring technique in cutting an LSI or a mask for exposure using a focused ion beam or the like.

In an LSI developing process it has recently become very important to make debugging, correction or analysis of a defect by cutting or connecting a part of a wiring in an LSI chip To this end, there have heretofore been reported examples of cutting a wiring in an LSI chip using a focused ion beam.

For example, Japanese Patent Laid-Open No. 106750/83 (Focused Ion Beam Cutting Method) describes that it is possible to effect cutting at different etching depths by changing the dose amount, radiation time and acceleration voltage of an ion beam.

Further, as a technique associated with a higher integration of a semiconductor device such as an LSI (large scale integrated circuit) and shortening of the developing period, a technique of cutting a wiring of the LSI by radiating a focused ion beam to a predetermined cutting region with a view to making debugging, correction or analysis of a defect of the LSI is disclosed in detail, for example, in the foregoing Japanese Patent Laid-Open No. 106750/83, which technique is outlined as follows. In etching a workpiece selectively by radiating a focused ion beam thereto, desired etching depths for the workpiece are preset as positional functions and on the basis of the preset data the ion beam is radiated while changing the dose amount and radiation time of the beam as well as acceleration voltage, whereby it is intended to effect etching at different depths. The above patent publication fully describes an etching control in the depth direction, but as to positioning of the cutting region in the planar direction, the said publication merely states that an ion beam is radiated to a part to be cut while referring to a positioning mark formed on the workpiece.

Further, as a cutting technique using an ion beam in the production of a semiconductor device, there is known the technique disclosed in Japanese Patent Laid-Open No. 202038/83. According to an outline of this technique, there is provided an end point detecting means for detecting a cutting end point accurately by observing charged particles such as secondary ions or secondary electrons or an emission spectrum emitted from an ion beam-radiated part of a workpiece during cutting, whereby in removing a black spot defect caused by the adhesion of a light shielding film such as a chromium film to a part which should be transparent, for example, in a photo mask, it is intended to prevent a glass substrate located below the black spot defect from being damaged by excess cutting.

Further, according to a conventional technique for measuring the potential of a defective part of an internal circuit in the analysis of a defect of an IC (integrated circuit) or an LSI, a laser beam is applied to an insulation film on an aluminum wiring of the defective part to form a hole and probes are manually put on the surface of the wiring (e.g., Japanese Patent Publication No. 6173/79).

Third Aspect of the Present Invention

The present invention, in a third aspect thereof, relates to a technique which may be effectively applied to a semiconductor integrated circuit device having a multilayer wiring structure and a process for producing such a semiconductor integrated circuit device.

Recently, it has been increasingly important to develop an effective technique of repairing a defective part in an LSI (Large Scale Integrated Circuit) or changing a logical design thereof by disconnecting and properly reconnecting part of the wirings within the LSI circuit after the completion of the LSI which is still in the form of a wafer or chip.

To attain the above-described object, proposed in Japanese Patent Application No. 70979/1986 was a method of connecting wirings in an LSI by a combination of an ion beam technique and a laser CVD technique. According to the proposed method, after the completion of an LSI having, for example, a double-layer wiring structure, wirings in a first-level layer are interconnected for the purpose, for example, of repairing a defective part or changing a logical design. In this case, since the wiring in the uppermost layer is generally widely laid out in order to supply a power supply current, it is necessary to provide contact holes extending through the wiring in the uppermost-level layer so as to reach the wirings in the lower-level layers and also provide a connecting wiring through the contact holes. For this arrangement, an insulating film on the uppermost-level wiring layer, the second-level wiring layer and an intermediate insulating film between the second-level wiring layer and the first-level wiring layer are processed by irradiation with a focused ion beam to form contact holes, thereby partially exposing the surfaces of the wirings in the first-level layer through the contact holes. After an insulating film, e.g., a silicon dioxide ($SiO_2$) film, has been formed on the whole surface of the chip, this insulating film is patterned by the use of photolithography and etching techniques so that the insulating film is left only in the vicinities of the contact holes. Then, the insulating film on the bottoms of the contact holes are removed by selective etching so that the surfaces of the wirings in the first-level layer are partially exposed through the contact holes again. Then, a metal is selectively deposited by laser CVD to thereby form a connecting wiring which interconnects the wirings in the first-level layer through the contact holes. In this case, since the connecting wiring is insulated from the wiring in the second-level layer by the insulating films formed within the contact holes, the wirings in the first- and second-level layers are prevented from shorting to each other.

On the other hand, as the result of increases in the degree of integration and miniaturization of ICs, it has recently been increasingly important to conduct an operation in which a defective part of an LSI is debugged or repaired in the step of developing the same by disconnecting and properly reconnecting part of the wirings within the LSI chip, thereby detecting errors in design or process, carrying out a defect analysis and returning the LSI to the process conditions, and thus increasing the production yield. For this purpose, examples in which the wirings in ICs are disconnected by means of a laser or ion beam have heretofore been reported.

More specifically, as a first prior art, "Laser Stripe Cutting System for IC Debugging" (Tech Digest of CLEO' 81, 1981, p. 160) is known. In this prior art, an example in which wirings are disconnected by means of a laser to debug a defective part is reported. As a second prior art, Japanese Patent Application No. 42126/1983 is known. This prior art discloses a technique in which an ion beam generated from a liquid metal ion source is focused in the shape of a spot having a diameter of 0.5 m, or less to disconnect wirings and bore holes and a metal is deposited in the holes by an ion beam to thereby interconnect the upper and lower wirings.

As a third prior art, "Direct Writing of Highly Conductive Mo Lines by Laser Induced CVD" (Extended Abstruct of 17th Conf. on Solid State Devices and Material, 1985, p. 193) is known.

Fourth Aspect of the Present Invention

In a fourth aspect, the present invention relates to techniques which are effective for correcting the connections of wirings by using the laser CVD technique and the focused ion beam technique.

A logic MIS, such as a microprocessor or a gate array, frequently has its logic structures corrected (logic corrections) during its development. This logic correction is accomplished by altering the pattern of the wirings connecting the logic gates.

However, the logic correction would elongate the development period of the LSI if it were started by altering the wiring mask pattern. Thus, as a method of correcting the wiring connections, there has been practiced the technique combining the focused ion beam (FIB) and the laser CVD.

In this technique, the passivation film of an integrated circuit formed over a semiconductor wafer (which will be shortly referred to as "wafer") is etched with a focused ion beam to expose the wiring to-be-cut to the outside. After this wiring is cut with the focused ion beam, a conductive pattern of molybdenum (Mo) or tungsten (W) is selectively deposited with the laser CVD between the predetermined preliminary wiring and the logic gate.

The focused ion beam can have its ion beam focused to a spot size of about 0.1 $\mu$m and is advantageous in that it can cut and process a fine wiring at high precision. Here, the focused ion beam technique is disclosed, for example, in "Electronic Materials—Separate Volume (Guide Book of Apparatus for Manufacturing and Testing Super-LSIs)", pp. 121–127, issued on Nov. 18, 1986 by KK Kogyo Chosakai, or Japanese Patent Laid-Open No. 63-100746 (opened on May 2, 1988), 63—152150 (opened on Jun. 24, 1988) or 63-157438 (opened on Jun. 30, 1988).

SUMMARY OF THE INVENTION

First Aspect of the Present Invention

With the prior art as stated above in connection with the first aspect of the present invention, the fabrication needs to be redone from a wafer process for forming the wiring pattern anew, irrespective of whether the scale of the request for the corrections is large or small. In, for example, a large-scale logic integrated circuit device which has a multilayer wiring structure including as many as four layers, a long time is expended on the operations of the logic corrections, etc., to pose the problem that the development periods of the large-scale logic integrated circuit device and an electronic computer system employing it become long.

Moreover, the conventional wafer prober is furnished with a wafer chuck which fixes a semiconductor wafer by virtue of vacuum section. In this regard, it has the problem that, with the wafer chuck left intact, the large-scale logic integrated circuit device split into each individual chip state, for example, cannot be fixed and probed by the vacuum suction.

Further, the techniques of the aforementioned official gazette of Japanese Patent Application Laid-Open No. 116144/1985 are effective to avoid the degradations of the positioning accuracies of individual chips attendant upon the enlargement of the diameter of a semiconductor wafer. However, a dedicated test apparatus for testing the semiconductor integrated circuit device divided into the chip state must be prepared separately from the wafer prober which has hitherto been used. This incurs the drawback that a facility investment for the test process increases unreasonably.

It is therefore an object of this first aspect of the present invention to provide a technique according to which logic, functions, etc. are corrected on a finished chip by the use of FIB (Focused Ion Beam) cutting laser CVD, etc. (hereinafter, the technique shall be called "on-chip corrections ").

A further object of the first aspect of the present invention is to provide a method of manufacturing a semiconductor integrated circuit device which is capable of shortening the development periods of the semiconductor integrated circuit device and a system employing it.

A further object of this first aspect of the present invention is to provide a method of testing a semiconductor integrated circuit device which realizes the probing of a pellet with a wafer prober and which is capable of shortening a required time and curtailing a cost in the probing of the pellet.

A still further object of this first aspect of the present invention is to provide a jig for testing a semiconductor integrated circuit device which realizes the probing of a pellet with a wafer prober and which is capable of enhancing a test accuracy and also shortening a required time and curtailing a cost in the testing process of the pellet.

A still further object of this first aspect of the present invention is to provide a method which shortens the development periods of high-degree systems (LSIs having high densities of integration and an electron device including them).

A further object of this first aspect of the present invention is to provide methods of developing, correcting and mass-producing a semiconductor integrated circuit device which are well suited to debug an electron device of complicated assemblage and installation processes.

A further object of this first aspect of the present invention is to provide a method of correcting wiring which is free from the undesirable remainder of subbing Cr (chromium), or the like.

A further object of this aspect of the present invention is to provide a method of intersecting pieces of jumper wire on a final passivation film without short-circuiting them.

A further object of this first aspect of the present invention is to provide a spare wiring layout which is well suited for on-chip wiring corrections.

A further object of this first aspect of the present invention is to provide a method of forming that recess of uneven wiring which is well suited for FIB processing effective for a notch preventive of short-circuiting in on-chip corrections.

A further object of this first aspect of the present invention is to provide a FIB processing technique which is effective for the cutting of an interconnection line, etc. in on chip-corrections.

A further object of this first aspect of the present invention is to provide developing and mass-producing methods which are suited to develop and mass-produce a custom IC (Integrated Circuit) or master slice IC having multilayer wiring.

A further object of this aspect of the present invention is to facilitate testing (probing) an IC or the like of large amount of heat production in its chip state.

Illustrative embodiments of this first aspect of the present invention are briefly summarized in the following paragraphs.

A method of manufacturing a semiconductor integrated circuit device in this first aspect of the present invention consists in that each of a plurality of articles of the identical sort of semiconductor integrated circuit device formed via a wafer process is split into individual pellets, which are thereafter assorted into a first group and a second group; that the pellets belonging to the first group are assembled into an intended system, while the pellets belonging to the second group are kept in stock; that when any functional defect has been found out in the first group of pellets assembled in the system, the second group of pellets are subjected to wiring corrections for eliminating the functional defect and are thereafter assembled into the system; and that these steps are repeated.

In addition, a method of testing a semiconductor integrated circuit device in this first aspect of the present invention consists in that a wafer prober including a wafer chuck is employed, and that a pellet is fixed to the wafer chuck while being held in a window which is provided in a part of a wafer-shaped jig, whereby the pellet is probed.

Besides, a jig for testing a semiconductor integrate circuit device in this first aspect of the present invention comprises a wafer-shaped base plate which is detachably placed on a wafer chuck of a wafer-prober, and a window which is provided in a part of the base plate and in which a pellet is located.

With the aforementioned method of manufacturing a semiconductor integrated circuit device according to this first aspect of the present invention, when a function defect has been found out in the first group of pellets assembled in the actual system, the second group of pellets already finished up are subjected to the wiring corrections for eliminating the functional defect of the first group of pellets and are thereafter exchanged for the first group of pellets, thereby making it possible to eliminate the functional defect of the first group of pellets or to take measures coping with a specification alteration etc. more promptly than in, for example, a case where a multilayer wiring structure is partly or wholly remade from the beginning by the wafer process in order to eliminate the functional defect.

Thus, the development periods of the semiconductor integrated circuit device and the system employing it can be shortened greatly.

In addition, with the aforementioned method of testing a semiconductor integrated circuit device according to this first aspect of the present invention, the semiconductor integrated circuit device in the pellet state can be probed without any remodeling of the conventional wafer prober, so that a probing apparatus dedicated to the pellet, for example, need not be prepared anew, thereby making it possible to shorten a required period of time and to curtail a cost in the process for probing the pellet.

Besides, with the aforementioned jig for testing a semiconductor integrated circuit device according to this first aspect of the present invention, the semiconductor integrated circuit device in the pellet state can be probed without any remodeling of the conventional wafer prober, so that a probing apparatus dedicated to the pellet, for example, need not be prepared anew, thereby making it possible to shorten a required period of time and to curtail a cost in the probing of the semiconductor integrated circuit device in the pellet state.

Moreover, the pellet can be positioned to the testing system stably and highly accurately, so that the test accuracy of the probing can be enhanced.

Second Aspect of the Present Invention

In the above prior art such as Japanese Patent Laid Open No. 106750/83, etc., regarding how to judge the time when a desired cutting depth was attained and how to stop cutting, it is merely mentioned that the radiation time and dose amount are made variable. An expression representing an etching depth S is shown on page 4 of the said laid open print, but there is no concrete description therein as to how cutting to a target depth can be done from that expression. A secondary ion analyzing method is referred to therein as a concrete method for detecting a cutting and point.

However, the LSI adopts a multilayer interconnection, so in order to cut a lower-layer wiring, it is necessary to form a hole typically having a high aspect ratio, such as a cutting area of 5 $\mu m^2$ and a cutting depth of 10 $\mu m$, as shown in the sectional view of a cutting region of FIG. 14C. In the case of a small cutting depth, as shown in FIG. 14B, a sufficient quantity of secondary ions 29' are detected by a secondary ion detector 30'. But at a higher aspect ratio, as in FIG. 14C, secondary ions 29' are scarcely detected. By this method, therefore, it is impossible to detect a cutting end point.

On the other hand, if the beam current and the acceleration voltage are constant, the cutting depth is proportional to the cutting time. In the case of a small cutting depth, the cutting time is short, so when the depth was controlled by the cutting time on the assumption that the beam current was constant within the said time, there occurred no large error.

In the hole shown in FIG. 14C, however, about 14 minutes was required for cutting, for example, a volume of $5\times5\times10=250$ $\mu m^3$ at a typical cutting speed of 0.3 $\mu m^3$/S, and within this time it is impossible to ignore a drift of a beam current iB as shown in FIG. 14D, which drift may exceed 10%. Therefore, where a cutting time is set on the basis of an initially-set current value and thereafter a drift is made in a decreasing direction of the beam current, as shown in FIG. 14E, an actual depth becomes insufficient so it is impossible to cut a wiring 31'. Conversely, where a drift is made in an increasing direction of an actual current value as compared with an initially-set current value, cutting will be done to a larger depth than a target depth, reaching a lower-layer wiring, resulting in the occurrence of problems, e.g. short-circuit with an upper-layer wiring due to reattachment 33' of sputter from the lower-layer wiring.

Further, it has become clear that the technique disclosed in the foregoing Japanese Patent Laid Open No. 106750/83 involves the following problem.

In the recent LSIs there is generally adopted a multilayer interconnection and the spacing between adjacent wirings in the same layer is narrow, so for cutting a wiring in an internal layer it is necessary to form a hole having a high aspect ratio of, for example, a cutting area of 5 $\mu m^2$ and a cutting depth of 10 $\mu m$, and thus an extremely high accuracy etching is required. On the other hand, a multilayer interconnection of an LSI is formed by laminating an insulating film of for example silicon dioxide ($SiO_2$) and a wiring of for example aluminum (Al) successively on a semiconductor of for example a silicon (Si) single crystal by vapor deposition or any other suitable method, and subjecting the layers formed to a desired etching. Thus, it is formed through such working process. In the multilayer interconnection, therefore, a positional deviation which has occurred in the LSI working process may occur between the lower wiring layer in which the cutting region is positioned and the upper layer positioned thereabove. Consequently, in the case of positioning the cutting region located in the lower layer on the basis of a positioning mark formed on the upper layer, it is impossible to make an accurate positioning of the cutting region due to the foregoing positional deviation between upper and lower layers, sometimes resulting in that it is difficult to cut the desired part. This has been made clear by the present inventors.

In a cutting work using an ion beam, as shown in the above Japanese Patent Laid Open No. 202038/83, it is important to detect charged particles or emission spectrum emitted from a workpiece in order to control the depth of a cutting region with a high accuracy.

In the above prior art, however, no consideration is given to the case where a cutting region is in the form of a relatively deep concave and it is difficult to detect charged particles such as secondary ions and secondary electrons or an emission spectrum emitted from the cutting region.

More particularly, the present inventors have found the following problem. For example, in a logical element having a multilayer interconnection structure, in the case of making a logical correction, taking measures against a defective design or making analysis of a defect by cutting and exposure of wiring using an ion beam, if the wiring is in a relatively deep position, the aspect ratio (the ratio of depth to bore) of a cut-away hole becomes large, so that charged particles such as secondary ions and secondary electrons or an emission spectrum generated at the bottom of the cut-away hole will be captured in the interior of the cut-away hole. Consequently, the detection sensitivity is deteriorated and it is difficult to make an accurate control for the cut-away hole on the basis of detected charged particles or emission spectrum from the cutting region.

Where thickness of each constituent layer of a multilayer interconnection structure is known in advance, it is possible to control the cutting depth on the basis of the cutting speed. However, the thickness of each constituent layer of a multilayer interconnection structure usually differs greatly between the interiors of the same semiconductor wafers, between discrete semiconductor wafers and between semiconductor wafers processed simultaneously, depending on variations in the manufacturing process such as deposition. It requires much labor and is actually difficult to trace the thickness of each constituent layer of a multilayer interconnection structure on each individual case.

According to studies made by the present inventors, the technique of the foregoing Japanese Patent Publication No. 6173/79 involves the problem that the diameter of the hole formed by the radiation of a laser beam is usually as small as about 5 to 10 $\mu m$, while the diameter of the tip end portion of each probe is as large as about 3 $\mu m$ even at the smallest, so it is difficult to secure contact of the probe with the wiring. In manual probing, moreover, since the number of probes is limited, it is impossible to supply power while putting probes on all power supply pads during potential measurement. As a result, there occurs a drop in supply potential in the interior of LSI, making it impossible to measure the potential of a defective part accurately.

In the prior art disclosed in Japanese Patent Laid Open No. 106750/83, it is merely mentioned that the radiation time and dose amount are made variable regarding how to judge the time when a desired cutting depth was obtained and stop cutting. Although an expression representing an etching depth S is shown on page 4 of the said publication, there is found no concrete description therein about in what manner a target depth can be cut in accordance with the said expression. As to a concrete method for detecting a cutting end point, a method of analyzing secondary ions is mentioned therein.

However, since the LSI adopts a multilayer interconnection, in order to cut a lower-layer wiring, it is necessary to form a hole having a high aspect ratio, typically like a cutting area of 5 $\mu m^2$ and a cutting depth of 10 $\mu$m, as shown in the section of a cutting region in FIG. 18C. In the case of a small cutting depth as shown in FIG. 18B, a sufficient amount of secondary ions 520' can be detected by a secondary ion detector 521'. But at a high aspect ratio, as shown in FIG. 18C, the secondary ions 520' are scarcely detected. With this method, therefore, it is impossible to detect a cutting end point.

On the other end, if the beam current and the acceleration voltage are constant, the cutting depth is proportional to the cutting time. In the case of a small cutting depth, the cutting time is short, so even when the depth was controlled by the cutting time on the assumption that the beam current was constant within the said time, there occurred no great error.

In the hole illustrated in FIG. 18C, however, it requires about 30 minutes to cut, for example, a volume of 5×5×10= 250 $\mu m^3$ at a typical cutting speed of 0.14 $\mu m^3$/S. Within this time it is impossible to ignore the drift of the beam current iB, as shown in FIG. 18D. The drift sometimes exceeds 10%. Therefore, as shown in FIG. 18E, when the cutting time is set on the basis of an initially-set current value and thereafter a drift is made in a decreasing direction of the beam current, the actual depth will be insufficient to cut a wiring 522'. Conversely, where a drift is made in an increasing direction of the actual current value as compared with the initial current value, even a lower-layer wiring deeper than a target depth will be cut, causing problems such as, for example, short-circuit with the upper-layer wiring due to reattachment of sputter 524' from the lower-layer wiring.

It is an object of the second aspect of the present invention to control a cutting depth with a high accuracy even when the beam current changes during the cutting.

It is another object of this second aspect of the present invention to provide a technique capable of radiating an ion beam to a desired position of a workpiece to effect an exact cutting of high accuracy.

It is a further object of this second aspect of the present invention to provide a semiconductor device having a hole of a high aspect ratio formed at an accurate depth as well as a cutting technique using an ion beam capable of controlling a cutting depth with a high accuracy.

It is a still further object of this second aspect of the present invention to provide a technique capable of accurately measuring the potential of an internal circuitry of a semiconductor integrated circuit device.

It is a still further object of the second aspect of the present invention to monitor the cutting depth with a high accuracy even when the beam current changes during cutting.

The foregoing objects are attained by measuring a beam current at very short time intervals during cutting of a single hole, integrating the product of the thus-measured value and a cutting rate coefficient with respect to time to obtain a cut-away volume, and dividing the latter by the area of a beam scan region.

The above and other objects as well as novel features of this aspect of the present invention will become apparent from the following description and the accompanying drawings.

Typical inventions disclosed herein will be outlined below.

The foregoing first object is attained by measuring a beam current at very short time intervals during cutting, integrating the measured value with respect to the time to obtain a radiation ion quantity (hereinafter referred to as "dose amount") and calculating a cutting depth using the dose amount.

The second invention disclosed, herein will be typically outlined below.

In cutting a cutting region by radiating an ion beam to the same region which is positioned in an internal layer of a predetermined depth of a sample, an ion beam radiating position is determined by reference to a cutting reference mark formed at a depth equal to or approximately equal to the depth of the cutting region and there is performed cutting of the same region.

The third invention disclosed herein will be typically outlined below.

In a semiconductor device there is provided a trial cutting region equal in structure in the depth direction and in formation history to an element region.

Further, there are provided an ion source; an ion beam optical system for controlling the acceleration of an ion beam emitted from the ion source and also controlling an arrival position of the beam relative to a workpiece; a detecting means for detecting charged particles or emission spectrum emitted from a cutting region of the workpiece; an ion beam current measuring means for measuring an ion beam current; a dose amount calculating section for measuring a time required for cutting in each of the constituent layers of the workpiece on the basis of changes in charged particles or emission spectrum emitted from the workpiece and integrating the ion beam current measured during cutting of each layer in accordance with the said required time to thereby calculate a dose amount required for cutting per unit area of each layer in the workpiece; and a dose amount storage section for storing the calculated dose amount required for cutting per unit area of each layer, wherein the cutting of a second region is carried out through first and second stages. In the first stage, the dose amount required for cutting per unit area of each layer in a first region of the workpiece is grasped and stored in the dose amount storage section, while in the second stage, a target dose amount required for cutting up to a desired depth in the second region of the workpiece is set on the basis of the dose amount required for cutting per unit area of each layer in the first region of the workpiece which has been stored in the dose amount storage section, and cutting is performed until a dose amount obtained by integrating an ion beam current during cutting with respect to time reaches a target dose amount.

The fourth invention disclosed herein is typically outlined that it is provided with auxiliary bumps or pads in a floating state.

The operation of the first invention is as follows.

In a cutting work using a focused ion beam, as shown in FIG. 13F, atoms 34' sputtered by an ion beam 28' reattaches to the side rail of a cut-sway bolt to form a reattachment layer 35' so that the side rail of the cut-away hole is inclined. A change in shape of the cut-away hole formed by the reattachment layer exerts an influence on the cutting speed for the depth.

As a result of experiments we obtained such a relationship as shown in FIG. 13G. Where a cutting width L is sufficiently large (4d or more) relative to a value, 2d, twice a beam diameter,d, cutting is started, and while a flat portion remains on the bottom of a cut-away hole, cutting depth Z is proportional to a dose amount D. With further advancement of cutting, when the flat portion of the cut bottom disappears due to reattachment of sputter and the cut-away hole becomes wedge-like, the cutting speed for the cutting depth Z becomes lower as shown in FIG. 13G. Where the cutting width L is narrower than the above, that is, where L is about the same as or smaller than twice the beam diameter, d, Z and D do not exhibit a proportional relation from the cutting start point, so the advancing speed of Z becomes lower with progress of cutting. In view of this point we have invented depth controlling methods with respect to both the case where Z is proportional to D and the case where Z is not proportional to D.

Where Z is proportional to D, a beam current is measured at a very short time interval during cutting and the measured value is integrated with respect to time to obtain a dose amount D, which in turn is multiplied by a constant of proportion to determine a depth Z. It is here assumed that the sputter volume per unit incident ion quantity of a workpiece; material M is $k_M[\mu m^3/n_c]$ (hereinafter referred to as the "cutting rate coefficient of material M") and the opening area at the start of cutting is A $[\mu m^2]$($A=L_1 \times L_2$, $L_1$ and $L_2$ being longitudinal and transverse widths, respectively). The cutting depth Z is obtained by dividing the volume V (hereinafter referred to as "sputter volume") of the cut-away hale which is in the form of a rectangular parallelopiped, by an opening area A, ignoring reattachment and assuming that all the sputter atoms disappear. Therefore, the following equations are established:

$$V=k_M D \tag{1}$$

$$Z = V/A = \frac{kM}{A} D \tag{2}$$

Thus, the constant of proportion of the above Z and D becomes $$\frac{kM}{A}.$$

Next, where Z and D are not proportional to each other, the dose amount D is determined in the same manner as above. Thereafter, the depth Z is determined using a cutting depth function Z=g(D) which has been obtained beforehand by a trial cutting experiment.

According to the foregoing second invention, it is possible to effect cutting with an ion beam in an exact position since an ion beam radiating position can be determined by reference to a cutting reference mark formed with a view to serving as a reference in positioning a cutting region.

According to the foregoing third invention, a trial cutting is performed in a trial cutting region in performing an ion beam cutting with a view to making logical correction, taking measures against a defective design or making analysis of a defect, whereby a dose amount per wait area of each layer can be grasped accurately is advance and it is possible to form a hole of a high aspect ratio at an exact depth in an element region.

For example, is cutting a second region of a workpiece, even when the cutting region is the form of a concave of a high aspect ratio having a large depth as compared with a cutting area and it is difficult to control the cutting depth under changes is the amount of secondary ions or secondary electrons emitted from the cutting region and detected, it is possible to set as exact target dose amount according to the cutting depth for the second cutting region on the basis of a dose amount per unit area of each layer which has already been grasped in the cutting of the first cutting region and stored in the dose amount storage section. The cutting depth can be controlled precisely by monitoring a dose amount which is obtained by integrating an ion beam current with respect to a cutting time.

According to the foregoing fourth invention, it is possible to make a potential measurement by connecting a portion to be measured for potential with an auxiliary bump or pad through wiring, thus permitting as exact potential measurement for an internal circuitry.

Further, the cutting depth can be monitored with a high accuracy even upon change in beam current during cutting, by measuring a beam current at a very short time interval during cutting for a single hole, then integrating the product of the measured value and a cutting rate coefficient with respect to time to obtain a cut-away volume and dividing the latter by the area of a beam scan region to obtain a cutting depth. More specifically, in a cutting rock using an ion beam, since a sample is cut by sputtering, sputter particles 525 are more likely to reattach to the side rail of a cut-away hole as the bole becomes deeper as shown in FIG. 17F, resulting is that the hole becomes tapered. Therefore, the opening portion comes to have an area A same as that of the beam scan region, but as the hole becomes deeper, a bottom area A' becomes smaller than the area A.

As a result of an experiment it wan confirmed that a cut-away hole volume gradually decreased in its rate of increase with respect to the cutting time (the beam current can be regarded as being almost constant), as shown is FIG. 17G. But the cutting depth increases at a constant rate of increase as long as the flat portion remains on the bottom (A'>0) as shown in FIG. 17H. It became clear, however, that this relation was no longer valid when the hole became conical with no bottom surface (A'=0).

Therefore, as shown is FIG. 17H, it is presumed that the volume V of the material sputtered by beam is constant with respect to time, but the reattachment volume $V_2$ increases as the hole becomes deeper, so the rate of increase of the cut-away hole volume $V_1=V-V_2$ changes. The volume V of the material sputtered with beam is referred to herein as a cut-away volume V. The cut-away volume V is represented as follows:

$$V=9\int k i_B dt$$

where k: cutting rate coefficient $[\mu m^3 A^{-1} sec^{-1}]$ $i_B$: beam current [A]

This volume corresponds to a cut-away hole volume in the absence of reattachment of sputter particles and is therefore the volume of a quadrangular prism free of tape: wherein the sectional area is A (the area of the beam scan region) everywhere.

Therefore, the cutting depth Z can be determined as follows:

$$z=V/A.$$

Third Aspect of the Present Invention

The prior arts discussed above in connection with the third aspect of the present invention suffer from the following problems.

The techniques proposed in Japanese Patent Application No. 70979/1986 has the problems that photolithography and etching steps are needed to form an insulating film only in the vicinities of contact holes and that the process for preventing shorting between the wirings in the first- and second-level layers is complicated.

In the first prior art, a means for disconnecting wirings alone is shown but no means for reconnecting the wirings is shown. Further, employment of a laser machining method involves the following disadvantages:

(1) Since the machining process is thermally executed, conductive of heat to the surroundings is unavoidable, and since processes such as evaporation and blowoff of vapors take place, it is extremely difficult to conduct a fine machining operation on the order of 1.5 μm or less.

(2) Laser light is only slightly absorbed by insulating films such as $SiO_2$, $Si_3N_4$ or the like and it is therefore absorbed by an aluminum or polysilicon wiring to the underlayer, and when such a wiring evaporates and blows off, it explosively blows the upper insulating film away, thereby effecting machining of the insulating film. For this reason, when the thickness of the insulating layer is 2 μm or more, it is difficult to machine the insulating film. Further, the peripheral portions (the surroundings and the upper and lower layers) are greatly damaged, and this leads to generation of defects. These results show that it is difficult to machine wirings in ICs having a multilayer wiring structure or a high degree of integration and miniaturization by the laser machining method.

The second prior art discloses (3) a means for disconnecting and boring by a focused ion beam, and (4) a means for interconnecting the upper and lower wirings by the use of a focused ion beam. Since employment of a focused ion beam enables machining on the order of 0.5 μm or less and permits any materials to be successively machined from the upper layer with ease by means of sputtering, the second prior art overcomes the problems of the first prior art. However, as to the means for interconnecting the upper and lower wirings mentioned in (4), the second prior art shows only the procedure of interconnection of the upper and lower airings but does not mention any moans for providing connection between one wiring and another wiring.

The third prior art discloses a method wherein the surface of a silicon (Si) substrate coated with $SiO_2$ is irradiated with an ultraviolet laser in a gas of a metal organic compound, e.q., molybdenum carbonyl [$Mo(CO)_6$]to decompose $Mo(CO)_6$ by a photothermal or photochemical laser induced CVD process, thereby depositing a metal, e.q., molybdenum (Mo) on the substrate and thus lithographically forming a metal wiring directly on the substrate. However, this prior art discloses merely a means for forming a Mo wiring on an insulating film but shows no means for interconnecting wirings which are located under an insulating film such as a protective film or an intermediate insulating film in an actual IC without any fear of these wirings shorting to a wiring disposed in an upper-level layer.

Accordingly, it is an object of this third aspect of the present invention to provide a semiconductor integrated circuit device which is so designed that it is possible to form a connecting wiring without causing shorting between wirings respectively located in lower and upper level layers in a multilayer wiring structure.

It is another object of this third aspect of the present invention to provide a process for producing a semiconductor integrated circuit device which enables formation of a simple connecting wiring for interconnecting wirings respectively located in lower- and upper-level layers in a multilayer wiring structure.

It is still another object of this third aspect of the present invention to provide an IC which is so designed that it is possible to form tins holes in an insulating film such as a protective film or an intermediate insulating film in the IC, thereby enabling a wiring located under an insulating film such as a protective film or an intermediate insulating film to be connected to another portion through a connecting wiring and thus permitting the IC to be subjected to debugging, repair, a defect analysis, etc., and also provide a method of interconnecting wirings in the IC.

Fourth Aspect of the Present Invention

According to a fourth aspect of the present invention, we have investigated the logic correcting technique using the aforementioned focused ion beam and laser CVD to find the following problems:

The formation of the conductive pattern with the laser CVD makes use of the thermal reactions due to the temperature rise at the laser-irradiated portion. If the wafer surface is irradiated with the laser beam, the temperature rises at the irradiated portion of the insulating film so that the reactive gases such as $W(CO_6)$ or $Mo(CO_6)$ are decomposed to deposit the conductive film of W or Mo selectively over the insulating film at the portions irradiated with the laser beam. If, therefore, the wafer or laser beam is moved in a predetermined direction with the wafer surface being irradiated with the laser beam, the conductive pattern can be foamed along the moving locus.

If, however, the surface of the insulating film is irradiated with the laser beam, the temperature of the insulating film not only at the irradiated portion but also in its neighborhood is raised by the heat conduction of the insulating film so that the width of the conductive pattern obtained extends as wide as 5 μm even if the spot size of the laser beam is focused to about 2 μm.

On the other hand, the width of the conductive pattern obtained may be different between the cases, in which the insulating film at the portions irradiated with the laser beam is underlaid by the wiring and not, even if the laser beam has a predetermined spot size. In the portion having the underlying wiring, more specifically, the heat of the insulating film will be promptly transferred to the underlying wiring so that the temperature of the insulating film will not rise so much. On the contrary, the temperature of the insulating film is liable to rise in the portion having no underlying wiring. As a result, the width of the conductive pattern becomes larger in the portion having no underlying wiring than that of the other portion.

Thus, in the conductive pattern-forcing technique using the laser CVD, the width of the conductive pattern obtained may be wider than necessary or may disperse. This raises a problem that the adjacent conductive patterns are short-circuited if the conductive patterns are to be arranged in the vicinity.

This fourth aspect of the present invention has been conceived in view of the problems described above, and has an object to provide a technique capable of effectively preventing the short-circuiting of conductive patterns arranged adjacent to each other when the connections of wirings are to be corrected by using the focused ion beam and the laser CVD.

One object of this fourth aspect of the present invention is to provide a technique for correcting the logic or function on a completed chip by using the FIB (Focused Ion Beam) cutting and the laser CVD (as will be shortly referred to as "on-chip correction").

A further object of this fourth aspect of the present invention is to provide a method of manufacturing a semiconductor integrated circuit device within a short period for developing the semiconductor integrated circuit device and a system using the former.

A further object of this fourth aspect of the present invention is to provide a method of shortening the period for developing a high-grade system (such as an LSI having a high degree of integration and an electronic device composed of the LSI).

A further object of this fourth aspect of the present invention is to provide a method of developing, correcting and mass-producing a semiconductor integrated circuit device which is suitable for debugging or adjusting (or functionally testing) an electronic device having complicated assembling and installing steps.

A further object of this fourth aspect of the present invention is to provide a wiring correcting method which is clear at any undesirable underlying barrier metal such as Cr.

A further object of this fourth aspect of the present invention is to provide an FIB processing technique which is effective for cutting the mutual wirings of on-chip correction.

A further object of this fourth aspect of the present invention is to provide a developing and mass-producing method which is suitable for developing a custom IC, (Integrated Circuit) having multilayer wirings and a master slice IC, A further object of this fourth aspect of the present invention is to improve the reliability of the wiring corrections with the laser beam, firstly be preventing the wiring of deposited film formed on a sample surface from being cracked and secondly by ensuring the terminal detection at the deposition of the metal layer in the through holes to prevent the boundary between the load-out wiring portion and the aforementioned wiring from being cracked.

A further object of this fourth aspect of the present invention is to provide a semiconductor device technique which can facilitate the correctional processing operations of the wirings, simplify the wiring correctional processing system and improve the yield of the wiring correctional processing.

A further object of this fourth aspect of the present invention is to provide a technique capable of improving the throughput of the logic correcting step using the FIB and the laser CVD.

Another object of this fourth aspect of the present invention is to provide a technique which can achieve the objects described above and can improve the yield of the logic correcting step using the FIB and the laser CVD.

Still another object of this fourth aspect of the present invention is to provide a technique which can achieve the objects described above and can effectively prevent a drop in resistance to electro-migration of the power source wiring.

A further object of this fourth aspect of the present invention is to provide a technique capable of achieving the objects described above, and also promote automation of the logic correcting step using the FIB and the laser CVD.

Another object of this fourth aspect of the present invention is to provide a technique capable of reliably preventing short-circuiting in the wiring corrections of the first and second wiring structures to be laminated through a second insulating film.

A further object of this fourth aspect of the present invention is to provide a semiconductor integrated circuit device which is reliably feed from the short-circuiting in the wiring correction of the first and second wiring structures to be laminated through a second insulating film.

A further object of this fourth aspect of the present invention is to provide a wiring correcting method capable of reliably preventing short-circuiting in the wiring correction of the first and second wiring structures to be laminated through a second insulating film.

A further object of this fourth aspect of the present invention is to provide a method of developing a main frame computer which can shorten the developing period by constructing a semiconductor integrated circuit device and by reliably preventing short-circuiting in the wiring correction of the lust and second wiring structures to be laminated through a second insulating film.

A representative example of the inventions to be disclosed hereinafter will be summarized in the following.

According to this fourth aspect of the present invention, there is provided a method of fabricating a semiconductor device, comprising the steps of: etching a passivation film of an integrated circuit formed over a wafer with a focused ion beam to expose a wiring to the outside at its pardon to be cut away; cutting the wiring with the focused ion beam; selectively coating by laser CVD a wide conductive pattern between the wirings to be connected; and etching said wide conductive pattern with said focused ion beam thereby to form a plurality of narrow conductive patterns.

According to the means specified above, the wide conductive pattern having been formed with the laser CVD is etched with a focused ion beam to form a plurality of narrow conductive patterns. This makes it possible to the adjacent conductive patterns form being short-circuited even if the conductive patterns are eider than necessary when the wide conductive pattern is formed with the laser CVD.

BRIEF DESCRIPTION OF THE DRAWINGS

FIG. 9A is a table showing the fundamental strategy of on-chip corrections in Embodiment 9 of the first aspect of the present invention.

FIG. 11D(*b*) is an explanatory diagram showing the detection intensity of secondary electrons;

FIG. 11G(*b*) is a schematic plan view of the processing reference mark in FIG. 11G(*a*).

FIG. 15D(*b*) is an explanatory view showing the intensity of secondary electrons detected;

FIG. 34 is an enlarged sectional view taken along the line X—X of FIG. 33;

FIGS. 35 to 37 are sectional views showing successive steps in the process for producing the LSI shown in FIGS. 33 and 34;

FIGS. 38 and 39 show a method of interconnecting wirings in an IC in accordance with one embodiment of the third aspect of the present invention, FIG. 38 being a fragmentary plan view of the IC, and FIG. 39 being a sectional view taken along the line X—X of FIG. 38;

FIGS. 40 and 41 show other embodiments, respectively, of the third aspect of the present invention;

FIG. 42 shows experimental results of a machining process for forming a notch;

FIG. 43 is a sectional view taken along the line X—X of FIG. 42;

FIG. 44 is a graph showing the experimental results shown in FIG. 42;

FIG. 45 is a sectional view taken along the line Y—Y of FIG. 38;

FIG. 46 is a sectional view taken along the line Z—Z of FIG. 45;

FIGS. 47 to 49 show in combination an example of a machining method which enables elimination of a step from the machined surface;

FIG. 50 is a sectional view taken along the line Y—Y of FIG. 38, which shows experimental results of the example shown in FIGS. 47 to 49;

FIG. 51A is an enlarged plan view of pertinent portions of a semiconductor wafer showing a semiconductor device manufacturing method according to embodiment 1 of the fourth aspect of the present invention;

Figure 51A:
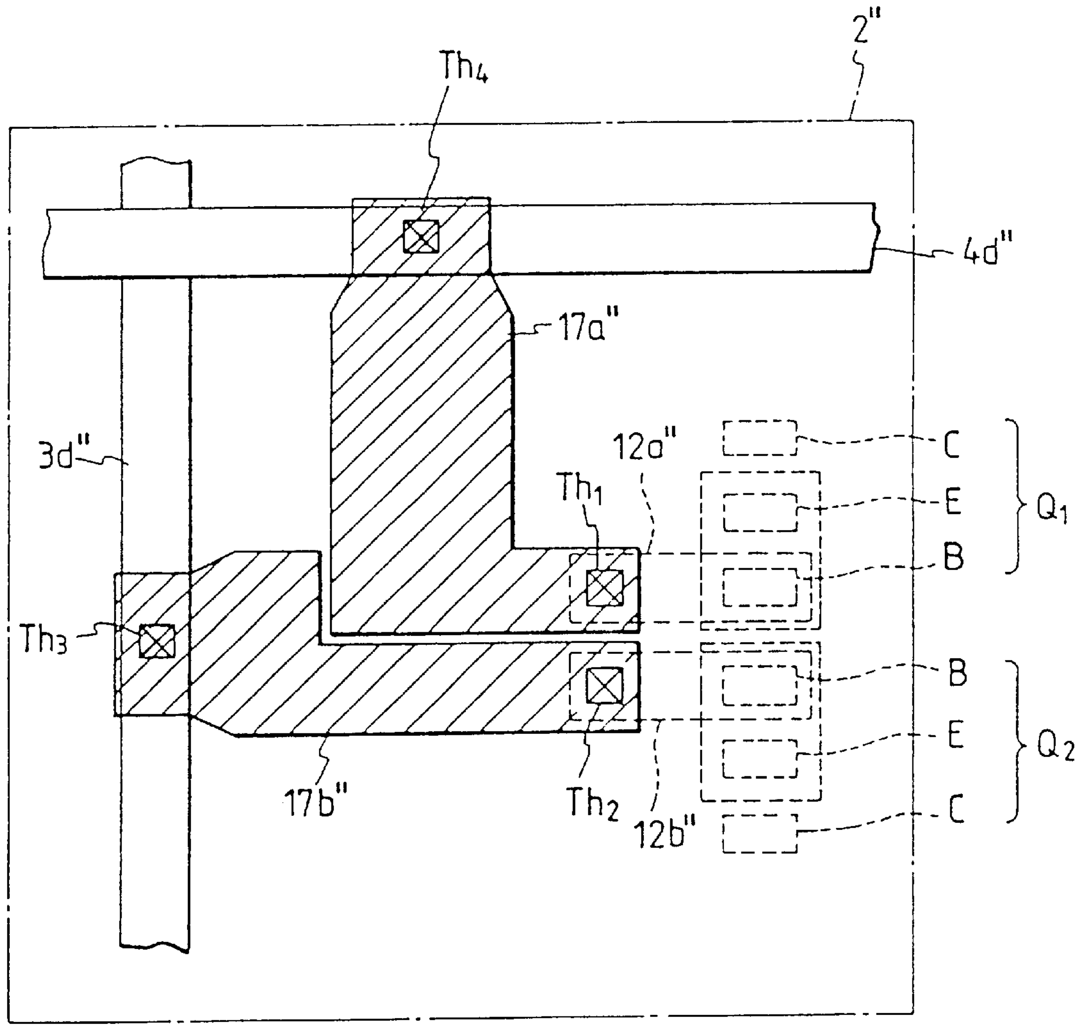
Figure 51B:
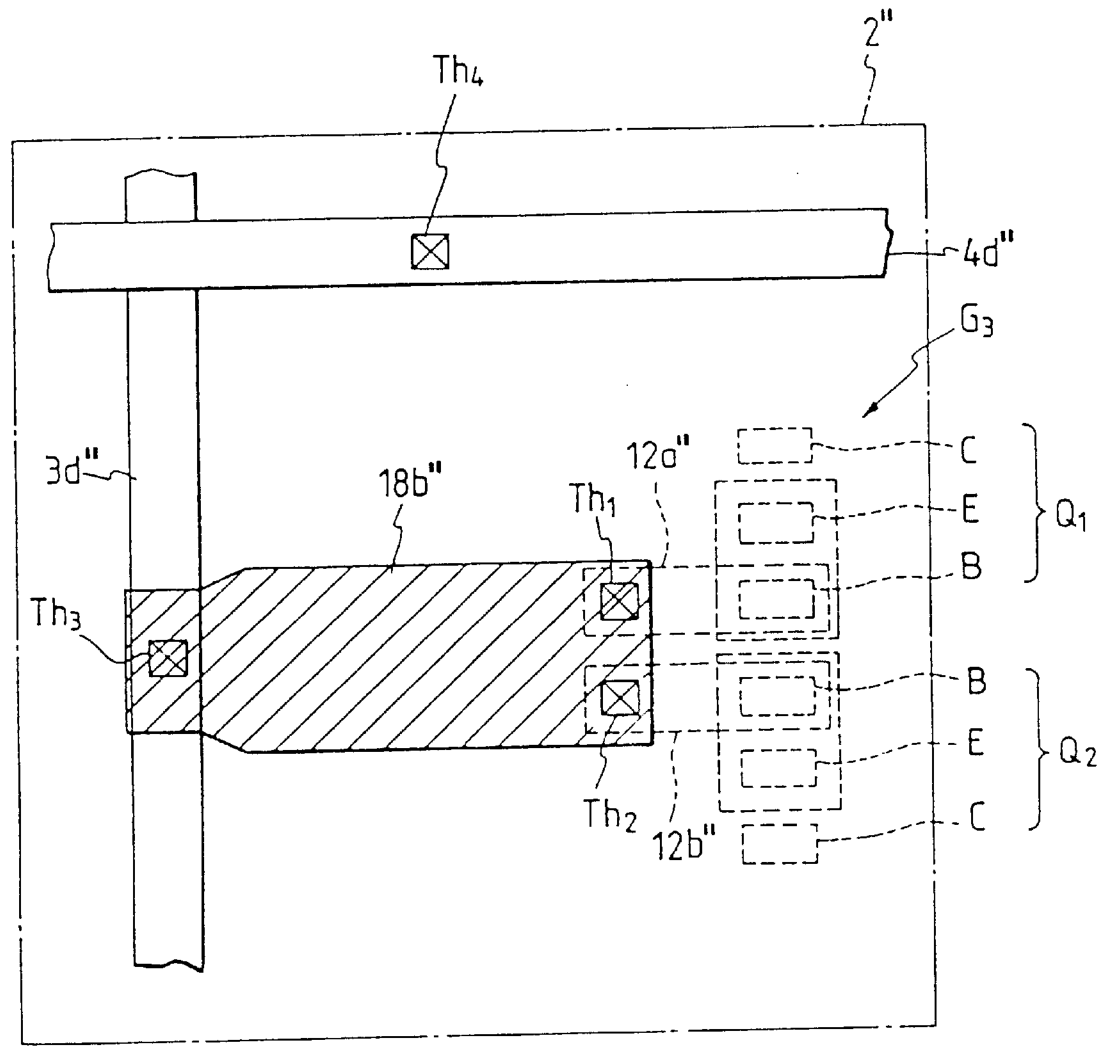
Figure 51C:
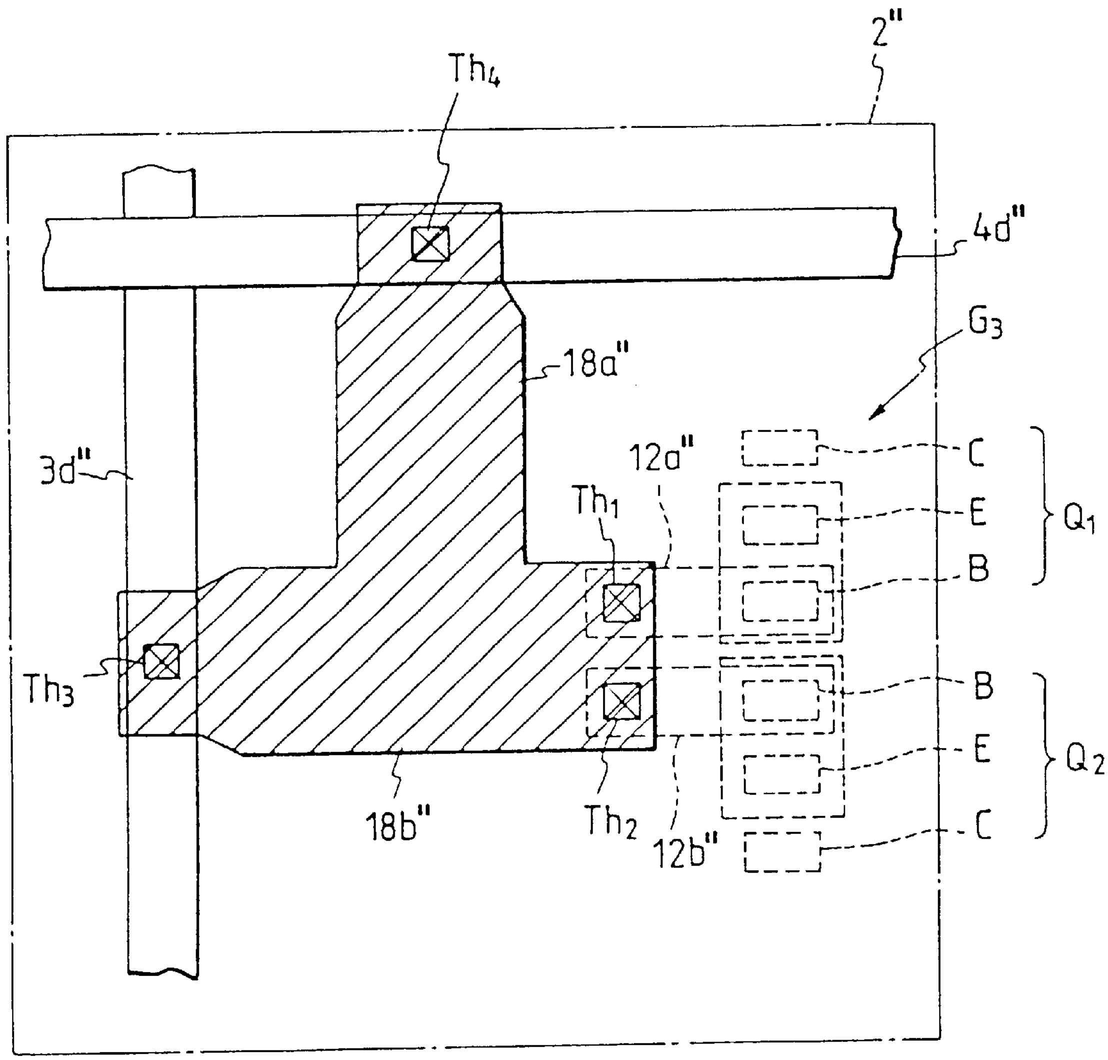
Figure 51D:
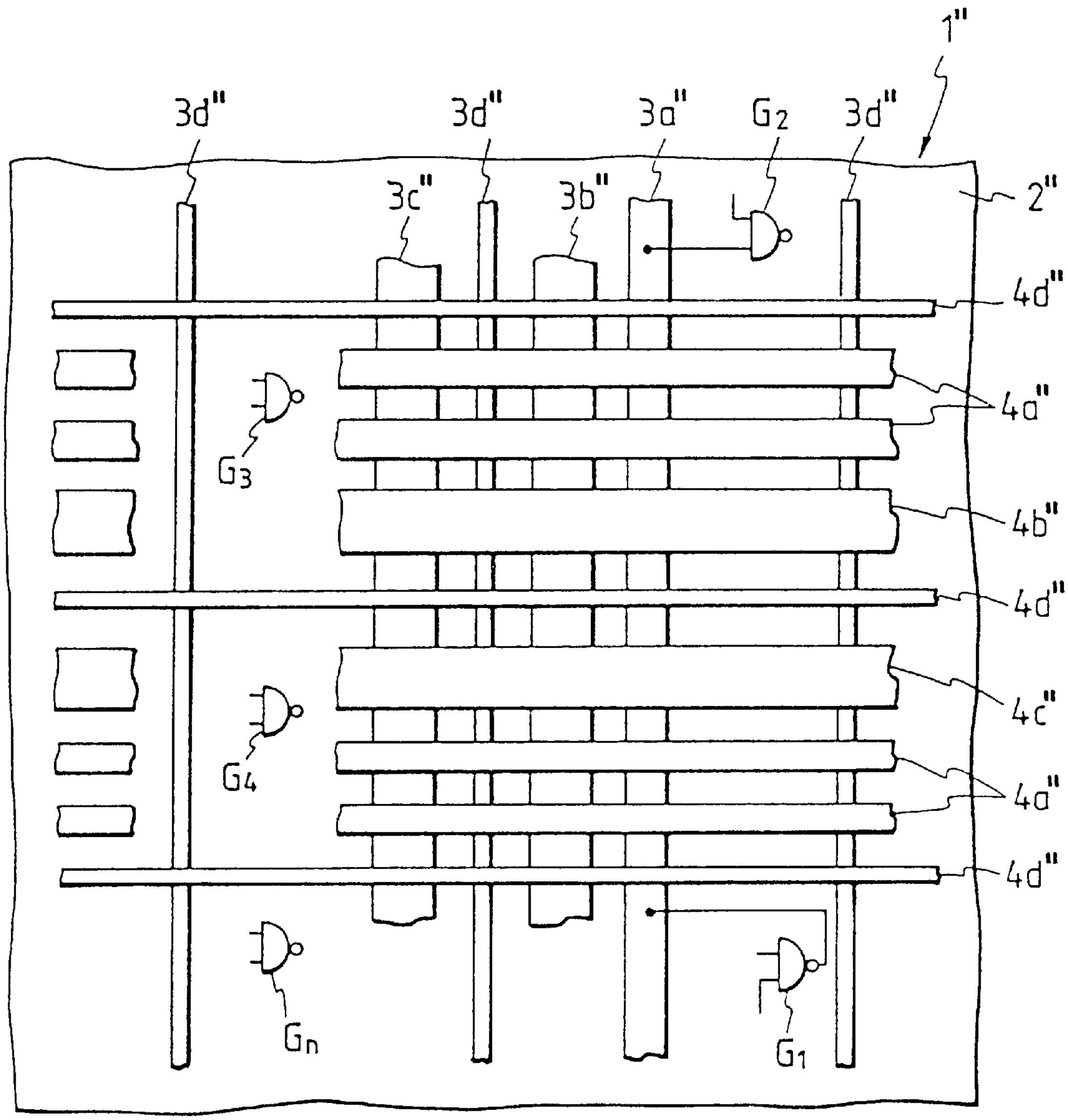
Figure 51E:
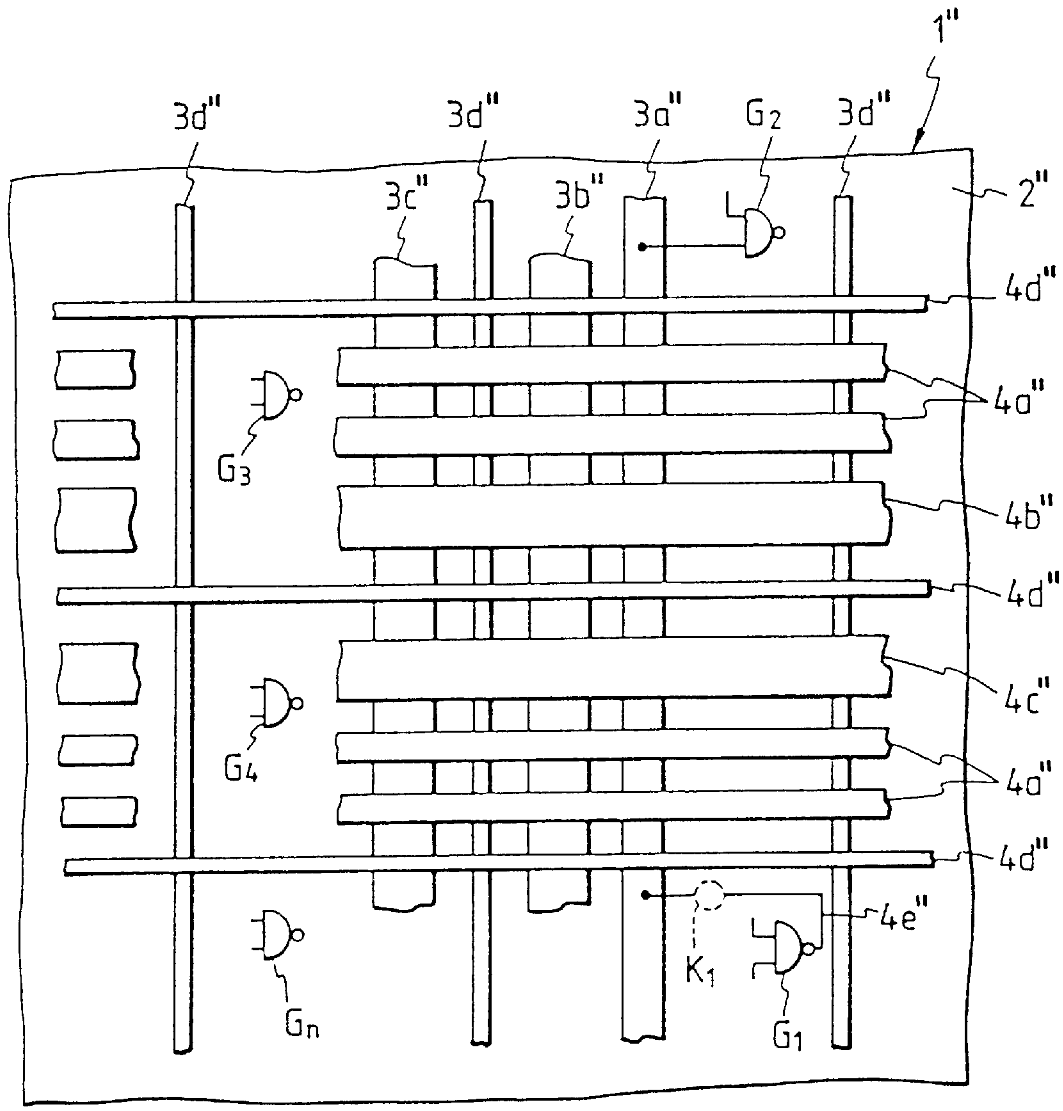
Figure 51F:
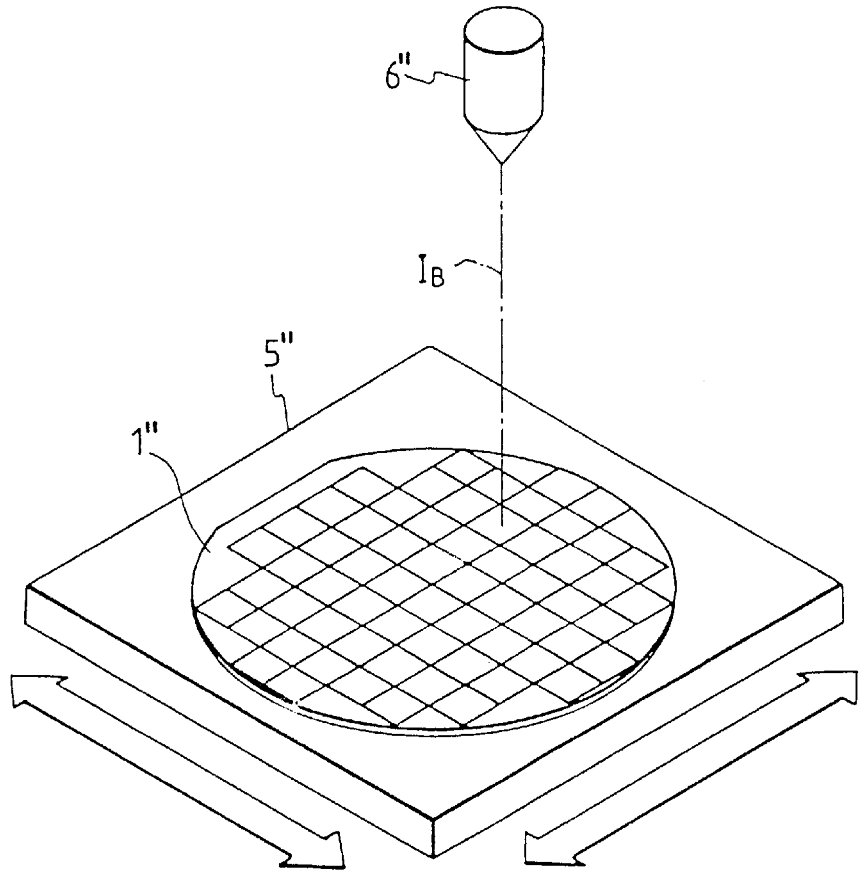
Figure 51G:
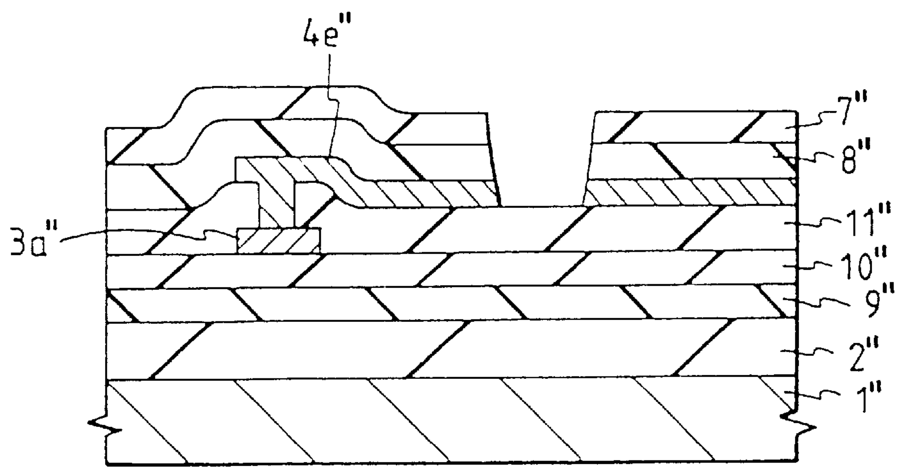
Figure 51H:
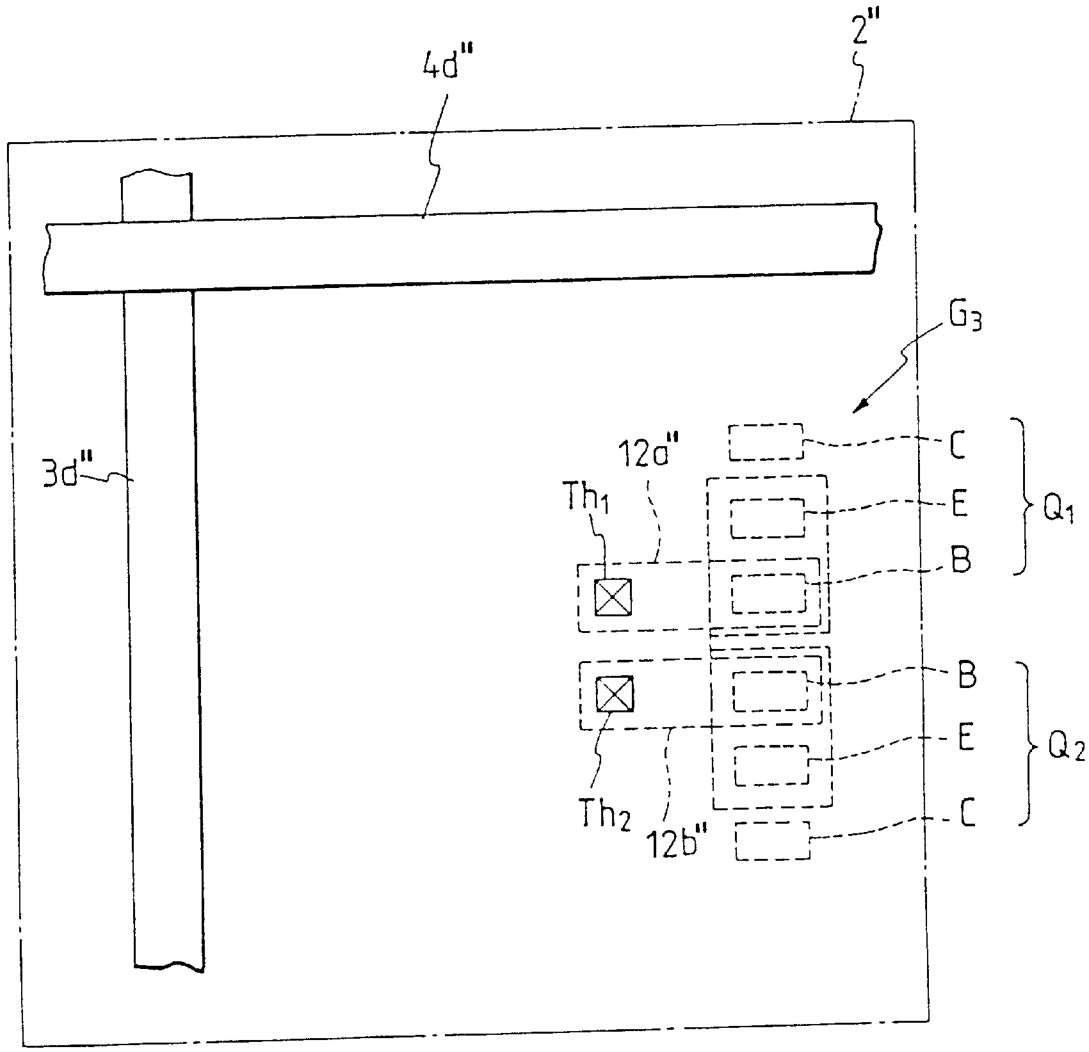
Figure 51I:
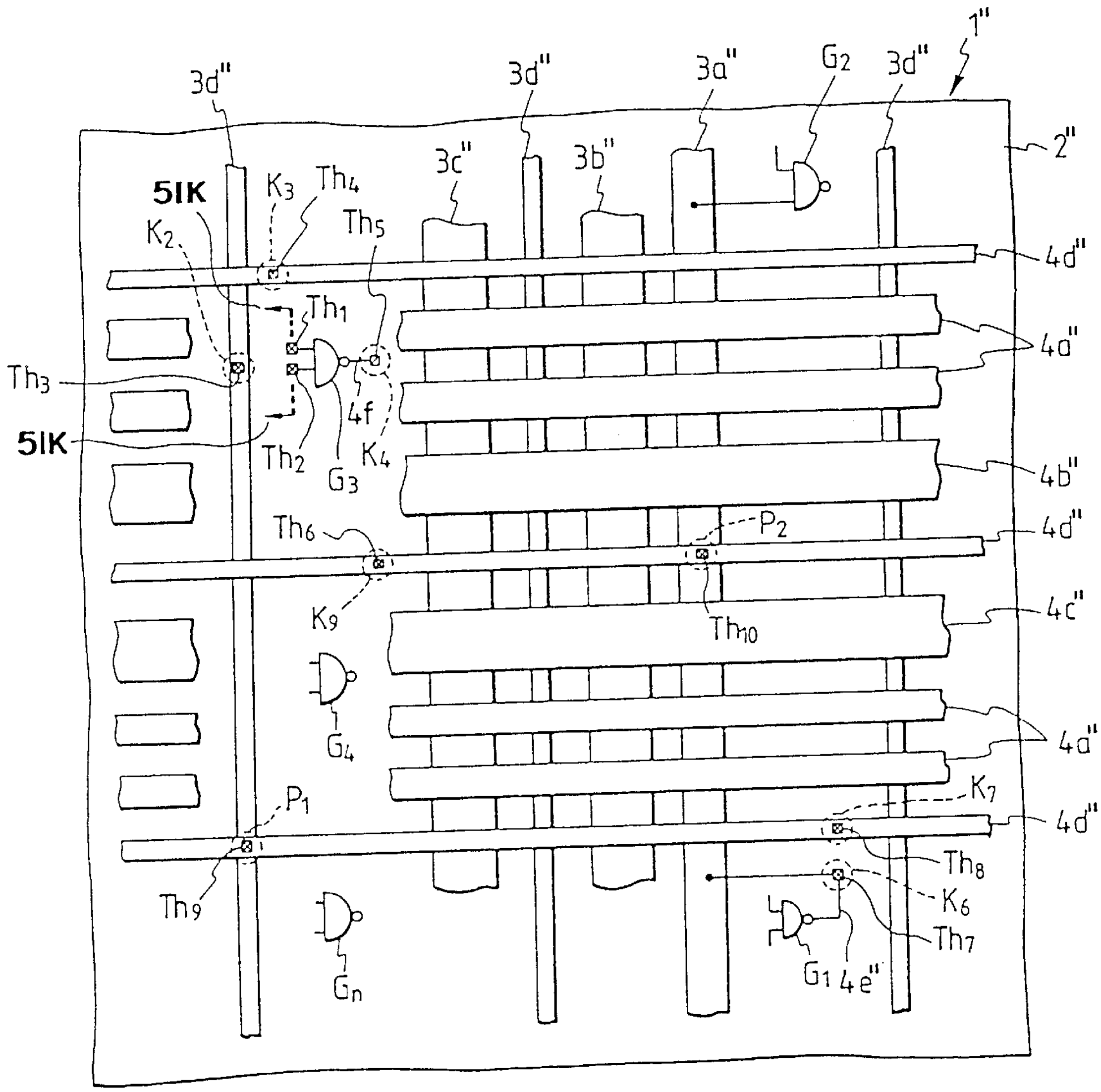
Figure 51J:
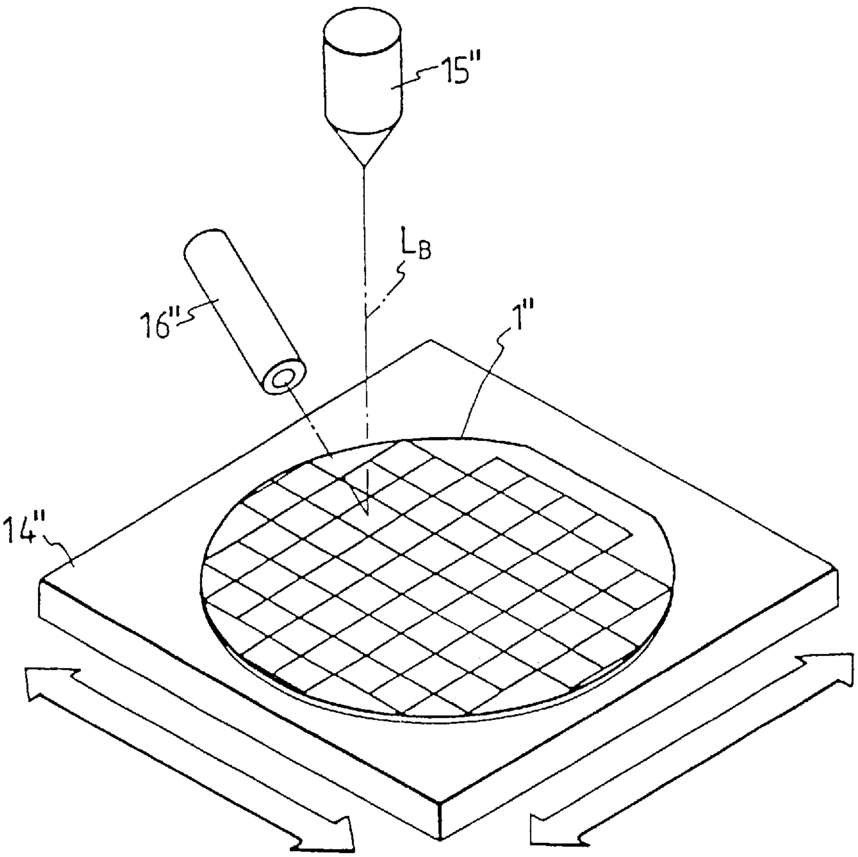
Figure 51K:
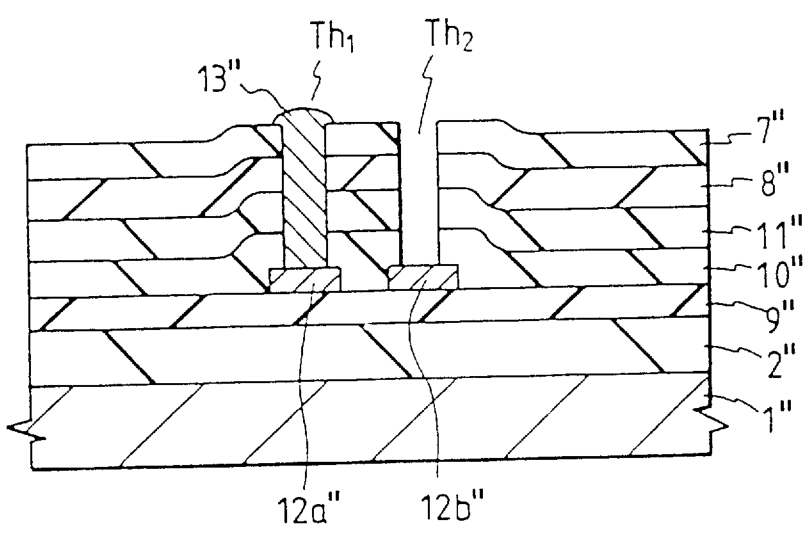
Figure 51L:
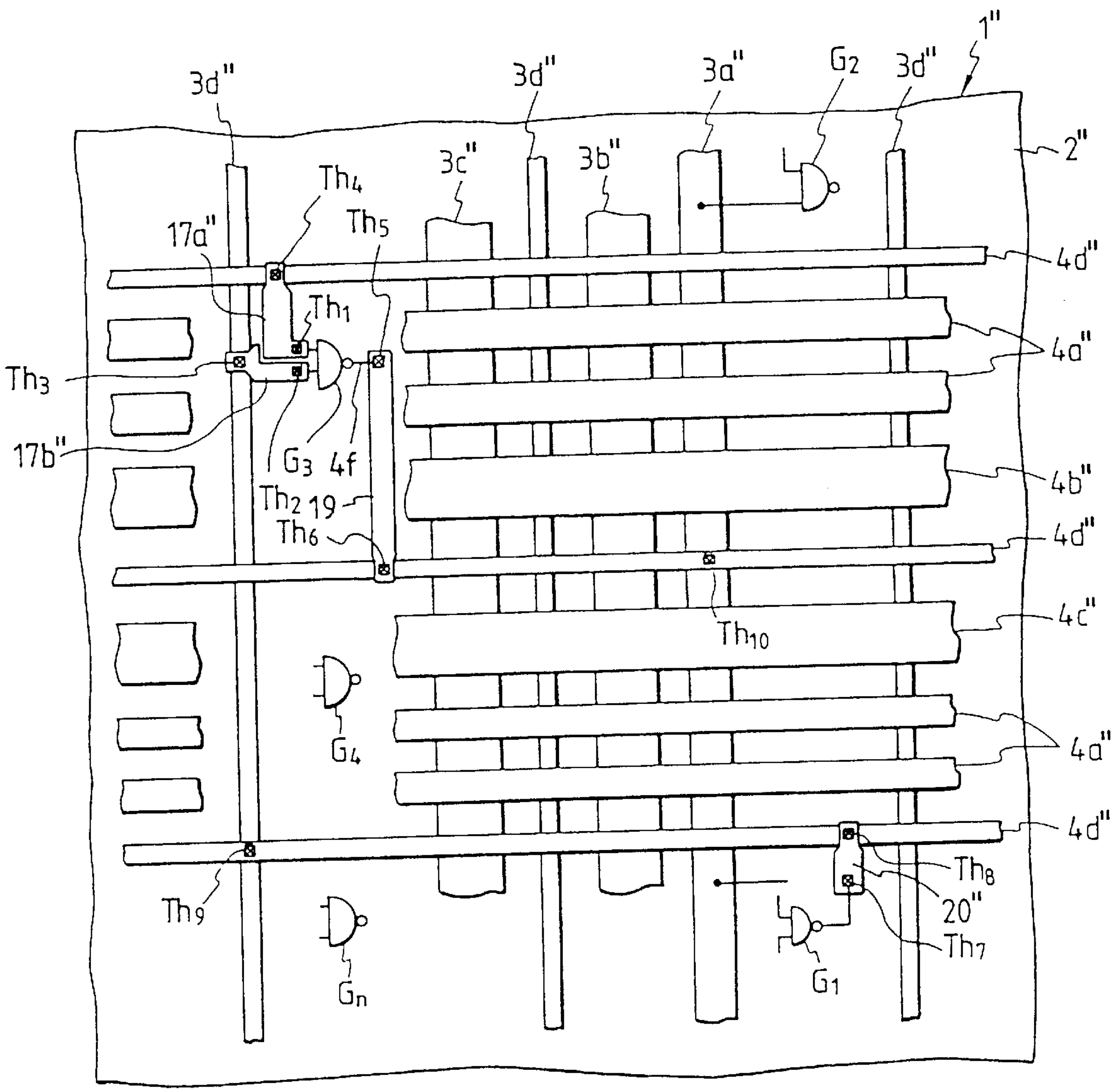
Figure 51M:
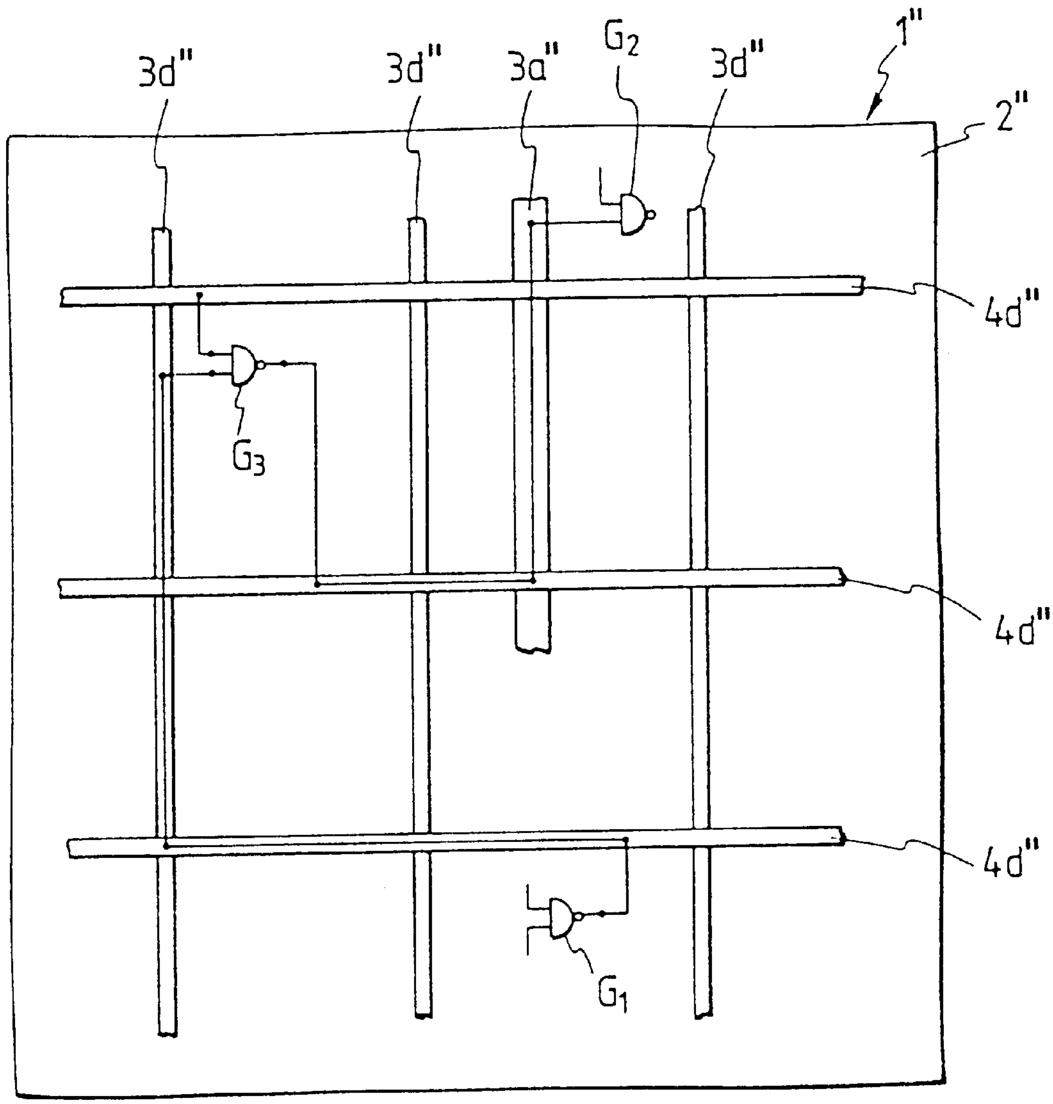
Figure 52:
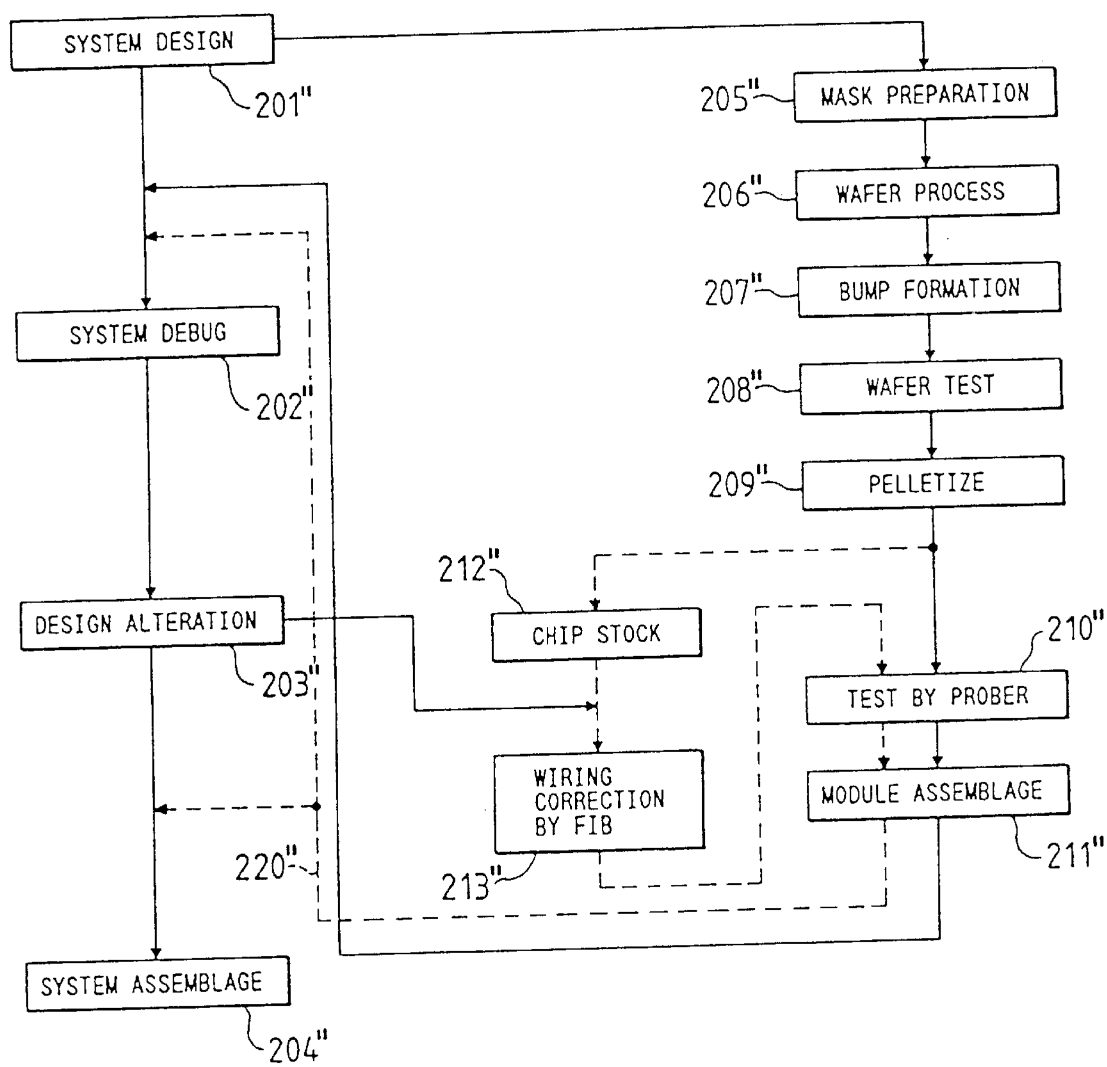
Figure 53A:
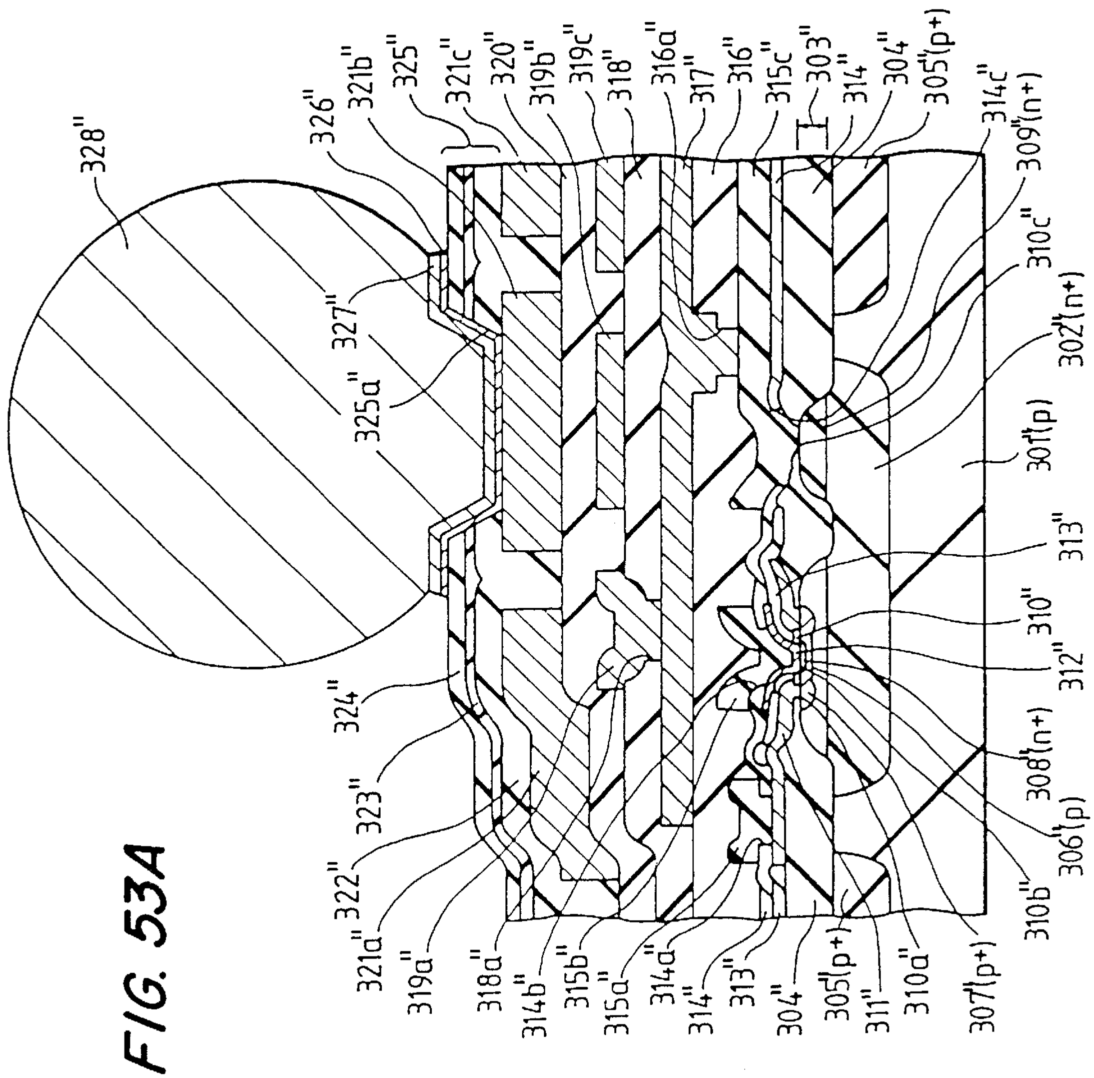
Figure 53B:
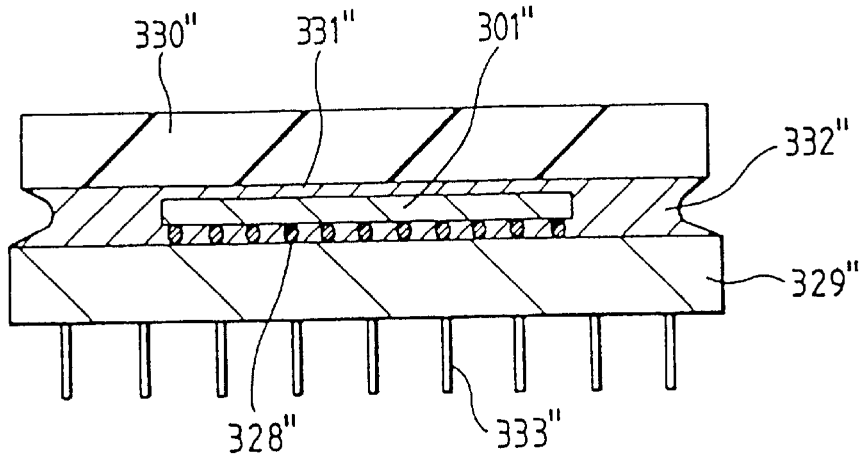
Figure 54B:
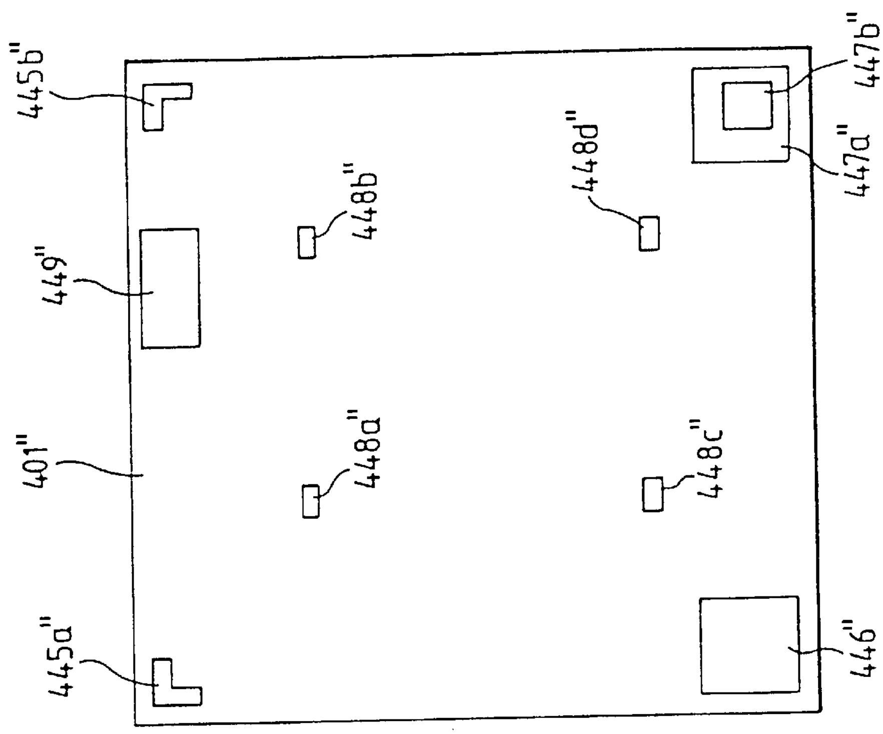
Figure 54A:
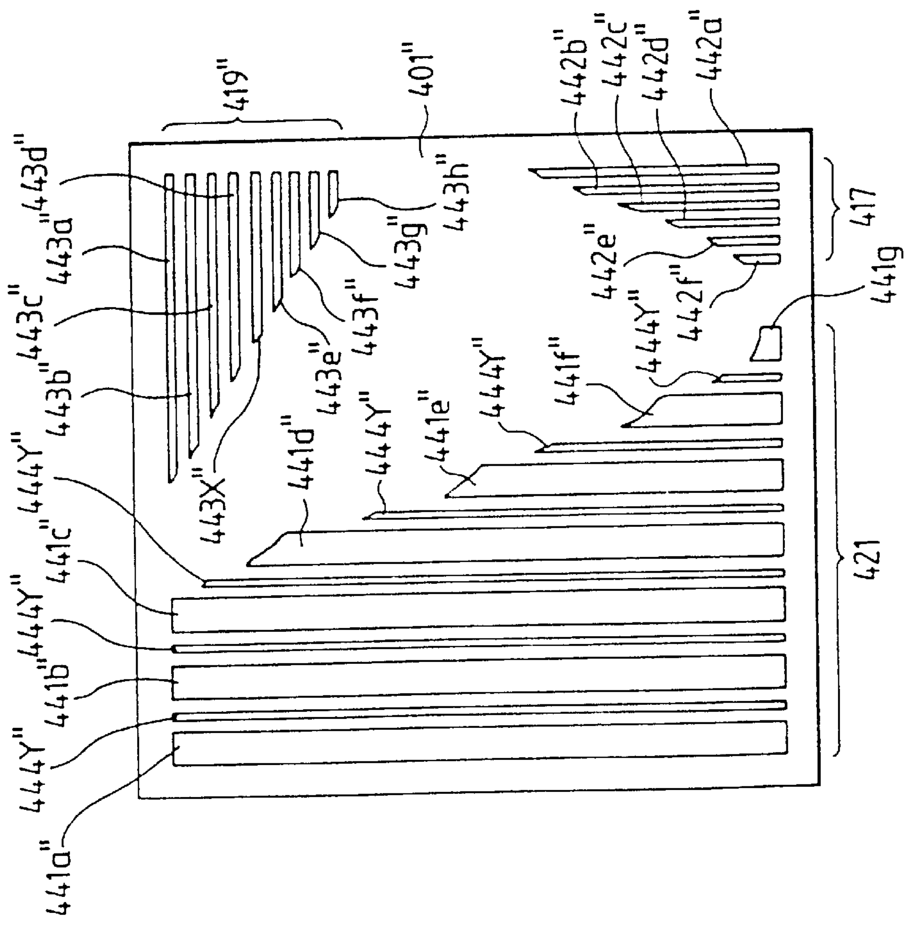
Figure 54C:
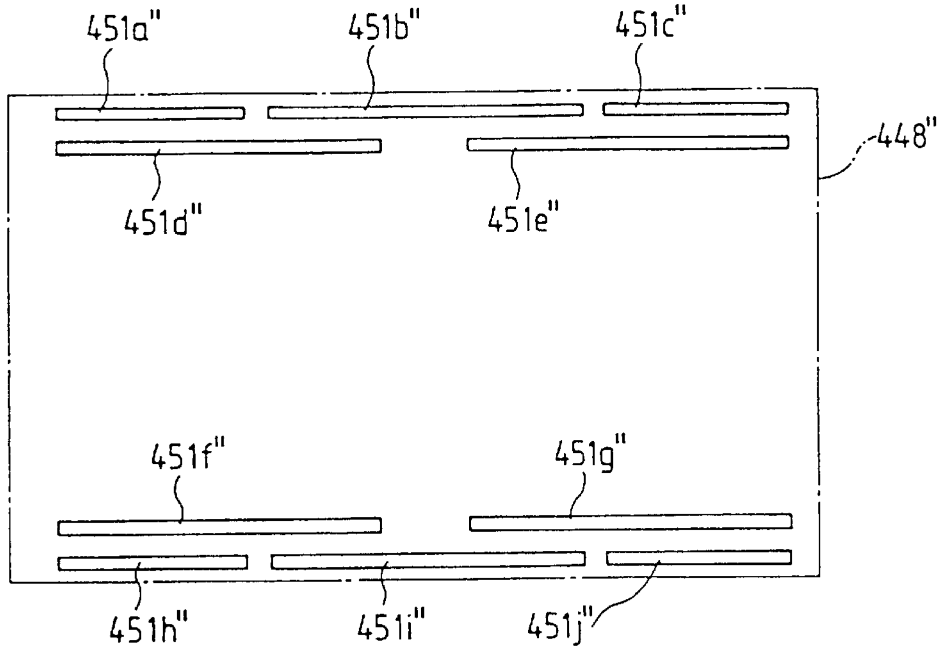
Figure 54D:
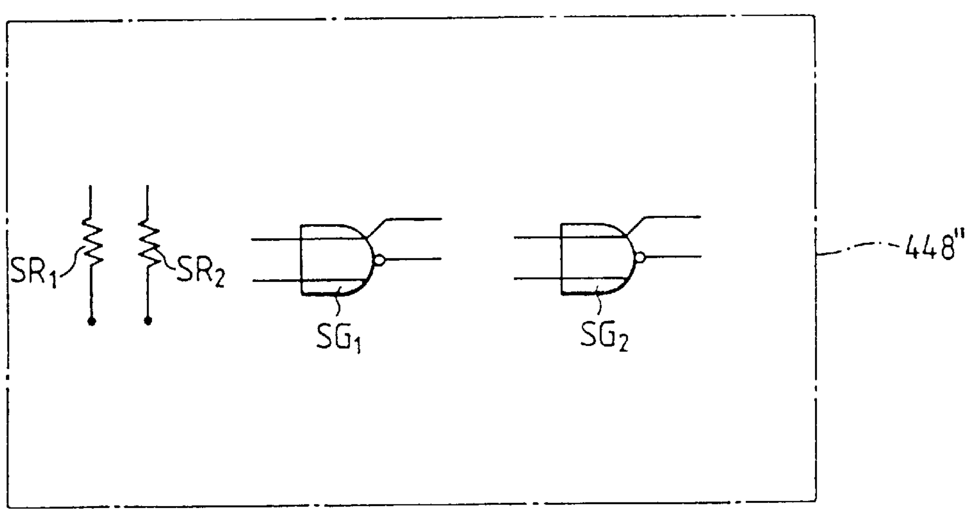
Figure 54E:
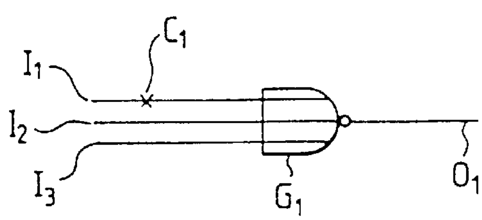
Figure 54F:
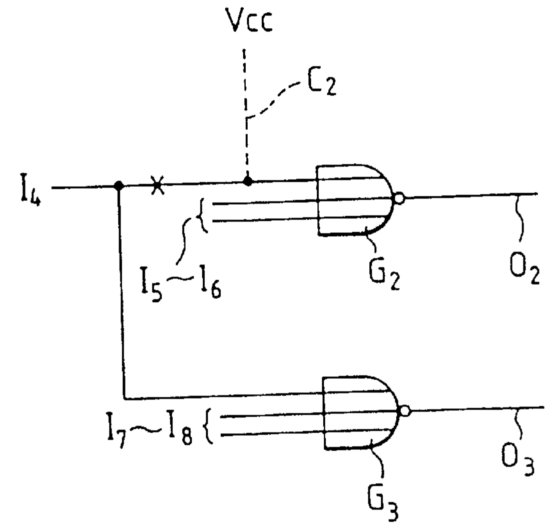
Figure 54G:
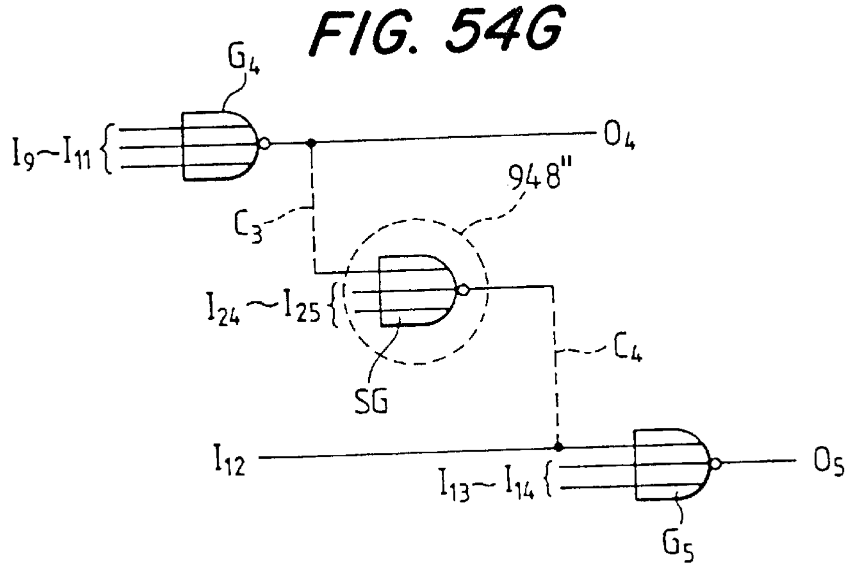
Figure 54H:
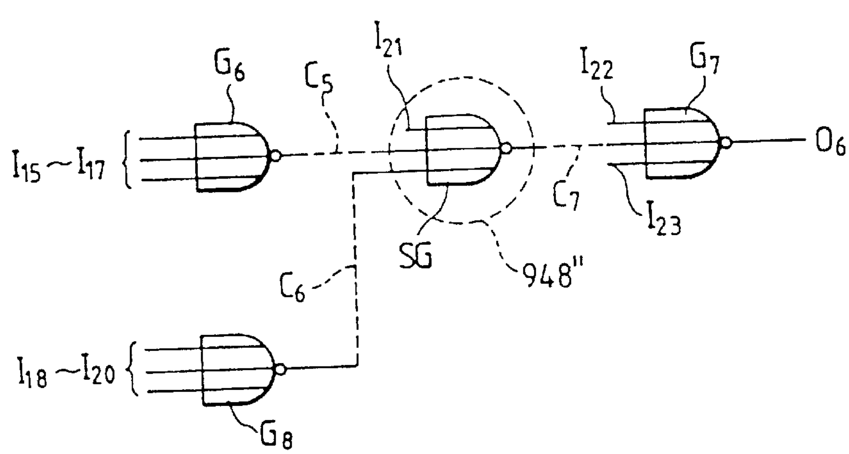
Figure 54I:
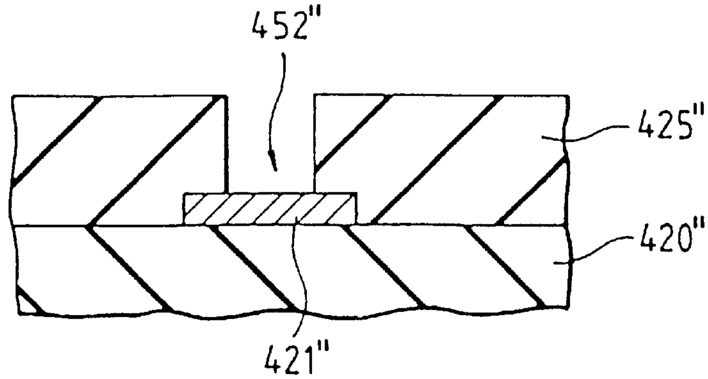
Figure 54I:
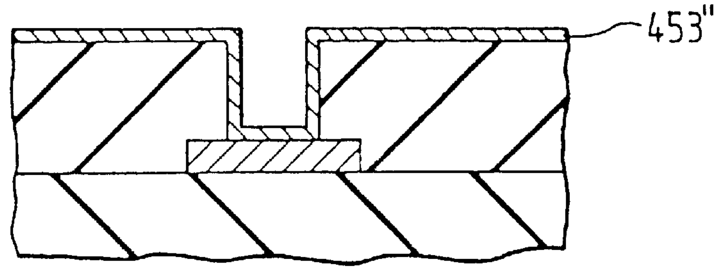
Figure 54I:
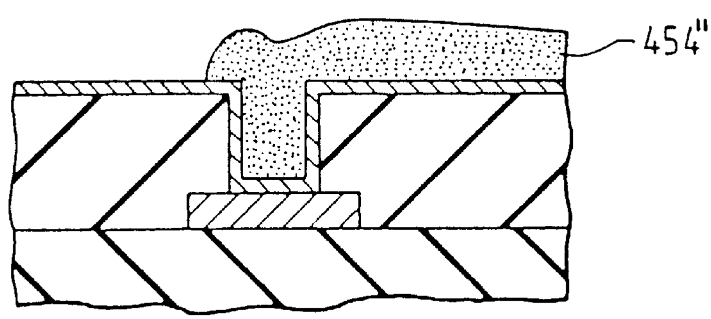
Figure 54I:
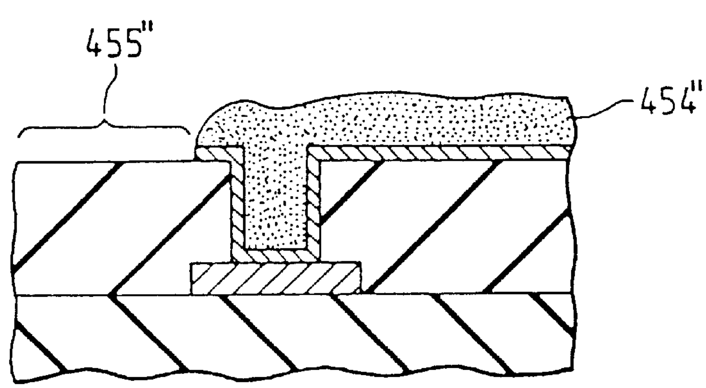
Figure 54J:
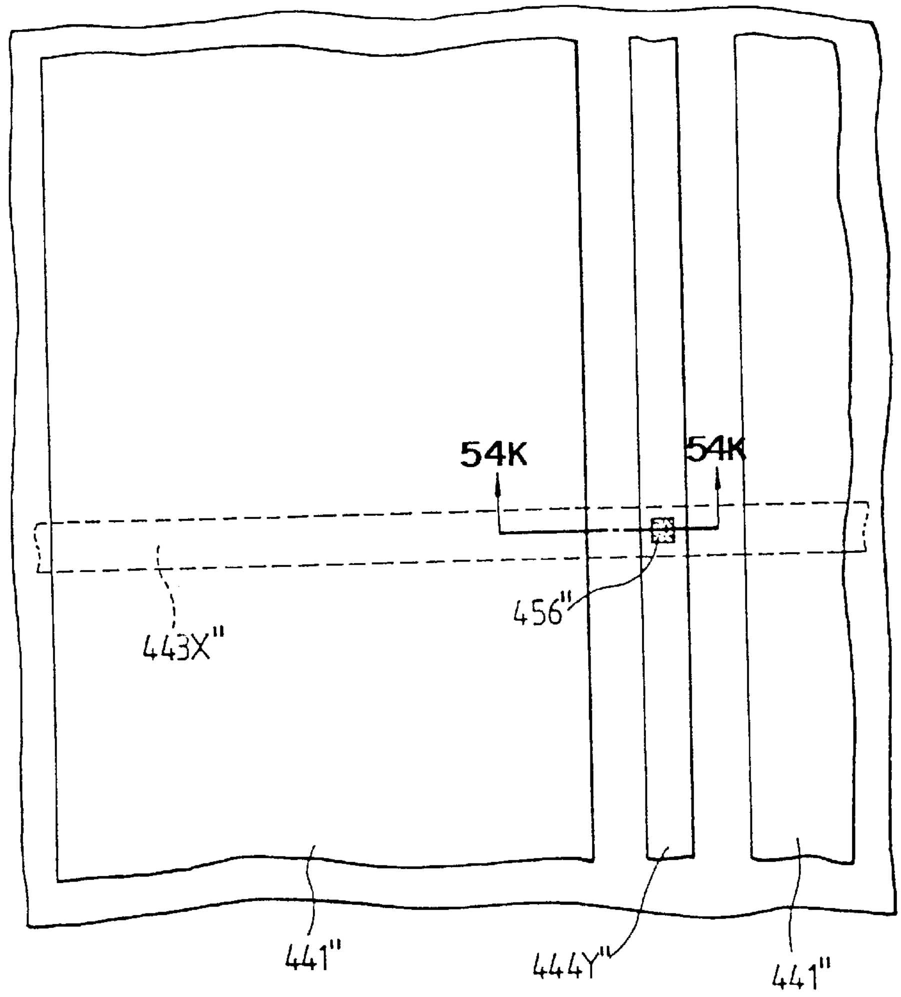
Figure 54K:
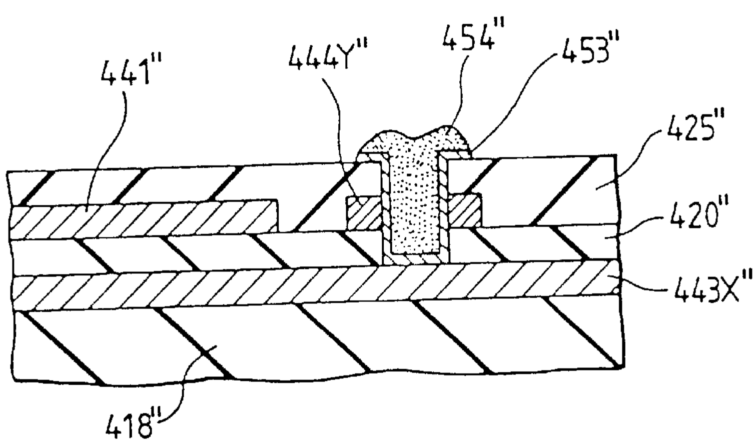
Figure 54L:
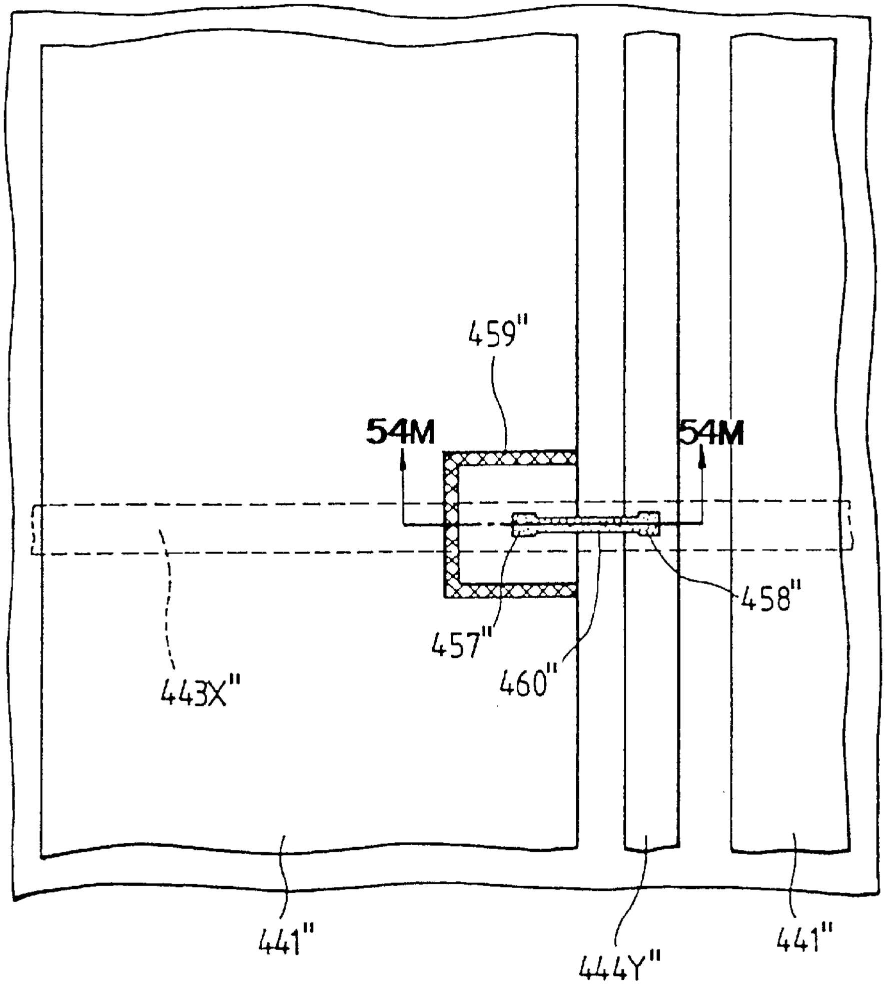
Figure 54M:
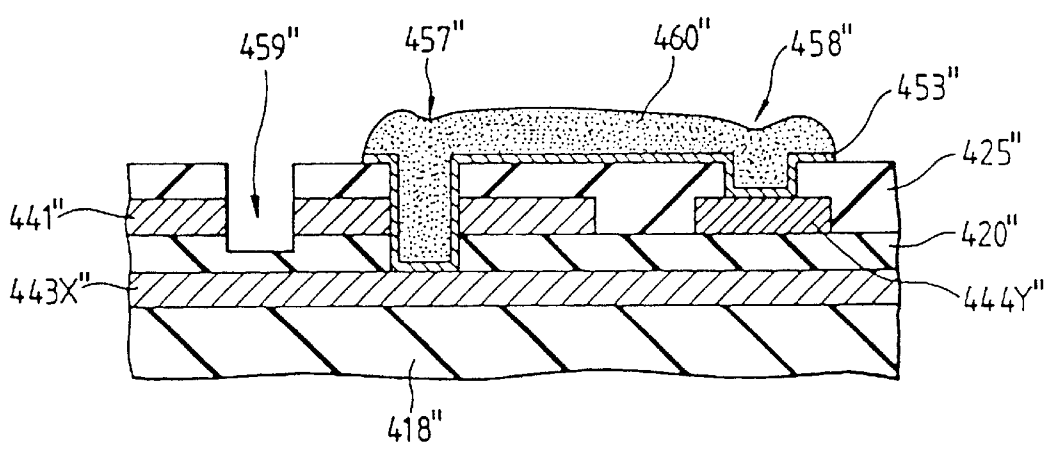
Figure 54N:
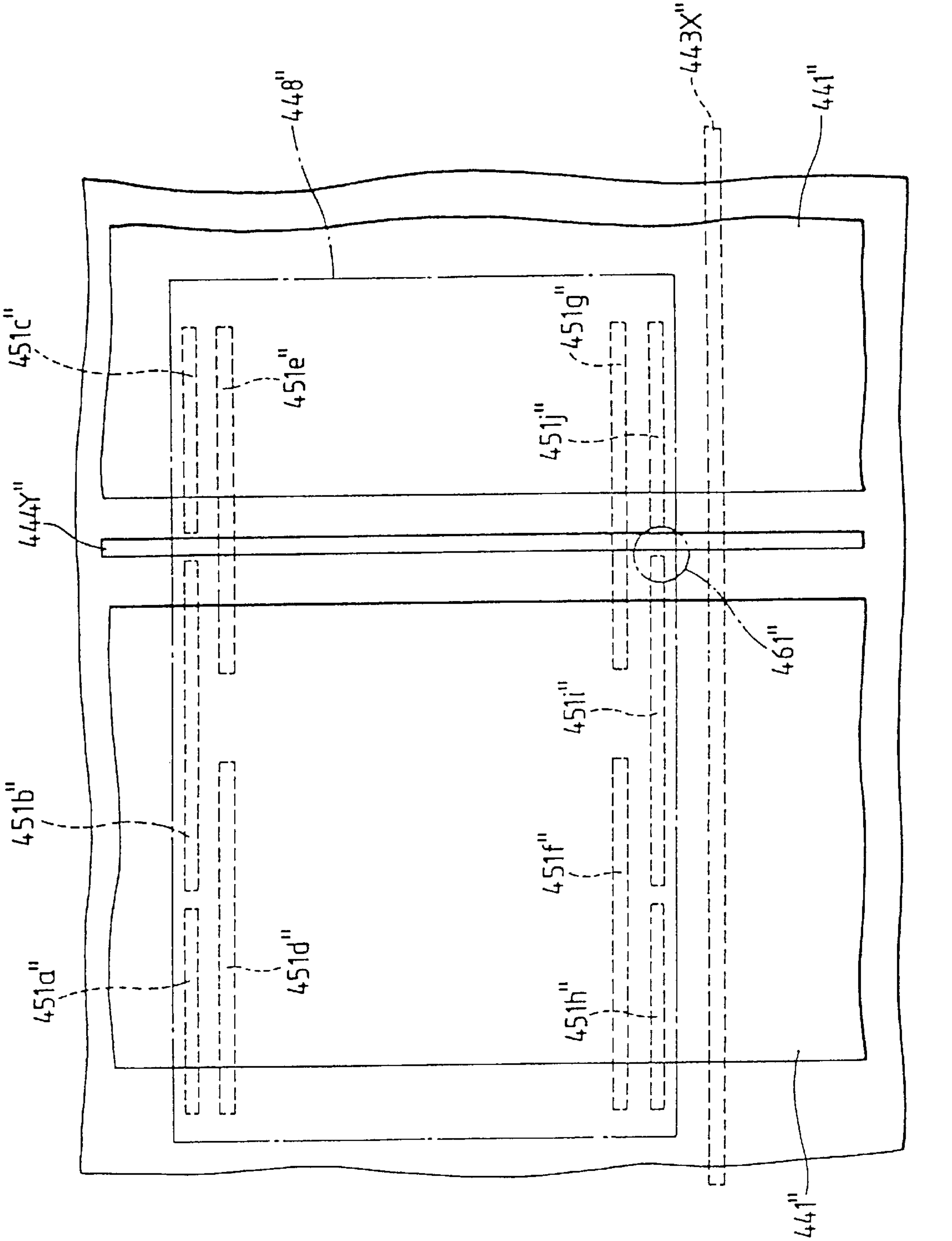
Figure 54O:
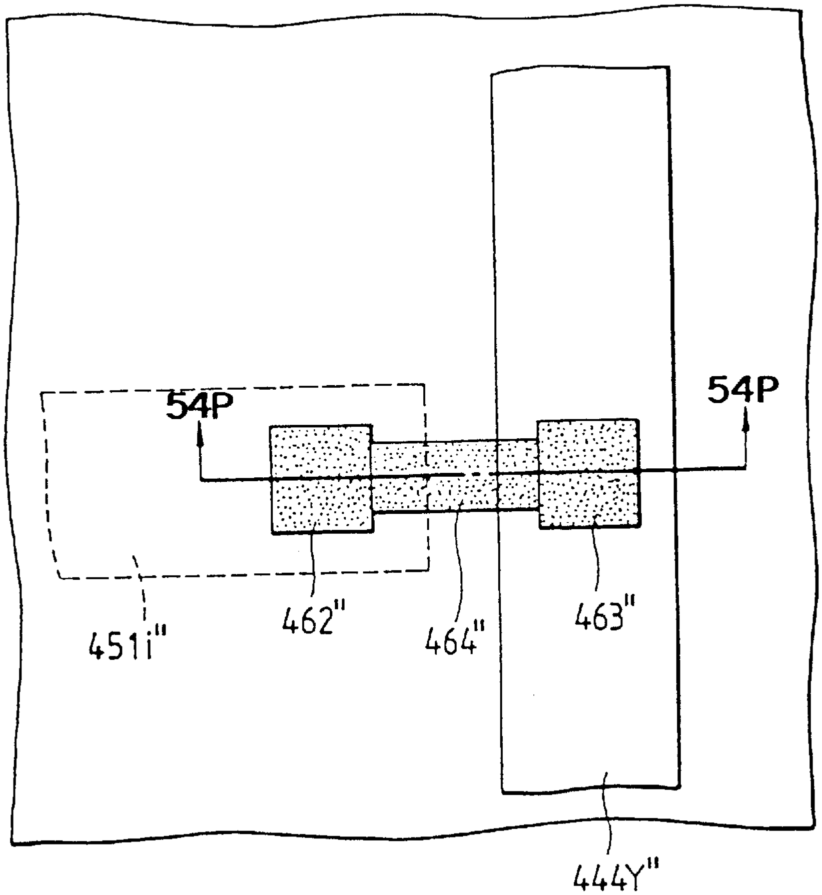
Figure 54P:
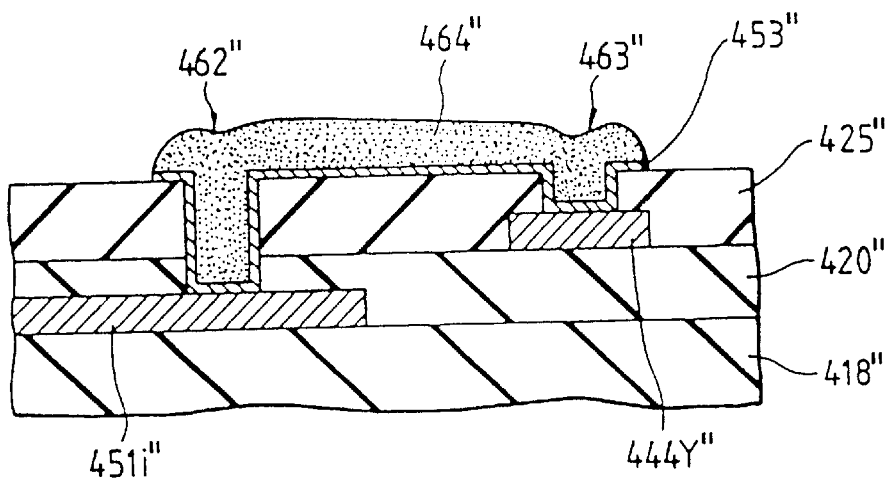
Figure 54Q:
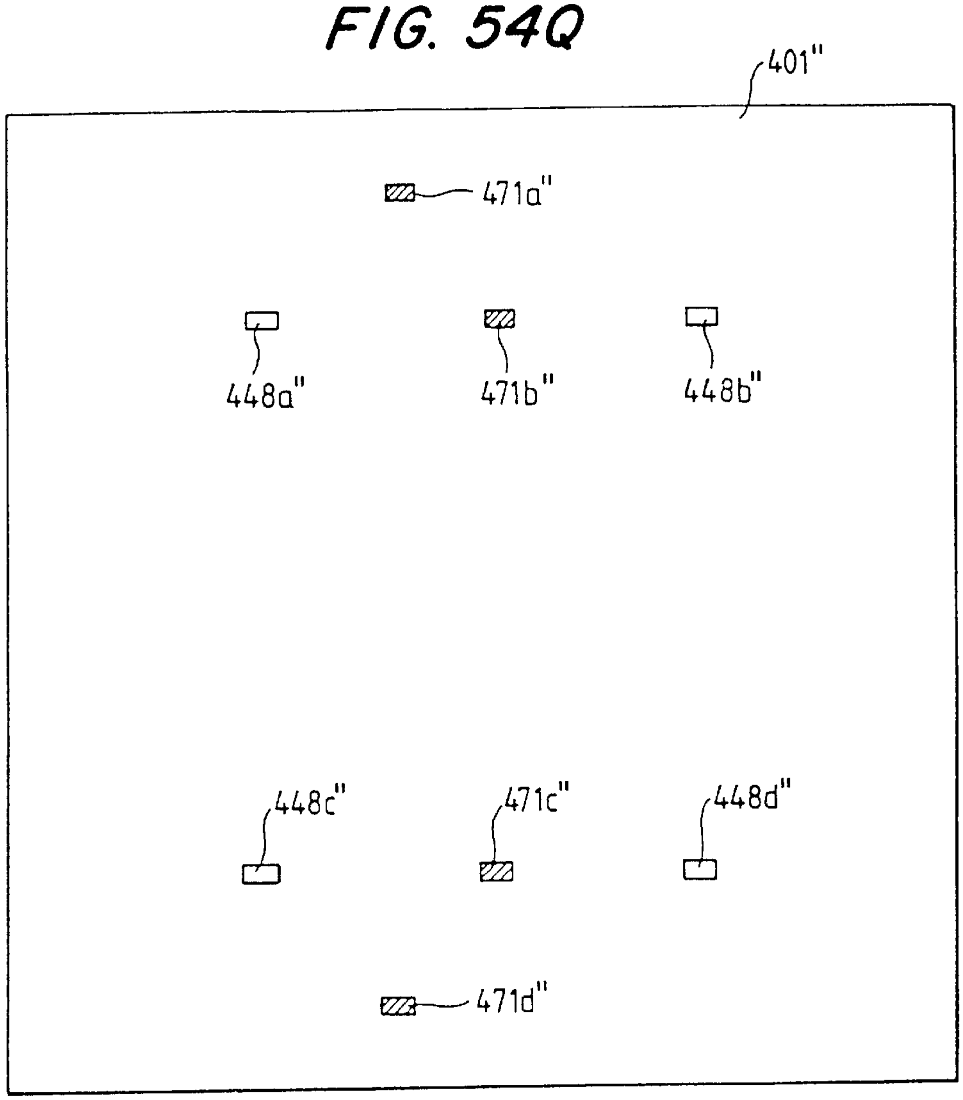
Figure 54S:
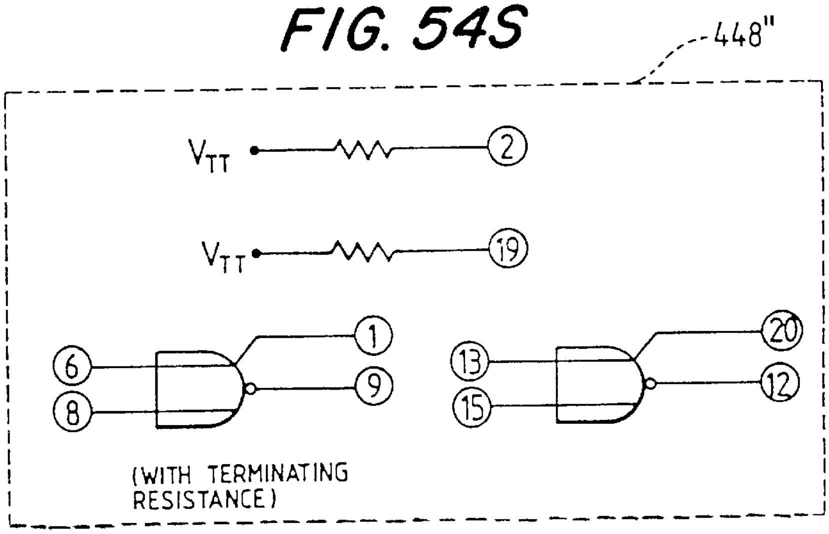
Figure 54R:
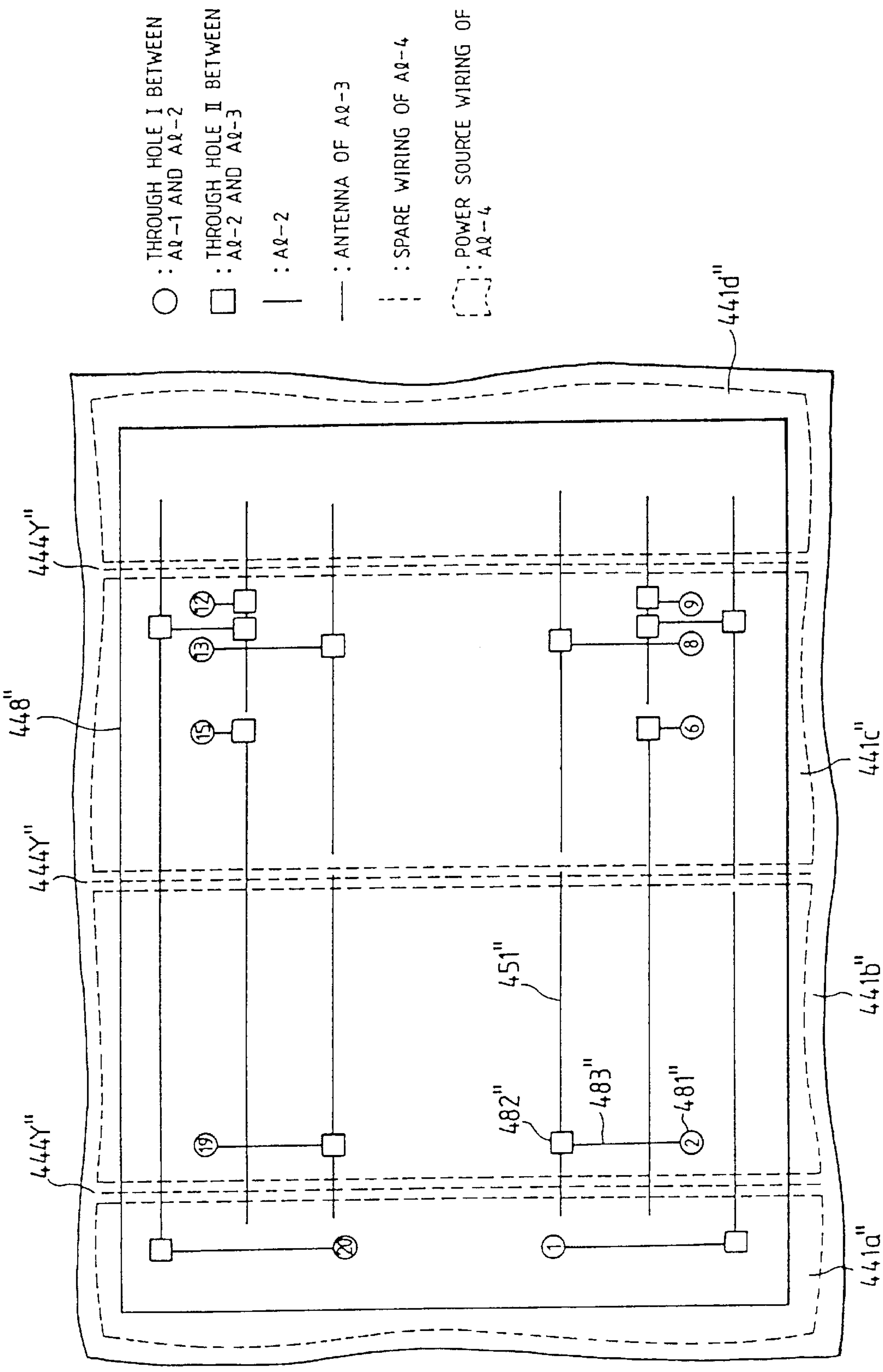
Figure 55A:
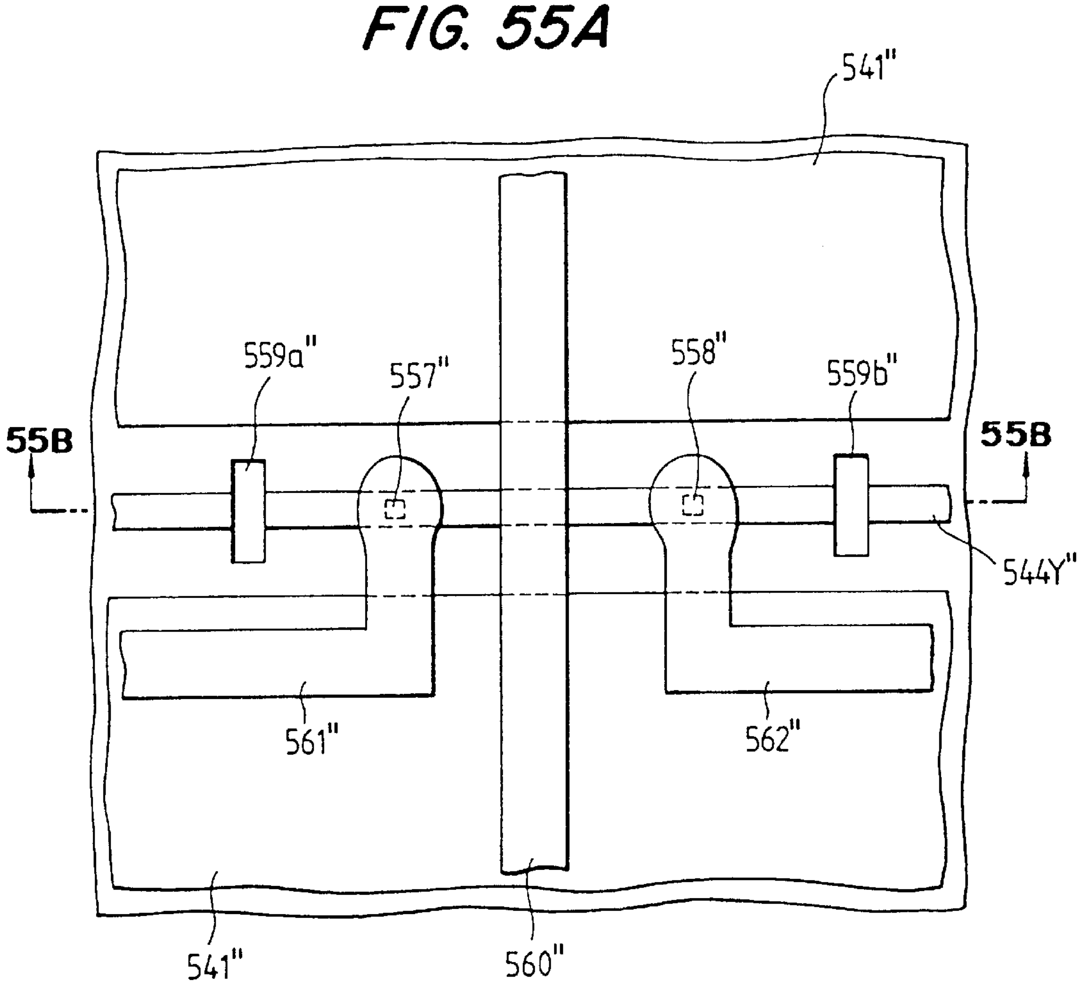
Figure 55B:
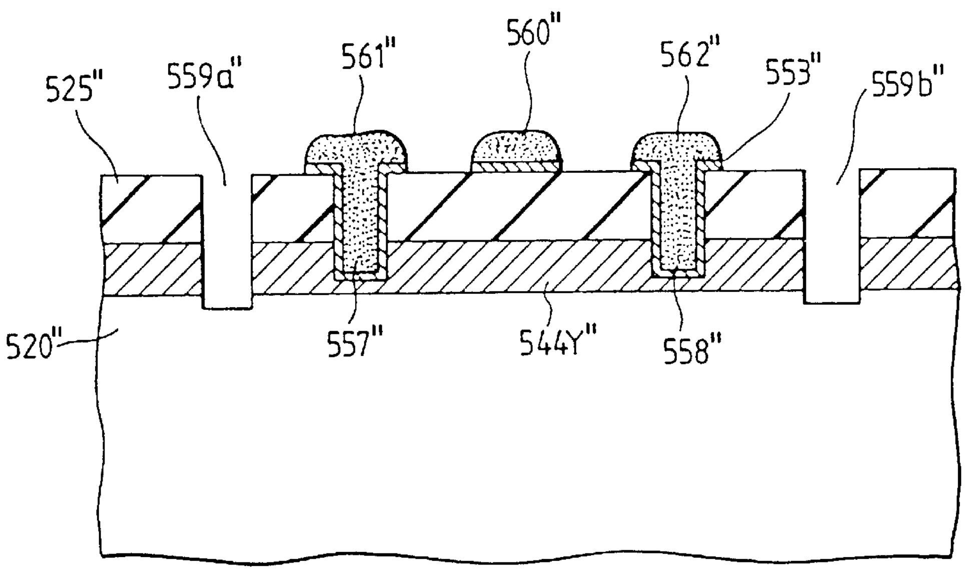
Figure 56:
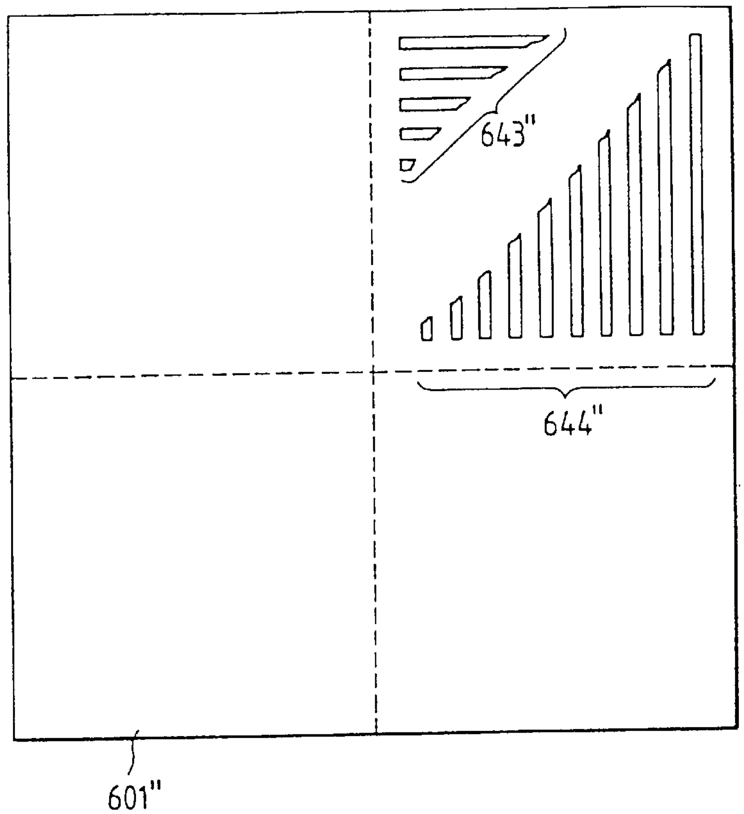
Figure 57A:
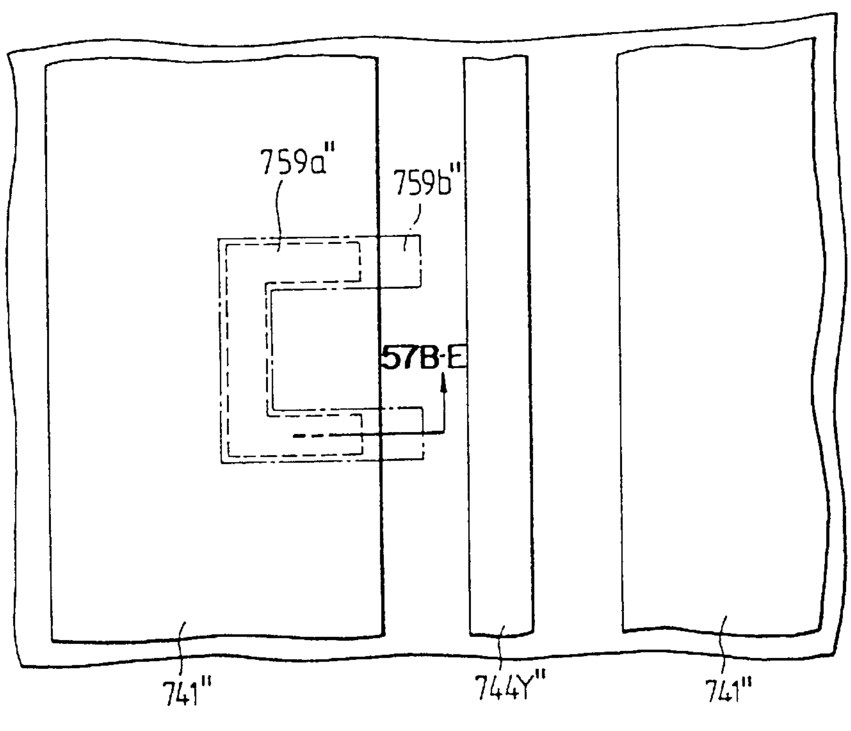
Figure 57B:
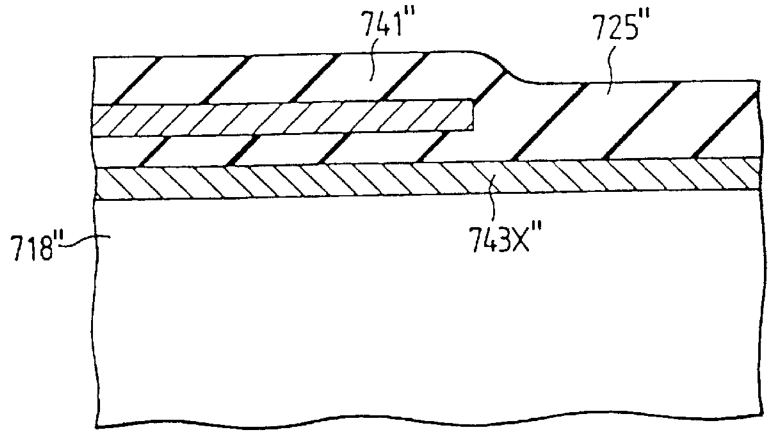
Figure 57C:
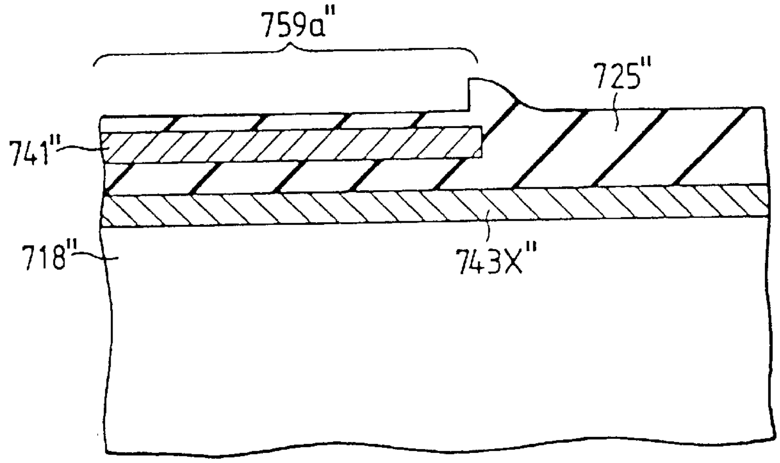
Figure 57D:
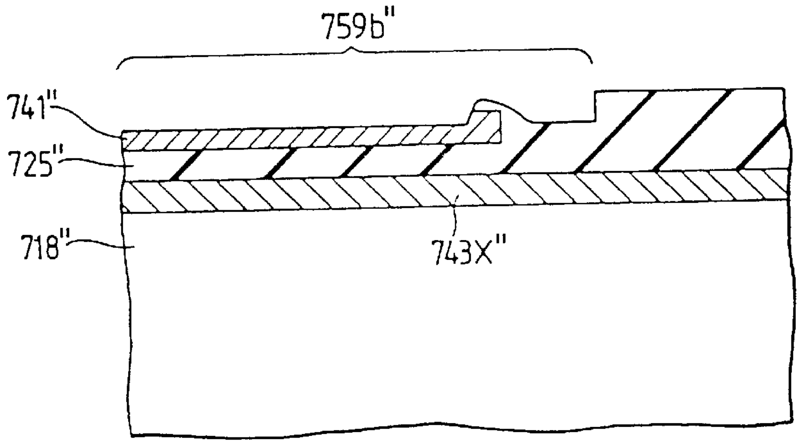
Figure 57E:
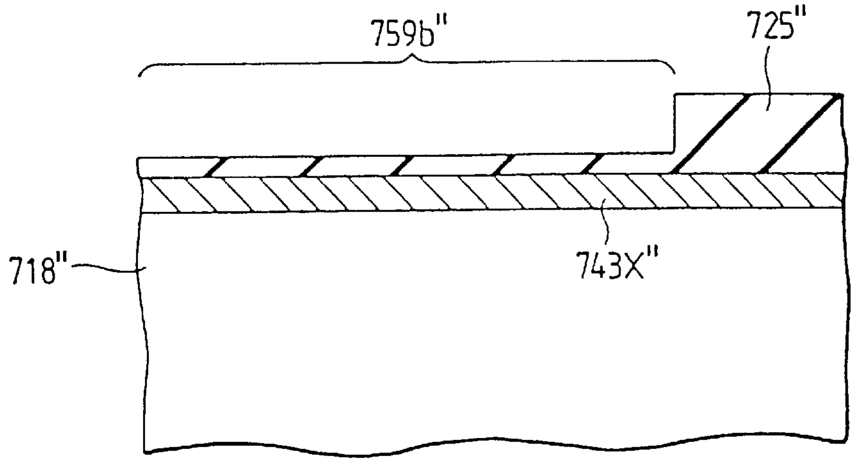
Figure 57F:
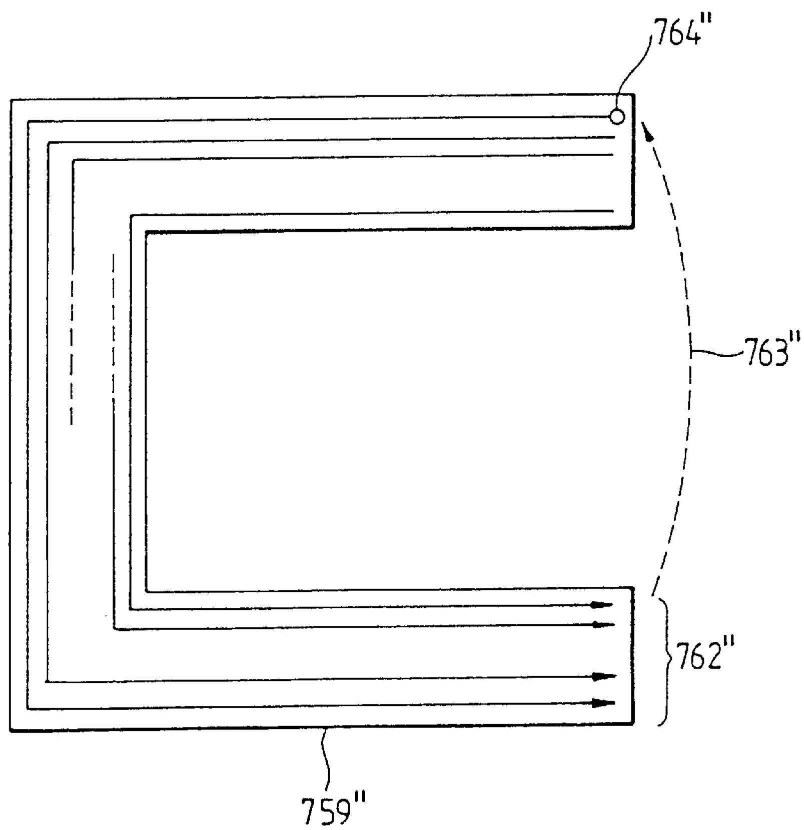
Figure 58A:
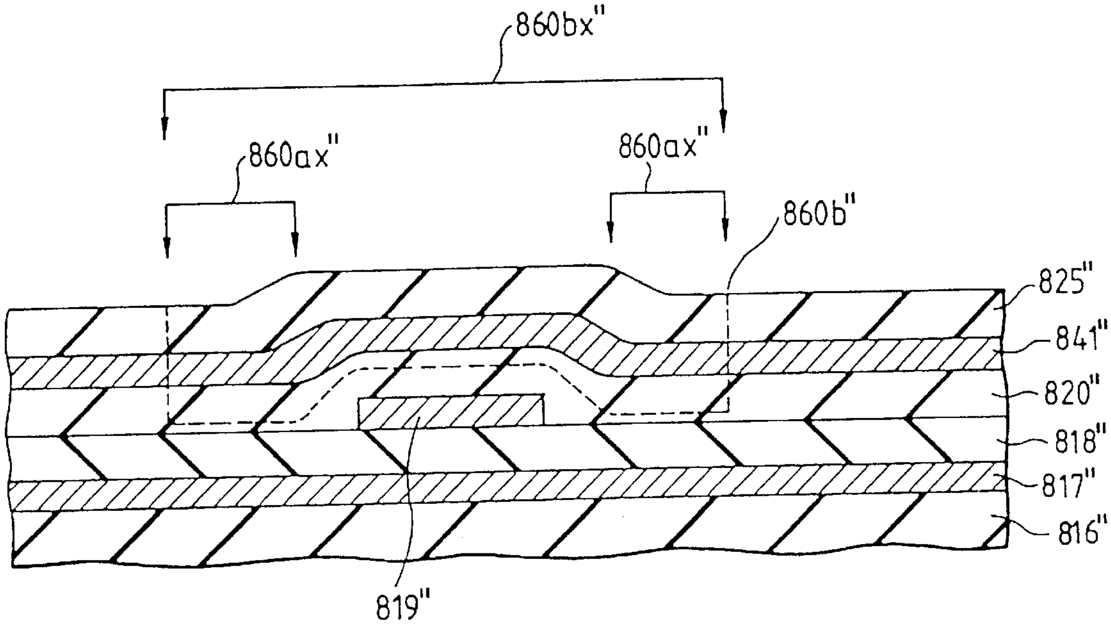
Figure 58B:
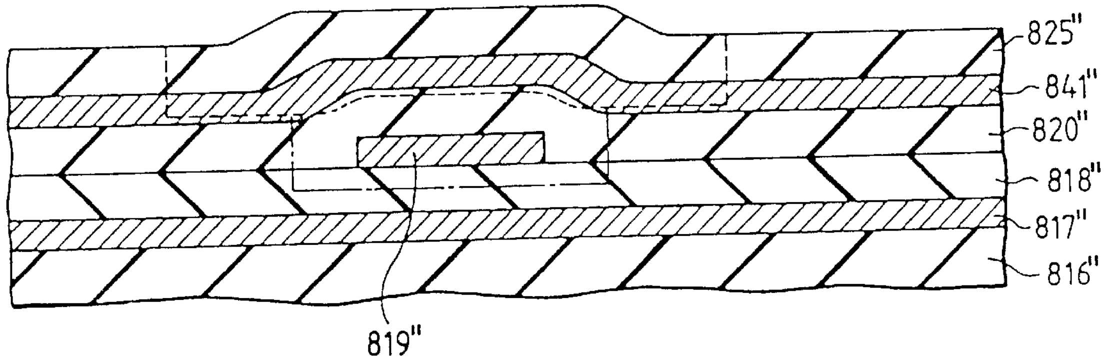
Figure 58C:
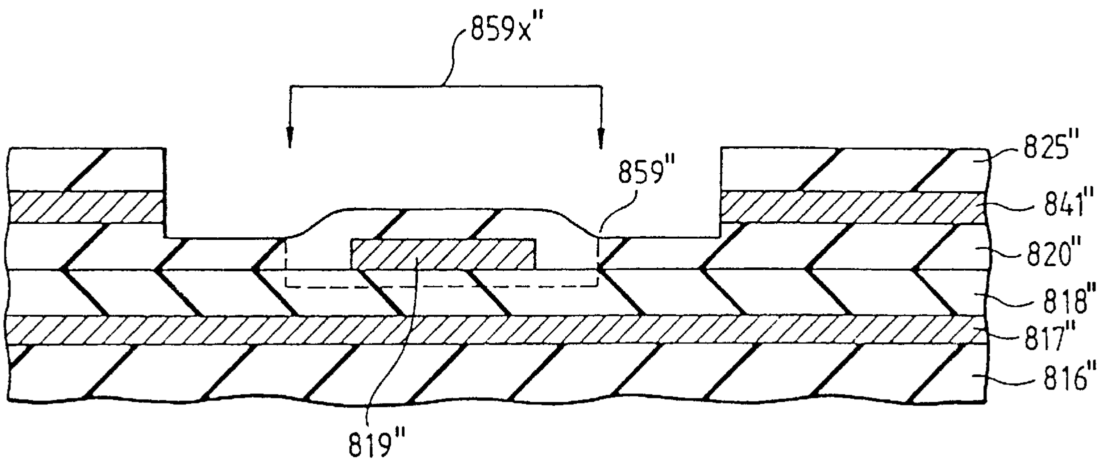
Figure 58D:
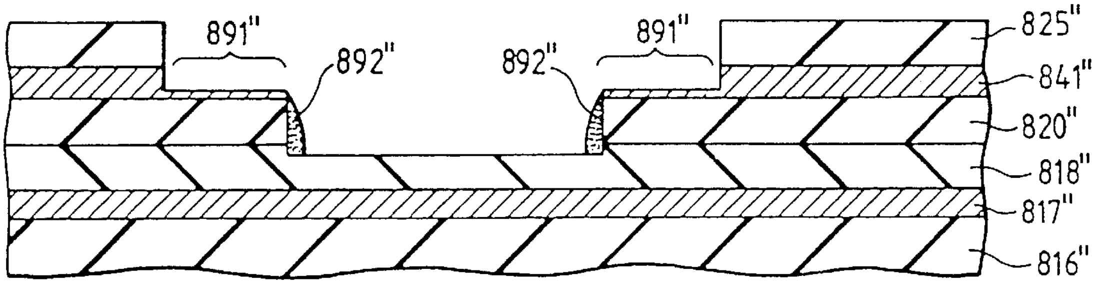
Figure 58E:
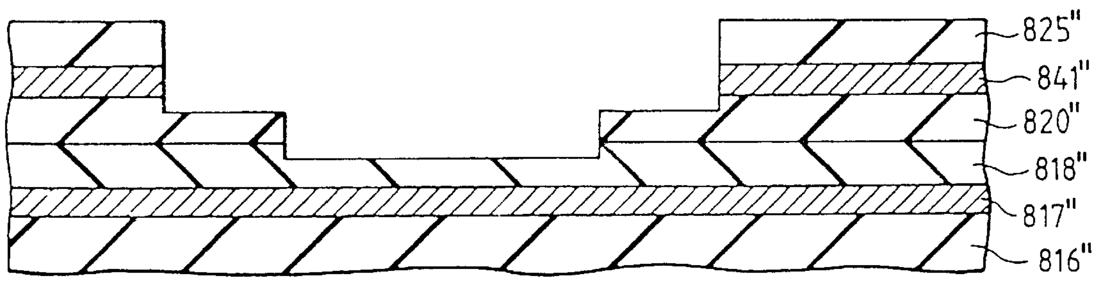
Figure 58F:
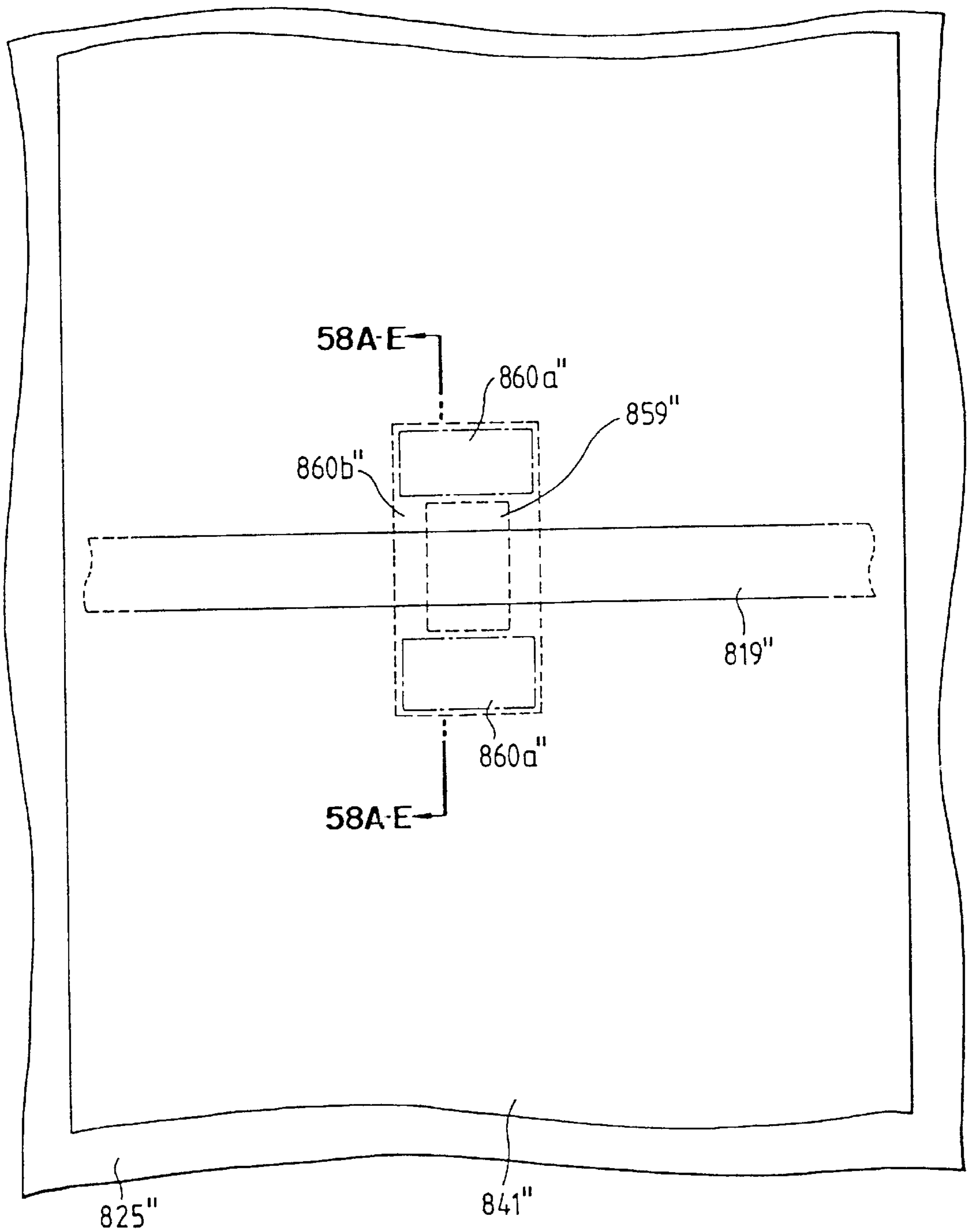
Figure 58G:
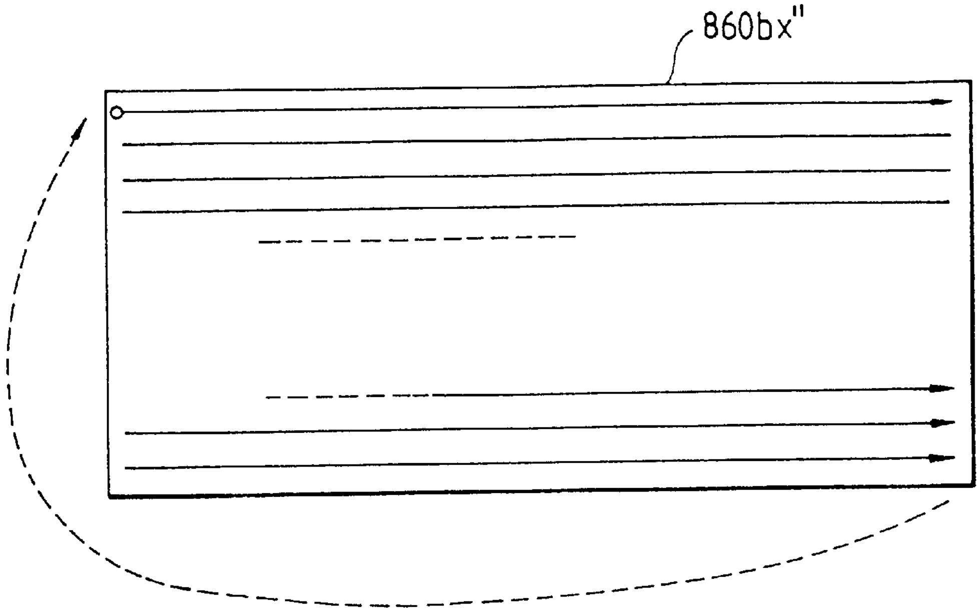
Figure 58H:
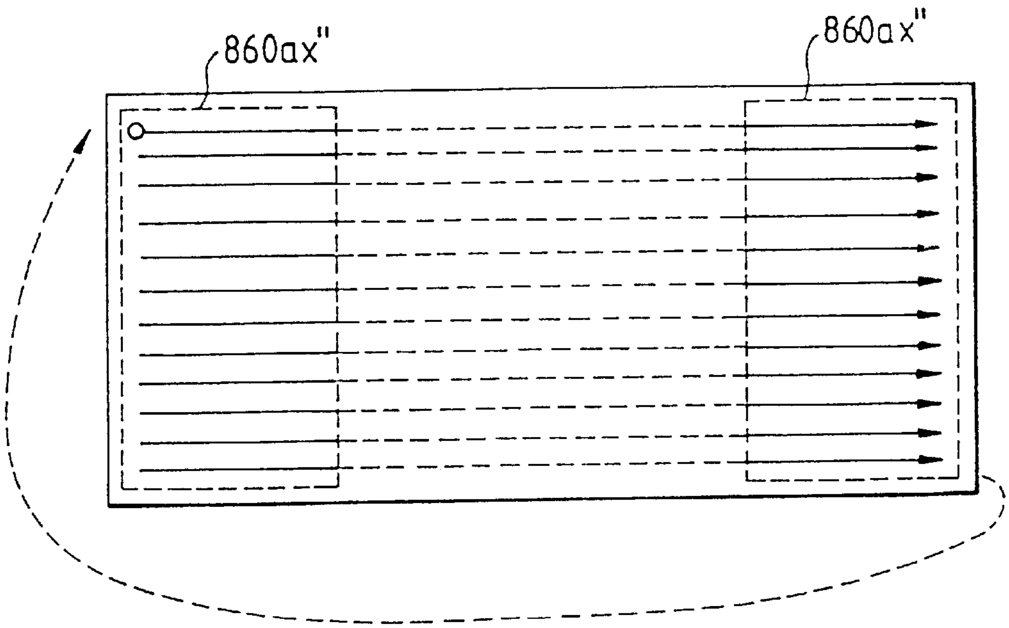
Figure 59B:
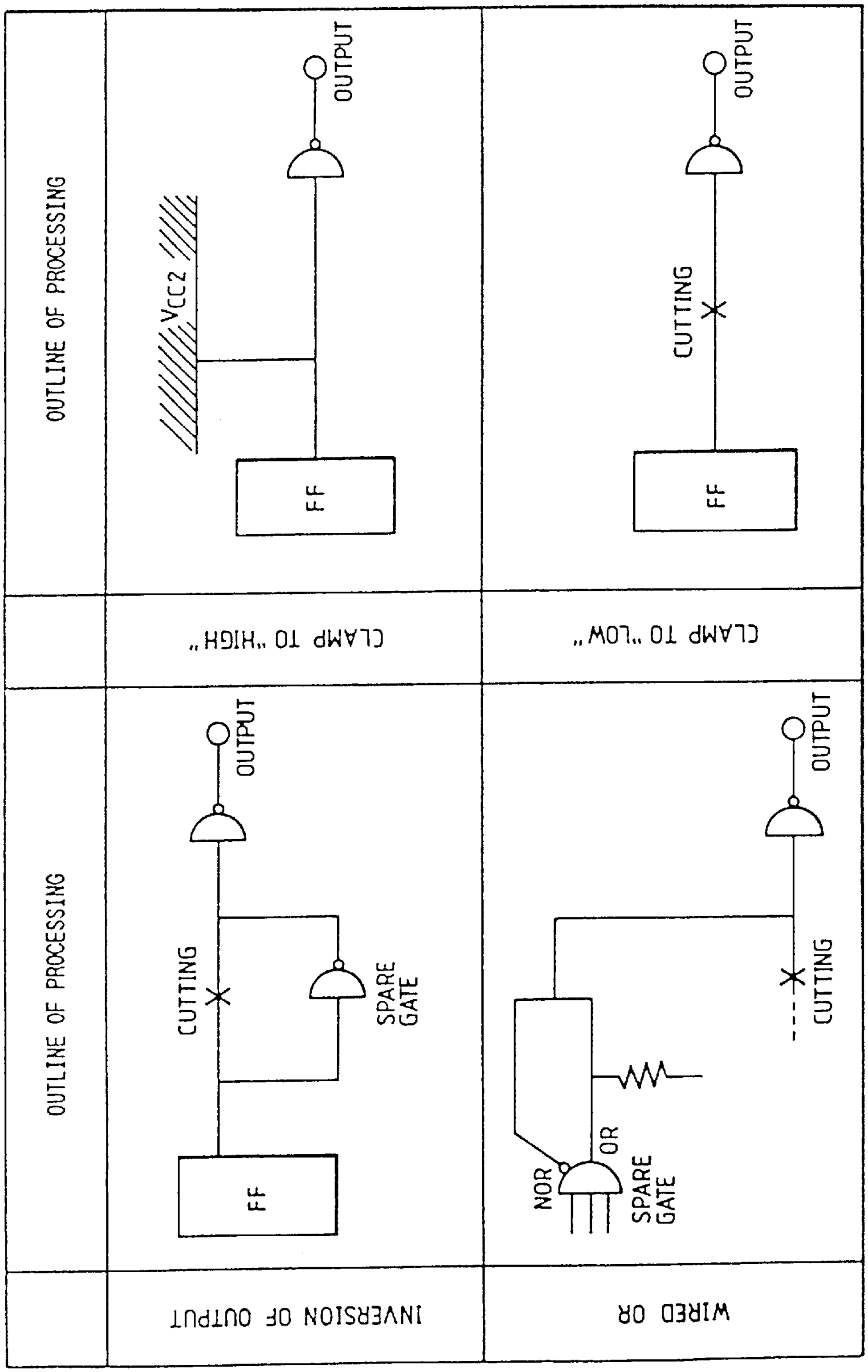
Figure 60A:
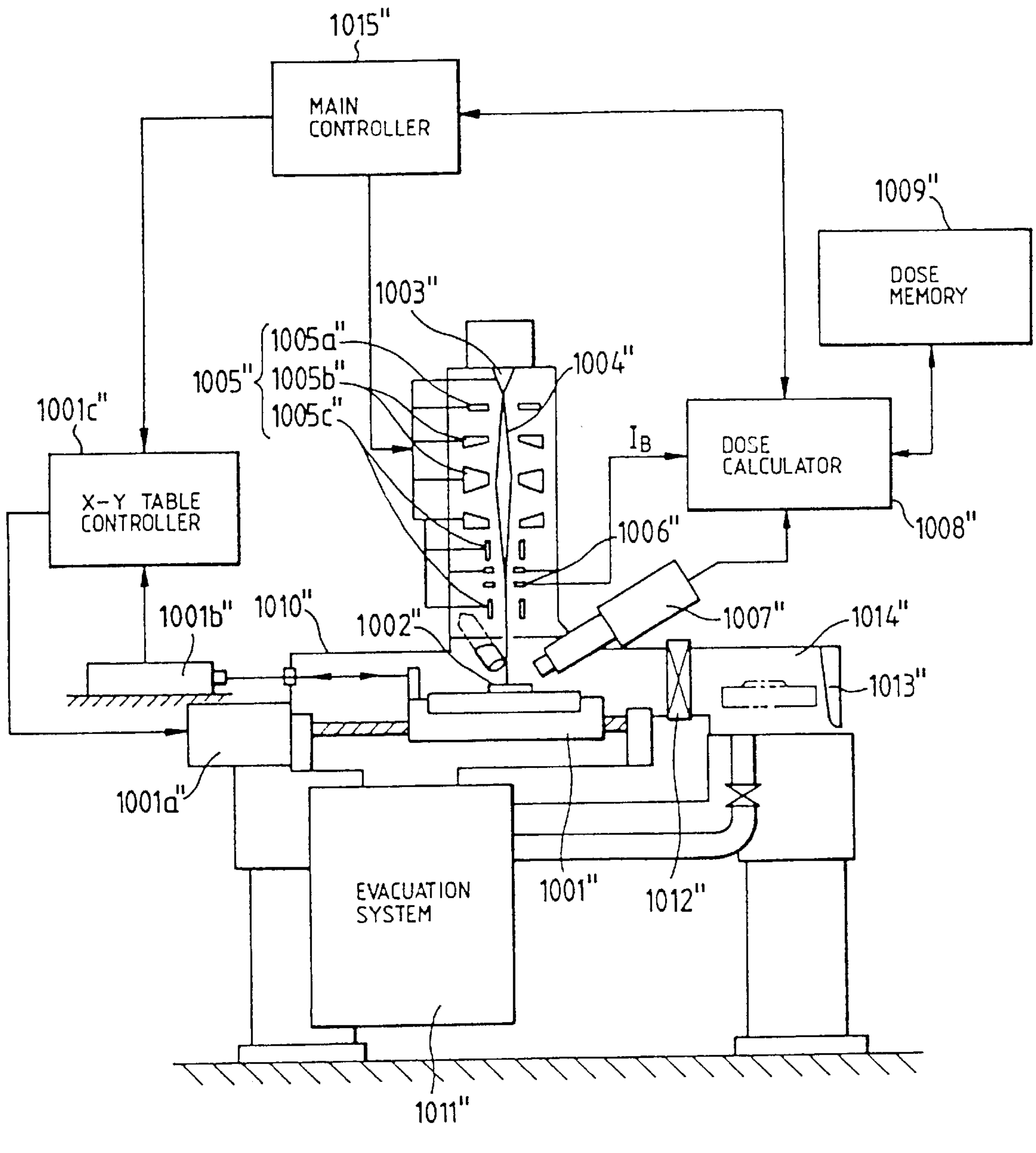
Figure 60B:
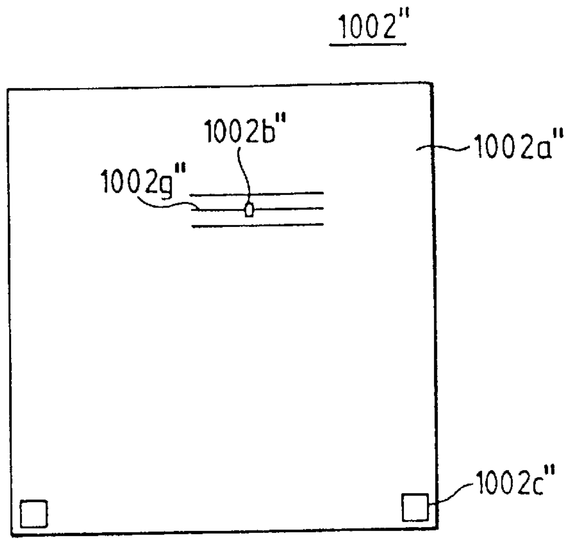
Figure 60C:
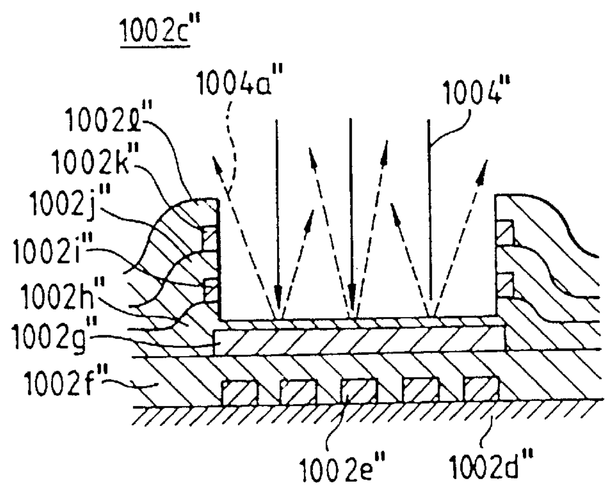
Figure 60D:
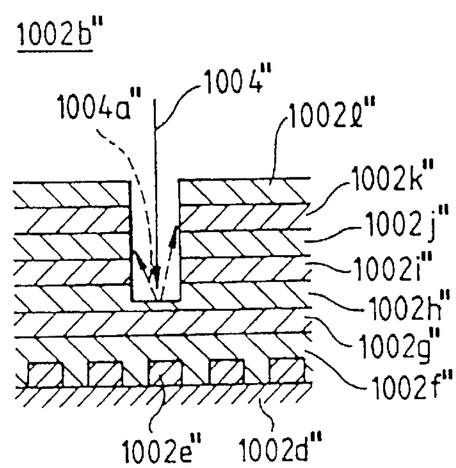
Figure 61A:
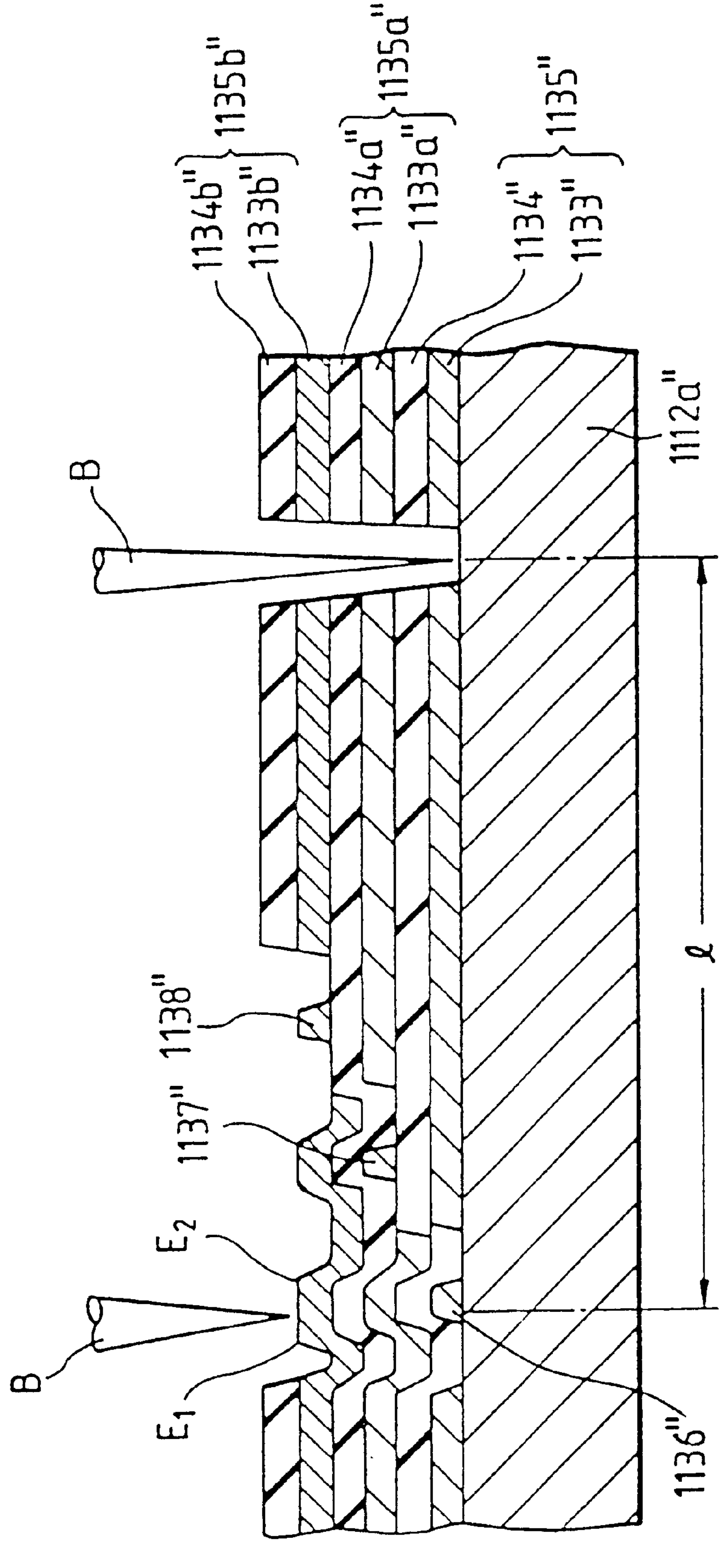
Figure 61B:
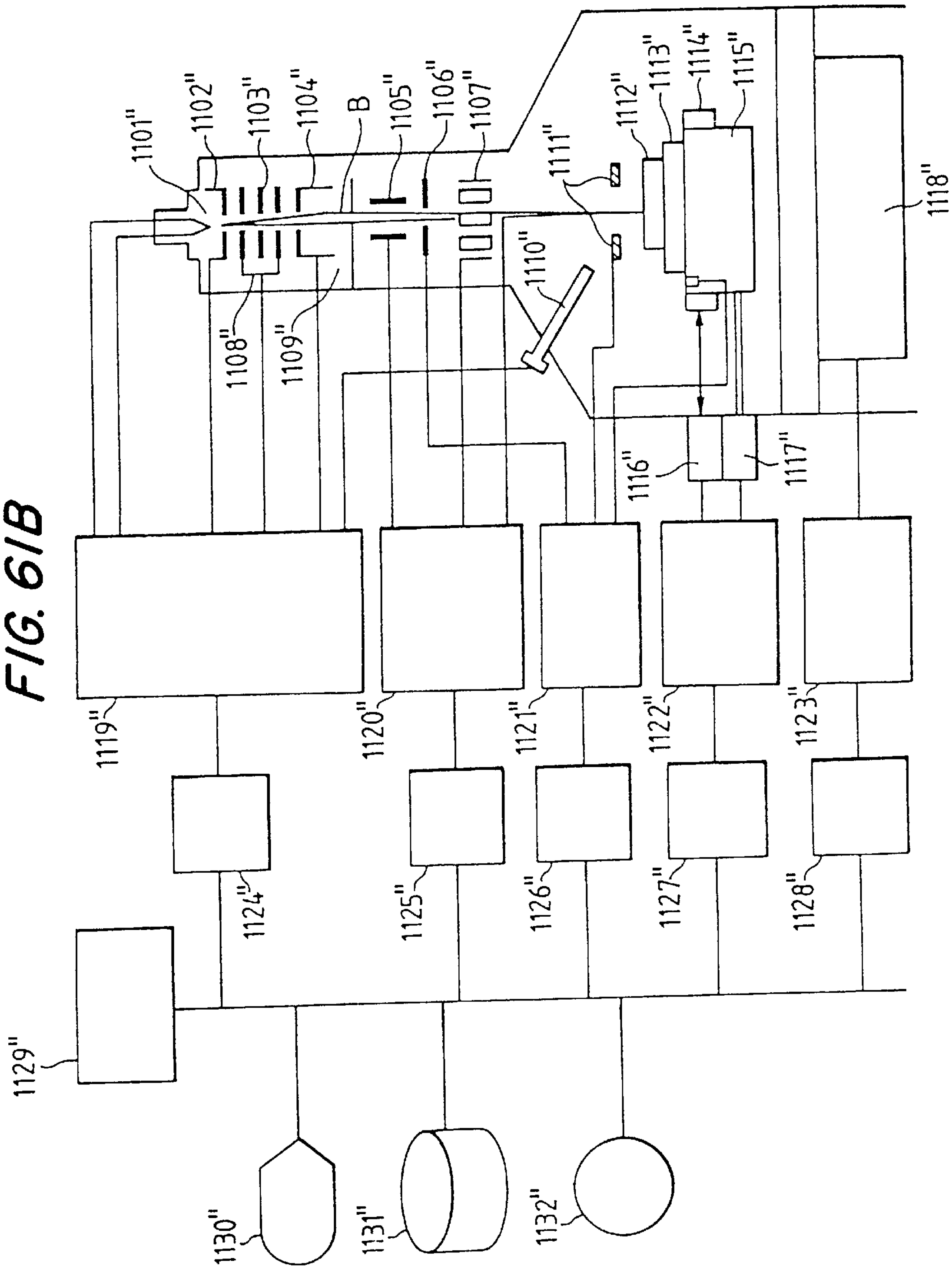
Figure 61C:
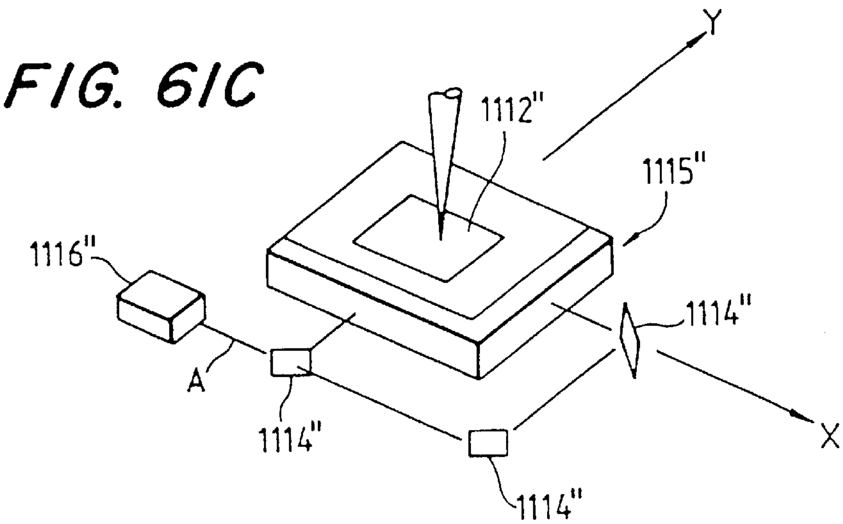
Figure 61D:
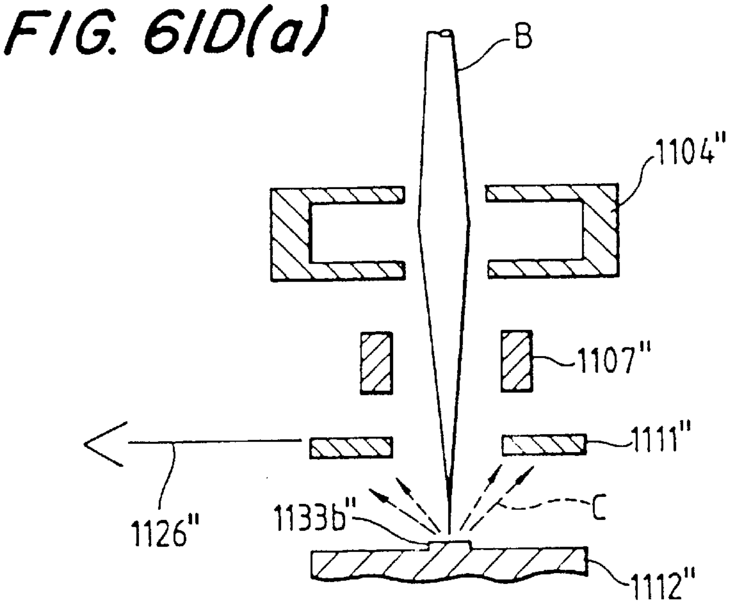
Figure 61D:
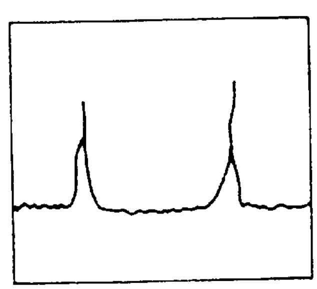
Figure 61E:
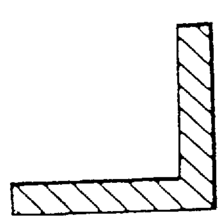
Figure 61E:
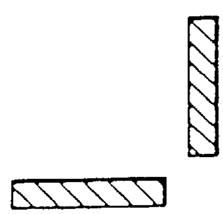
Figure 61E:
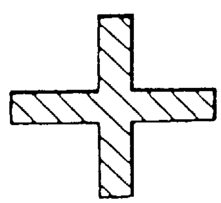
Figure 61E:
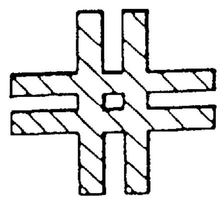
Figure 61F:
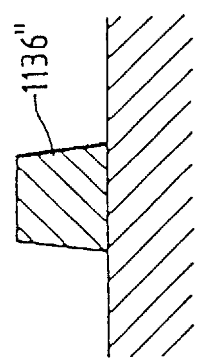
Figure 61F:
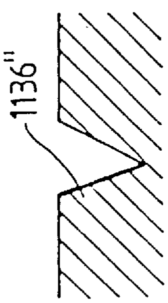
Figure 61G:
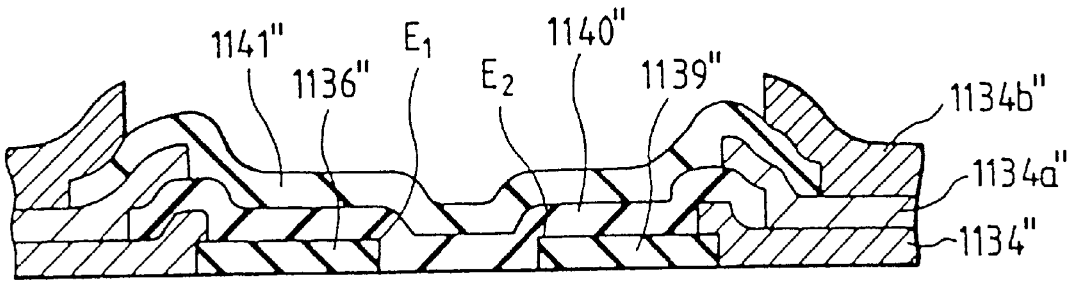
Figure 61G:
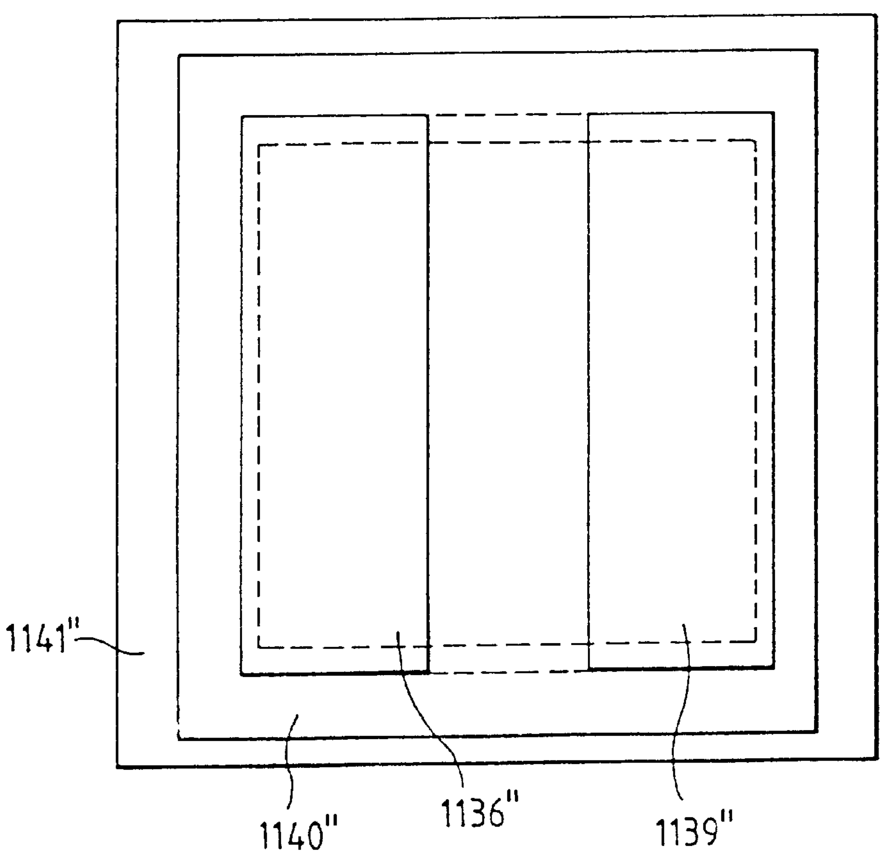
Figure 62A:
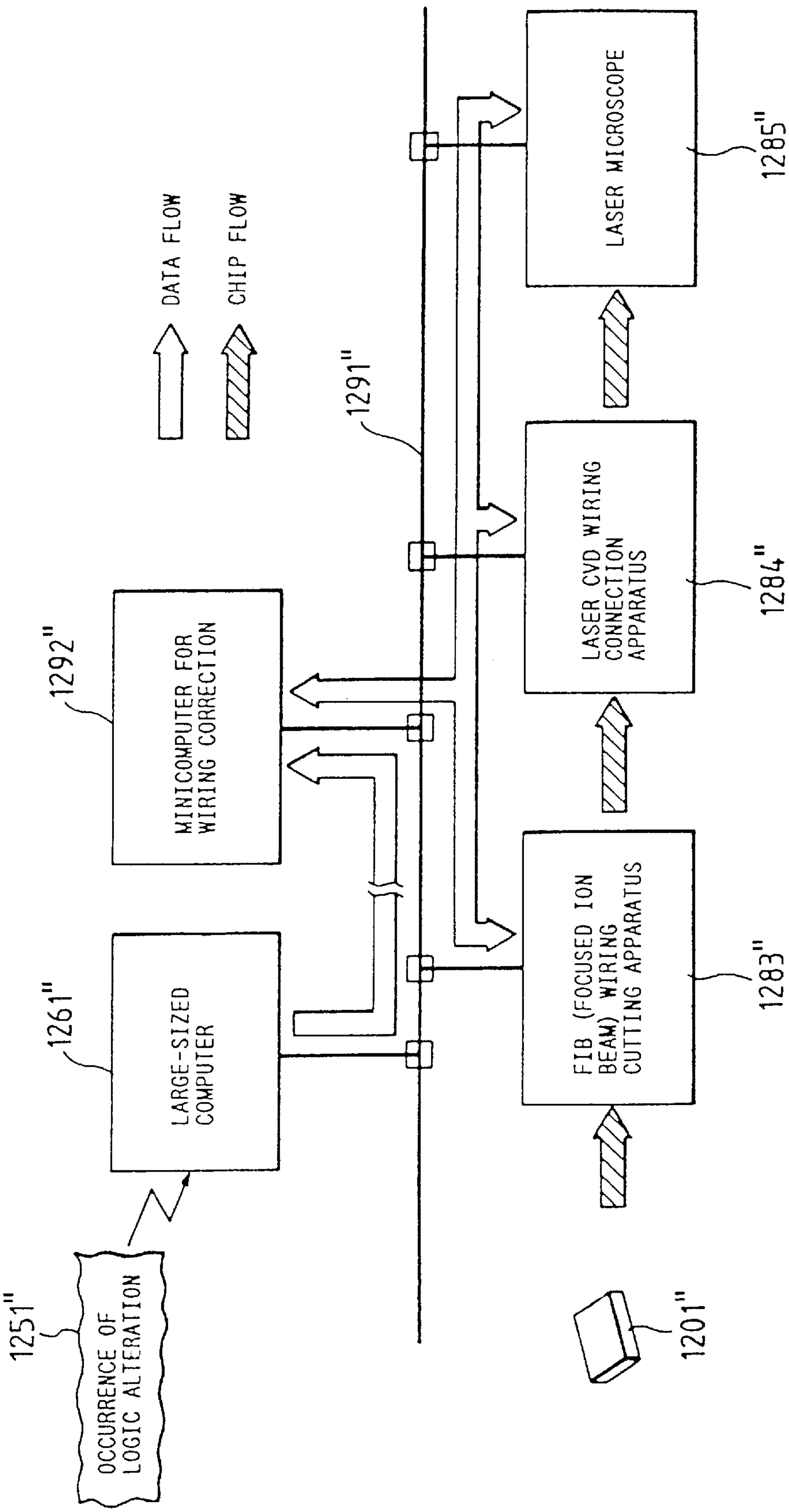
Figure 62B:
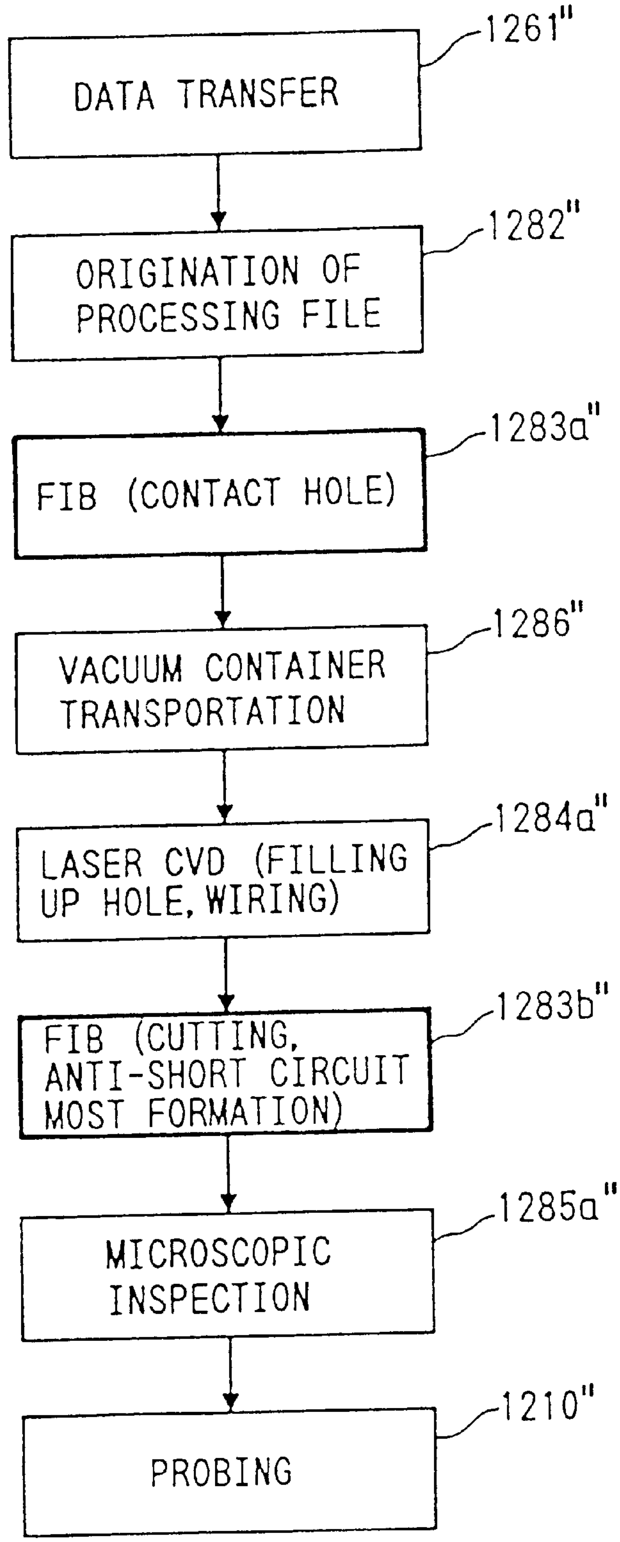
Figure 62C:
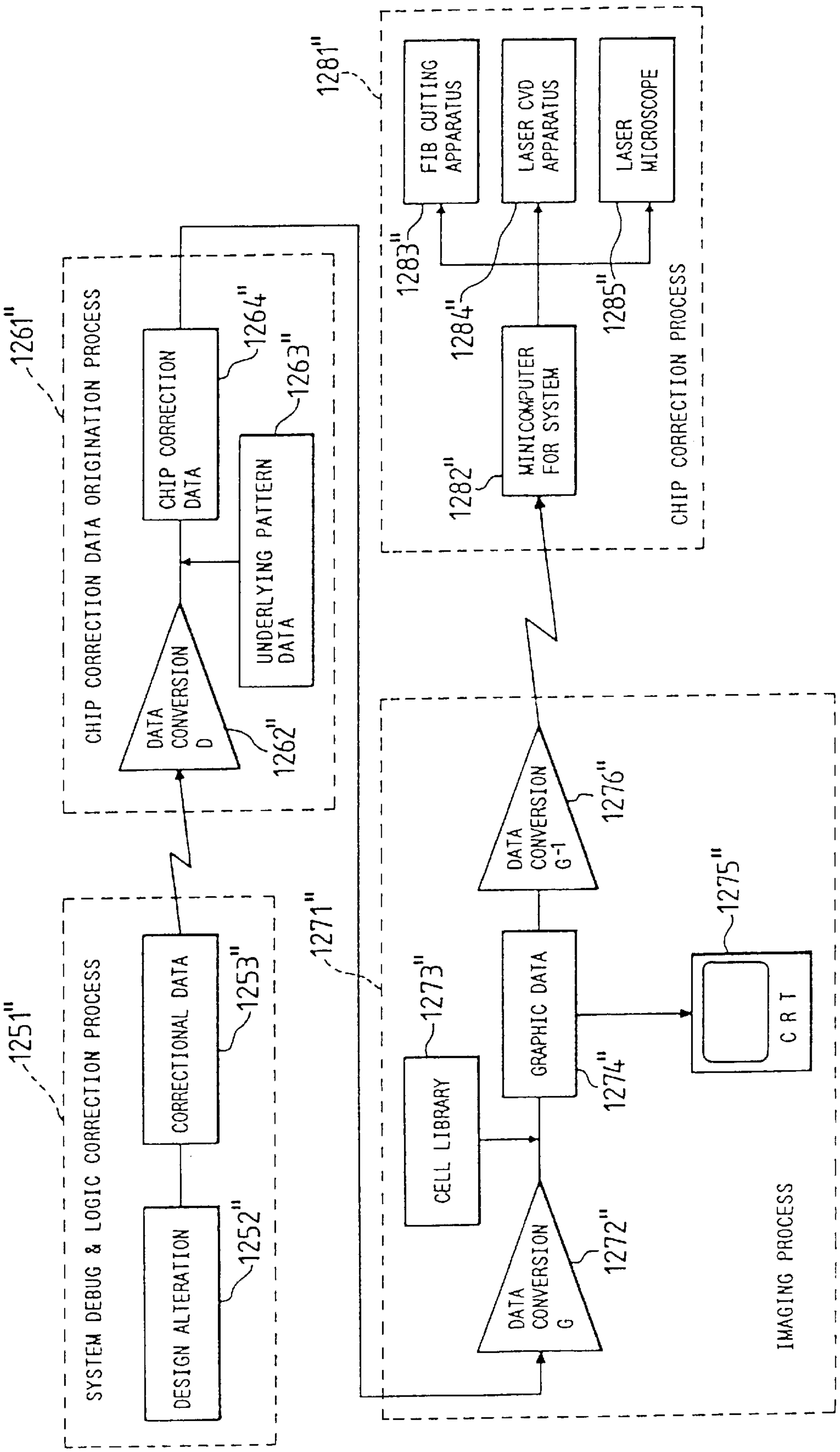
Figure 63:
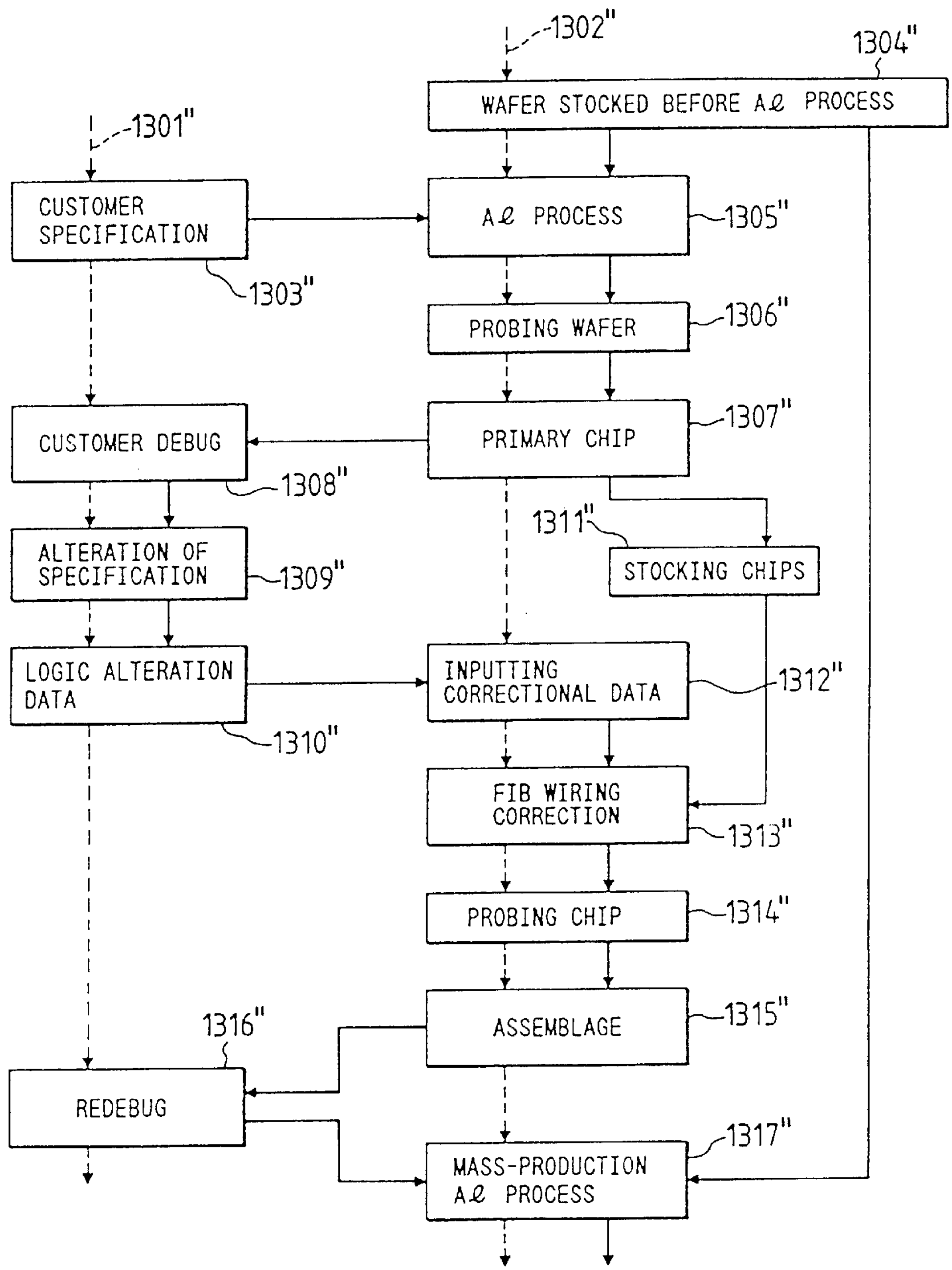
Figure 64A:
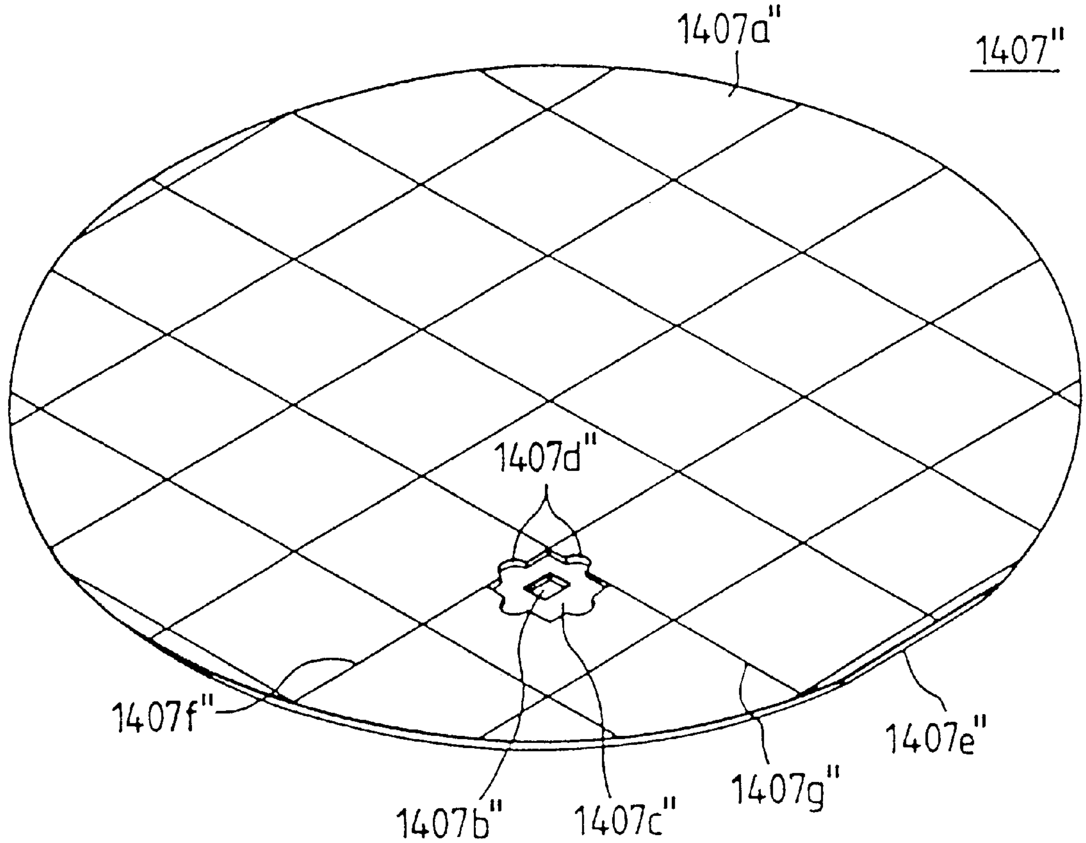
Figure 64B:
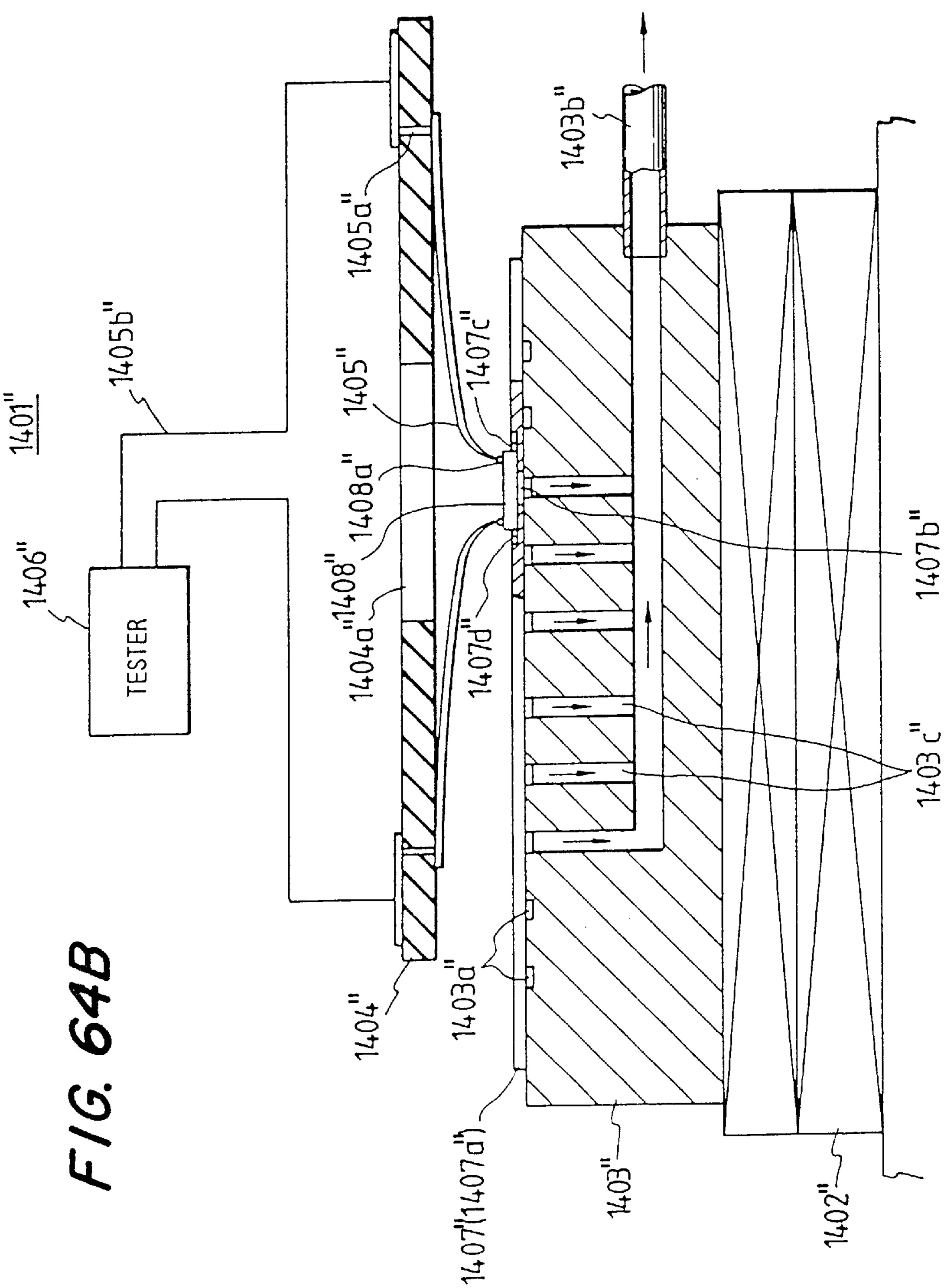
Figure 64C:
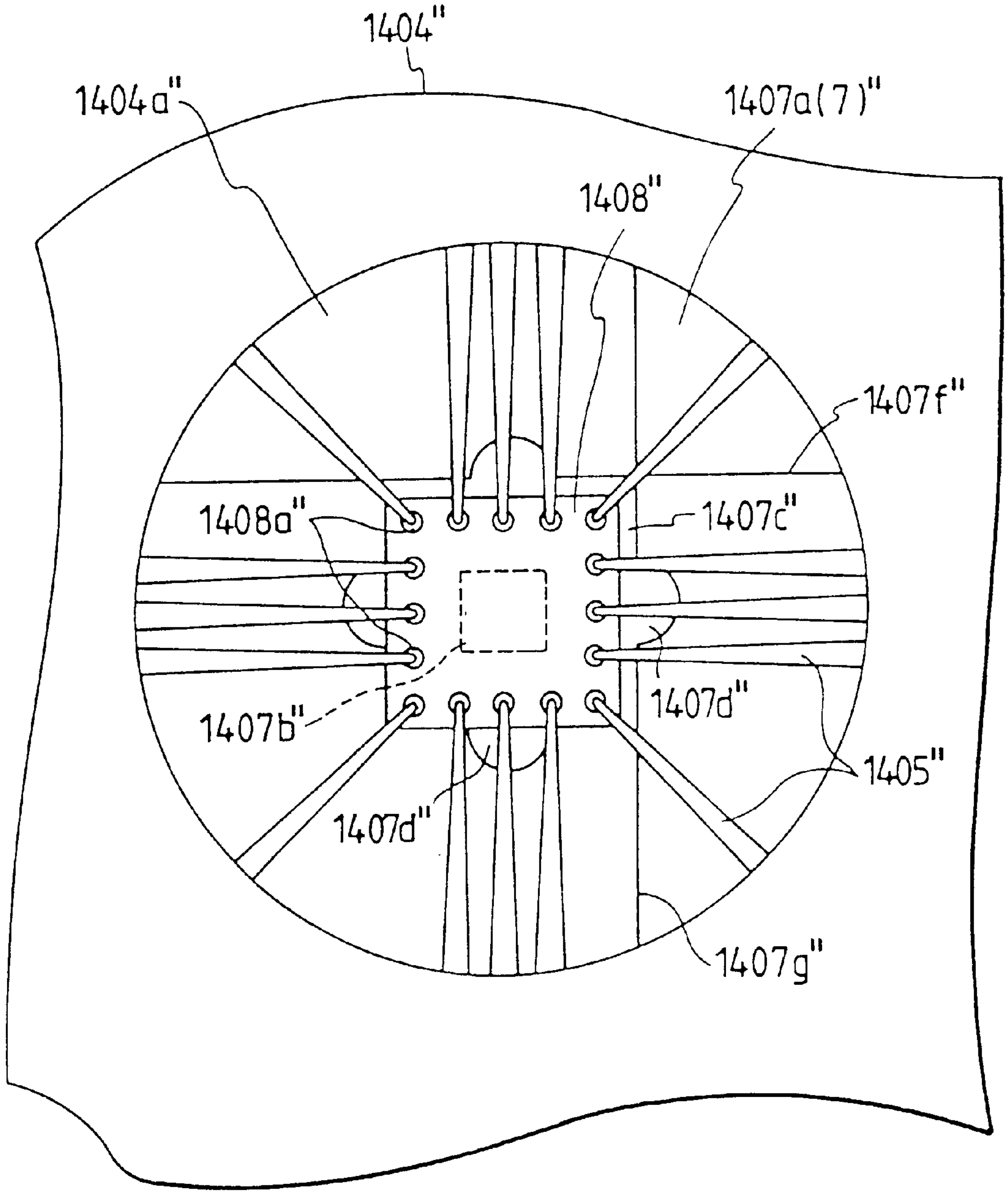
Figure 64D:
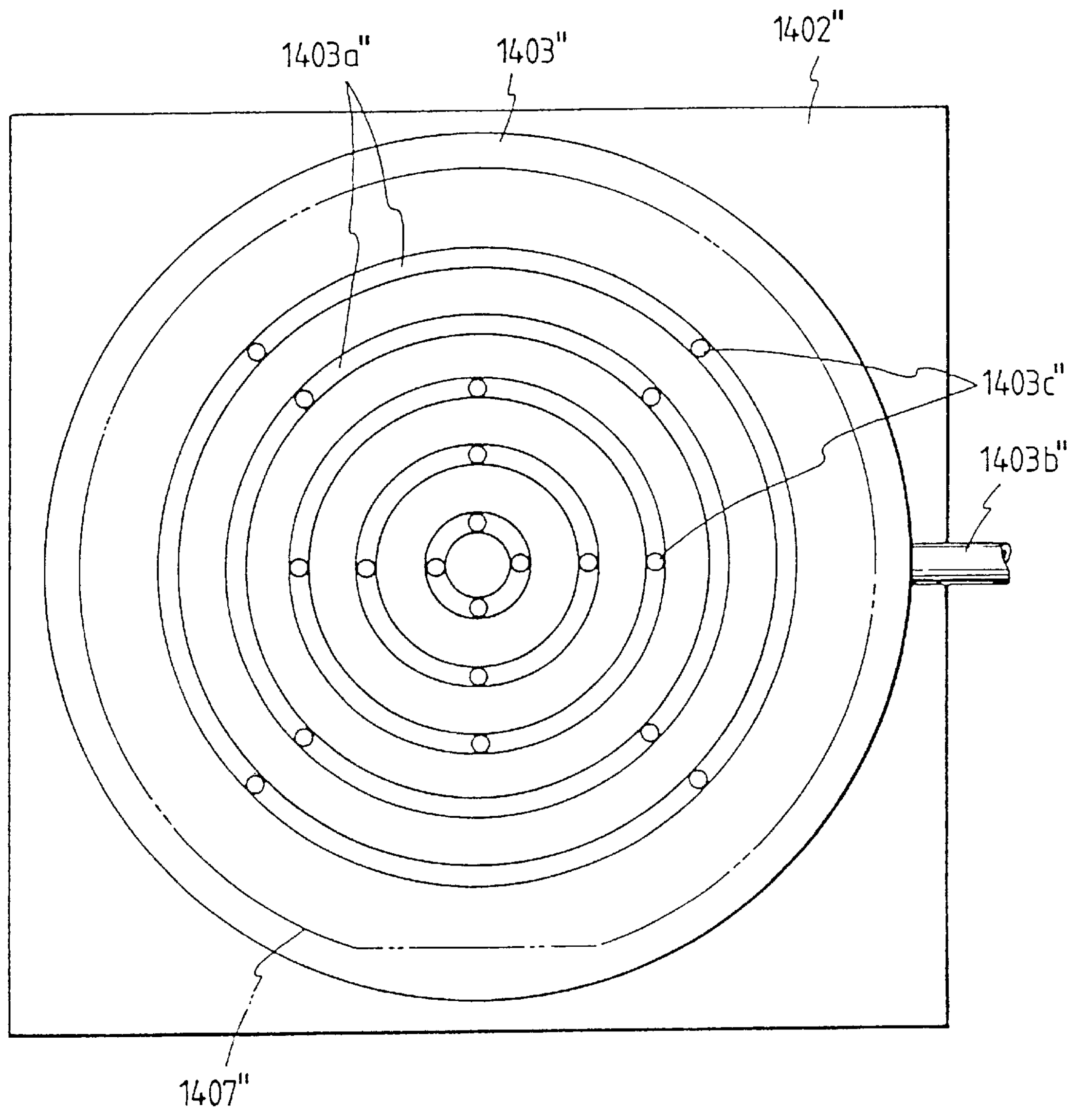
Figure 64E:
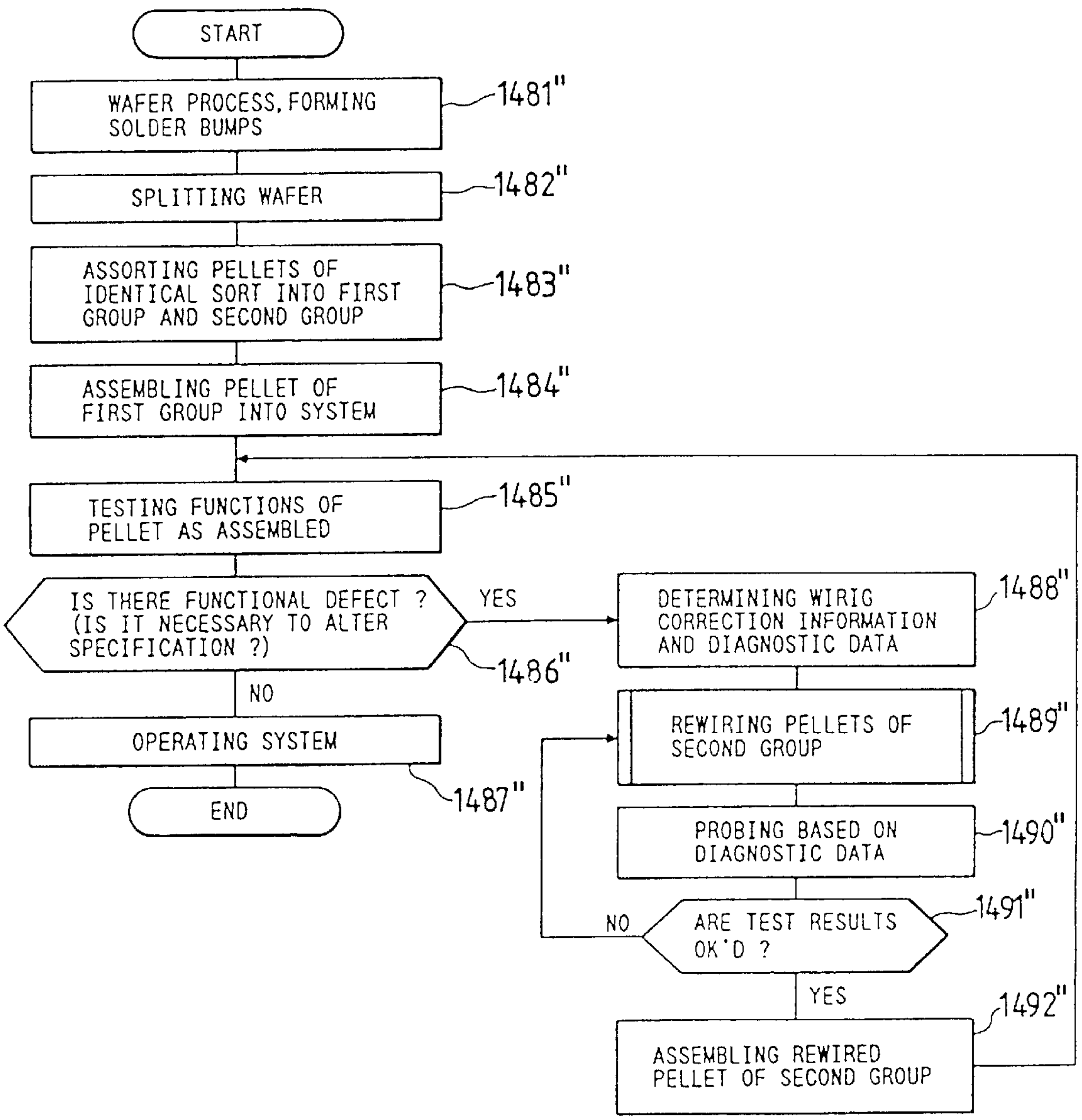
Figure 64F:
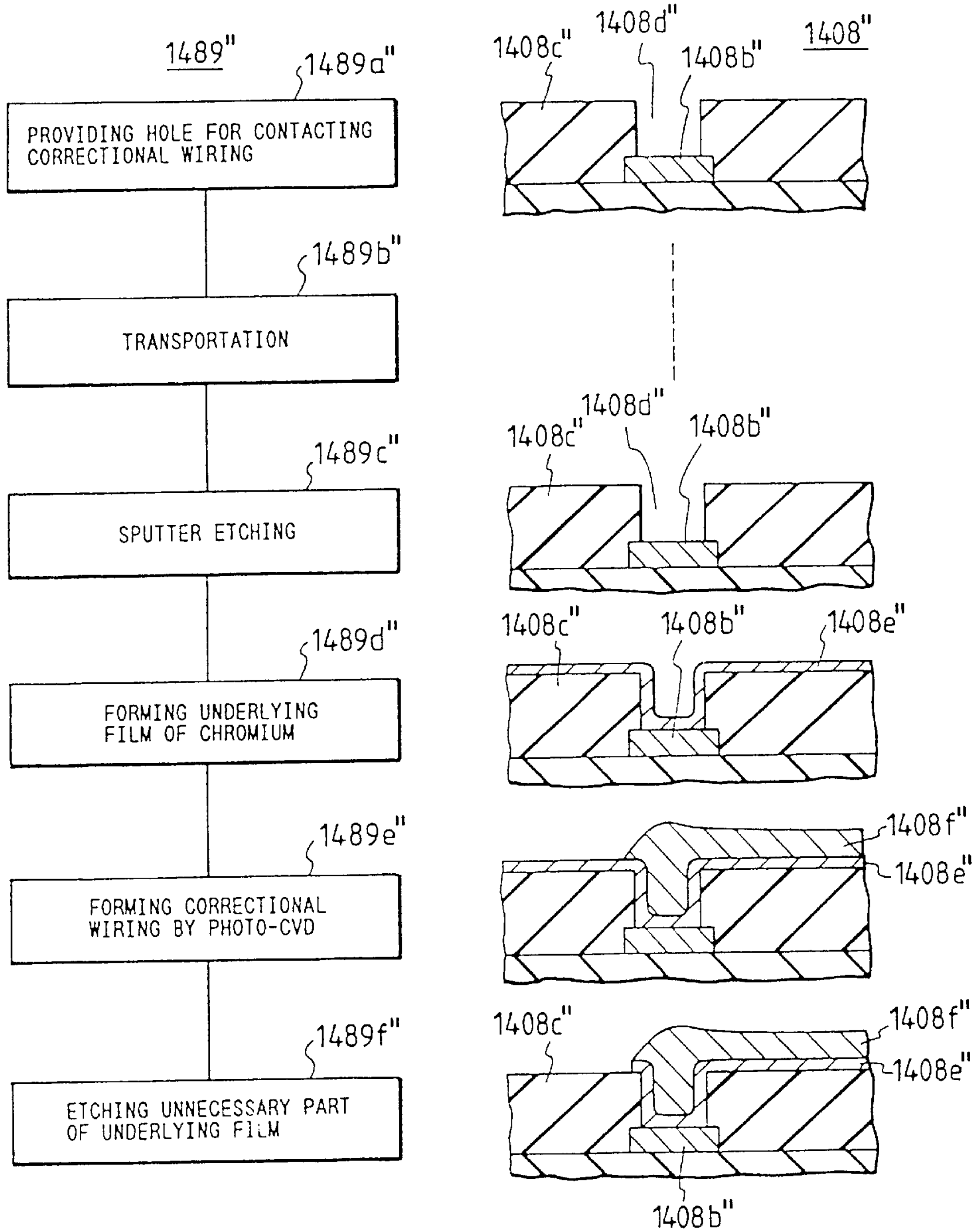
Figure 65A:
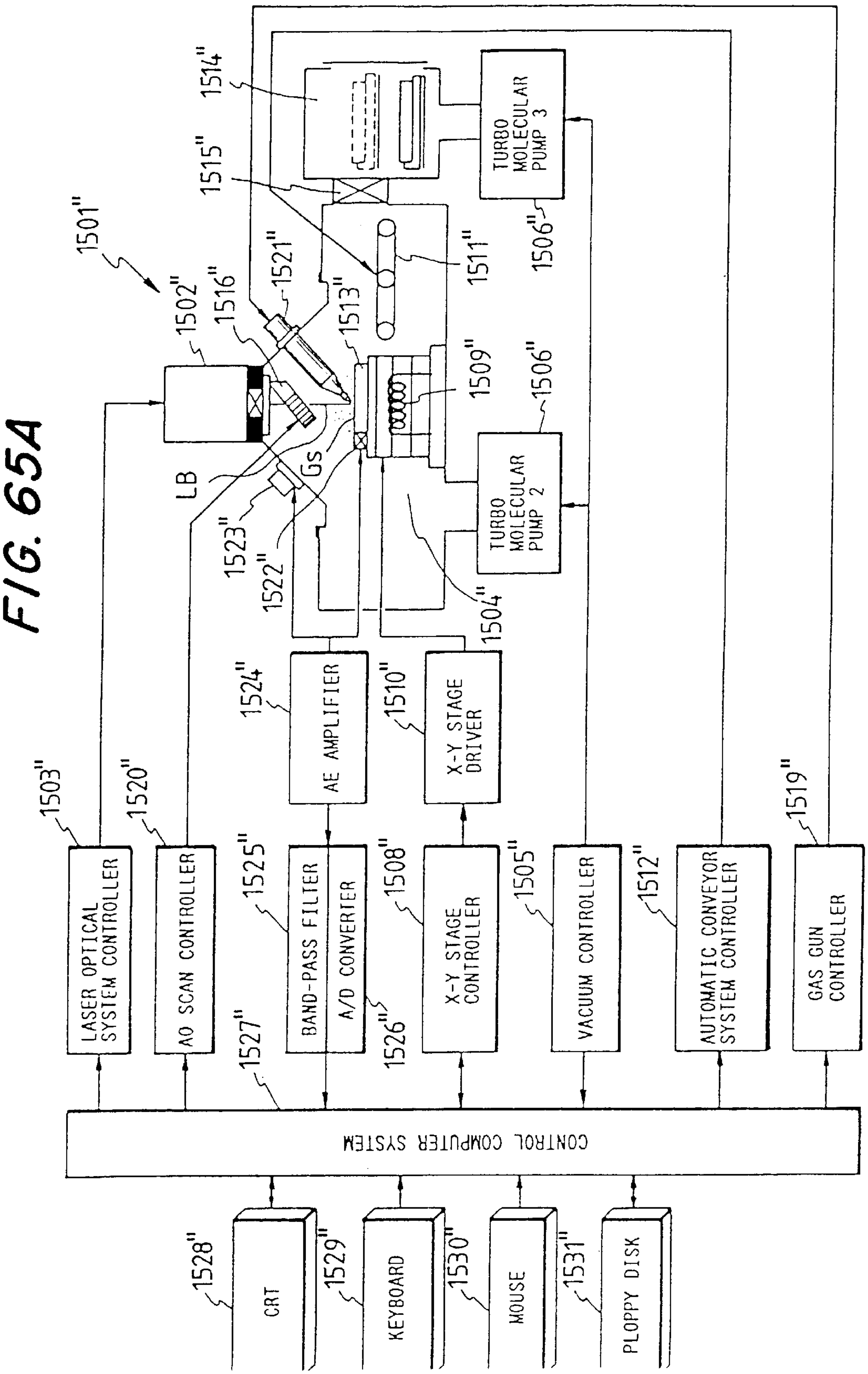
Figure 65B:
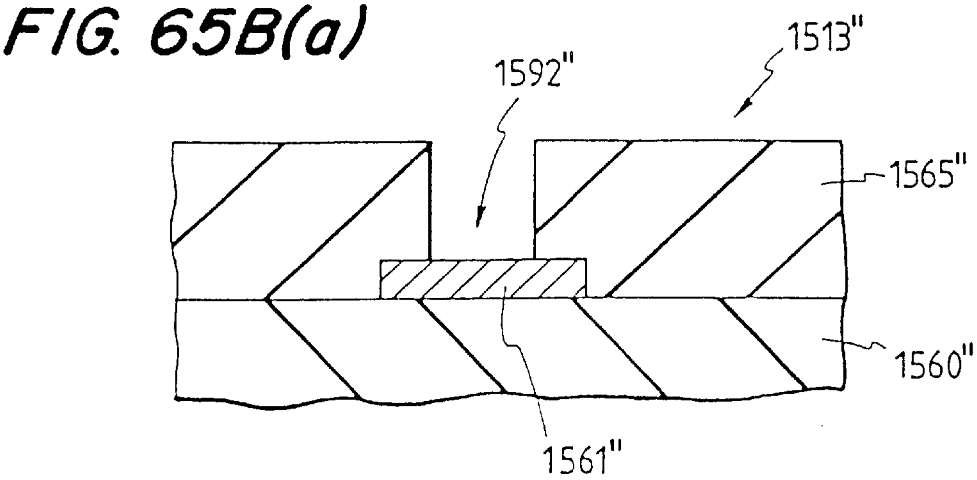
Figure 65B:
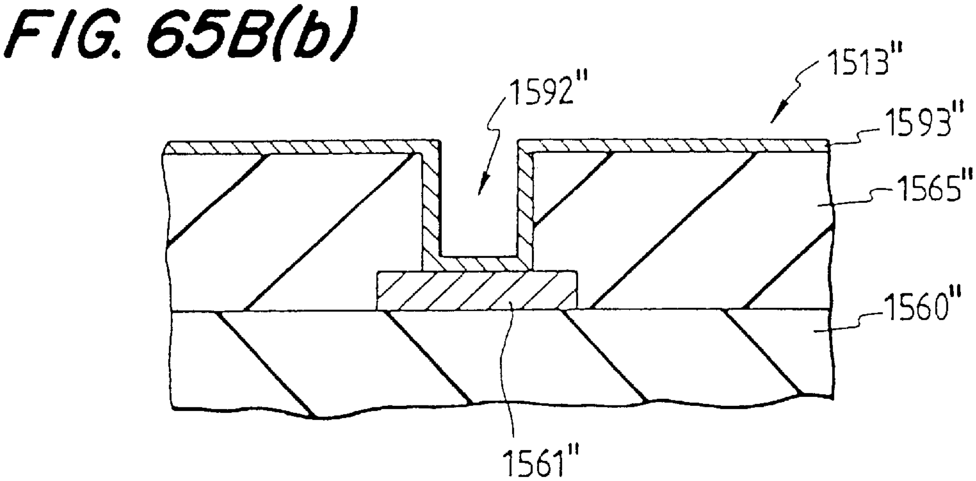
Figure 65B:
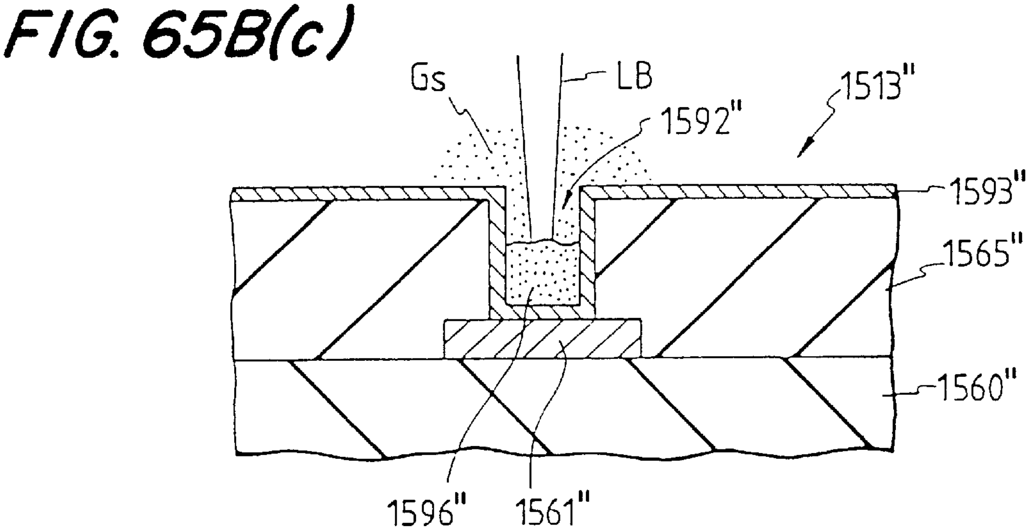
Figure 65B:
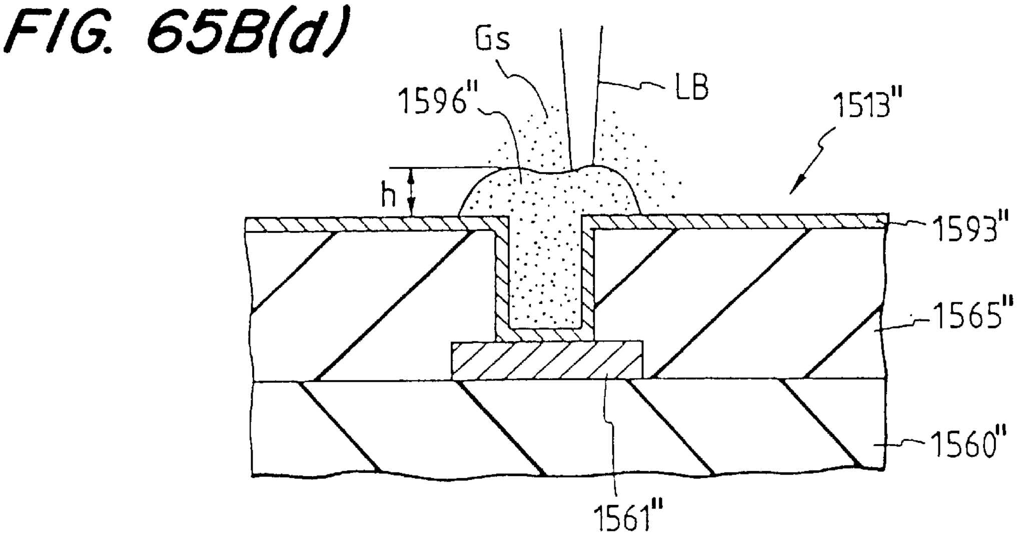
Figure 65B:
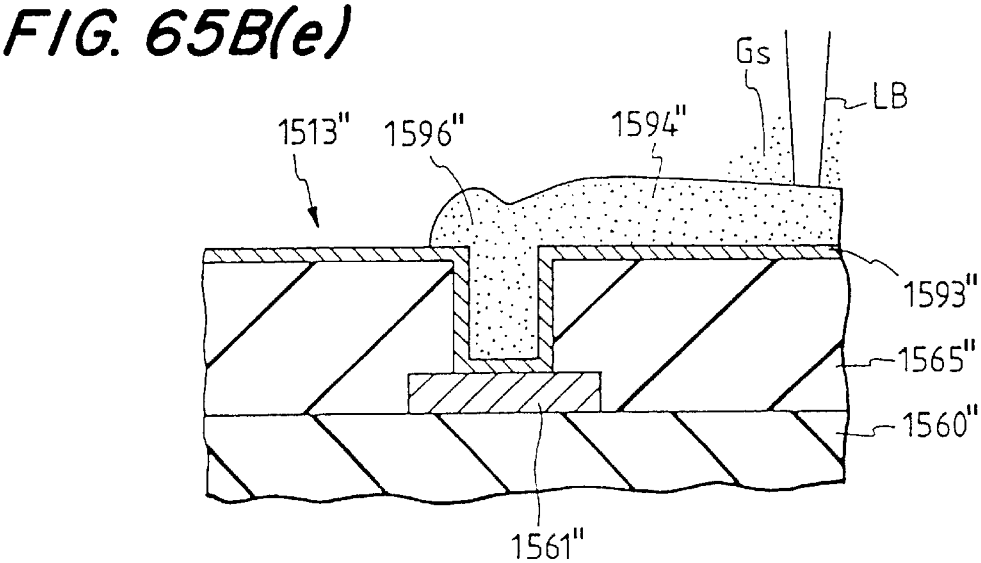
Figure 65B:
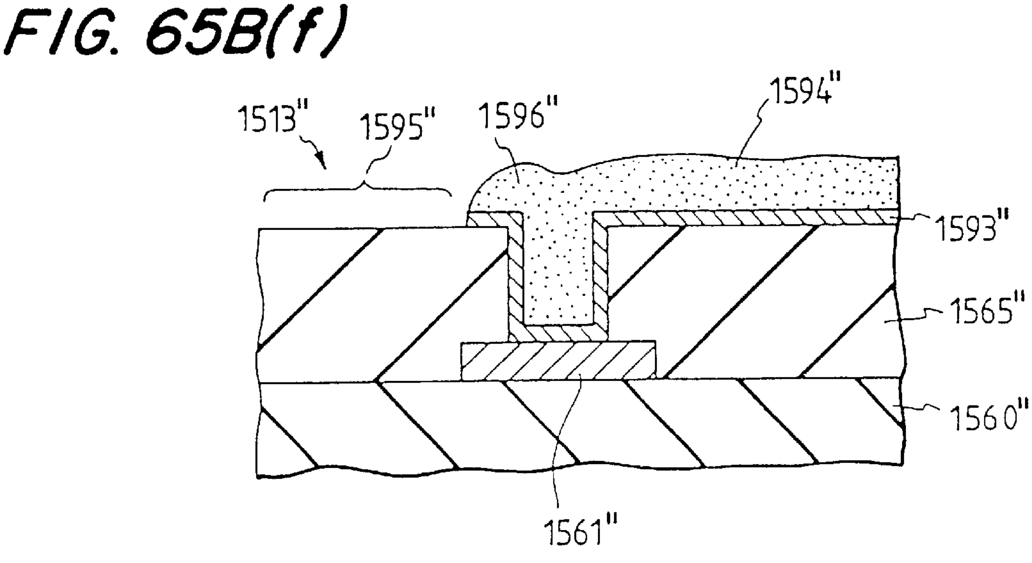
Figure 65C:
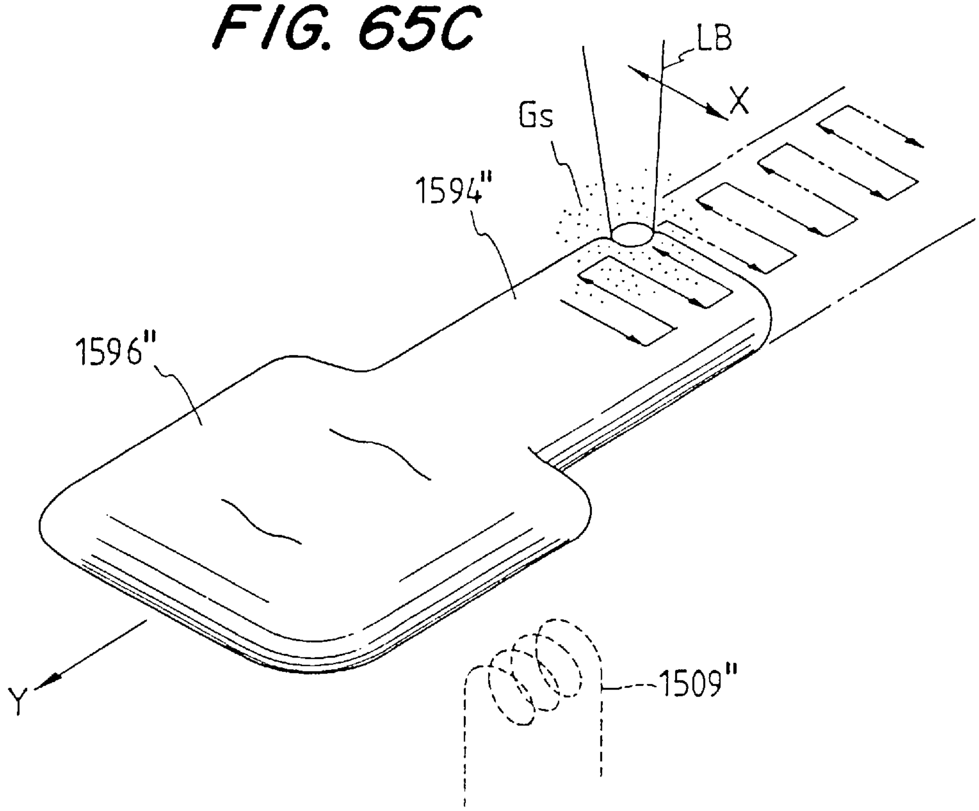
Figure 65D:
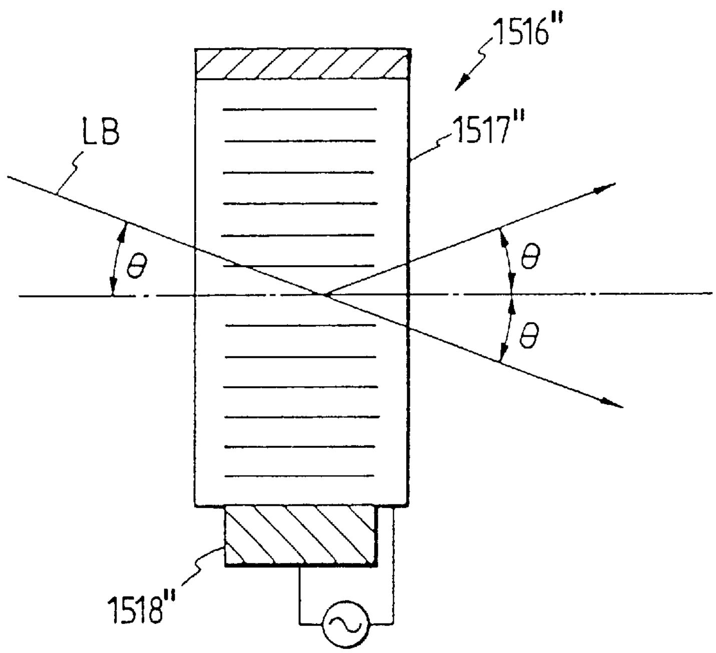
Figure 65E:
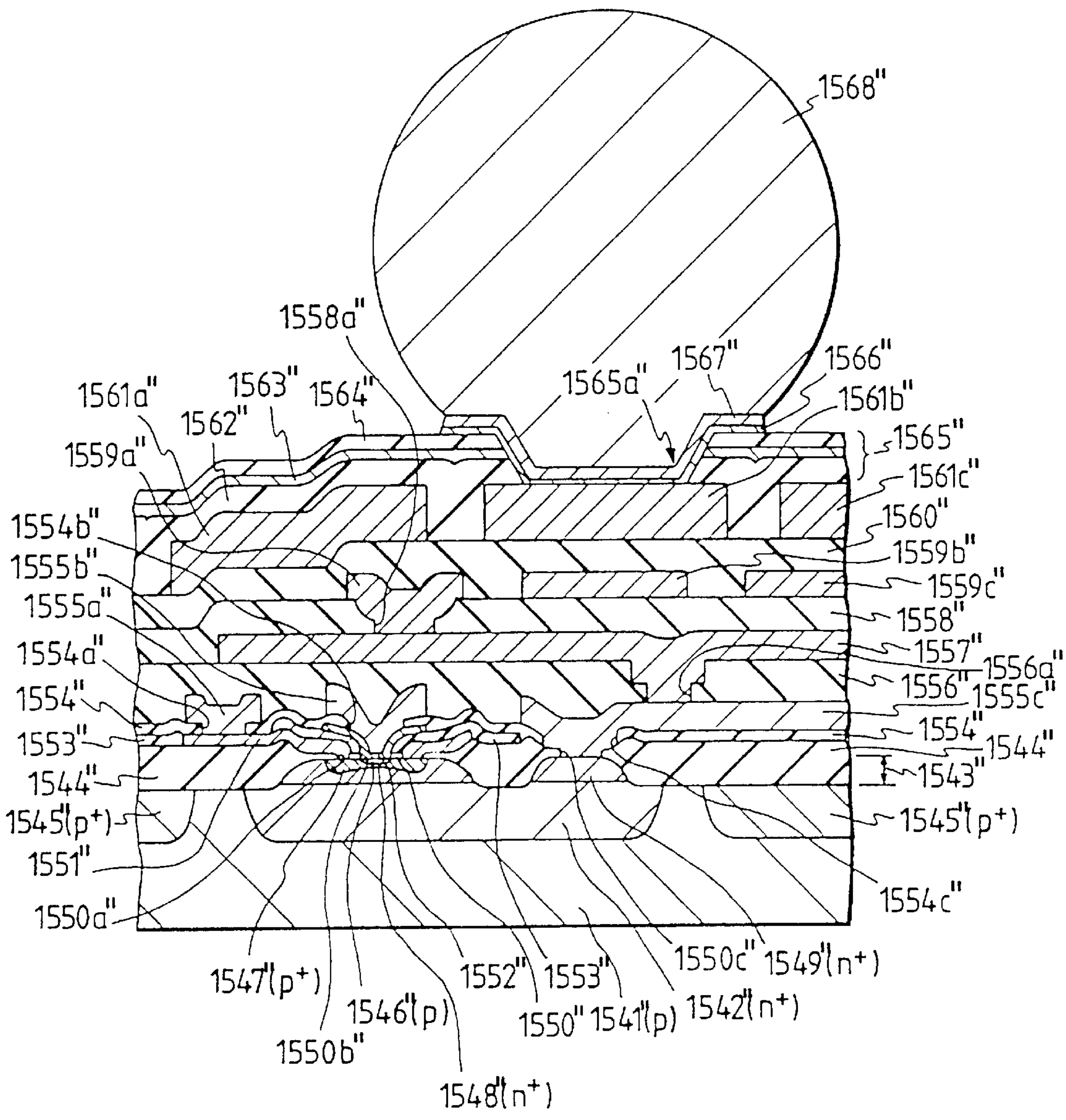
Figure 65F:
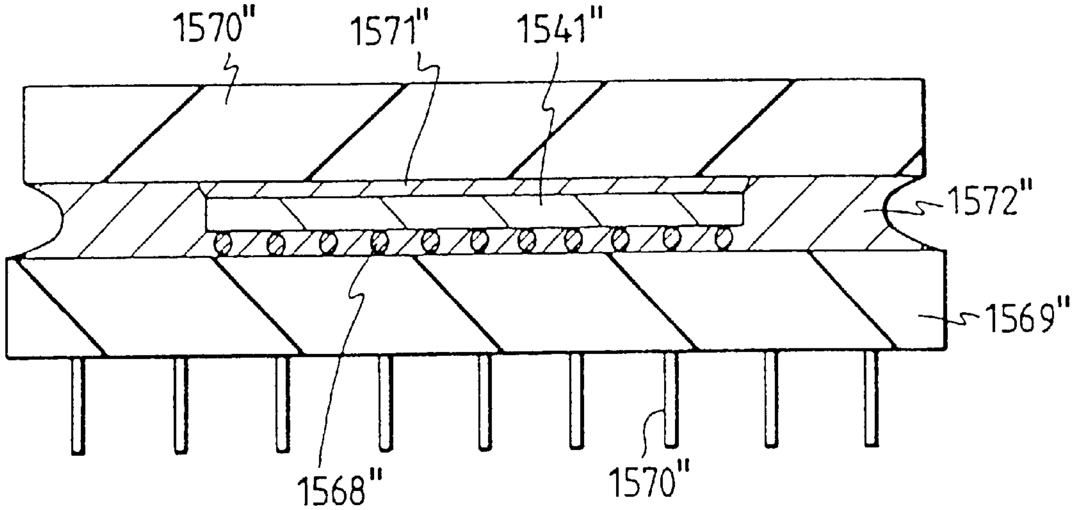
Figure 65G:
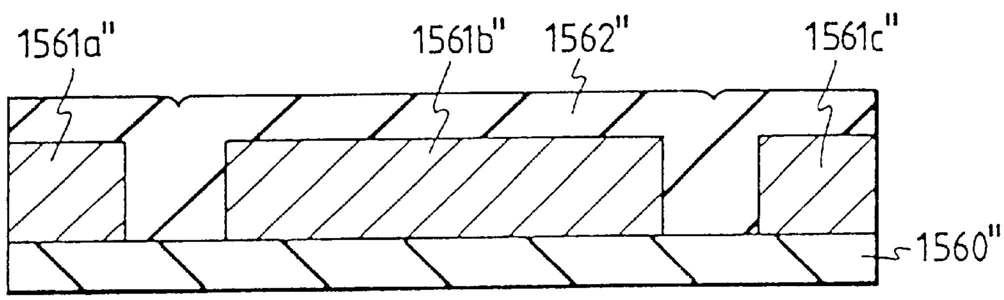
Figure 65H:
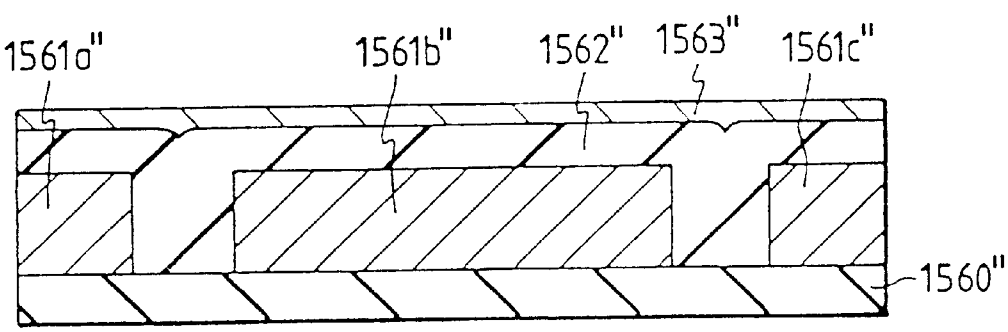
Figure 65I:
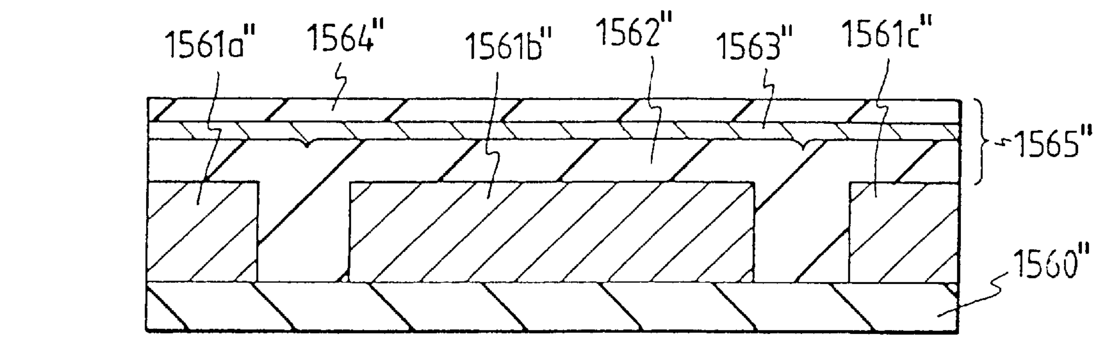
Figure 65J:
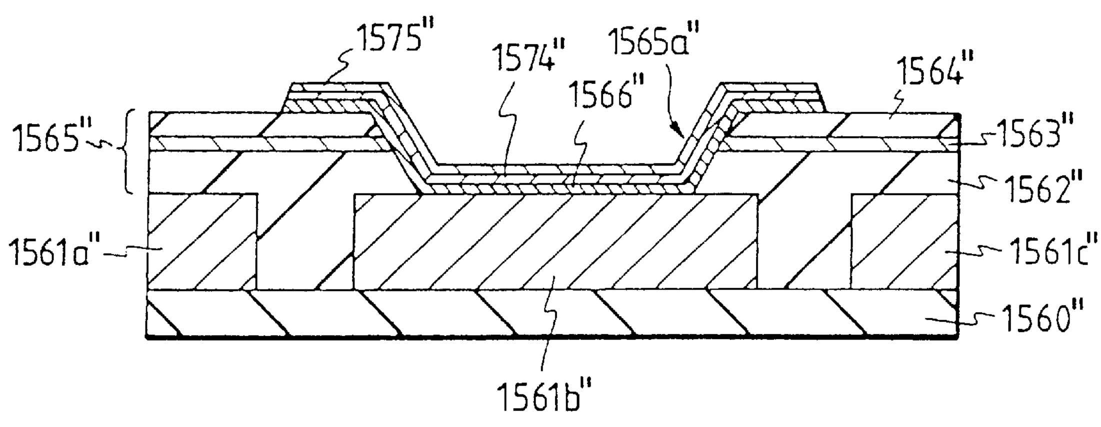
Figure 65K:
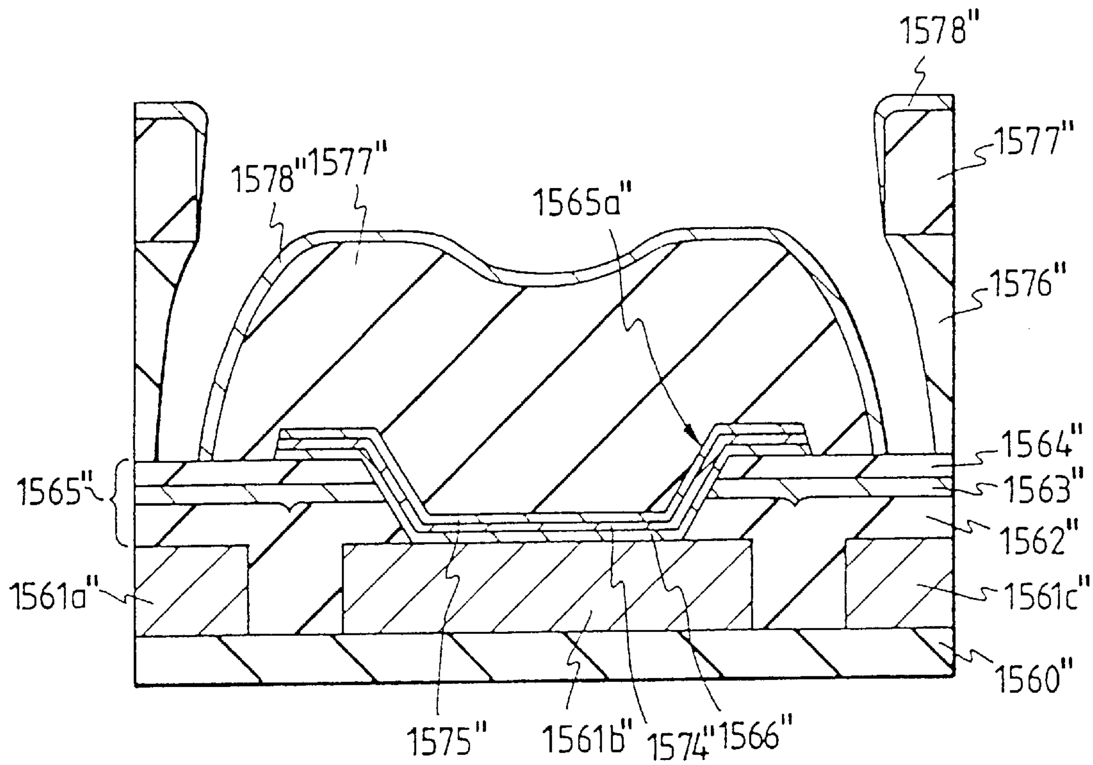
Figure 65L:
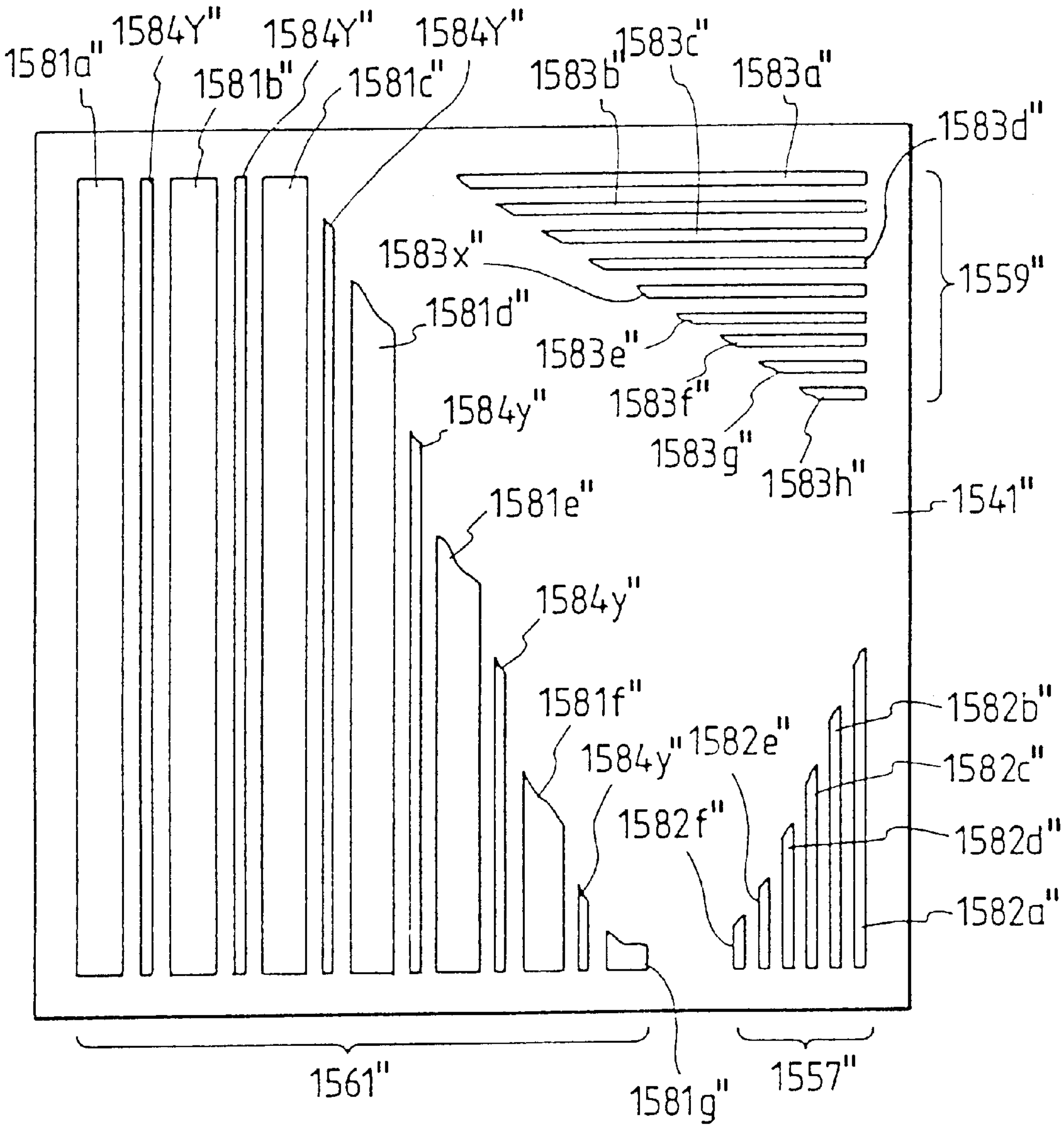
Figure 65M:
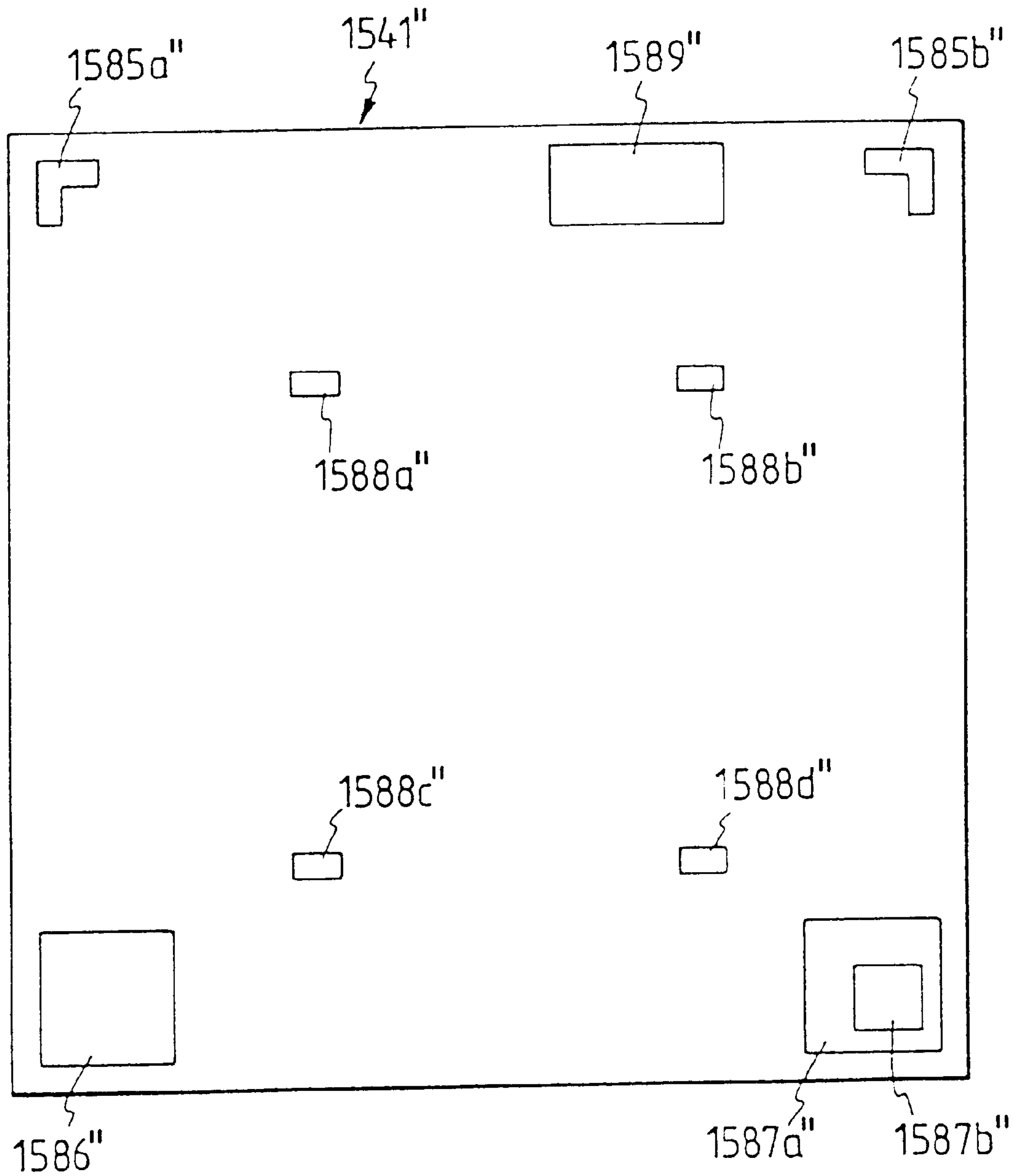
Figure 65N:
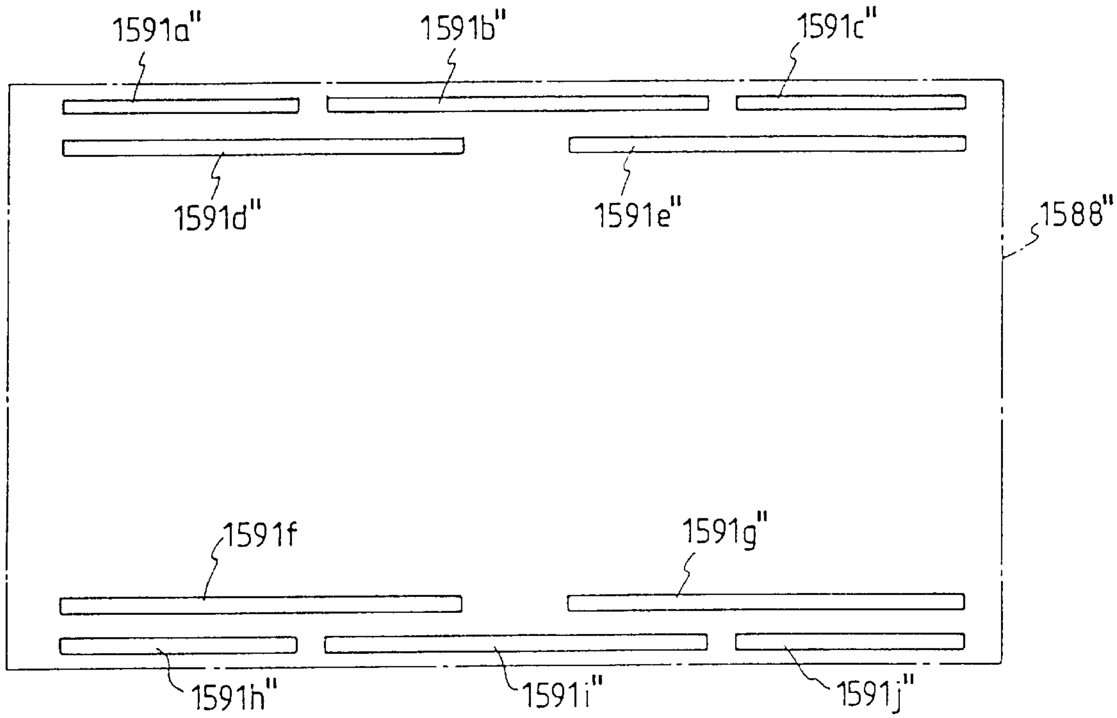
Figure 65O:
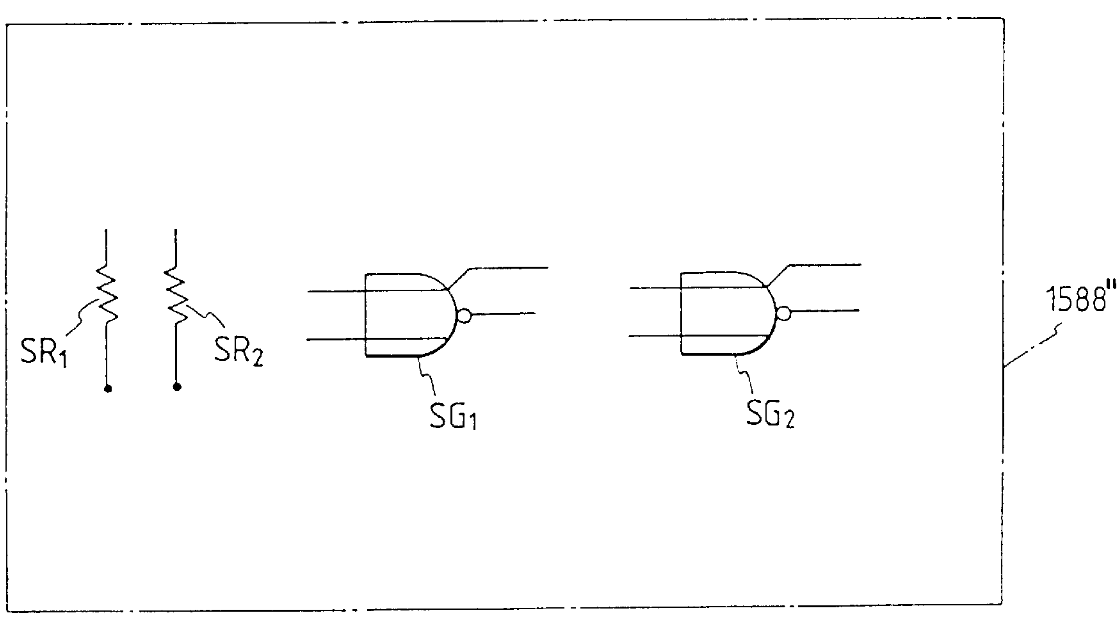
Figure 65P:
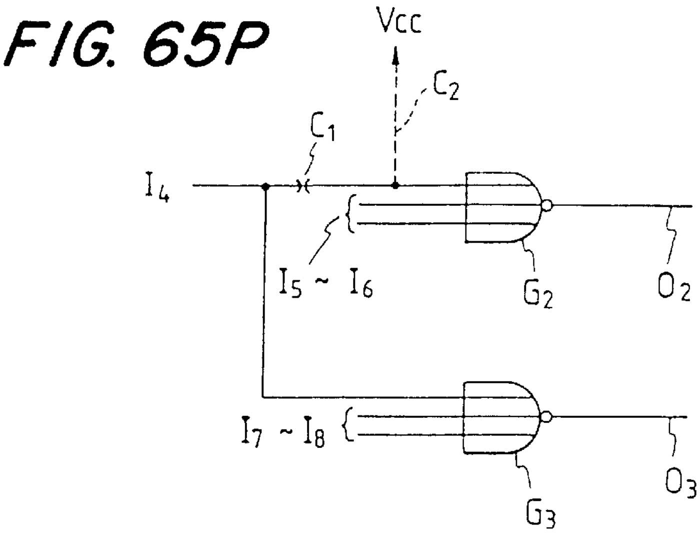
Figure 65Q:
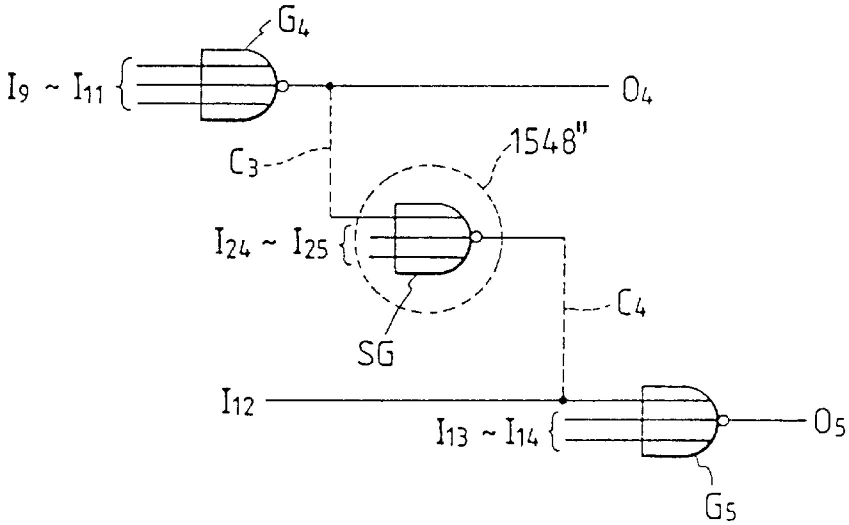
Figure 65R:
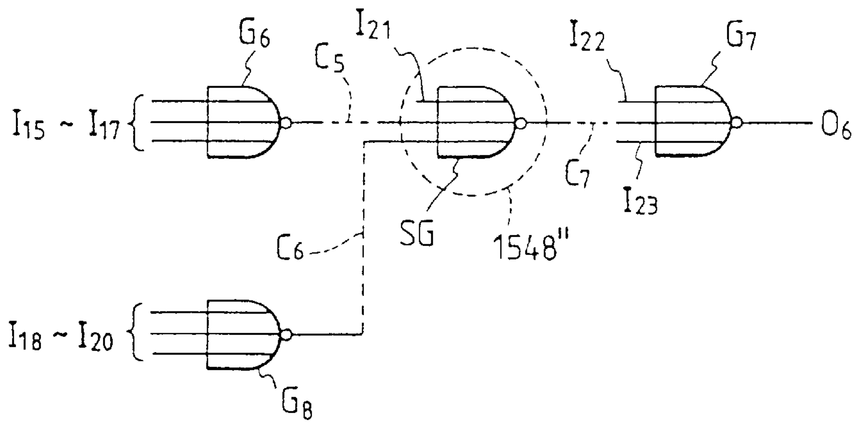
Figure 65S:
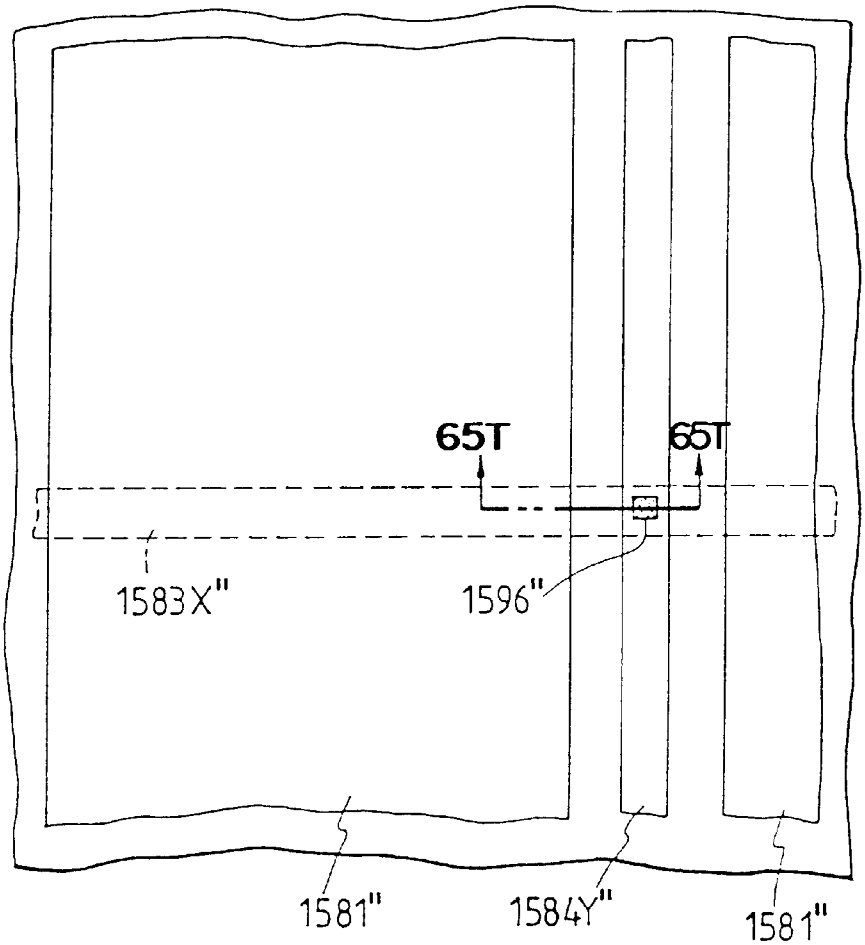
Figure 65T:
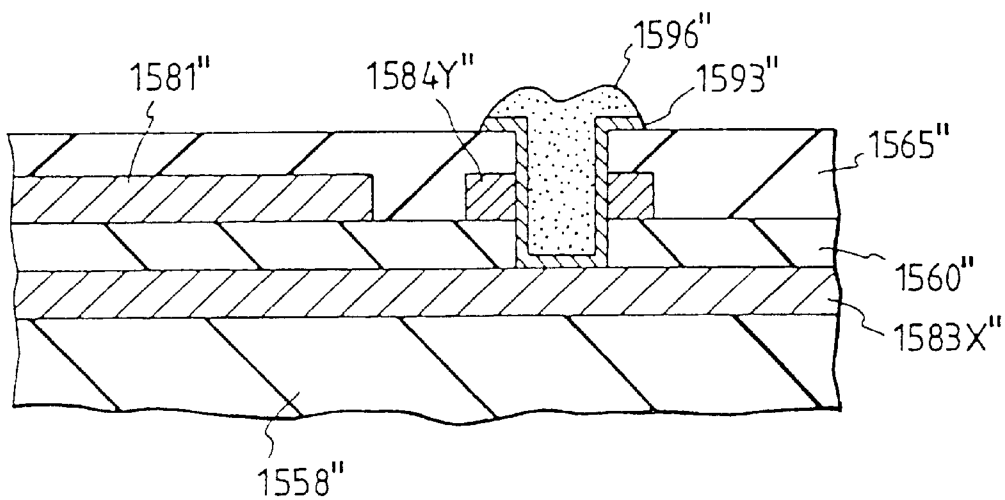
Figure 65U:
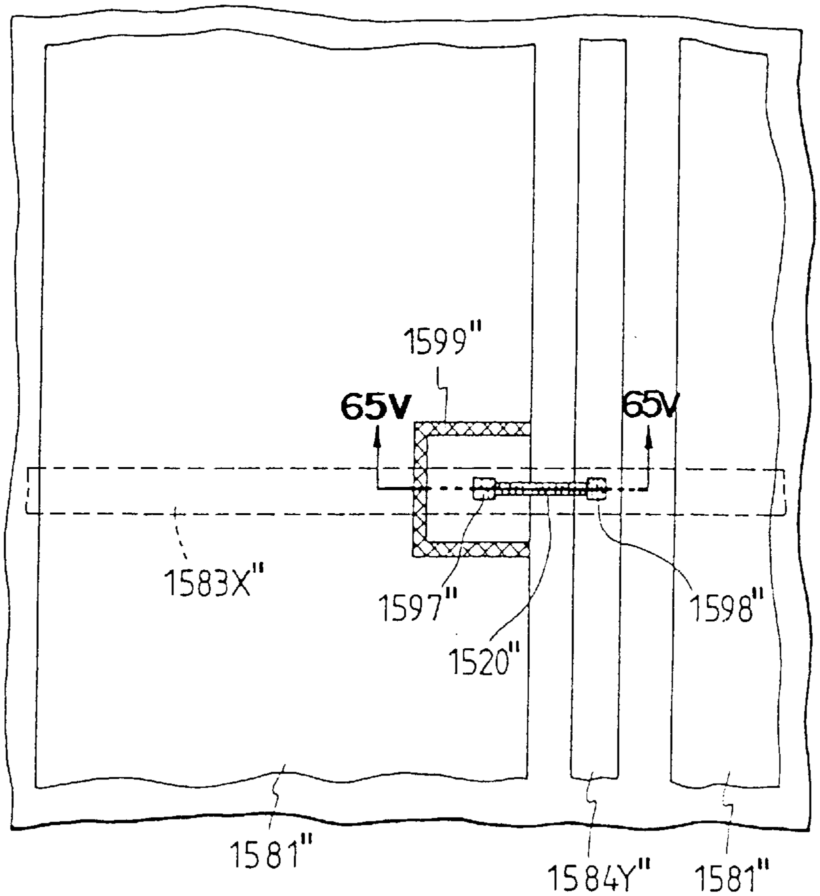
Figure 65V:
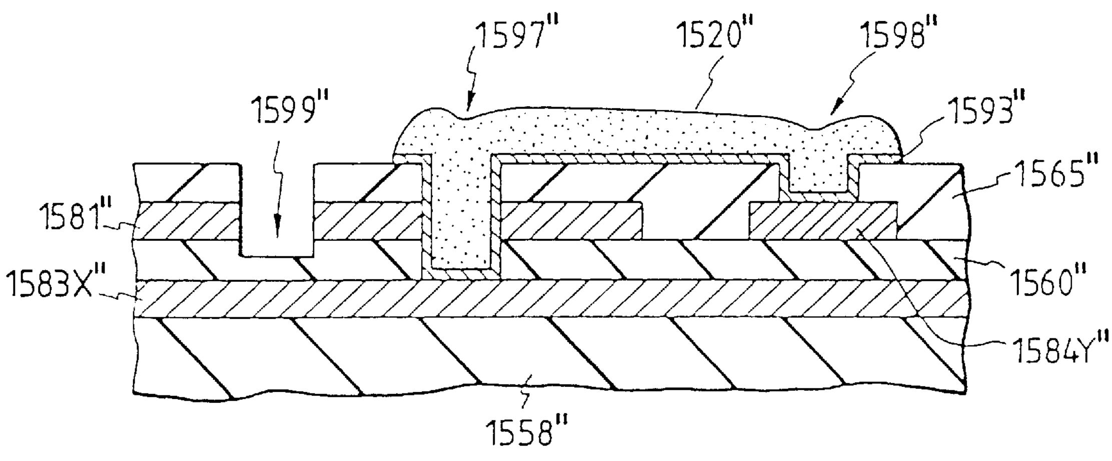
Figure 65W:
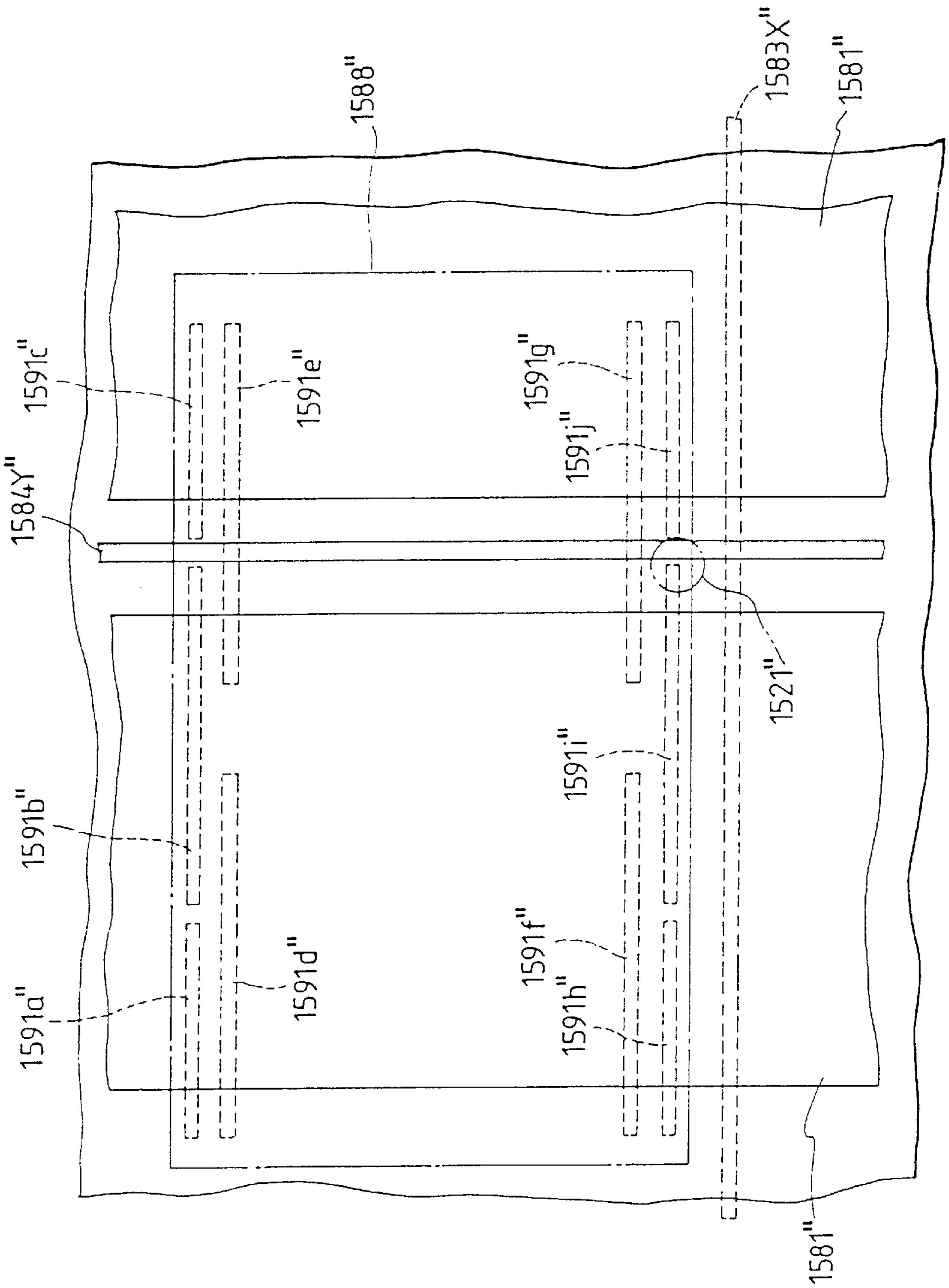
Figure 65X:
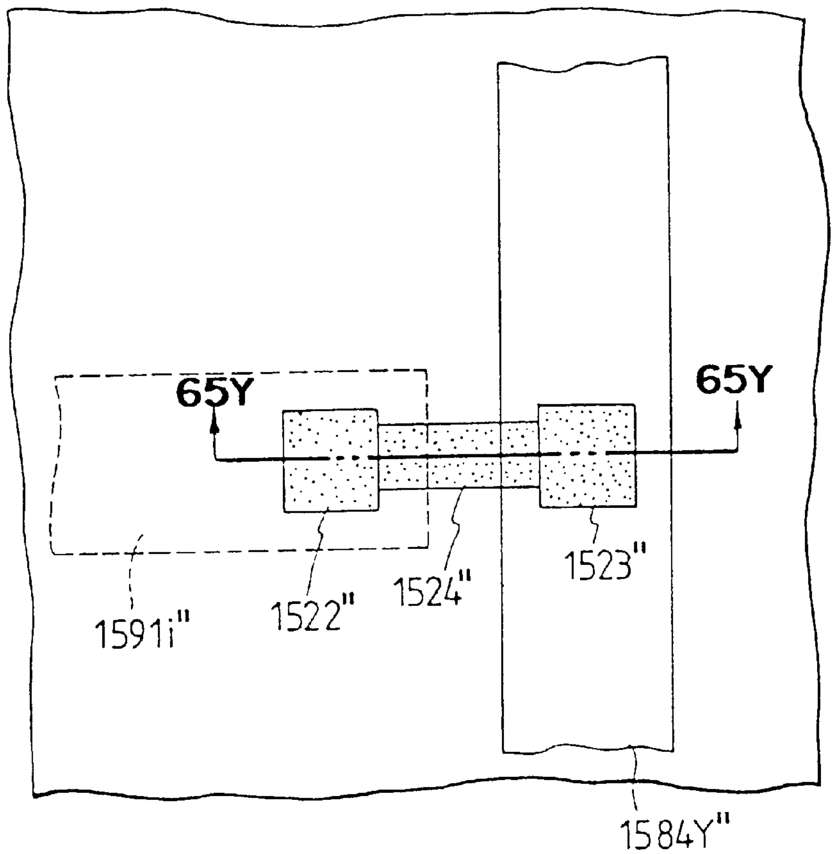
Figure 65Y:
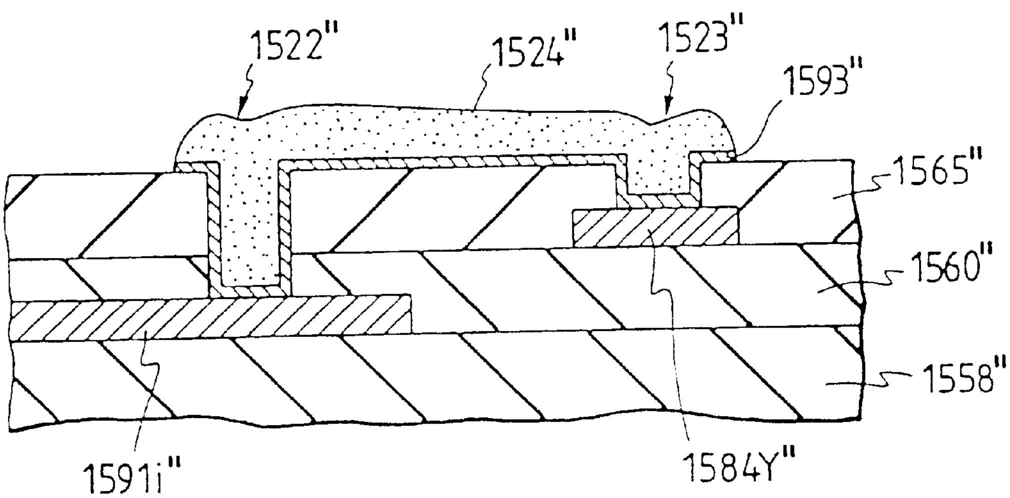
Figure 66A:
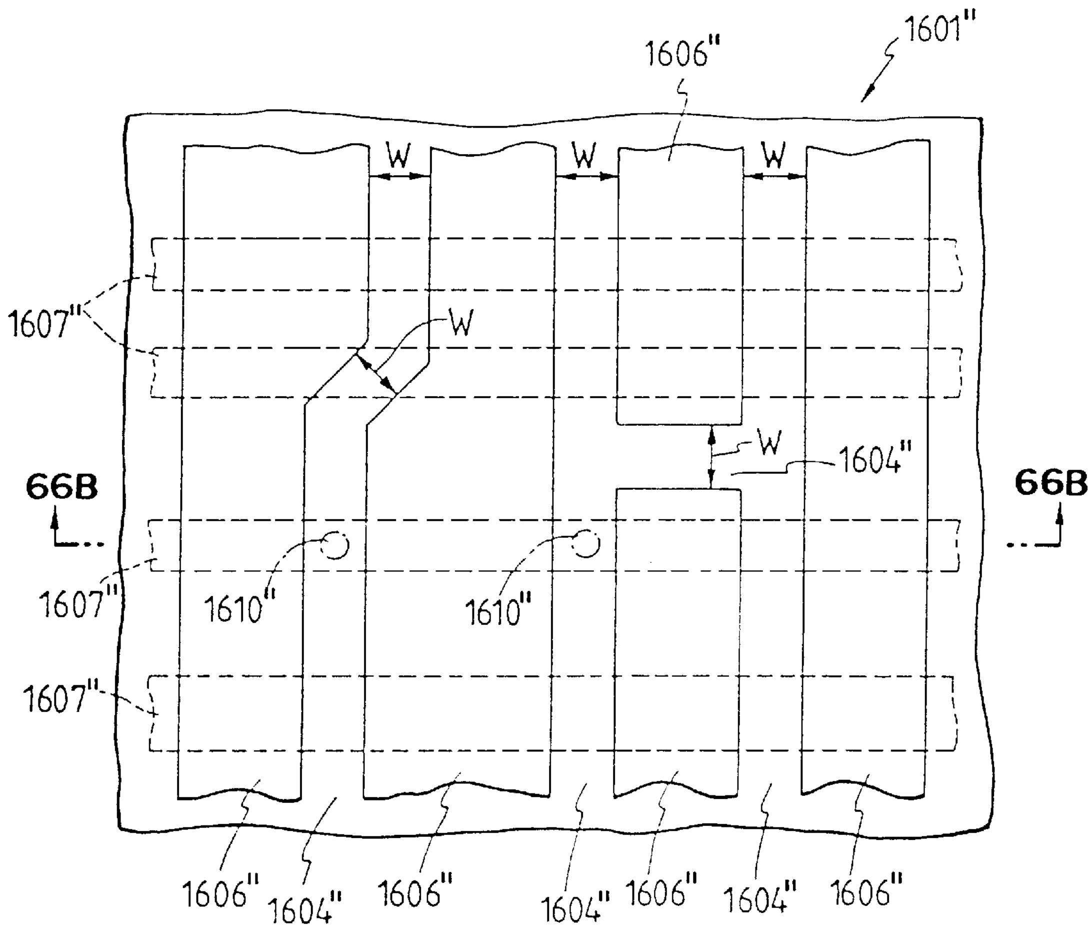
Figure 66B:
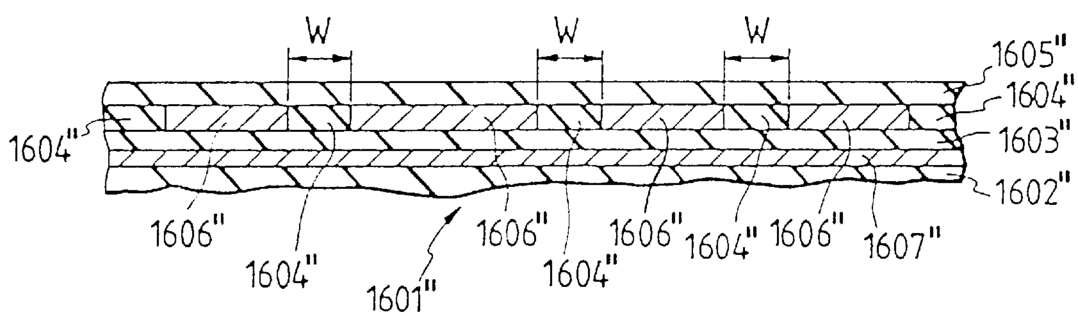
Figure 66C:
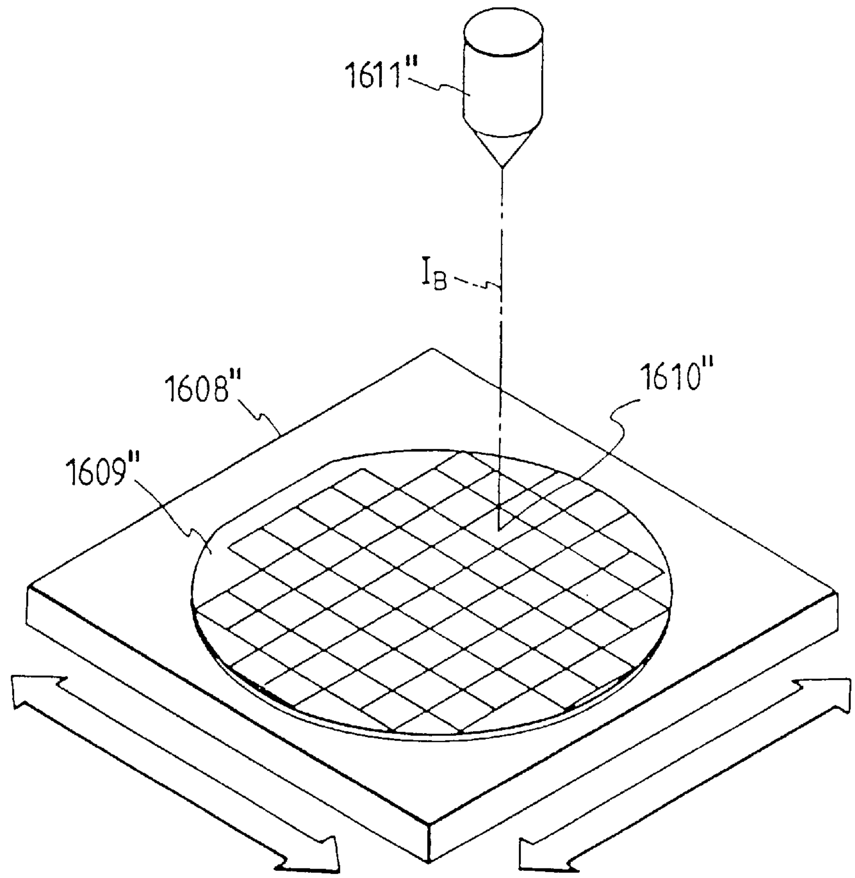
Figure 66D:
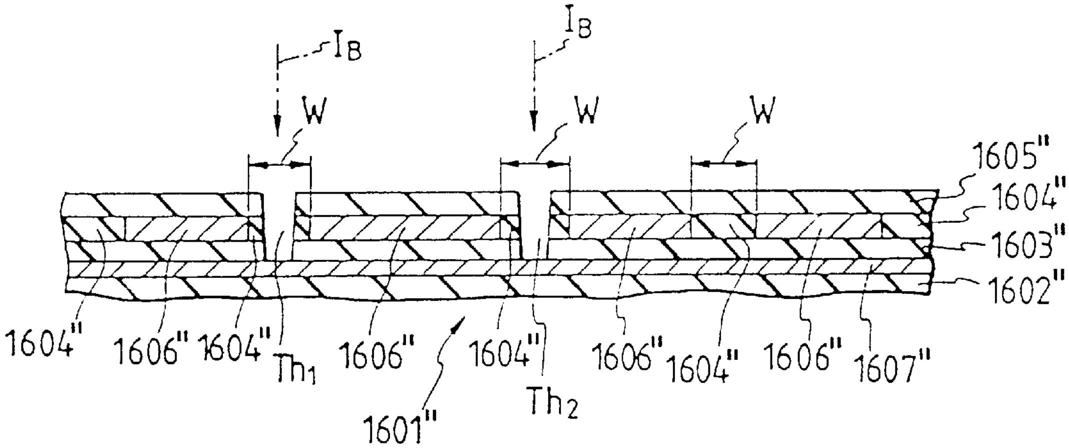
Figure 66E:
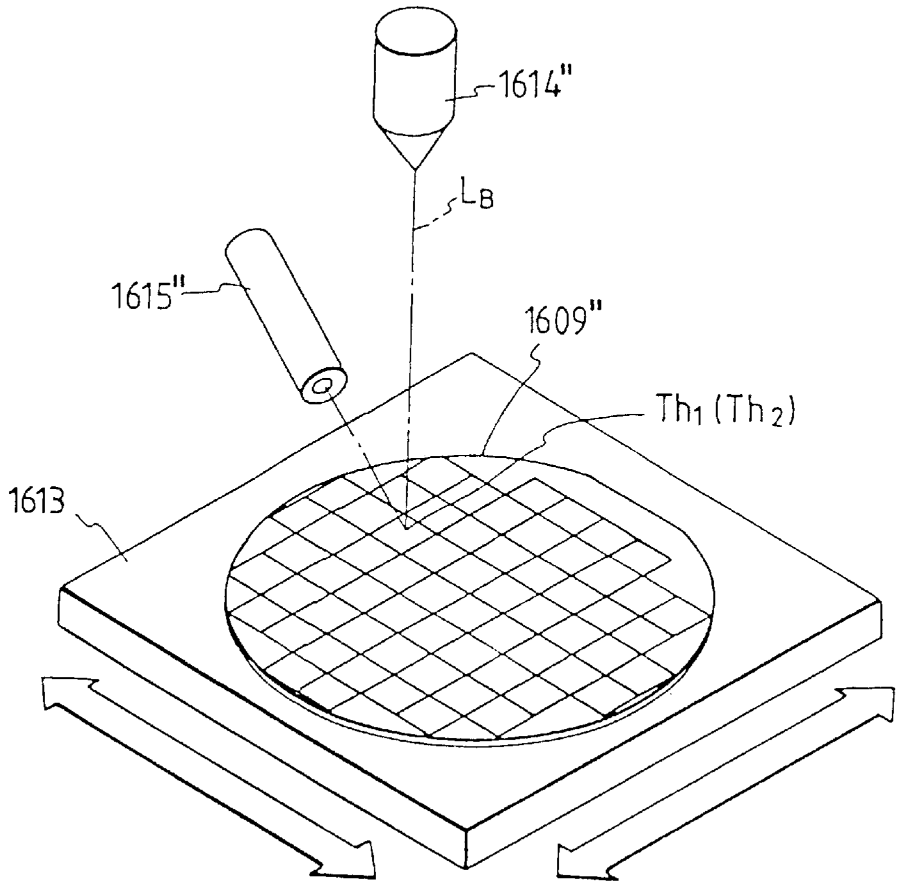
Figure 66F:
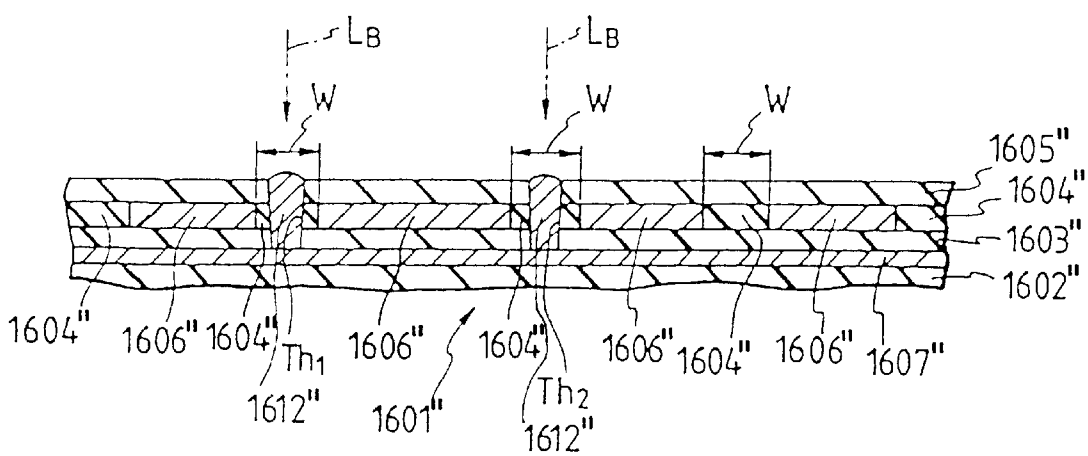
Figure 66G:
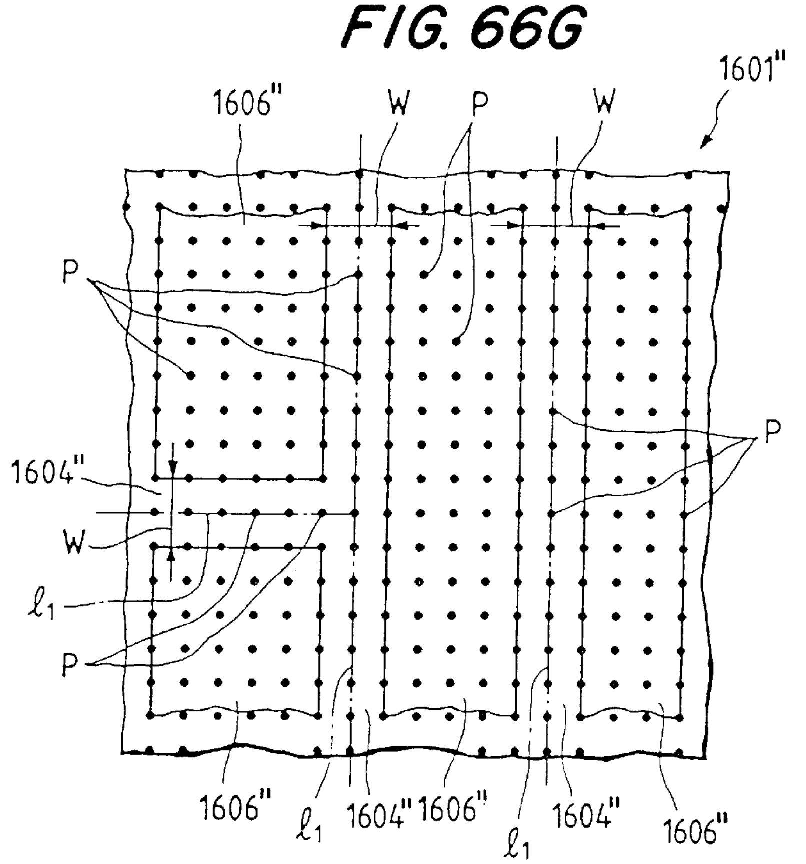
Figure 66H:
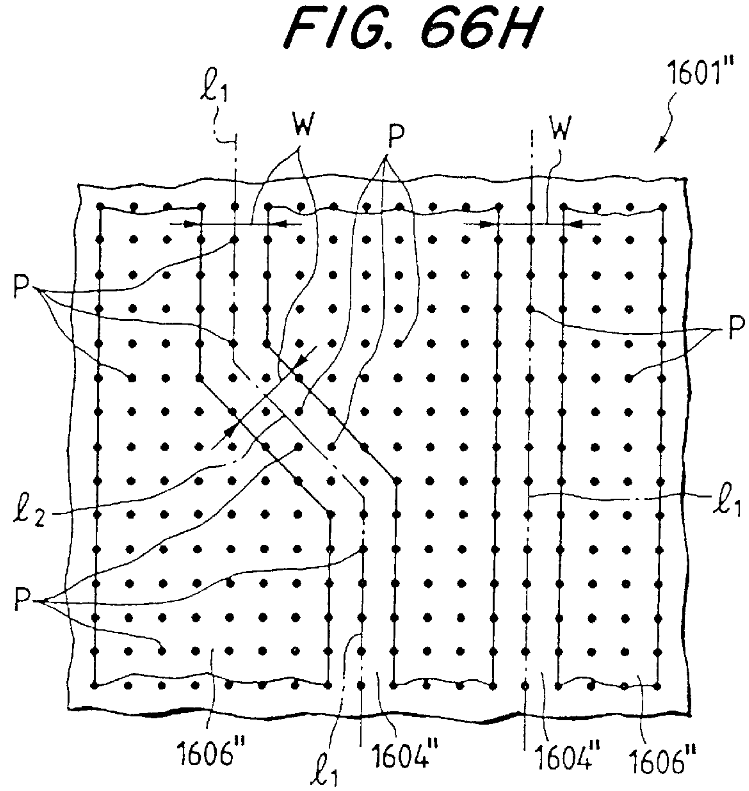
Figure 66I:
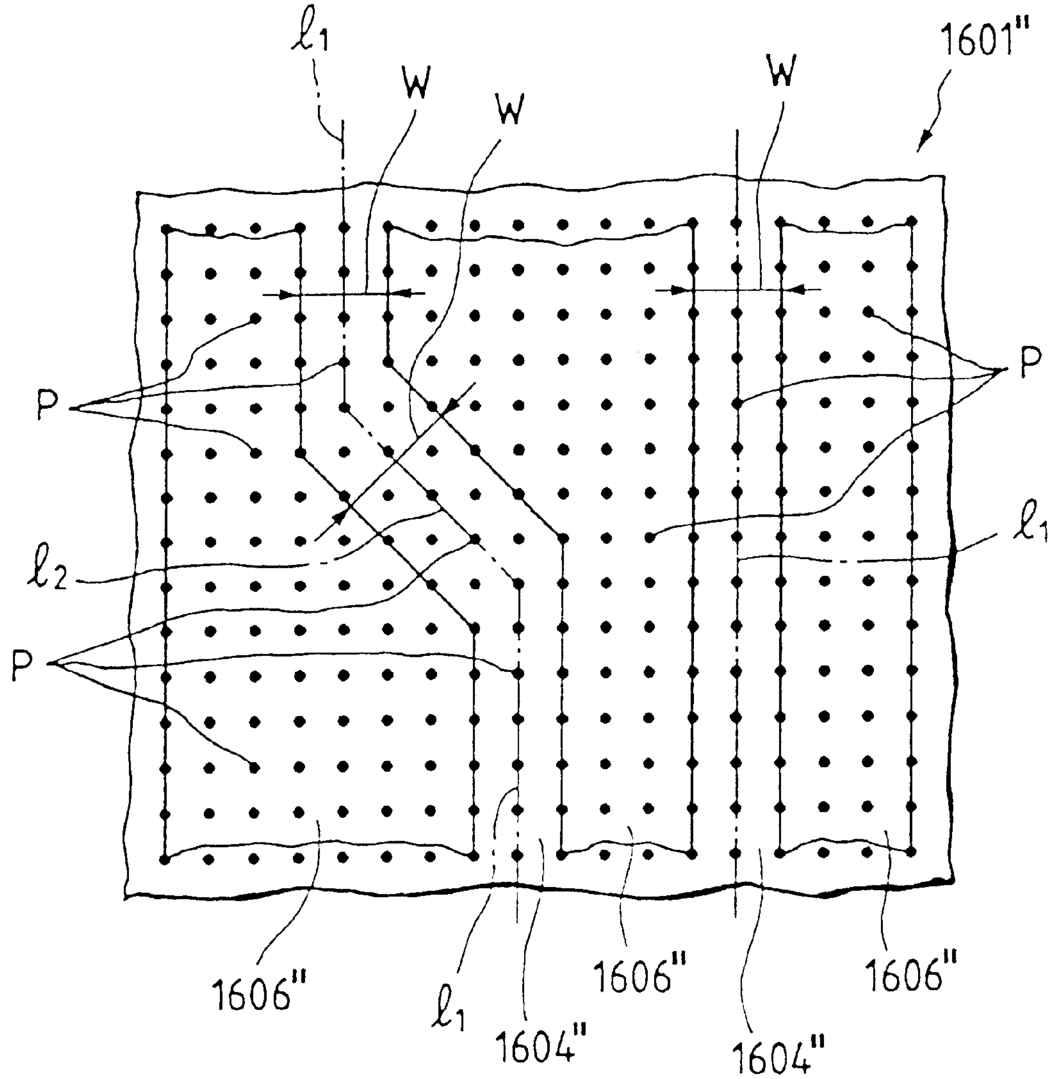
Figure 67A:
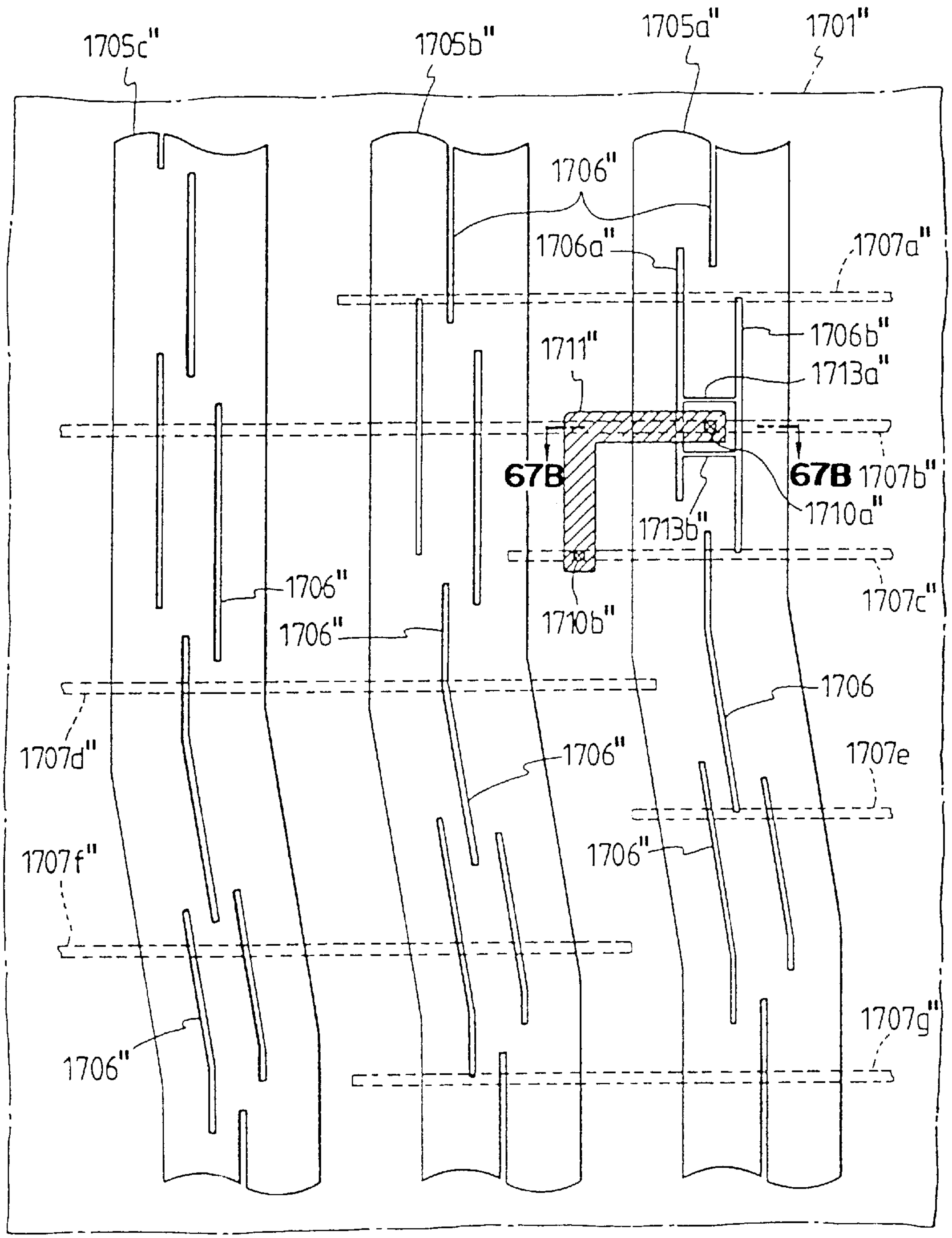
Figure 67B:
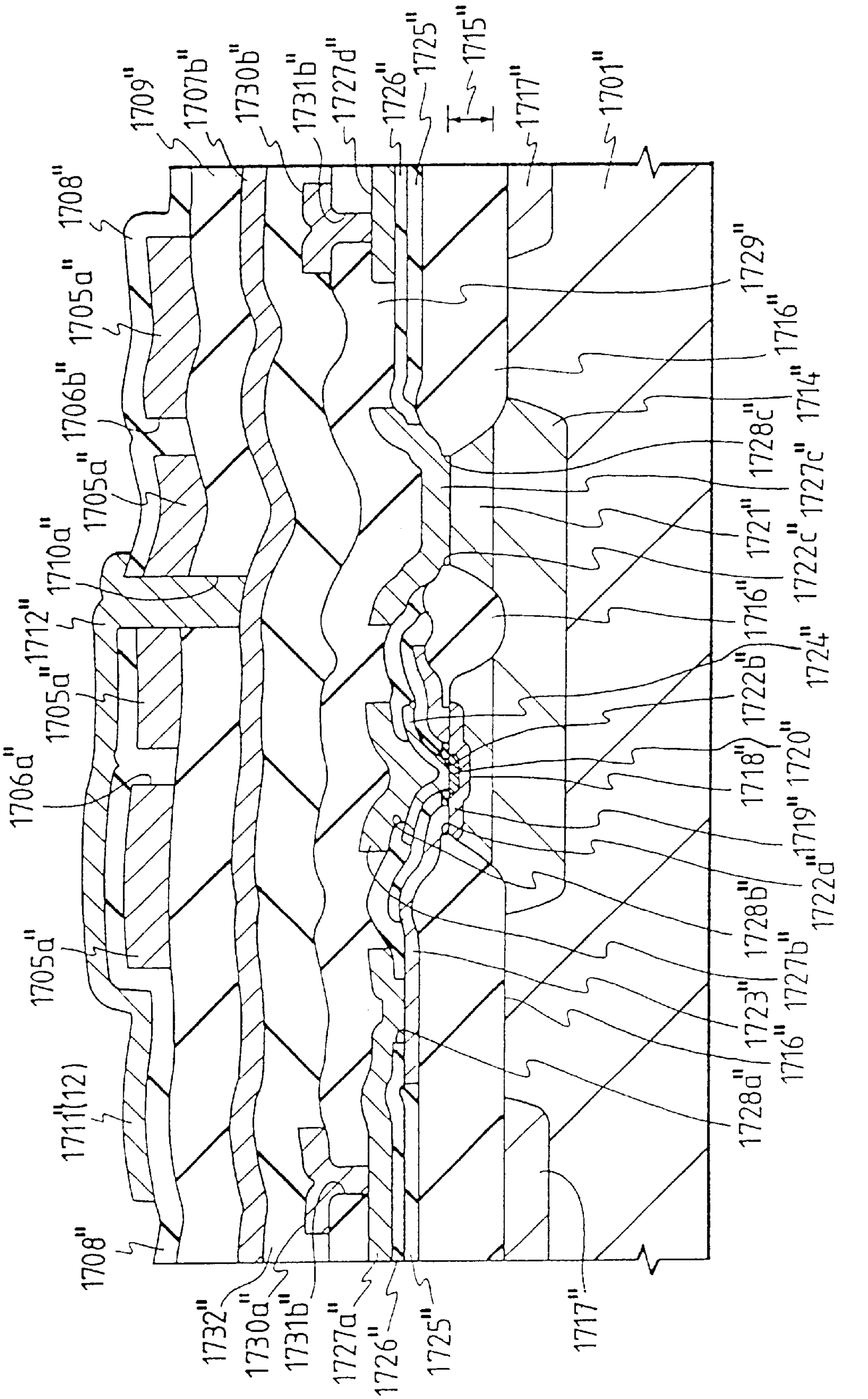
Figure 67C:
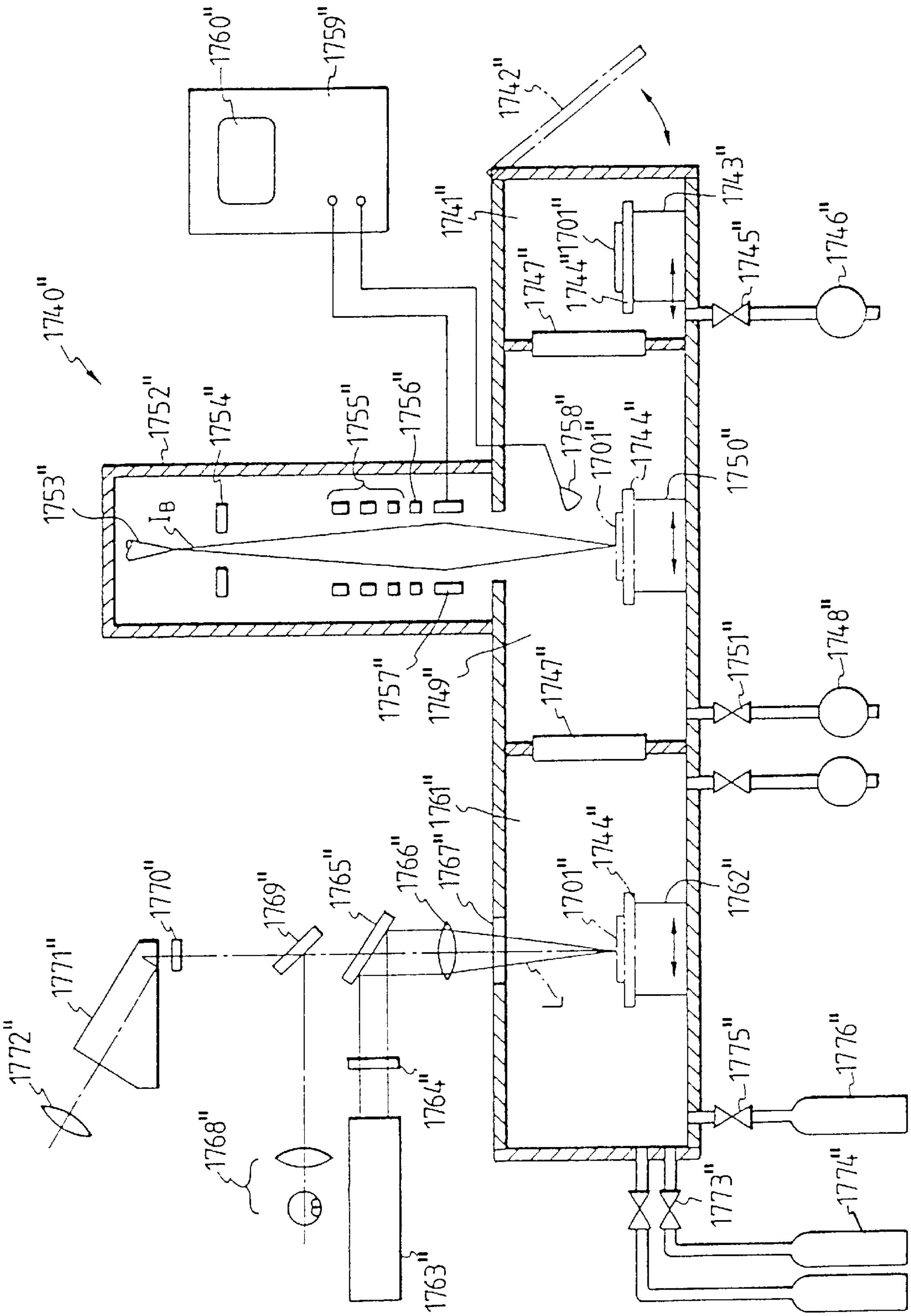
Figure 67D:
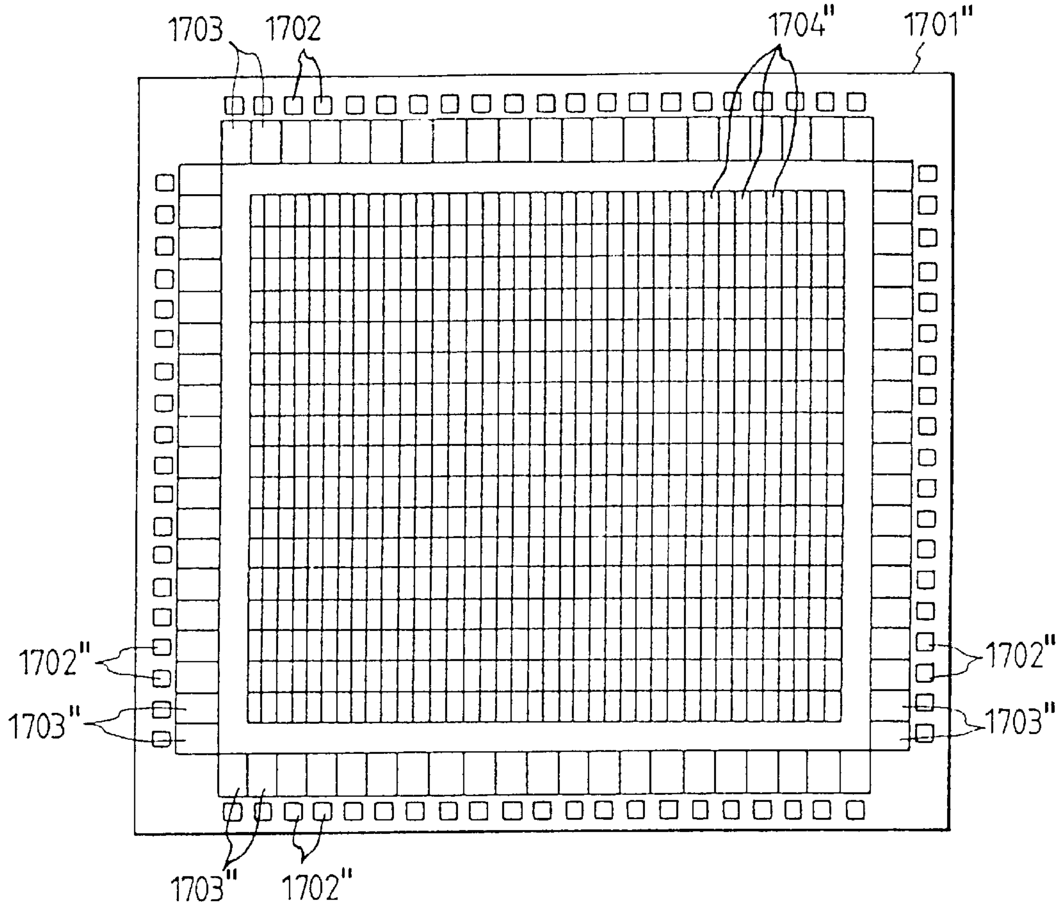
Figure 67E:
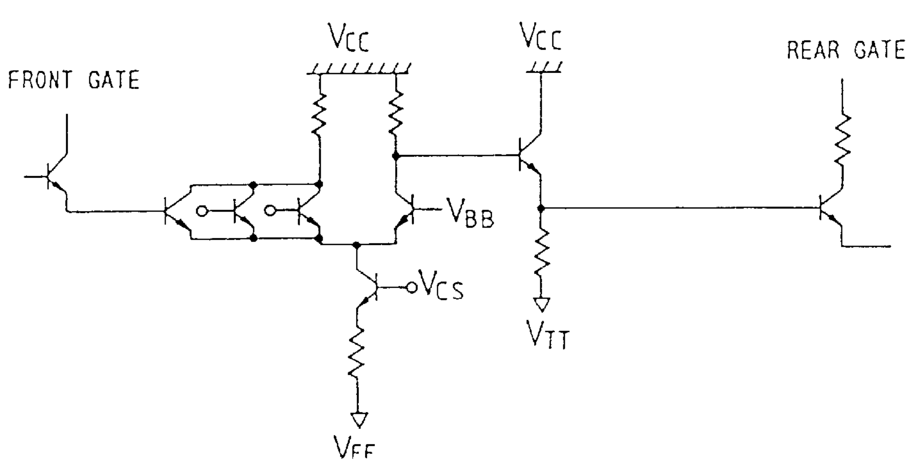
Figure 67F:
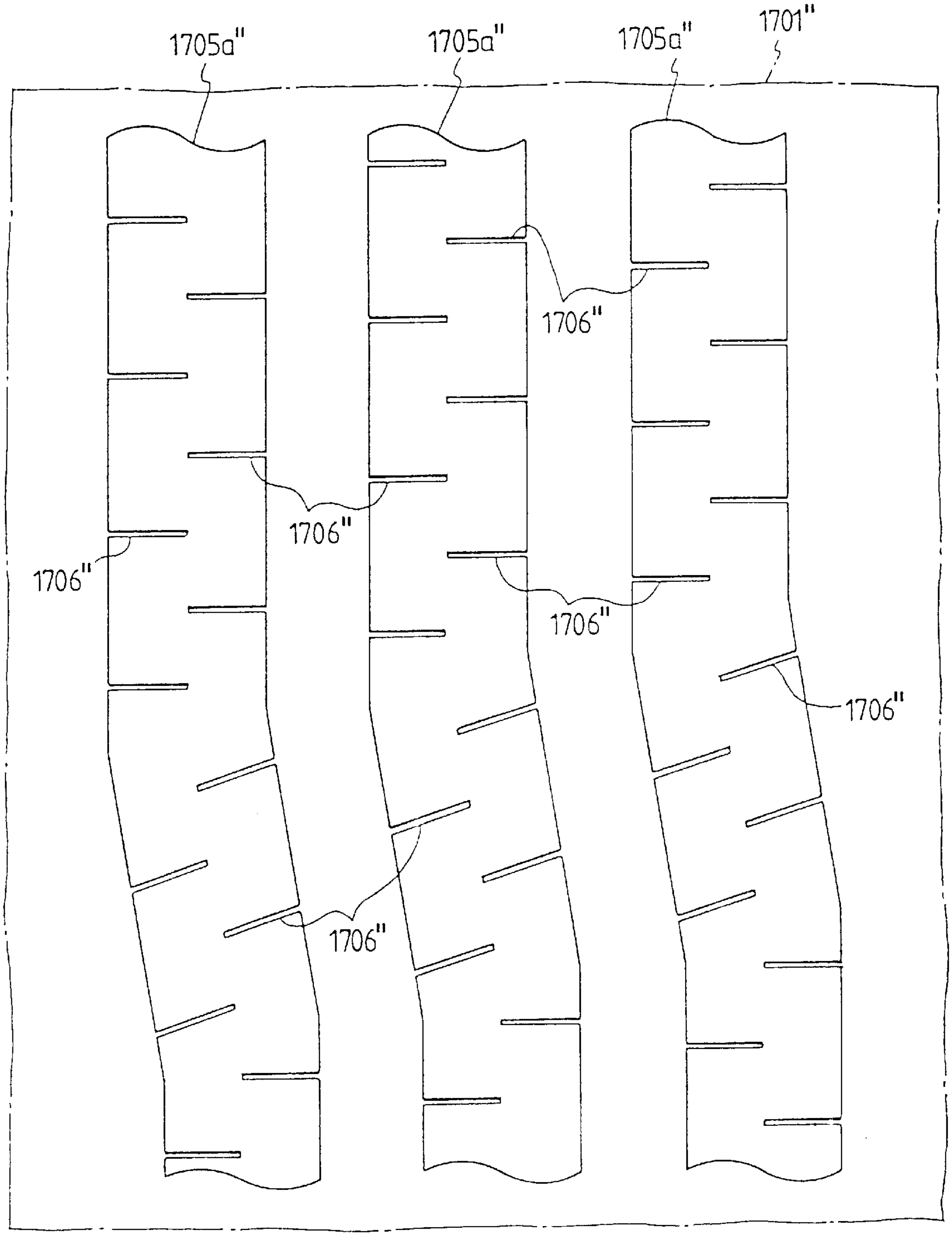
Figure 68A:
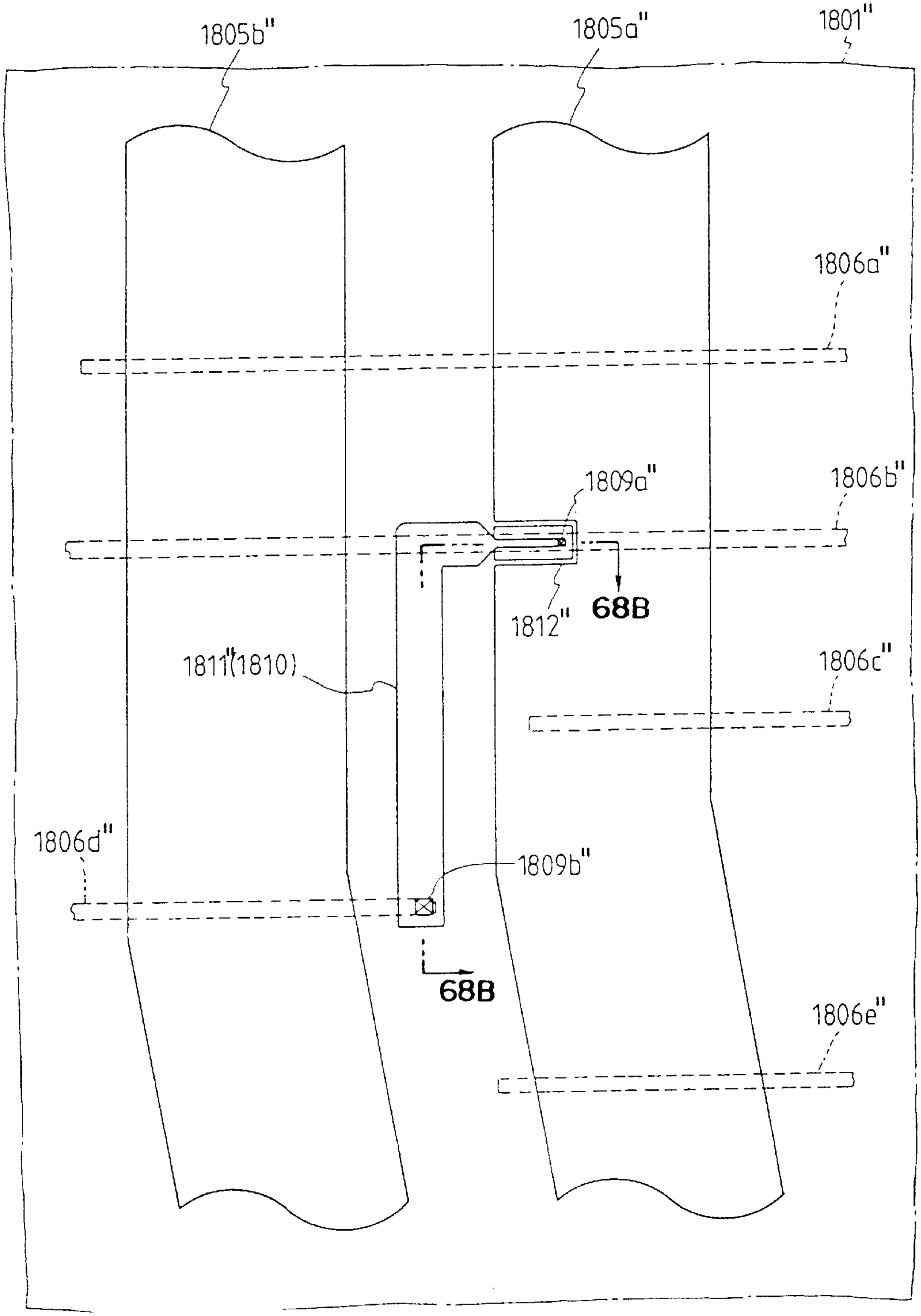
Figure 68B:
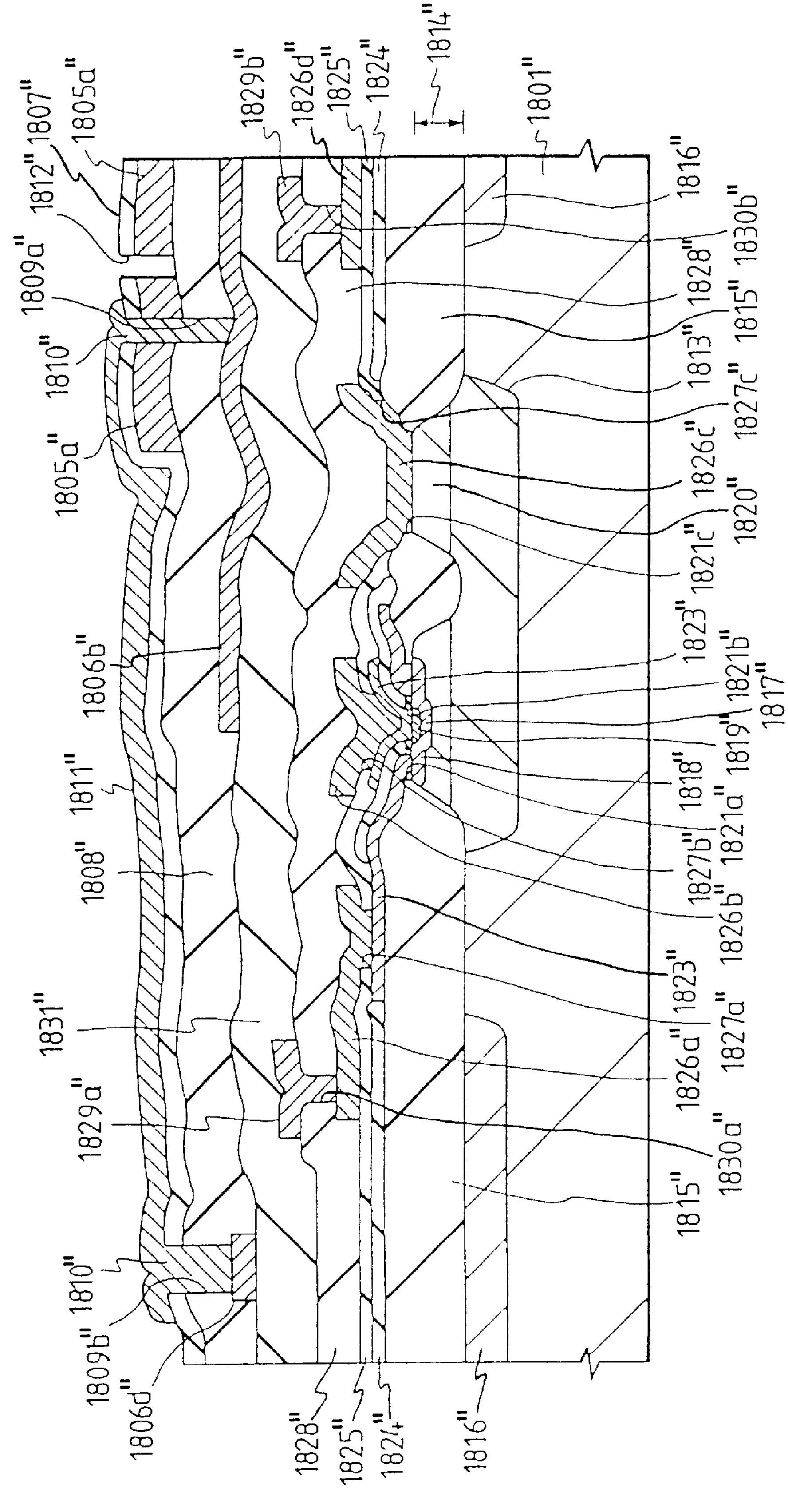
Figure 68C:
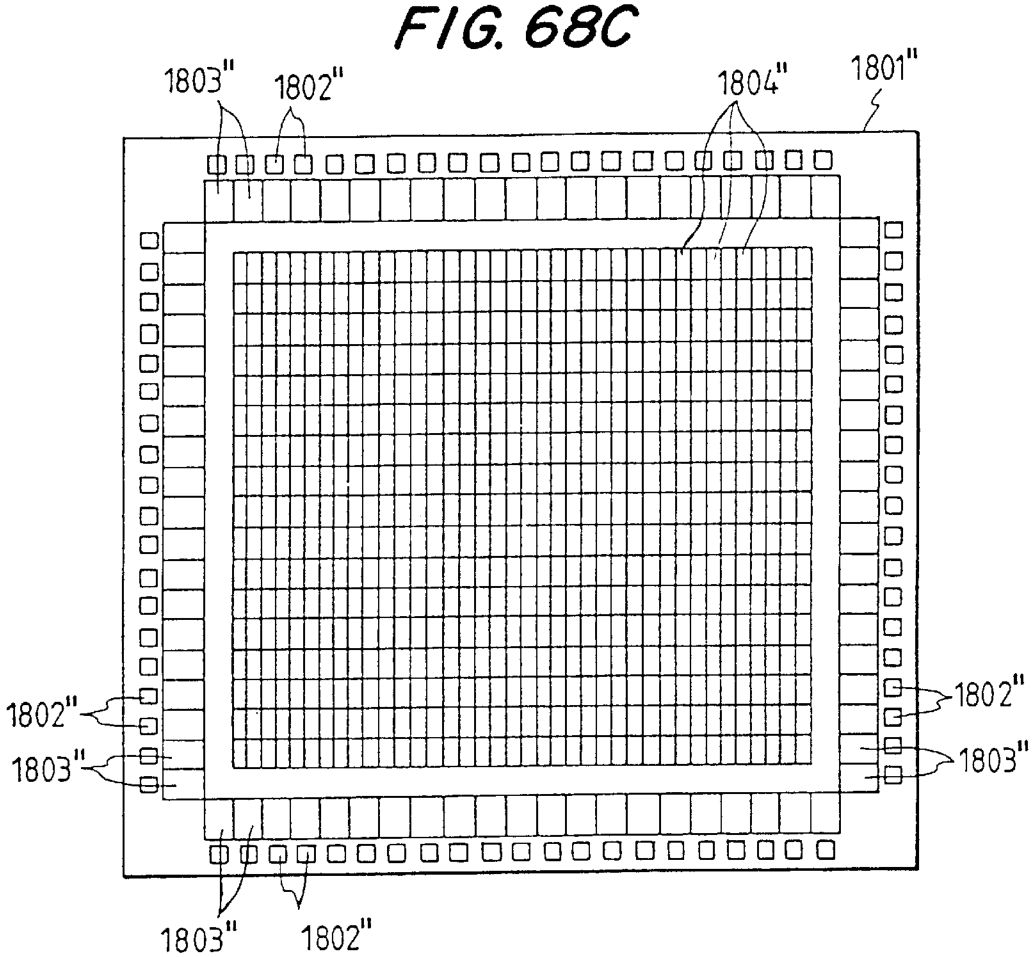
Figure 68D:
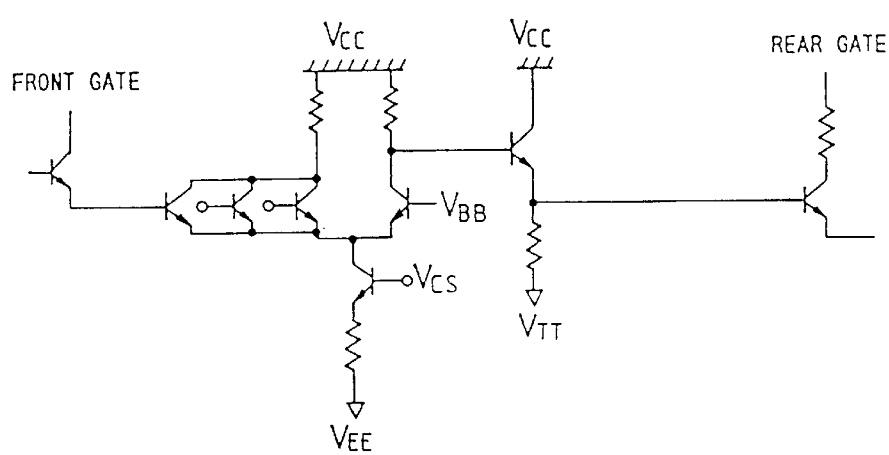
Figure 68E:
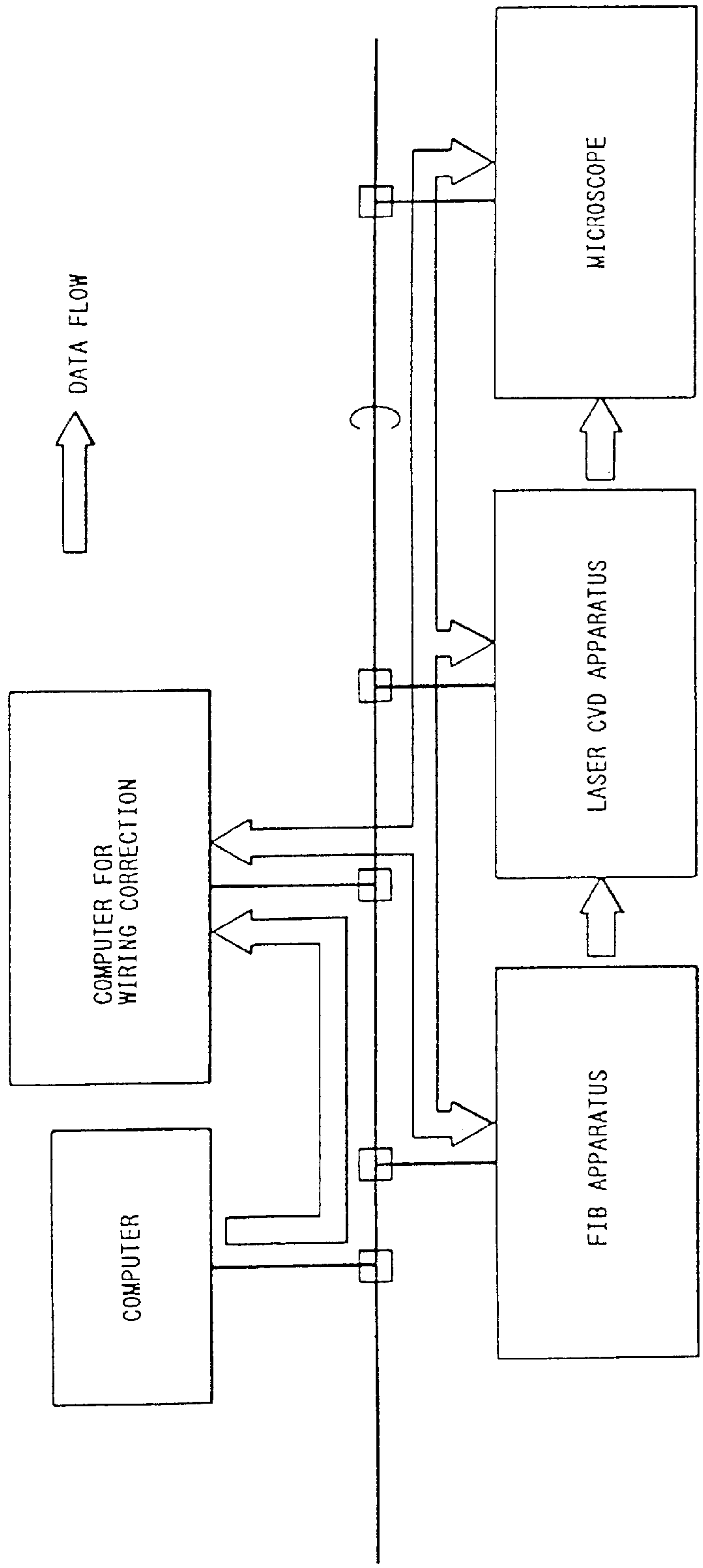
Figure 68F:
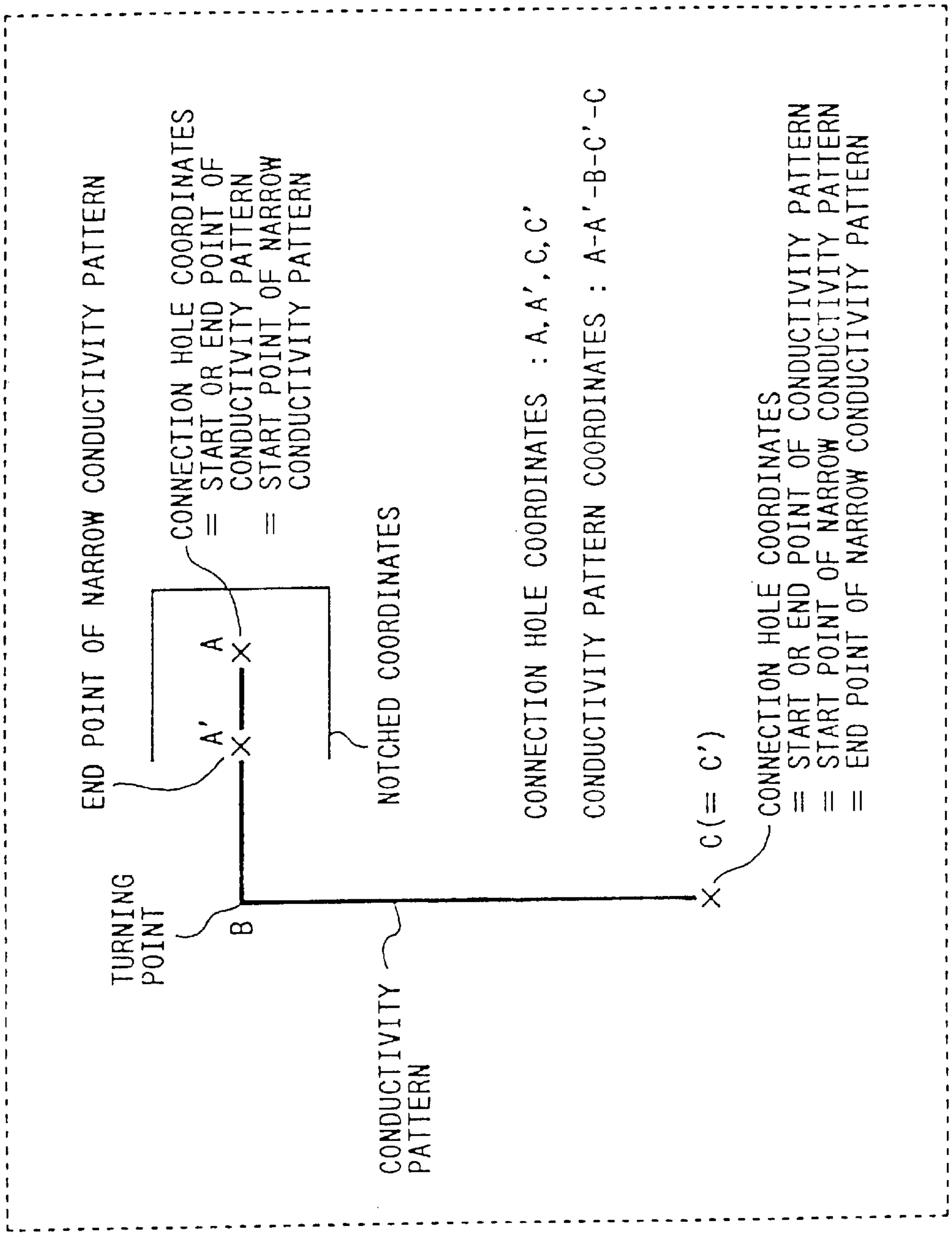
Figure 68G:
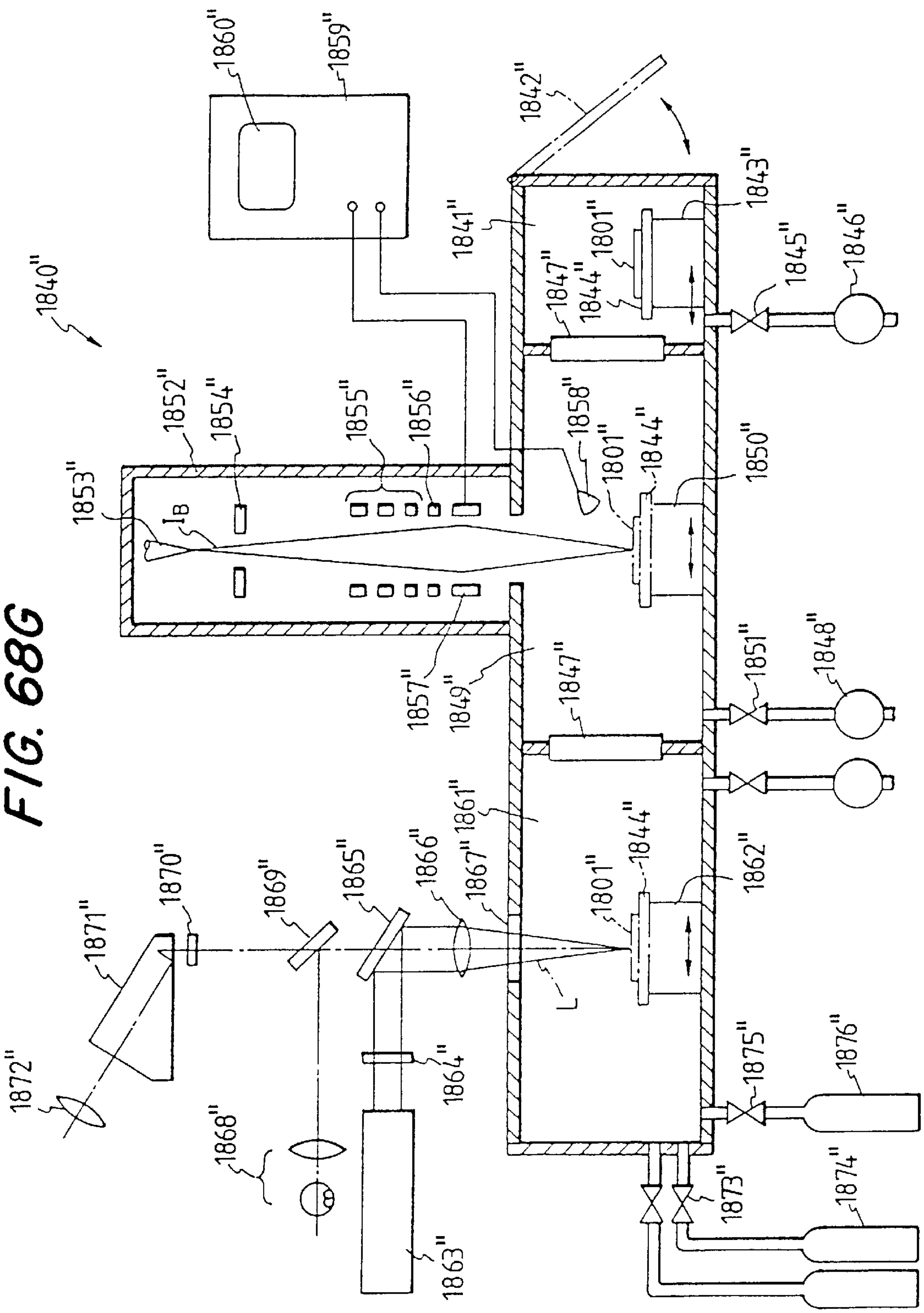
Figure 68H:
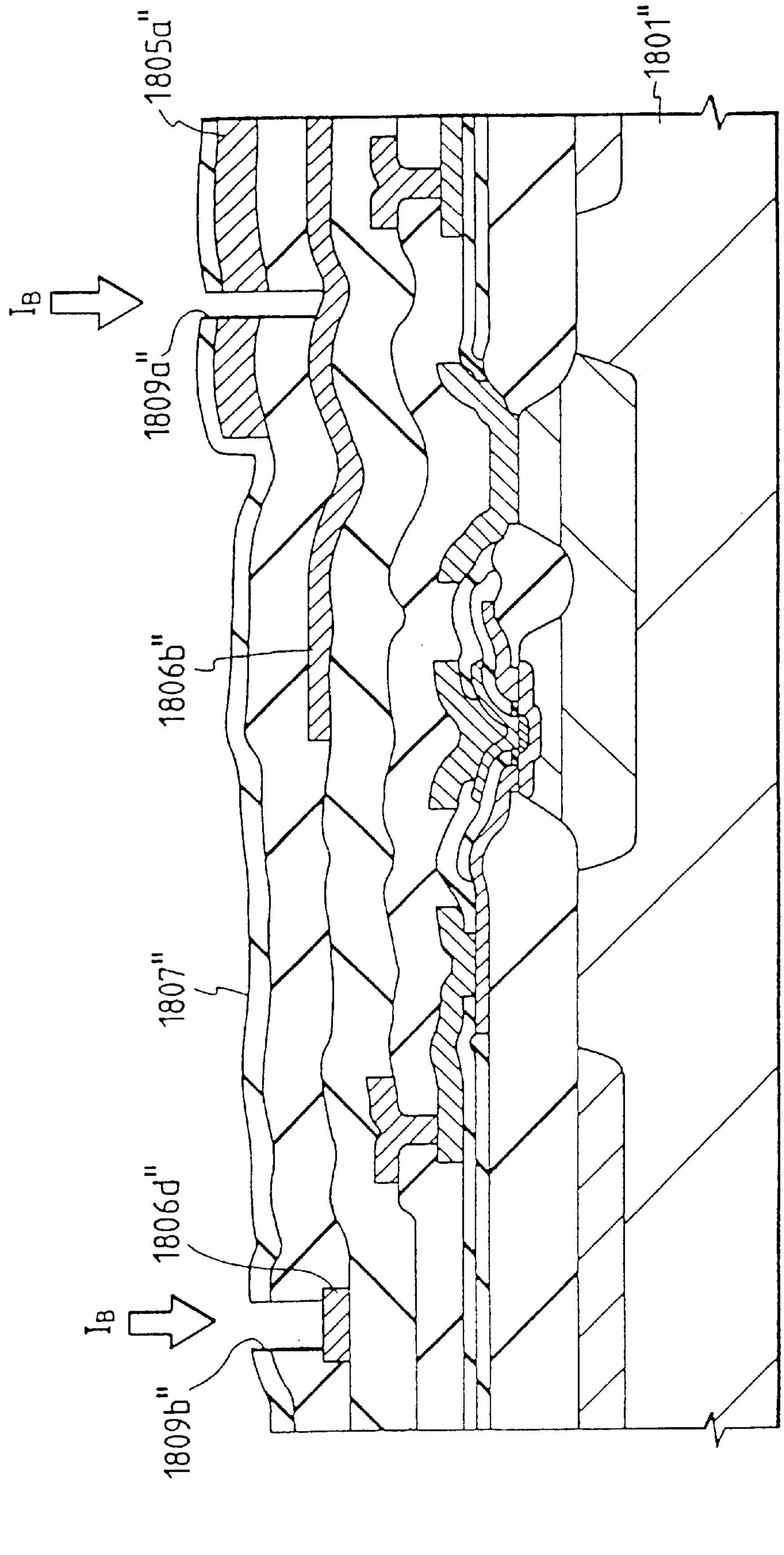
Figure 68I:
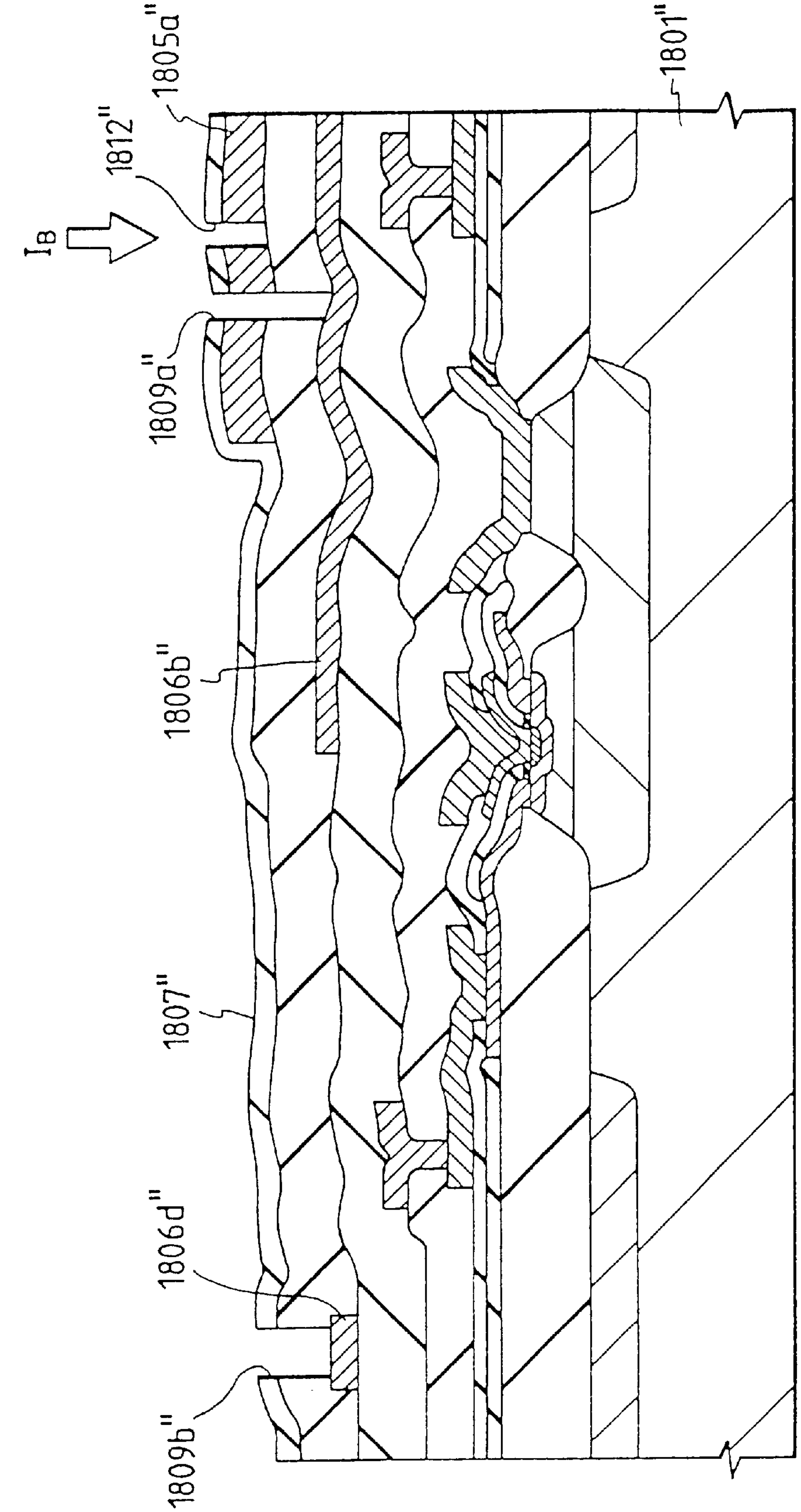
Figure 68J:
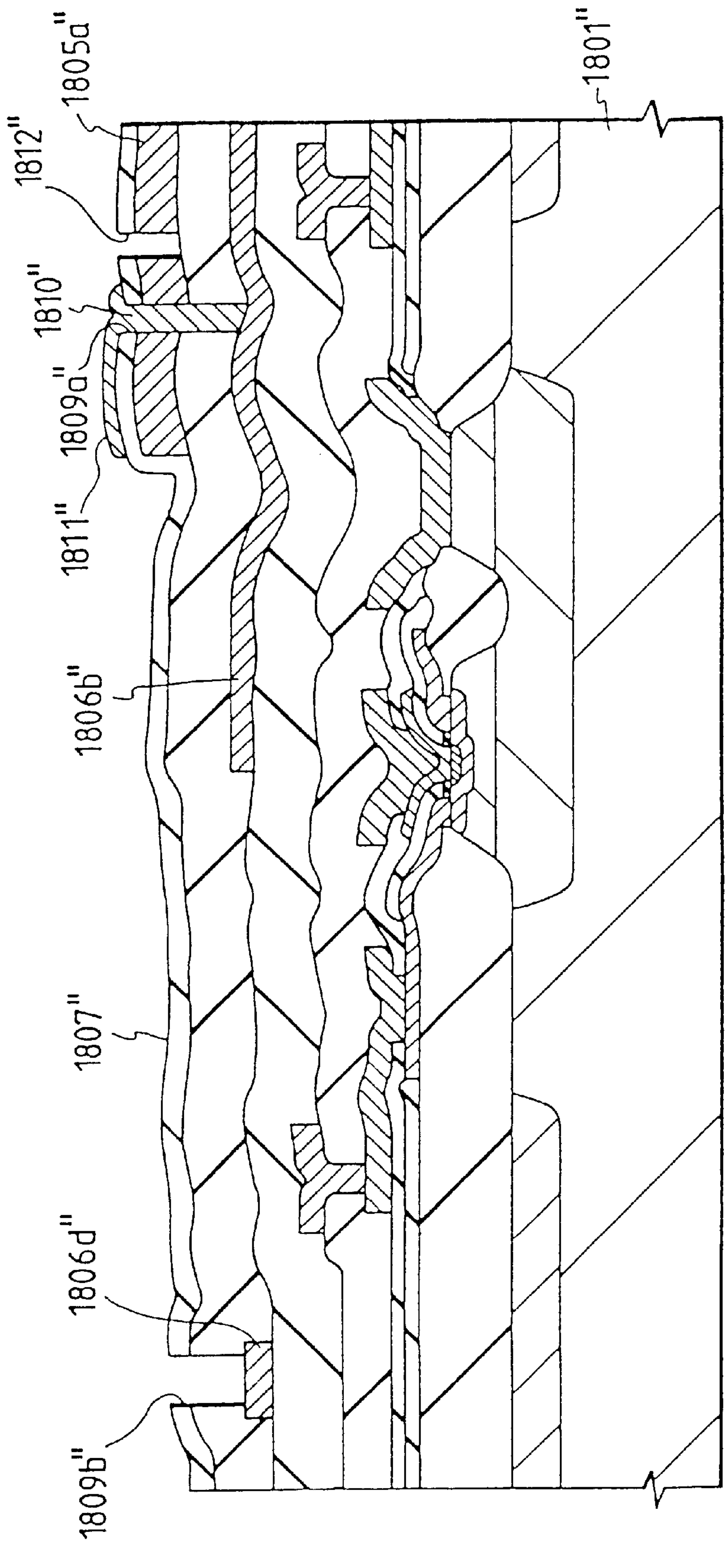
Figure 69A:
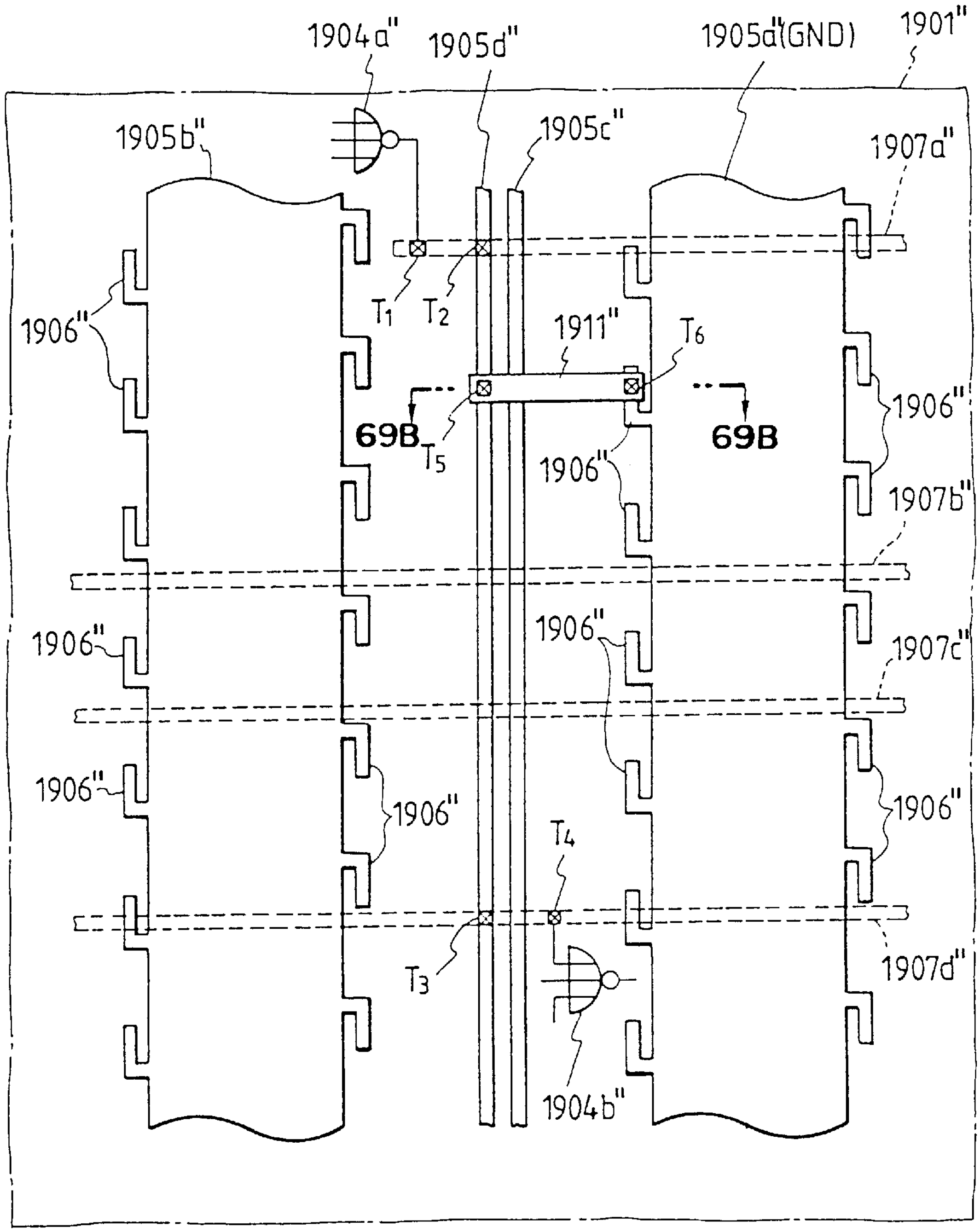
Figure 69B:
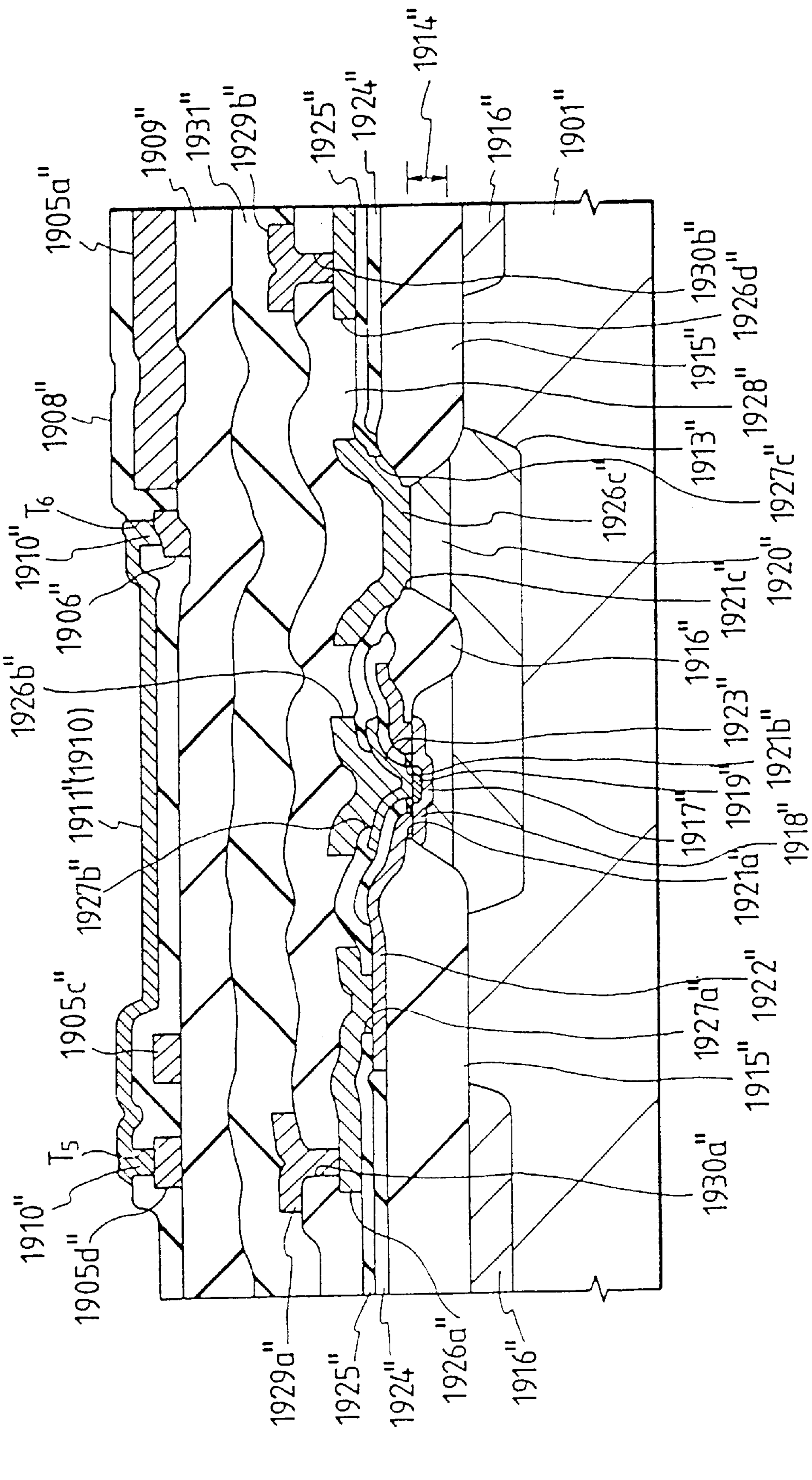
Figure 69C:
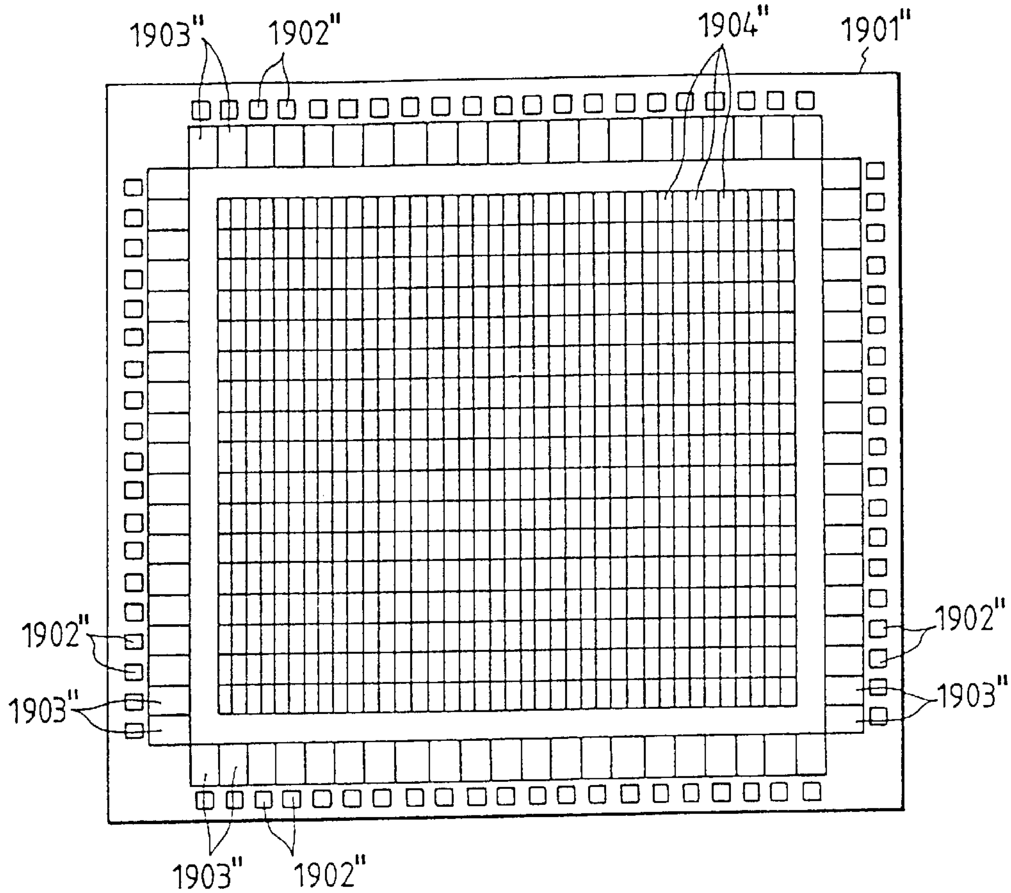
Figure 69D:
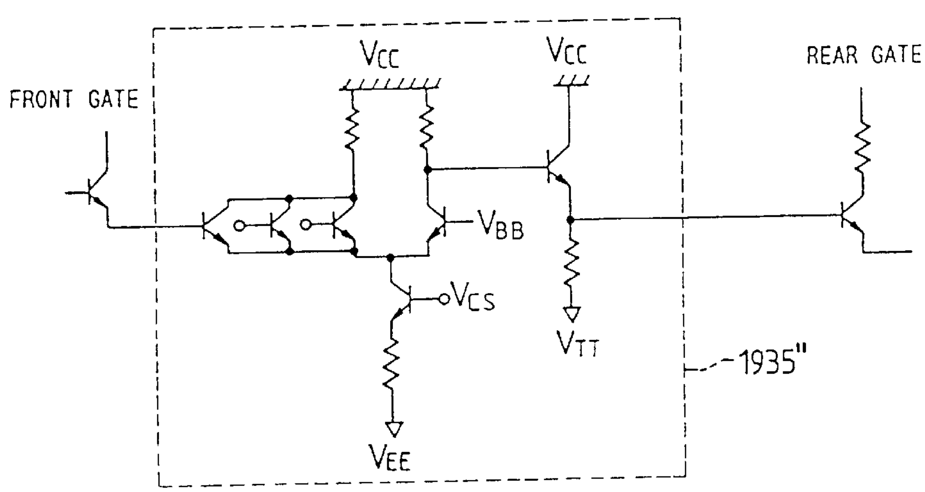
Figure 69E:
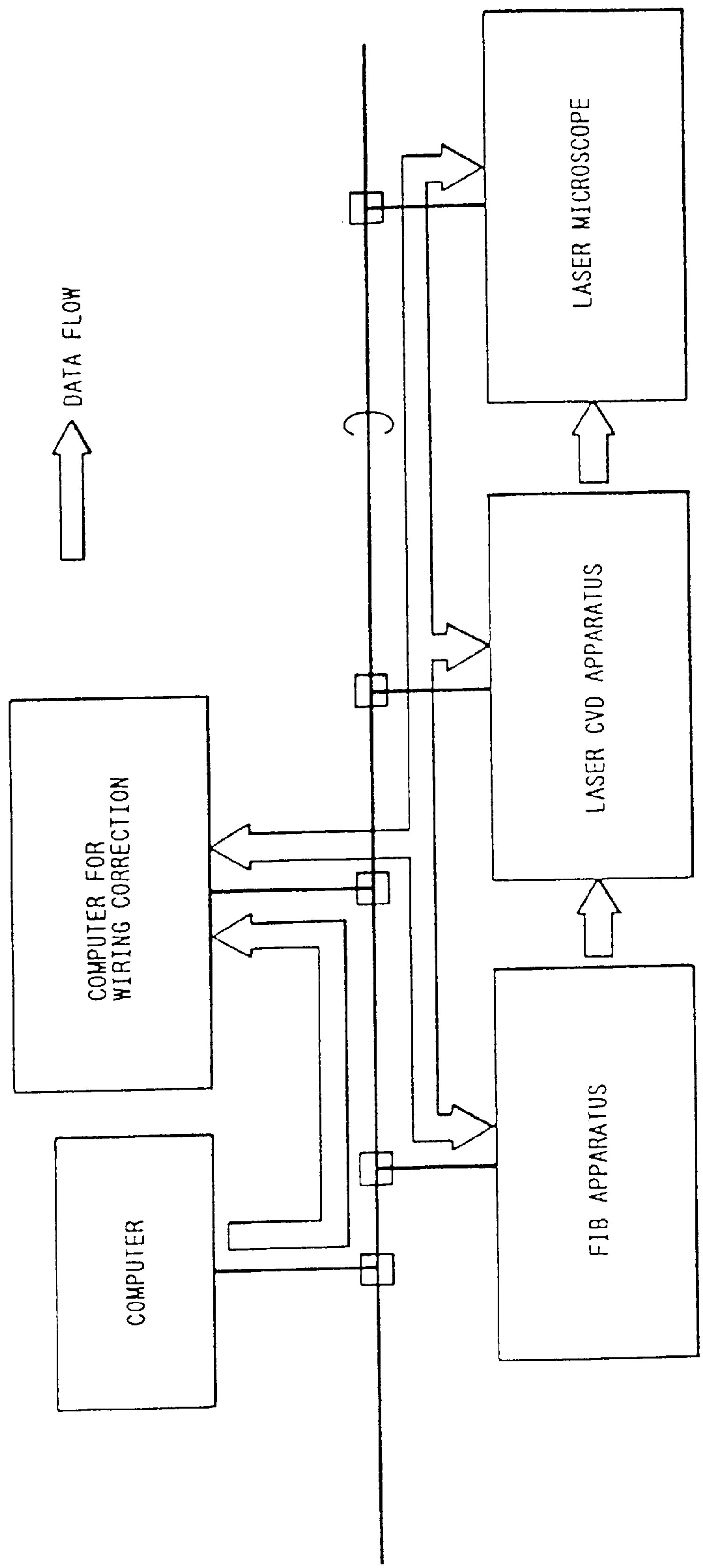
Figure 69F:
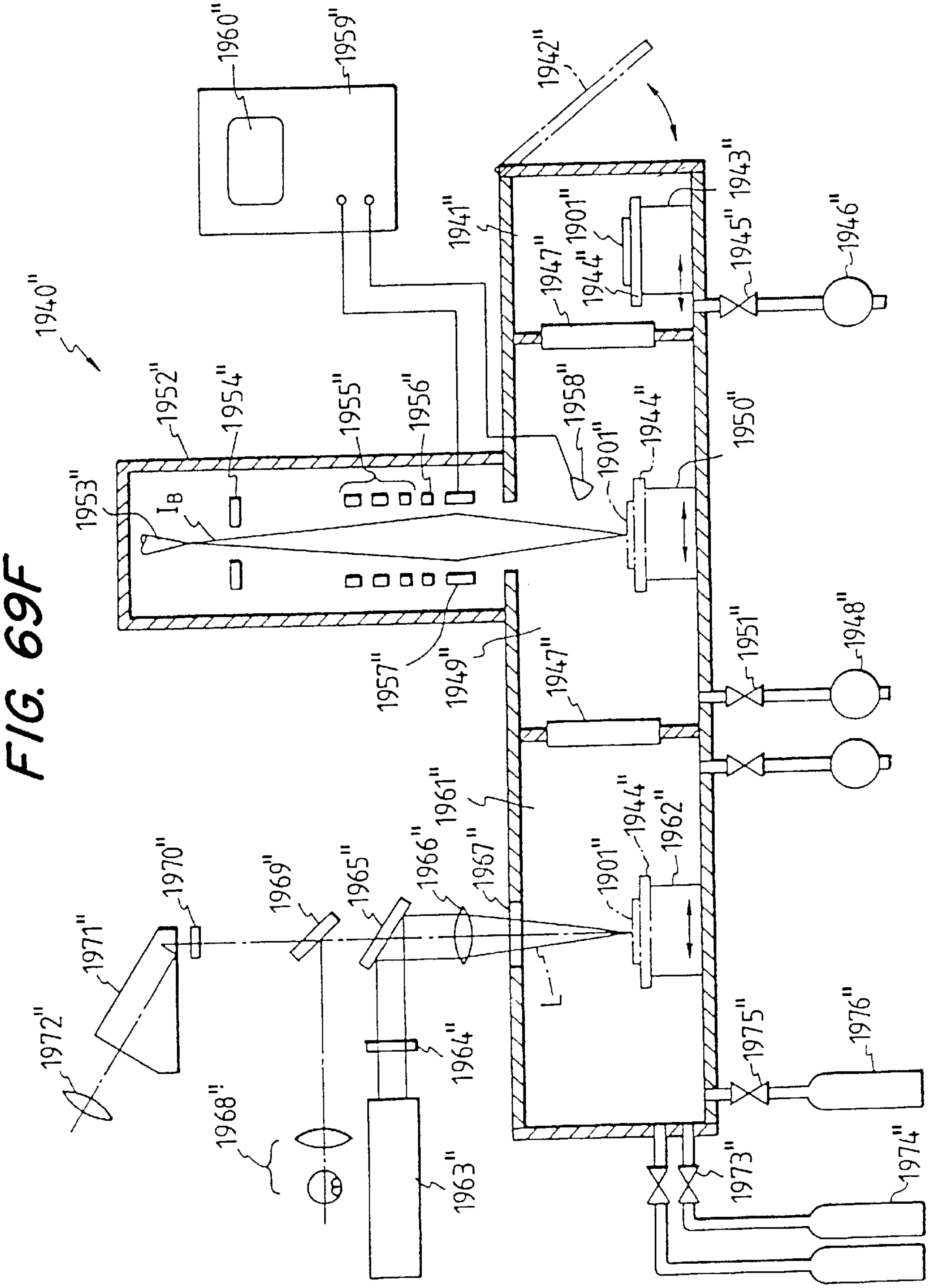
Figure 69G:
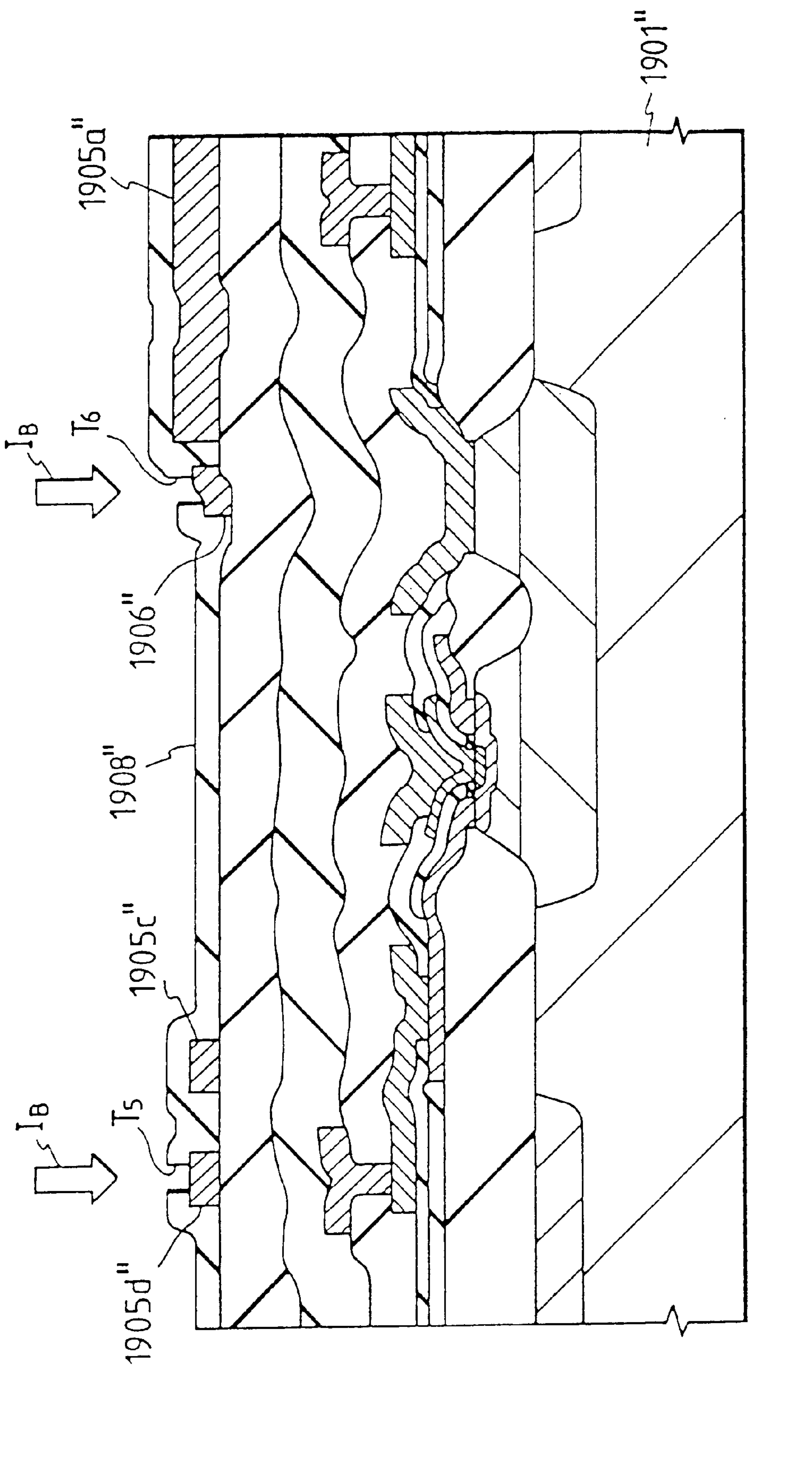
Figure 69H:
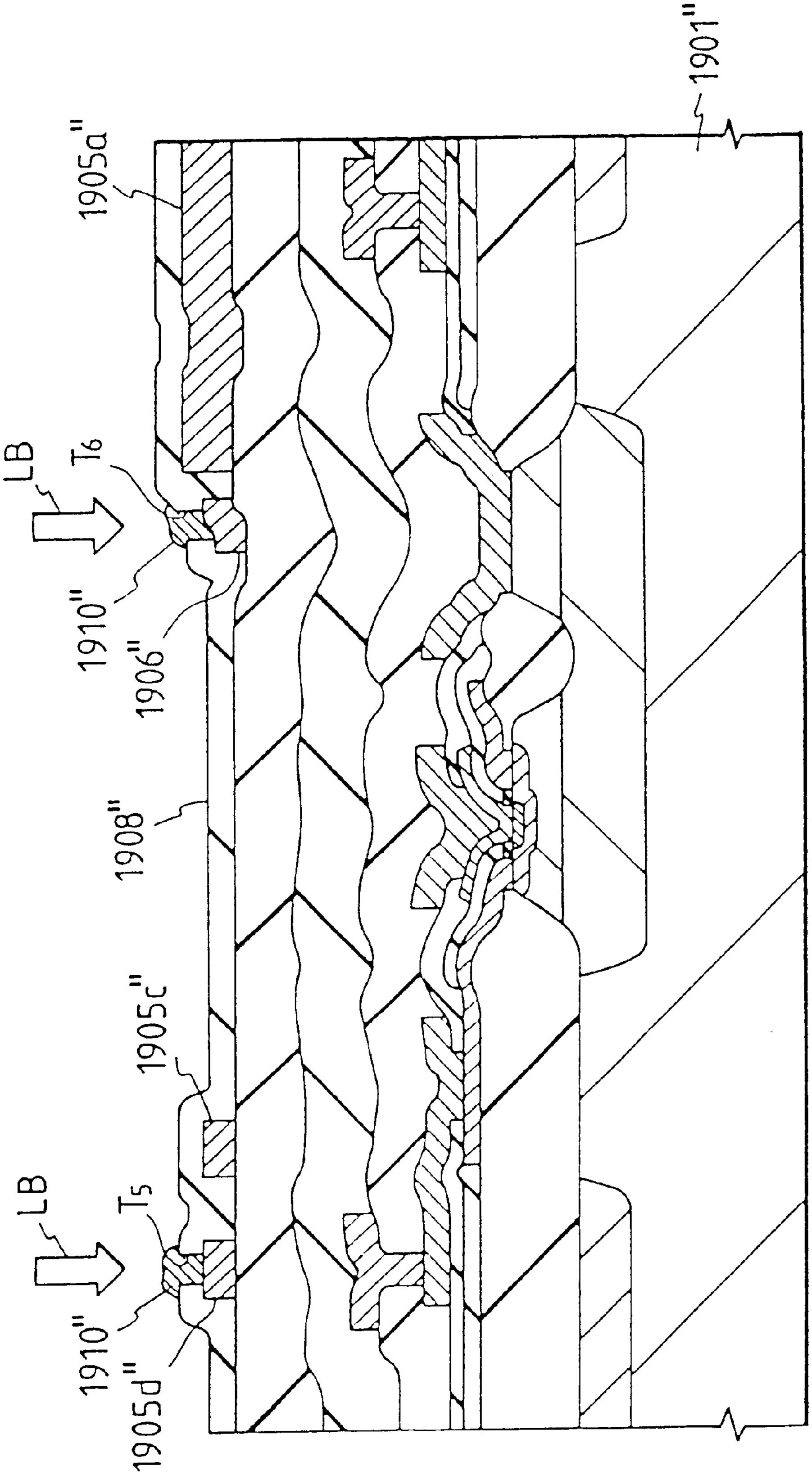
Figure 70A:
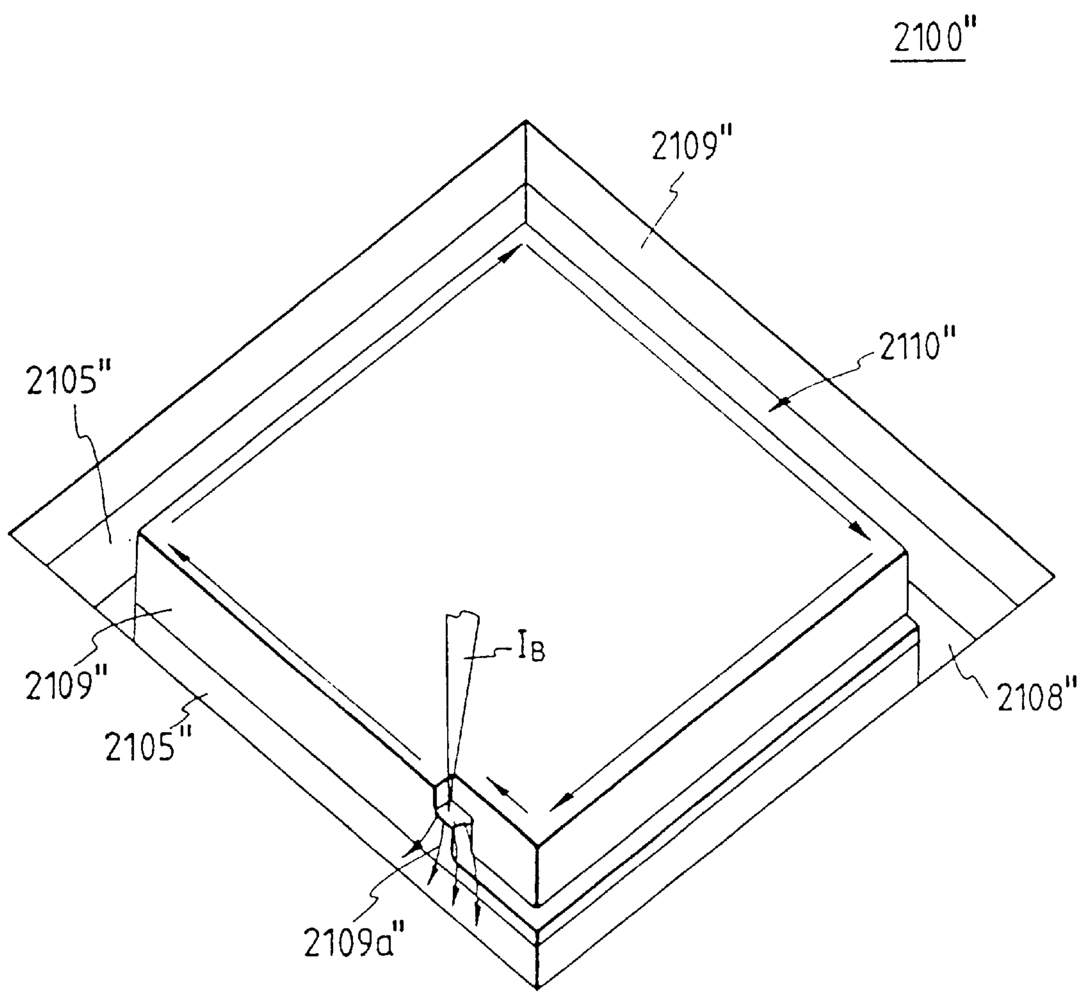
Figure 70B:
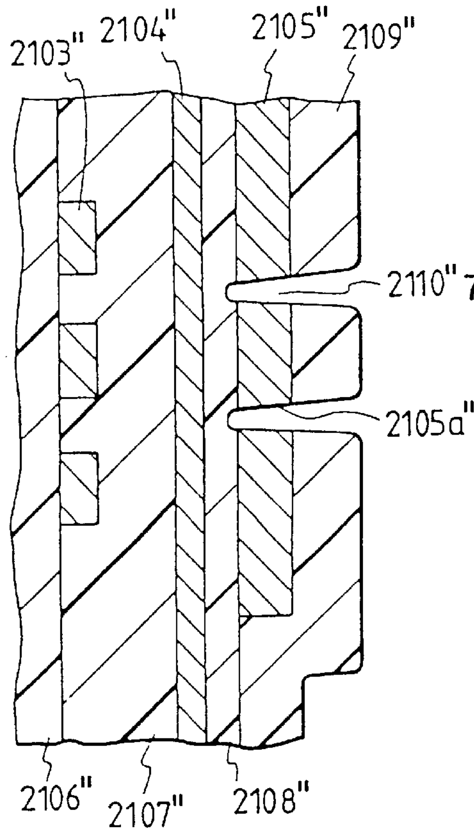
Figure 70B:
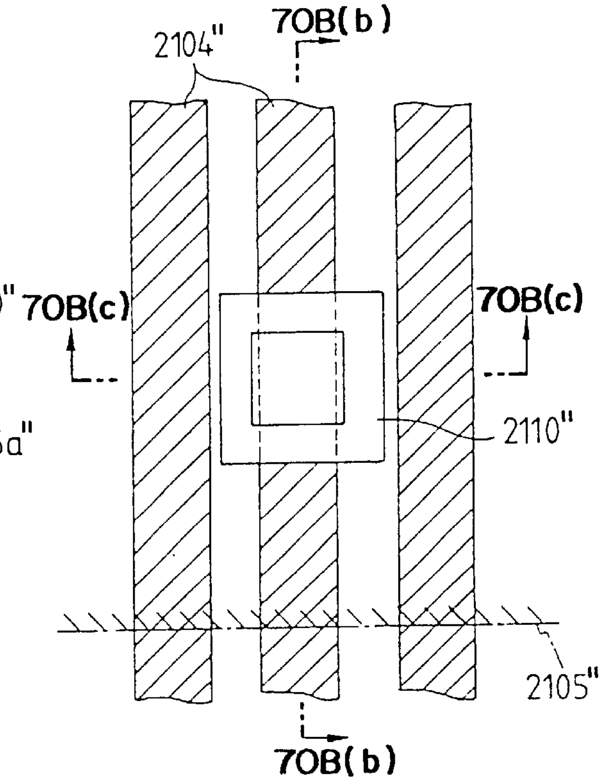
Figure 70B:
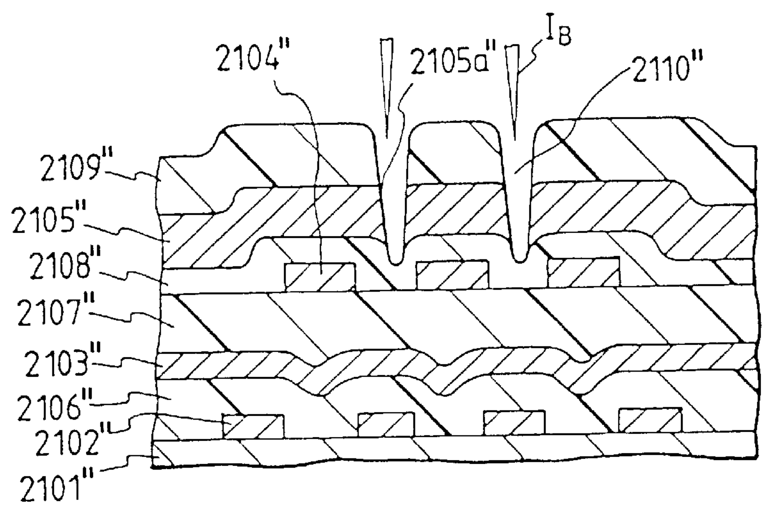
Figure 70C:
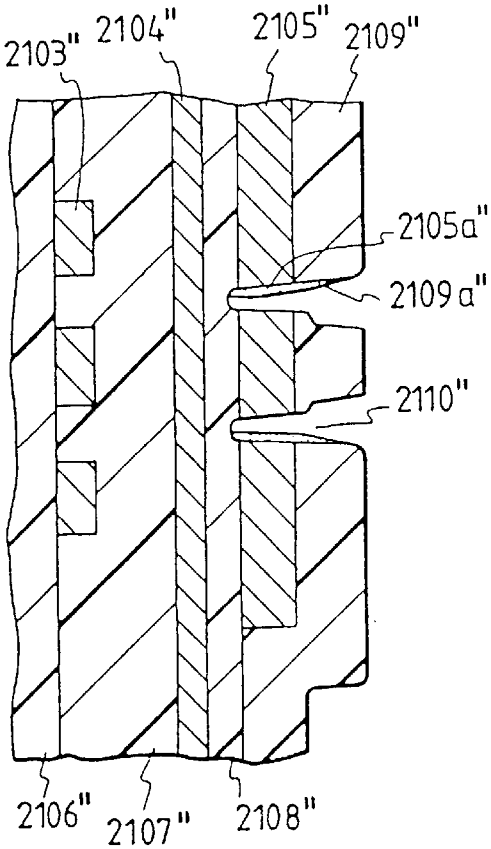
Figure 70C:
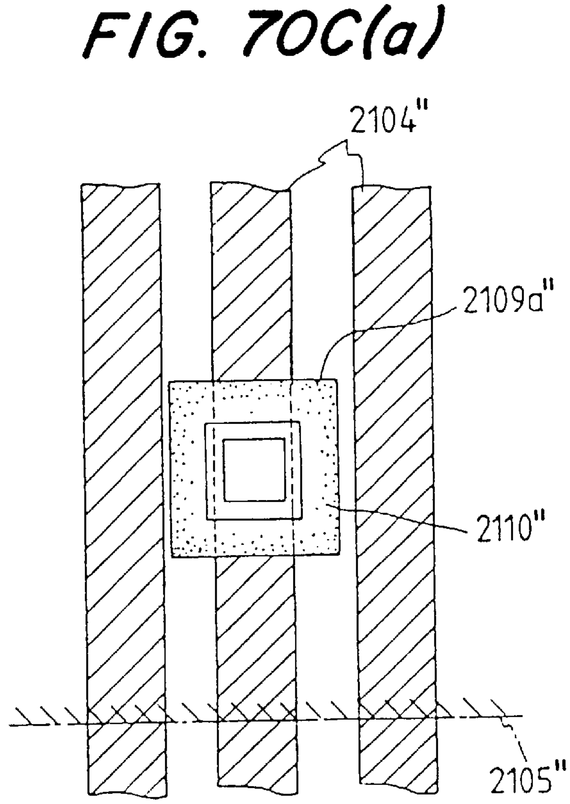
Figure 70C:
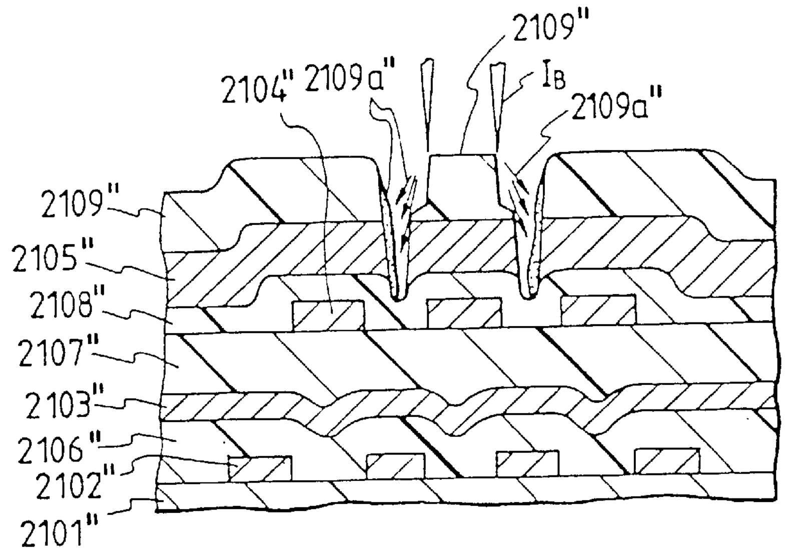
Figure 70D:
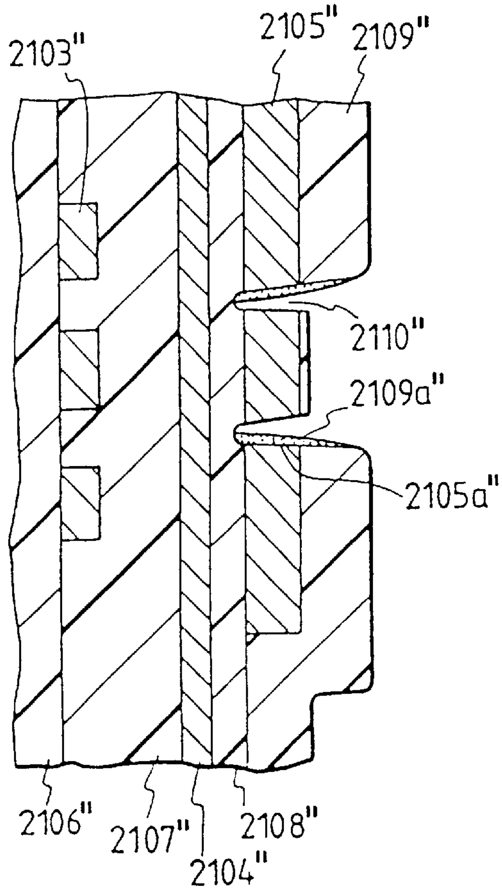
Figure 70D:
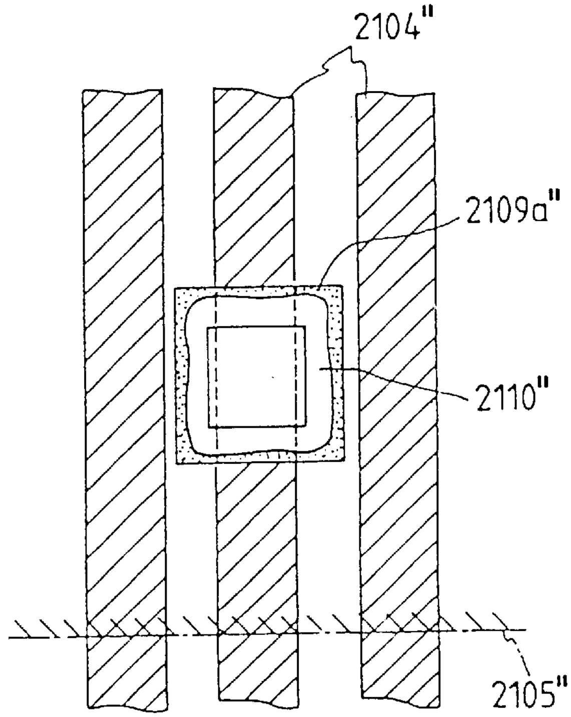
Figure 70D:
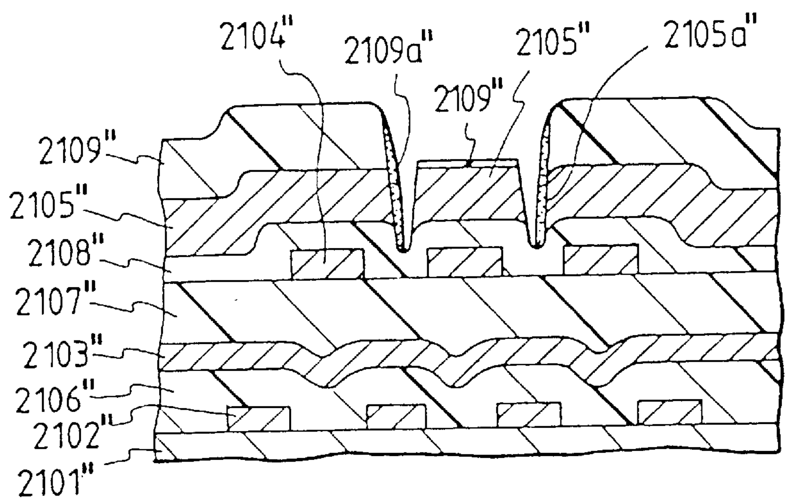
Figure 70E:
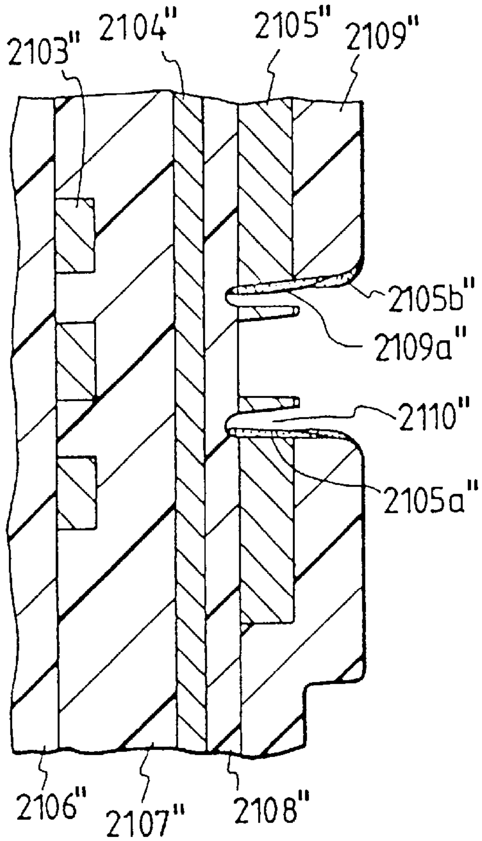
Figure 70E:
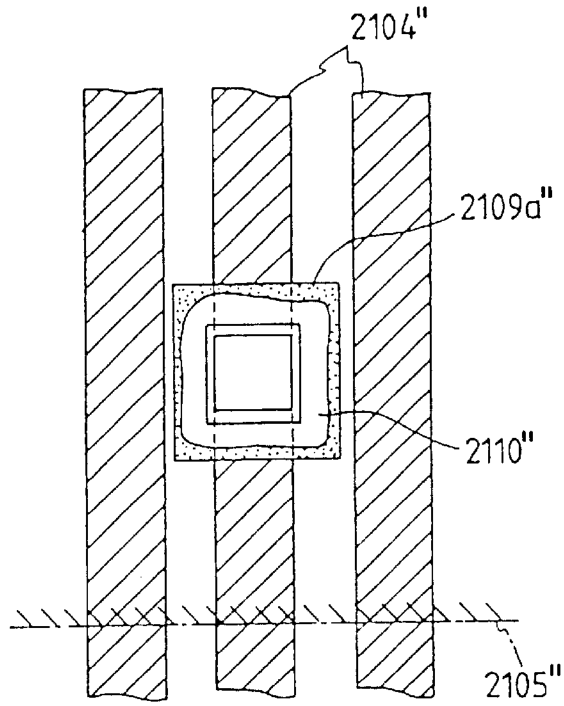
Figure 70E:
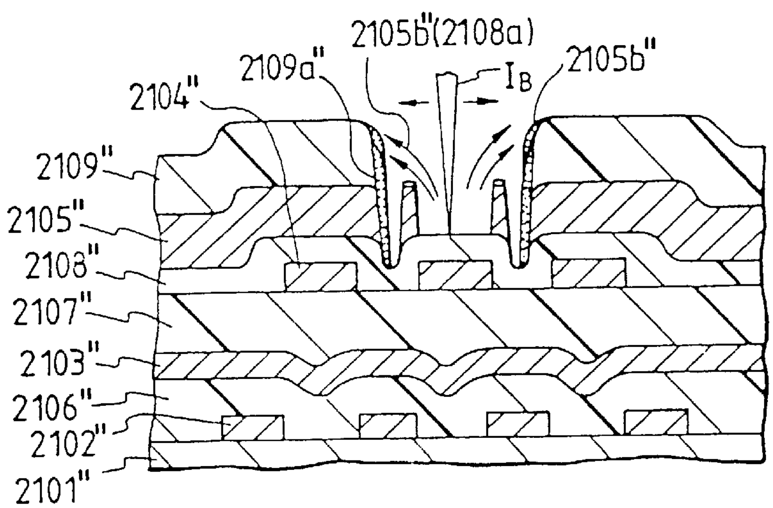
Figure 70F:
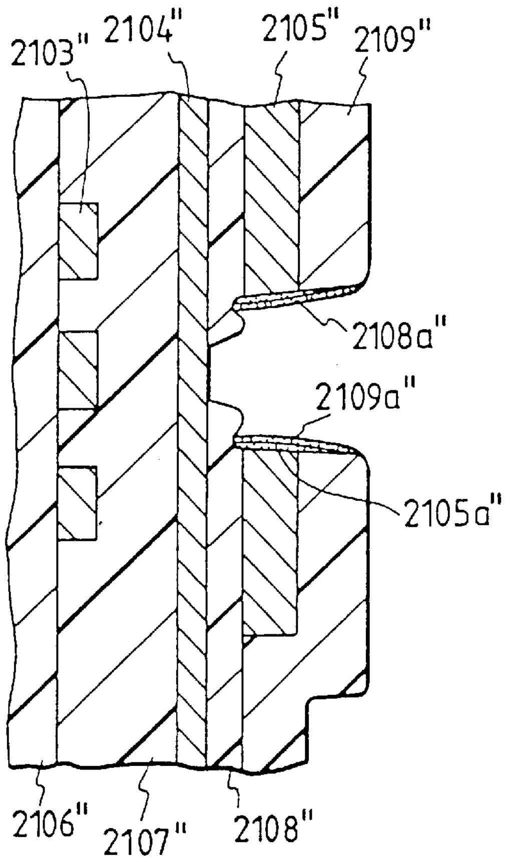
Figure 70F:
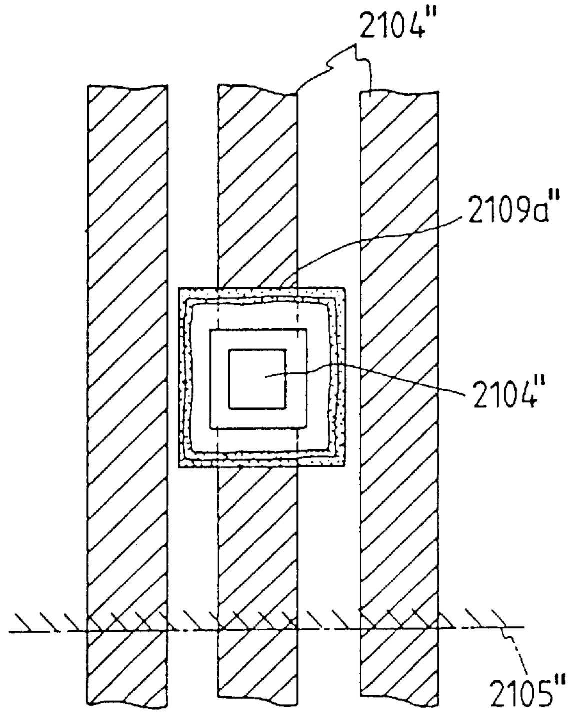
Figure 70F:
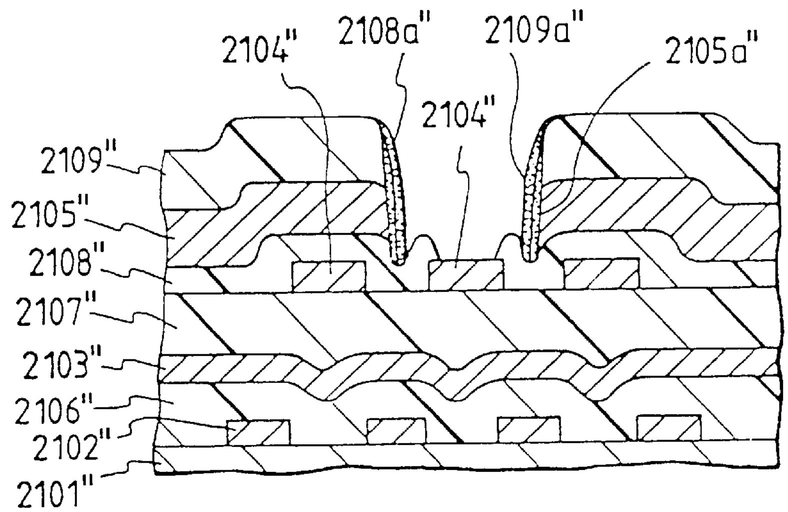
Figure 70G:
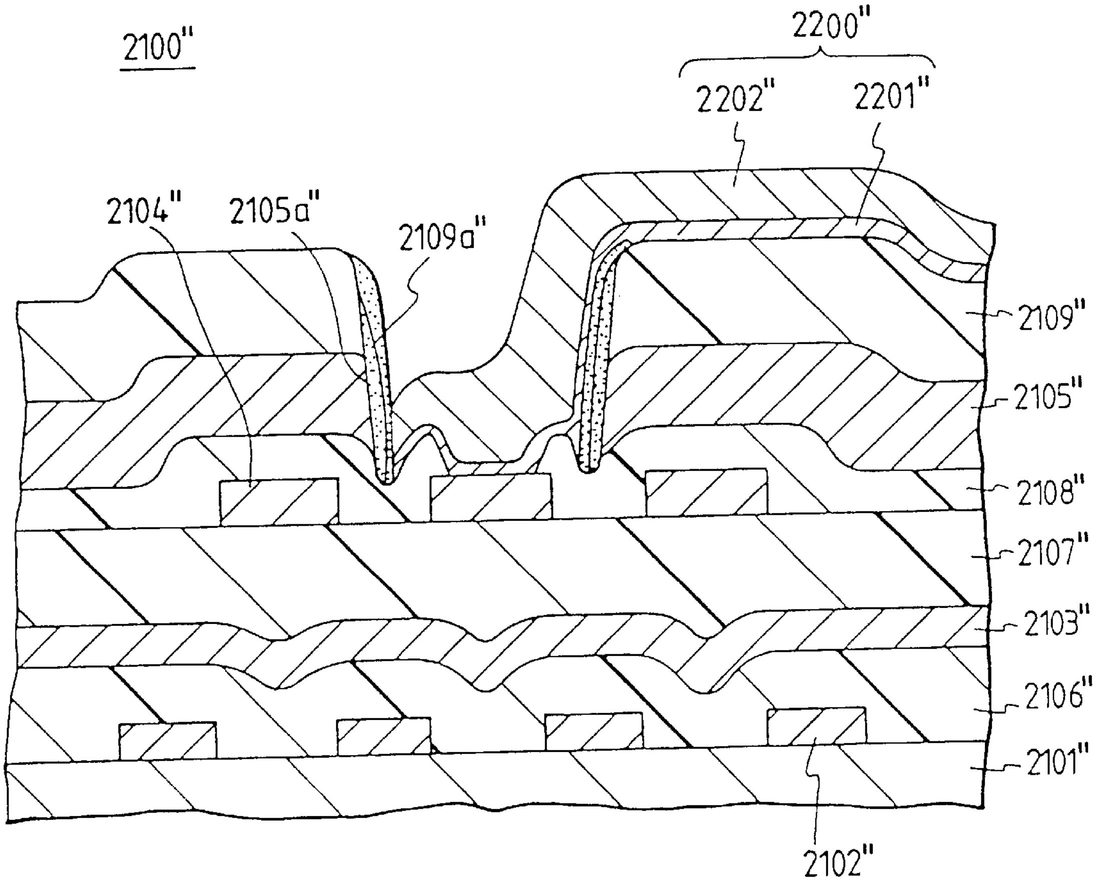
Figure 70H:
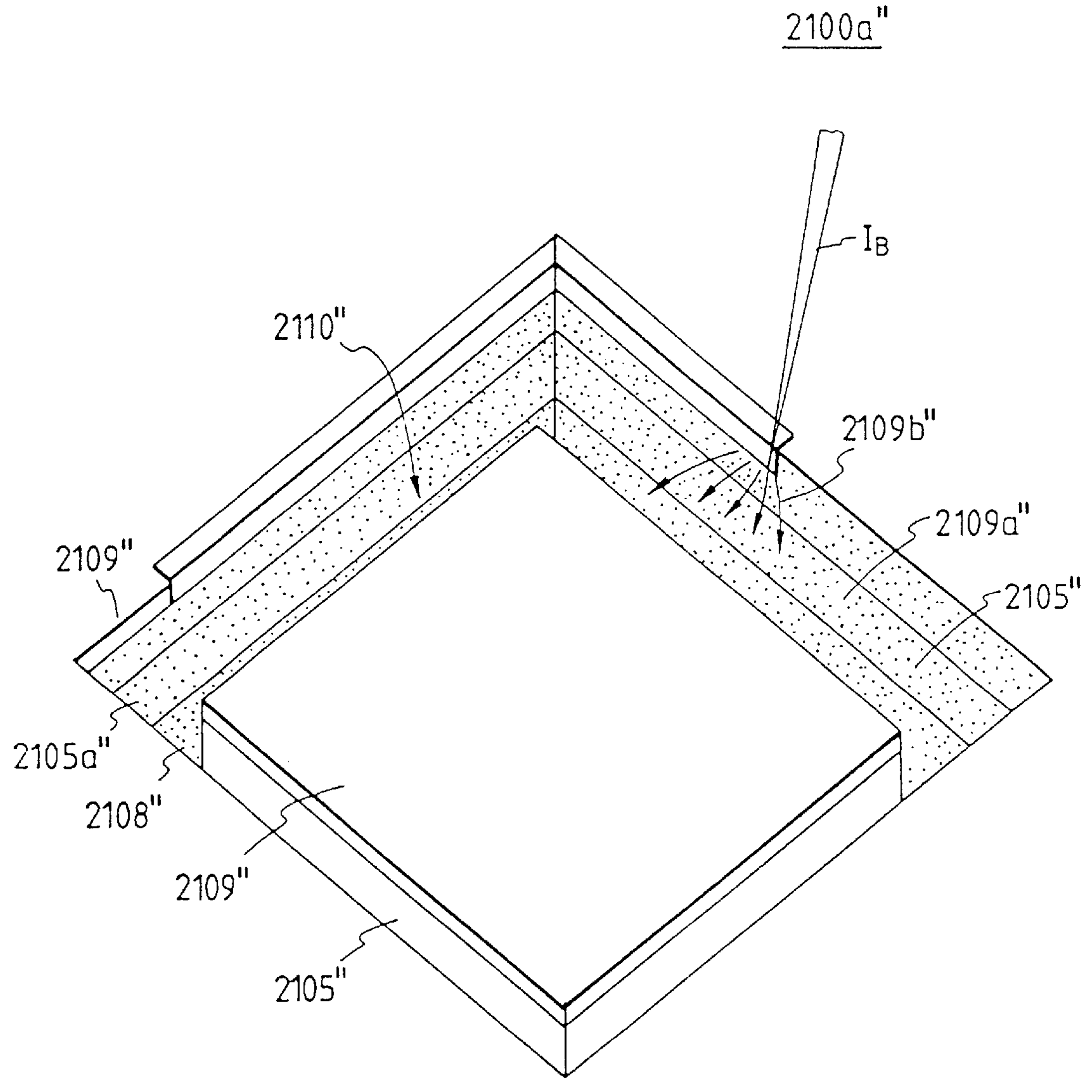
Figure 70I:
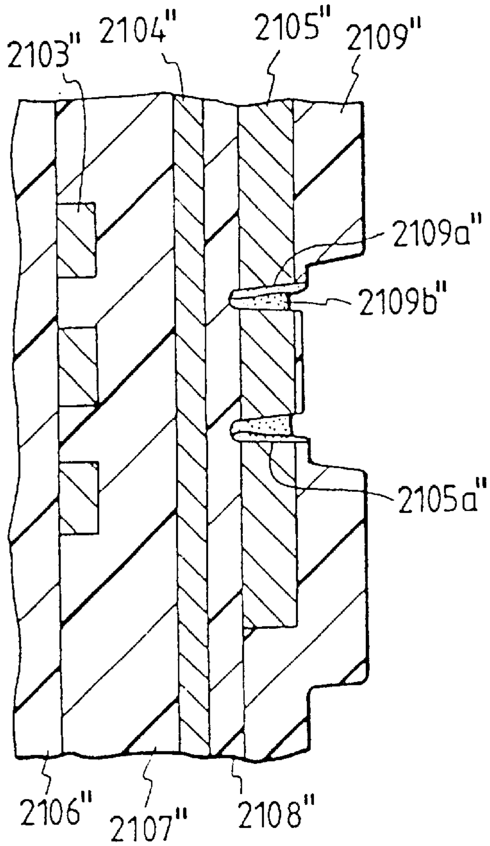
Figure 70I:
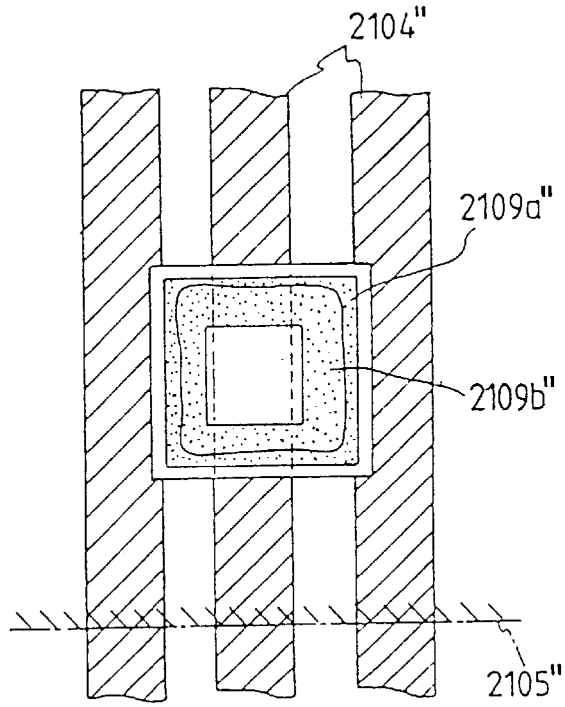
Figure 70I:
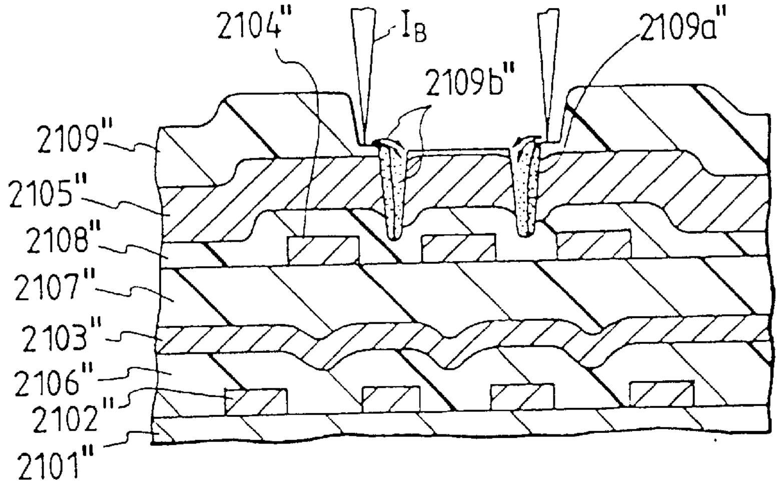
Figure 70J:
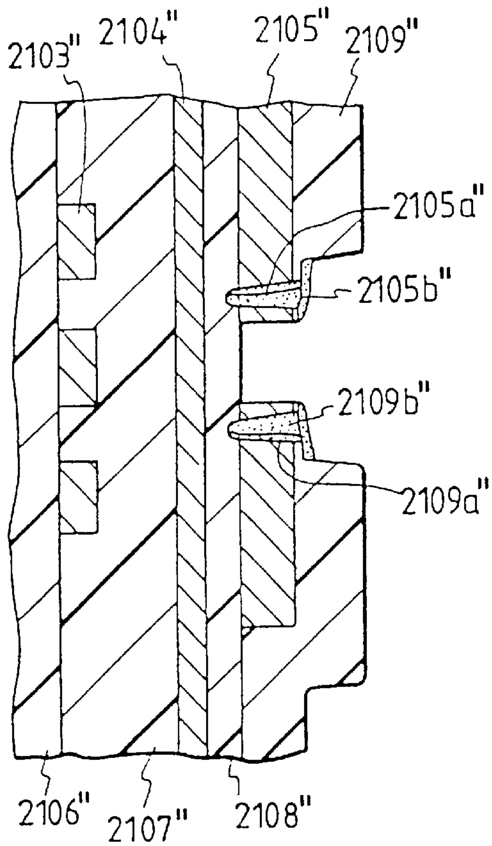
Figure 70J:
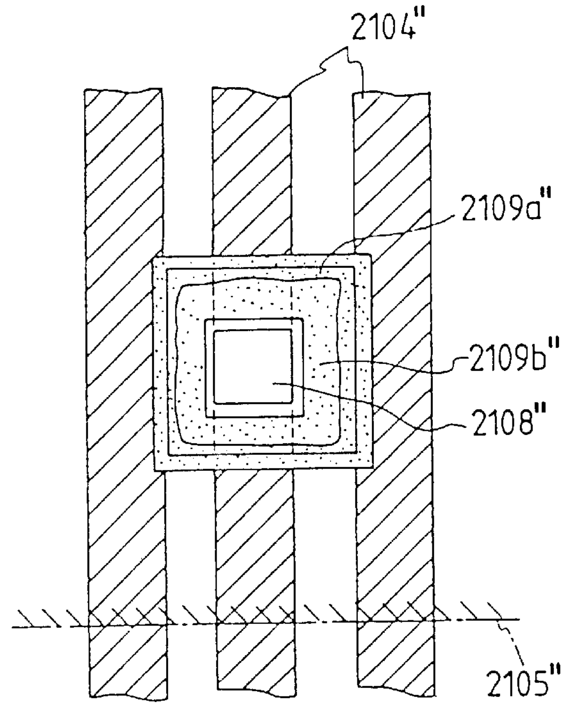
Figure 70J:
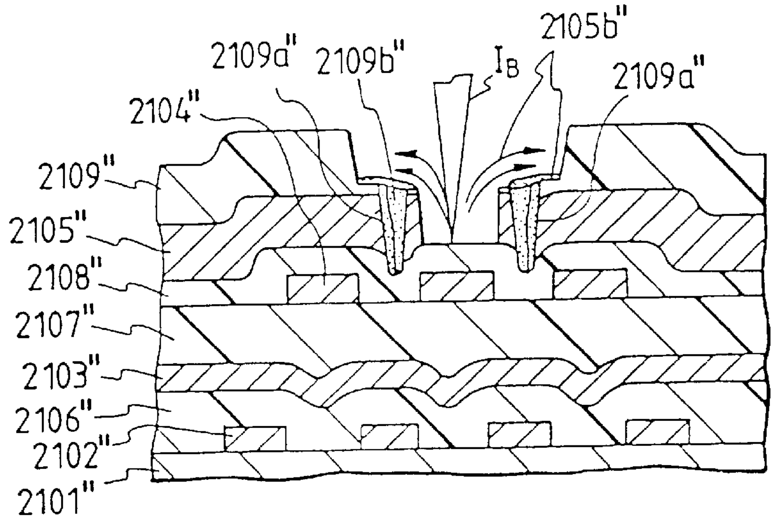
Figure 70K:
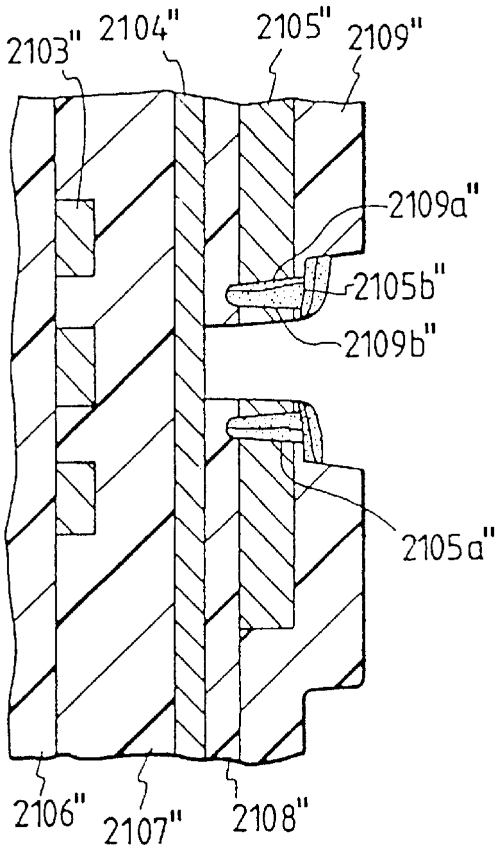
Figure 70K:
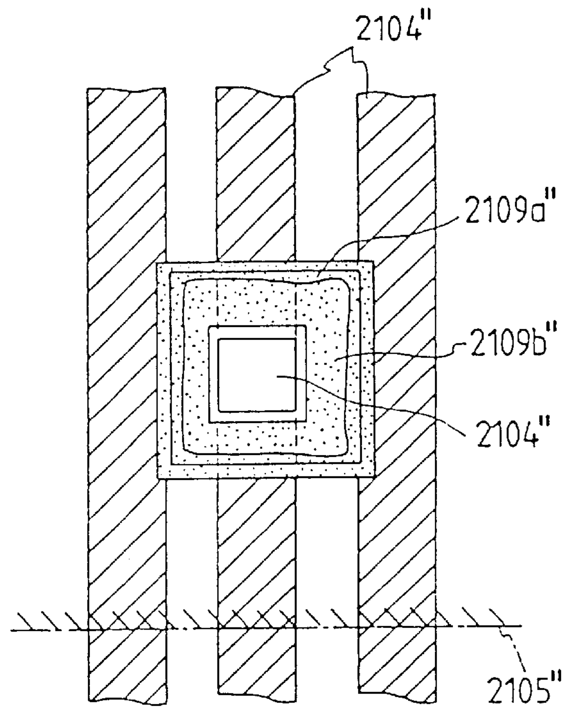
Figure 70K:
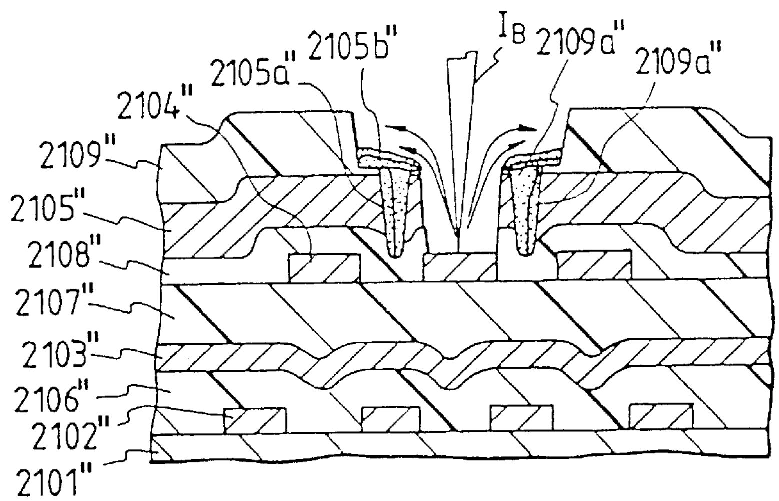
Figure 70L:
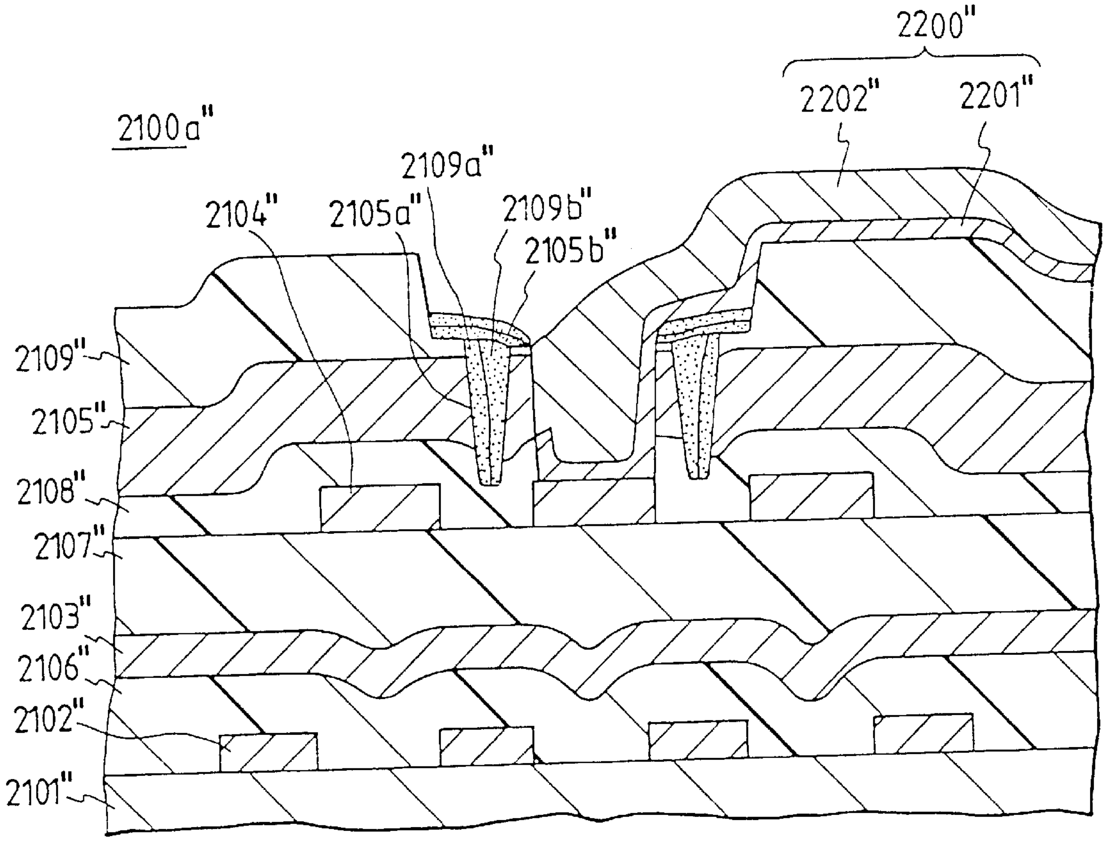
Figure 70M:
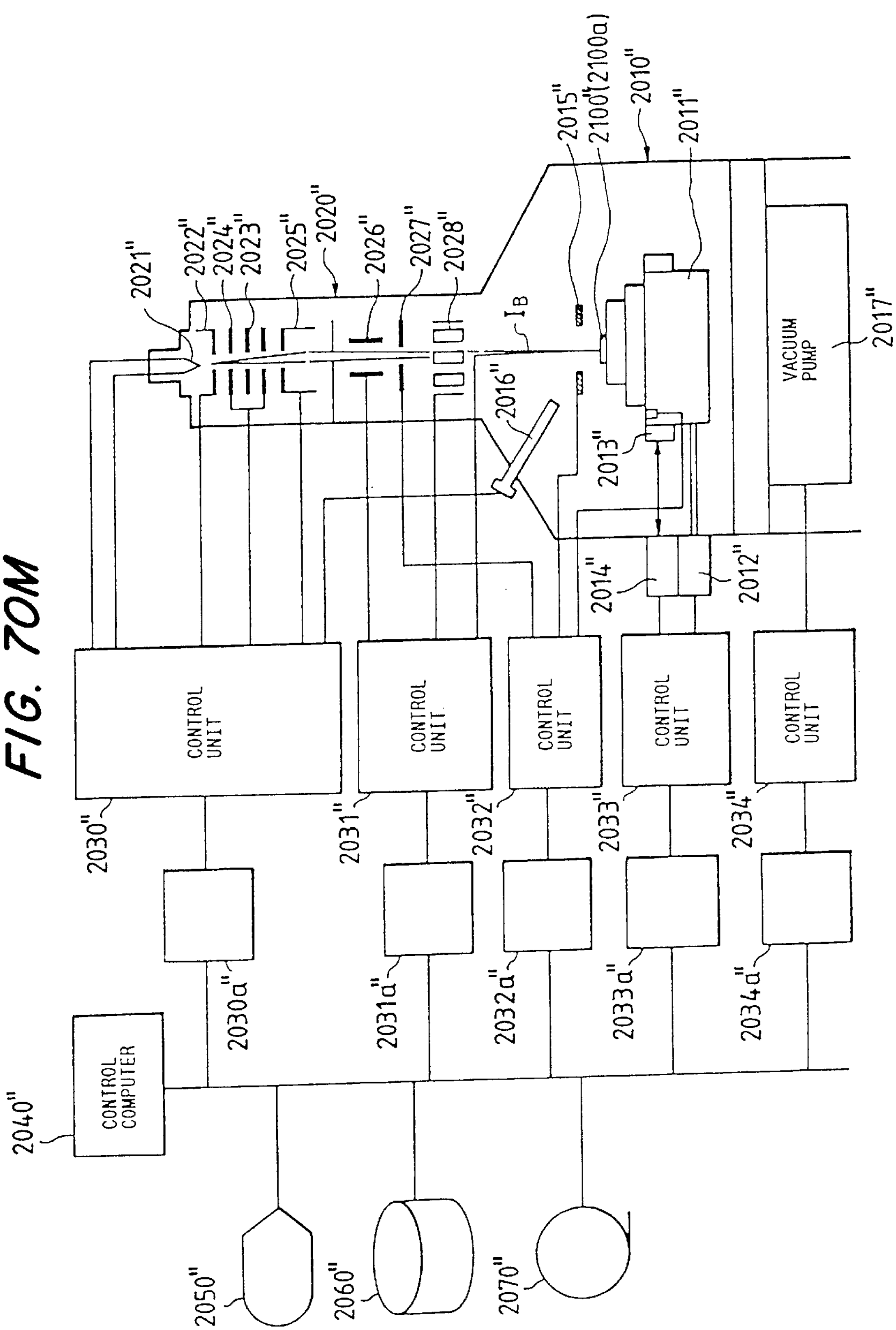
Figure 70N:
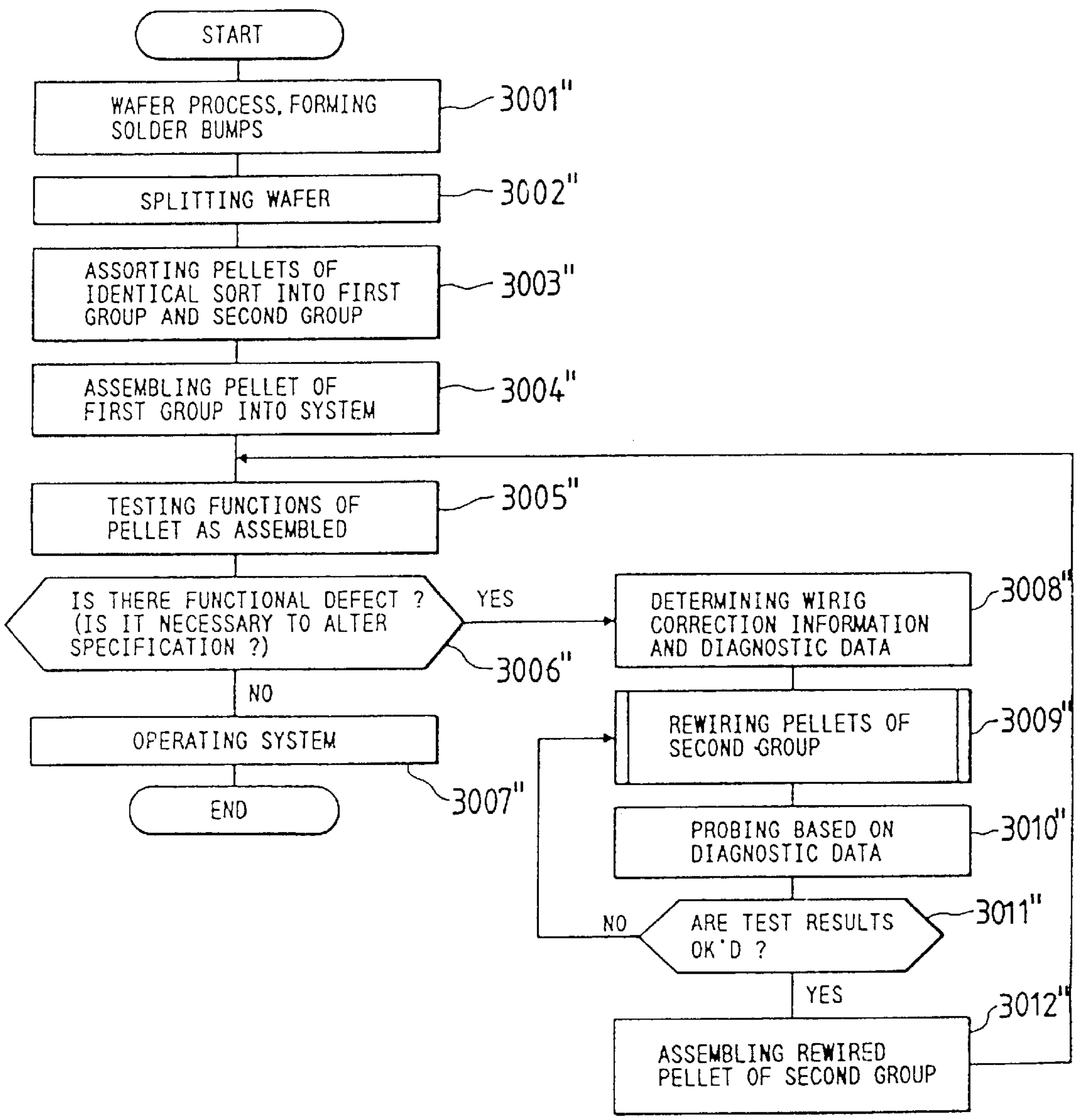

FIG. 51B is an enlarged plan view showing pertinent portions of the semiconductor wafer;

FIG. 51C is an enlarged plan view showing pertinent portions of the semiconductor wafer;

FIG. 51D is a plan view showing the wiring pattern formed over the semiconductor wafer;

FIG. 51E is a plan view showing a wiring pattern;

FIG. 51F is a perspective view showing pertinent portions of a focused ion beam apparatus;

FIG. 51G is a sectional view showing a part of the semiconductor wafer;

FIG. 51H is an enlarged plan view showing pertinent portions of the semiconductor wafer;

FIG. 51I is a plan view showing a wiring pattern formed over the semiconductor wafer;

FIG. 51J is a perspective view showing a pertinent portion of the laser CVD apparatus;

FIG. 51K is a sectional view taken along the line IX—IX of FIG. 51J;

FIG. 51L is a plan view showing a wiring pattern formed over the semiconductor wafer;

FIG. 51M is a plan view of a semiconductor wafer showing the connections of logic gates equivalently;

FIG. 52 is a flow chart showing the whole construction of the designing and manufacturing system of the present invention;

FIG. 53A is a sectional view showing pertinent portions of a bipolar LSI according to embodiment 3 of the fourth aspect of the present invention;

FIG. 53B is a sectional view showing a pin grid array package with which the bipolar LSI depicted in FIG. 53A is sealed;

FIGS. 53C–53G are sectional views for explaining, in order of steps, a method manufacturing the bipolar LSI depicted in FIG. 53A;

FIG. 54A is a layout plan view of the second–fourth layers of Al (aluminum) wiring of a logic chip in embodiment 4 of the fourth aspect of the present invention;

FIG. 54B is a layout diagram of various adjusting patterns or the tools of a wiring correction system in the embodiment 4;

FIG. 54C is a layout plan view of the antenna wiring of a spare gate cell in the embodiment 4;

FIG. 54D is a circuit diagram showing the spare devices of the spare gate cell;

FIGS. 54E–54H are circuit diagrams showing several correctional patterns;

FIGS. 54I(*a*)–54I(*d*) are sectional views showing the process flow of corrections with an FIB and laser CVD;

FIGS. 54J–54P are plan views and sectional views of corrected wiring parts which correspond to several techniques for local corrections;

FIG. 54Q is a top layout plan view of the chip of a spare gate (FF) cell in a modification of embodiment 4 of the fourth aspect of the present invention;

FIG. 54R is a layout diagram of the wiring of the spare gate cell;

FIG. 54S is a mode circuit diagram showing the constructions of elements within the spare gate cell;

FIG. 55A is a top plan view showing a cross-under technique in embodiment 5 of the fourth aspect of the present invention;

FIG. 55B is a sectional view taken along line A—A of FIG. 55A;

FIG. 56 is a schematic top plan view of a chip showing a spare wiring-quartering system of embodiment 6 of the fourth aspect of the present invention;

FIG. 57A is a top plan view of a chip showing a cut-away part in embodiment 7 of the fourth aspect of the present invention;

FIGS. 57B–57E are sectional flow diagrams showing a pre-milling process in the embodiment;

FIG. 57F is a top plan view of a milling process showing the actual operation of a processing FIB;

FIGS. 58A–58E are sectional flow diagrams showing the flow of the lower layer Al-cutting process of two-stage milling of embodiment 8 of the fourth aspect of the present invention;

FIG. 58F is a top plan view of parts corresponding to the two-stage milling;

FIGS. 58G–58H are top plan views of processed regions for explaining the actual operations of a processing FIB;

FIG. 59A is a table showing the fundamental strategy of on-chip corrections of embodiment 9 of the fourth aspect of the present invention;

FIG. 59B is a diagram showing examples of the basic patterns of the corrections;

FIG. 60A is a block diagram showing pertinent portions of an ion beam processing apparatus according to embodiment 10 of the fourth aspect of the present invention;

FIG. 60B is a plan view of an example of the semiconductor device of the present invention to be subjected to ion beam processing;

FIG. 60C is a sectional view of a part of the semiconductor device;

FIG. 60D is a sectional view of another part of the semiconductor device;

FIG. 61A is an enlarged sectional view of a wafer for explaining an ion beam processing method according to embodiment 11 of the fourth aspect of the present invention;

FIG. 61B is a schematic constructional view showing a processing apparatus which is used in the ion beam processing method;

FIG. 61C is a schematic perspective view showing the sample stand of the processing apparatus on an enlarged scale;

FIG. 61D(*a*) is a schematic explanatory view showing the scanning state of an ion beam on the surface of a processing reference mark;

FIG. 61D(*b*) is an explanatory diagram showing the detection intensity of secondary electrons;

FIGS. 61E(*a*)–61E(*d*) are explanatory views each showing a modification of the plan pattern of the processing reference mark;

FIGS. 61F(*a*) and 61F(*b*) are explanatory views each showing a modification of the vertical sectional shape of the processing reference mark;

FIG. 61G(*a*) is an enlarged partial sectional view showing another example of the processing reference mark;

FIG. 61G(*b*) is a schematic plan view of the processing reference mark in FIG. 61G(*a*);

FIG. 62A is a block diagram showing the whole construction of an on-chip wiring correction system;

FIG. 62B is a flow chart showing a testing process for wiring corrections;

FIG. 62C is a block diagram showing the whole data flow of the on-chip wiring correction system;

FIG. 63 is a block diagram showing the whole flow of a gate array developing and manufacturing process of embodiment 13 of the fourth aspect of the present invention;

FIG. 64A is a perspective view showing one example of a testing jig according to the present invention;

FIG. 64B is a sectional view showing one example of a wafer prober for executing the testing method of the present invention;

FIG. 64C is a plan view of the same;

FIG. 64D is a plan view of the same;

FIG. 64E is a flow chart showing one example of a method of manufacturing a semiconductor integrated circuit device according to one embodiment of the fourth aspect of the present invention;

FIG. 64F is an explanatory view showing a portion of the same in more detail;

FIG. 65A is a block diagram showing the structure of a laser CVD apparatus according to embodiment 15 of the fourth aspect of the present invention;

FIGS. 65B(*a*) to 65B(*f*) are sectional view of pertinent portions showing the wiring correcting steps of the present embodiment;

FIG. 65C is a perspective view of pertinent portions showing a wiring correcting step of the same;

FIG. 65D is an explanatory view showing the principle of a modulating unit to be used in the embodiment;

FIG. 65E is a section view showing pertinent portions of a bipolar LSI manufactured by the present embodiment;

FIG. 65F is a sectional view showing a pin grid array (PGA) type package sealed with the bipolar LSI showing in FIG. 65E;

FIGS. 65G–65K are sectional views showing the portions of the sequential steps of forming upper layer portions of the bipolar LSI;

FIG. 65L is a model plan view showing the structure of Al second–fourth layer wiring over the semiconductor chip of the bipolar LSI;

FIG. 65M is a layout diagram showing the arrangements of the wiring correcting process, supporting tool and the like over the semiconductor chip of the same;

FIG. 65N is a plan view showing only the antenna wiring of Al-3 of the plan arrangement of a spare gate cell;

FIG. 65O is a schematic circuit diagram showing the built-in elements and gates of the spare gate cell;

FIG. 65P, 65Q and 65R are model circuit diagrams showing the correcting patterns of various gates, respectively;

FIG. 65S is an enlarged plan view showing the correcting portion of the principal plane of the semiconductor chip corresponding to FIGS. 65L and 65M;

FIG. 65T is a sectional view taken along line X—X of FIG. 65S;

FIG. 65U is an enlarged plan view showing a portion of the principal plane of the semiconductor chip, which has been subjected to another correcting technique;

FIG. 65V is a sectional view taken along line X—X of FIG. 65U;

FIGS. 65W–65Y are a plan view and an enlarged view showing one example using another correcting technique, especially, a spare gate, and a sectional view taken along line X—X of the same;

FIG. 66A is an enlarged plan view showing a part of the wiring pattern over the semiconductor wafer of the semiconductor device according to embodiment 16 of the fourth aspect of the present invention;

FIG. 66B is a sectional view showing a part and taken along line II—II of FIG. 66A;

FIG. 66C is a perspective view showing a pertinent portion of a focused ion beam apparatus;

FIG. 66D is a sectional view showing a part at the wiring correcting step of the semiconductor device shown in FIG. 66A;

FIG. 66E is a perspective view showing pertinent portions of a laser CVD apparatus;

FIG. 66F is a sectional view showing a part at the wiring correcting step of the semiconductor device shown in FIG. 66A;

FIG. 66G is a plan view showing a part of the wiring pattern over the semiconductor wafer shown in FIG. 66A;

FIG. 66H is a plan view showing a part of the wiring pattern over the semiconductor wafer of the semiconductor device according to a modification of the present embodiment;

FIG. 66I is a plan view showing a part of the wiring pattern over the semiconductor wafer of the semiconductor device according to another modification of the present embodiment;

FIG. 67A is an enlarged sectional view of pertinent portions of a semiconductor chip showing the semiconductor integrated circuit device according to embodiment 17 of the fourth aspect of the present invention;

FIG. 67B is a sectional view of the semiconductor chip taken along line II—II of FIG. 67A;

FIG. 67C is a schematic diagram showing an ion beam processing apparatus to be used in the manufacturing step of the semiconductor integrated circuit device;

FIG. 67D is a top plan view of a semiconductor chip showing the semiconductor integrated circuit device;

FIG. 67E is a circuit diagram showing the fundamental gates of the semiconductor integrated circuit device;

FIG. 67F is an enlarged plan view of a semiconductor chip showing the semiconductor integrated circuit device according to a modification of the present embodiment;

FIG. 68A is an enlarged plan view showing pertinent portions of a semiconductor chip showing a semiconductor integrated circuit device according to embodiment 18 of the fourth aspect of the present invention;

FIG. 68B is a sectional view of the semiconductor chip taken along line II—II of FIG. 68A;

FIG. 68C is a plan view of the semiconductor chip showing the semiconductor integrated circuit device;

FIG. 68D is a circuit diagram showing the fundamental gates of the semiconductor integrated circuit device;

FIG. 68E is a block diagram showing the structure of a wiring correcting system to be used for manufacturing the semiconductor integrated circuit device;

FIG. 68F is a model diagram showing the wiring correcting data to be used for manufacturing the semiconductor integrated circuit device;

FIG. 68G is a model diagram showing an ion beam processing apparatus to be used for manufacturing the semiconductor integrated circuit device;

FIG. 68H–68J are sectional views of the semiconductor chip showing the manufacturing steps of the semiconductor integrated circuit device;

FIG. 69A is an enlarged plan view of pertinent portions of a semiconductor chip showing a semiconductor integrated circuit device according to embodiment 19 of the fourth aspect of the present invention;

FIG. 69B is a sectional view of the semiconductor chip taken along line II—II of FIG. 69A;

FIG. 69C is a plan view of the semiconductor view showing the semiconductor integrated circuit device;

FIG. 69D is a circuit diagram showing the logic gates of the semiconductor integrated circuit device;

FIG. 69E is a block diagram showing the wiring correcting system used for manufacturing the semiconductor integrated circuit device;

FIG. 69F is a schematic diagram showing an ion beam processing apparatus used for manufacturing the semiconductor integrated circuit device;

FIGS. 69G and 69H are sectional views of the semiconductor chip showing the steps of manufacturing the semiconductor integrated circuit device;

FIG. 70A is a perspective view showing an instant of the wiring correcting step of an LSI by the ion beam processing according to embodiment 20 of the fourth aspect of the present invention;

FIGS. 70B(*a*)–70B(*c*) are plan and sectional views showing one example of the wiring correcting procedure;

FIGS. 70C(*a*)–70C(*c*) are plan and sectional views showing one example of the wiring correcting procedure;

FIGS. 70C(*a*)–70C(*c*) are also plan and sectional views showing one example of the wiring correcting procedure;

FIGS. 70D(*a*)–70D(*c*) are also plan and sectional views showing one example of the wiring correcting procedure;

FIGS. 70E(*a*)–70E(*c*) are also plan and sectional views showing one example of the wiring correcting procedure;

FIGS. 70F(*a*)–70F(*c*) are also plan and sectional views showing one example of the wiring correcting procedure;

FIG. 70G is a sectional view showing one example of the wiring correcting procedure;

FIG. 70H is a perspective view showing an instant of the wiring correcting step of an LSi by the ion beam processing according to a modification of the fourth aspect of the present invention;

FIGS. 70I(*a*)–70I(*c*) are plan and sectional views showing one example of the wiring correcting procedure;

FIGS. 70J(*a*)–70J(*c*) are also plan and sectional views showing one example of the wiring correcting procedure;

FIGS. 70K(*a*)–70K(*c*) are also plan and sectional views showing one example of the wiring correcting procedure;

FIG. 70L is a sectional view showing one example of the wiring correcting procedure;

FIG. 70M is a block diagram showing one example of the structure of an ion beam processing apparatus used for the wiring correcting procedure of the present embodiment; and FIG. 70N is a flow chart showing one example of the developing steps of a main frame computer.

DETAILED DESCRIPTION OF THE INVENTION

Since the present invention comprehends multifarious systems, method, devices, processing and testing apparatuses, etc., it will be described in a large number of divided chapters for the sake of convenience, but various embodiments are the partial details of other embodiments or the partial or entire modifications thereof. Accordingly, although not pointed out one by one, the mutual combinations and substitutions of the embodiments shall be naturally included within the scope of the present invention.

First Aspect of the Present Invention

Figure 1A:
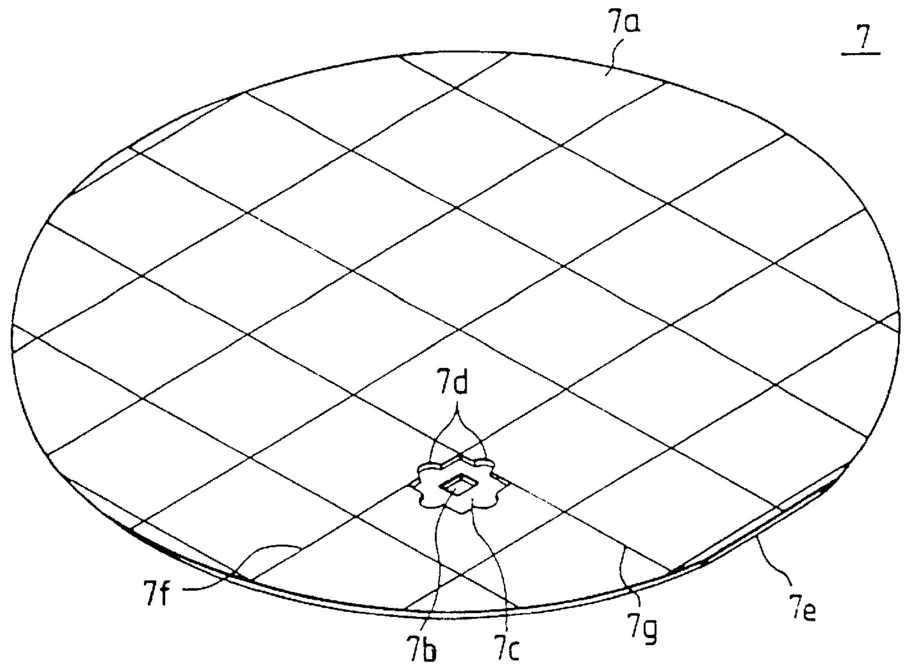
FIG. 1A is a perspective view showing an example of the testing jig of the first aspect of the present invention.
Figure 1B:
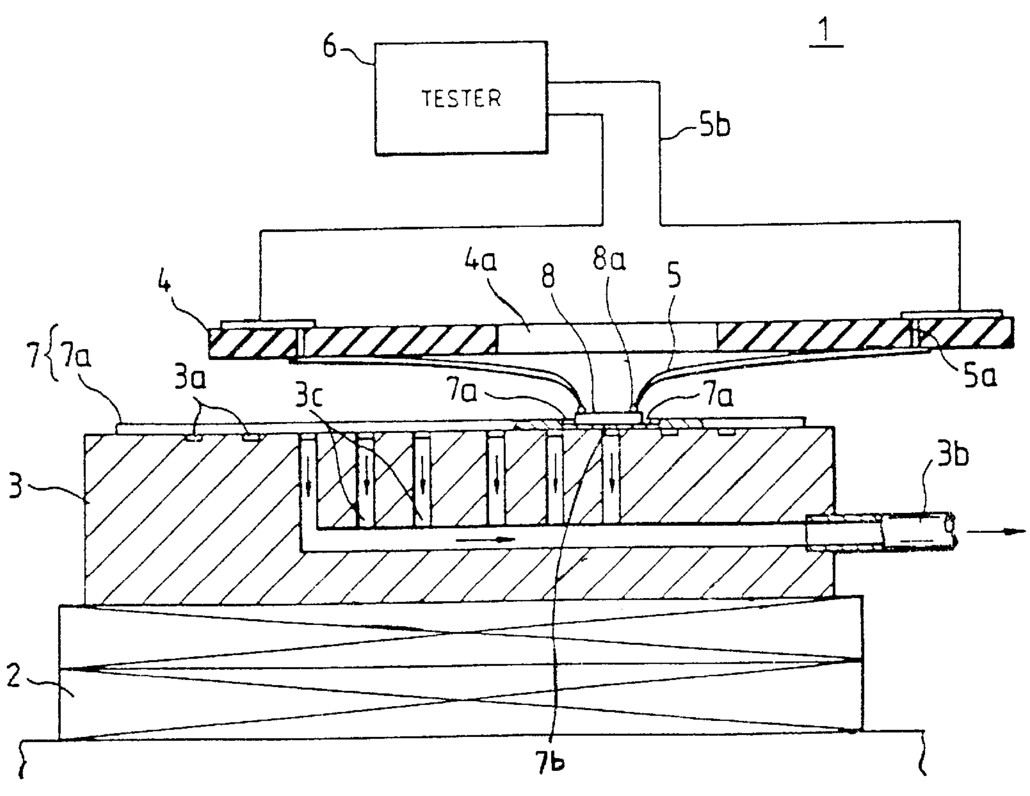
FIG. 1B is a sectional view showing an example of a wafer prober with which the testing method of the first aspect of the present invention is performed.
Figure 1C:
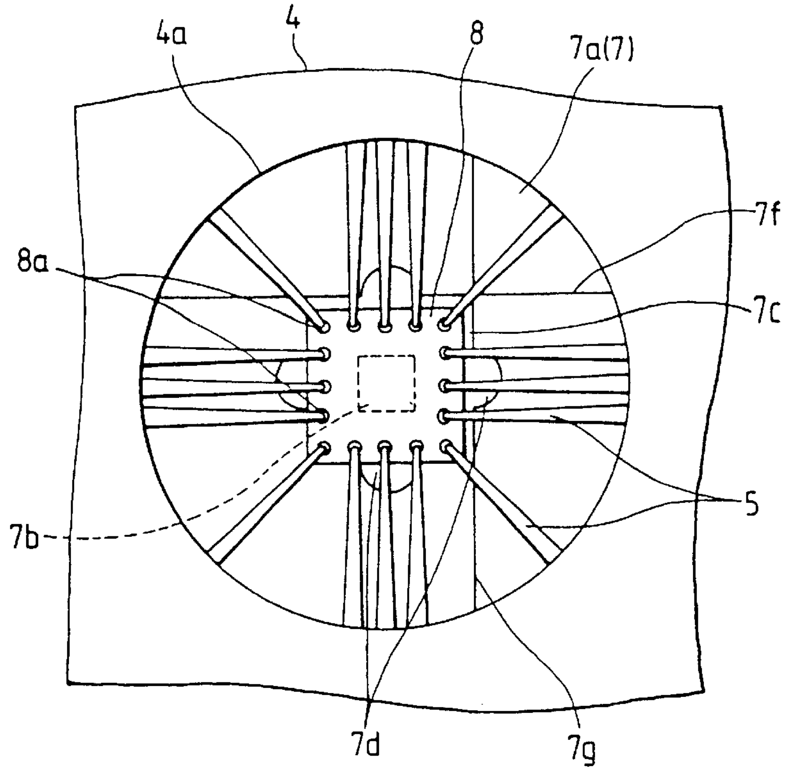
FIG. 1C is a plan view of pertinent portions of the wafer prober.
Figure 1D:
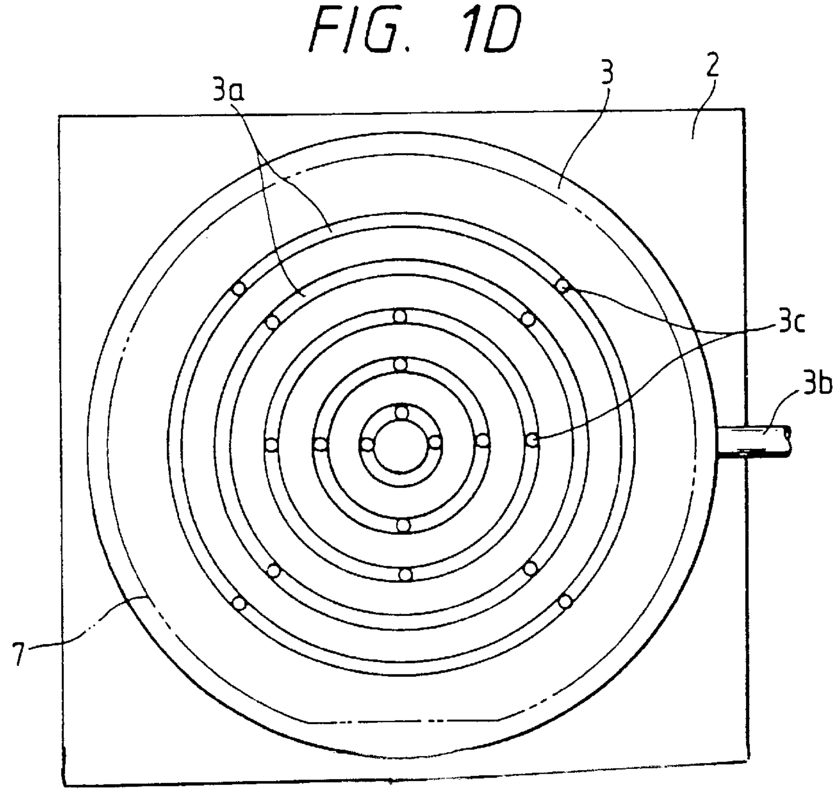
FIG. 1D is a plan view showing a wafer chuck in the wafer prober.

FIG. 1A is a perspective view showing an example of the testing jig of the present invention, FIG. 1B is a vertical sectional view showing an example of a wafer prober with which the testing method of the present invention is performed, FIG. 1C is a plan view of pertinent portions of the wafer prober, and FIG. 1D is a plan view of a wafer chuck in the wafer prober.

Figure 1E:
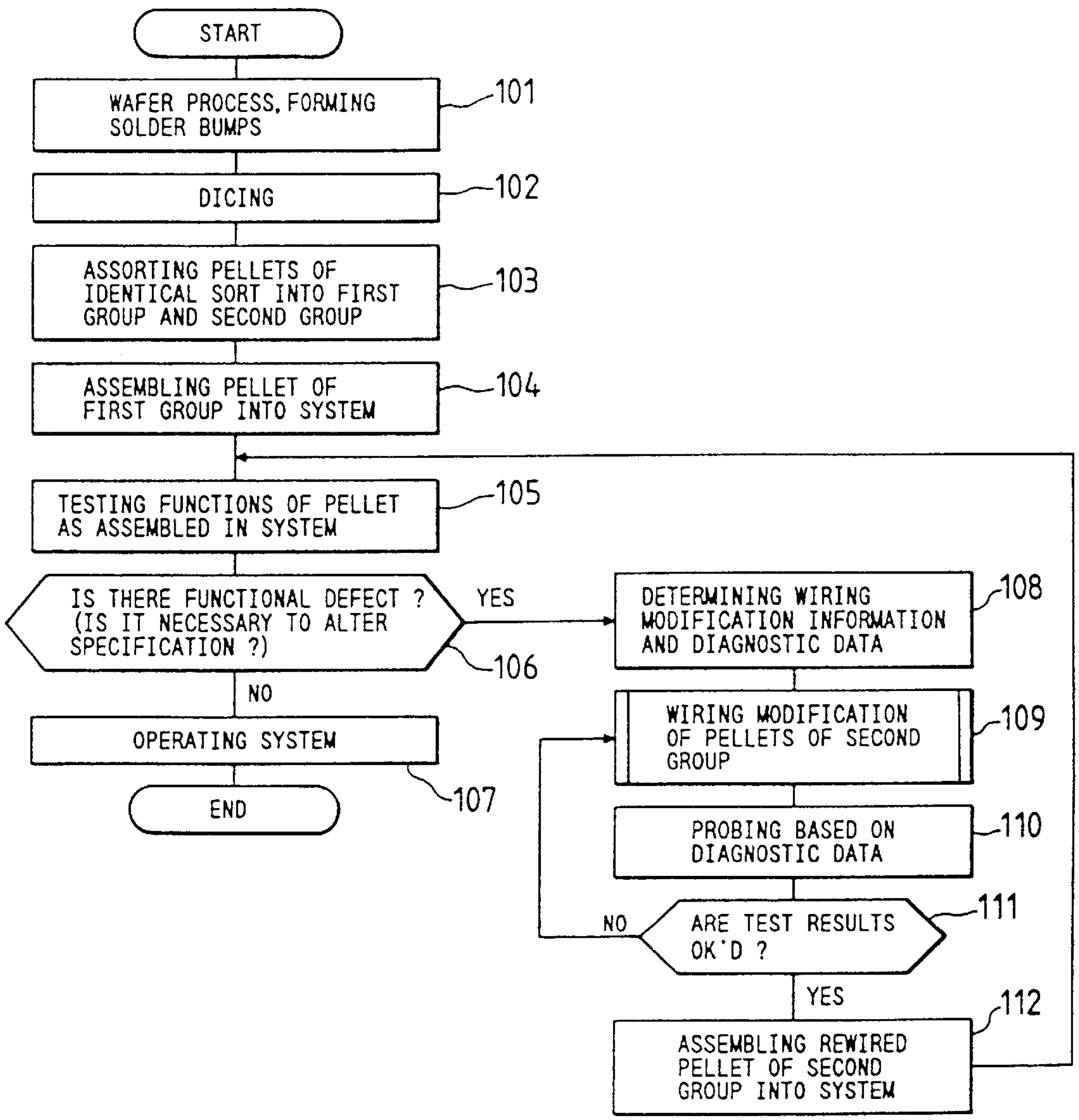
FIG. 1E is a flow chart showing an example of that method of manufacturing a semiconductor integrated circuit device which is an embodiment of the first aspect of the present invention.
Figure 1F:
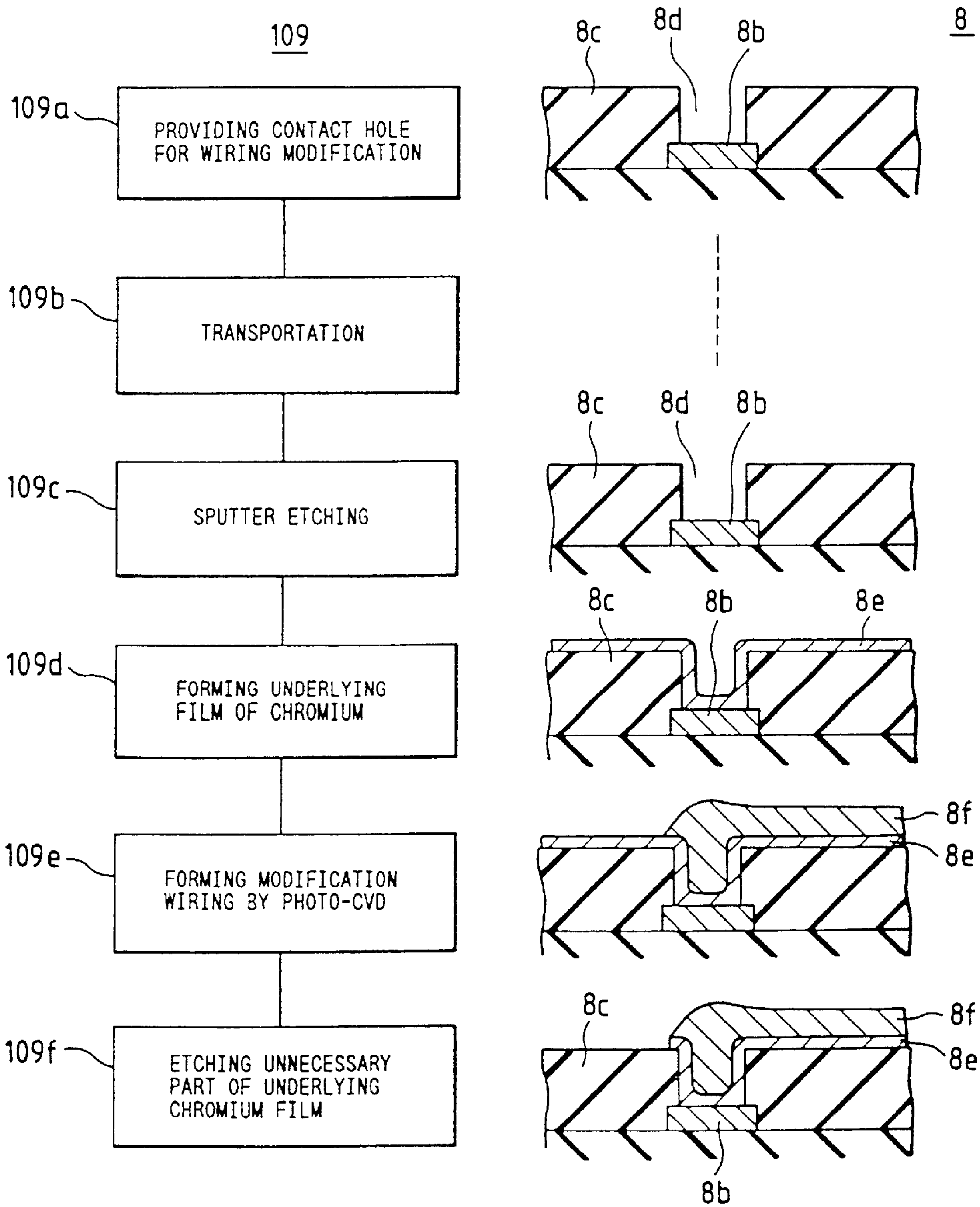
FIG. 1F is an explanatory diagram showing part of the manufacturing method in more detail.

In addition, FIG. 1E is a flow chart showing an example of that method of manufacturing a semiconductor integrated circuit device which is an embodiment of the present invention, while FIG. 1F is an explanatory diagram showing part of the manufacturing method in more detail.

First, examples of the construction of a wafer prober and a testing jig for use in a testing method which is an embodiment of the present invention will be described with reference to FIGS. 1A–1D.

As shown in FIG. 1B, the wafer prober 1 in this embodiment comprises an X-Y table 2 which is capable of a rectilinear movement within a horizontal plane, a rotational displacement, and ascent and descent operations in the vertical direction, and a wafer chuck 3 which is supported by the X-Y table 2.

The front surface of the wafer chuck 3 is formed with a plurality of concentric suction grooves 3*a* as shown in FIG. 1D.

Further, a plurality of suction ports 3*c* are provided in the wafer chuck 3, and they communicate with a suction pipe 3*b*, one end of which is open to the bottom parts of the suction grooves 3*a* and the other end of which is connected to a vacuum pump or the like, not shown, outside the wafer prober 1. Thus, a flat test piece such as semiconductor wafer, not shown, which is placed on the wafer chuck 3 is stably held on this wafer chuck 3 in detachable fashion by vacuum suction.

Meanwhile, a probe card 4 is disposed over the wafer chuck 3 in an attitude parallel to the plane of this wafer chuck 3.

On the surface of the probe card 4 confronting the wafer chuck 3, a plurality of probes 5 the base end sides of which are fixed to this probe card 4 are arranged in such an attitude that the flexible and sharp distal ends of the probes 5 concentrate centrally of the probe card 4 in predetermined positional relations.

Through the appropriate positioning operation of the X-Y table 2, the probes 5 are individually depressed on and electrically connected with the external electrodes or the like not shown, of each of a plurality of semiconductor integrated circuit elements which are constructed in the unshown semiconductor wafer fixed to the wafer chuck 3.

Besides, an observation window 4*a* is provided in the central part of the probe card 4. The window 4*a* makes it possible to observe from above the probe card 4, the touched states, positioned states etc. of the plurality of probes 5 with respect to the external electrodes or the like not shown, of each of the plurality of semiconductor integrated circuit elements which are constructed in the unshown semiconductor wafer fixed to the wafer chuck 3.

Further, each of the plurality of probes 5 mounted on the probe card 4 is connected to a tester 6 including a control computer by way of example, through a wiring structure 5*a* provided within this probe card 4, a cable 5*b* connected to the wiring structure 5*a*, etc.

The tester 6 transfers operating test signals and supplies operating electric power to the external electrodes or the like, not shown, provided on each of the semiconductor integrated circuit elements constructed in the unshown semiconductor wafer fixed to the wafer chuck 3, through the probes 5 individually connected to the external electrodes or the likes.

In this case, a jig 7 including a base plate 7*a* which presents substantially the same shape as that of a conventional semiconductor wafer is put on the upper surface of the wafer chuck 3.

In the base plate 7*a* of the jig 7, a rectangular window 7*b* penetrating this base plate 7*a* is formed as shown in FIG. 1B in a position where it overlaps any of the plurality of suction grooves 3*a* engraved in the wafer chuck 3 on which this jig 7 is put.

Further, in a region surrounding the rectangular window 7*b*, a rectangular step portion 7*c* is formed to be lower than the front surface of the base plate 7*a*. Rectangular pellets 8 each including a large-scale logic integrated circuit device therein are formed by cutting the semiconductor wafer, and such a rectangular pellet 8 is accommodated in the step portion 7*c* under the state under which it completely conceals the window 7*b* located centrally of this step portion 7*c*.

Moreover, substantially semicircular indents 7*d* are respectively formed in the middle parts of side walls defining the rectangular step portion 7*c*. Thus, the operations of setting the pellet 8 on and taking it out of the step portion 7*c* by the use of a pincette or the like are easily carried out without damaging this pellet 8.

Besides, an orientation flat 7*e* is provided at a part of the outer periphery of the base plate 7*a* as shown in FIG. 1A, and it is formed by cutting off the outer peripheral part rectilinearly in a direction parallel to one latus of the rectangular step portion 7*c*. By way of example, it is used as a reference plane in the operation of positioning the jig 7 to the wafer chuck 3.

In addition, the front surface of the base plate 7*a* of the jig 7 is formed with both positioning scribed lines 7*f* parallel to the extending direction of the orientation flat 7*e* and positioning scribed lines 7*g* orthogonal to the extending direction of the orientation flat 7*e*. The positioning scribed lines 7*f* and 7*g* are used for, e. g., the positioning of the pellet 8 to the plurality of probes 5 fixed to the probe card 4, as illustrated in FIG. 1C.

Now, an example of a method of manufacturing a semiconductor integrated circuit device with the probing technique as stated above will be described with reference to the flow charts of FIGS. 1E and 1F, etc.

First, an unshown master slice in a wafer state, which is formed with basic cells including such active elements as transistors via diffusion processes etc., is formed by photolithography with multilayer wiring structures for connecting the basic cells to one another so as to realize desired logical operations. Thus, a plurality of articles of a large-scale logic integrated circuit device having the same functions are simultaneously formed within the unshown semiconductor wafer.

Further, each of the plurality of articles of the large-scale logic integrated circuit device having the same functions and lying in the wafer state is formed with solder bumps 8*a* (in FIG. 1C) which function as electrodes for, e. g., transferring operation signals from and to the exterior of the circuit device (step 101).

Subsequently, the unshown semiconductor wafer formed with the plurality of articles of the semiconductor integrated circuit device having the same functions is cut, whereby the plurality of articles of the large-scale logic integrated circuit device having the same functions and lying in the wafer state are respectively split into individual pellets 8 (step 102).

Further, the plurality of pellets 8 which are respectively the articles of the large-scale logic integrated circuit device having the same logical functions are assorted into a first group to be mounted in a system such as general-purpose electronic computer, and a second group to be kept in custody (step 103).

Thereafter, the first group of pellets 8 are mounted in the system via a predetermined assemblage process, etc. (step 104).

Next, in the system in which the first group of pellets 8 are mounted, the functions of some or all of the pellets are tested (step 105).

It is decided if the first group of pellets 8 mounted have any logical or physical functional defect, and if the whole system requires the alteration of the specification thereof (step 106). In the absence of the functional defect in the pellets 8, requirement for the specification alteration of the system, or the like, the system is put into its ordinary operation (step 107).

In contrast, in the presence of the functional defect in the first group of pellets 8 mounted in the system or the need for specification alteration of the system at the step 106, wiring correction information for coping with the pertinent functional defect or specification alteration and diagnostic data in a probe test after corrections are first determined (step 108).

Thereafter, the second group of pellets 8 having the same structures and logical functions as those of the first group of pellets 8 and kept in stock since the step 103 are subjected to rewiring operations on the basis of the wiring correction information determined at the step 108 (step 109).

Here, an example of the rewiring operations of the second group of pellets 8 at the step 109 is illustrated in FIG. 1F.

First, using a focused ion beam apparatus or the like not shown, an insulator film **8*c* which covers a pertinent wiring structure 8*b* in the pellet 8 is provided with a through hole 8*d* in order to expose the wiring structure 8*b* (substep 109*a***).

Thereafter, the pellet 8 formed with the through hole **8*d* is transported into a CVD apparatus not shown (substep 109*b***).

During the transportation at the substep **109*b*, a natural oxidation film is formed on the wiring structure 8*b* exposed to the exterior via the through hole 8*d*. In order to remove the natural oxidation film and to clean the exposed surface, the wiring structure 8*b* is subjected to a light degree of sputter etching (substep 109*c***).

Subsequently, a subbing film **8*e* made of a conductor such as chromium (Cr) is formed to a thickness of several tens Å on the whole front surface of the pellet 8 and in the through hole 8*d* which exposes the wiring structure 8*b* to the exterior (substep 109*d***).

Further, correctional wiring **8*f* which connects the wiring structure 8*b* exposed from the through hole 8*d* and another wiring structure 8*b* similarly exposed, or the like is selectively formed into a predetermined shape by local photochemical vapor deposition in which a laser beam or the like, not shown, is employed as excitation light and the reaction gas of which is molybdenum carbonyl ($Mo(CO)_6$) of the like (substep 109*e***).

Thereafter, that unnecessary part of the subbing film **8*e* which does not underlie the correctional wiring 8*f* is removed by selective etching (substep 109*f***).

In the above, for the sake of brevity, the case of electrically connecting the wiring structures **8*b* to each other has been explained as one example of the wiring corrections. However, the operation of merely cutting the wiring structure 8*b* at a desired position with a focused ion beam or the like at the substep 109*c***, etc. are also combined and performed properly.

Owing to such a series of rewiring operations, the second group of pellets 8 are subjected to the wiring corrections for coping with the functional defect in the first group of pellets 8 or the specification alteration of the system as has been found out at the step 106.

Thereafter, the second group of pellets 8 rewired as stated above are subjected to probing for discriminating whether or not the results of the wiring corrections are appropriate (step 110).

Here, the probing in this embodiment is carried out as follows:

First, the wafer-shaped jig 7 described before is put on the wafer chuck 3 of the conventional wafer prober 1 so that the surface formed with the positioning scribed lines **7*f* and 7*g* may lie above and that the window 7*b* may be located directly over the suction groove 3*a***.

Further, the rewired pellet 8 of the second group to be tested is set in the step portion **7*c* of the jig 7 in the attitude in which its surface formed with the plurality of solder bumps 8*a* faces upwards, and it is brought into close contact with one corner of the step portion 7*c* whose size is slightly larger than this rectangular pellet 8**.

On this occasion, the window **7*b* of the jig 7 directly overlying the suction groove 3*a* is completely concealed by the pellet 8**.

Under this state, the interiors of the plurality of suction grooves **3*a* tightly closed by the lower surface of the jig 7 are evacuated through the suction pipe 3*b* as well as the suction ports 3*c*. Thus, the jig 7 and the pellet 8, which is set on the step portion 7*c* of this jig 7 and which is exposed to the suction groove 3*a* through the window 7*b*, are reliably fixed to the wafer chuck 3** by the atmospheric pressure.

Thereafter, the pellet 8 set on the step portion **7*c* of the jig 7 and the plurality of probes 5 fixed to the probe card 4 are subjected to paralleling etc. in such a way that the positioning scribed lines 7*f* and 7*g* engraved in the front surface of the jig 7 are observed with the eye or with a positioning control system, not shown, included in the wafer prober 1**.

Further, the X-Y table 2 is properly driven so that the respective solder bumps **8*a* provided on the pellet 8 may be located directly under the corresponding probes 5**.

Under the state thus established, the wafer chuck 3 is raised to a predetermined height. Then, the pointed ends of the respective probes 5 are depressed under a predetermined contact pressure against the corresponding solder bumps **8*a* formed on the pellet 8, and both are electrically connected as shown in FIG. 1C**.

Under this state, the tester 6 executes operating tests for the rewired pellets 8 of the second group on the basis of, e.g., the diagnostic data determined at the step 108.

In this manner, in the probe test of this embodiment, the jig 7 of simple structure and easy fabrication as stated above is used, whereby each individual pellet 8 can be probed with ease and at high precision without subjecting the conventional wafer prober 1 to any remodeling etc.

Therefore, it is unnecessary to develop a new testing apparatus or remodel the wafer chuck 3 for the purpose of probing the individual pellets which have been modified from the wafer state. The required period of time in probing the rewired pellets 8 can also be shortened and the cost therefor curtailed.

As regard the jig 7, in a case, for example, where merely a window 7*b* is formed which is slightly larger than the pellet 8 so that the pellet 8 is held in direct contact with the wafer chuck 3, a vacuum suction force acting on the pellet 8 can be spoilt by the open air which makes inroads through a clearance appearing between the inner periphery of the window 7*b* and the outer periphery of the pellet 8.

In contrast, in the case of this embodiment, the jig 7 is provided with the step portion 7*c* around the window 7*b* which penetrates the base plate 7*a*, and the pellet 8 is held on this step portion 7*c* in the state in which the window 7*b* is completely concealed, so that the pellet 8 is held airtight with respect to the jig 7. Accordingly, the drawback as stated above is reliably prevented, and the jig 7 and the pellet 8 can be fixed to the wafer chuck 3 more stably.

Moreover, the substantially semicircular indents 7*d* are respectively formed centrally of the side walls of the rectangular step portion 7*c*. Thus, in setting or removing the pellet 8 on or from the step portion 7*c* with a pincette or the like, the operation can be readily executed without damaging this pellet 8.

Meanwhile, in a case where the probing at the foregoing step 111 has decided that the required logical operation or operating performance is impossible because the wiring correction operation stated before is imperfect, the flow of the manufacturing method returns to the wiring correction operation of the step 109, at which the same pellet 8 or another new pellet 8 belonging to the second group is rewired.

Besides, in a case where the results of the probing at the step 111 have determined that the removed pellet is proper the rewired pellet 8 of the second group is assembled instead of the defective pellet 8 of the first group mounted in the system (step 112). Thereafter, the aforementioned series of operations of the steps 105 et seq. are repeated.

Here, in developing an electronic computer system or pellets 8 each of which is a large-scale logic integrated circuit device for use in the system, a functional defect or specification alteration arising after the assemblage of the pellet 8 into the system has heretofore been usually coped with by, e. g., a method wherein multilayer wiring structures are partly or wholly formed again for a master slice in a wafer state by a conventional wafer process. This method has posed the problem that, as logical operations required of the pellets 8 become more complicated and the number of wiring layers increases, an unreasonable time is expended till the completion of the correction of the functional defect or a measure for the specification alteration.

In this regard, in the assembling system wherein solder bumps are adopted in lieu of conventional wire bonding with increase in the number of input/output terminals in each pellet 8, after the formation of the multilayer wiring the solder bumps also need to be formed by evaporation or another process which requires a long time, such that the increase in the expended time becomes particularly conspicuous.

In contrast, according to the manufacturing method in this embodiment as stated above, the second group of pellets 8 in the finished states in which the wiring structures and solder bumps requiring long times for fabrication have already been formed may merely be subjected to the minimum required wiring corrections, so that the period of time expended till the completion of the correction of the functional defect or the measure for the specification alteration can be sharply shortened.

This brings forth the effect that the development periods of the large-scale logic integrated circuit device and the general-purpose electronic computer system employing the circuit device can be sharply shortened.

Further, the test of the chip 8 which produced a large amount of heat is executed while this chip 8 is being indirectly cooled by forcibly circulating water or a coolant such as Flourinert through a cooling pipe formed within the wafer chuck or stage 3 in FIG. 1B.

Besides, the chip 9 may well be drawn by suction on the stage 3 directly without the intervention of the jig 7.

Effects which are attained by typical aspects of performance of the present invention are briefly explained as follows:

According to a method of manufacturing a semiconductor integrated circuit device as in this first aspect of the present invention, each of a plurality of articles of the identical sort of semiconductor integrated circuit device formed via a wafer process is split into pellets, which are thereafter assorted into a first group and a second group; the pellets belonging to the first group are assembled into an intended system, while the pellets belonging to the second group are kept in stock; hen any functional defect has been found out in the first group of pellets assembled in the system, the second group of pellets are subjected to wiring corrections for eliminating the functional defect and are thereafter assembled into the system; and these steps are repeated. Therefore, when the functional defect has been found out in the first group of pellets assembled in the actual system, the second group of pellets already finished up are subjected to the wiring corrections for eliminating the functional defect of the first group of pellets and are thereafter exchanged for the first group of pellets, thereby making it possible to eliminate the functional defect of the first group of pellets or to take measures coping with a specification alteration etc. more promptly than in, for example, a case where multilayer wiring structures are partly or wholly remade from the beginning by the wafer process in order to eliminate the functional defect.

Thus, the development periods of the semiconductor integrated circuit device and the system employing it can be sharply shortened.

In addition, according to a method of testing a semiconductor integrated circuit device in this first aspect of the present invention and by means of a testing jig thereof, the semiconductor integrated circuit device in a pellet state can be probed without any remodeling of a conventional wafer prober, so that a probing apparatus dedicated to the pellet, for example, need not be prepared anew, thereby making it possible to shorten a required period of time and to curtail a cost in the process for probing the pellet.

Moreover, with the testing jig of this aspect of the invention, the pellet can be positioned to the testing system stably and highly accurately, so that the test accuracy of the probing can be enhanced.

Embodiment 2

General System Flow

Figure 2:
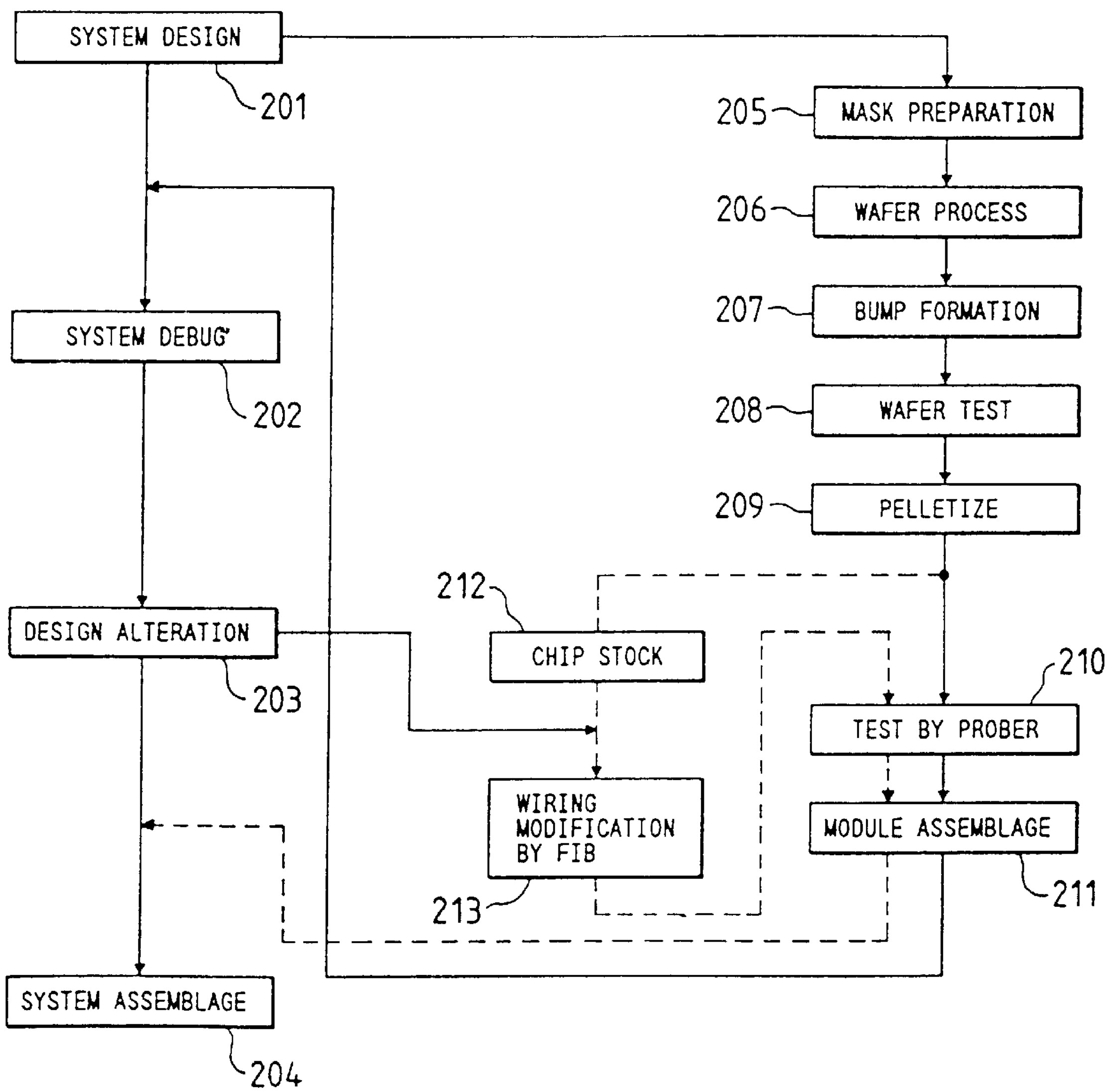
FIG. 2 is a flow chart showing the whole construction of the designing and manufacturing system of the first aspect of the present invention.

The general flow of a designing and developing system in the present invention will be described with reference to FIG. 2.

Referring to the figure, numeral 201 designated the step of designing a main frame computer or any other information processing system or control system. The signal processing of the system is chiefly performed by semiconductor devices such as Si monolithic ICs or GaAs monolithic ICs (memory gate arrays). Numeral 202 designates the step of debugging the system, and numeral 203 the step of altering the design. The logic alterations, etc. of the semiconductor devices taking charge of the signal processing, etc. of the system are made on the basis of the results of the debug. Numeral 204 indicates the system assemblage step of assembling the altered semiconductor devices into the system. The above steps 201–204 shall be generically termed the "system development process".

Numeral 205 denotes the mask preparation step of preparing the manufacturing masks of the semiconductor devices on the basis of the system design, numeral 206 a wafer process for forming predetermined integrated circuits in a wafer by the use of the masks, and numeral 207 the bump formation step of forming solder bump electrodes on bonding pads which are provided on the parts of the wafer corresponding to pellets. By the way, instead of forming the bumps, pieces of bonding wire may well be directly connected to the bonding pads.

At a wafer test step 208, electrical tests are conducted by bringing probes into direct touch with the solder bumps or the pads; at a pelletizing step 209, the wafer having been tested is split into the chips (pellets); and at a prober test step 210, the chip is electrically tested by a prober. A flow indicated by solid lines can be partly or wholly omitted.

Shown at numeral 211 is the module assemblage step or sealing step of assembling the tested chip into a package. The semiconductor device finished up here is supplied to the system debug step 202. The above-steps 205–211 shall be generically termed the "semiconductor device process".

A chip stock step 212 is such that, after the wafer has been split, some of the nondefective chips are kept in stock so as to make ready for the alteration of the specification of the system. At a wiring correction step 213, a chip subjected to the design alteration 203 is taken out from among the stocked chips and is processed with a focused ion beam (hereinbelow, abbreviated to "FIB") or the like. The chip corrected here is tested by the method elucidated in Embodiment 1, whereupon it is packaged as the semiconductor device. As indicated by a broken line, this semiconductor device is supplied to the system assemblage 204.

Embodiment 3

Now, the whole construction and manufacturing process of an LSI (semiconductor device) in this embodiment will be described.

Figure 3A:
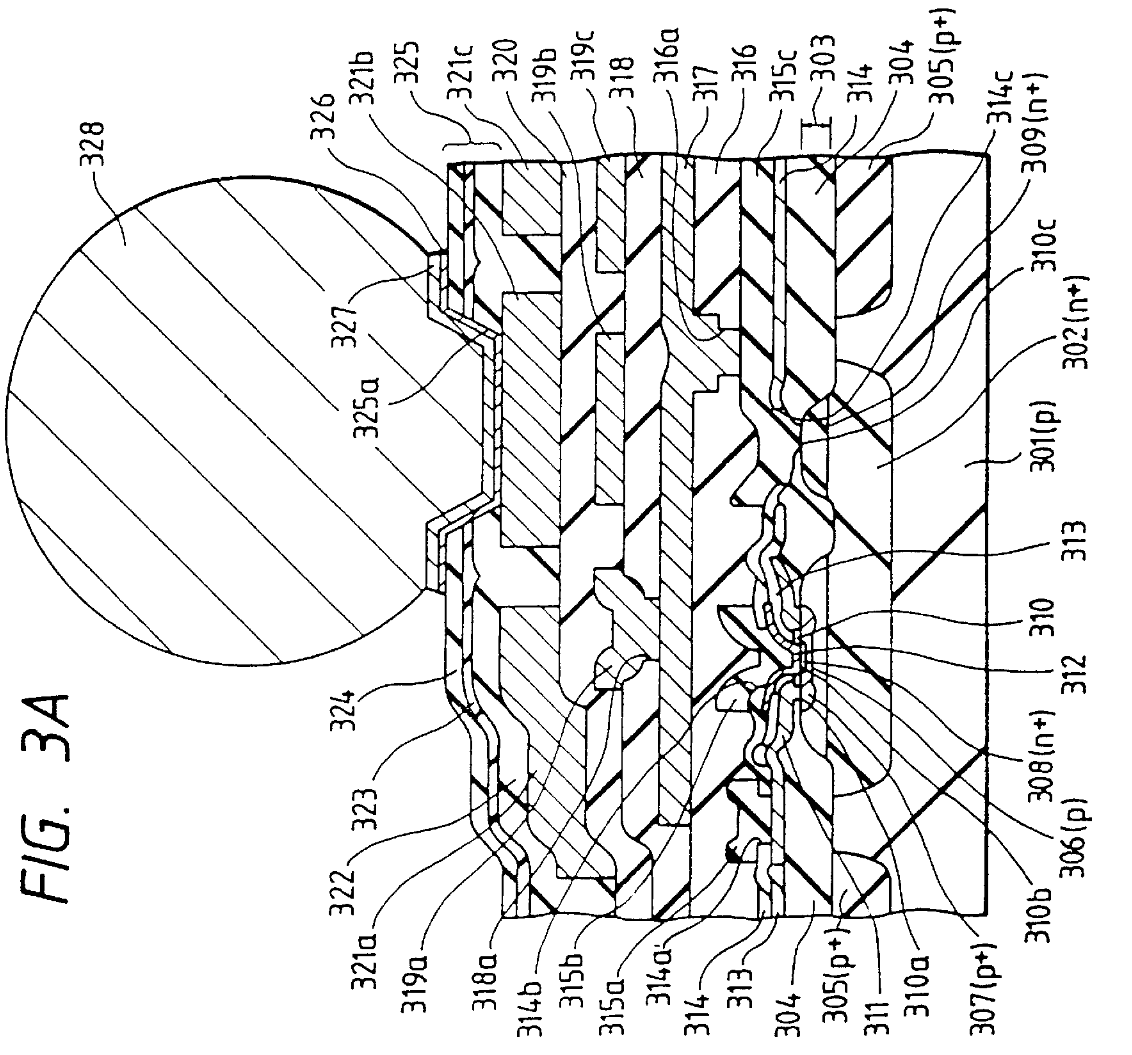
FIG. 3A is a sectional view showing the essential portions of a bipolar LSI according to Embodiment 3 of the first aspect of the present invention.

FIG. 3A is a sectional view showing pertinent portions of the bipolar LSI according to the embodiment of this first aspect of the present invention.

As shown in FIG. 3A, in the bipolar LSI according to this embodiment, a semiconductor chip (semiconductor substrate) 301 made of p-type silicon by way of example is provided in its front surface with a buried layer 302 of, for example, $n^+$-type and is overlaid with an epitaxial layer 303 of, for example, n-type silicon. A field insulator film, for example, $SiO_2$ film 304 is provided at the predetermined part of the epitaxial layer 303, thereby to effect the isolation among elements and isolation within each element. The field insulator film 304 is underlaid with a channel stopper region 305 of, for example, $p^+$-type. Besides, an intrinsic base region 306 of, for example, p-type and a graft base region 307 of, for example, $p^+$-type are provided in the part of the epitaxial layer 303 enclosed with the field insulator film 304, and an emitter region 308 of, for example, $n^+$-type is provided in the intrinsic base region 306. Thus, an n-p-n bipolar transistor is configured of the emitter region 308, the instrinsic base region 306, and a collector region which includes the epitaxial layer 303 and the buried layer 302 underlying the intrinsic base region 306. In addition, numeral 309 indicates a collector take-out region of, for example, $n^+$-type which is connected with the buried layer 302. Numeral 310 indicates an insulator film, for example, $SiO_2$ film which is provided in continuation to the field insulator film 304. This insulator film 310 is provided with holes 310*a*, 310*b* and 310*c* respectively corresponding to the graft base region 307, emitter region 308 and collector take-out region 309. A base lead-out electrode 311 made of a polycrystalline silicon film is connected to the graft base region 307 through the hole 310*a*, while a polycrystalline-silicon emitter electrode 312 is provided on the emitter region 308 through the hole 310*b*. Incidentally, numerals 313 and 314 denote insulator films, for example, $SiO_2$ films.

Symbols 315*a*–315*c* designate first-layer wiring lines made of, for example, aluminum films. Of them, the wiring line 315*a* is connected to the base lead-out electrode 311 through a hole 314*a* provided in the insulator film 314, the wiring line 315*b* to the polycrystalline-silicon emitter electrode 312 through a similar hole 314*b*, and the wiring line 315*c* to the collector take-out region 309 through a similar hole 314*c* as well as the aforementioned hole 310*c*. In addition, numeral 316 indicates an inter-layer insulator film which is configured of, for example, an SiN film formed by plasma CVD, a spin-on-glass (SOG) film, and an SiO film formed by the plasma CVD. The inter-layer insulator film 316 is overlaid with second-layer wiring 317 which is made of, for example, an aluminum film. The wiring 317 is connected to the wiring 315*c* via a through hole 316*a* which is provided in the inter-layer insulator film 316. Incidentally, the through hole 316*a* has a stepped shape, thereby to enhance the step coverage of the wiring 317 in this through hole 316*a*. Numeral 318 indicates an inter-layer insulator film which is similar to the inter-layer insulator film 316. The inter-layer insulator film 318 is overlaid with third-layer wiring lines 319*a*–319*c* each of which is made of, for example, an aluminum film. Of them, the wiring line 319*a* is connected to the wiring 317 via a through hole 318*a* which is provided in the inter-layer insulator film 318. Further, numeral 320 indicates an inter-layer insulator film which is similar to each of the inter-layer insulator films 316 and 318. The inter-layer insulator film 320 is overlaid with fourth-layer wiring lines 321*a*–321*c* each of which is made of, for example, an aluminum film. Each of the wiring lines 321*a*–321*c* is constructed thicker than the wiring lines of the lower layers so as to be capable of causing a great current to flow therethrough, and it has a thickness of 2 $\mu$m by way of example. Besides, the width of a groove defined between the adjacent ones of these wiring lines 321*a*–321*c* is 2 $\mu$m by way of example. Accordingly, the aspect ratio (the depth of the groove/the width of the groove) of this groove is a large value of, for example, 1.

Shown at numeral 322 is a surface flattening insulator film made of, for example, an $SiO_2$ film. By way of example, the insulator film 322 is formed by the bias sputtering of $SiO_2$ or the combination of plasma CVD and sputter etching. Since the grooves between the wiring lines 321*a*–321*c* are completely filled up with the insulator film 322, the front surface of this insulator film 322 becomes substantially flat. As the insulator film 322, it is also possible to employ a silicate glass film, such as PSG (Phospho-Silicate Glass) film, BSG (Boro-Silicate Glass) film of BPSG (Boro- Phospho-Silicate Glass) film, which is formed by, for example, the combination of normal-pressure pressure CVD and sputter etching. The insulator film 322 is overlaid with an SiN film 323 which is formed by, for example, plasma CVD. As is well known, the SiN film 323 has a resistance to moisture. In this case, the front surface of the insulator film 322 inclusive of the parts thereof corresponding to the grooves between the wiring lines 321*a*–321*c* is flat, so that the front surface of the SiN film 323 is also flat. In consequence, the thickness and quality of the SiN film 323 are uniform. Accordingly, the moisture resistance of a protective film 325 to be described below can be enhanced over the prior art. Thus, a non-airtight sealing type package can be employed as the package of the LSI. The SiN film 323 is overlaid with an SiO film 324 which is formed by, for example, plasma CVD. The protective film 325 for protecting the chip is configured of the insulator film 322, the SiN film 323 and the SiO film 324. In this case, the SiO film 324 plays the roles of ensuring the adhesion of a chromium (Cr) film 326, to be mentioned below, to the protective film 325 and preventing the SiN film 323 from being etched at the dry etching of this Cr film 326.

The protective film 325 is formed with a hole 325*a*, through which the Cr film 326, for example, is provided on the wiring 321*b*. The Cr film 326 is overlaid with a solder bump 328 of lead (Pb)—tin (Sn) alloy system through, for example, an intermetallic compound layer 327 of copper (Cu)—Sn system.

Figure 3B:
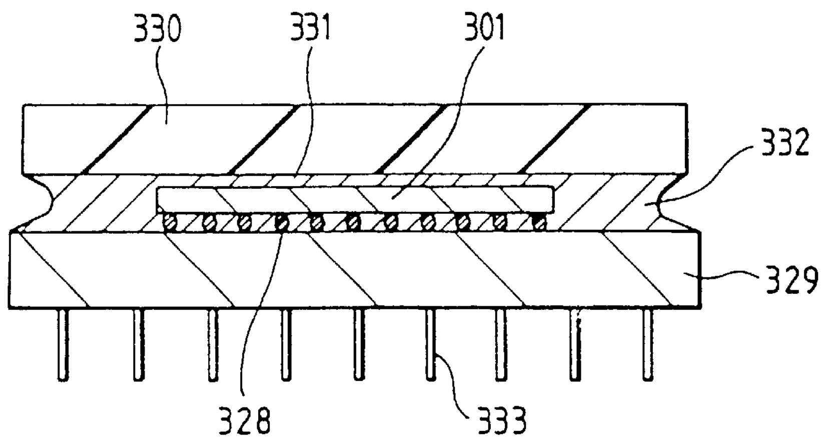
FIG. 3B is a sectional view showing a pin grid array type package with which the bipolar LSI depicted in FIG. 3A is sealed.

FIG. 3B is a sectional view showing a pin grid array (PGA) type package with which the bipolar LSI illustrated in FIG. 3A is sealed.

As shown in FIG. 3B, in the pin grid array type package, the semiconductor chip 301 is connected onto a chip carrier 329 made of, for example, mullite ($3Al_2O_3.2SiO_2$) by the use of the solder bumps 328. In addition, numeral 330 designates a cap which is made of, for example, silicon carbide (SiC). The rear surface of the semiconductor chip 301 (the surface in which no element is formed) is held in contact with the cap 330 through a brazing material, for example, solder 331, whereby heat can be effectively radiated from the semiconductor chip 301 to this cap 330. By the way, in case of installing the package on a module board or the like, radiation fins (not shown) are held in contact with the cap 330, whereby the radiation of heat from the package is effectively performed. Besides, numeral 332 indicates a resin, for example, epoxy resin, with which the semiconductor chip 301 is sealed. That is, the package is a non-airtight sealing type package. Since, in this case, the moisture resistance of the protective film 325 is excellent as already stated, the non-airtight sealing type package can be employed in this manner, whereby curtailment in the cost of the package can be attained. Numeral 333 designates input/output pins, which are connected to the solder bumps 328 by multilayer wiring (not shown) laid in the chip carrier 329.

Now, a method of manufacturing the bipolar LSI shown in FIG. 3A will be described. Steps till the formation of the inter-layer insulator film 320 shall be omitted from description.

Figure 3C:
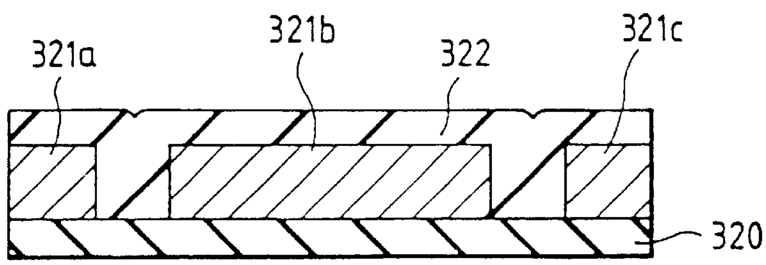
FIGS. 3C–3G are sectional views for explaining in the order of steps, a method of manufacturing the bipolar LSI depicted in FIG. 3A.

As shown in FIG. 3C, wiring lines 321*a*–321*c* are formed on the inter-layer insulator film 320, whereupon an insulator film, for example, $SiO_2$ film 322 is formed by, for example, the bias sputtering of $SiO_2$ or the combination of plasma CVD and sputter etching. As already stated, the front surface of the insulator film 322 can be made substantially flat. Here, it is assumed by way of example that the depth and width of each groove defined between the adjacent ones of the wiring lines 321*a*–321*c* are 2 $\mu$m, respectively. Then, in the case where the insulator film 322 is formed using the bias sputtering of $SiO_2$, it may have a thickness of, for example, about 3.5 $\mu$m in order to present the substantially flat surface. On the other hand, in the case where the insulator film 322 is formed by the combination of plasma CVD and sputter etching, it may have a thickness of, for example, about 1.5 $\mu$m in order to present the substantially flat surface.

Figure 3D:
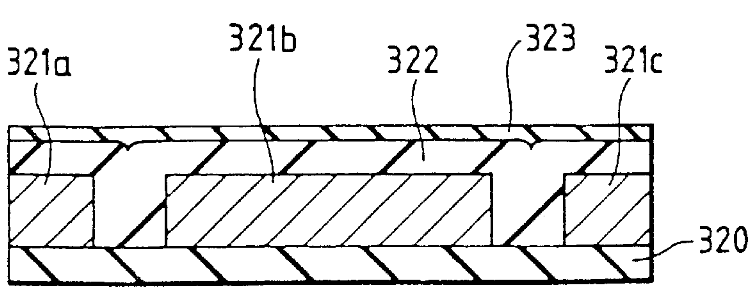

Subsequently, as shown in FIG. 3D, an SiN film 323 which is 5000 Å thick by way of example is formed on the insulator film 322 by, for example, plasma CVD.

Figure 3E:
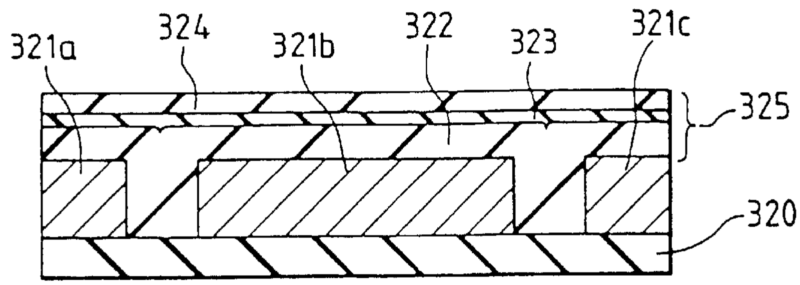

Subsequently, as shown in FIG. 3E, an SiO film 324 which is 1 $\mu$m thick by way of example is formed on the SiN film 323 by, for example, plasma CVD. In this way, a protective film 325 of superior moisture resistance is formed.

Figure 3F:
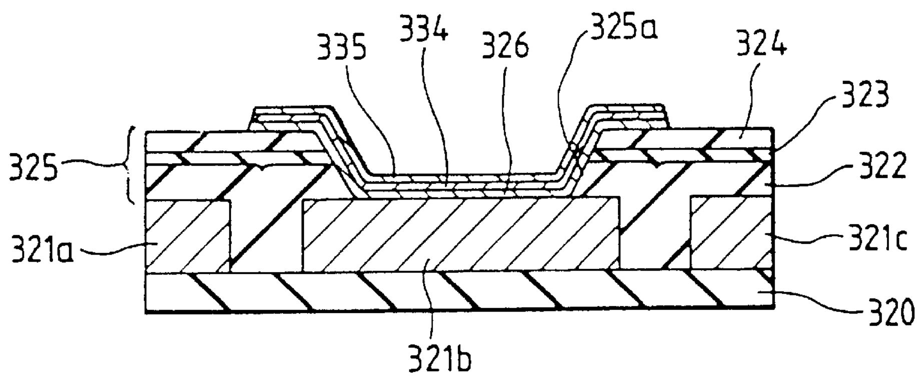

Next, as shown in FIG. 3F, the predetermined part of the protective film 325 is etched and removed, thereby to form a hole 325*a* to which the front surface of the wiring line 321*b* is exposed. Under this state, the whole front surface of the resultant structure is overlaid with a Cr film 326 having a thickness of, for example, 2000 Å, a Cu film 334 having a thickness of, for example, 500 Å and a gold (Au) film 335 having a thickness of, for example, 1000 Å, in succession by, for example, evaporation. Thereafter, the Au film 335, Cu film 334 and Cr film 326 are patterned into predetermined shapes by etching. In this case, the Au film 335 serves to prevent the oxidation of the Cu film 334, and this Cu film 334 serves to secure the wettability of a solder bump 328 with its subbing layer. In addition, the etching operations of the Au film 335 and the Cu film 334 are carried out with, for example, wet etching, while the etching operation of the Cr film 326 is carried out with, for example, dry etching which employs a gaseous mixture consisting of $CF_4$ and $O_2$. As already stated, during the dry etching, the SiO film 324 functions as an etching stopper, so that the underlying SiN film 323 can be prevented from being etched. Incidentally, the Au film 335, Cu film 334 and Cr film 326 are usually called "BLM (Ball Limiting Metalization)".

Figure 3G:
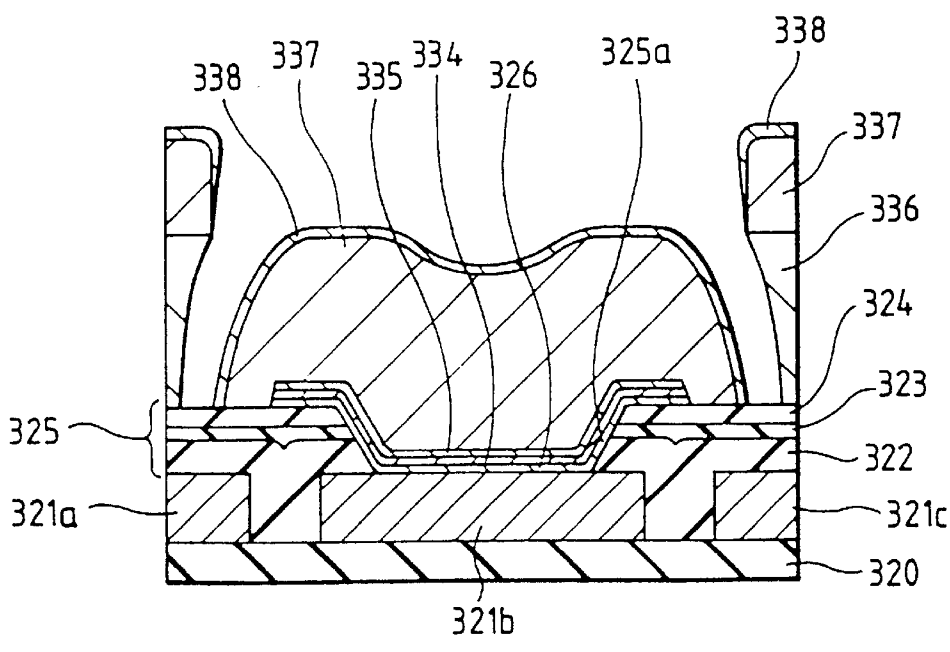

Next, as shown in FIG. 3G, a resist pattern 336 of predetermined shape is formed on the SiO film 324, whereupon the whole front surface of the resultant structure is formed with a Pb film 337 and an Sn film 338 in succession by, for example, evaporation. Thus, the Au film 335, Cu film 334 and Cr film 326 are covered with the Pb film 337 and Sn film 338. The thicknesses of the Pb film 337 and Sn film 338 are selected so that the Sn content of the solder bump 328 to be formed later may become a predetermined value.

Subsequently, the resist pattern 336 is removed along with the parts of the Pb film 337 and Sn film 338 formed thereon (by so-called lift-off), whereupon the resultant structure is annealed at a predetermined temperature. Thus, the Pb film 337 and the Sn film 338 are alloyed, and the solder bump 328 of Pb—Sn alloy system which is substantially global is formed as shown in FIG. 3A. In the alloying process, Sn in the Sn film 338 is alloyed with Cu in the Cu film 334, whereby a layer of intermetallic compound of Cu—Sn system 327 is formed between the solder bump 328 and the Cr film 326. In actuality, Au from the Au film 335 is also contained in the solder bump 328.

Embodiment 4

Now, the inner construction of a chip of VLSI (Very Large Scale Integration) which is an example of an object to be handled in the first aspect of the present invention will be described.

The chip referred to here is used as the CPU or any other logical processing unit and the memory device of a main frame computer (ultrahigh speed computer). Accordingly, it needs to have a very large number of input/output terminals. In general, it is installed on or connected to an external package or circuit board by wire bonding when it has up to about 200 pins, and by TAB (Tape Automated Bonding), CCB (Controlled-collapse Solder Bumps) or the like when it has more pins.

The chip is in the shape of a square or oblong plate whose sides are 10 mm–20 mm long. The principal surface of the chip for forming circuit elements is formed with ECL (Emitter-Coupled Logic) circuits and other required CMOS (Complementary MOS) circuits, and the internal chip construction corresponding to a requested specification is selected according to a system (designing and manufacturing system) similar to that of a so-called gate array.

Figure 4B:
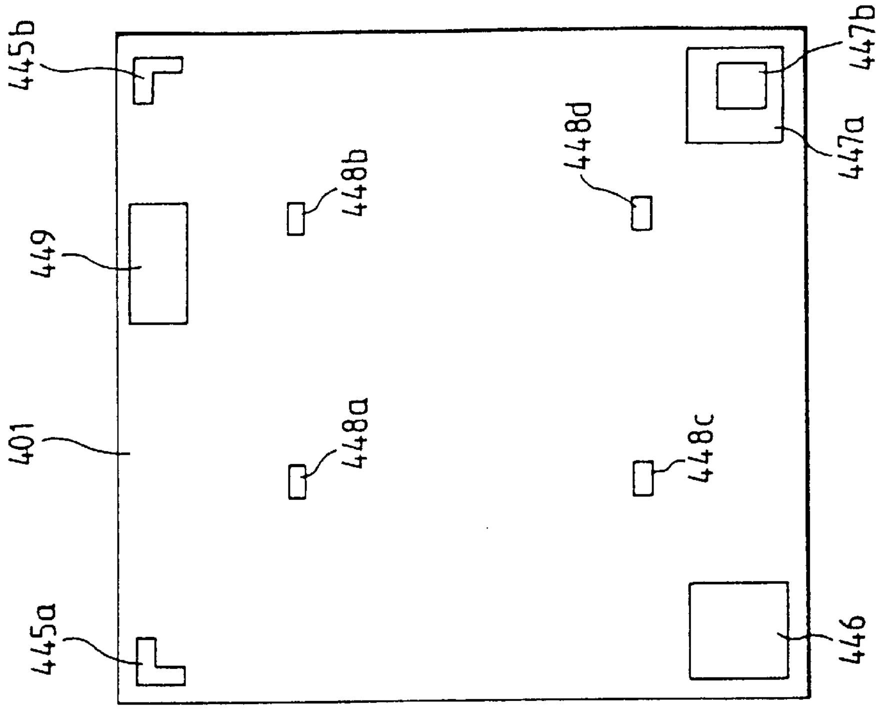
FIG. 4B is a layout diagram of various adjusting patterns or the tools of a airing correction system in the embodiment.
Figure 4A:
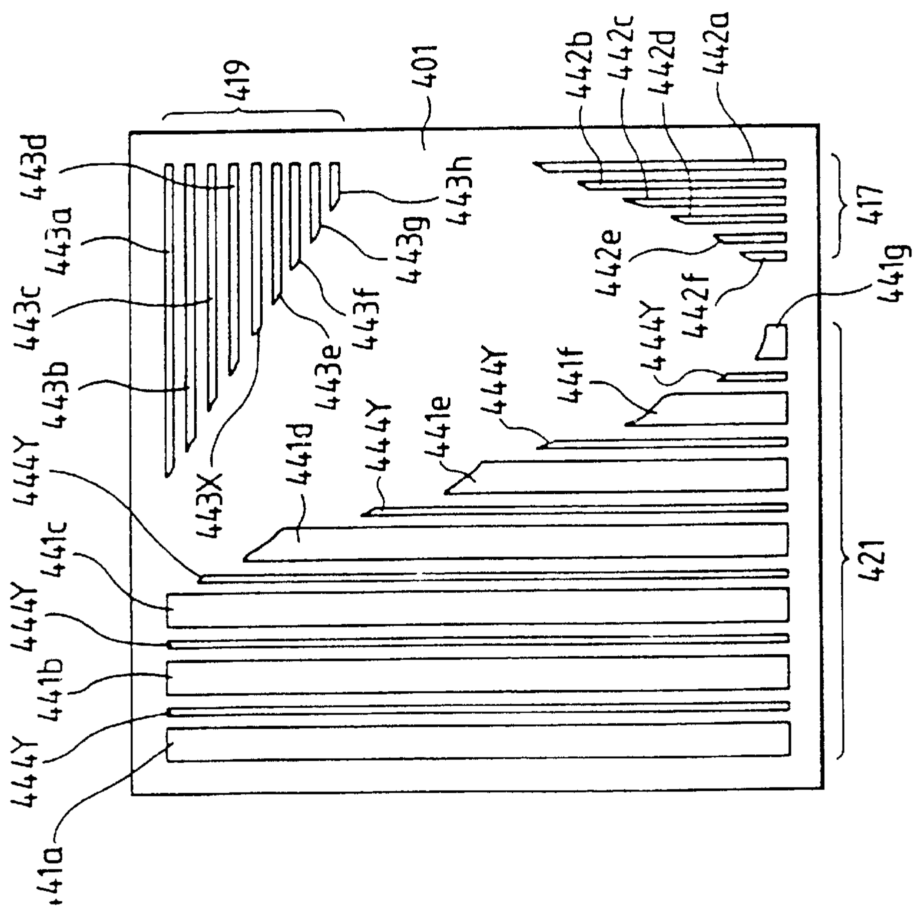
FIG. 4A is a layout plan view of the second–fourth layers of Al (aluminum) wiring of a logic chip in Embodiment 4 of the first aspect of the present invention.

FIG. 4A is a top model diagram showing the layout of second–fourth layers of Al (aluminum) wiring on the chip. Referring to the figure, numeral 421 designates the fourth-layer metal wiring lines which shall be termed "Al-4" (or "WR-4") and which are laid in a large number so as to chiefly extend substantially over the full vertical length of the chip 401 in the direction of a Y-axis. Numeral 419 designates the third-layer metal wiring lines which shall be termed "Al-3" (or "WR-3") and which chiefly extend in the direction of an X-axis. Numeral 417 indicates the second-layer metal wiring lines which shall be termed "Al-2" (or "WR-2") and which chiefly extend in the Y-axial direction. Although the Al wiring lines of each of the layers are shown only partly, they are laid on the entire upper surface of the chip as may be needed. Each of symbols 441*a*–441*g* denotes a power source wiring line or a reference voltage wiring line having a width of 50–200 μm (in the case of the ECL, $V_{ESL}$ . . . −4 V, $V_{EE}$ . . . −3 V, $V_{TT}$ . . . −2 V, and $V_{CC1}$, $V_{CC2}$ and $V_{CC3}$ . . . 0 V). Symbol 444Y denotes fourth-layer spare wiring lines termed "AlS-4", each of which has a width of 10 μm and which are laid so as to extend substantially over the full vertical length of the chip 401 on the upper surface thereof. Symbols 443*a*–443*h* denote the third-layer wiring lines Al-3 which have pitches of 5 μm and widths of 3.5 μm, and which are automatically laid out as required by interconnections. Symbol 443X represents a third-layer spare wiring line termed "AlS-3", which is laid every fifth pitch and which extends substantially over the full lateral length of the chip 401 on the upper surface thereof. The floating spare wiring lines AlS-3 and AlS-4 can cover substantially the whole area of the chip 401. Symbols 442*a*–442*f* indicate the second-layer wiring lines Al-2 which have pitches of 5 μm and widths of 3.5 μm, and which are automatically laid out as required by the interconnections in association with the third-layer wiring lines Al-3.

FIG. 4B is a chip layout diagram concerning a wiring correction process, supporting tools, etc. Referring to the figure, symbols 443*a* and 445*b* denote origin detecting patterns which serve to detect the angle θ between the origin and reference axis of a pattern on the chip 401, and which are formed by the fourth-layer wiring Al-4. Numeral 446 designates a trial digging region. Symbol 447*a* indicates a processing reference mark, namely, a metal pattern for detecting an inter-layer deviation, which is formed by the third-layer wiring Al-3, while symbol 447*b* indicates a similar metal pattern for detecting an inter-layer deviation, which is formed by the fourth-layer wiring Al-4. Symbols 448*a*–448*d* denote spare gate cells, respectively. Shown at numeral 449 is a region where marks or patterns are formed using an FIB or by laser selective CVD in order to record the wiring correction history, specification, product name, type etc. of the chip.

Figure 4C:
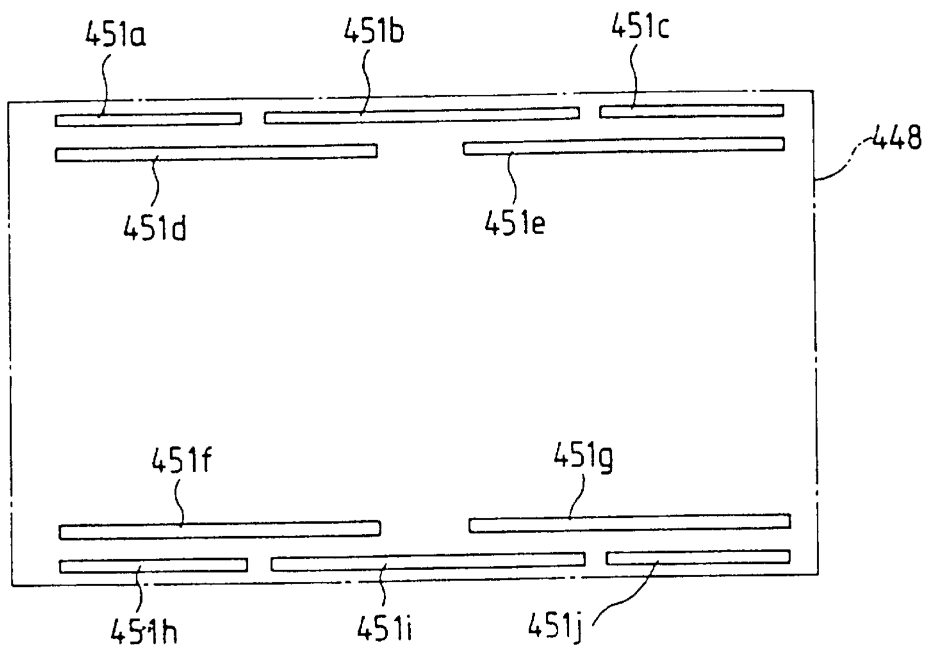
FIG. 4C is a layout plan view of the antenna wiring of a spare gate cell in the embodiment.

FIG. 4C is a plan view showing only antenna wiring formed by the third-layer wiring Al-3, in the plan layout of the spare gate cell. In the figure, symbols 451*a*–451*j* denote the antenna wiring lines of the spare gate cell 448 as termed "AlA-3", respectively.

Figure 4D:
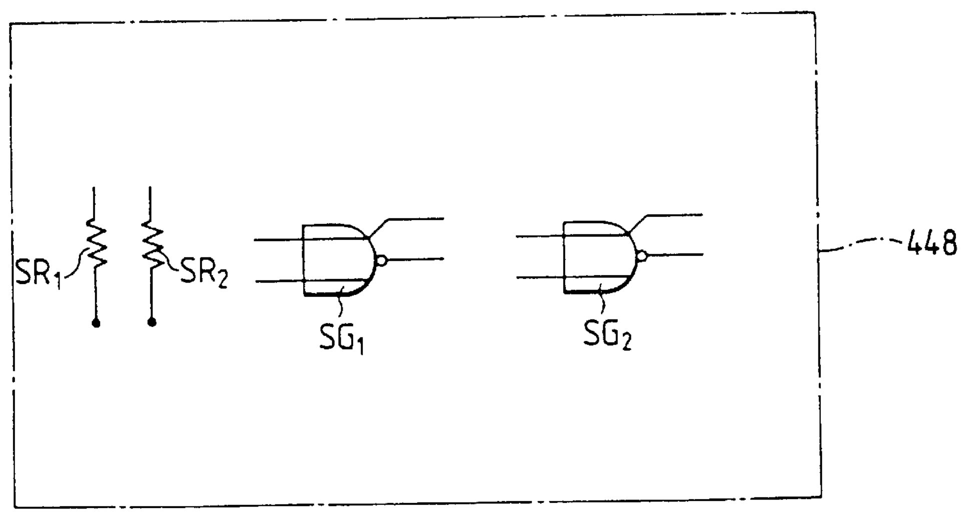
FIG. 4D is a circuit diagram showing the spare devices of the spare gate cell.

FIG. 4D is a model circuit diagram of the built-in elements and gates of the spare gate cell 448. In the figure, symbols $SR_1$ and $SR_2$ indicate spare resistors, and symbols $SG_1$ and $SG_2$ the ECL spare gates.

Now, several patterns in the wiring correction method of the present invention will be described (examples for the ECL circuit will be explained below).

Figure 4E:
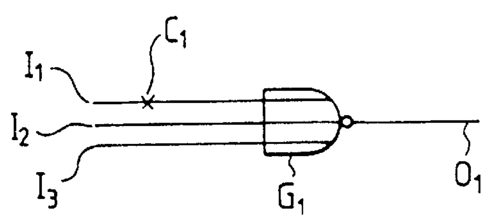
FIGS. 4E–4H are circuit diagrams showing several correctional patterns.

FIG. 4E is a model circuit diagram showing a correctional pattern called "input low clamp". Referring to the figure, symbol $G_1$ denotes a wired gate which is already wired as one of the gates of the VLSI, and which has input wiring lines $I_1$–$I_3$ and an output wiring lines $O_1$. Symbol $C_1$ denotes that part of the input wiring line $I_1$ which has been cut with the FIB.

Figure 4F:
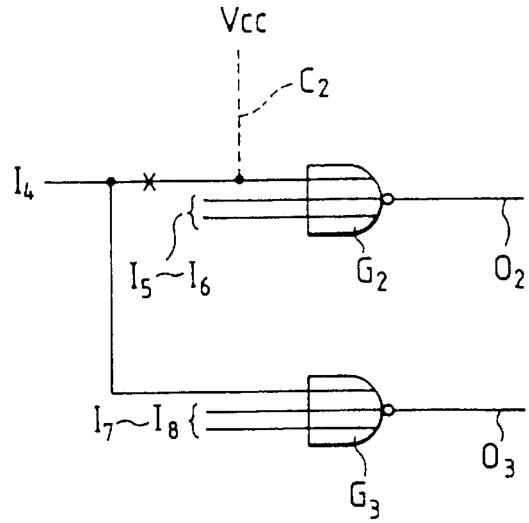

FIG. 4F is a model circuit diagram showing a correctional pattern called "input high clamp". Referring to the figure, symbols $G_2$ and $G_3$ denote wired gates which have input wiring lines $I_4$–$I_8$ and output wiring lines $O_2$ and $O_3$. A voltage $V_{CC}$ is one of the voltages $V_{CC1}$–$V_{CC3}$, and it is the voltage $V_{CC2}$ in the case of the internal gate. Symbol $C_2$ denotes a piece of jumper wire which is formed by laser CVD or vapor selective CVD employing an FIB.

Figure 4G:
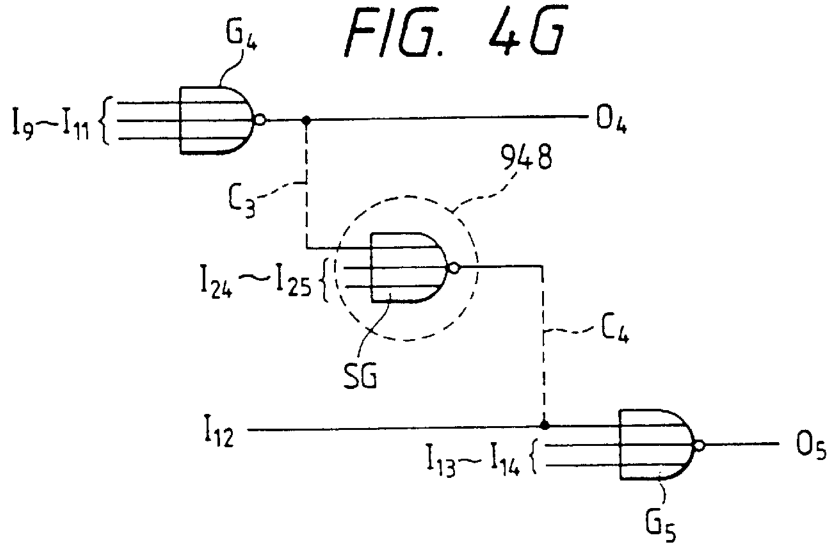

FIG. 4G is a model circuit diagram showing a correctional patterned called "reverse output use". Referring to the figure, symbols $G_4$ and $G_5$ denote wired gates, and symbol SG denotes spare gates (corresponding to those $SG_1$ and $SG_2$ in FIG. 4D) included in the spare gate cell 448 which is one of those 448*a*–448*d* in FIG. 4B. Symbols $I_9$–$I_{14}$ and $I_{24}$, $I_{25}$ denote the input wiring lines of the gates $G_4$, $G_5$ and SG, and symbols $O_4$ and $O_5$ denote the output wiring lines of the respective gates $G_4$ and $G_5$. Symbols $C_3$ and $C_4$ indicate pieces of correctional jumper wire formed by vapor selective laser CVD or the like similar to the above.

Figure 4H:
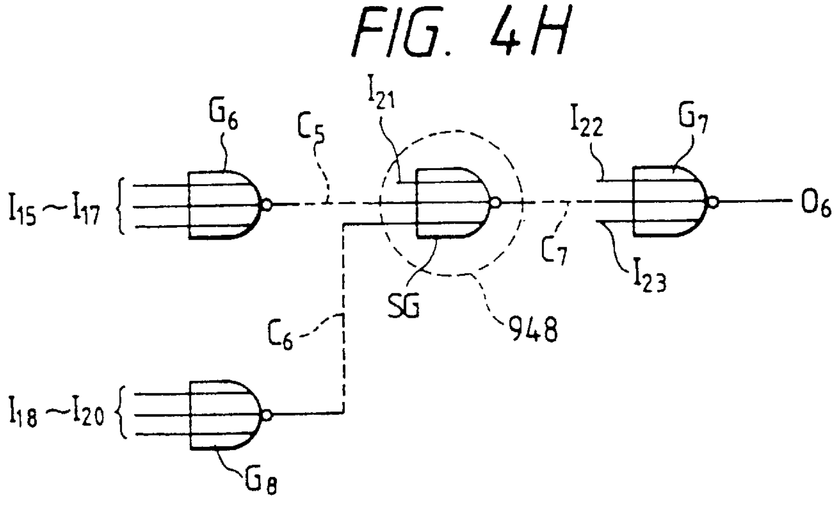

FIG. 4H is a model circuit diagram of a correctional pattern called "spare gate addition". Referring to the figure, symbols $G_6$–$G_8$ denote wired gates, and symbol SG denotes spare gates in the spare gate cell 448 similarly to the foregoing. Symbols $I_{15}$–$I_{23}$ denote the input wiring lines of the gates $G_6$–$G_8$ and SG, and symbol $O_6$ denotes the output wiring line of the gate $G_7$. Correctional wiring lines $C_5$–$C_7$ are made of Mo (molybdenum) or the like, and are formed by laser CVD or the like.

Next, the process of this correctional system will be described.

In developing a large-sized system, for example, main frame computer, several hundred sorts of logic LSIs are simultaneously developed, and the system is debugged and adjusted by the use of the logic LSIs. Besides, in the presence of any logical defect or any point of alteration, each LSI must be remade promptly. In the first aspect of the present invention, therefore, the LSI articles formed with the CCB electrodes (corresponding to FIG. 3B) and diced into the chip states are kept in stock, and they are subjected to corrections as indicated by the aforementioned correctional patterns and the preceding embodiments, whereby the LSI can be completely remade in 5–30 hours.

Here, the wiring corrections are possible, not only in the chip state, but also in the wafer state. In the wafer state, alignment etc. are easier, whereas a turnaround time expended in correcting and remaking the LSI becomes longer. Accordingly, the wafer corrections are also possible in fields where such a demerit is allowed. In, for example, WSI (Wafer Scale Integration), the demerit is avoided, and hence, the wafer corrections are useful.

Regarding the corrections in the chip state, the wiring can be corrected, not only in the state of the chip per se, but also in the state in which the chip is die-bonded to a package base or in the state in which the wire bonding of the chip has been completed. In this case, the turnaround time can be shortened more. This also holds true of the case of applying the TAB technique.

As stated above, the spare chips each of which has been split in the state of FIG. 3A by way of example are kept in stock for each sort of products, and they are corrected in correspondence with the results of the debug.

Figure 4I:
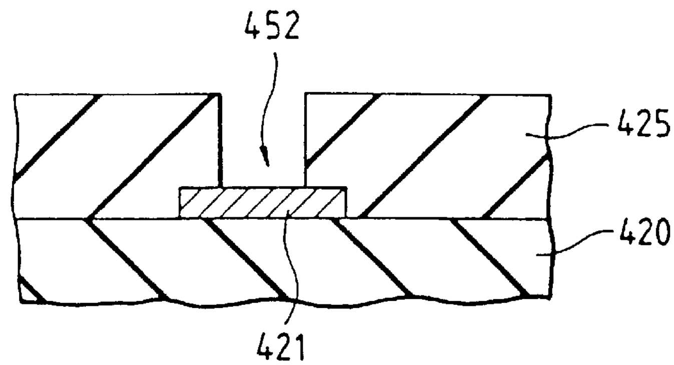
FIGS. 4I(*a*)–4I(*d*) are sectional views showing the process flow of corrections with an FIB (focused ion beam) and laser CVD (chemical vapor deposition)
Figure 4I:
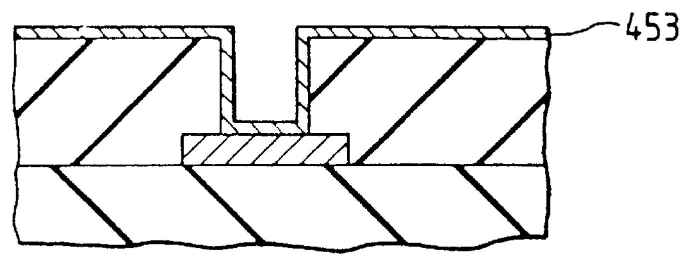
Figure 4I:
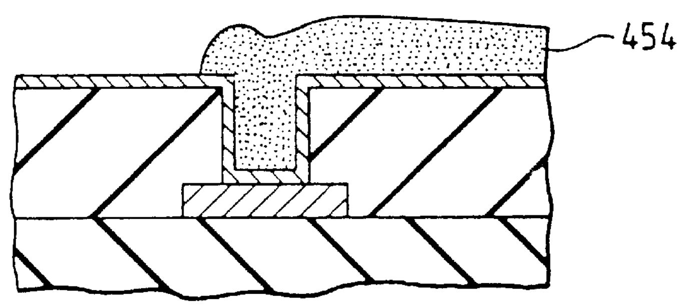
Figure 4I:
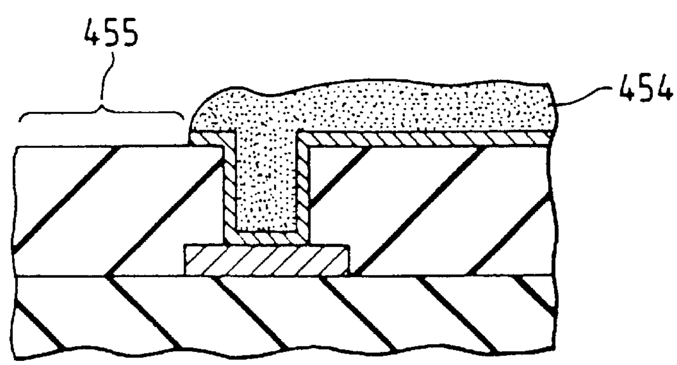
Figure 4J:
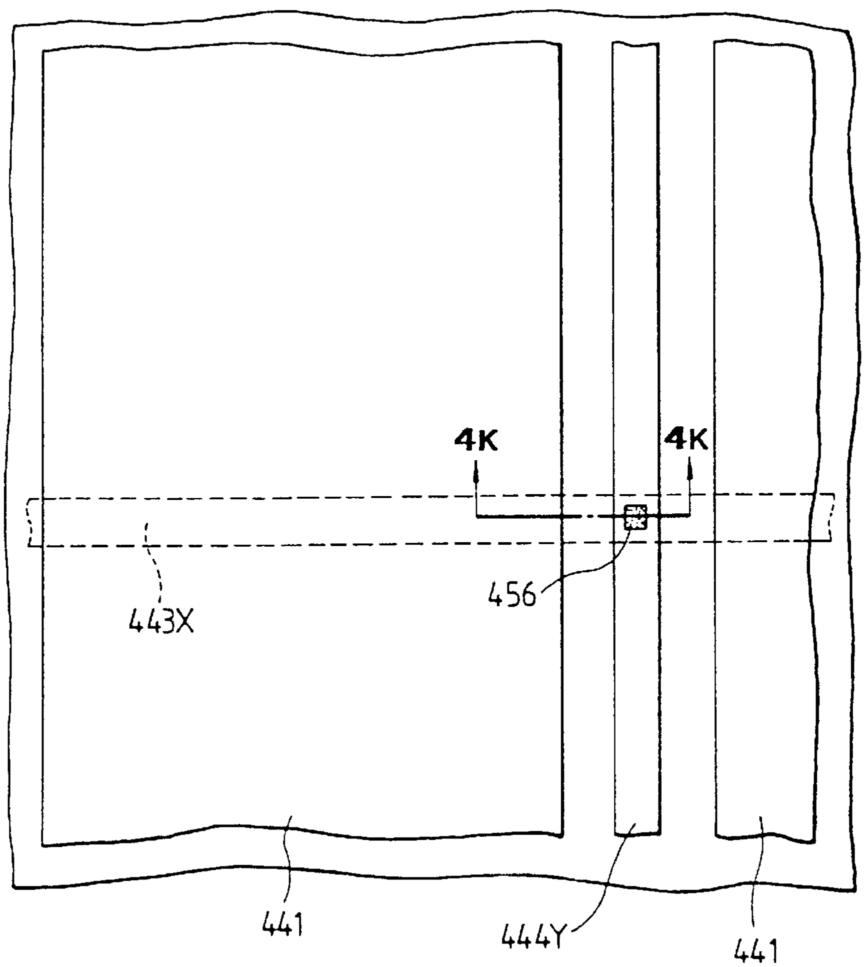
FIGS. 4J–4P are plan views and sectional views of corrected wiring parts which correspond to several techniques for local corrections.

First, the trial digging region 446 in FIG. 4B is dug with an FIB by way of trail, and the detection data of the digging is stored. Further, the misregistration between the wiring layers Al-3 and Al-4 is detected using the inter-layer deviation detecting patterns 447*a* and 447*b* in the same figure, and the data of the detection is stored. Subsequently, the operations or calculations of bringing designed pattern data on the chip 401 and the origins and axes of actual patterns into agreement are executed using the origin and θ detecting patterns 445*a* and 445*b* in the same figure. In accordance with the operations or calculations, the following corrections as shown in FIGS. 4J–4P are made:

FIG. 4J is an enlarged top view of the correctional part of the principal surface of the chip 401 corresponding to FIGS. 4A and 4B. In FIG. 4J, numerals 441 designate the broad Al-4 power source wiring (including the reference voltage wiring) lines, respectively, symbol 443X denotes the spare wiring line AlS-3 extending in the X-axial direction and formed by the third-layer wiring Al-3 (otherwise, this spare wiring line may well be replaced with one of the third-layer wiring lines Al-3 coupled with any element), symbol 444Y denotes the spare wiring line AlS-4 extending in the Y-axial direction and formed by the fourth-layer Al wiring, and numeral 456 designates an Mo (molybdenum) layer which is formed by laser CVD in a vertical hole provided by an FIB.

Figure 4K:
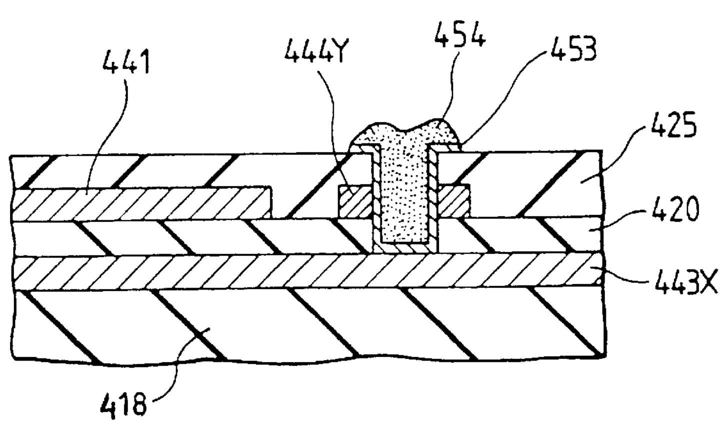

FIG. 4K is a sectional view taken along X—X in FIG. 4J. Referring to FIG. 4K, numeral 418 designates a third-layer inter-layer insulator film IL-3, symbol 443X the third-layer spare wiring line mentioned above, numeral 420 a fourth-layer inter-layer insulator film IL-4, numeral 441 the power source wiring line, numeral 425 a final passivation film, namely, a top protective film, symbol 444Y the fourth-layer spare wiring line, numeral 453 a subbing Cr (chromium) film, and numeral 454 the laser CVD layer of Mo.

Figure 4L:
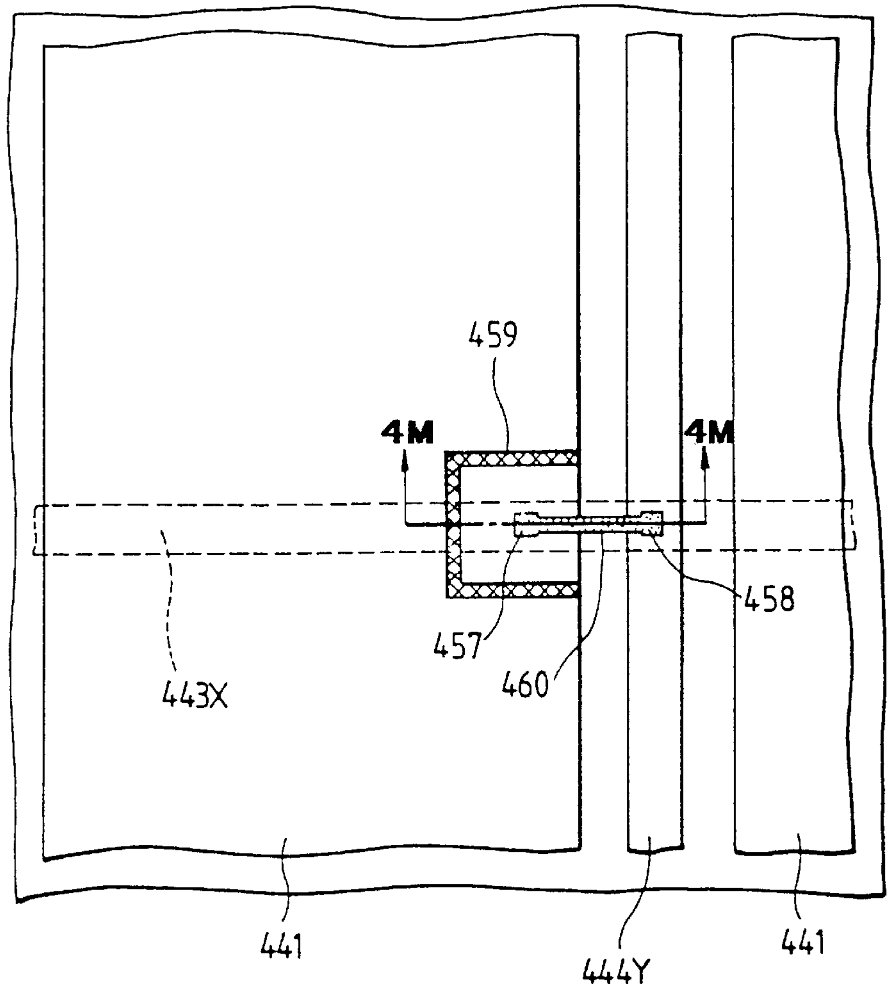

FIG. 4L is an enlarged top view of a part subjected to another correctional technique. Only points different from the correction in FIGS. 4J and 4K will be described below. Referring to FIG. 4L, numeral 459 indicates a U-shaped notch (formed by an FIB) which serves to prevent an Mo jumper wiring line 460 and the power source wiring line 441 from short-circuiting. Further, numerals 457 and 458 indicate Mo layers with which vertical holes formed by an FIB are filled up. The Mo jumper wiring line 460 is formed simultaneously with the Mo layers 457 and 458.

Figure 4M:
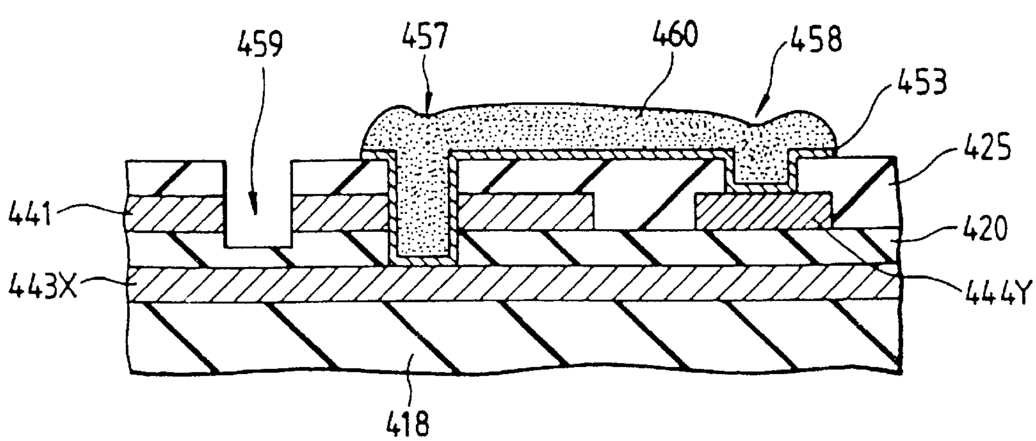

FIG. 4M is a sectional view taken along X—X in FIG. 4L, and various symbols shall not be repeatedly explained as they have already been described. This technique is effective particularly in a case where the spare wiring line 443X does not extend to directly under the spare wiring line 444Y, a case where the spare wiring line 443X is replaced with the ordinary wiring line Al-3, and so forth.

On this occasion, the molybdenum jumper wire 460 is formed and is used as a mask for sputtering and removing the entire unnecessary parts of the subbing Cr film, whereupon the short-circuiting preventive notch 459 is formed by the use of the FIB. Then, a favorable result is obtained without leaving the Cr film in the notch 459. That is, after the completion of a step in FIG. 4I(*d*) to be referred to later, the short-circuiting preventive notch 459 is formed by milling. More specifically, contact holes are previously formed by the FIB, the subbing Cr film is thereafter deposited, the holes are subsequently filled up so as to selectively form the jumper wire by the laser CVD, the unnecessary parts of the Cr film are removed using the jumper wire as the mask, and the notching operation is thereafter carried out.

Figure 4N:
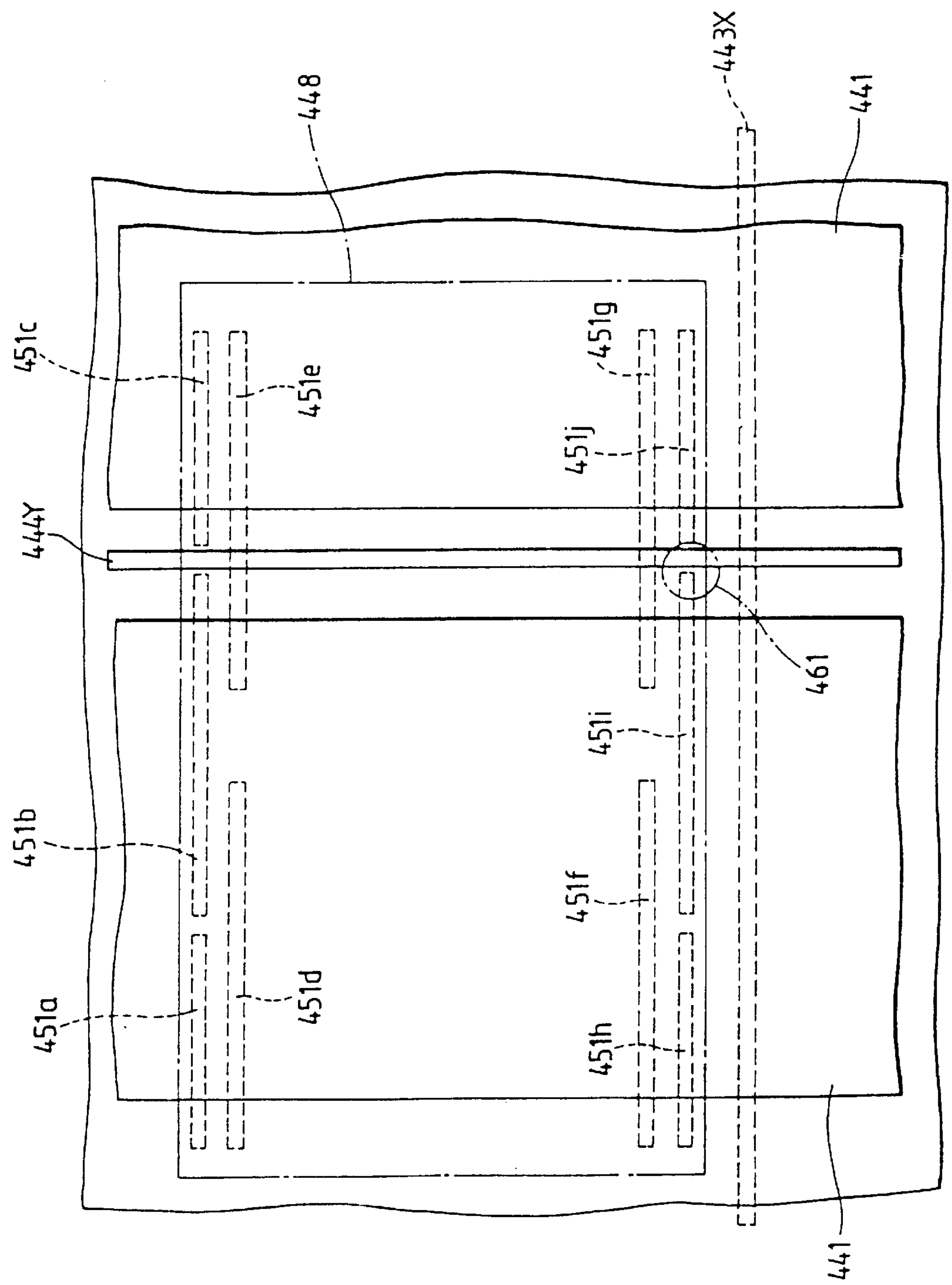
Figure 4O:
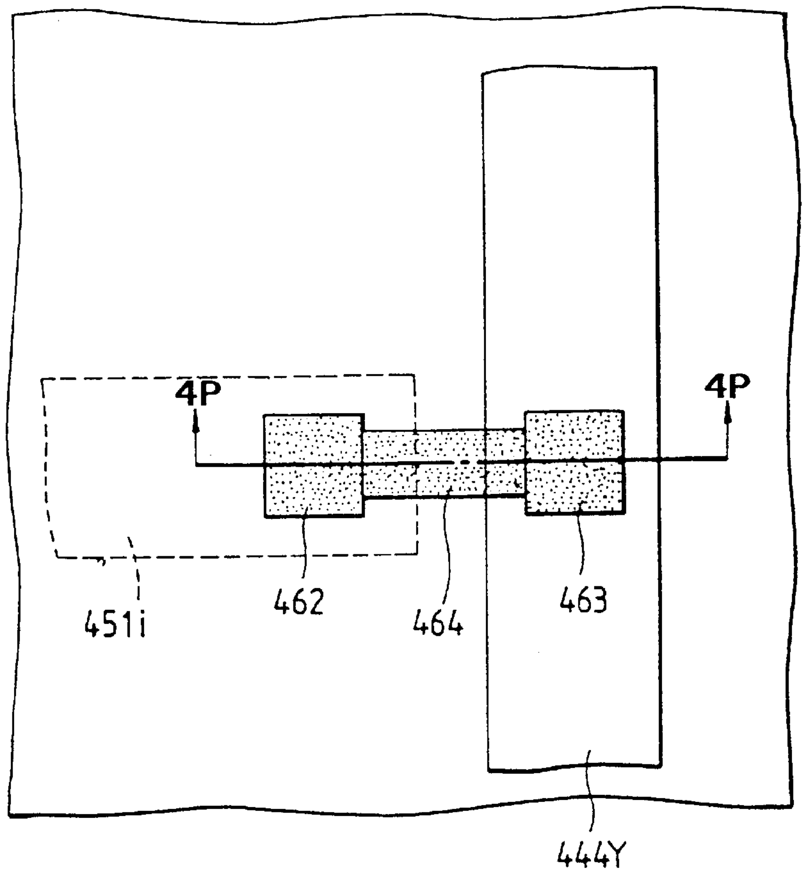
Figure 4P:
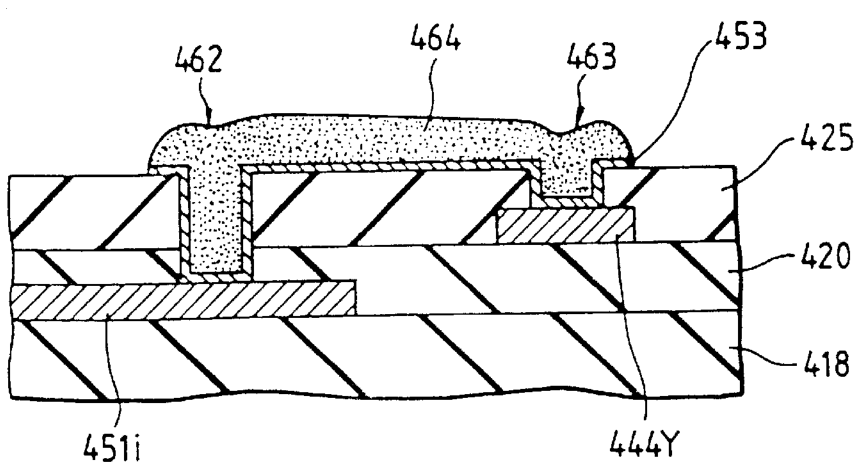

FIGS. 4N–4P are a plan view, an enlarged view of pertinent portions and a sectional view taken along X—X in FIG. 4O, respectively, showing another correctional technique, especially an example which employs the space gates. Referring to the figures, numeral 448 designates the space gate cell, and symbols 451*a*–451*j* denote the antenna wiring lines which are formed by the third-layer wiring Al-3 and which are respectively connected through the second-layer and first-layer wiring lines Al-2, Al-1 to any terminals of the elements $SG_1$, $SG_2$, $SR_1$ and $SR_2$ in FIG. 4D. Further, numerals 441 designate the broad power source wiring lines formed by the fourth-layer wiring Al-4, respectively, symbol 444Y denotes the spare wiring line AlS-4, symbol 443X denotes the spare wiring line AlS-3, and numeral 461 designates a part to-be-corrected. Besides, numerals 462 and 463 indicate Mo (molybdenum) layers with which vertical holes formed by an FIB are filled up by laser CVD, and numeral 464 an Mo jumper wiring line which is formed in continuation to the Mo layers 462 and 463 by laser scanning.

There will now be described a process for providing a hole by an FIB and forming a jumper wiring line by laser CVD.

FIGS. 4I(*a*)–4I(*d*) are sectional views of pertinent portions showing the flow of the process. As shown in FIG. 4I(*a*), the coordinates of an object to be corrected are determined on the basis of data stored beforehand, and a hole 452 is formed using an FIB (with the internal pressure of a processing chamber held at $1\times10^{-5}$ Pa). Subsequently, as shown in FIG. 4I(*b*), the exposed surfaces of an Al wiring line 421 and a final passivation film 425 are subjected to sputter etching in an Ar (argon) atmosphere (under 1 Pa), whereupon Cr (chromium) is deposited on the whole surface of the resultant structure to a thickness of about 100 Å by sputtering, thereby to form a Cr subbing film 453. Subsequently, as shown in FIG. 4I(*c*), a correctional wiring line of Mo (molybdenum) 454 having a thickness of about 0.3–1 μm and a width of about 3–15 μm is formed in the sublimation-phase atmosphere (gaseous phase) of molybdenum carbonyl ($Mo(CO)_6$) under about 10 Pa (by way of example, under the condition that a high-power Ar laser of continuous oscillation is operated at a laser output of 200 mW and a laser scanning rate of 1 mm/second). Thereafter, as shown in FIG. 4I(*d*), the unnecessary part 455 of the Cr film 453 is removed by sputtering in an Ar atmosphere and using the wiring line 454 as a mask.

As described above, in executing the wiring corrections of the correctional patterns in FIGS. 4E–4H, the techniques illustrated in FIGS. 4J–4P are combined with one another, whereby the wiring lines on the chip after the completion of the final passivation are corrected. After the end of the corrections or substantially simultaneously therewith, the correctional data etc. are marked at the position 449 in FIG. 4B by, for example, the deposition of a metal film based on laser CVD (the marking is simultaneously effected in the correcting apparatus) or an FIB or cutting away the wiring layers Al-3 and Al-4 and the Mo film. For the marking, it is possible to use letters, numerals and suitable symbols and also various recognizing codes for computers, including bar codes etc. Besides, in a case where complicated wiring or high density is formed in the region 449, a diffraction grating pattern obtained by cutting away the wiring layer Al-4 with a laser or an FIB or a code based on a similar pattern formed by Mo laser CVD is effective.

Figure 4Q:
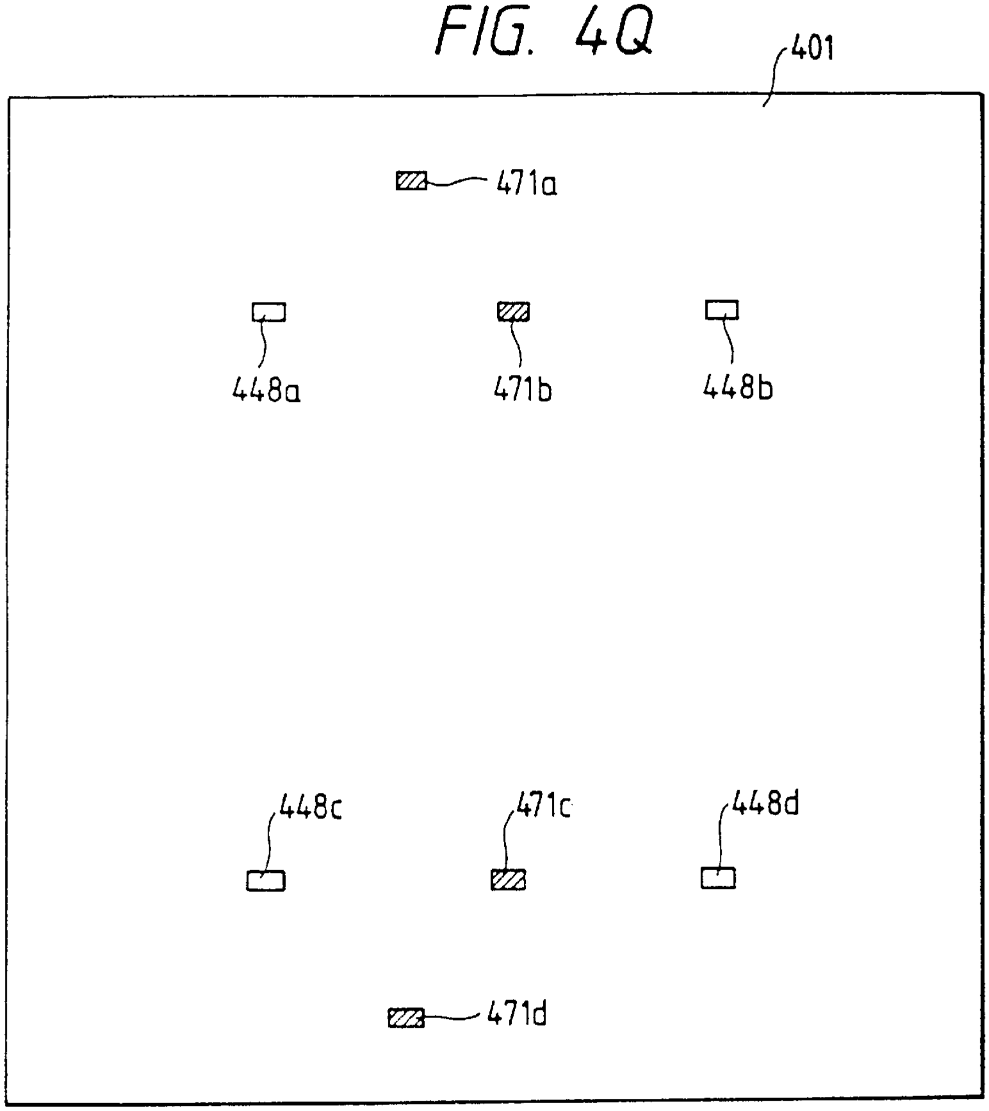
FIG. 4Q is a top layout plan view of the chip of a spare gate (flip-flop which is abbreviated to FF) cell in a modification of Embodiment 4 of the first aspect of the present invention.
Figure 4S:
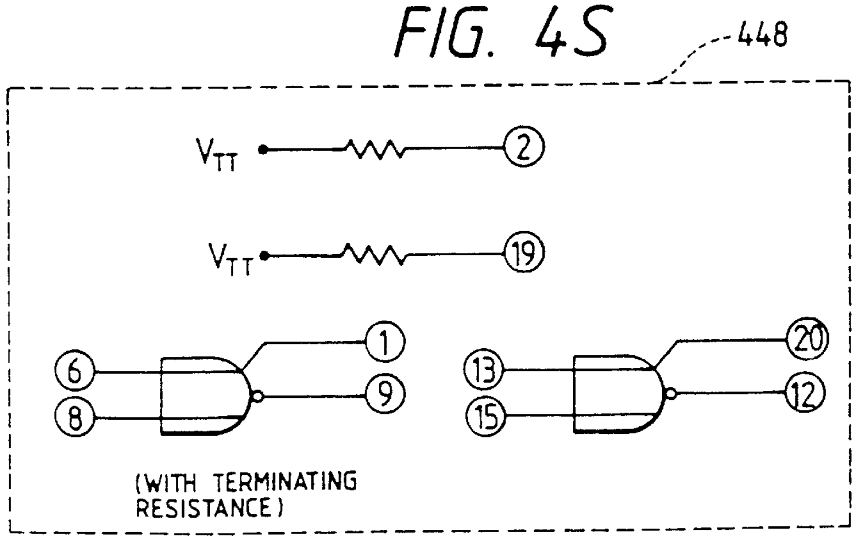
FIG. 4S is a model circuit diagram showing the constructions of elements within the spare gate cell.
Figure 4R:
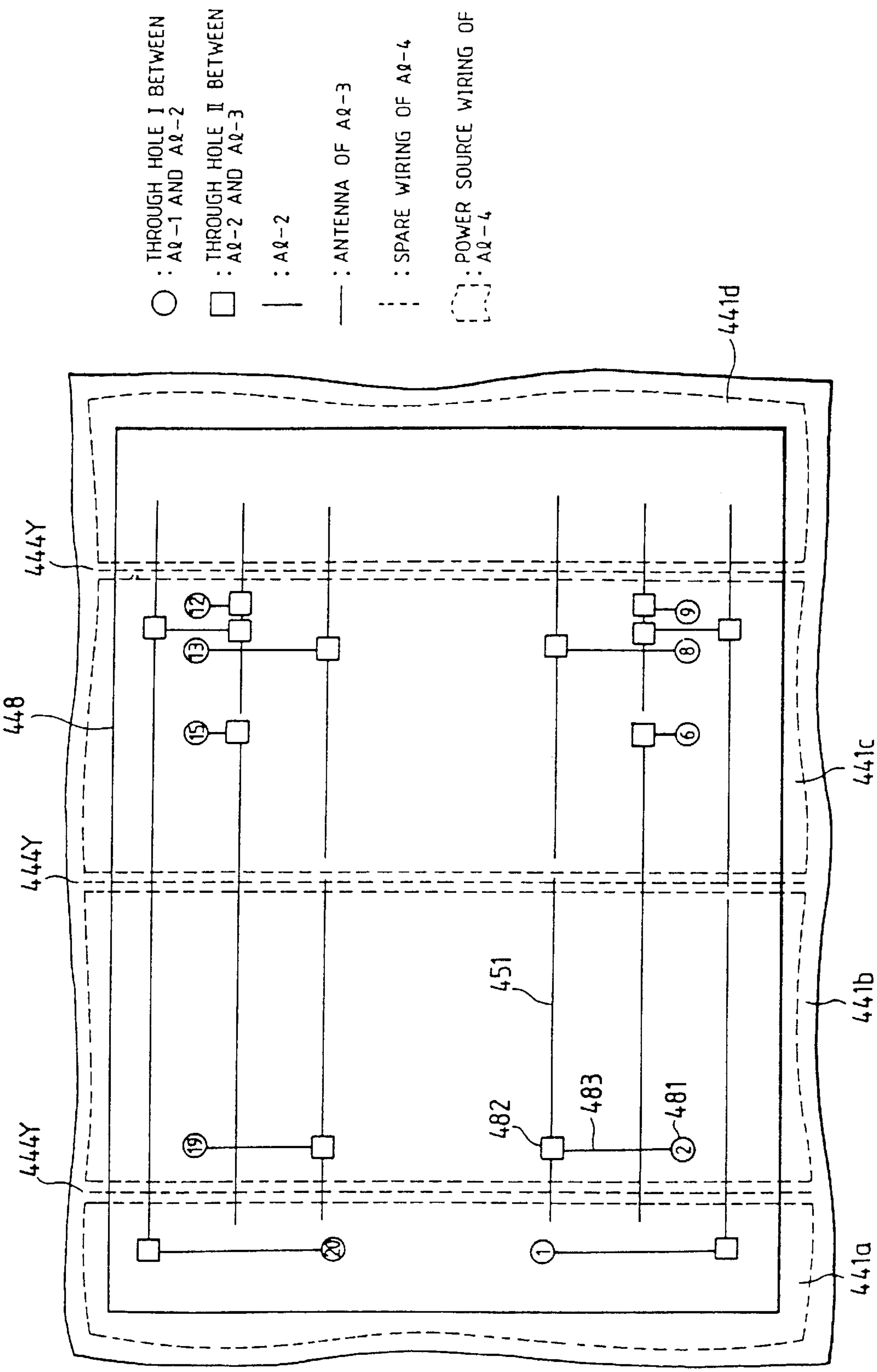
FIG. 4R is a layout diagram of the wiring of the spare gate cell.

Further, a modification of the spare cell will be described. FIG. 4Q is a layout diagram of spare gate (or spare flip-flops which shall be abbreviated to "spare FFs" below) cells being the modification of the spare gate cells in FIG. 4B; FIG. 4R is a layout diagram of the practicable wiring of the spare gate cell, and FIG. 4S is a model circuit diagram of elements in the spare gate cell. Referring to these figures, symbols 448*a*–448*d* denote the spare gate cells, and symbols 471*a*–471*d* spare FFs, namely, spare latches. Numeral 401 designates an Si (silicon) semiconductor chip. Vertical broken lines (single-line symbols) indicate spare wiring lines 444Y formed by fourth-layer wiring Al-4, and stripe regions 441*a*–441*d* enclosed with broken lines are broad Al power source wiring lines formed by the fourth-layer wiring Al-4, respectively. Circles with, for example, numeral 481 affixed thereto denote through holes I provided between wiring layers Al-1 and Al-2, while squares with, for example, numeral 482 affixed thereto denote through holes II provided between wiring layers Al-2 and Al-3. Vertical solid lines with, for example, numeral 483 affixed thereto indicate interconnection wiring lines formed by the second-layer wiring Al-2 in order to couple the through holes I and II, while lateral solid lines with, for example, numeral 451 affixed thereto indicate antenna wiring lines formed by the third-layer wiring Al-3 so as to extend from the through holes II. The numerals of the through holes I correspond to those of terminals in FIG. 4S. Incidentally, since each of the spare latch cells has substantially the same wiring layout as described above, the detailed description thereof shall be omitted.

Thus, the latches, gates, resistors etc. can be utilized as required without an operation for the prevention of short-circuiting ascribable to notching. That is, the intersection point between any of the spare wiring lines 444Y and the antenna of the element of the spare cell desired to be led out is provided with a hole by an FIB, whereby a desired space device can be readily raised to the level of the fourth-layer wiring Al-4.

Embodiment 5

There will be described a technique for intersecting jumper wiring lines (Mo wiring lines) as is used in the wiring correction process.

Figure 5A:
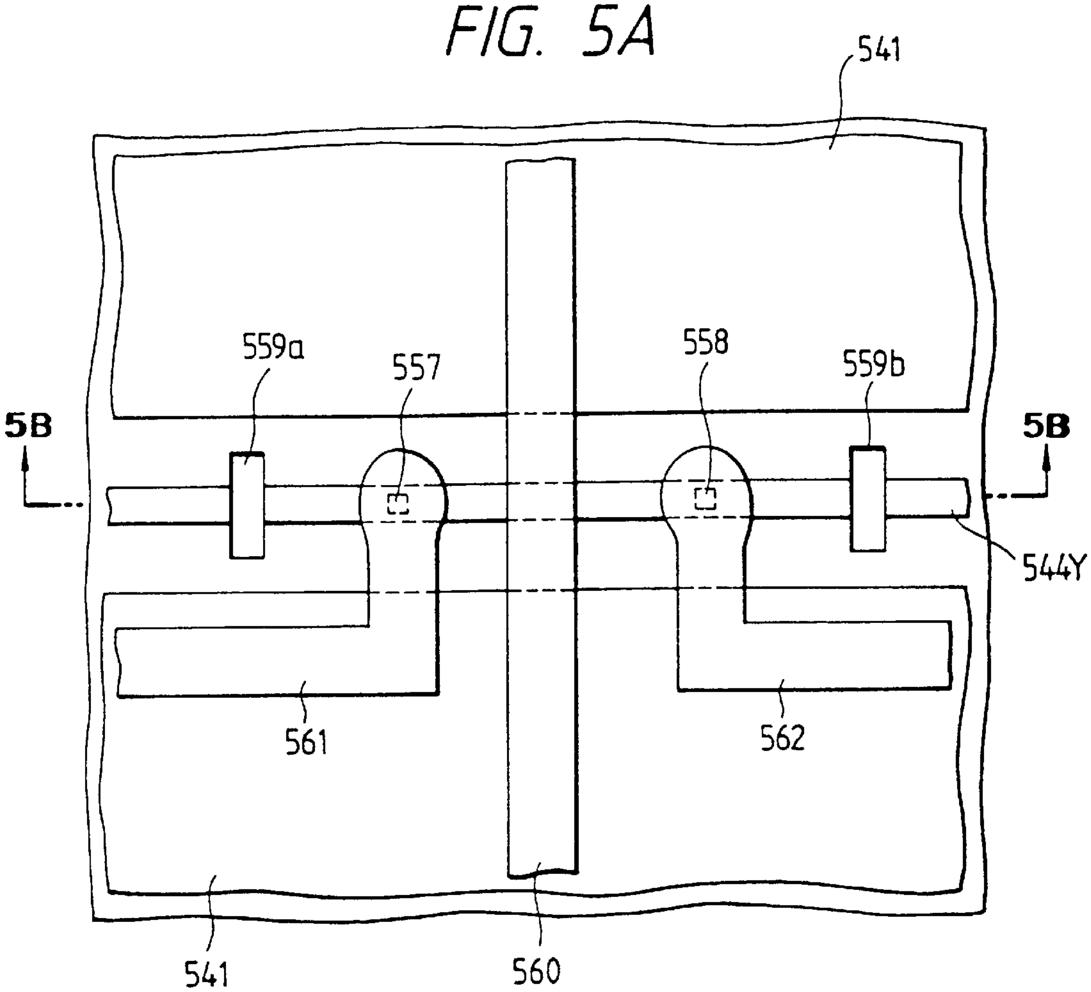
FIG. 5A is a top plan view showing a cross-under technique in Embodiment 5 of the first aspect of the present invention.
Figure 5B:
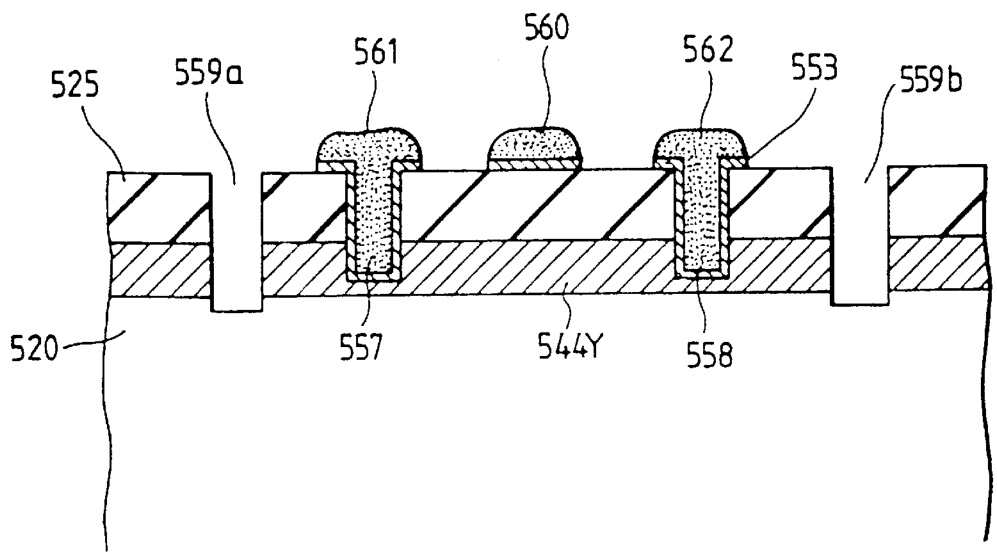
FIG. 5B is a sectional view taken along cutting-plane line A—A in FIG. 5A.

FIG. 5A is a top view showing the intersection of jumper wiring lines, while FIG. 5B is a schematic sectional view taken along A—A in FIG. 5A. Referring to the figures, numerals 541 designate broad power source Al wiring lines (fourth-layer Al) extending in the direction of a Y-axis. Symbol 544Y denotes a spare wiring line (fourth-layer Al), and symbols 559*a* and 559*b* denote notches which are formed by the use of an FIB and which serve to isolate one part of the spare wiring line 544Y from the other parts. Numeral 560 indicates a first Mo wiring line which runs in the direction of an X-axis, and numerals 561 and 562 indicate second Mo wiring lines which run in the Y-axial direction and which is to intersect the first Mo wiring line 560. Numeral 520 indicates an inter-layer insulator film interposed between third-layer Al wiring and the fourth-layer Al wiring, numeral 525 a final passivation film, and numeral 553 a subbing Cr layer for the Mo wiring. Through holes 557 and 558 serve to connect the respective second Mo wiring lines 561 and 562 with the fourth-layer spare Al wiring line 544Y.

In this manner, when the jumper lines are to be intersected each other on the final passivation film, the jumper lines extending in the Y-axial direction are crossed-under through the fourth-layer spare wiring line. In this case, when a floating spare wiring line of suitable length is existent, it may well be used as it is. Moreover, in such a case where the spare wiring line is unnecessarily long or where it is to be utilized for any other purpose, the notches or notch are/is formed on both or one of the sides of the spare wiring line as shown in FIG. 5A by the process explained before.

Embodiment 6

This embodiment concerns a modification of the spare wiring layout illustrated before, for use in FIB and laser CVD wiring corrections.

Figure 6:
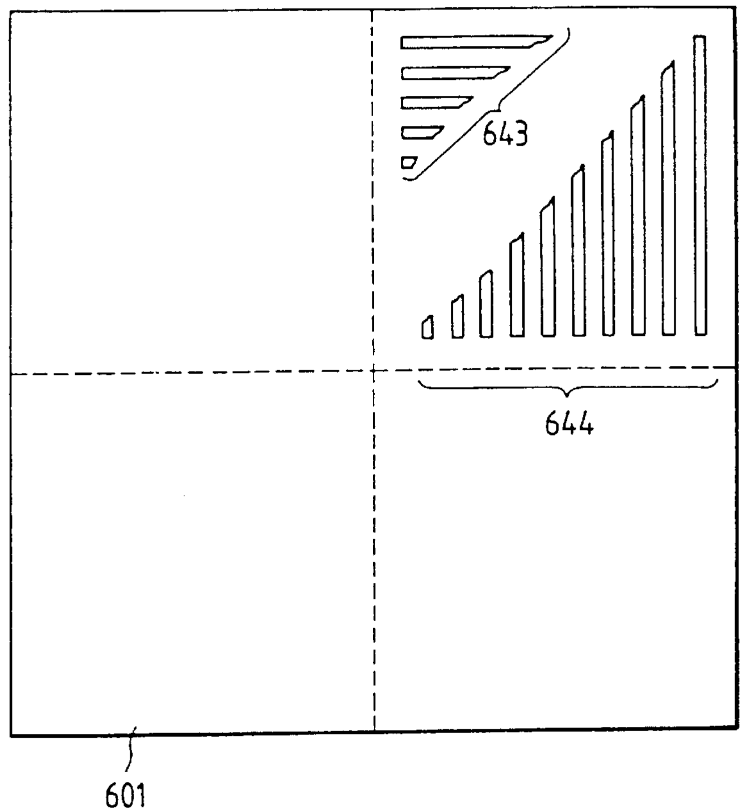
FIG. 6 is a schematic top plan view of a chip showing a spare wiring quartering system in Embodiment 6 of the first aspect of the present invention.

FIG. 6 is a top view of a semiconductor chip in the present invention, schematically showing only fourth-layer spare wiring lines 644 and third-layer spare wiring lines 643. In the figure, fourth-layer Al power source wiring lines which run in parallel with the fourth-layer Al spare wiring lines 644 are omitted as they have been illustrated in the preceding embodiments.

In this embodiment, the chip 601 is divided in four, and the spare wiring lines are laid in each division so as to extend substantially over the full lateral and vertical lengths of the corresponding division. Thus, stray capacitances are reduced, and the utility of the spare wiring is enhanced. That is, some or all of notches for isolation are dispensed with. Incidentally, the details of these wiring lines have been expelled in the foregoing embodiments.

The power source wiring lines (fourth-layer Al) are extended substantially over the full length of the chip without being divided. One spare wiring line (fourth-layer Al) may be laid between the adjacent ones of all the power source wiring lines, or may well be laid every third–fifth power source wiring line as is required. Besides, the way of dividing the spare wiring lines is not restricted to the division by two, but spare wiring lines extended over the full lengths of the chip, divided by two and divided by three may well be combined.

Embodiment 7

There will be described an FIB processing technique which is applied to the connection between an Al wiring line of any lower layer, for example, the third layer and a jumper line while preventing short-circuiting ascribable to the notching of a broad power source wiring line as described before. Hereinbelow, this technique shall be called "pre-milling".

As explained in the foregoing embodiments, in a case where the third-layer Al wiring line directly under the fourth layer is to be led out onto the fourth-layer broad power source wiring line by the Mo jumper line (formed by the combination of the provision of holes by an FIB and the deposition of Mo by laser CVD), a notch needs to be provided around the connecting through hole lest the Mo wiring line and the fourth-layer Al wiring line should short-circuit in the through-hole. Since that upper surface of the chip which is not flat is processed for forming the notch, the technique to be described below is required. Now, the technique will be concretely explained by taking the layout in FIG. 4L as an example.

Figure 7A:
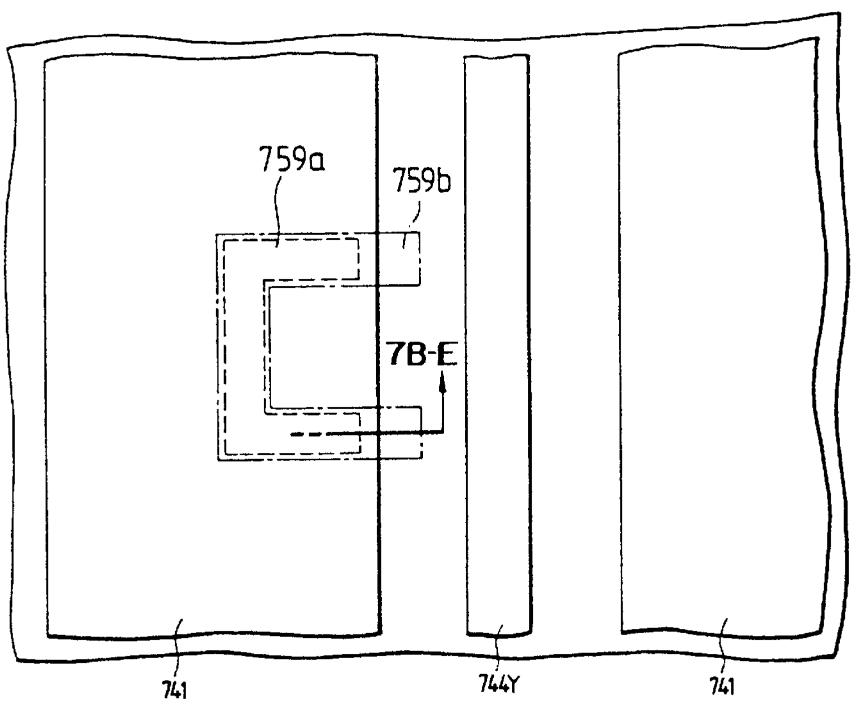
FIG. 7A is a top plan view of a chip showing a cut-away part in Embodiment 7 of the first aspect of the present invention.
Figure 7B:
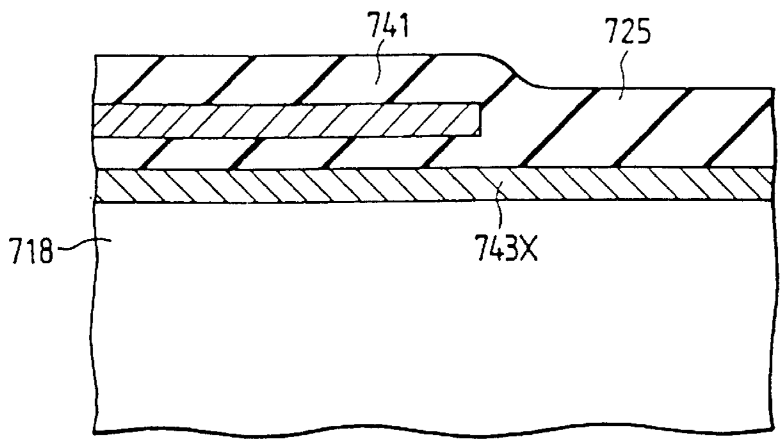
FIGS. 7B–7E are sectional flow diagrams showing a pre-milling process in the embodiment.

FIG. 7A is a top view of a chip showing a notch forming region. Referring to the figure, numerals 741 designate fourth-layer Al broad power source wiring lines, between which a fourth-layer Al spare wiring line 744Y is laid. Symbol 759*a* denotes a pre-milling region, and symbol 759*b* a main milling region.

FIGS. 7B–7E are sectional views of part A—A in FIG. 7A, showing a process flow for forming a flattened notch. Referring to these figures, numeral 741 designates the part of the fourth-layer power source wiring line around a region where a through hole is to be formed. Shown at numeral 725 is a final passivation and inter-layer insulation film. A third-layer Al wiring line 743X passes directly under the notch. An inter-layer insulator film 718 is interposed between third-layer and second-layer Al wiring lines. As stated before, symbol 759*a* denotes the pre-milling region, and symbol 759*b* the main milling region.

Figure 7C:
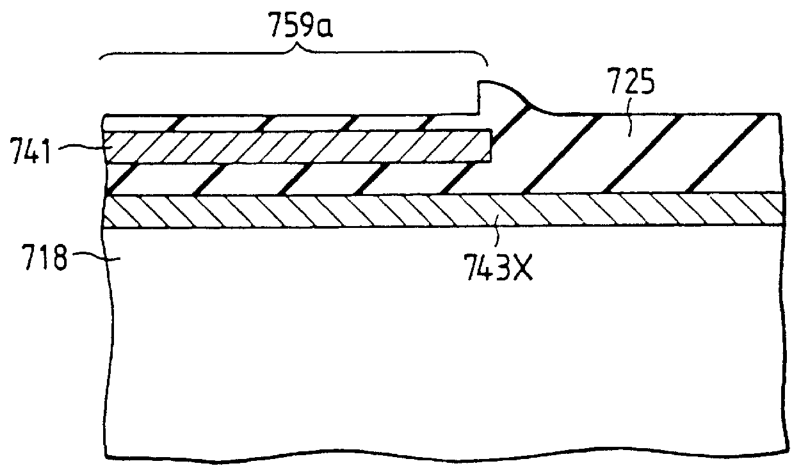
Figure 7D:
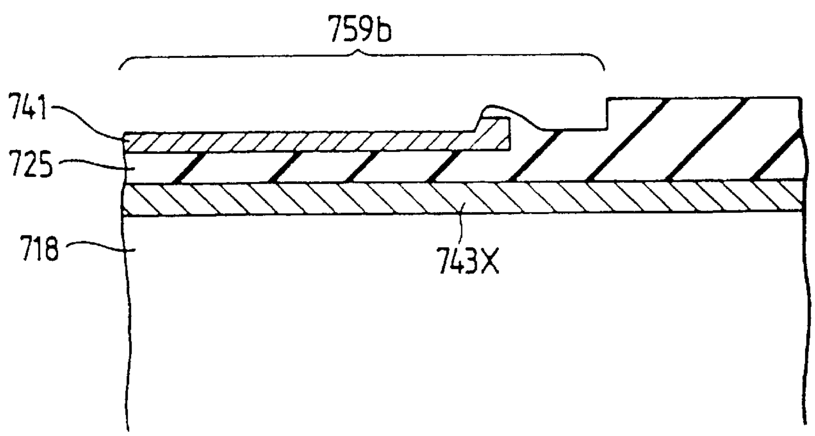
Figure 7E:
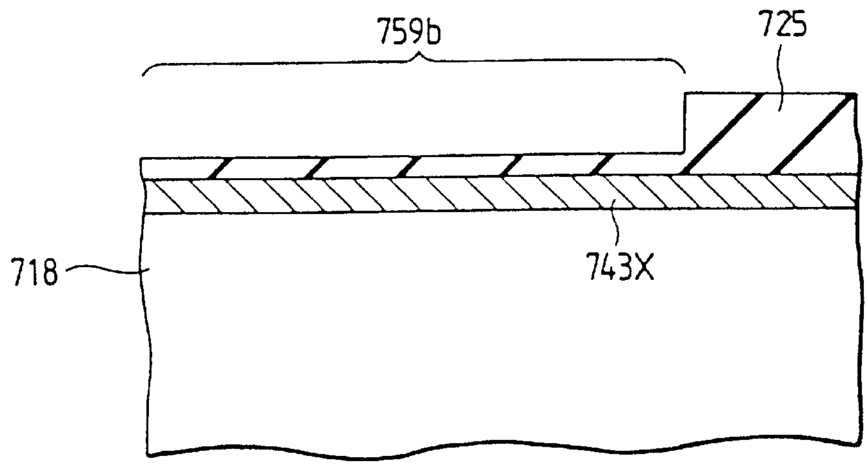

The process will be described on the basis of these figures. In order to form the notch in a part corresponding to the main milling region, the pre-milling region 759*a* is first milled in correspondence with the thickness of the underlying Al wiring line 741 as shown in FIG. 7C, by scanning an FIB. Subsequently, the whole area of the main milling region 759*b* is repeatedly scanned by the FIB. Thus, owing to spontaneous flattening based on the variation (chiefly in angle) of a topographical structure, the notch which is flat over its full length is formed as shown in FIG. 7E.

In this way, it is possible to prevent the underlying Al wiring (mainly, the third layer) from being exposed or cut carelessly.

Figure 7F:
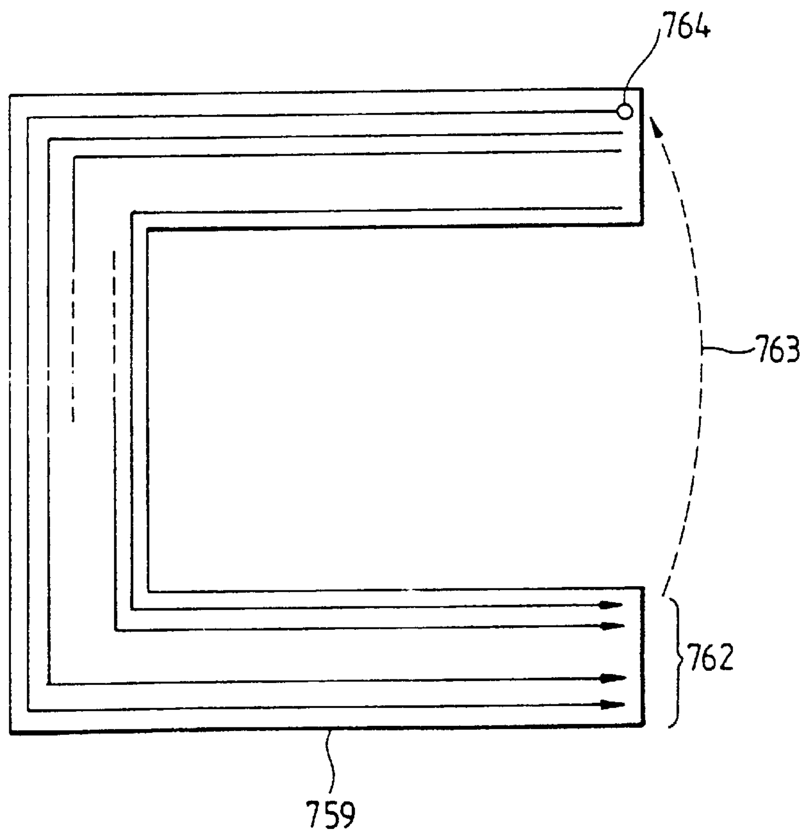
FIG. 7F is a top plan view of a milling process showing the actual operation of a processing FIB.

Here will be described a practicable scanning method for the milling FIB. FIG. 7F is a top view of a scanning region concretely showing the situation of the scanning of the FIB for processing the notch 759 (regions 759*a* and 759*b*).

In the figure, arrows 762 in solid lines indicate the sequence of raster scans. In this regard, since an ordinary notch is about 2 $\mu$m wide, it can be formed in such a way that the scans are repeated about 10–20 times along a single path (with a beam having a diameter of 2 $\mu$m) including a return path 763 (numeral 764 designates a start point), thereby to dig the insulator film 725 about 6 $\mu$m.

Embodiment 8

There will be described a technique according to which, in a process for correcting wiring with an FIB, a third-layer Al interconnection wiring line directly under a fourth-layer broad Al power source wiring line is cut without short-circuiting the upper and lower wiring lines or without exposing or cutting the lower wiring line undesirably. Incidentally, since the structure, materials, specification, intended uses, etc. of a device concerned are the same as in the foregoing, they shall not be repeated here.

Figure 8A:
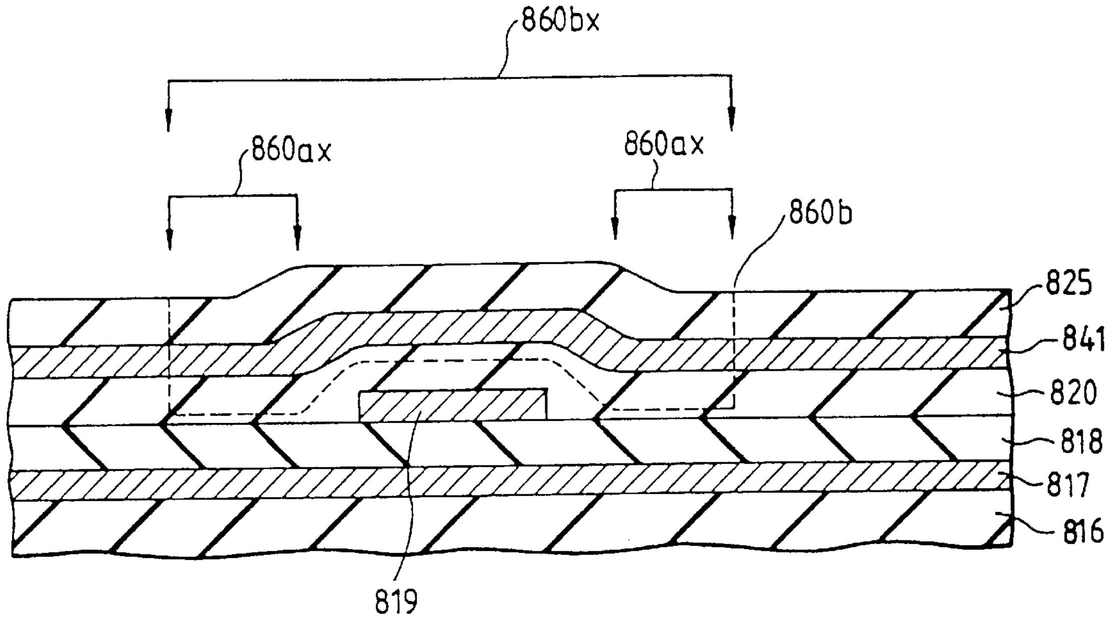
FIGS. 8A–8E are sectional flow diagrams showing the flow of the lower layer Al-cutting process of two-stage milling in Embodiment 8 of the first aspect of the present invention.
Figure 8B:
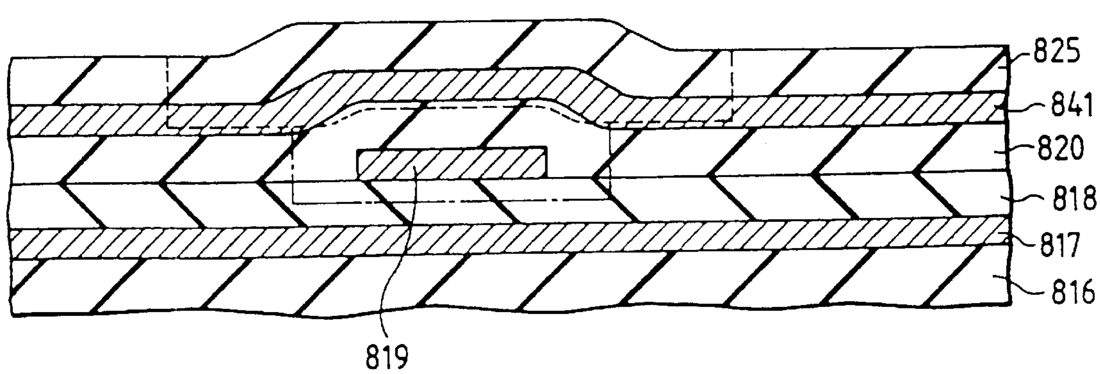

By way of example, let's consider a case where an interconnection wiring line 819 of third-layer Al wiring Al-3 under a broad wiring line (power source) 841 of fourth-layer Al wiring Al-4 as illustrated in FIG. 8B is cut by the use of an FIB. In this case, in order to prevent short-circuiting ascribable to a film redeposited on a milled wall, two stages of milling are carried out as indicated by a broken line and a dot-and-dash line in the figure. Even with this measure, however, the parts of the fourth-layer wiring Al-4 remaining in stage parts 891 as shown in FIG. 8D might short-circuit with the part of the third-layer wiring Al-3 exposed to the front of the chip of the device (the exposed part is not shown), through the redeposited metal 892 at the front surface of a lower hole, depending upon the undulation or nonuniform thickness of the Al wiring or the like. The technique to be described below is effective for preventing this drawback.

Figure 8C:
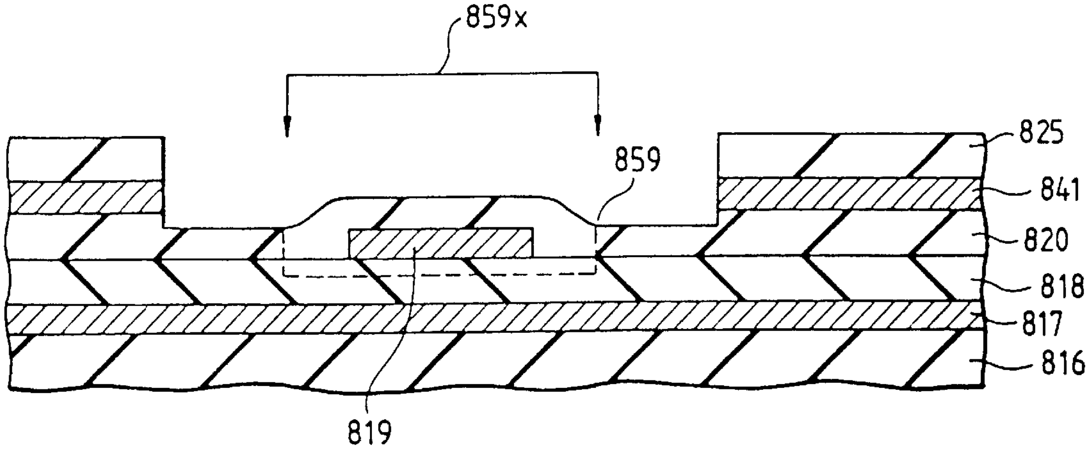
Figure 8D:
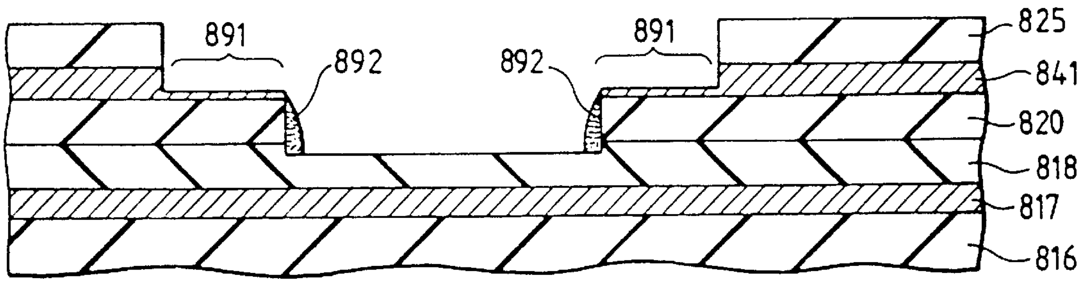
Figure 8E:
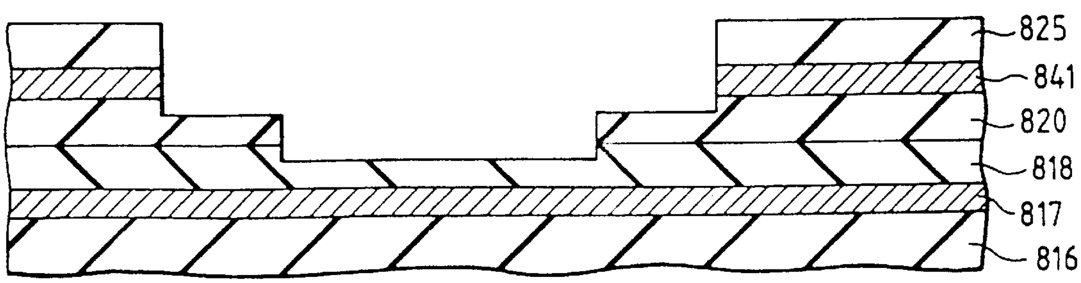
Figure 8F:
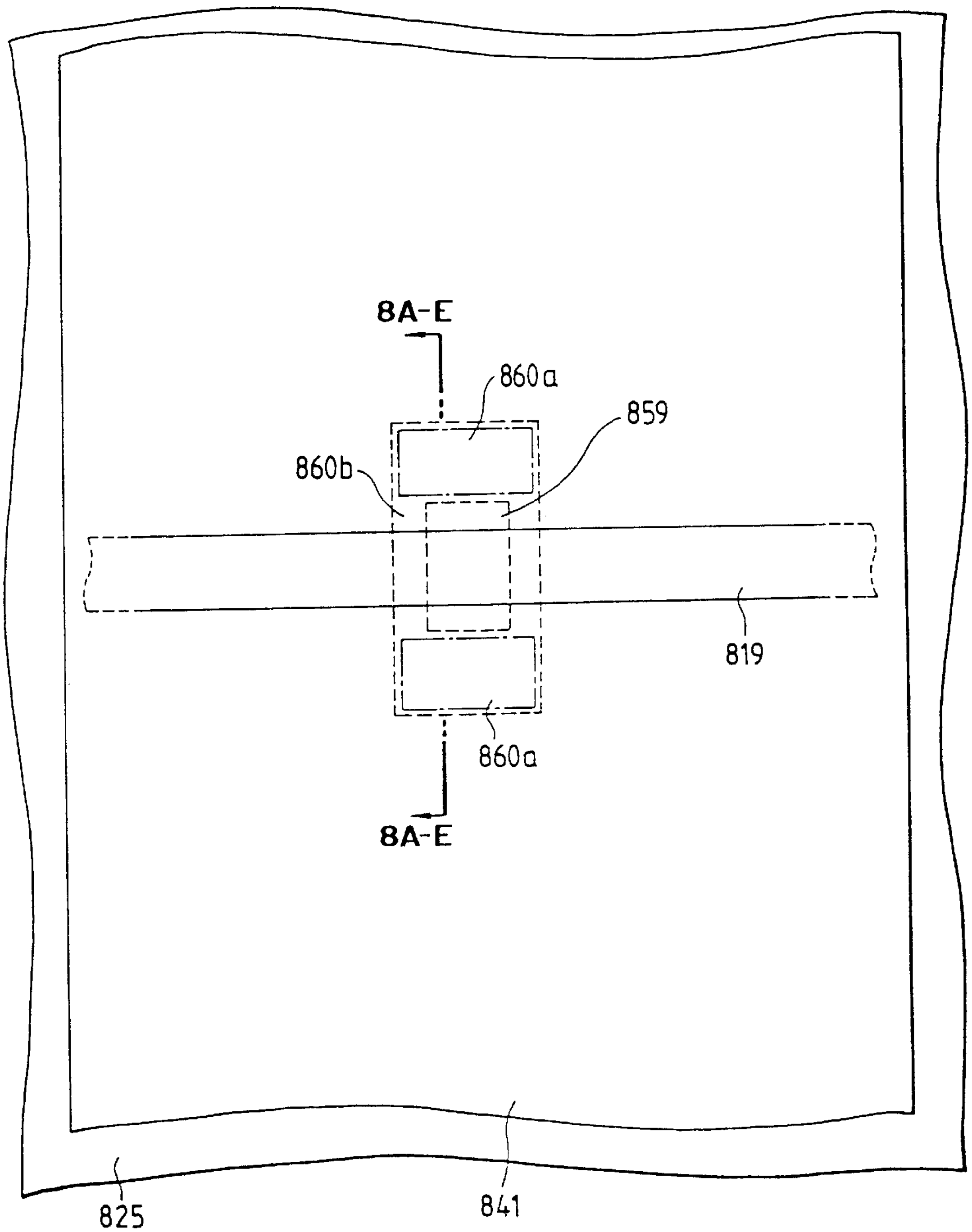
FIG. 8F is a top plan view of parts corresponding to the two-stage milling.

FIGS. 8A, 8C and 8E are sectional flow diagrams showing the process for cutting the third-layer Al interconnection wiring line. FIG. 8F is a top view of the chip showing a processing region in the cutting process. Referring to these figures, numeral 825 designates a final passivation film, under which the fourth-layer broad Al power source wiring line 841 runs in the direction of a Y-axis. Numeral 820 designates a fourth inter-layer insulator film, in which the third-layer Al interconnection wiring line 819 to be cut runs in the direction of an X-axis by way of example. Numeral 818 indicates a third inter-layer insulator film, numeral 817 a second-layer Al wiring line, and numeral 816 a second inter-layer insulator film. Symbols 860*a* denote peripheral milling parts in the operation of digging the upper surface of the chip into the shape of a tableland (hereinbelow, termed "angular milling") at the first step of the two-stage milling, while symbol 860*b* denotes a main milling part in the angular milling. Shown at numeral 859 is a second-step milling region which corresponds to the second step of the two-stage milling process for cutting the lower-layer Al.

Figure 8G:
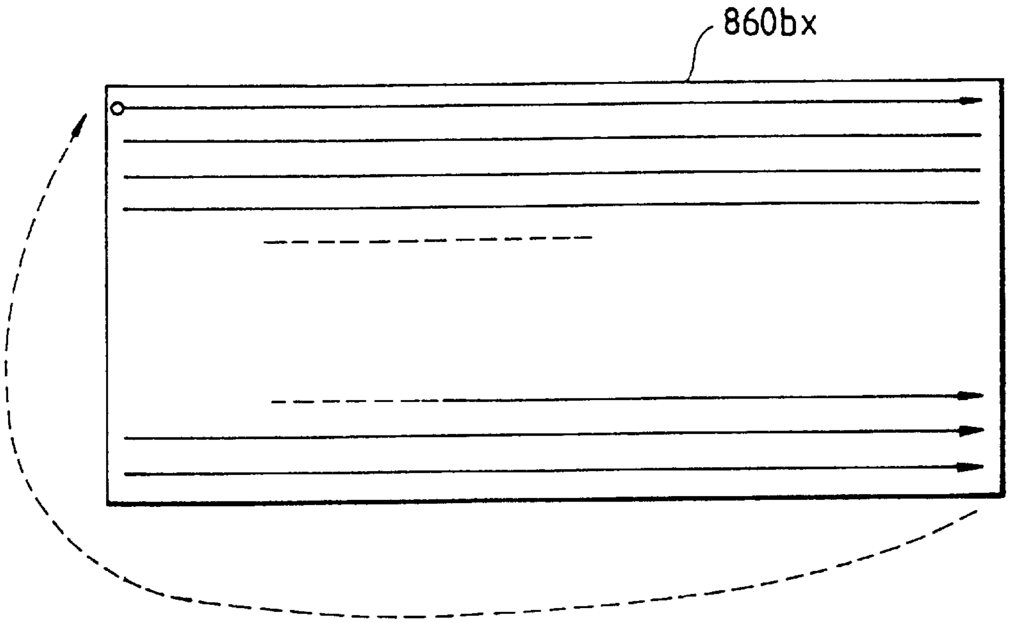
FIGS. 8G and 8H are top plan views of processed regions for explaining the actual operations of a processing FIB.
Figure 8H:
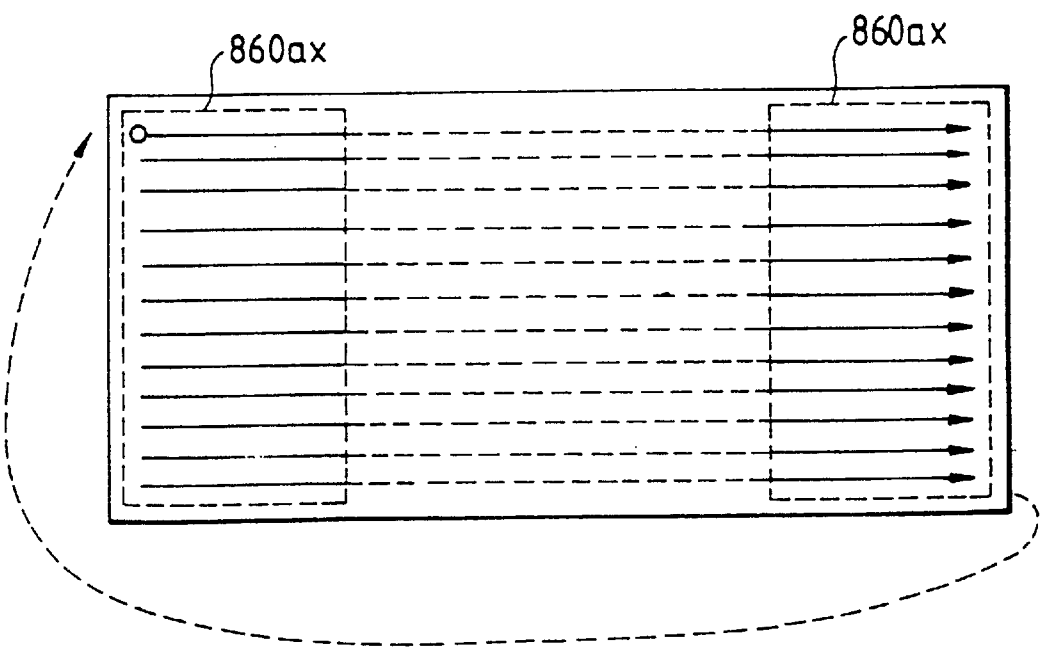

In FIG. 8G, symbol 860*bx* denotes an FIB scanning region which corresponds to the main milling region 860*b*, while in FIG. 8H, symbols 860*ax* denote FIB scanning regions which correspond to the peripheral milling regions 860*a*. In raster scan paths indicated by arrows in FIGS. 8G and 8H, solid-line parts signify that the amount of ion doping (dose) is a predetermined uniform value. On the other hand, broken-line parts signify that the amount of doping is "0" (null). The operation of smearing up the desired region with the beam one time in this manner shall hereinafter be called "one frame".

Referring now to these figures, the milling process will be elucidated.

When, as indicated by a broken line 860*b* in FIG. 8A, the bottom of the milled hole is so shaped that the difference between the levels of the tableland part and peripheral flatland parts of the hole is set sufficiently great, the proportions of the fourth-layer wiring Al-4 to remain on the stage parts (891 in FIG. 8D) can be made small. Therefore, the peripheral scans as shown in FIG. 8H and the overall scans as shown in FIG. 8G are repeated 10–20 frames at a ratio of 1:5 or so. Then, the chip surface can be processed into a shape as shown in FIG. 8C, at a high probability.

Subsequently, as illustrated in FIG. 8C, an ion beam doping area 859*x* corresponding to the lower hole processing region 859 is entirely and uniformly irradiated with the ion beam (by repeating raster scans as in the foregoing), whereby the interconnection wiring line 819 formed by the third-layer wiring Al-3 can be cut as shown in FIG. 8E.

Embodiment 9

Now, the fundamental strategy of on-chip wiring corrections will be described by taking the fourth-layer Al wiring of the foregoing ECL logic as an example.

Figure 9B:
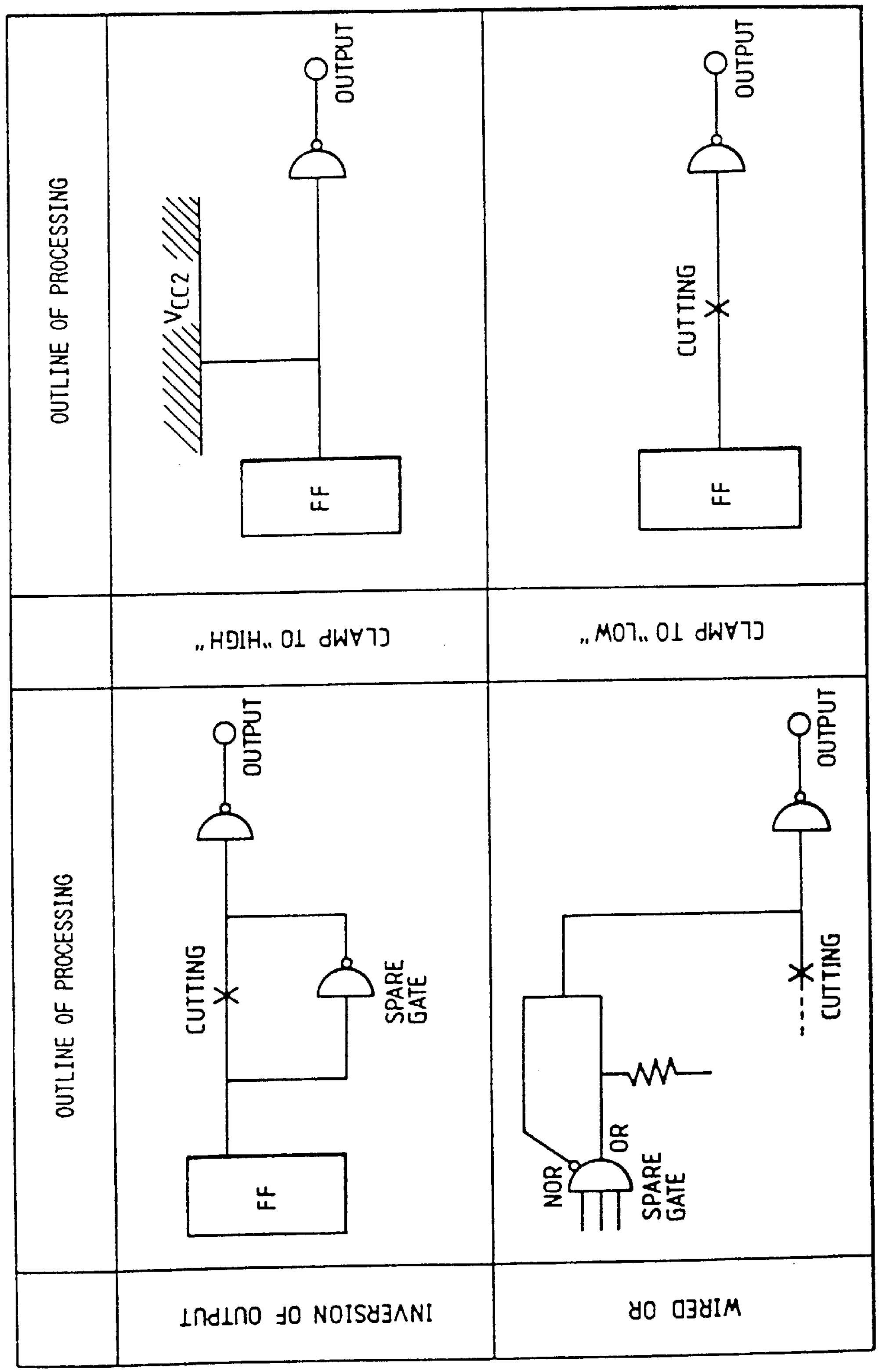
FIG. 9B is a diagram showing examples of the basic patterns of the corrections.

FIG. 9A tabulates the fundamental strategy of the on-chip wiring corrections. FIG. 9B exemplifies the basic patterns of the corrections. In FIG. 9B, each bold solid line indicates a correctional wiring line which is formed of an Mo jumper line or the like. By way of example, the "inversion of output" is processing in which, in order to invert the output of an FF, namely, flip-flop, an interconnection line is cut on the output side of the FF (with an FIB), and an inverter being a spare gate is connected to the input side of a succeeding gate by two jumper lines.

The fundamental strategy summarized in FIG. 9A is as follows:

"Policy 1" is that an interconnection line is cut in the space of Al-4 power source wiring as far as possible. This is intended to prevent the broad power source Al line and underlying Al wiring from short-circuiting due to redeposition. "Policy 2" is that, when the quality of the processing of the FIB is considered, cutting an Al-2 interconnection line lower than an Al-3 interconnection line is more advantageous than cutting the Al-3 interconnection line which is closer to the Al-4 wiring and is more liable to short-circuit. According to "Policy 3", in the case of cutting the Al-3 interconnection line, two-stage processing as in the foregoing will be necessitated in order to prevent the short-circuiting thereof with the second-layer wiring Al-2 or the fourth-layer wiring Al-4, and hence, the flat place of the underlying layer (subbing layer) of the Al-3 interconnection line needs to be selected.

"Policy 4" concerns connection, and has the content that, in order to dispense with the step of cutting away the Al-4 power source line as occupies the greater part of a processing period of time, lines are connected in the Al-4 power source line space as far as possible. This policy is further advantageous in that, since a spare wiring line is often laid in the power source line space, a jumper line need not be extended long. "Policy 5" is that, insofar as the policy 4 is observed, the short-circuiting with the Al-4 power source line is not apprehended, so the Mo jumper line or a through hole burying line is formed between the pertinent line and the Al-3 interconnection line as to which a hole is favorably filled up by Mo laser CVD.

"Policy 6" is that, when lines are inevitably connected under the Al-4 power source wiring, a place where a length to be cut away can be shortened to the utmost is selected. This is the second best policy in the case where the policy 4 or 5 cannot be conformed to.

According to "Policy 7", since the jumper line (wiring line of Mo formed by laser CVD) has a comparatively high resistivity of 20 Ω/mm, it is shortened as far as possible, or an Al spare wiring line having a low resistivity of 2 Ω/mm is positively utilized. Especially i a correctional pattern which takes wired OR, the resistance between a source and a spare terminating resistor needs to be lowered to the utmost.

Embodiment 10

Figure 10A:
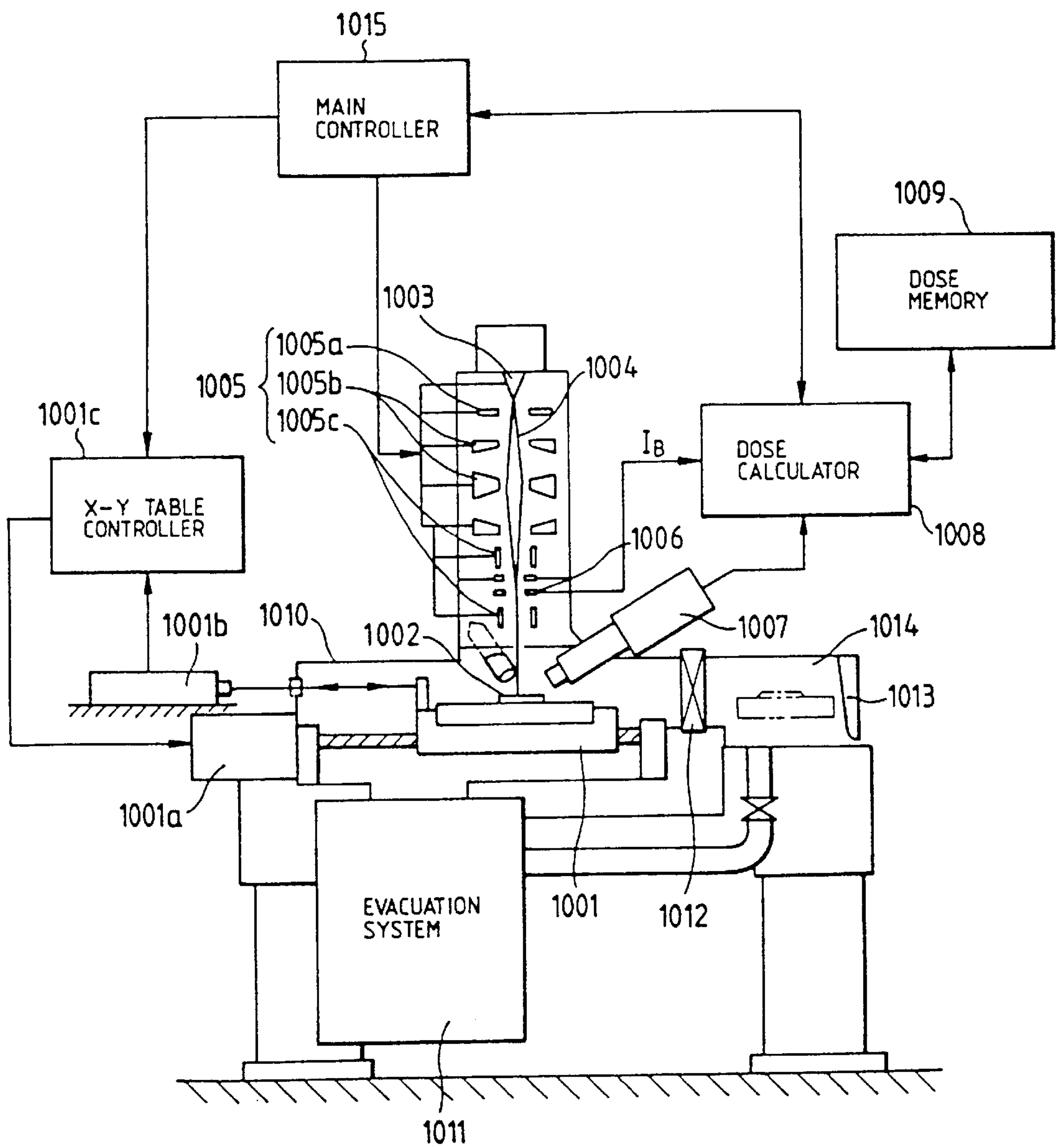
FIG. 10A is a schematic view, partly in blocks, showing pertinent portions of an ion beam processing apparatus which is Embodiment 10 of the first aspect of the present invention.
Figure 10B:
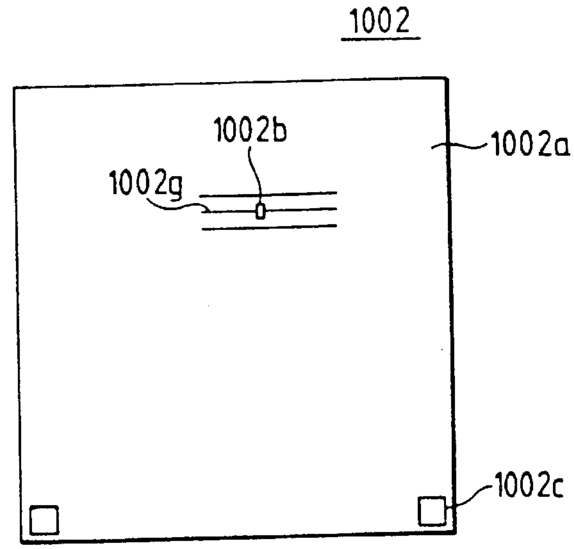
FIG. 10B is a play view of an example of the semiconductor device of the present invention to be subjected to ion beam processing.
Figure 10C:
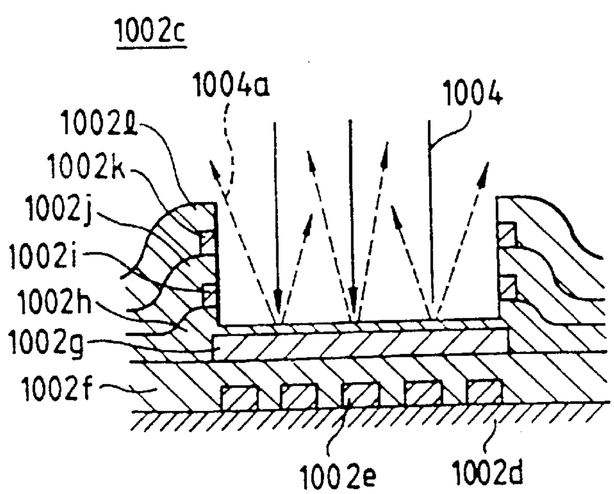
FIG. 10C is a sectional view of a part of the semiconductor device.
Figure 10D:
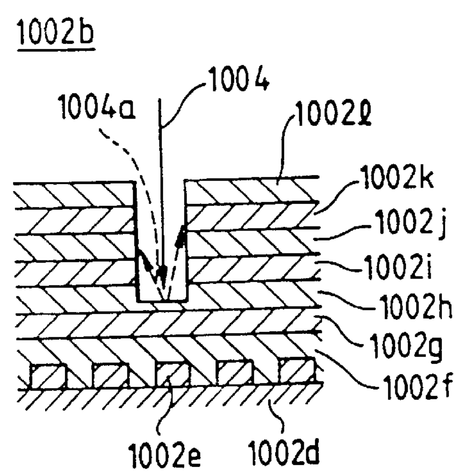
FIG. 10D is a sectional view of another part of the semiconductor device.

FIG. 10A is a block diagram showing pertinent portions of an ion beam processing apparatus for use in the performance of the present invention, FIG. 10B is a plan view of an example of the semiconductor device of the present invention to be subjected to ion beam processing; and FIGS. 10C and 10D are sectional views of parts of the semiconductor device.

On an X-Y table 1001 which is movable within a horizontal plane, a semiconductor wafer 1002 (workpiece) is detachably placed in a predetermined attitude, the semiconductor wafer being formed with a plurality of semiconductor devices 1002*a* in such a way that thin films made of predetermined substances are deposited by repeating photolithographic steps.

In this case, the semiconductor device 1002*a* formed in the semiconductor chip 1002 includes a trial processing system 1002*c* (first portion) along with an element region 1002*b* (second portion).

In the element region 1002*b* of the semiconductor device 1002*a*, there is formed a logic element having a multilayer wiring structure in which a first layer of aluminum wiring 1002*e*, an inter-layer insulator film 1002*f*, a second layer of aluminum wiring 1002*g*, an inter-layer insulator film 1002*h*, a third layer of aluminum wiring 1002*i*, an inter-layer insulator film 1002*j*, a fourth layer of aluminum wiring 1002*k*, and a final passivation film 1002*l* are stacked on an insulator substrate 1002*d*. On the other hand, the trial processing region 1002*c* is the same as the element region 1002*b* in the deposition structure of the substance in the depth direction thereof, the history of the formation of the deposition structure, and so forth.

The X-Y table 1001 is constructed so as to be driven through a servometer 1001*a* and to have its displacement detected by a laser interferometer 1001*b*. The displacement can be precisely controlled in a closed loop by an X-Y table controller 1001*c*.

An ion source 1003 facing down is provided over the X-Y table 1001, and an ion beam 1004 formed of the ions of, for example, gallium (Ga) is radiated toward the semiconductor wafer 1002 placed on the X-Y table 1001.

Along the path of the ion beam 1004 extending from the ion source 1003 to the semiconductor chip 1002, there is disposed on ion-beam optical system 1005 which includes an extraction electrode 1005*a*, converging lenses 1005*b*, electrostatic deflection lenses 1005*c*, etc., and which functions, e. g., to accelerate, converge and select the ions constituting the ion beam 1004 and also to control the position of incidence of the ion beam 1004 on the semiconductor wafer 1002.

Further, ion beam current-detection means 1006 for detecting an ion beam current $I_B$ is provided in the path of the ion beam 1004.

In the vicinity of the X-Y table 1001 on which the semiconductor chip 1002 is placed, there is disposed detection means 1007 for detecting charged particles, such as secondary ions or secondary electrons, or emission spectra 1004*a* which are produced from the semiconductor chip 1002 during the incidence of the ion beam 1004. The detection means 1007 is connected to a dose calculator 1008 together with the ion beam current-detection means 1006 mentioned above.

The dose calculator 1008 measures the required periods of time of the processing steps of the respective layers constitutes the multilayer wiring structure of the semiconductor device 1002*a* formed in the semiconductor chip 1002, on the basis of, for example, the changes of the species of the secondary ions, the fluctuations of the amounts of the secondary electrons and the changes of the emission spectra from the semiconductor chip 1002 as detected through the detection means 1007, and it also integrates the ion beam current $I_B$ in accordance with the individual required periods of time, thereby to calculate doses which are needed for processing the unit areas of the respective layers constituting the multilayer wiring structure of the semiconductor device 1002*a*. The calculated doses are stored in a dose memory 1009.

The X-Y table 1001, ion source 1003, ion-beam optical system 1005, ion beam current-detection means 1006, detection means 1007, etc. are accommodated within a vacuum vessel 1010.

Evacuation means 1011 which is constructed by, for example, joining predetermined vacuum pumps etc. in multistage fashion is connected to the vacuum vessel 1010, the interior of which can thus be evacuated to a desired degree of vacuum.

Further, a preliminary evacuation chamber 1014 furnished with an outer door 1013 is connected to the vacuum vessel 1010 through a gate valve 1012. Thus, the semiconductor chip 1002 placed or to be placed on the X-Y table 1001 can be taken out or in without spoiling the degree of vacuum of the interior of the vacuum vessel 1010.

In addition, the X-Y table controller 1001*c*, ion-beam optical system 1005, dose calculator 1008, evacuation means 1011, etc. are generally controlled by a main controller 1015 which includes a control computer etc.

Now, the operation of this embodiment will be described.

First, the X-Y table 1001 is properly moved, whereby the trial processing region 1002*c* of the semiconductor device 1002*a* formed in the semiconductor chip 1002 is positioned directly under the ion source 1003.

Subsequently, the ion beam 1004 is projected, thereby to start the operation of processing the trial processing region 1002*c* in the area $A_0$ [$\mu m^2$] of a processing plane.

This area $A_0$ is set sufficiently large relative to a required processing depth in order that the aspect ratio of a recess in the processed portion may become small, in other words, that the charged particles or emission spectra 1004*a* appearing from the processing portion may be sufficiently detected by the detection means 1007.

On this occasion, the dose calculator 1008 measures the periods of time $t_i$ (i=1, 2, 3, . . . ) [sec] respectively required for processing the final passivation film 1002*l*, fourth aluminum wiring layer 1002*k*, inter-layer insulator film 1002*j*, . . . , in accordance with the times at which the species of the secondary ions of the charged particles or emission spectra 1004*a* detected through the detection means 1007 change-over, the intensities of the secondary electrons, the times at which the emission spectra charge, or the like. Simultaneously, it measures the ion beam currents $I_B$ [nA] through the ion beam current-detection means 1006.

Here, letting $K_i$ [$\mu m^2.sec^{-1}.nA^{-1}$] denote the sputtering rate of the substance forming each layer, a processed depth $Z_i$ [$\mu$m] at the processing time $t_i$ is given by:

$$Z_i = K_i A_0^{-1} \int_0^{t_i} I_B \, dt$$

Accordingly, the dose $D_i$ [$nA.sec.um^{-2}$] which is needed for processing the unit area of each layer is graphed by:

$$D_i = Z_i / K_i$$
$$= 1 / A_0^{-1} \int_0^{t_i} I_B \, dt$$

That is, the dose calculator 1008 computes the doses $D_i=Z_i/K_i$ required for the processing of the unit areas of the respective layers, on the basis of the processing periods of time $t_i$ expended on the processing of the individual layers and the ion beam currents $I_B$ during the processing, and it stores the computed doses in the dose memory 1009. (First stage)

Subsequently, the main controller 1015 reads out the doses $D_i$ required for processing the unit areas of the individual layers as stored in the dose memory 1009, and it computes a target dose $D_{TOT}$ in the processing of the element region 1002.

Now, let's consider a case of processing where a hole of area $A_1$ [$\mu m^2$] which penetrates six layers from the uppermost layer of final passivation film 1002*l* to the second layer of aluminum wiring 1002*g* is provided in the element region 1002*b* so as to cut the second-layer aluminum wiring line 1002*g*. Then, the dose D [$nA.sec.\mu m^2$] required per unit area becomes:

$$D=D_1+ \ldots +D_6+D_7.C_1$$
$$=Z_1/K_1 + \ldots +Z_6/K_6+(Z_7/K_7).C_1$$

Here, $C_1$ denotes an excess processing coefficient which is determined in consideration of the dispersion of a processing depth in the final processing layer. In this case, it is set at about 0.2 by way of example.

Besides, $Z_1/K_1+ \ldots +Z_6/K_6$ indicates a processing component of predetermined amount, and $(Z_7/K_7).C_1$ indicates an excess processing component.

Then, the target dose $D_{TOT}$ [nA.sec] which is needed for processing the whole processed hole to be provided in the element region 1002*b* is obtained as:

$$D_{TOT}=D.A_1.(1/f(a))$$

Here, f(a) is a coefficient indicative of a processing efficiency which changes in accordance with the aspect ratio a of the processed hole to be provided in the element region 1002*b*, and $f(a) \leqq 1$ holds.

That is, as the aspect ratio a is greater, the processing efficiency becomes lower, and the coefficient f(a) decreases more, so that the target dose $D_{TOT}$ increases more.

Simultaneously with the computation of the dose $D_{TOT}$, the X-Y table 1001 is properly driven, whereby the intended element region 1002*b* is positioned directly under the ion source 1003.

Then, the processing of the region of the processing area $A_1$ is started and conducted while the ion beam current $I_B$ and the processing period of time $t_i$ which can be measured easily without the influences of the aspect ratio of the processed portion, etc. are being observed. The processing is continued until the dose obtained by integrating the ion beam current $I_B$ with the processing period of time $t_1$ reaches the target dose $D_{TOT}$. When the processing has ended, the hole of exact depth having the area $A_1$ is provided in the element region 1002*b*, and the second-layer aluminum wiring line 1002*g* is reliably cut. By way of example, the logic correction of the semiconductor device 1002*a*, a countermeasure for the inferior design thereof, or the analysis of the defect thereof can be accurately made or taken without damaging the lower insulator layer, etc., by the cutting of the second-layer aluminum wiring line 1002*g*. (Second stage)

Thus, according to this embodiment, the following effects can be attained:

(1) A semiconductor device 1002*a* formed in a semiconductor chip 1002 is provided with a trial processing region 1002*c* along with an element region 1002*b*, whereupon processing is carried out via a first stage at which, in the trial processing region 1002*c*, doses $D_i$ required for the processing per-unit-area of respective layers constituting a multilayer wiring structure or the like are measured while charged particles or emission spectra 1004*a* developed from a processed portion in a processing area sufficiently large in comparison with a depth are being detected in sufficient amounts, and a target dose $D_{TOT}$ is grasped on the basis of the doses $D_i$, and a second stage at which the intended element forming region 1002*b* is irradiated with an ion beam 1004 while doses are being measured on the basis of an ion beam current $I_B$ and a processing period of time $t_i$ which can be measured easily irrespective of the aspect ratio of the processed portion, etc., and the irradiation is continued until the doses in the processing reaches the target dose $D_{TOT}$. Therefore, the depth of the hole of high aspect ratio to be provided in the element forming region 1002*b* by the irradiation with the ion beam 1004 can be precisely controlled.

(2) As the result of the item (1), in the semiconductor device 1002*a* such as a logic element of high integration density, a logic correction, a countermeasure for an inferior design, the analysis of a defect, etc. can be accurately made or taken by the cutting, exposure, etc. of a wiring layer based on the ion beam processing.

(3) The ion beam processing in which a processed depth is precisely controlled can be performed even for the semiconductor device 1002*a* as to which the thickness $Z_i$ of the respective layers in a depth direction and the sputtering rates $K_i$ of the ion beam 1004 for substances making up the respective layers are not known.

(4) As the results of the items (1)–(3), in a logic element of high integration density, etc., the productivities of the operations of a logic correction, a countermeasure for an inferior design, the analysis of a defect, etc. based on the ion beam processing can be enhanced.

In order to control the processed depth more precisely, doses in somewhat larger amounts are set on the basis of the data of the preceding trial digging beforehand, whereupon automatic processing may be performed in such a way that end points are automatically detected by monitoring the secondary ions of Al and Si by means of the detector. Thus, the depth can be monitored during the actual processing, so that a hole can be accurately processed even when Al and $SiO_2$ films involve deviations. Moreover, the processing is not affected by the size and topographical structure of the hole.

Embodiment 11

Figure 11A:
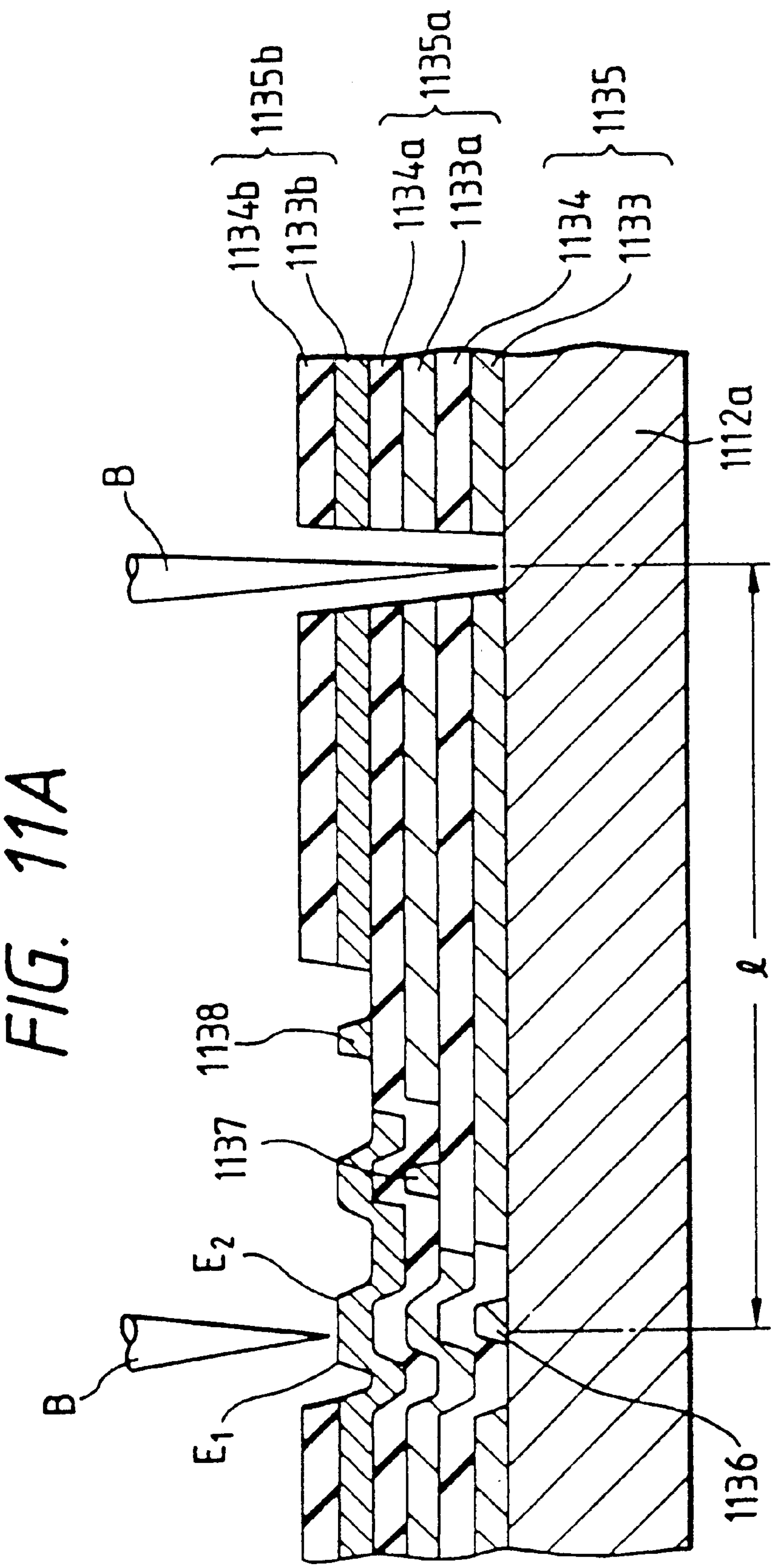
FIG. 11A is an enlarged sectional view of a wafer for explaining an ion beam processing method which is Embodiment 11 of the first aspect of the present invention
Figure 11B:
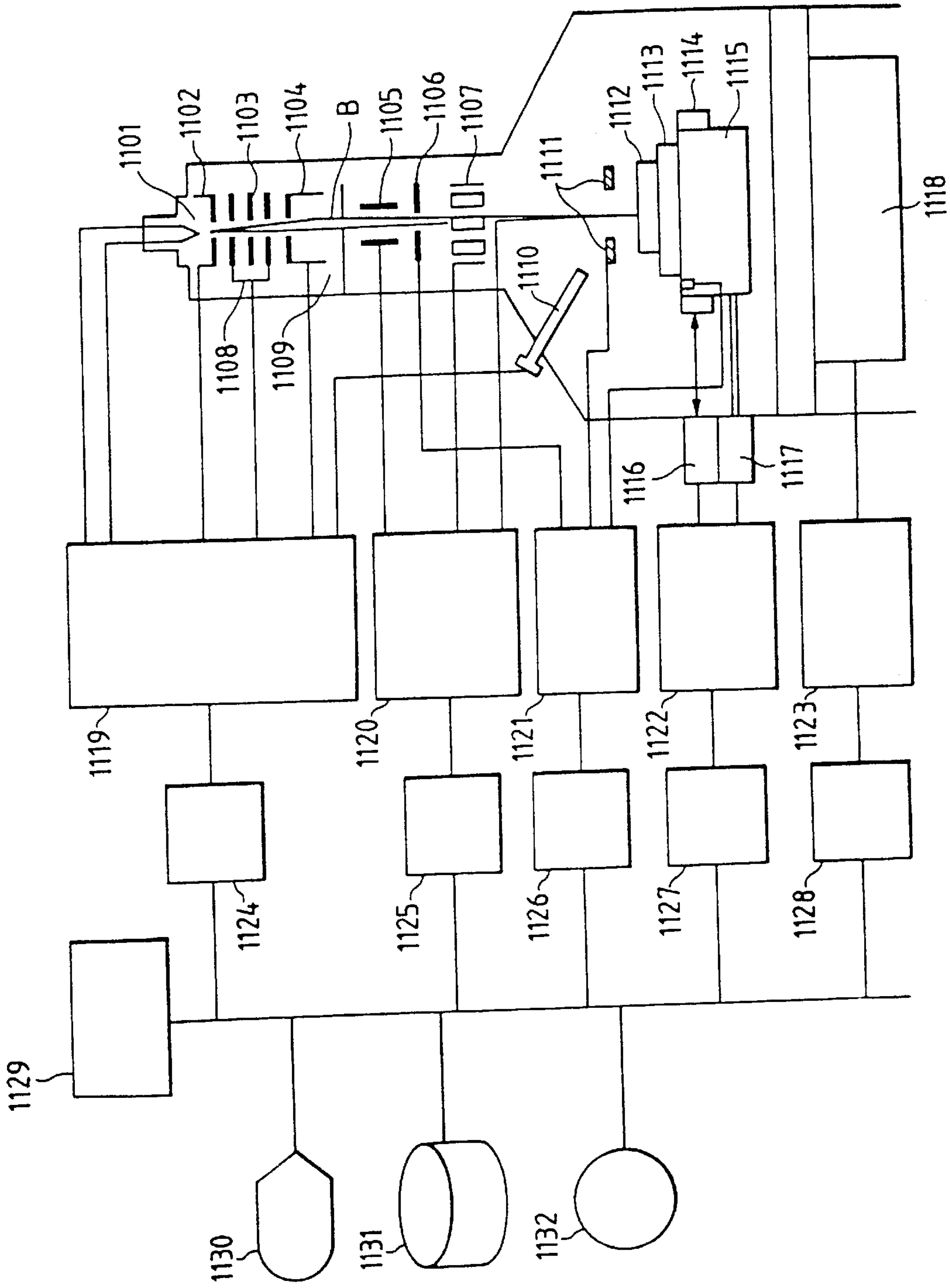
FIG. 11B is a schematic constructional view showing a processing apparatus which is used in the ion beam processing method.
Figure 11C:
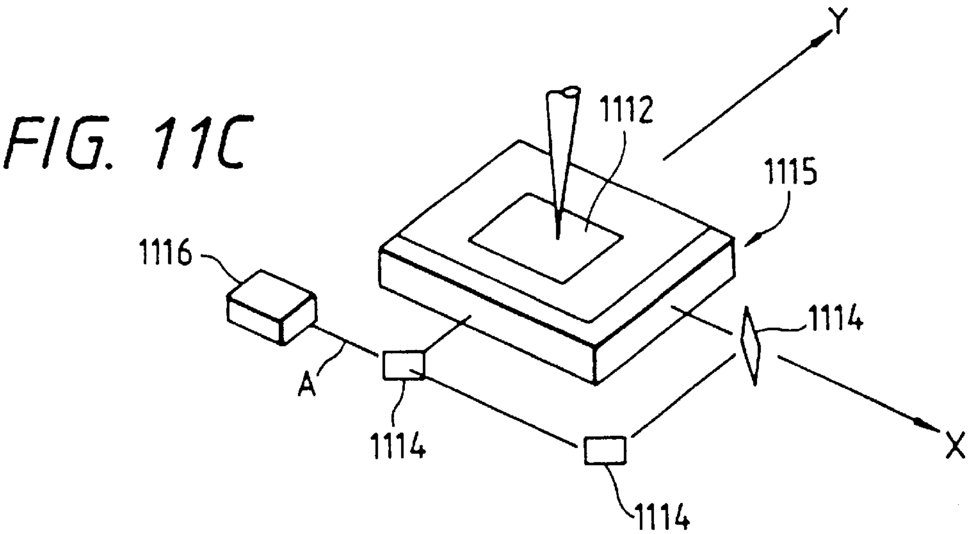
FIG. 11C is a schematic perspective view showing the sample stand of the processing apparatus on as enlarged scale.

FIG. 11A is an enlarged partial sectional view of a wafer for explaining an ion beam processing method which is an embodiment of the present invention, FIG. 11B is a schematic constructional view showing a processing apparatus which is used in the ion beam processing method, and FIG. 11C is a schematic perspective view showing the sample stage of the processing apparatus on an enlarged scale. In addition, FIG. 11D(*a*) is a schematic explanatory view showing the scanning state of an ion beam on the surface of a processing reference mark, while FIG. 11D(*b*) is an explanatory diagram showing the detection intensity of secondary electrons during the scanning of the ion beam. Further, FIGS. 11E(*a*)–11E(*d*) show modifications of the plan pattern of the processing reference mark, and FIGS. 11F(*a*)–11F(*b*) show modifications of the sectional shape of the processing reference mark. Besides, FIG. 11G(*a*) is an enlarged partial sectional view showing another example of the processing reference mark, while FIG. 11G(*a*) is a schematic plan view of this example.

The processing apparatus for use in the ion beam processing method of this embodiment includes constituents 1101–1132 as shown in FIG. 11B.

Referring to FIG. 11B, the constituent 1101 provided at the upper part of the apparatus proper is an ion source emitter. Although not shown, an ion source such as molten liquid metal is accommodated in the ion source emitter 1101. An extraction electrode 1102 is provided below the ion source emitter 1101 so as to emit ions into vacuum. Also located below the extraction electrode 1102 are a first lens electrode 1108 which functions as an electrostatic lens, and a first aperture electrode 1103 which functions as an aperture mask. Below the first aperture electrode 1103, there are disposed a second lens electrode 1104, a second aperture electrode 1109, a blanking electrode 1105 for controlling the ON/OFF of beam projection, and a third aperture electrode 1106 as well as a deflection electrode 1107.

Owing to such arrangement of the electrodes, an ion beam B emitted from the ion source emitter 1101 is formed as a focused beam, and it is controlled by the blanking electrode 1105 and the deflection electrode 1107 so as to be projected on a chip 1112 which is a workpiece.

The chip 1112 is placed on a sample holder 1113 mounted on a sample stage 1115, which is positioned by a stage driving motor 1117 while its position is being recognized by a laser interferometer 1116 through laser mirrors 1114 disposed nearby.

A secondary ion/secondary electron detector 1111 is arranged above the semiconductor chip 1112 so as to detect the generation of secondary ions and secondary electrons from the workpiece 1112.

In addition, the constituent 1110 located above the secondary ion/secondary electron detector 1111 is an electron shower, which prevents the chip 1112 from being electrified.

The interior of the processing system thus far described is kept in a vacuum state by a vacuum pump which is indicated at numeral 1118 in the figure. Besides, the individual processing means have their operations controlled by respective controllers 1119–1123 which are disposed outside, and which are, in turn, controlled by a control computer 1129 through corresponding interfaces 1124–1128. Incidentally, the control computer 1129 inputs/outputs data and records data by means of a terminal 1130, a magnetic disk 1131 and an NT deck 1132.

In the processing apparatus, the sample stage 1115 can be moved predetermined distances in X- and Y-directions by the drive motor 1117 which is controlled by the controller 1122, on the basis of, for example, positional data stored in the magnetic disk 1131. The minute deviations between the actual movement distances and the positional data items on that occasion are found by utilizing the fact that, as illustrated in FIG. 11C, a laser beam A projected from the laser interferometer 1116 is reflected from the X-directional wall and Y-directional wall of the sample stage 1115 via the laser mirrors 1114, whereupon the reflected beams enter the laser interferometer 1116 again and interfere with each other. The information items of the positional deviations are properly input to the deflection controller 1120 for controlling the deflection electrode 1107, whereby the irradiation position of the ion beam B can be finely corrected.

Part of the chip 1112 being a sample is enlargedly shown in FIG. 11A. The chip 1112 includes a semiconductor substrate 1112*a* whose body is made of silicon (Si) single crystal or the like. The semiconductor substrate 1112*a* is formed with multilayer wiring configured of three layers. More specifically, there are stacked a first wiring layer 1135 at the lowermost layer as includes first wiring 1133 and a first insulator layer 1134 deposited and formed thereon, a second wiring layer 1135*a* at the middle layer as includes second wiring 1133*a* and a second insulator layer 1134*a* deposited and formed thereon, and a third wiring layer 1135*b* at the uppermost layer as includes third wiring 1133*b* and a third insulator layer 1134*b* deposited and formed thereon.

Figure 11D:
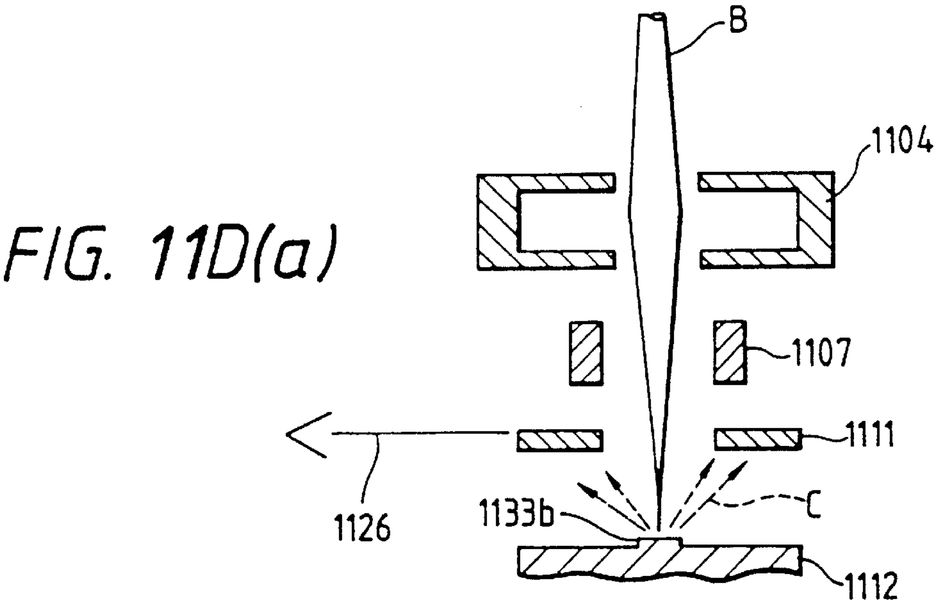
FIG. 11D(*a*) is a schematic explanatory view showing the scanning state of an ion beam on the surface of a processing reference mark.
Figure 11D:
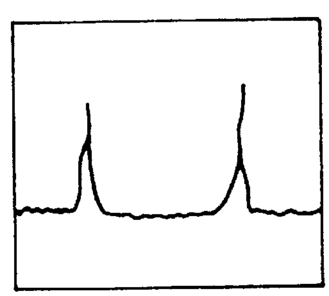
Figure 11E:
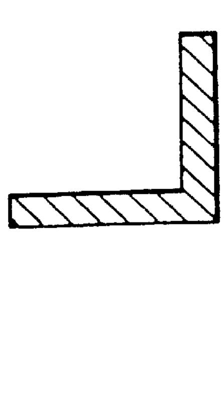
FIGS. 11E(*a*)–11E(*d*) are explanatory views each showing a modification of the plan pattern of the processing reference mark.
Figure 11E:
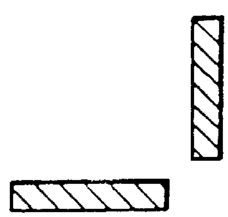
Figure 11E:
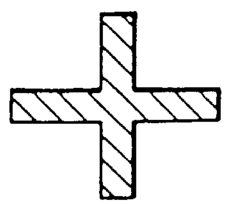
Figure 11E:
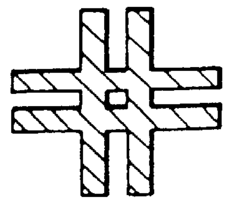
Figure 11F:
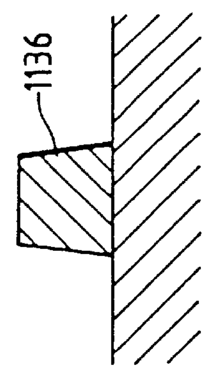
FIGS. 11F(*a*) and 11F(*b*) are explanatory views each showing a modification of the vertical sectional shape of the processing reference mark.
Figure 11F:
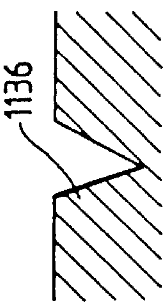

In the multilayer wiring structure, the first, second and third wiring layers 1135, 1135*a* and 1135*b* are respectively provided with processing reference marks 1136, 1137 and 1138 which are used for processing the corresponding layers. Although not restricted thereto, the processing reference mark 1136 can have any of plan shapes shown in FIGS. 11E(*a*)–11E(*d*) by way of example. Also the sectional shape of this reference mark 1136 can be made a salient shape (FIG. 11F(*a*)) similar to the shape of the mark shown in FIG. 11A, or a notch shape as shown in FIG. 11F(*b*). In addition, as a material for forming the processing reference mark 1136 at this time, any of various substances such as aluminum (Al) can be used, and a substance which affords a uniform layer thickness is desirable. By the way, each of the processing reference marks 1136 etc. is formed simultaneously with the formation of the wiring of the corresponding layer.

Referring to FIG. 11A, the first insulator layer 1134, second wiring 1133*a*, second insulator layer 1134*a* and third wiring 1133*b* are further stacked and formed in succession on the processing reference mark 1136, and the third wiring 1133*b* at the uppermost layer is exposed to the exterior. The individual layers mentioned above have uniform thicknesses of high precision. Accordingly, the shape of the processing reference mark 1136 of the lower layer is accurately reflected as it is, in the front surface of such third wiring 1133*b* lying directly over the processing reference mark 1136, and the left and right edges of the upper end of the processing reference mark 1136 are respectively reflected as edge parts $E_1$ and $E_2$ in the third wiring 1133*b* lying at the top level. As compared with the edges of the processing reference mark 1136, the edge parts $E_1$ and $E_2$ exhibit certain spreads in the planar direction of the chip. However, the spreads are proportional to the number of the stacked layers, and the center between both the edges of the processing reference mark 1136 is in accurate agreement with the center between the edge parts $E_1$ and $E_2$ even when the intermediate layers involve some planar positional deviations. Accordingly, if the positions of the edge parts $E_1$ and $E_2$ can be specified, naturally the center of the processing reference mark 1136 lying at the lowermost layer can be accurately specified.

Such a technique for specifying the positions will now be described in more detail.

In the ensuing description, there will be explained a case where the processing reference mark 1136 is used for positioning and where the first wiring 1133 of the first wiring layer 1135 is subjected to cutting processing by irradiating it with the ion beam B.

First, the wafer 1112 is set on the predetermined position of the sample stage 1115 of the processing apparatus, whereupon the vacuum pump 1118 is operated to bring the interior of the apparatus into a predetermined vacuum state. Subsequently, on the basis of positional data stored in the magnetic disk 1131, the stage driving motor 1117 is operated to move the sample stage 1115 to a position where the ion beam B comes over the processing reference mark 1136 of the first wiring layer 1135. Then, as sketched in FIG. 11D(*a*), the ion beam B is scanned over a range extending beyond the edge parts $E_1$ and $E_2$, on that front surface of the third wiring 1133*b* of the uppermost layer in which the processing reference mark 1136 is reflected. Secondary electrons C generated on that occasion are detected, and the position of the underlying processing reference mark 1136 is grasped from variation in the detected amount of the secondary electrons C. The detection state of the secondary electrons C at this time is illustrated in FIG. 11D(*b*), and the amount of the secondary electrons increases to peak values at the positions of the edge parts $E_1$ and $E_2$ of the third wiring 1133*b*. The positional coordinates of the edges of the processing reference mark 1136, in turn, the positional coordinates of the center of this processing reference mark 1136 can be calculated from the peak positions of the detection intensity of the secondary electrons.

Herein, according to this embodiment, the processing reference mark 1136 is not directly exposed to the front surface of the chip 1112, but the shape thereof is reflected at the steps, namely, edge parts of the third wiring 1133*b* of the uppermost layer accurately in proportion to the number of the stacked layers, so that the central position of the processing reference mark 1136 intrinsically located at the lowermost layer can be calculated at high precision.

In this way, the central position of the processing reference mark 1136 at the lowermost layer can be specified, whereby the positional relationship of the wiring formed in this lowermost layer can be accurately calculated.

Subsequently, on the basis of the positional information obtained as described above, the positional coordinates of a processing position stored in the magnetic disk 1131 or the like beforehand are input to the controller 1122, and the stage driving motor 1117 is actuated, whereby the cutting processing of the first wiring 1133 of the lowermost layer can be carried out. In FIG. 11A, a case is illustrated where the position spaced a distance l from the processing reference mark 1136 is subjected to the cutting processing. In executing the cutting processing of the wiring 1133 at the lowermost layer in this manner, the wiring 1132 can be positioned with reference to those edge parts $E_1$ and $E_2$ of the third wiring 1133*b* of the uppermost layer at which the processing reference mark 1136 lying at the lowermost layer similarly to the wiring 1133 is accurately reflected, so that the positional recognition of very high precision is realized to effectively prevent the erroneous cutting, etc. of the wiring 1133.

The processing technique with the ion beam B at this time will be briefly described. The ion beam B is projected with a predetermined scanning width for a fixed period of time while the irradiation amount and irradiation time interval of the ion beam B, an acceleration voltage or a voltage applied to the deflection electrode 1107, and so forth are being adjusted on the basis of information stored in the magnetic disk 1131 or the like beforehand. Thus, the wiring layer is etched and processed at a desired depth and width.

The above description has referred to the case where the positioning is effected by recognizing those edge parts $E_1$ and $E_2$ of the wiring 1133*b* of the uppermost layer at which the shape of the processing reference mark 1136 lying at the lowermost layer is reflected. However, this is not restrictive, but the layers overlying the processing reference mark 1136 may well be etched and removed within a predetermined extent into the state in which this processing reference mark 1136 is directly exposed to the exterior, so as to perform the cutting processing of the wiring 1133 of the lowermost layer with reference to the exposed mark.

Figure 11G:
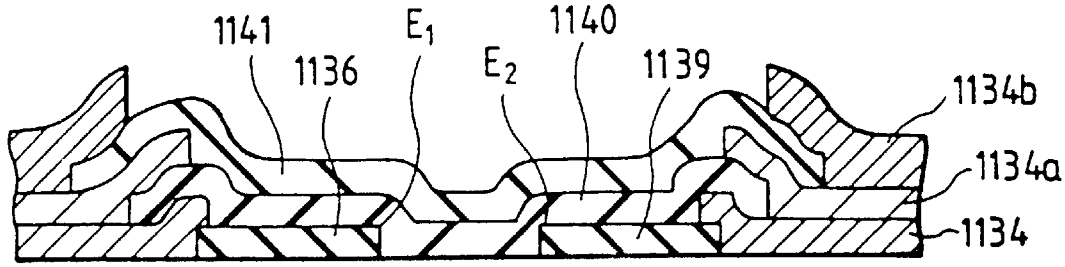
FIG. 11G(*a*) is an enlarged partial sectional view showing another example of the processing reference mark.
Figure 11G:
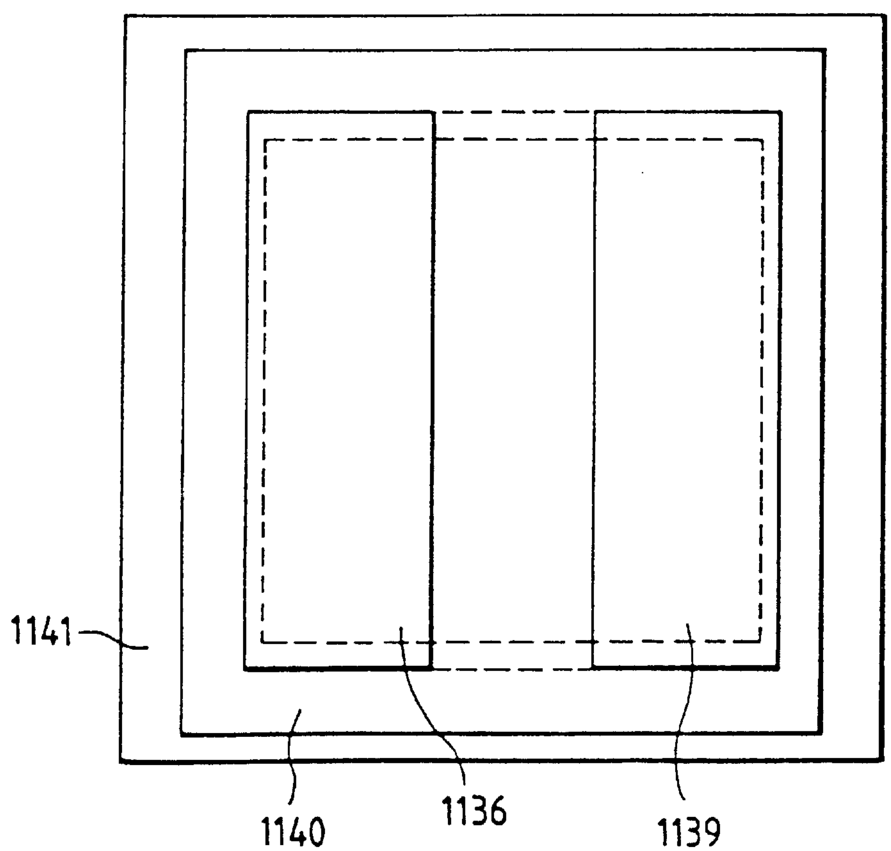

In addition, the processing reference mark 1136 may well have a structure as shown in FIGS. 11G(*a*) and 11G(*b*), unlike the single form as shown in FIG. 11A. More specifically, a first pattern is so formed that two processing reference marks 1136 and 1139 are juxtaposed at the same depth as that of the first wiring 1133. A second pattern 1140 is deposited and formed on the first pattern without interposing the first insulator layer 1134. Further, a third pattern 1141 is deposited and formed directly on the second pattern 1140. The first pattern 1136, 1139, the second pattern 1140 and the third pattern 1141 can be respectively formed by the same steps as those of the wiring lines (not shown) identical in depth to the corresponding layers. At that time, the parts of the first, second and third insulator layers 1134, 1134*a* and 1134*b* overlying the processing reference marks 1136 and 1139 are etched and removed, so that the third pattern 1141 falls into an exposed state. Owing to such a structure in which no insulator layer is interposed between the respectively adjacent layers, the processing reference marks 1136 and 1139 at the lowermost layer can be reflected in the shape of the uppermost layer at a still higher precision.

In the case of using the processing parallel reference marks 1136 and 1139, the right edge of the processing reference mark 1136 located at the left as viewed in FIGS. 11G(*a*) and 11G(*b*) is accurately reflected at the edge part $E_1$ of the third pattern 1141, while the left edge of the processing reference mark 1139 located at the right is accurately reflected at the edge part $E_2$ of the third pattern 1141. Accordingly, the central position between the edge parts $E_1$ and $E_2$ corresponds accurately to the central position between the processing reference marks 1136 and 1139. Therefore, when the ion beam is scanned on the front surface of the third pattern 1141, the detection intensity of the secondary electrons changes greatly at the edge parts $E_1$ and $E_2$ as in the case illustrated in FIG. 11A, and hence, the positional coordinates of the edge parts $E_1$ and $E_2$ can be accurately found. As a result, the central position between the processing reference marks 1136 and 1139 can be accurately specified from the positional coordinates of the edge parts $E_1$ and $E_2$, and a portion to-be-processed can be positioned with reference to this central position. In consequence, the position of the portion to-be-deposited can be specified very accurately, and the portion to-be-processed can be processed at high precision as in the case illustrated in FIG. 11A.

In this manner, according to this embodiment, the following effects can be attained:

(1) In ion beam processing, the same layer as first wiring which is a portion to-be-processed is provided with a processing reference mark 1136 which is intended for the positioning of the portion to-be-processed, and the portion to-be-processed is positioned with reference to that shape of wiring 1133*b* at the uppermost layer in which the shape of the processing reference mark 1136 is accurately reflected. Thus, even when horizontal positional deviations are involved between respectively adjacent layers, the portion to-be-processed can be positioned at a very high precision. Therefore, the accurate position can be subjected to the beam processing at high precision.

(2) An ion beam is scanned on that front surface of the third wiring 1133*b* which is formed with edge parts $E_1$ and $E_2$ reflecting the edges of the processing reference mark 1136 mentioned in the item (1), and the positional coordinates of the edge parts $E_1$ and $E_2$ are specified from the changes of the detection intensity of secondary electrons generated during the scanning. Thus, the coordinates of the central position of the processing reference mark 1136 can be specified at high precision. Therefore, the precision of the cutting processing which employs the ion beam can be enhanced more.

(3) Two processing reference marks 1136 and 1139 are juxtaposed, and a second pattern and a third pattern are stacked and formed on the marks 1136, 1139 without interposing any inter-layer insulator film. Thus, the edges of the opposing positions of the two marks can be reflected as the edge parts $E_1$ and $E_2$ of the third pattern at the uppermost layer more accurately. Therefore, the central position between the processing reference marks 1136 and 1139 can be accurately specified from the positional coordinates of the edge parts $E_1$ and $E_2$, and the processing precision of a portion to-be-processed can be further heightened.

Embodiment 12

In the whole construction of the on-chip correction system debug of the present invention, the processing of data will be chiefly described.

Figure 12A:
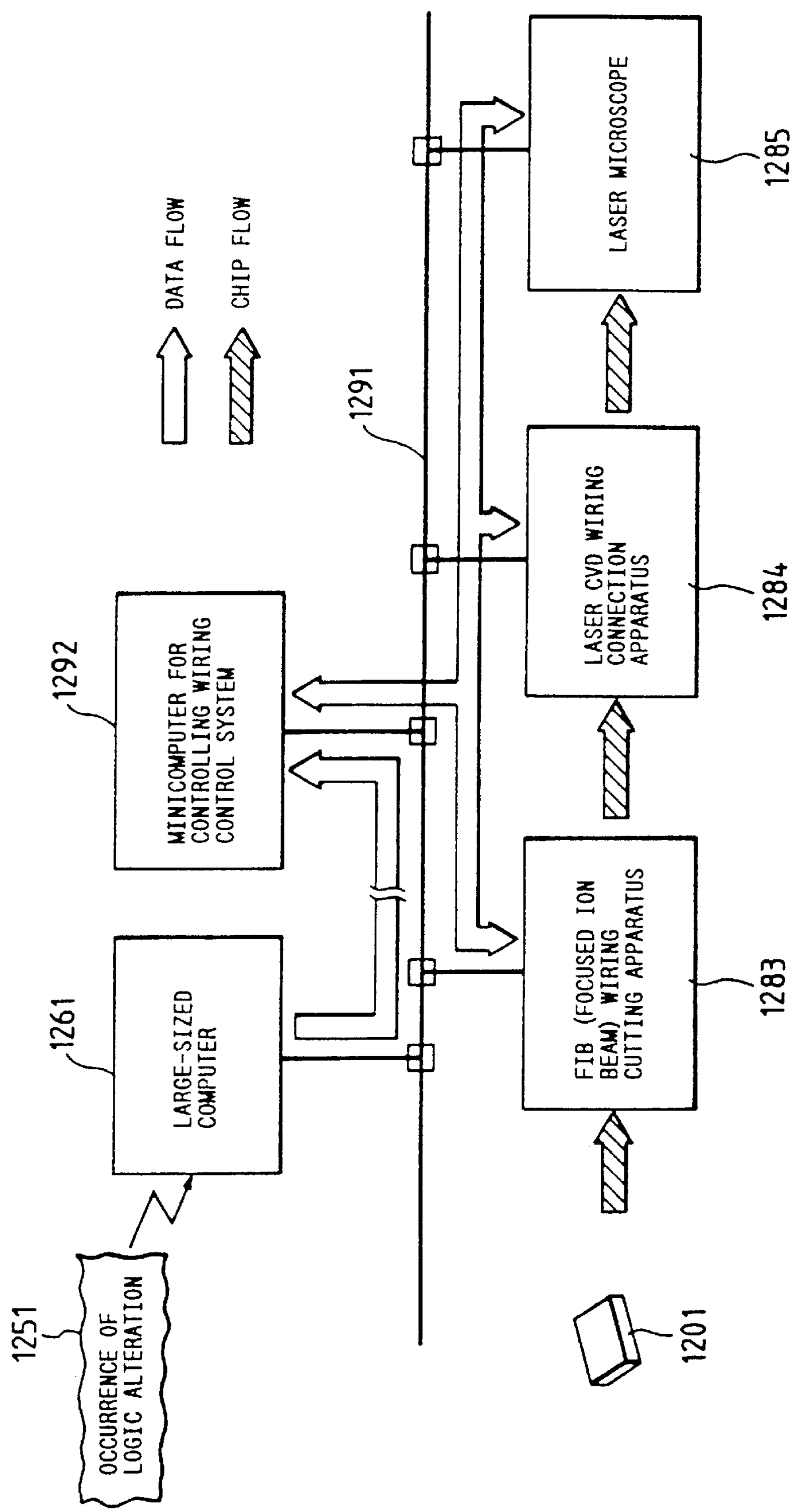
FIG. 12A is a block diagram showing the whole construction of an on-chip wiring correction system in Embodiment 12 of the first aspect of the present invention.
Figure 12B:
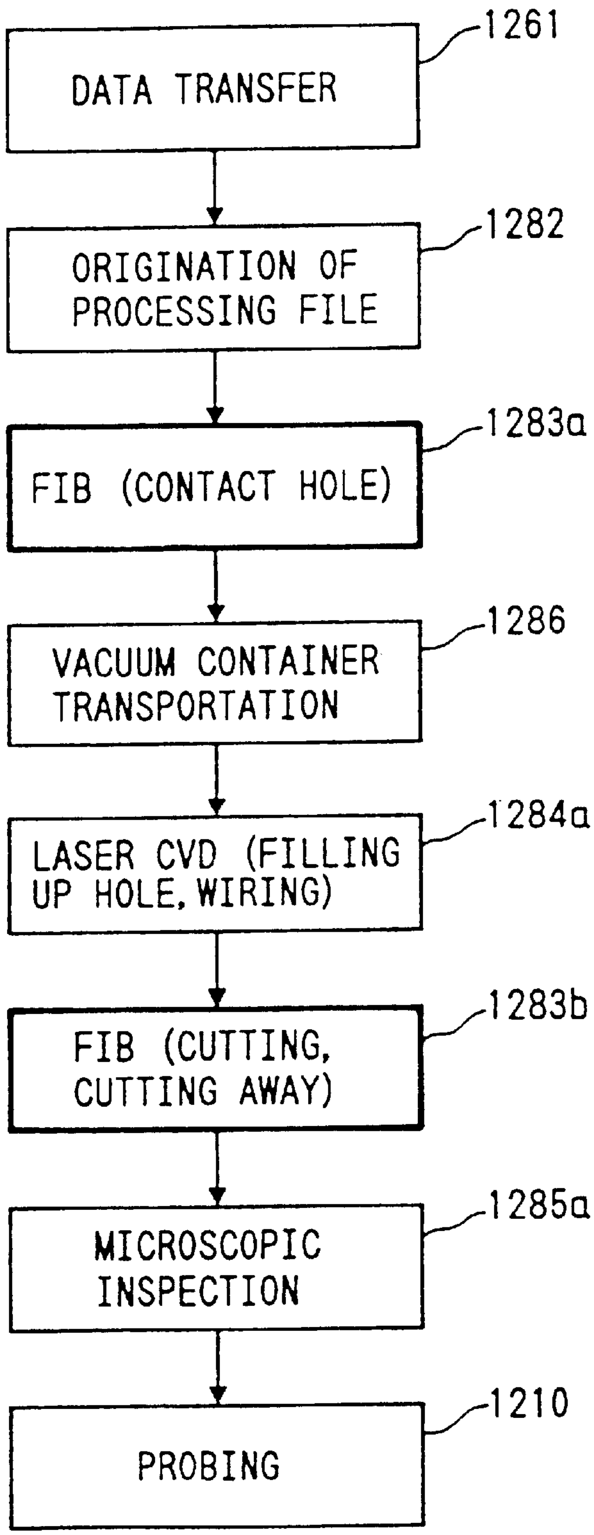
FIG. 12B is a flow chart showing a testing process for wiring corrections.
Figure 12C:
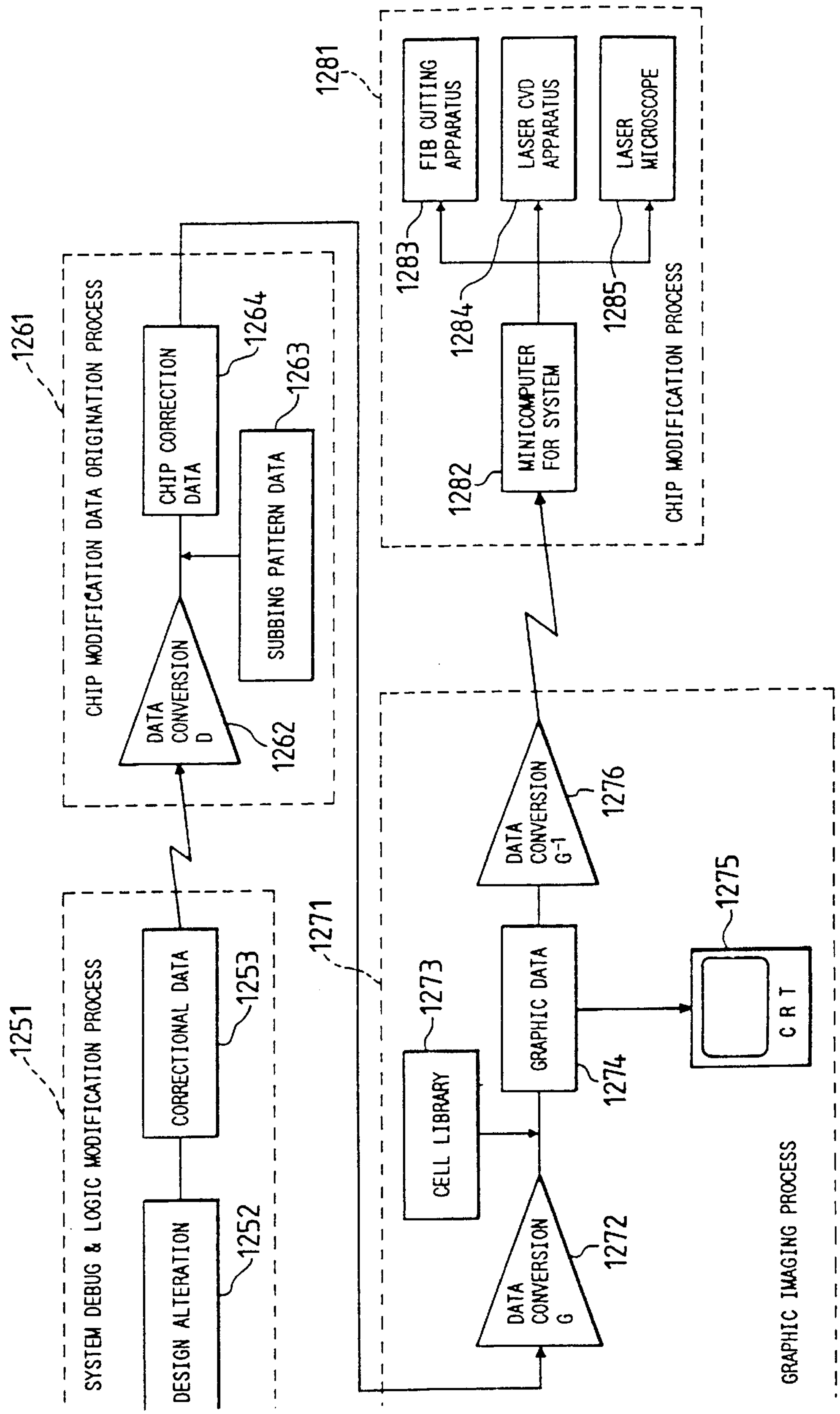
FIG. 12C is a block diagram showing the whole data flow of the on-chip wiring correction system.

FIG. 12A is a block diagram showing the hardware architecture of the entire system, FIG. 12B is a schematic block diagram of the entire processing flow of this system, and FIG. 12C is a block diagram showing the details of the data flow of this system. Referring to FIG. 12A, numeral 1201 designates a stocked chip. Numeral 1283 indicates an FIB wiring correction apparatus or the step of processing with this apparatus, numeral 1284 a laser selective CVD apparatus or the step of forming an Mo wiring line (jumper line) with this apparatus, and numeral 1285 a laser microscope with a confocal memory. These apparatuses are connected with a host computer or the like by a data communication circuit, such as "Ethernet" (registered trademark), 1291. The host computer (minicomputer) 1292 controls the on-chip correction system. Numeral 1261 denotes a large-sized computer which receives design alteration data and which converts the data so as to match with other layout information within the chip 1201, and numeral 1251 a system debugging information processor. These system debug apparatuses and the foregoing correction system are connected by the aforementioned communication circuit or any other communication circuit (e.g., a telephone circuit).

Referring to FIG. 12B, numeral 1261 indicates a process for merging and transferring the subbing pattern data of the chip and correctional data originated as the result of the system debug. A processing file preparation process 1282 is such that, on the basis of the transferred data, the host computer 1292 of the correction system determines concrete processing by referring to the data of trial digging etc. A contact hole providing process 1283*a* is such that, in the FIB apparatus 1283, the control computer thereof executes FIB processing on the basis of an instruction from the host computer 1292. In a container transportation process 1286, the chip to-be-processed is transported from the FIB apparatus 1283 to the laser CVD apparatus 1284 by a load lock system while a degree of vacuum of at least $5\times10^{-6}$ Torr is held. Symbol 1284*a* denotes a laser CVD process (employing an Ar laser of 200 mW) for the selective formation of an Mo jumper line or the like. In a cutting/cutting-away FIB process 1283*b*, the chip having completed a desired connection by the jumper line or based on filling up the hole with Mo has a desired interconnection cut or is formed with a notch. A microscope inspection process 1285*a* is such that, on the basis of an instruction from the host computer 1292, the control computer of the apparatus automatically inspects predetermined processed coordinates. A chip probing process 1210 is carried out with a wafer prober.

Referring to FIG. 12C, numeral 1251 designates a system and process for the system debug and logic design correction of an electron device, numeral 1252 a design alteration process, and numeral 1253 a correctional data origination apparatus and process for originating and inputting the correctional data, such as coordinate data, of the chip to-be-corrected on the basis of the result of the debug.

Numeral 1261 indicates a chip correction data originating large-sized computer system or process for converting the above correctional data so as to merge it with the other data of the chip, numeral 1262 a process for the conversion, numeral 1263 chip layout data except direct correction parts such as subbing Al wiring lines, and numeral 1264 a process for originating chip correction data from the preceding data items.

Numeral 1271 indicates an imaging apparatus or process for imaging the chip correction data so as to acknowledge a part to-be-corrected, numeral 1272 a process for converting the chip correction data into graphic data, numeral 1273 a library for various cells, numeral 1274 a graphic apparatus for originating and controlling the graphic data, numeral 1275 a displaying CRT, and numeral 1276 an inverse conversion process for reconverting the graphic data into the format of the original chip correction data.

Numeral 1281 designates a chip correction system or process, numeral 1282 a host computer for controlling the system, numeral 1283 an FIB milling apparatus, numeral 1284 a laser CVD apparatus, and numeral 1285 an inspecting microscope apparatus. These apparatuses have their control computers, respectively, and job instructions, processed result data, etc. are transferred between the control computers and the host computer through the communication circuit.

Now, the whole system will be described centering on the flow of data with reference to FIG. 12C.

When a design alteration is determined by the result of system debug, data items such as wiring cutting coordinates, a layer to-be-cut, connection coordinates, a layer to-be-connected, the coordinates of a connection wiring path as digitized according to the strategy of Embodiment 9 are input as correctional data 1253. The correctional data items are transferred in on-line fashion into a chip design/manufacture data managing computer system 1261 which controls chip design and manufacture data, and in which the data items are converted into the same format as in this system. Thereafter, other chip layout data stored in the system and required for processing the subbing Al wiring pattern etc. of a chip to-be-processed is added to the converted data, to originate chip correction data 1264. These operations are performed for the following reason: Data for developing a system is basically logic design data corresponding to logic diagrams. Therefore, in originating concrete chip correction data, it needs to be converted into chip design/manufacture data corresponding to an actual mask pattern.

The chip correction data 1264 is transferred to a graphic apparatus 1271, and is displayed as an image on a CRT 1275. On this occasion, if the correction plan has no problem, the data left intact is transferred to a chip correction system 1281 (after inverse conversion). In contrast, when the correction plan includes improvement, change, addition or the like, it is revised in such a way that data items on a fundamental processing pattern, a spare cell, spare wiring, etc. are read out from a cell library 1273 or the like on the graphic apparatus, and the data is thereafter transferred to the correction system 1281.

Here, instead of inputting the correctional data by means of the information processing system 1253 for managing the system development, correctional data may well be input at an image level upon directly acknowledging an image in a graphic terminal 1274.

The chip correction data transferred from the graphic apparatus 1271 is loaded in a host computer 1282 and is merged with other processing data, whereby a complete set of processing data is originated. More specifically, in accordance with product sort data in the chip correction data, the host computer 1282 instructs processing apparatuses 1283, 1284 and an inspection apparatus 1285 to perform preliminary operations such as trial digging (FIB milling apparatus 1283) and inter-layer misregistration measurement (laser microscope 1285) and to transfer the results back to the host computer. Subsequently, the host computer 1282 originates the actual processing data on the basis of the chip correction data and the preliminary operation data as well as other processing reference data, and it transfers the instructions of processing and inspection to the processing and inspection apparatuses 1283–1285 in on-line fashion on the basis of the originated processing data.

For the purpose of ensuring the processing precision and positioning precision (±0.5 $\mu$m) thereof, such a chip correction system needs to be placed in an environment having a temperature of 23±1° C., vibrations of at most 0.1 $\mu$m, and a dust degree of "Class 100" or below.

Embodiment 13

In this embodiment, the application of the on-chip wiring correction system of the present invention will be described. The system and method are applicable to the logic corrections of bipolar custom logic LSIs and other CMOS logic LSIs and to the pattern corrections and defect analyses of bipolar, MOS and GaAs memory LSIs, etc. as concretely mentioned in the foregoing embodiments. They are also applicable to the pattern corrections of a mask, a printed-wiring circuit board, a multilayer ceramic circuit board, etc.

Here will be taken an example applied to a gate-array master slice IC.

A gate array is a kind of semiconductor integrated circuit whose functions can be freely set by altering the Al wiring lines of a large number of basic gates and memories. Such a gate array should desirably be perfect at the stage of a logic specification prepared by a customer. However, when the number of the gates exceeds a certain value, debugging the gate array perfectly at the logic level is not always efficient, and moreover, it is sometimes impossible. In such cases, a gate array developing/mass-producing (manufacturing) system or method to be explained below can speed up the development of a system through the utilization of FIB wiring corrections.

Figure 13:
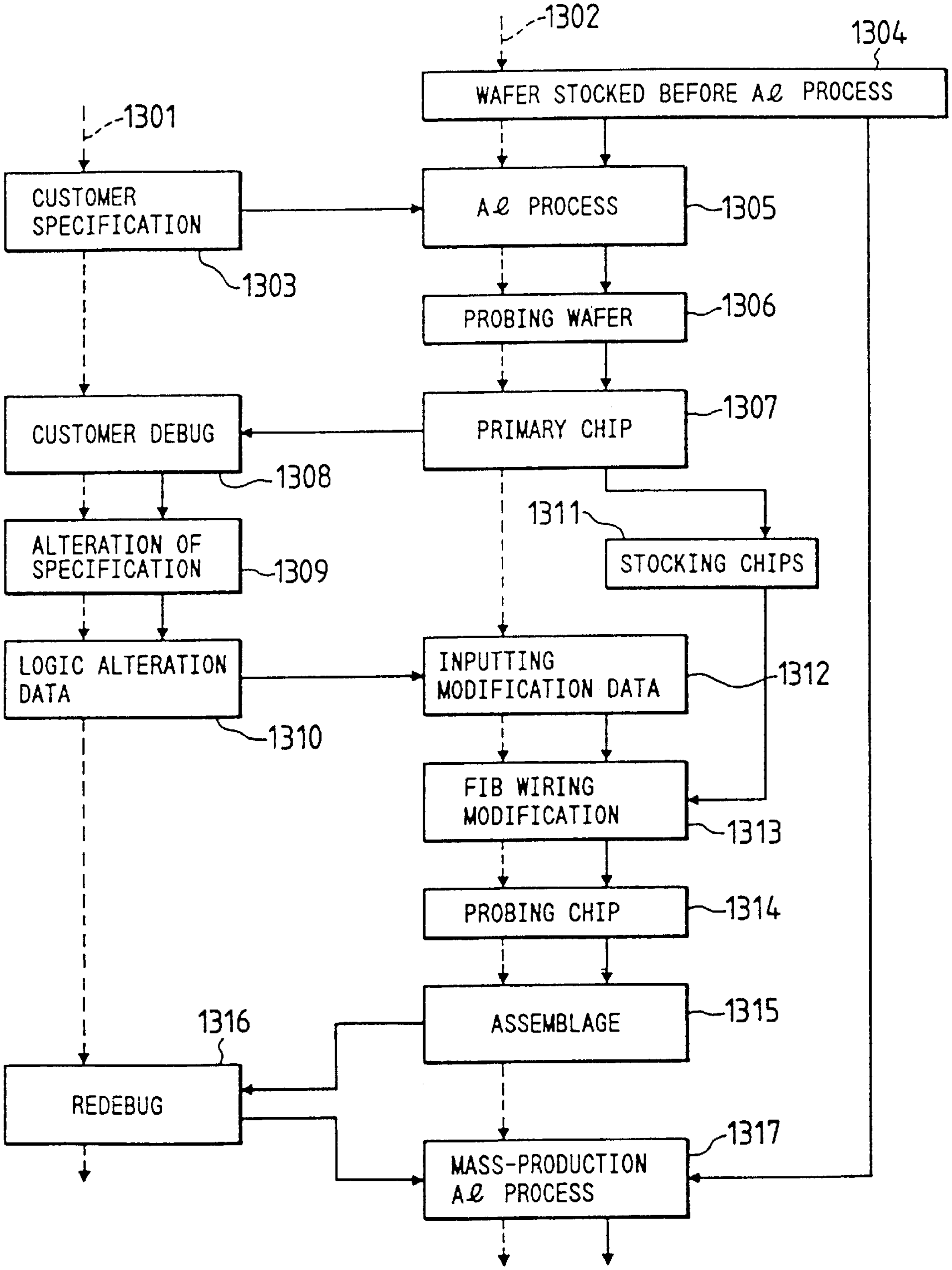
FIG. 13 is a block diagram showing the whole flow of a gate array developing and manufacturing process in Embodiment 13 of the first aspect of the present invention.

FIG. 13 is a diagram showing the entire flow of the system or method. Referring to the figure, a broken line at numeral 1301 indicates a process flow on the side of a customer, while a broken line at numeral 1302 indicates a process flow on the side of a chip manufacturer. At a step 1303, the trial manufacture specification of an IC is determined by the customer. Numeral 1304 designates a master slice wafer which is kept in stock before an Al process in order to shorten the turnaround time of the gate array. Shown at numeral 1305 is an Al multilayer process as described in the foregoing embodiments, which is performed according to the trial manufacture specification. At a wafer probing step 1306, electrical tests are conducted in the wafer state by the use of a prober. A primary chip splitting/assemblage step 1307 is such that the wafer including nondefective articles are split into chips by dicing, and that the chip is assembled to a testable extent. At a step 1308, the customer debugs the pertinent system on the basis of the chip. Thereafter, the customer alters the specification on the basis of the debug at a step 1309 and originates correctional data at a logic diagram level and transfers it in on-line fashion at a step 1310. At step 1312, the correctional data is input with a graphic terminal as described in Embodiment 12. A step 1311 is such that the finished chips of the sort identical to the primary chips mentioned before are kept in stock. At a step 1313, the stocked chips are subjected to FIB wiring corrections on the basis of processing data as described in the foregoing embodiments, and at a step 1314, the corrected chips are probed in the chip states as described in the foregoing embodiments. The probed chips are assembled at a step 1315, and the system is redebugged by the customer at a step 1316. Numeral 1317 indicates a mass-production A1 process corresponding to the IC whose final specification has been determined by the redebug step 1316. Here, the stocked wafer is subjected to the Al process so as to finish up the gate array.

Thus, with this method, the period of time which is taken for the finish of the corrected chip (to be tested) since the debugged result of the customer has been transferred to the chip manufacturer in on-line fashion is as short as 1 day–3 days. Therefore, the development period of the gate array of high integration density can be sharply shortened.

The supplementary explanation of the whole process flow is as follows: The stocked wafer 1304 from which the primary chips 1307 are prepared has regions corresponding to the spare gates and spare FFs in the foregoing embodiments. The Al process 1305 at this time is the process of the four Al layers having the spare wiring, antenna wiring etc. as described in the foregoing embodiments. Since such primary chips are kept in stock, the wiring corrections with an FIB can be promptly made in correspondence with the logic alteration. The Al process 1317 for the mass production after the redebug 1316 may well be the same as the above process 1305. However, in a case where the quantity of production is very large, masks may well be corrected or remade.

Reference for Supplementing Embodiments

Techniques for processing a chip with an FIB are explained in detail by Takahashi et al in U.S. patent application Ser. No. 07/134,460 (filed in Dec. 17, 1987). The explanation in this patent application is incorporated herein by reference in its entirety.

A chip radiation structure (a heat radiation structure in the installed state of a chip) omitted from the foregoing embodiments is explained by Kawanabe et al. in U.S. patent application Ser. No. 285,581 (filed on Dec. 6, 1988). The explanation in this Ser. No. 285,581 is also incorporated herein by reference in its entirety.

The details of CCB (Controlled-Collapsed Solder Bumps) and packages are explained by Sahara et al. in U.S. patent application Ser. No. 07/174,371 (filed on Mar. 28, 1988). The explanation in this Ser. No. 07/174,371 is also incorporated herein by reference in its entirety.

Second Aspect of the Present Invention

This second aspect of the present invention can be applied, generally, to ion beam cutting techniques, particularly where there is required a precise control for the depth of a cutting region having a high aspect ration. This aspect of the present invention will be described in connection with specific embodiments thereof.

Embodiment 1

Embodiment 1 of the present invention will be described below with reference to FIGS. 14A, 14H, 14I and 14J.

Figure 14A:
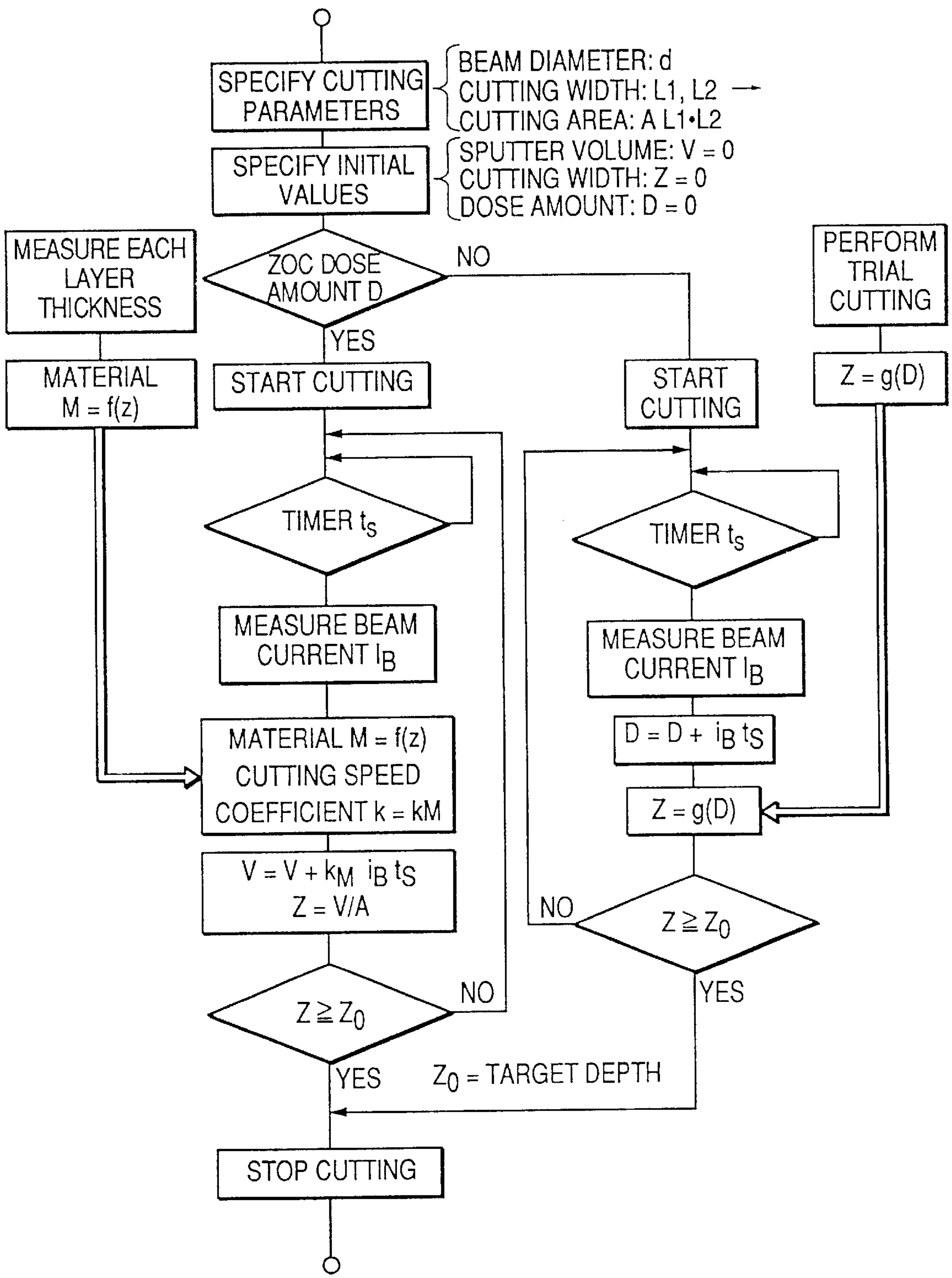
FIG. 14A is a flow chart of embodiment 1 of the second aspect of the present invention.
Figure 14B:
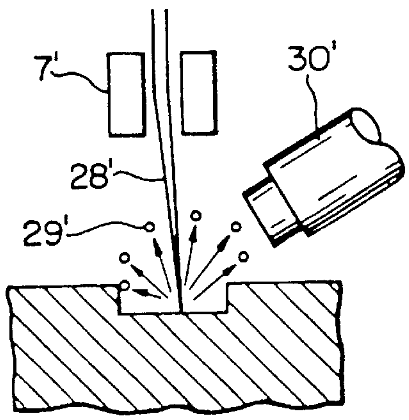
FIGS. 14B and 14C are sectional views explaining how to detect secondary ions.
Figure 14C:
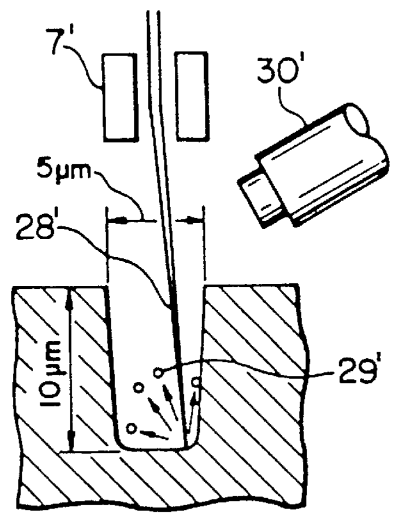
Figure 14D:
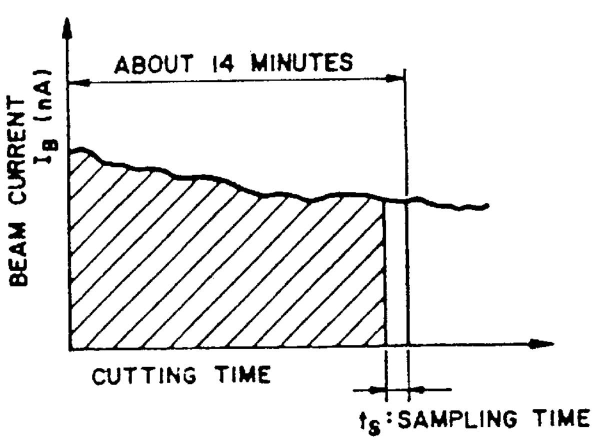
FIG. 14D is a diagram showing changes of a beam current with respect to time.
Figure 14F:
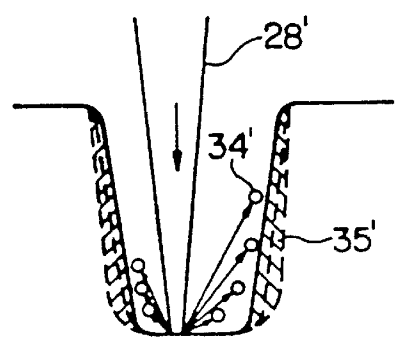
FIG. 14F is a sectional view of a cut-away hole.
Figure 14E:
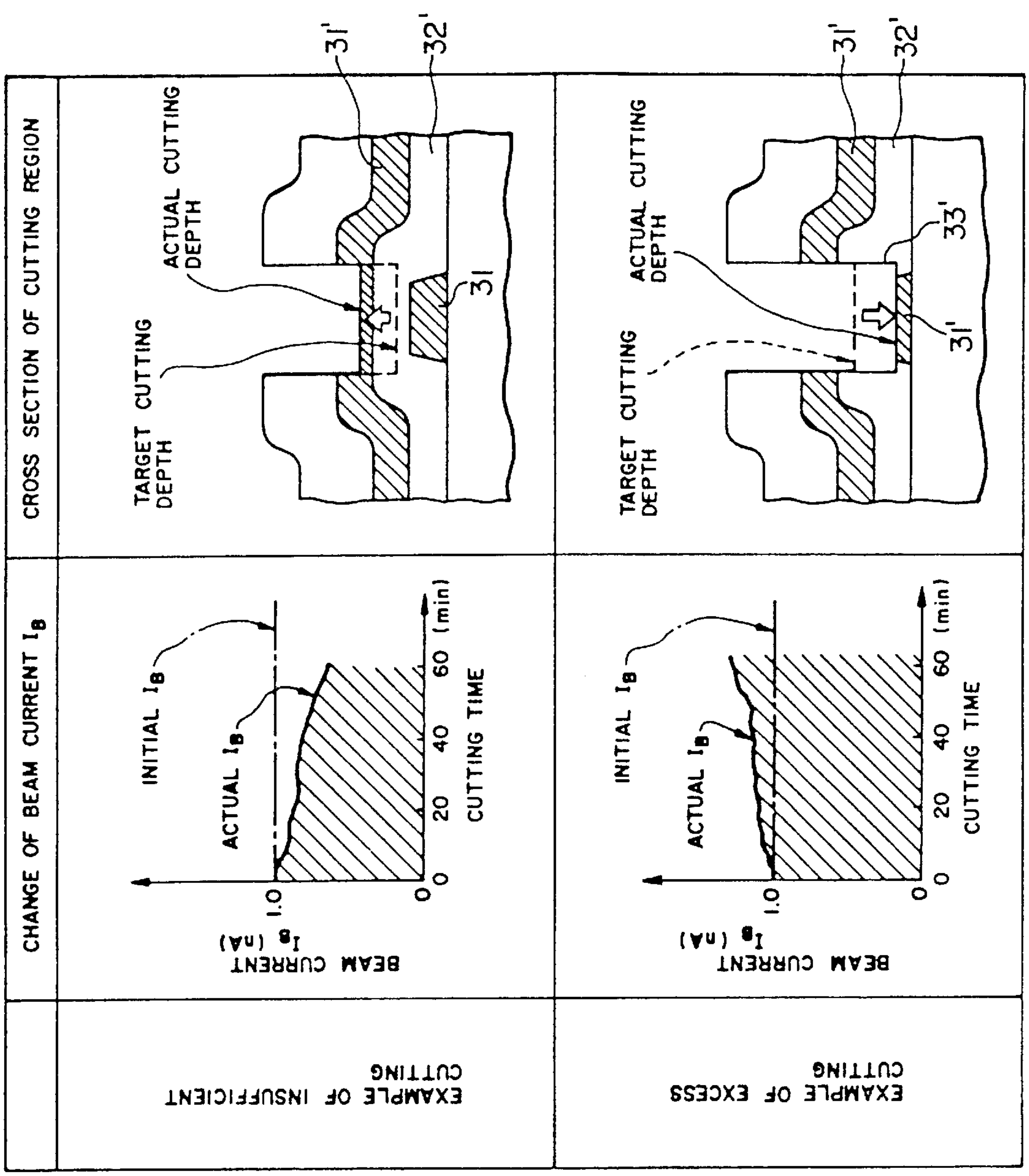
FIG. 14E is a diagram showing a cutting state according to a conventional method.
Figure 14G:
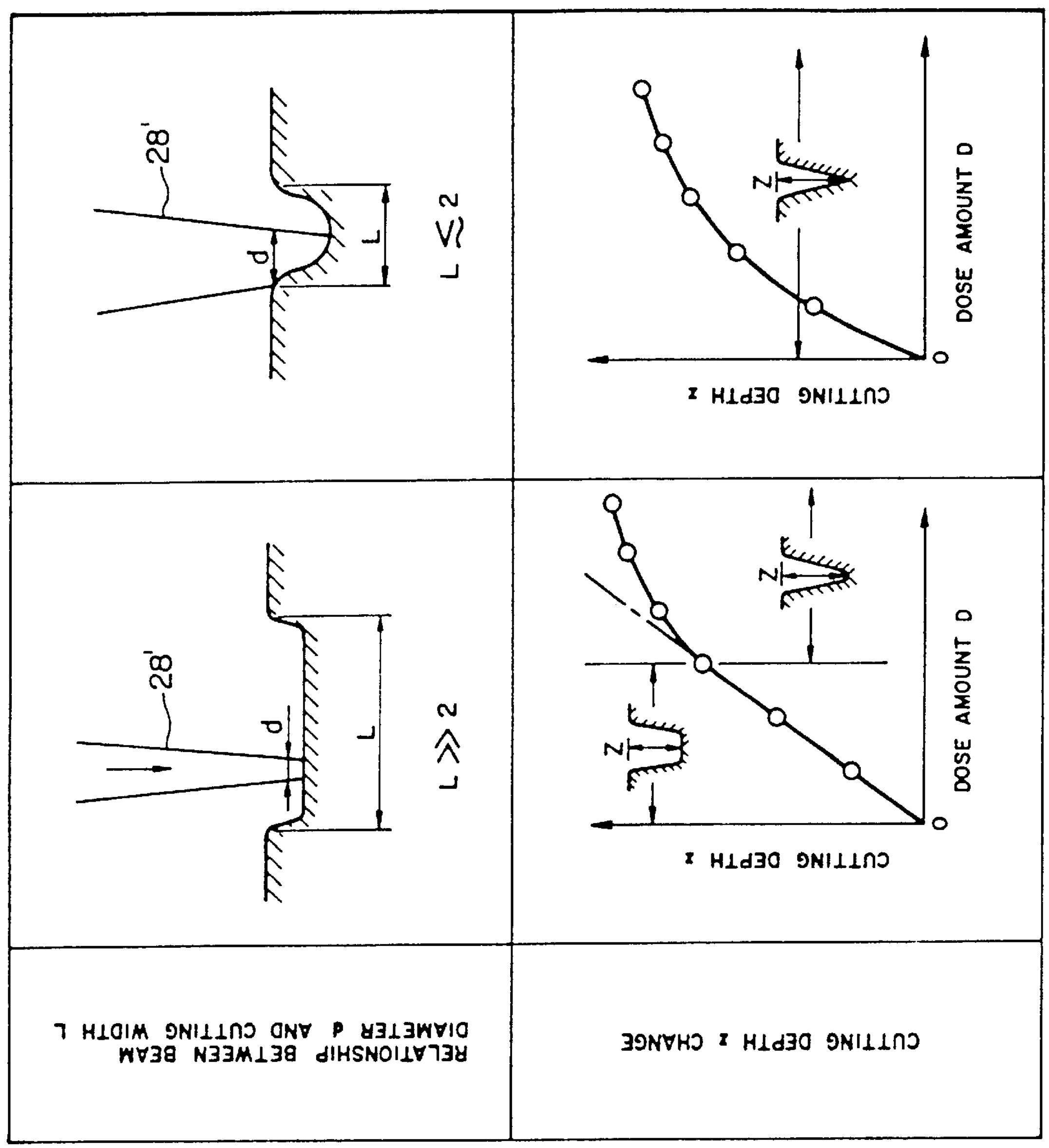
FIG. 14G is a diagram showing changes in cutting depth during cutting.
Figure 14H:
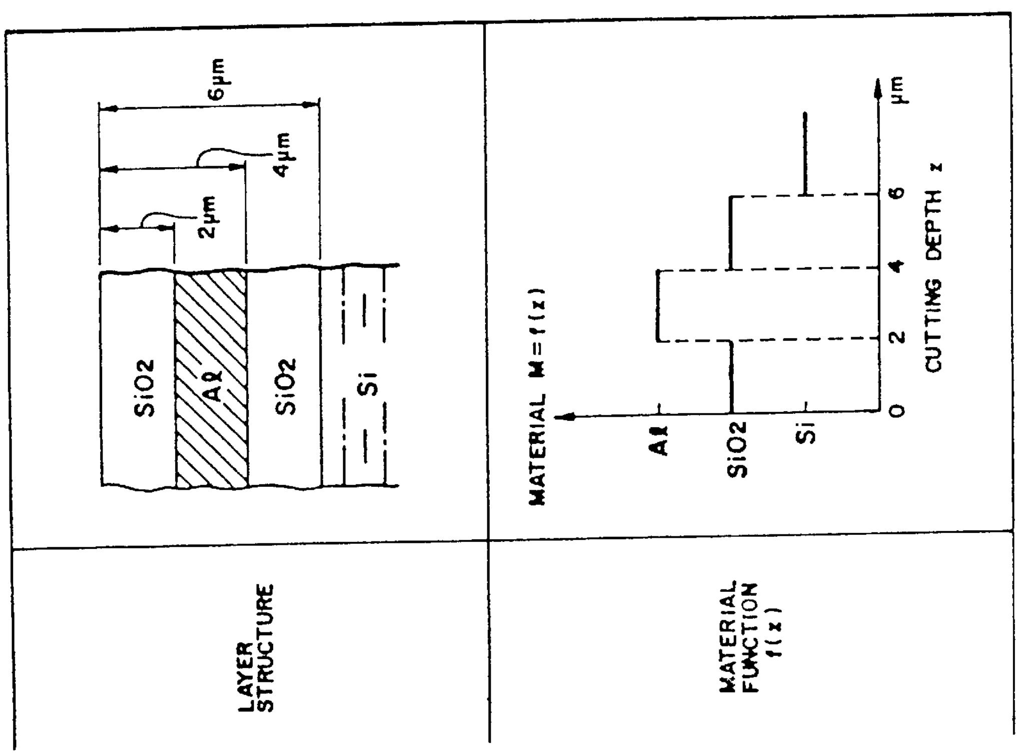
FIG. 14H is a diagram showing a material function in the embodiment 1.
Figure 14I:
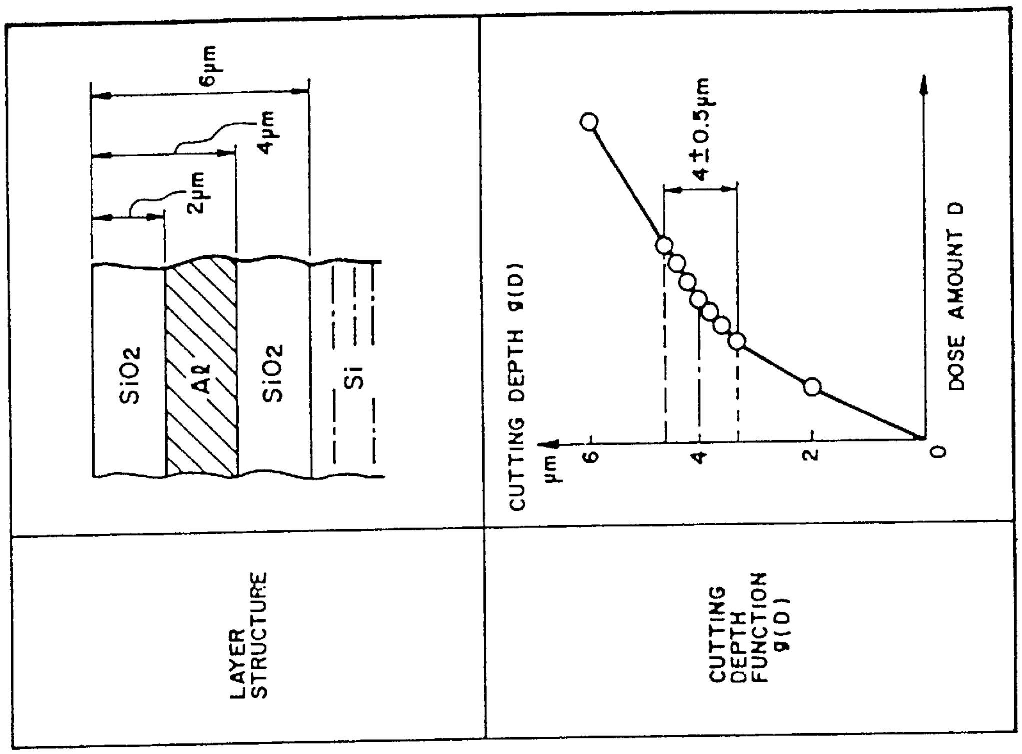
FIG. 14I is a diagram showing a cutting depth function in the embodiment 1.
Figure 14J:
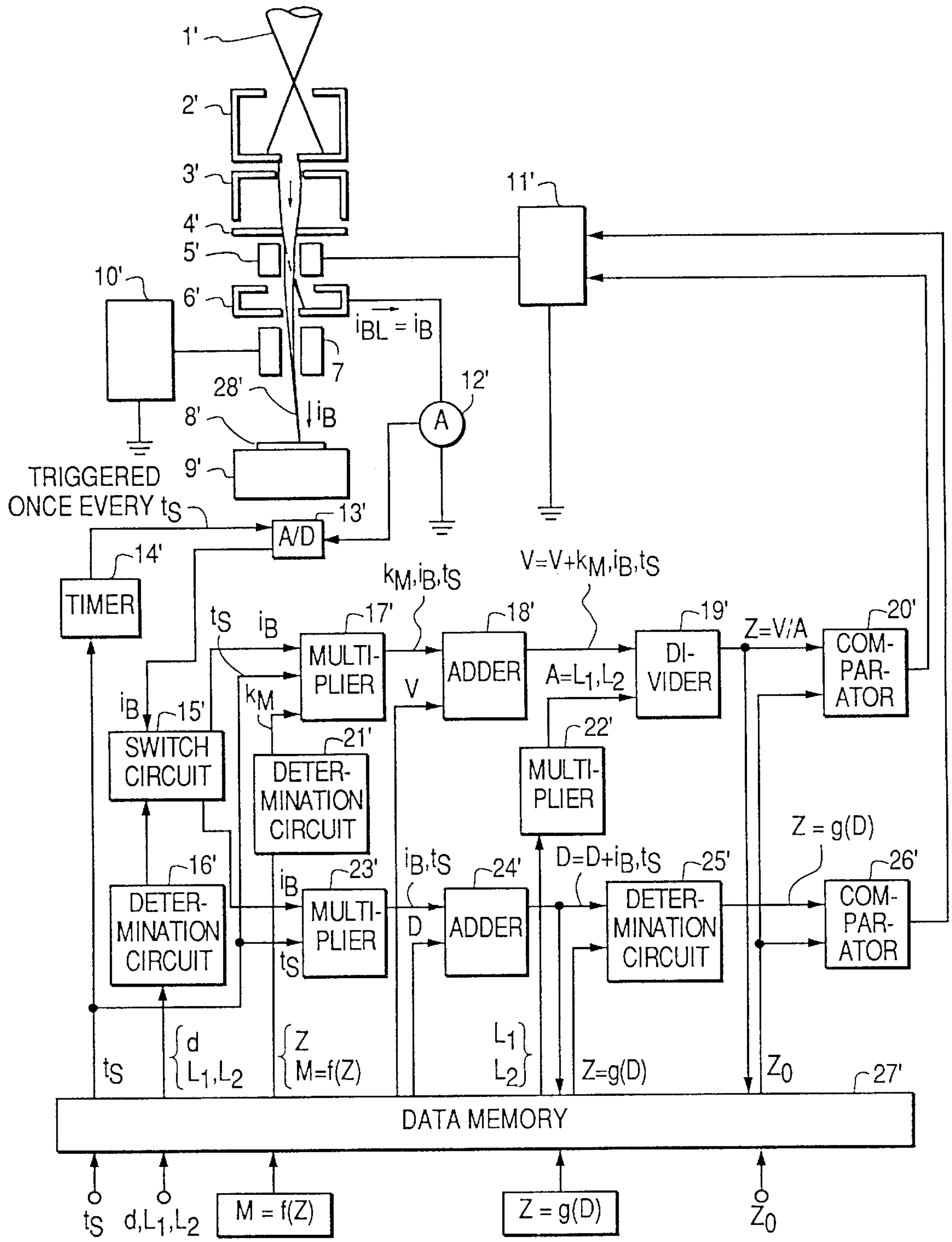
FIG. 14J is a system block diagram embodying the second aspect of the present invention.

In FIG. 14J, an ion beam emitted from an ion source 1' is focused onto a sample 8' through first, second and third lens electrodes (indicated at 2', 3' and 4', respectively, in the figures). The beam is bent and directed to a blanking aperture 6' by applying a voltage to a blanking electrode 5' as necessary, whereby the radiation of the beam to the sample 8' can be avoided. By applying a deflecting voltage to a deflector electrode 7' the beam can be scanned in a cutting region.

The sample 8' is fixed onto a stage 9' which is driven by a drive unit (not shown). During cutting, the stage 9' is fixed and the beam is deflected for scan.

Required voltages are fed to the blanking electrode 5' and the deflector electrode 7' from a blanking controller 11' and a deflector controller 10', respectively.

FIG. 14A is a flowchart for controlling the cutting depth using the system shown in FIG. 14J. In a cutting work, first a beam diameter d and cutting widths $L_1$ and $L_2$ (longitudinal and transverse widths, respectively) are set as cutting parameters, then a comparison is made between d and $L_1$, $L_2$ with respect to magnitude, them judgement is made as to whether a depth Z is proportional to a dose amount D or not, and with respect to the case where the answer is affirmative and a negative case, cutting is started along separate flows. The relation of d, $L_1$ and $L_2$ for determining a proportional relation between Z and D changes depending on a workpiece, so it is necessary to determine it experimentally in advance. For example, in forming a multilayer interconnection of an LSI comprising aluminum wirings and sputtered $SiO_2$ films, $Z \propto D$ when $L_1 \geqq 4d$ and $L_2 \geqq 4d$, and Z is not proportional to D when $L_1 < 2d$ or $L_2 \leqq 2d$. In an intermediate region, whether approximation to $Z \propto D$ can be made or not depends on the depth accuracy required. The present inventors obtained this relation experimentally.

Where Z is proportional to D, cutting is performed according to the flow shown on the left side in FIG. 14A. A timer is operated simultaneously with the start of cutting and a beam current $i_B$ is measured at every predetermined certain time $t_S$. The sampling time $t_S$ is selected to a time value within which a change in beam current is sufficiently small. In the measurement of a beam current, for example as shown in FIG. 14J, there is measured an ion current $i_{BL}$ flowing into the blanking aperture 6' and toward the earth upon blanking operation. If the blanking aperture 6' is formed in a structural shape which encloses all of emitted secondary electrons therein, the value of $i_{BL}$ coincides with the value of the beam current $i_B$.

At this time, the minimum unit of the sampling time $t_S$ corresponds to a single scan time, which is very short.

How to measure $i_{BL}$ will now be explained with reference to FIGS. 14K, 14L and 14M. Upon blanking operation to intercept the ion beam at the blanking aperture 6', secondary ions 36' are generated from the same aperture due to collision of the ions therewith. The secondary ions 36' thus generated are attracted, for example, by an electric field developed by the blanking electrode 5' and fly away, resulting in that an electric current $i_{BL}$ including an additional current corresponding to the secondary electrons flow through an ammeter 12'. This current $i_{BL}$ no longer coincides with a radiation beam current $i_B$ supplied for cutting. Therefore, in order to make the measured current $i_{BL}$ coincident with the radiation beam current $i_B$, it is necessary to have all of the generated secondary electrons 36' captured by the blanking aperture 6'.

Figure 14K:
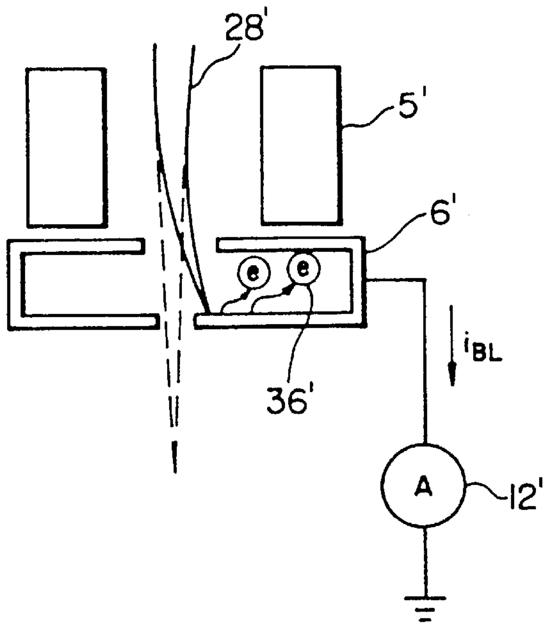
FIGS. 14K, 14L and 14M are diagrams showing beam current measuring methods.

In the example shown in FIG. 14K the upper portion of the blanking aperture 6' is provided with an eaves-like portion to shield it from the blanking electrode 5'. As a result, the secondary electrons 36' are not influenced by the electric field formed by the blanking electrode 5', so can all be captured by the blanking aperture 6'.

Figure 14L:
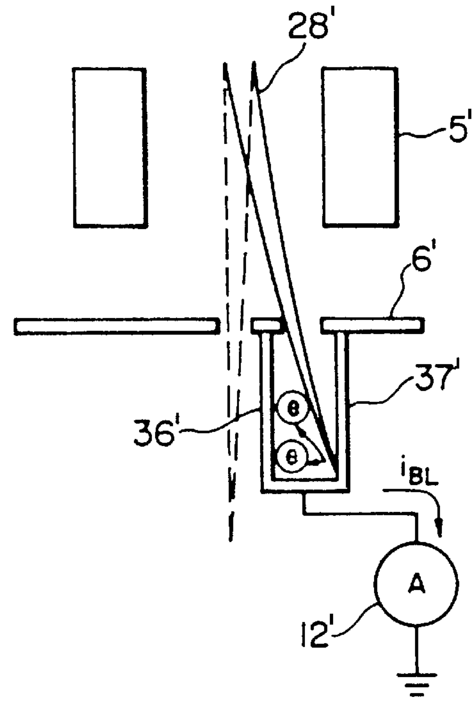

In the example shown in FIG. 14L, the blanking aperture 6' is provided with a Faraday cup 36' so that an ion beam 28' is incident on the Faraday cup 37' during blanking operation. As a result, all of the secondary electrons 36' can be captured into the Faraday cup 37' and the measured current $i_{BL}$ from the Faraday cup coincides with the radiation beam current $i_B$.

Figure 14M:
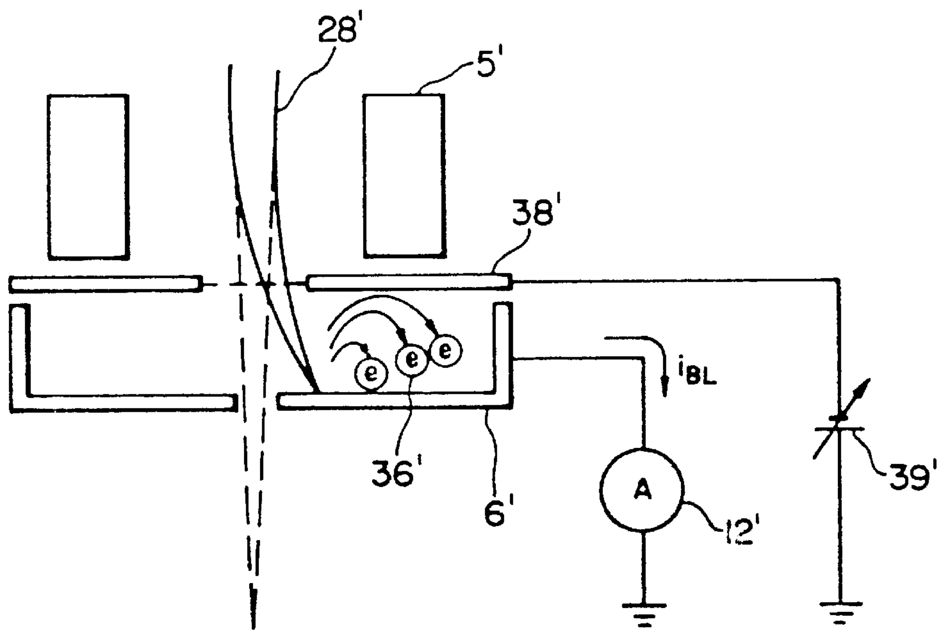

In the example shown in FIG. 14M, a secondary electron trapping electrode 38' is provided between the blanking aperture 6' and the blanking electrode 5' and a trap voltage is applied thereto from a secondary electron trapping power source. For example, the secondary electron trapping electrode 38' comprises a plate electrode centrally formed with a hole and a metallic mesh disposed in the central hole. Since the energy of the secondary electrons 36' is in the range of several eV to several ten eV, the trap voltage may be set to −100V or so. As a result, the secondary electrons 36' are all repelled toward the blanking aperture 6' and so can be trapped by the latter. The influence of the trap voltage upon the focusability of the ion beam 28' is slight and can be easily corrected by a lens voltage for example.

Now, the method of determining the value of $i_B$ indirectly by calculation from another current value will be explained below with reference to FIGS. 14N, 14O, 14P and 14Q.

Figure 14N:
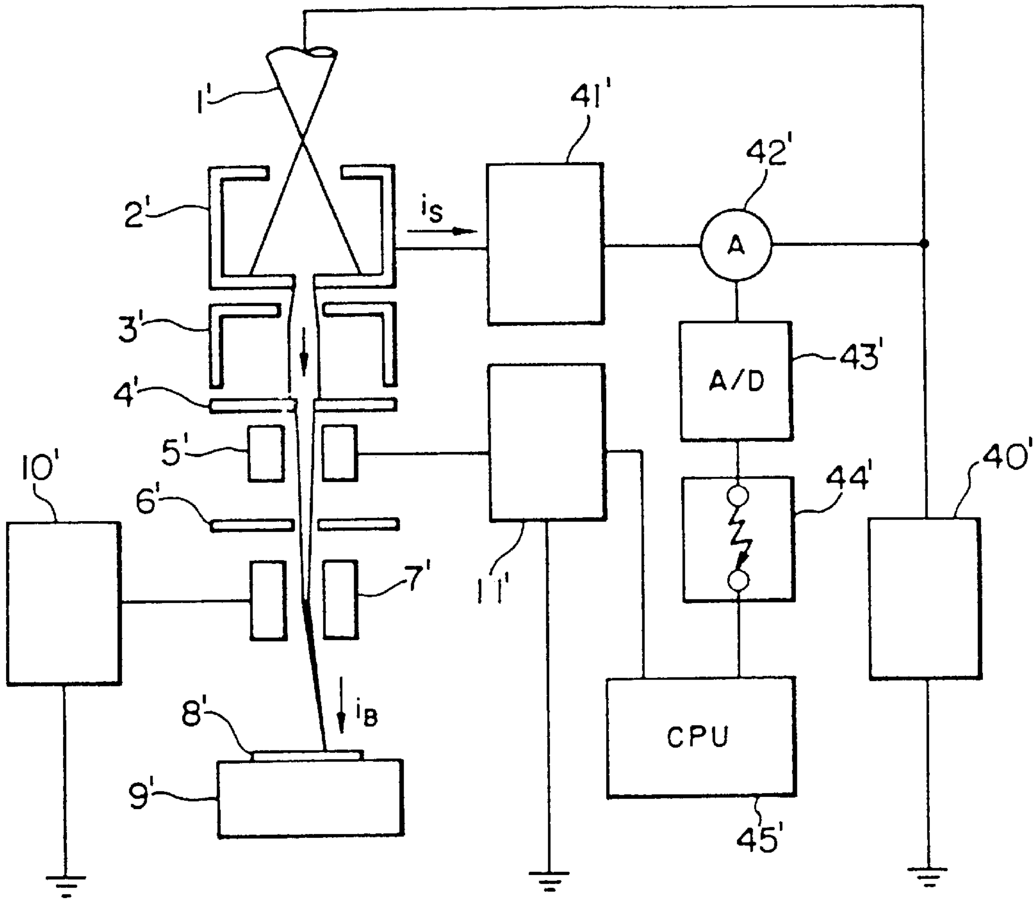
FIGS. 14N, 14O, 14P and 14Q are diagrams showing how to determine a beam current indirectly by calculation.
Figure 14O:
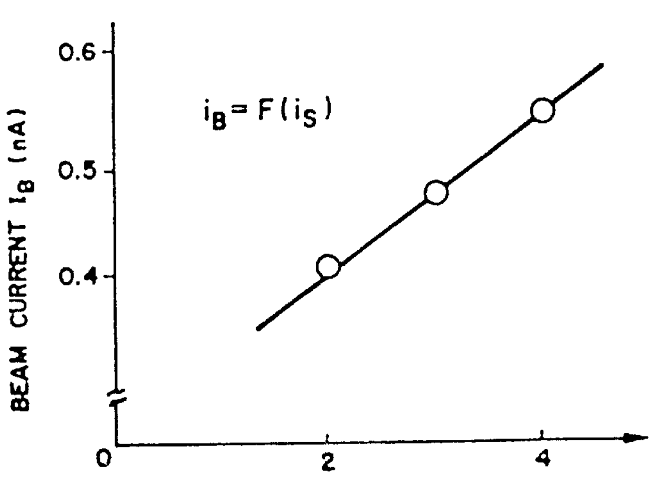
Figure 14P:
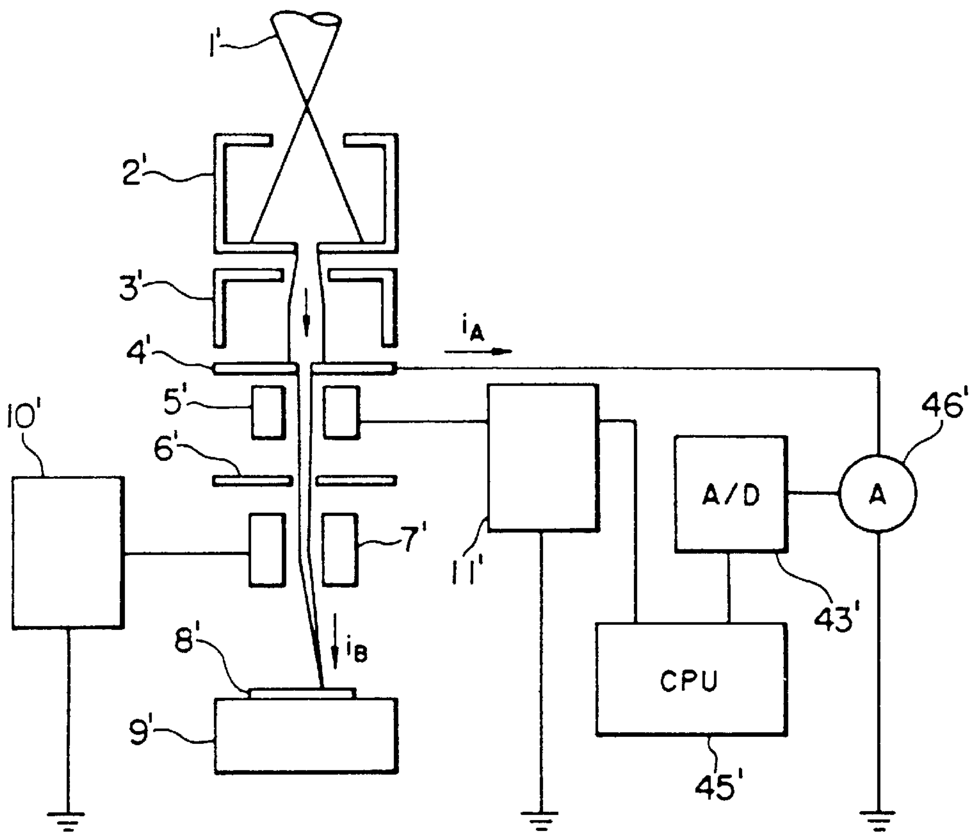

FIG. 14N shows an example of suing as a measurement current all ion current (hereinafter referred to as the "source current $i_S$") provided from an ion source and flowing into a first lens electrode 2 (draw-out electrode). The source current $i_S$ flowing through a draw-out power source 41' is measured by an ammeter 42' and digitized by an A/D converter 43', then the measured value is transmitted to a CPU 45' by means of an optical data link 44'. Since the $i_S$ measuring system floats to a degree corresponding to an acceleration voltage, the optical data line 44' is used for electrical insulation. In the CPU 45' the value of $i_B$ is calculated from the measured value $i_S$ using the following relation between the source current $i_S$ and the radiation beam current $i_B$ which has been obtained experimentally:

$$i_B=F\ (i_S) \tag{3}$$

As a result of an actual experiment the above $i_S-i_B$ relation $F(i_S)$ could be expressed in a high accuracy using a linear function as shown in FIG. 10:

$$i_B=\alpha_1 i_S=\beta_1 \tag{4}$$

Referring will now be made to FIG. 14B, showing an example of using as a measurement current an electric current (hereinafter referred to as "aperture current $i_A$") which is a current remaining after limiting the amount of radiation ions by the third lens electrode 4' (a beam limiting aperture). The aperture current $i_A$ flowing from the third lens electrode 4 is measured by an ammeter 46' and digitized by the A/D converter 43', then transmitted to the CPU 45'. The CPU 45' calculates the value of $i_B$ from the measured value $i_A$ using the following relation between the aperture current $i_A$ and the radiation beam current $i_B$ which has been obtained experimentally, in the same manner as in the use of the source current is:

$$i_B=G\ (I_A) \tag{5}$$

Figure 14Q:
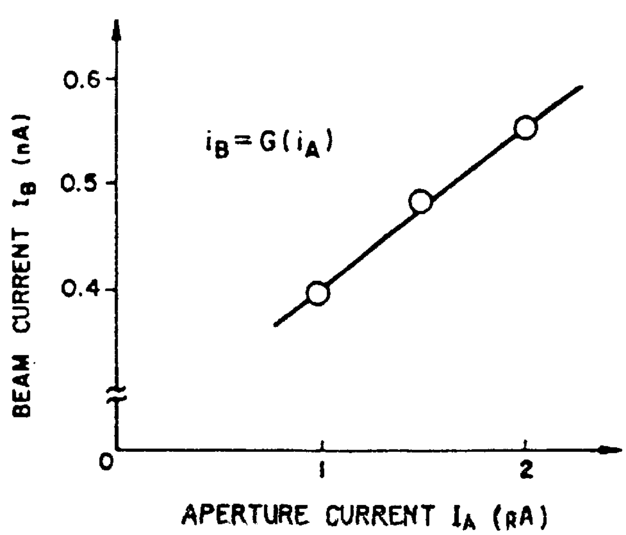

According to an experiment, the above $i_A-i_B$ relation $G(i_A)$ could also be expressed in a high accuracy using a linear function as shown in FIG. 14Q:

$$i_B=\alpha_2 i_S=\beta_2 \tag{6}$$

In these methods wherein the values of $i_S$ and $i_A$ are measured and the value of $i_B$ is determined by calculation, the accuracy of the function $F(i_S)$ or $G(i_A)$ used in the calculation has influence on the depth accuracy. Where the function $F(i_S)$ or $G(i_A)$ is approximately by a linear function, it has been possible to make a depth control of ±0.3 $\mu$m for a cutting depth of 5 $\mu$m. However, where the cutting depth is above 5 $\mu$m or where a higher depth accuracy is required, it is possible that the accuracy of $F(i_S)$ or $G(i_A)$ will come into question.

The foregoing method of measuring the value of $i_B$ directly using $i_{BL}$ is suitable for attaining a higher depth accuracy although the structure of the blanking aperture becomes somewhat complicated.

The product of the $i_B$ [nA] and $t_S$ [sec] thus obtained is multiplied by a cutting rate coefficient $k_m$[$\mu m^3$/nc] to obtain an increment ΔV [$\mu m^3$] of the sputter volume within the sapling time:

$$\Delta V=k_M i_B t_S \tag{7}$$

ΔV is added to the sputter volume V [$\mu m^3$] from the start of cutting and the sum is divided by a cutting region opening area A [$\mu m^3$] ($A=L_1\times L_2$), whereby the present cutting depth Z [$\mu$m] can be calculated.

$$V=V+k_M i_B t_S \tag{8}$$

$$Z=V/A \tag{9}$$

Cutting is repeated at every $t_S$ until the depth Z thus obtained exceeds a target depth Zo, whereupon the cutting is stopped.

In the above flow, the value of the cutting rate coefficient $k_M$ varies depending on the material M of a workpiece. Therefore, in the case of cutting a multilayer sample, it is necessary to judge the material M at every sampling time $t_S$ and determine the value of $k_M$. For example, the thickness of each layer of a workpiece is measured by means of an interferometer or the like and the material M is determined as a function f(Z) of the depth Z in advance, and judgement of the material is made in accordance with the value of Z at the time of sampling.

FIG. 14H shows an example of the material function f(Z). Where a multilayer structure shown in FIG. 14H is to be cut successively from upper to lower layer, the material changes like the graph shown in the same figure with progress of the cutting depth Z to obtain a material function f(Z).

Where Z is not proportional to D, cutting is performed in accordance with the flow shown on the right side in FIG. 14A. The timer is operated upon start of cutting and a beam current $i_B$ is measured at every certain time $t_S$. A dose amount increment $\Delta D=i_B\cdot t_S$ within the sampling time is determined by multiplying $i_B$ [nA] by $t_S$ [sec], and ΔD [nc] is added to the dose amount from the start of cutting to obtain a cumulative dose amount D[nc].

$$D=D+i_B\cdot t_S \tag{10}$$

The present cutting depth Z[$\mu$m] is obtained from the Z-D relation Z=g(D) which has been determined beforehand and the D just obtained above. The cutting is repeated at every $t_S$ until Z exceeds the present target depth Zo, whereupon the cutting is stopped.

FIG. 14I shows an example of the cutting depth function Z=g(D) which represents the relation of Z and D. Prior to an actual cutting, a trial cutting is performed while D is changed, using a sample of the same layer structure as that of a cutting region, and the depth Z of a cut-away hole is measured by an electron microscope for example to obtain the above functional relation Z=g(D). Z=g(D) is a monotone increasing function, so it is not necessary for the above trial cutting to fully cover the entire cutting depth. It is sufficient to effect cutting minutely only before and behind the target depth Zo and approximate Z=g(D) by a straight line with respect to the remaining region. For example, where the multilayer structure shown in FIG. 14I is to be cut up to an aluminum layer, that is, up to a target depth of 4 $\mu$m, a minute trial cutting is made for only the region of 4 $\mu$m or so in the depth Z and the remaining region is approximate by a straight line, whereby there is obtained such a relation as shown in the graph of the same figure, which relation corresponds to the cutting depth function g(D).

A constructional example of a control system for realizing the above cutting flow is shown in FIG. 14J. Necessary data such as $t_S$, d, $L_1$, $L_2$, M=f(Z), Z=g(D) and Zo are fed to a data memory 27'. During cutting, a beam current $i_B$ detected by the blanking aperture 6' is measured by the ammeter 12' and the value obtained is digitized by an A/D converter 13' to obtain a digital signal, which is fed to the controller. Upon start of cutting, a timer 14' operates and a trigger signal is fed to the A/D converter 13' at every $t_S$, so that the converter 13' operates and the value of $i_B$ is fed to a switch circuit 15'. The determination circuit 16' determines a proportional relation between Z and D on the basis of the values of input data d, $L_1$ and $L_2$, and the value of $i_B$ is distributed to the circuits which follow.

Where Z and D are proportional, the value $i_B$ is fed to a multiplier 17'. A determination circuit 21' determines the material M from the depth Z and the material function M=f(Z) and sets a value of $k_M$. The values of $i_B$, $t_S$ and $k_M$ are multiplied by the multiplier 17' and a value of the sputter volume V is determined in an adder 18'. Further, V is divided by an opening area A in a divider 19' to calculate the present depth Z. The value of A is determined from the values of $L_1$ and $L_2$ by means a multiplier 22'. The depth Z is compared with the target depth Zo in a comparator 20'. When Z exceeds Zo, a signal is fed to the blanking controller 11' to apply a voltage to the blanking electrode to stop cutting.

Where Z and D are not proportional, the value of $i_B$ is fed to a multipiler 23'. The values $i_B$ and $t_S$ are multiplied by the multiplier and a cumulative dose amount D is determined by an adder 24'. Further, in a determination circuit 25', the present depth Z is determined from Z=g(D). The depth Z is compared with the target depth Zo by a comparator 26', and when Z exceeds Zo, a signal is fed to the blanking controller 11' to stop cutting.

According to the present invention, as set forth above, even when cutting is performed over a period of time wherein changes of the beam current are not negligible, the cutting depth can be controlled on the basis of current values measured at very short time intervals, so it is possible to form a hole of a high depth accuracy.

Embodiment 2

Figure 15A:
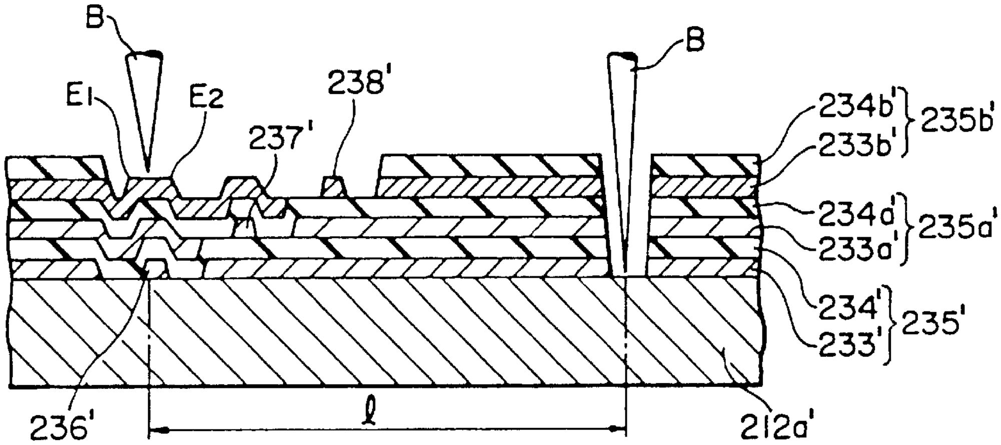
FIG. 15A is an enlarged sectional view of a wafer for explaining a cutting method using an ion beam according to an embodiment 2-I of the second aspect of the present invention.
Figure 15B:
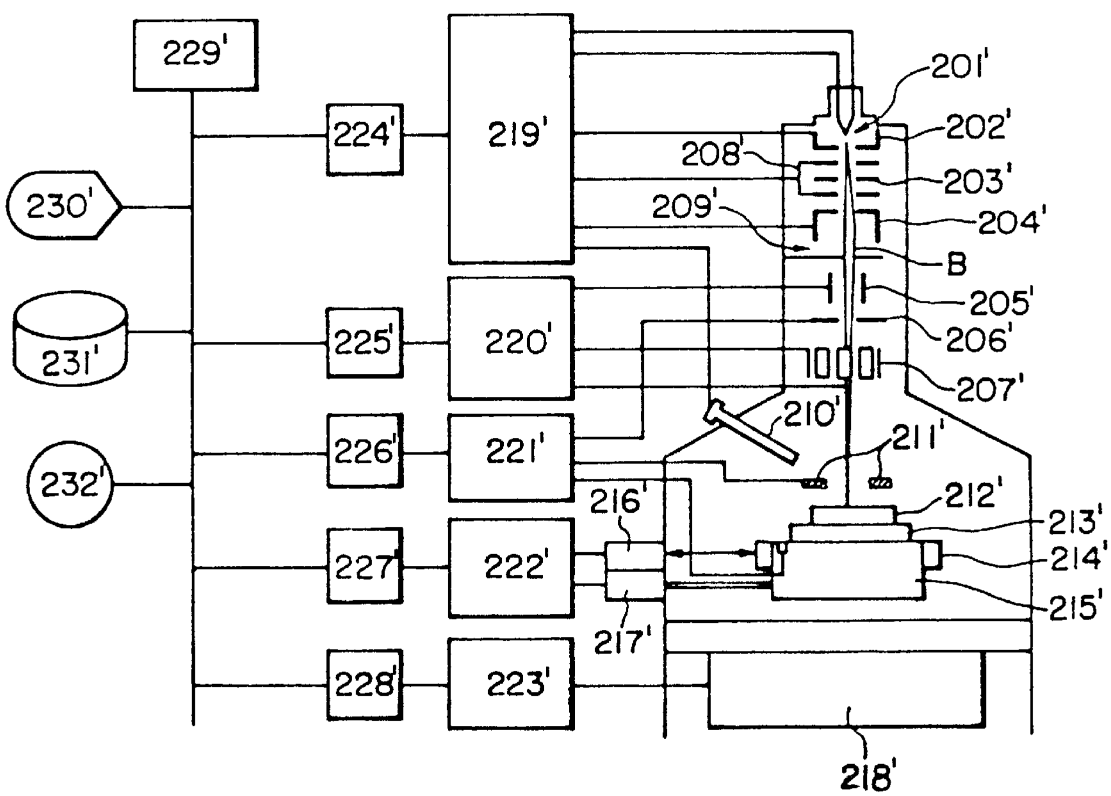
FIG. 15B is a schematic block diagram of a cutting system used for practicing the ion beam cutting method shown in FIG. 15A.
Figure 15C:
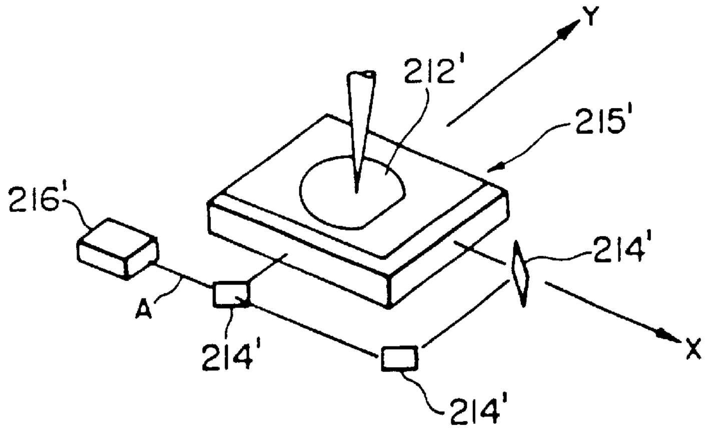
FIG. 15C is an enlarged, schematic, perspective view of a sample stage in the cutting system.
Figure 15D:
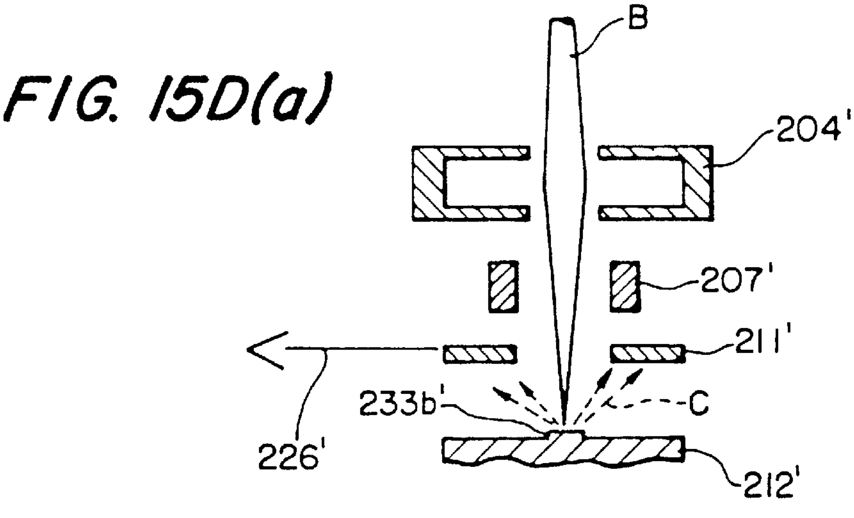
FIG. 15D(*a*) is a schematic explanatory view showing an ion beam scanning state on the surface of a cutting reference mark.
Figure 15D:
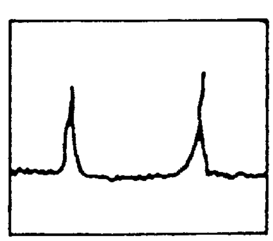
Figure 15E:
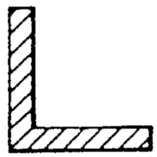
FIGS. 15E(*a*) to (*d*) are explanatory views showing modified examples in planar pattern of cutting reference marks.
Figure 15E:
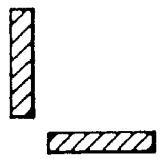
Figure 15E:
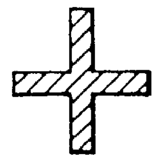
Figure 15E:
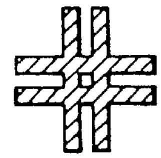
Figure 15F:
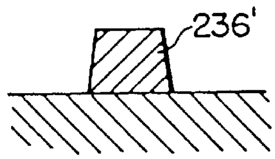
FIGS. 15F(*a*) and (*b*) are explanatory views showing modified examples in sectional shape of cutting reference marks.
Figure 15F:
Figure 15G:
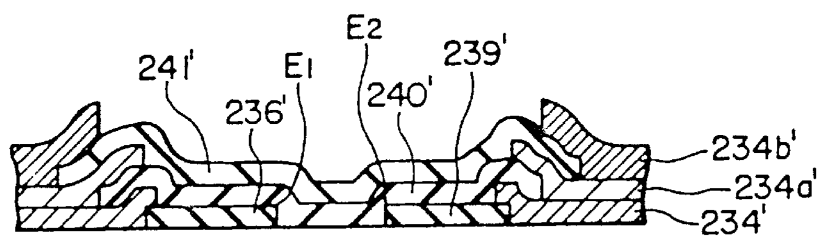
FIG. 15G(*a*) is an enlarged, partial, sectional view showing a further example of a cutting reference mark, and FIG. 15G(*b*) is a schematic plan view thereof.
Figure 15G:
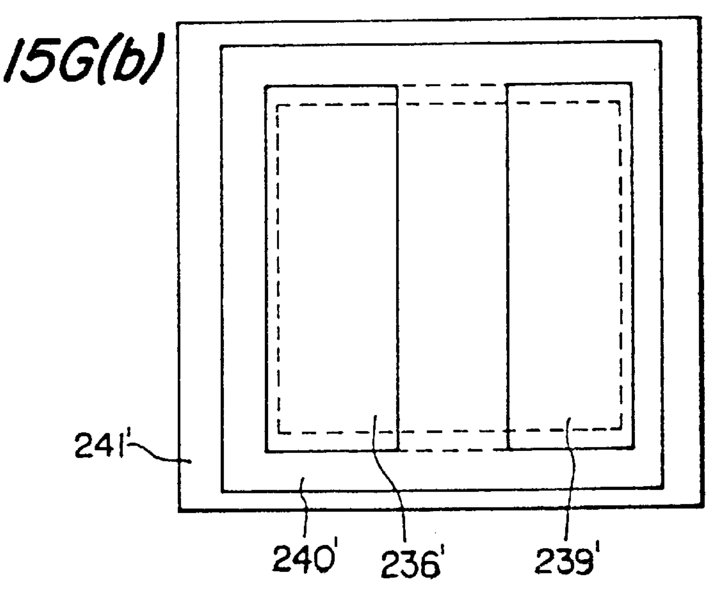

FIG. 15A is an enlarged, partial sectional view of a wafer for explaining a cutting method using an ion beam according to an embodiment 2-I of the invention; FIG. 15B is a schematic block diagram of a cutting system used for practicing the said ion beam cutting method; FIG. 15C is a schematic perspective view showing a sample stage in the cutting system on a larger scale; FIG. 15D(*a*) is a schematic explanatory view showing an ion beam scanning state on the surface of a cutting reference mark; FIG. 15D(*b*) is an explanatory view showing the intensity of secondary electrons detected. Further, FIGS. 15E(*a*) to (*d*) each show a modified example of a planar pattern of a cutting reference mark, and FIGS. 15F(*a*) and (*b* ) each show a modified example in sectional shape of a cutting reference mark. FIG. 15G(*a*) is an enlarged, partial sectional view showing a further example of a cutting reference mark and FIG. 15G(*b*) is a schematic plan view thereof.

As shown in FIG. 15B, the cutting system used for the ion beam cutting method of this embodiment comprises components 201' to 232'.

In FIG. 15B, the reference numeral 201' denotes an ion source emitter disposed at an upper part of the system body and containing an ion source such as, for example, molten metal. Disposed under the ion source emitter 201' is a draw-out electrode 202' to release ions into vacuum. Below the draw-out electrode 202' are disposed a first lens electrode 208' which functions as an electrostatic lens and a first aperture electrode 203' which functions as an aperture mask. Provided below the first aperture electrode 203' are a second lens electrode 204', a second aperture electrode 209', a blanking electrode 205' for controlling ON-OFF of beam radiation, a third aperture electrode 206' and a deflecting electrode 207'.

Under the construction using such various electrodes the ion beam B emitted from the ion source emitter 201' is formed as a focused beam, which is applied onto a wafer 212' as a workplace while being controlled by the blanking electrode 205' and the deflecting electrode 207'.

The wafer 212' is placed on a sample holder 213' disposed on the sample stage 215'. The sample stage 215' is positioned by a stage driving motor 217' while its position is checked by a laser interference length measuring device 216' through laser mirrors 214' attached to side portions of the sample stage 215'.

Above the wafer 212' is disposed a secondary ion/secondary electron detector 211' to detect secodnary ions and secondary electrons emitted from the wafer 212'.

Positioned above the secondary ion/secondary electron detector 211' is an electron shower 210' having a structure which prevents the upper surface of the wafer 212' from being charged.

The interior of the cutting system described above is held in vacuum of means of a vacuum pump indicated at 218' in the figure. The operation of the cutting system is controlled by controllers 219'–223', which in turn are controlled by a control computer 229' through interfaces 224'–228'. In the control computer 229' there are performed input, output and recording of data through a terminal 230', a magnetic disc 231' and an MT deck 232'.

The cutting system described above is constructed so that in accordance with positional data stored in the magnetic disc 231' the sample stage 215' can be moved a predetermined distance in XY directions by the stage driving motor 217' which is controlled by the controller 222'. In this case, a slight deviation between an actual moving distance and the positional data is determined by utilizing interference of laser beams. More particularly, a laser beam A emitted from the laser interference length measuring device 216' is reflected by wall surfaces in X and Y directions of the sample stage 215' through the laser mirrors 214' and the reflected beams are again incident on the laser interference length measuring device 216' and interfere with each other. The information of such positional deviation is fed as necessary to the deflecting controller 220' for controlling the deflecting electrode 207' so that a fine correction of a radiated position of the ion beam B can be effected.

In FIG. 15A, a part of the wafer 212' as a sample is shown on a large scale. The body of the wafer 212' is constituted by a semiconductor substrate 212*a*' comprising a single crystal of silicon (Si) for example. On the semiconductor substrate 212*a*' is formed a multiplayer interconnection comprising three layers. More specifically, as the lowest layer is formed a first wiring layer 235' comprising a first wiring 233' and a first insulation layer 234' formed thereon, a second wiring layer 235*a*' laminated onto the first wiring layer 235' and comprising a second wiring 233*a*' and a second insulation layer 234*a*' formed thereon, and a third wiring layer 235*b*' laminated as the top layer onto the second wiring layer 235*a*' and comprising a third wiring 233*b*' and a third insulation layer 234*b*' formed thereon.

In the above multilayer interconnection, the first, second and third wiring layers 235', 235*a*' and 234*b*' are provided with cutting reference marks 236', 237' and 238', respectively, to be used for cutting the wiring layers. The cutting reference mark 236' may be formed in its planar shape as shown in FIG. 15E(*a*) to (*d*), although its planar shape is not limited thereto. Its section may be in a projecting shape [FIG. 15F(*a*)] of the same structure as that shown in FIG. 15A, or may be such a grooved shape as shown in FIG. 15F(*b*). Various materials, including aluminum (Al), are employable for forming the cutting reference mark 236'. Especially, materials capable of forming the mark in a uniform thickness are desirable. The cutting reference marks 236', etc. are formed simultaneously with the forming of the multilayer wirings.

In FIG. 15A, over the cutting reference mark 236' are successively laminated the first insulation layer 234', second wiring 233*a*', second insulation layer 234*a*' and third wiring 233*b*'. The third wiring 233*b*' of the top layer is exposed to the exterior. Each layer has a uniform thickness of a high accuracy, so that the shape of the cutting reference mark 236' is exactly reflected on the surface of the third wiring 233' positioned just above the mark 236', and the right and left upper edges of the reference mark 236' are reflected as edge portions $E_1$ and $E_2$ in the top third wiring 233*b*'. The edge portions $E_1$ and $E_2$ has a certain extent in the planar direction as compared with the edges of the reference mark 236'. The said extent is proportional to the number of laminated layers and the center between both edges of the reference mark 236' is in exact coincidence with the center of the edge portions $E_1$ and $E_2$. Therefore, it follows that if the edge portions $E_1$ and $E_2$ can be specified positionally, the center of the reference mark positioned in the lowest layer can also be accurately specified inevitably.

Such a position specifying technique will be explained below in more detail. The following description is of the case where positioning is performed on the basis of the cutting reference mark 236' and ion beam is directed to the first wiring 233' of the first wiring layer 235' to cut the wiring.

First, the wafer 212' is placed in a predetermined position of the sample stage 215' of the cutting system and thereafter the vacuum pump 218' is operated to make the interior of the system vacuous to a predetermined degree. Then, the stage driving motor 217' is operated in accordance with the positional data stored in the magnetic disc 231' to move the sample stage 215' up to a position in which the ion beam is just above the reference mark 236' in the first wiring layer. Then, as schematically shown in FIG. 15D(*a*), on the surface of the third wiring 233*b*' of the top layer with the reference mark 236' reflected thereon, the ion beam B is scanned over a range exceeding the edge portions $E_1$ and $E_2$ and secondary electrons C generated are detected. The position of the cutting reference mark located in the lowest layer is grasped on the grasped on the basis of changes in the amount of secondary electrons C detected. It is FIG. 15D(*b*) that shows a detected state of the secondary electrons C. The amount of the secondary electrons increases at the edge portions $E_1$ and $E_2$ of the third wiring 233*b*', giving peak values. From the peak positions in the intensity of the secondary electrons detected there can be calculated positional coordinates of the edge portions of the cutting reference mark 235' and that of the center of the reference mark 236'.

According to this embodiment, the reference mark 236' is not directly exposed to the surface of the wafer 212', but its shape is exactly reflected in the difference in height, i.e. edge portions, of the third wiring 233*b*' of the top layer in proportion to the number of layers. Consequently, a central position of the reference mark located in the lowest layer can be calculated with a high accuracy.

Since a central position of the reference mark 236' in the bottom layer can thus be specified, it is possible to accurately calculated a positional relation of the wiring formed in the bottom layer.

Then, on the basis of the positional information obtained as above, the positional coordinates of the cutting position prestored in the magnetic disc 231' are fed to the controller 222' to operate the stage driving motor 217' whereby the first wiring of the lowest layer can be cut. In FIG. 15A the wiring is cut in a position spaced a distance l from the cutting reference mark 236'. In cutting the wiring 233' positioned in the lowest layer, it is possible to effect positioning on the basis of the edge portions $E_1$ and $E_2$ of the third wiring 233B' of the top layer in which is accurately reflected the reference mark 236' positioned in the bottom layer. Consequently, it is possible to make a positional recognition of an extremely high accuracy, so it is possible to effectively prevent the wiring 233' from being cut erroneously for example.

A brief explanation will now be given about a cutting technique using the ion beam B. The wiring layers are etched at desired depth and width by radiating the ion beam B at a predetermined scanning width for a predetermined time while adjusting the amount of the ion beam B radiated, radiation time, acceleration voltage, or the voltage applied to the deflecting electrode 207'.

In the above description the positioning is performed by recognizing the edge portions $E_1$ and $E_2$ of the top layer wiring 233*b*' in which is reflected the shape of the cutting reference mark 236' positioned in the bottom layer. But the positioning method is not limited to this. The layer overlying the reference mark 236' may be removed by etching in a predetermined range to have the mark 236' exposed to the exterior directly and the bottom layer wiring 233' may be cut with reference to the exposed mark.

The cutting reference mark 236' may be of such a structure as shown in FIG. 15G, not such a single structure as shown in FIG. 15A. More specifically, a first pattern comprising two cutting reference marks 236' and 239' arranged side by side is formed at the same depth as the first wiring 233'. On the first pattern is formed a second pattern 240' directly without interposition of the first insulation layer 234'. Further, a third pattern 241' is directly formed on the second pattern 240'. The first pattern, the second 240' and the third 241' can be formed in the same step as that for wirings (not shown) formed at the same depths as the respective layers. First, second and third insulation layers 234', 234*a*' and 234*b*' positioned above the reference marks 236' and 239' are removed by etching, so the third pattern 241' is in an exposed state. By adopting such a structure without interposition of insulation layers the cutting reference marks 236' and 239' in the lowest layer can be reflected in the shape of the top layer.

Where the parallel reference marks 236' and 239' are used, the right-hand edge of the reference mark 236' positioned left in FIG. 15G is exactly reflected in an edge portion $E_1$ of the third portion 241', while the left-hand edge of the reference mark 239' positioned right is exactly reflected in an edge portion $E_2$ of the third pattern 241'. Therefore, the central position of the edge patterns $E_1$ and $E_2$ corresponds exactly to the central position of the reference marks 236' and 239'. Therefore, when the surface of the third pattern 241' is scanned with an ion beam, the intensity of secondary electrons detected greatly varies at the edge portions $E_1$ and $E_2$ like the case explained in connection with FIG. 15A, so positional coordinates of the edge portions $E_1$ and $E_2$ can be determined accurately. As a result,, from the positional coordinates of the edge portions $E_1$ and $E_2$ it is possible to specify a central position of the cutting reference marks 236' and 239' accurately and it is possible to effect positioning of the cutting region on the basis of the said central positions. Consequently, the cutting region can be positionally specified extremely accurately and can be cut with a high accuracy like the case of FIG. 15A.

Thus, according to this embodiment there can be attained the following effects.

(1) The ion beam cutting, a cutting reference mark 236' for positioning a cutting region is provided in the same layer as the first wiring which is the cutting region, and positioning is performed on the basis of the shape of the top layer wiring 233*b*' in which is exactly reflected the shape of the reference mark 236', whereby the positioning of the cutting region can be effected with an extremely high accuracy even when there is a positional deviation in the horizontal direction between layers. Consequently, it is possible to apply a beam cutting to an exact position in a high accuracy.

(2) The surface of the third wiring 233*b*' formed with edge portions $E_1$ and $E_2$ in which is reflected the edges of the cutting reference mark 236 shown in the above (1) is scanned with an ion beam, and positional coordinates of the edge portions $E_1$ and $E_2$ are specified on the basis of changes in intensity of secondary electrons produced, whereby coordinates of a central position of the reference mark 236' can be specified with a high accuracy, so it is possible to further improve the accuracy of a cutting work using an ion beam.

(3) Two cutting reference marks 236' and 239' are provided side by side and second and third patterns are laminated over those reference marks without interposition of an insulation layer, whereby the edges in opposed positions of those two marks can be reflected more accurately as edge portions $E_1$ and $E_2$ of the top layer. Consequently, it becomes possible to accurately specify a central position of the cutting reference marks 236' and 239' on the basis of positional coordinates of the edge portions $E_1$ and $E_2$ and the cutting accuracy for the cutting region can be further enhanced.

Figure 15H:
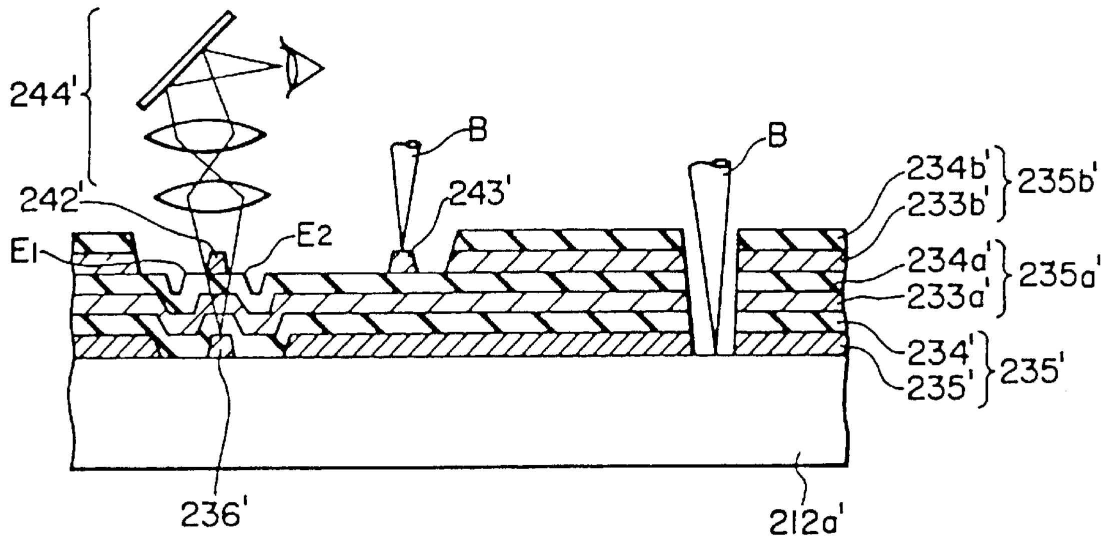
FIG. 15H is an enlarged, partial, sectional view of a wafer for explaining a cutting method using an ion beam according to an embodiment 1-II of the second aspect of the present invention.
Figure 15I:
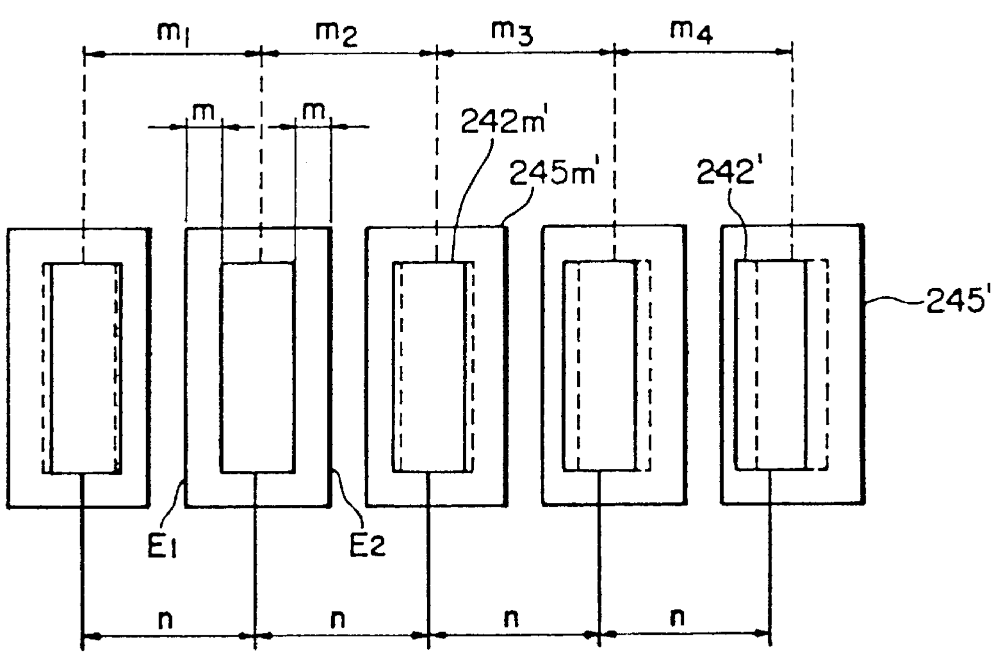
FIG. 15I is an enlarged plan view for explaining a relation between a cutting reference mark and a deviation detecting mark.

FIG. 15H is an enlarged, partial sectional view of a wafer for explaining a cutting method using an ion beam according to an embodiment 2-II of the invention, and FIG. 15I is an enlarged plan view of both a cutting reference mark and a deviation detecting mark for explaining the relation of both marks.

Embodiment 2-II is for cutting a wiring disposed in a lower wiring layer of an LSI using a cutting system having substantially the same functions as in the cutting system used in the foregoing embodiment 2-I. A difference resides in how to specify a position of a cutting reference mark 236' which is provided for the purpose of cutting the first layer.

More specifically, a part of an LSI applied to this embodiment 2-II is shown in FIG. 15H. Like the previous embodiment 2-I, this LSI has a multilayer interconnecting comprising three layers which are a first wiring 235', a second wiring layer 235*a*' and a third wiring layer 235*b*'. The first wiring layer 235' is formed with a cutting reference mark 236' for use as a positioning reference in cutting the first wiring 233'. In this embodiment 2-II moreover, a deviation detecting mark 242' for detecting a cutting deviation between layers is formed in the region of the third wiring layer 235*b*' located above the cutting reference mark 236'. The third wiring layer 235' is further formed with an auxiliary cutting mark 243'. In FIG. 15B, a part of the third wiring layer 235*b*' is removed by etching to expose the deviation detecting mark 242' and the auxiliary cutting mark 243' to the exterior.

In this embodiment 2-II, first an amount of deviation between the cutting reference mark 236' and the deviation detecting mark 242' is measured using an optical microscope 244'. This amount of deviation appears as the total of interlayer deviation quantities between the first wiring layer 235' and the third wiring layer 235*b*'. As shown in FIG. 15I, the deviation detecting mark 242' is provided in a plural number in a parallel direction. These marks are formed in such a positional relation that their spacings are wider at the rightmost end in FIG. 15I like, from the leftmost end, $m_1$3.6 μm, $m_2$=3.8 μm, $m_3$=4.2 μm and $m_4$=4.4 μm. On the other hand, the reference patterns 245' are formed at equal intervals of, say, n=4.0 μm.

The deviation detecting marks 242' and the reference patterns 245' are designed in such a positional relation that in the case where such five sets of patterns as shown in FIG. 15I are set, centrally positioned, deviation detecting mark 242 m and reference pattern 245 m are coincident in their center lines. In other words, when there is a planar, positional deviation between any layers from the bottom to the top layers, the centrally positioned, deviation detecting mark 242 m and reference pattern 245 m are not coincident in their axes. In FIG. 15I illustrating this embodiment 2-II, the axis of the central, deviation detecting mark 242 m and that of the central, reference pattern 245 m are not in coincidence, while the deviation detecting mark 242' and the reference pattern 245' both positioned second from the left are coincident in their axes. Therefore, it can be easily seen that in FIG. 15I the top layer is in deviation by 0.2 μm leftwards with respect to the lowest layer.

A central axis position of each reference pattern can be easily recognized by measuring the distance m of each deviation detecting mark 242' from each of the edge portion $E_1$ and $E_2$ of each reference pattern 245'.

Thus, where there is a deviation of 0.2 μm between the deviation detecting mark 242' and the cutting reference mark 236', a coordinate value is corrected by 0.2 μm rightwards with respect to the auxiliary cutting mark 243' at the time of positioning the cutting region with reference to the auxiliary mark 243'. As a result, even in the case of specifying a position of the cutting region with reference to the auxiliary mark 243' located in the third wiring layer, this can be done in an extremely high accuracy and the first wiring 233' can be cut highly accurately in an exact position.

Although only transverse relations have been referred to in the above description, positional deviations in the vertical direction in the figure can also be dealt with in the same manner.

It is to be understood that the invention is not limited to the embodiment described above, but that various modifications may be made within the scope not departing from the gist of the invention.

For example, as means for positional recognition through scanning with an ion beam, the above embodiment utilizes changes in intensity of secondary electrons detected, there by be utilized the intensity of secondary electrons detected, there may be utilized the intensity of secondary ions detected or changes of ionic species.

In the above description the present invention has been applied mainly to wafers as a background utilization field of the invention, but the invention is not limited thereto. For example, the present invention is applicable to all of those having a multilayer structure.

An effect obtained by a typical invention disclosed herein will now be explained. In cutting a cutting region positioned in an internal layer at a predetermined depth of a sample under radiation of an ion beam, an ion beam radiating position is determined by reference to a cutting reference mark formed at a depth just the same or almost the same as the depth of the cutting region, the said reference mark serving as a reference in positioning the cutting region, whereby the cutting work using the ion beam can be done in an exact position.

Embodiment 3

Figure 16A:
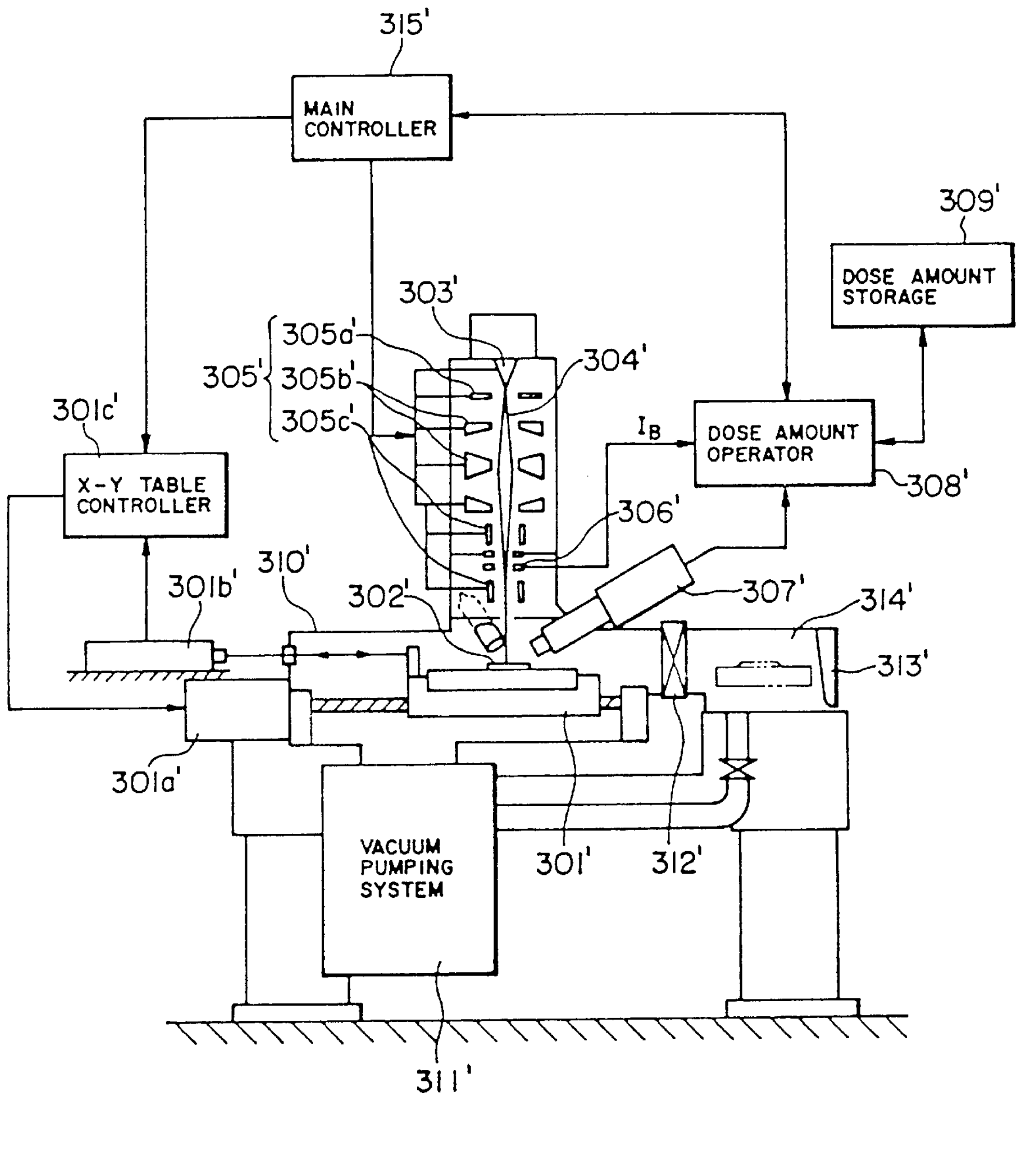
FIG. 16A is a block diagram showing a principal portion of a cutting system using an ion beam according to an embodiment 3 of the second aspect of the present invention.
Figure 16B:
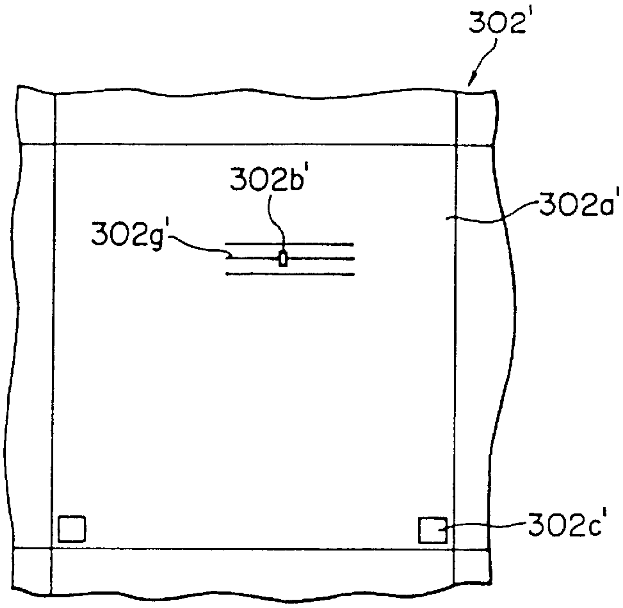
FIG. 16B is a plan view showing an example of a semiconductor device of the invention to be subjected to a cutting work with an ion beam.
Figure 16C:
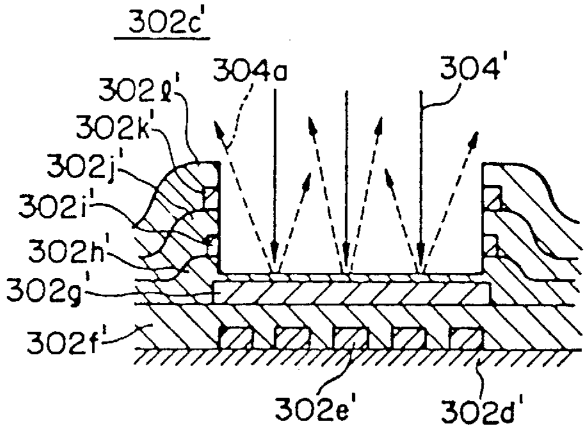
FIG. 16C is a sectional view of a part of the semiconductor device.
Figure 16D:
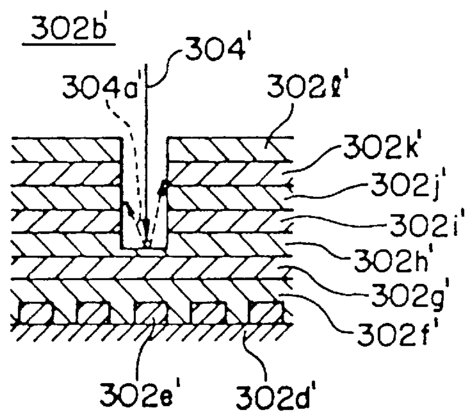
FIG. 16D is also a sectional view of a part of the semiconductor device.

FIG. 16A is a block diagram showing a principal portion of a cutting system using an ion beam according to an embodiment 3 of the present invention; FIG. 16B is a plan view showing an example of a semiconductor device of the present invention to be subjected to a cutting work using an ion beam; and FIGS. 16C and 16D are each a sectional view of a part of the semiconductor device.

On an X-Y table 301' movable in a horizontal plane there is placed a semiconductor wafer 302' (workpiece) removably at a predetermined posture, the wafer 302' having a plurality of semiconductor devices 302*a*' formed by having a thin film of a predetermined material deposited thereon through repetition of photolithography.

Each semiconductor device 302*a*' on the semiconductor wafer 302' is formed with not only an element region 302*b*' (a second part) but also a trial cutting region 320*c*' (a first party).

In the element region 302*b*' of the semiconductor device 320*a*' there is formed a logical element having a multilayer interconnection structure comprising an insulator substrate 302*d*' and a laminate formed thereon which laminate comprises a first aluminum wiring layer 302*e*', an inter-layer insulating film 302*f*', a second aluminum wiring layer 302*g*', an inter-layer insulating film 302*h*', a third aluminum wiring layer 302*i*', an inter-layer insulating film 302*j*', a fourth aluminum wiring layer 302*k*' and a final protective film 302*l*'. The trial cutting region 302*c*' is the same as the element region 302*b*' in the material deposition structure in the depth direction and also in the formation history of such disposition structure.

The X-Y table 301' is driven through a servomotor 301*a*' and it is constructed so that a displacement thereof is detected by a laser interferometer 310*b*', which displacement can be controlled precisely in a closed loop by an X-Y table controller 301*c*'.

Above the X-Y table 301' is provided on ion source 203' facing downwards, which is constructed so that an ion beam 304' comprising gallium (Ga) ion for example is radiated toward the semiconductor wafer 302' placed on the X-Y table 301'.

In the path of the ion beam 304' extending from the ion source 303' to the semiconductor wafer 302' there is disposed an ion beam optical system 305' comprising a draw-out electrode 305*a*', a convergent lens group 305*b*' and an electrostatic deflecting lens group 305*c*', whereby there are performed acceleration, convergence and selection of ions controlled the ion beam 304' as well as control of an incident position of the ion beam 304' relative to the semiconductor wafer 302'.

Also provided in the path of the ion beam 304' is an ion beam current detecting means 306' for detecting an ion beam current $I_B$.

In the vicinity of the X-Y table 301' with the semiconductor wafer 302' placed thereon is disposed a detecting means 307' for detecting charged particles such as secondary ions or secondary electrons or an emission spectrum, indicated at 304*a*', generated from the semiconductor wafer 302' upon incidence of the ion beam 304'. Together with the ion beam current detecting means 306', the detecting means 307' is connected to a dose amount operator 308'.

The dose amount operator 308' measures the time required for cutting each of the layers constituting the multilayer interconnecting structure of each semiconductor device 302*a*' formed on the semiconductor wafer 302', on the basis of a change of secondary ion species, a change in the amount of secondary electrons, or a change of emission spectrum, provided from the semiconductor wafer 302 and detected through the detecting means 307'. The dose amount operator 308' further functions to integrate the ion beam current $I_B$ with respect to each required time to thereby calculate a dose amount required for cutting unit area of each constituent layer of the multilayer interconnection structure of the semiconductor device 302*a*'. The dose amount thus calculated is stored in a dose amount storage 309'.

The X-Y table 301' ion source 303', ion beam optical system 305', ion beam current detecting means 306' and detecting means 307' are disposed within a vacuum vessel 310'.

To the vacuum vessel 310' is connected an exhausting means 311' constituted, for example, by connecting vacuum pumps in multi-stage, whereby the interior of the vessel 310' can be exhausted to a desired degree of vacuum.

Further, a stand-by exhaust chamber 314' having an outer door 313' is connected to the vacuum vessel 310' through a gate valve 312', and thus the semiconductor wafer 302' can be taken in and out with respect to the X—Y table 310' without impairment of the internal vacuum degree of the vacuum chamber 310'.

The X-Y table controller 310*c*', ion beam optical system 305', dose amount operator 308' and exhausting means 311' are together controlled by a main controller 315' comprising a control computer, etc.

The operation of this embodiment will be described below.

First, the X-Y table 301' is moved as necessary whereby the trail cutting region 302*c*' of a semiconductor device 302*a*' formed on the semiconductor wafer 302' is positioned just under the ion source 303'.

Next, upon radiation of the ion beam 304' there is started operation for cutting the trail cutting region 302*c*' in a cutting plane area Ao [$\mu m^2$]. This area Ao is set sufficiently large relative to a required cutting depth so that the aspect ratio of the concave of the cutting region becomes small, that is, charged particles or emission spectrum 304*a*' generated from the cutting region is detected sufficiently by the detecting means 307'.

At this time, the dose amount operator 308' determines a time $t_i$ (i=1, 2, 3, . . . ) required for cutting each of the final protective film 302*l*', fourth aluminum wiring layer 302*k*', inter-layer insulating film 302*j*'. . . , on the basis of a switching time of secondary ion species, intensity of secondary electrons, or a changing time of emission spectrum, with respect to the charged particles or emission spectrum 304*a*' detected through the detecting means 307'. At the same time it measures an ion beam current $I_{B'}$ [nA] through the ion beam current detecting means 306'.

If the sputter rate of the constituent material of each layer is $k_i$ [$\mu m^3 s^{-1} nA^{-1}$], a cutting depth $Z_i$ [$\mu$m] at a cutting time $t_i$ is given as follows.

$$Z_i = k_i A_0^{-1} \int_0^{t_i} I_B \, dt$$

Thus, the dose amount $D_i$ required for cutting unit area of each layer can be obtained as follows:

$$\begin{aligned} D_i &= Z_i / k_i \\ &= 1 / A_0^{-1} \int_0^{t_i} I_B \, dt \ [\text{nA} \cdot \text{s} \cdot \mu\text{m}^{-2}] \end{aligned}$$

Thus, the dose amount operator 308' calculates the dose amount $D_i=Z_i/k_i$ required for cutting per unit area of each layer, on the basis of the cutting time $t_i$ required for cutting each layer and the ion beam current $I_B$ during cutting, and then stores the calculated dose amount in the dose amount storage 309'. (First stage)

Then, the main controller 315' reads the dose amount $D_i$ required for cutting per unit area of each layer stored in the dose amount storage 309' and calculates a target dose amount $D_{TOT}$ in cutting the element region 302*b'*.

Where a hole of an area $A_1$ [$\mu m^2$] extending from the final protective film 302*l*' as the top layer to the second aluminum wiring layer 302*g*' is to be formed in the element region 302*b*' and the second aluminum wiring layer 302*g*' is to be cut, the dose amount D required per unit area is:

$$\begin{aligned} D &= D_1 + \cdots D_6 + D_7 \cdot C_1 \\ &= Z_1 / k_1 + \cdots + Z_5 / k_6 + (Z_7 / k_7) C_1 \ [\text{nA} \cdot \text{s} \cdot \mu\text{m}^{-2}] \end{aligned}$$

wherein $C_1$ represents an excess cutting coefficient which is determined in consideration of variations in cutting depth in the final cutting layer, and in this case it is set to say 0.2 or so, $Z_1/k_1$+ . . . +$Z_6/k_6$ represents a predetermined cutting quantity and $(Z_7/k_7)C_1$ represents an excess cutting quantity.

The target dose amount $D_{TOT}$ required for cutting the entire hole to be formed in the element region 302*b*' is obtained as:

$$D_{TOT} = D \cdot A_1 \cdot (1 / f(a)) \ [\text{nA} \cdot \text{s}]$$

wherein f(a) is a coefficient indicative of a cutting efficiency which varies according to the aspect ratio a of the hole to be formed in the element region 302*b'*.

$$f(a) \leqq 1.$$

With increase of the aspect ratio a, the cutting efficiency lowers and f(a) decreases, so $D_{TOT}$ increases.

Simultaneously with the above calculation of $D_{TOT}$, the X-Y table is moved as necessary, whereby the object element region 302*b*' is positioned just under the ion source 303'.

Then, cutting for the region of a cutting area $A_1$ is started while observing the ion beam current $I_B$ capable of being measured easily without being influenced by the aspect ratio of the cutting region and also observing the cutting time. The cutting work is continued until a dose amount obtained by integrating the ion beam current $I_B$ with respect to a cutting time reaches the target dose amount $D_{TOT}$. At the end of cutting there will be obtained a hole in the element region 302*b*', having the area $A_1$ and a depth which is neither excessive nor deficient, and in this state the second aluminum wiring layer 302*g*' is sure to be cut, whereby it is possible to effect logical correction of the semiconductor device 302*a*', take measures against a defective design or make analysis of a defect accurately without damage to the underlying insulating layer.

(Second stage)

Thus, according to this embodiment there can be obtained the following effects.

(1) The semiconductor devices 302*a*' formed on the semiconductor wafer 302' are each provided with the element region 302*b*' and the trial cutting region 302*c*' and in the trial cutting region 302*c*' there is performed cutting through the first stage of determining the dose amount $D_1$ required for cutting per unit area of each constituent layer of a multilayer interconnection structure while fully detecting charged particles or emission spectrum 304' generated from the cutting region at a sufficiently large cutting area as compared with the depth in the trail cutting region 302*c*', and determining the target dose amount $D_{TOT}$ on the basis of the dose amount $D_1$, and further through the second stage of radiating the ion beam 304' to the object element region 302*b*' while determining a dose amount on the basis of an ion bean current $I_B$ which can be observed easily regardless of the aspect ratio of the cutting region and also on the basis of a cutting time, and continuing the cutting work until the dose amount during cutting reaches the target dose amount $D_{TOT}$. Therefore, the depth of the hole of a high aspect ratio formed by the radiation of the ion beam 304' in the element region 302*b*' can be controlled accurately.

(2) As a result of the above effect (1) it is possible to effect logical correction, take measures against a defective design or make analysis of a defect by cutting and exposing a wiring layer using an ion beam in a semiconductor device 302*a*' or other high density logical elements.

(3) It is possible to effect a cutting work using an ion beam while controlling the cutting depth precisely even in a semiconductor device 302*a*' wherein the thickness $Z_i$ of each layer in the depth direction and the sputter rate $k_i$ of the ion beam 304' for the constituent material of each such layer are unknown.

(4) As a result of the above effects (1) to (3) it is possible to improve the efficiency of such operations as logical correction, taking measures against a defective design or analysis of a defect in a cutting work using an ion beam in a high density logical element.

It goes without saying that the invention is not limited to the above concrete embodiment and that various modifications may be made within the range not departing the gist of the invention.

Although in the above description the invention was applied to making logical correction, taking measures against a defective design or making analysis of a defect using an ion beam in a logical element as a background utilization field of the invention, the invention is not limited thereto, but can be applied widely to ion beam cutting techniques at large for which is required a precise control for the depth of a cutting region having a high aspect ratio.

A brief description will be given below about effects which are obtained by a typical invention disclosed herein.

In the semiconductor device there is provided a trial cutting region having the same structure in the depth direction and formation history as the element region, so in performing a cutting work using an ion beam with a view to making logical correction, taking measures against a defective design or making analysis of a defect with respect to the semiconductor device, cutting is performed on trial in the trial cutting region, whereby the dose amount per unit area of each layer can be determined exactly in advance and so a hole of a high aspect ratio can be formed at an accurate depth in the element region by the radiation of ion beam.

The ion beam cutting system includes an ion source, an ion beam optical system for controlling an ion beam emitted from the ion source, a detecting means for detecting charged particles or emission spectrum generated from a cutting region of a workpiece, an ion beam current measuring means, a dose amount operator for determining a time required for cutting each constituent layer of the workpiece on the basis of a change of the charged particles or emission spectrum generated from the workpiece and integrating an ion beam current measured during cutting of each said layer with respect to the said required time, thereby calculating a dose amount required for cutting per unit area of each said layer in the workpiece, and a dose amount storage for storing the calculated dose amount required for cutting per unit area of each said layer. Cutting for a second region of the workpiece is performed through a first stage of determining a dose amount required for cutting per unit area of each said layer in a first region of the workpiece and storing it in the dose amount storage and further through a second stage of setting a target dose amount required for cutting up to a desired depth in the second region of the workpiece on the basis of the dose amount required for cutting per unit area of each said layer in the first region of the workpiece and stored in the dose amount storage, and continuing the cutting work until a dose amount obtained by integrating an ion beam current during cutting with respect to a cutting time reaches the target dose amount. For example, therefore, even when the second region of the workpiece is in a concave shape of a high aspect ratio having a large depth as compared with the cutting area and so it is difficult to control the cutting depth on the basis of a detected amount of secondary ions or secondary electrons generated from the cutting region, it is possible to set an exact target dose amount according to the cutting depth of the second region on the basis of the dose amount per unit area of each layer predetermined in the cutting of the first region and stored in the dose amount storage, and the cutting depth can be controlled precisely by monitoring the dose amount obtained by integrating an ion beam current detectable easily irrespective of the shape of the cutting region with respect to time.

Embodiment 4

An embodiment 4 of the present invention will be described below concretely with reference to the drawings. In all of the drawings for illustration of this embodiment, the components having the same functions are indicated by the same reference numerals, and repeated explanations will be omitted.

Figure 17A:
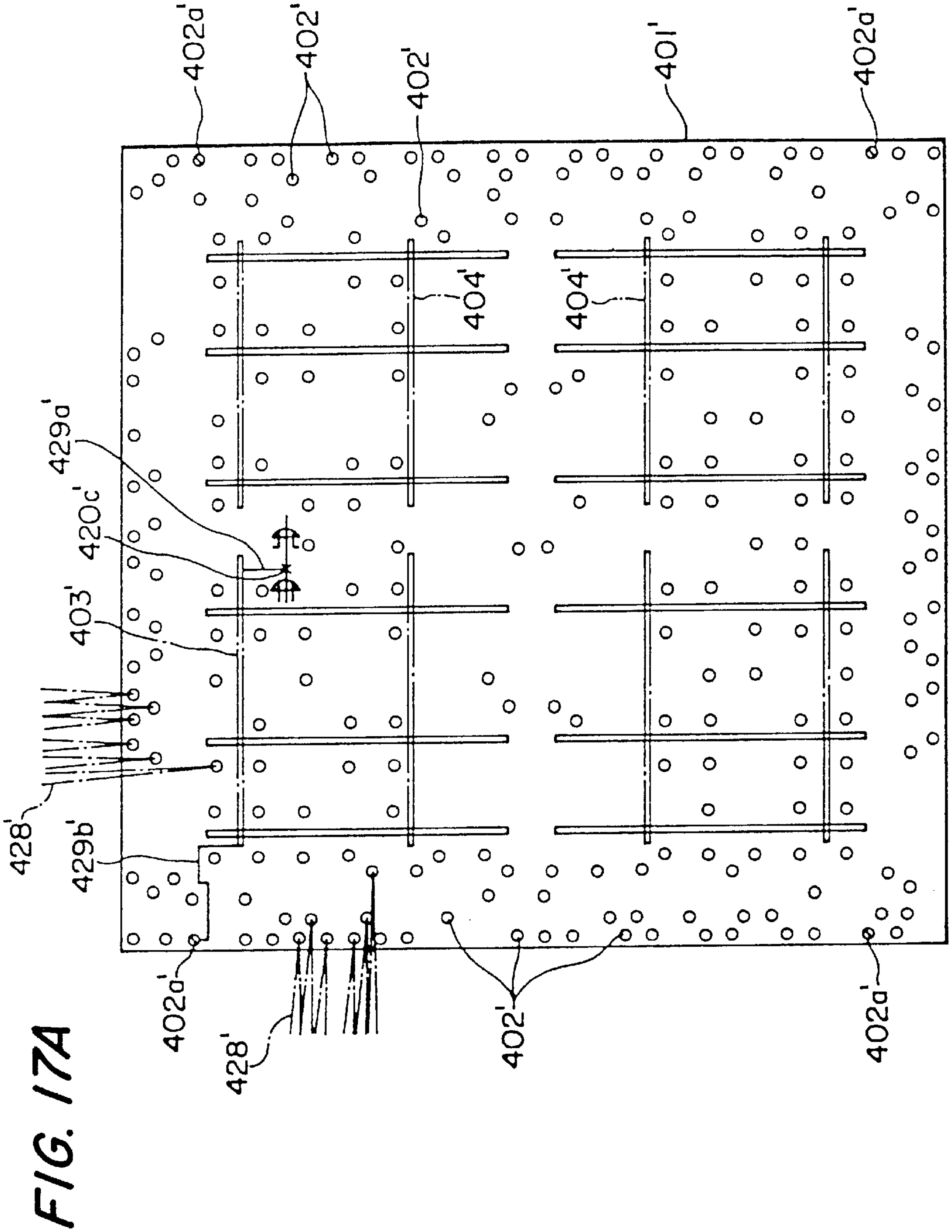
FIG. 17A is a plan view showing a bipolar LSI according to an embodiment 4-I of the second aspect of the present invention.

FIG. 17A is a plan view showing a bipolar LSI according to an embodiment 4-I of the invention. As shown in the same figure, in the bipolar LSI of this embodiment, a large number of bumps 402' are provided throughout the whole surface of a semiconductor chip 401' such as, for example, a square, P-type silicon chip. The bumps 402' comprise bumps for the supply of an electric power as a power source of the LSI, including a negative potential $V_{EE}$ (e.g. −3V), a negative potential $V_{TT}$ (e.g. −2V) and $V_{CC}$ [e.g. GND(OV)] (see FIG. 17C), and bumps for the input and output of signals. These bumps 402' are connected to an internal circuitry of the LSI through, for example, a fourth aluminum wiring layer not shown in FIG. 17A.

In this embodiment, auxiliary bumps 402*a*' are provided at the four corners of the semiconductor chip 401' in addition to the bumps 402'. In a completed state of the LSI, the auxiliary bumps 402*a*' are not connected by wiring to the internal circuitry and are in an electrically floating state.

Numerals 403' and 404' represent auxiliary wirings comprising aluminum films of, for example the third and fourth layers respectively. In this embodiment they are provided each in a plural number perpendicularly to each other. Like the auxiliary bumps 402*a*', the auxiliary wirings 403' and 404' are also in an electrically floating state. Due to the provision of these auxiliary wirings 403' and 404', later-described connecting wirings 429*a*' and 429*b*' formed by laser CVD can be made short. The connecting wirings 429*a*' and 429*b*' are relatively time-consuming in their formation and are usually constituted by a metal higher in resistivity than aluminum, so a smaller length thereof is advantageous in decreasing the wiring resistance. In this case, the auxiliary wirings 403' are disposed between signal wirings (not shown) comprising the aluminum film of the third layer, while the auxiliary wirings 404' are disposed between power wirings (not shown) comprising the aluminum film of the fourth layer.

Figure 17B:
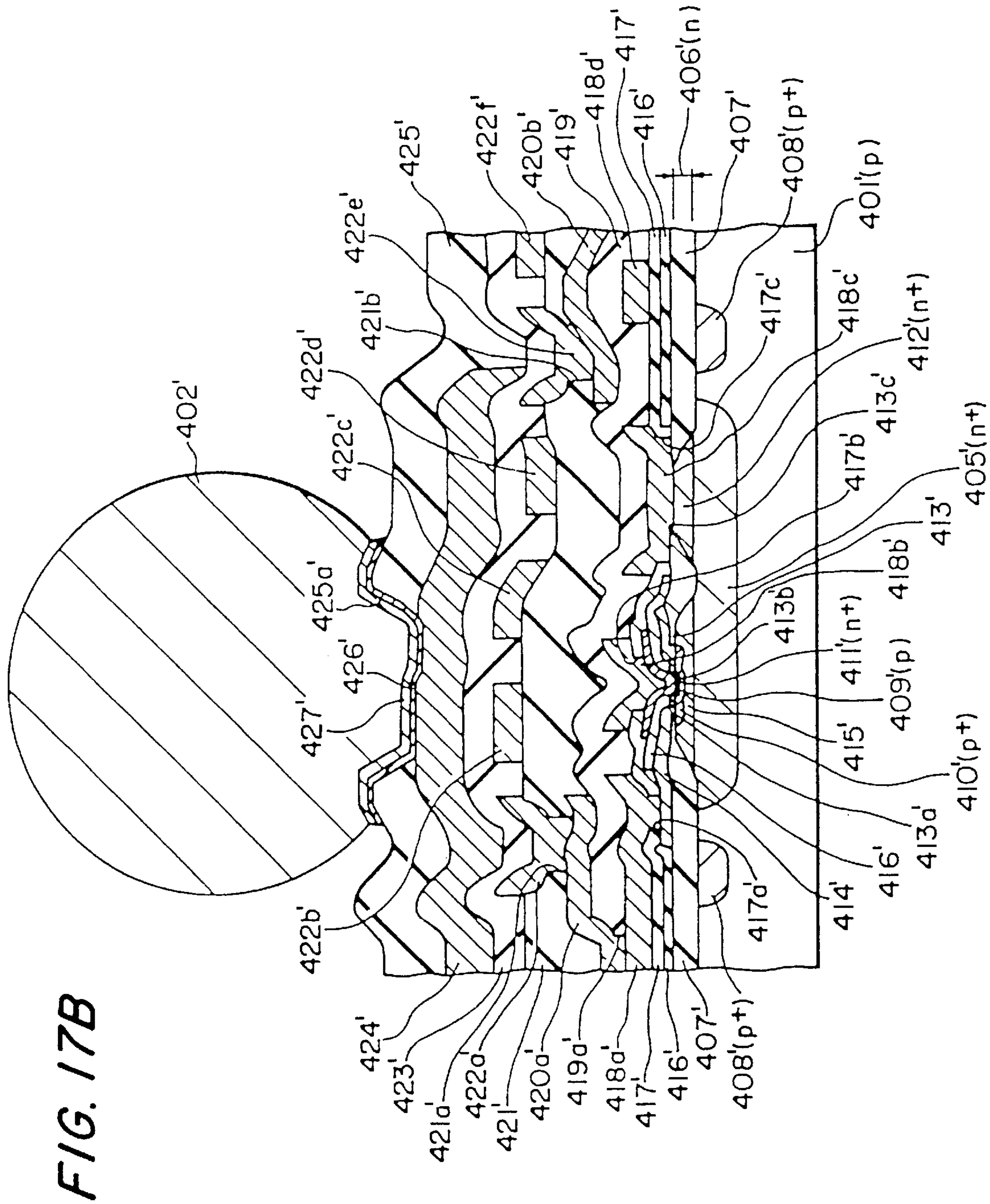
FIG. 17B is a sectional view of a principal portion of the bipolar LSI shown in FIG. 17A.

FIG. 17B is a sectional view of a principal portion of the bipolar LSI shown in FIG. 17A.

Figure 17C:
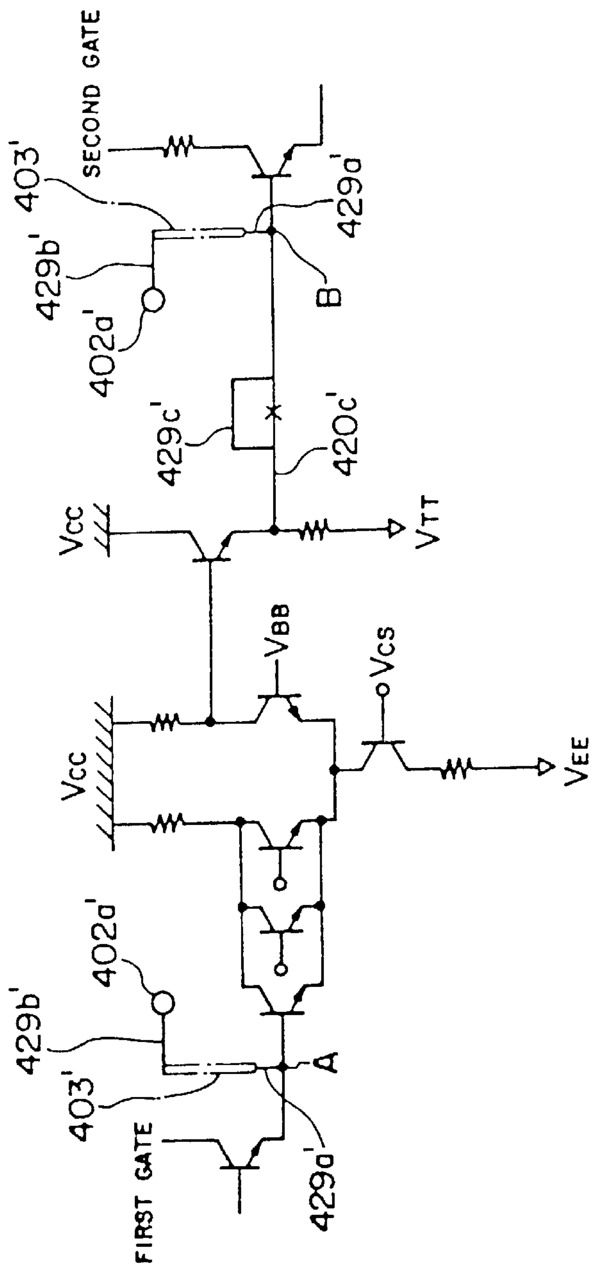
FIG. 17C is a circuit diagram showing an ECL 3-input OR gate which constitutes the bipolar LSI shown in FIG. 17A.
Figure 17D:
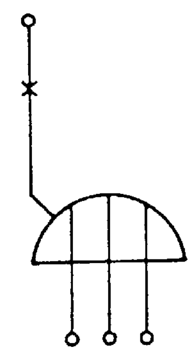
FIG. 17D is a symbolic diagram of the ECL 3-input OR gate shown in FIG. 17C.

In the bipolar LSI of this embodiment, as shown in FIG. 17B, a buried layer 405', which is n+ type for example, is provided in the surface of the semiconductor chip 401' and an epitaxial layer 406' of n− type silicon for example is formed on the chip 401'. Further, a field insulating film 407' such as, for example, $SiO_2$ film is formed at predetermined portions of the epitaxial layer 406' to effect inter-element separation and intra-element separation. Below the field insulating film 407' is provided a channel stopper region 408' of say p+ type. In the portion of the epitaxial layer 406' surrounded by the field insulating film 407' there are formed an intrinsic base region 409' of a p type and a graft base region 410' of a p+ type, with an emitter region 411' of a n+ type being formed in the intrinsic base region 409'. An npn type bipolar transistor is constituted by the emitter region 411', the intrinsic base region 409' and a collector region located below the intrinsic base region 409', the collector region comprising the epitaxial layer 406' and the buried layer 405'. In this embodiment, a plurality of such npn type bipolar transistors and resistors (not shown) are used to constitute such an ECL (Emitter Coupled Logic) 3-input OR gate as shown in FIG. 17C. In FIG. 17C, $V_{BB}$ is −1.2V and Vcs is −1.85V.

Numeral 412' denotes a collector take-out region of n+ type connected to the buried layer 405' and numeral 413' denotes an insulating film such as, for example, $SiO_2$ film contiguous to the field insulating film 407'. The insulating film 413' has openings 413*a*' to 413*c*' in corresponding relation to the graft base region 410', emitter region 411' and collector take-out region 412', respectively. Through the opening 413*a*' a base draw-out electrode 414' constituted by a polycrystalline silicon film is connected to the graft base region 410', while through the opening 413*b*' there is provided a polycrystalline silicon emitter electrode 415' on the emitter region 411'. Numerals 416' and 417' each denote an insulating film such as, for example, $SiO_2$ film.

Numerals 418*a*' to 418*d*' represent first-layer wirings each formed by an aluminum film for example. The wiring 418*a*' is connected to the base draw-out electrode 414' through an opening 417*a*' formed in the insulating film 417'; the wiring 418*b*' is connected to the polycrystalline silicon emitter electrode 415' through an opening 417*b*'; and the wiring 418*c*' is connected to the collector take-out region 412' through an opening 417*c*' and the opening 413*c*'. Numeral 419' denotes an inter-layer insulating film comprising, for example, an SiN film formed by plasma CVD, a spin-on-glass (SOG) film and an SiO film formed by plasma CVD. On the inter-layer insulating film 419' there are provided second-layer wirings 420*a*' and 420*b*' each formed by an aluminum film. The wiring 420*a*' is connected to the wiring 418*a*' through a through hole 319*a*' formed in the inter-layer insulating film 419'. Numeral 421' denotes an inter-layer insulating film like the film 419'. On the inter-layer insulating film 421' are formed third-layer wirings 422*a*' to 422*f*' each constituted by an aluminum film for example. The wiring 422*a*' is connected to the wiring 420*a*' through a through-hole 421*a*' formed in the inter-layer insulating film 421' and the wiring 422*e*' is connected to the wiring 420*b*' through a through-hole 421*b*'. Further, numeral 423' denotes an inter-layer insulating film like the films 419' and 421'. On the inter-layer insulating film 423' is formed a fourth-layer wiring 424' by an aluminum film for example. The wiring 424' has large width and thickness as compared with the wirings of the lower layers so as to permit a large current flow. Numeral 425' denotes a protective film comprising an SiN film by plasma CVD for example and an SiO film formed in the same manner. On the protective film 425' is formed an opening 425*a*' and, for example, a chromium (Cr) film is formed on the wiring 424' through the opening 425*a*'. And on the Cr film 426' are formed the bumps 402' by, for example, a lead (Pb)—tin (Sn) alloy solder through say a copper (Cu)—tin (Sn) intermetallic compound 427'. The auxiliary bumps 402*a*', also formed by a Pb-Sn alloy solder, are provided on the fourth-layer aluminum film not connected to the internal circuitry, through the Cr film 426' and the intermetallic compound layer 427'.

The following description is now provided about the method of measuring a potential of a defective part in the bipolar LSI constructed as above. This potential measurement may be made in a state of either wafer or chip.

As shown in FIG. 17A, the LSI is subjected to a probe check using an LSI tester in accordance with a predetermined test program. A probe card used in this probe check is provided with probes 428' in the same number as the bumps 402' and auxiliary bumps 402*a*'. The probe card permits the probes 428' to be raised for all of the bumps 402' and auxiliary bumps 402*a*'. It is here assumed that as a result of having probed the LSI the internal circuitry proved to involve a defective gate and the position of a defective part became clear, which defective part is indicated by the mark "x" in FIG. 17A.

Next, by a later-described method there are formed a connecting wiring 429*a*' by say molybdenum (Mo) which wiring connects the above defective part to the auxiliary wiring 403' located at the shortest distance from the defective part, as well as a connecting wiring 429*b*' by say Mo which wiring connects the said auxiliary wiring 403' to an auxiliary bump 402*a*', whereby the defective part is connected to the defective bump 402*a*'.

Thereafter, a probe check is made again using the LSI tester to measure a potential of the defective part.

According to this embodiment, as described above, a defective part can be measured for potential by raising the probes 428' for the auxiliary bumps 402*a*' using the probe card; besides, in the potential measurement, the probes 428' can be raised for all the power bumps to effect the supply of electric power. Therefore, the potential of the defective part can be measured certainly and that accurately. Thus, the analysis of a defect in the LSI can be done with a high accuracy and that rapidly. By feeding the result of this analysis of a defect back to the LSI design or manufacturing process there can be attained shortening of the period required for the development of LSI.

The following description is now provided about the method of forming the aforementioned connecting wirings 429*a*' and 429*b*'.

Figure 17E:
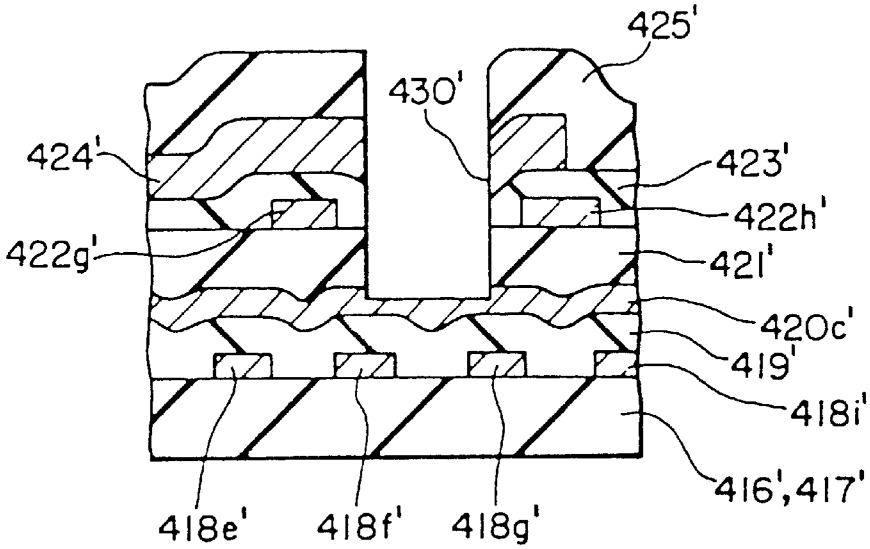
FIGS. 17E to 17H are sectional views for explaining step by step a method for forming a wiring for connection.

As shown in FIG. 17E, a focused ion beam (FIB) of gallium (Ga) is applied to the surface portion of the semiconductor chip 401' indicated by the mark "x" in FIG. 17A to form a through-hole 430' through the fourth-layer wiring 424', thereby exposing the surface of, for example, the second-layer aluminum wiring 420*c*' (an output wiring of the gate) of the portion to be measured for potential. The through-hole 430' has a square sectional shape, for example 5 $\mu$m in side length and a depth of say 8 $\mu$m (see FIG. 17E). In FIG. 17E, numerals 418*e*', 418*f*' and 418*g*' denote aluminum wirings of the first layer and numerals 422*a*' and 422*h*' represent aluminum wirings of the third layer.

Figure 17F:
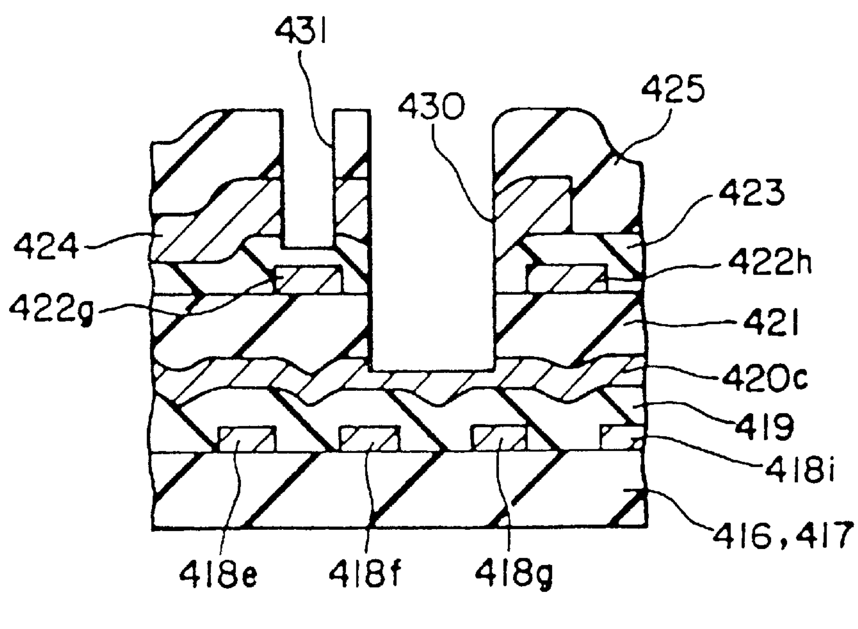

Next, as shown in FIG. 17F, the focused ion beam is again applied to a peripheral part of the through-hole 430' to form a groove 431' reaching the inter-layer insulating film 423'. For example, the groove 431' has a width of 2 $\mu$m and a depth of 6 $\mu$m. With the groove 431' it is possible to prevent contact of the connecting wiring 429*a*' with the wiring 424' of the fourth layer, so it is possible to prevent short-circuit between the wirings 429*a*' and 424'.

Figure 17G:
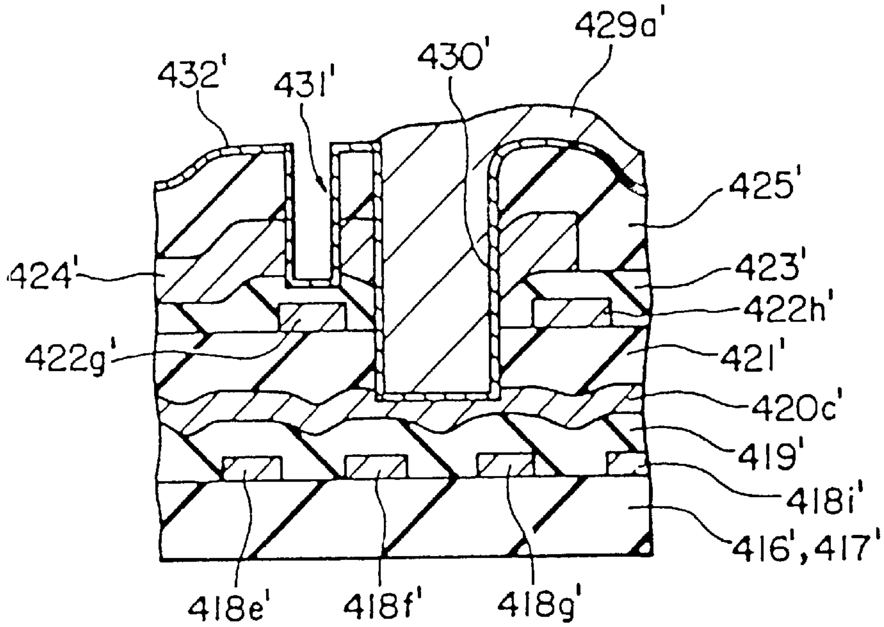

Then, as shown in FIG. 17G, a Cr film 432' having a thickness of 200 to 300 Å is formed throughout the entire surface by, for example, sputtering and thereafter a connecting wiring 429*a*' is formed by laser CVD using a reactive gas such as, for example, $Mo(CO)_6$. As the laser beam there may be used an argon laser beam for example. The aluminum wiring 420*c*' of the second layer at the defective part and a corresponding auxiliary wiring 403' are connected together through the connecting wiring 429*a*' (see FIG. 17A). In this case, the Cr film 432' prevents Mo from becoming difficult to be deposited due to reflection of the laser beam at the surface of the aluminum wiring during the foregoing laser CVD. It also functions to improve the adhesion of the connecting wiring 429*a*' to the substrate. In place of the Cr film 432' there may be used, for example, a gold (Au) film. Further, the connecting wiring 429*a*' may be constituted by tungsten (W), and in this case there may be used $W(CO)_6$ as the reaction gas in the laser CVD.

Figure 17H:
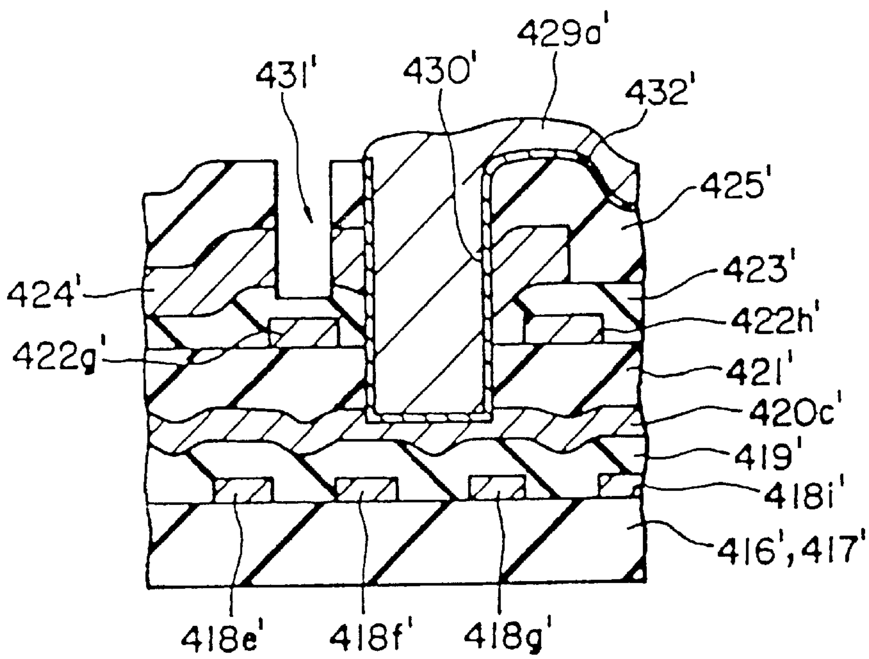
Figure 17I:
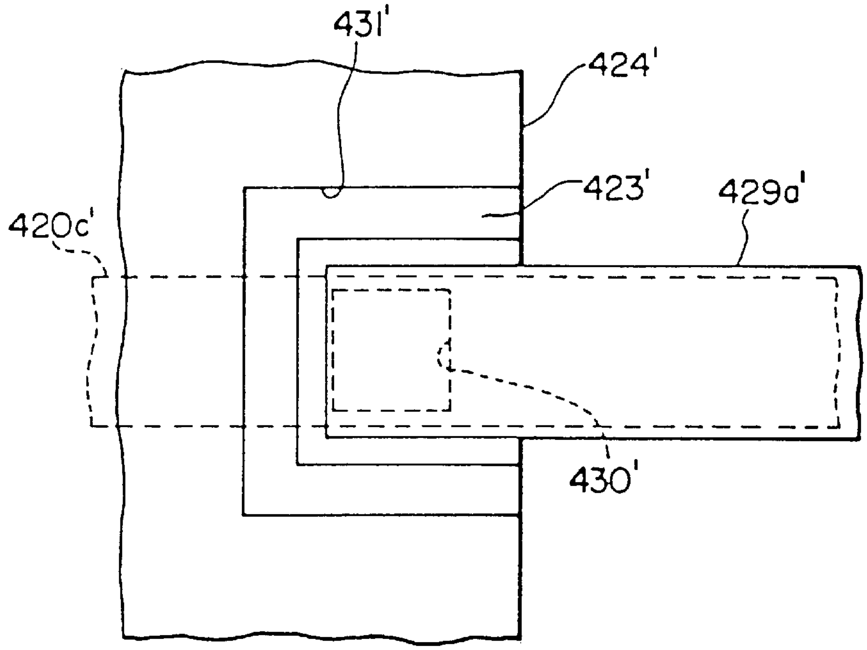
FIG. 17I is a plan view in the state of FIG. 17H.
Figure 17J:
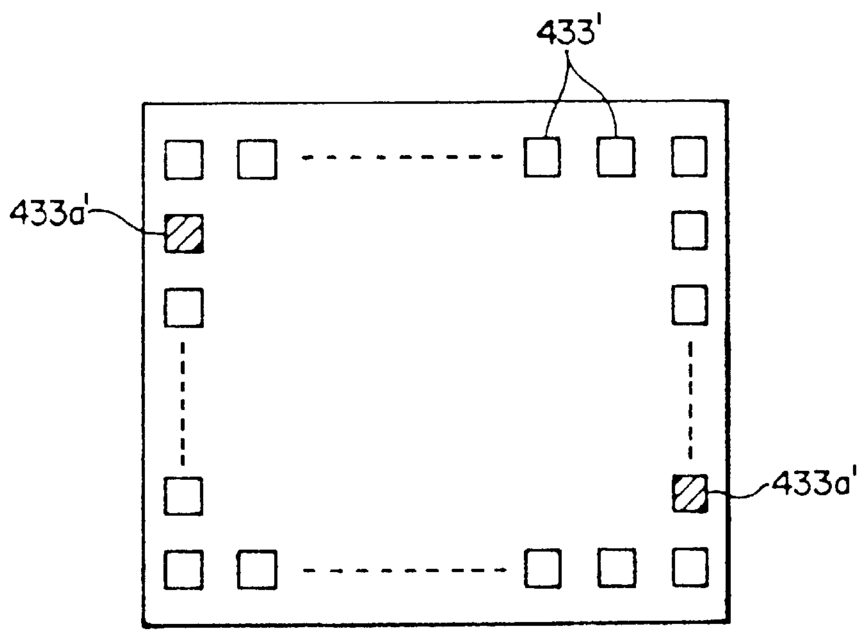
FIG. 17J is a plan view showing an embodiment 4-II of the second aspect of the present invention.

Next, as shown in FIG. 17H, the lower portion of the connecting wiring 429*a*' is removed by, for example, sputter etching and the Cr film 432' is etched off. This condition is shown in plan view in FIG. 17I.

The connecting wiring 429*b*' can also be formed in the same manner as above.

The following is an explanation about how to repair the defective part after the potential measurement in the same part.

First, it is assumed that the presence of a defective gate in the internal circuitry of the LSI and the position of a defective part became clear as a result of a probe check made using an LSI tester in the same manner as above. The gate shown in FIG. 17C is assumed to be this defective gate.

Then, using the above laser CVD technique, portions A and B in FIG. 17C are connected to auxiliary bumps 402*a*' different from each other. In this case, in the same manner as above, first the portion A and an auxiliary wiring 403' are connected through the connecting wiring 429*a*', then this auxiliary wiring 403' and an auxiliary bump 402*a*' are connected through the connecting wiring 429*b*'. The connection between the portion B and an auxiliary bump 402*a*' is also performed in the same way.

Then, high level (H) and low level (L) voltages are applied as input voltages Vin to the portion A by the auxiliary bump 402*a*', and an output voltage Vout of the portion B is measured. In both the cases of Vin=H and L, if Vout=L, there is a great possibility of disconnection of, for example, the aluminum wiring 420*c*' which constitutes an output wiring of the gate. Therefore, a minute observation of the appearance of the LSI is made using a microscope or the like in order to find out a disconnected part. It is assumed that as a result of the observation the aluminum wiring 420*c*' proved to be disconnected, for example at the part indicated by the mark "x".

Thereafter, the connecting wiring 429*c*' is connected using the foregoing laser CVD technique, whereby the disconnection can be repaired.

Although the invention has been described on the basis of the above embodiment, it goes without saying that the invention is not limited thereto and that various modifications may be made within the scope not departing from the gist of the invention.

For example, the number and position of the auxiliary bumps 402*a*' can be selected as necessary, and it is not always necessary to provide the auxiliary wirings 403' and 404', which may be omitted. Moreover, in an LSI using pads, as shown in FIG. 17H, auxiliary pads 433' may be provided in addition to the power supplying and signal inputting/outputting pads 403'. Further, the present invention is applicable to various other semiconductor integrated circuit devices, e.g. MOSLSI, than bipolar LSIs.

An effect attained by a typical invention disclosed herein is that the potential measurement for the internal circuitry can be done accurately.

Embodiment 5

An embodiment 5-I of the present invention will be described below with reference to FIGS. 18A and 18I to 18K.

Figure 18A:
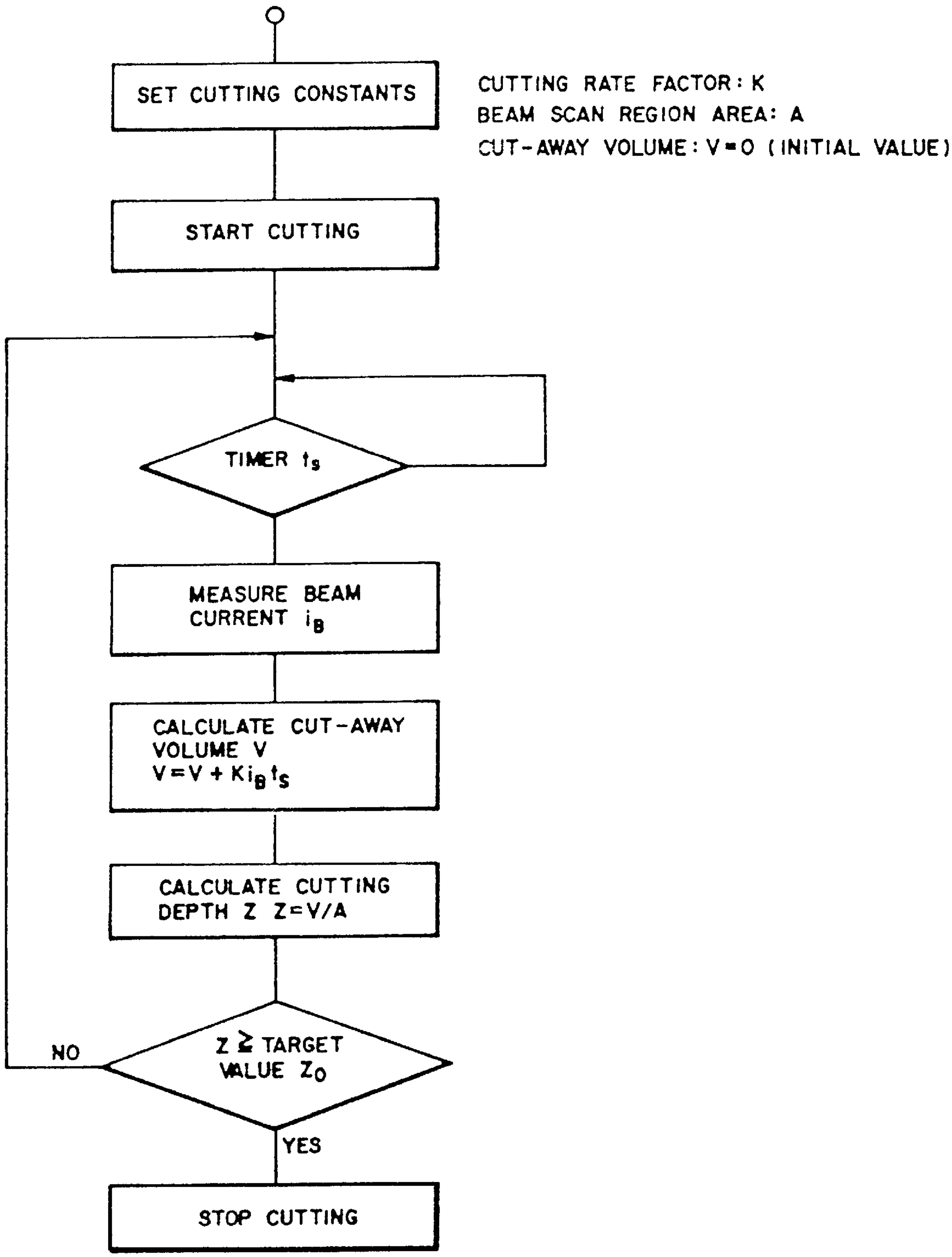
FIG. 18A is a flow chart of an embodiment 5-I of the second aspect of the present invention.
Figure 18B:
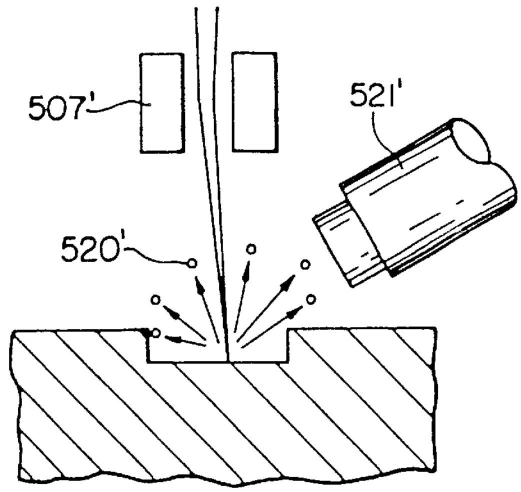
FIGS. 18B and 18C are sectional views for explaining how to detect secondary ions.
Figure 18C:
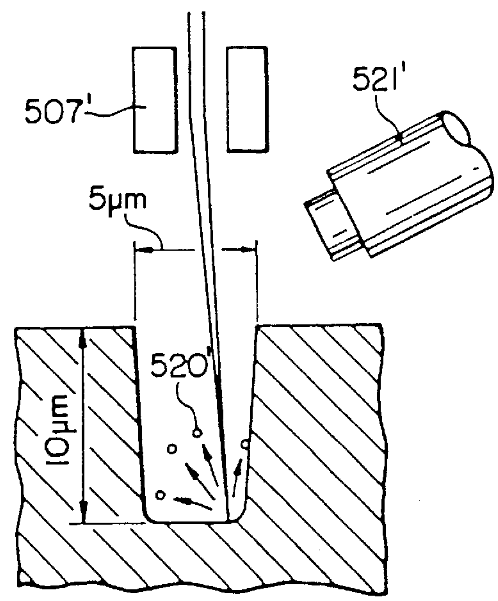
Figure 18D:
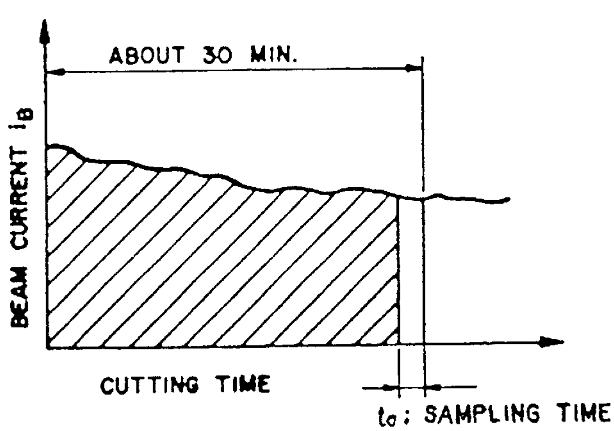
FIG. 18D is a diagram showing how a beam current changes with the lapse of time.
Figure 18E:
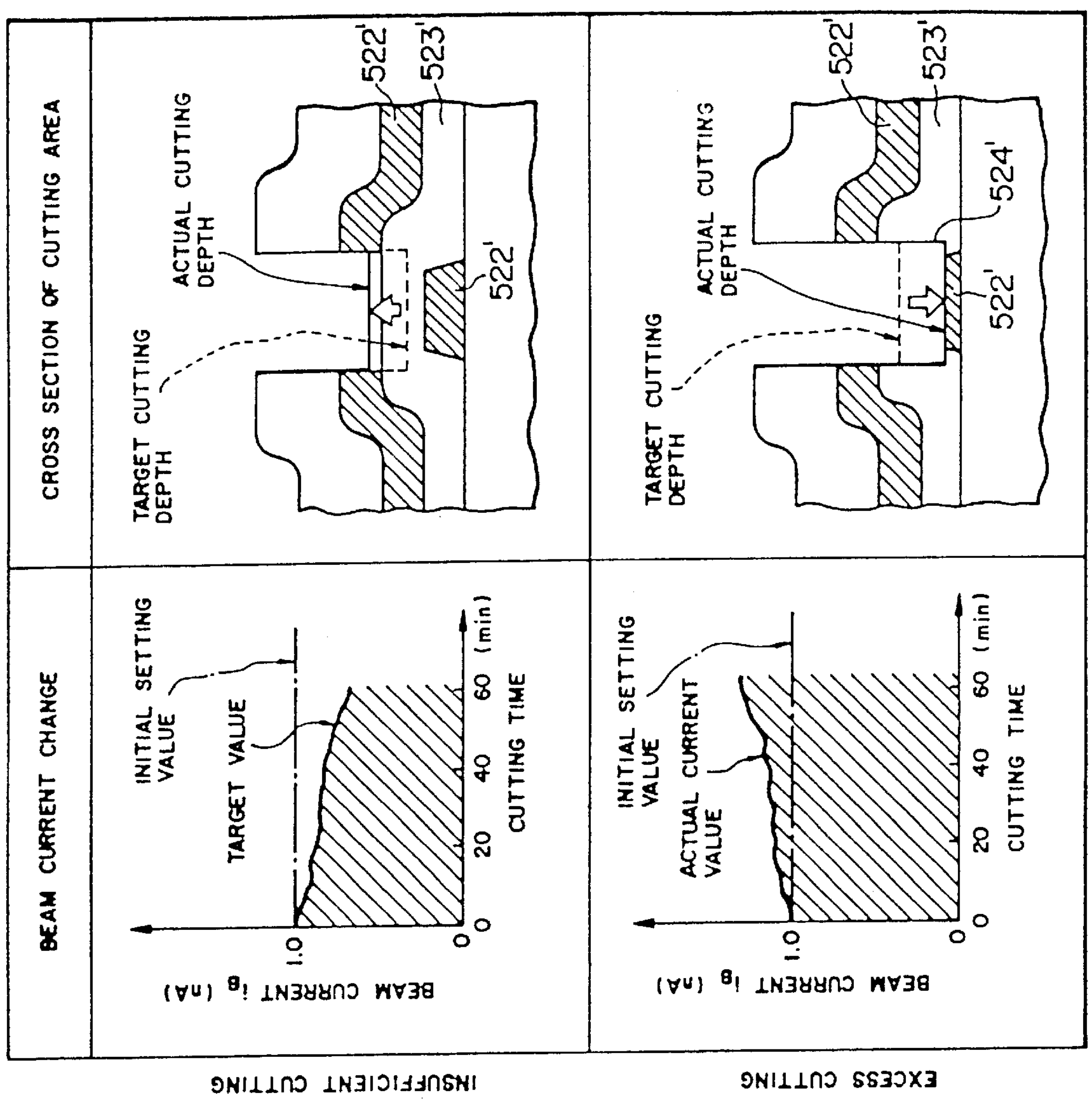
FIG. 18E is a diagram showing a cutting state according to a conventional method.
Figure 18G:
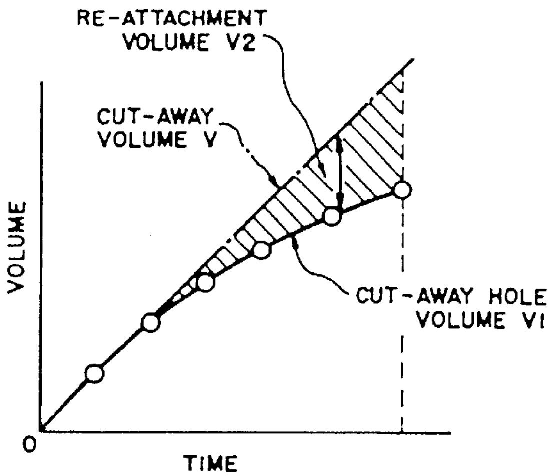
FIGS. 18G and 18H are graphs showing experimental results on cut-away volume and depth.
Figure 18F:
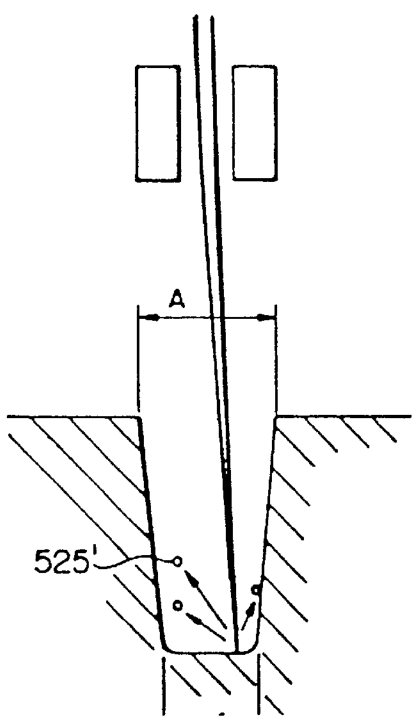
FIG. 18F is a sectional view of a cut-away hole.
Figure 18H:
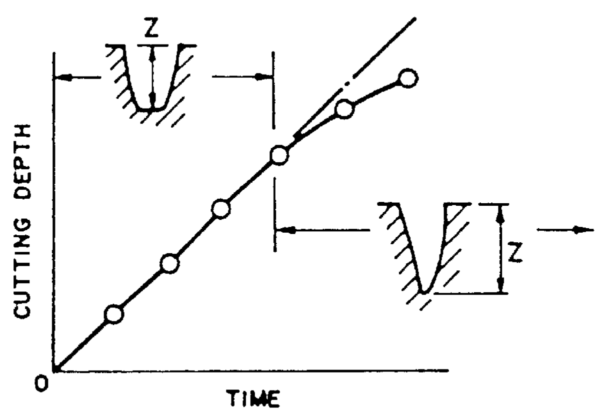
Figure 18I:
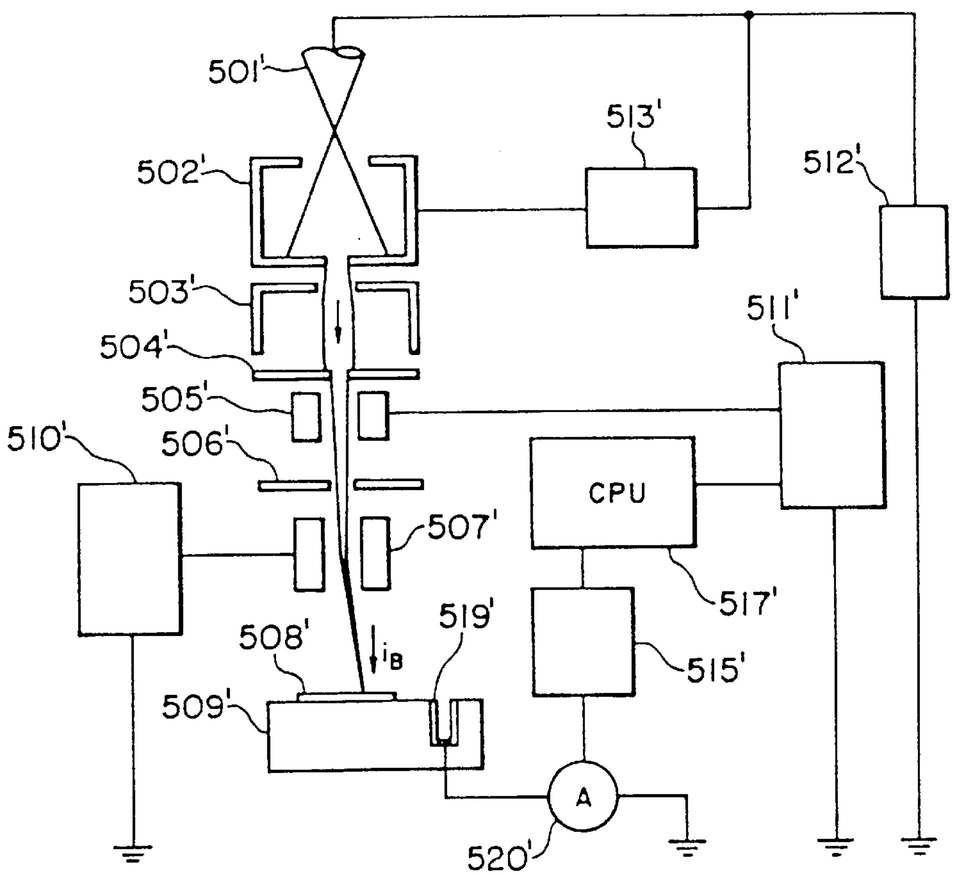
FIG. 18I is a system block diagram according to an embodiment 5-I of the second aspect of the present invention.

In FIG. 18I, an ion beam emitted from an ion source 501' is focused onto a sample 508' by first, second and third lens electrodes 502', 503' and 504'. The beam is bent and directed to a blanking aperture 506' by applying a voltage to a blanking electrode 505' whereby the beam can be prevented from being applied to the sample 508' where required. By applying a deflecting voltage to a deflector electrode 507' the beam can be scanned in a cutting region.

The sample 508' is fixed onto a stage 509' which is driven by a drive unit (not shown). During cutting, the stage is fixed and the beam is deflected by a deflector 507'.

A required voltage is supplied to this system by means of a deflector controller 510', a blanking controller 511', an accelerating power source 512' and a draw-out power source 513'.

Figure 18J:
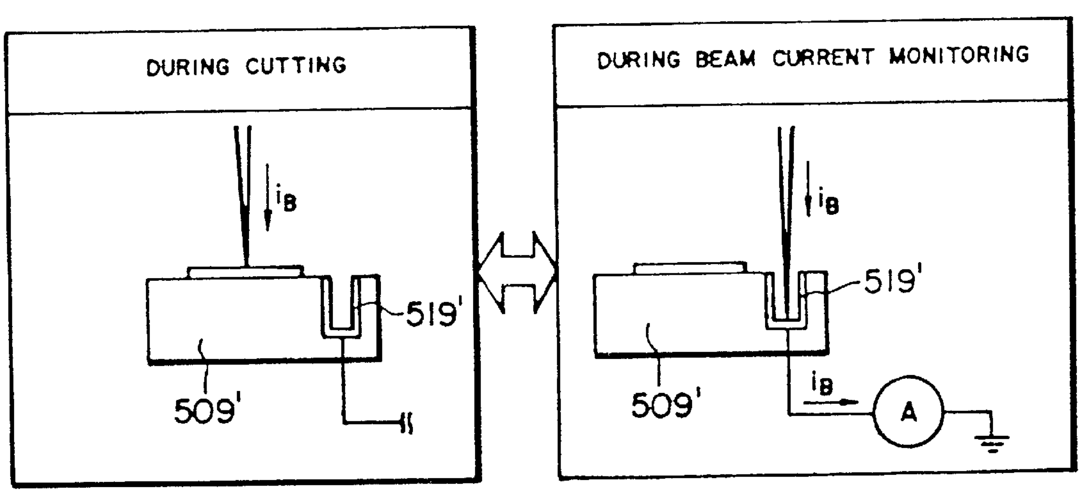
FIG. 18J is a beam current measuring diagram in the embodiment 5-I.

FIG. 18A shows a flow of monitoring the cutting depth in the system illustrated in FIG. 18I. A timer is operated upon start of cutting and a beam current $i_B$ is measured at every certain time $t_S$. The time $t_S$ is set to a time wherein a change in the beam current can be ignored. During monitoring of the beam current, the stage 509' is shifted from the cutting position to let the beam fall into a Faraday cup 519', as shown in FIG. 18J. During movement of the stage 509' the beam is kept under blanking, and the timer is not operated during movement of the stage 509' and measurement using the Faraday cup 519' because the cutting work is not under way. A dose amount W, a cut-away volume V and a cutting depth Z are determined according to the following equations by means of a computer 517':

$$W=\Sigma i_B t_S\ [A\cdot\text{sec}]$$

$$V=k\cdot W\ [\mu\text{m}^3]$$

$$Z=V/A\ [\mu\text{m}]$$

where, k: cutting rate coefficient [$\mu$m$^3$A$^{-1}$sec$^{-1}$]

A: beam scan area [$\mu$m$^2$]

The cutting rate coefficient k depends on the material of a sample, ion energy and ion material. In a normal cutting work, ion energy and ion material are constant, so in the case of cutting a single material, the cutting rate coefficient k may be treated as a constant. According to an experiment, when there were used an ion energy of 20 kV and gallium as an ion material, there was obtained $k_{SiO_2}=0.28\ \mu\text{m}^3\text{nA}^{-1}\text{sec}^{-1}$ for $SiO_2$. In the case of a sample of a multilayer structure comprising plural materials, it must be taken into account that the cutting rate coefficient differs depending on materials.

Figure 18K:
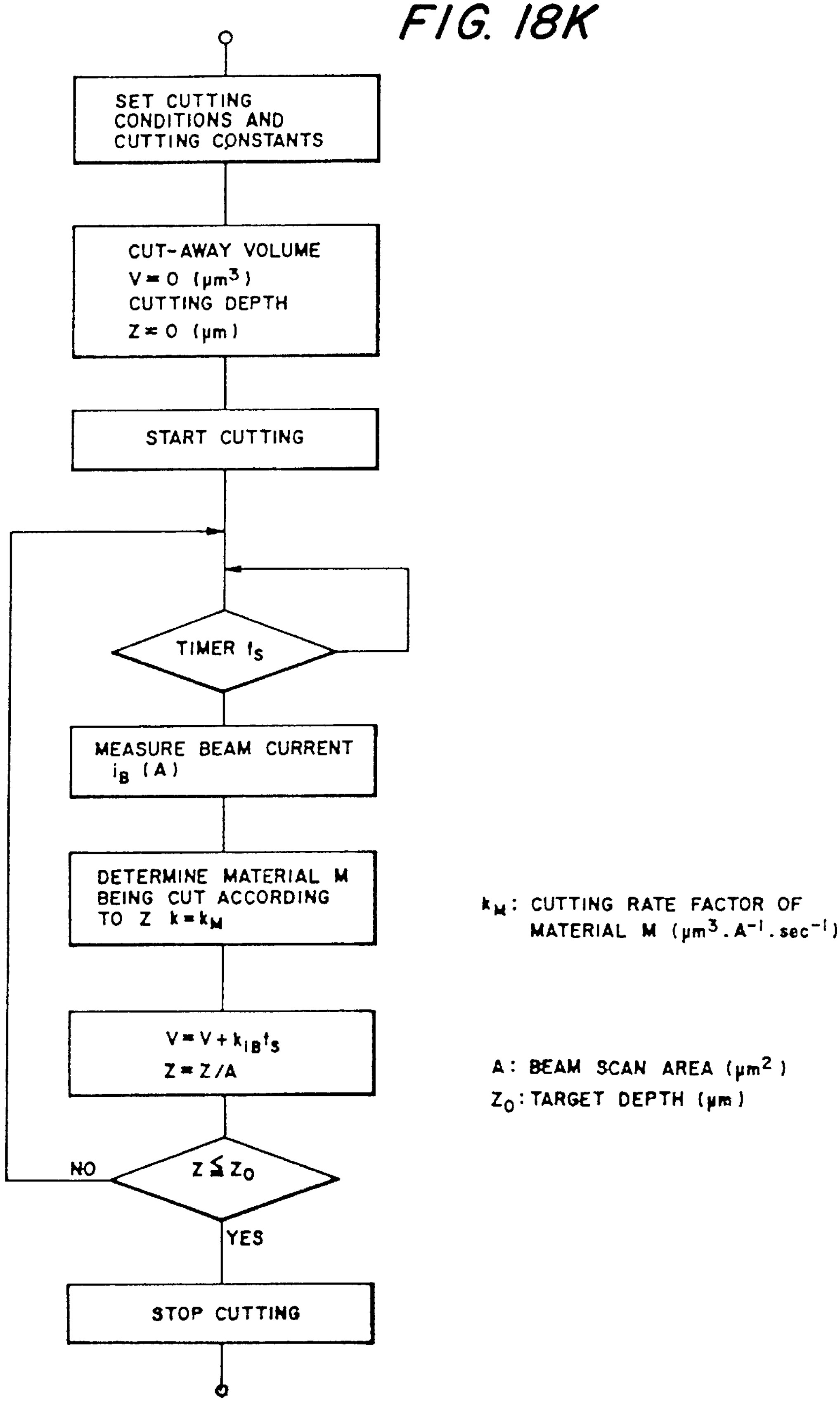
FIG. 18K is a flow chart in the case of cutting plural materials in the embodiment 5-I.

This embodiment will now be explained with reference to FIG. 18K. As shown in FIG. 18K, a material M being cut is determined on the basis of the thickness of each layer of a sample which has been measured in advance, according to the depth Z detected when the beam current $i_B$ was monitored. Then, the present cut-away volume V is determined by adding a cut-away volume increment ΔV to the cut-away volume obtained in the previous measurement of beam current:

$$\Delta V=k i_B t_S\ [\mu\text{m}^3]$$

$$(k=k_M)$$

The present depth Z is obtained by dividing the cut-away volume V by a beam scan area A:

$$Z=V/A\ [\mu\text{m}]$$

When this depth Z reaches a target depth $Z_O$, the cutting is stopped.

Since in this embodiment-5-I the stage 509' is moved at every sampling time $t_S$, the cutting time is so much wasted. As a solution to this problem, an embodiment-5-II will be described below with reference to FIGS. 18L to 18N.

Figure 18L:
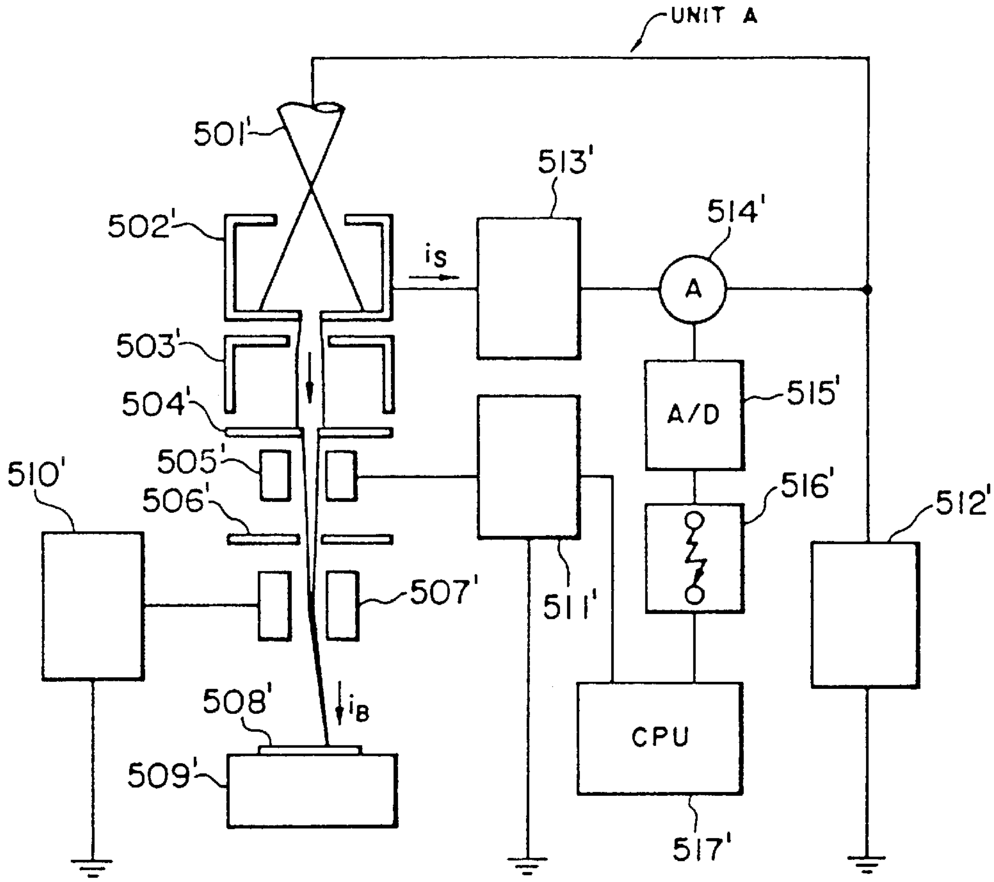
FIG. 18L is a system block diagram according to an embodiment 5-II of the second aspect of the present invention.
Figure 18M:
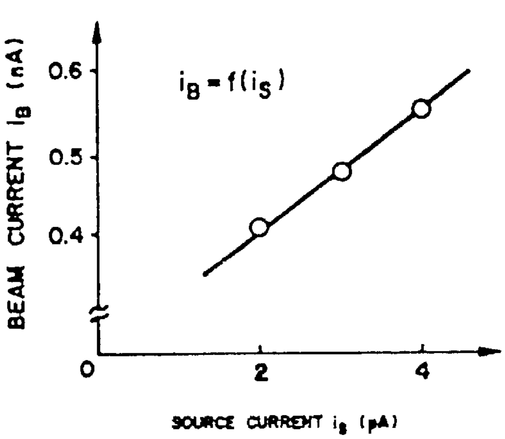
FIG. 18M is a graph showing a source current-beam current relation.

In FIG. 18L, an ammeter 514' is for measuring a source current $i_S$ flowing through the first lens electrode 502'. The beam current $i_B$ is represented as a function of the source current $i_S$ as shown in FIG. 18M:

$$i_B=f(i_S)$$

This is measured in advance and stored in a computer 517'. As to this function, usually a sufficient accuracy is obtained in terms of the following linear function:

$$i_B=\alpha i_S+\beta$$

Since the ammeter 514' floats to a degree corresponding to the acceleration voltage relative to the earth, a measured analog value is converted to a digital value by means of an A/D converter 515', followed by coupling by an optical isolator 516', and then fed to the computer 517'. A flow of this embodiment 5-II can be expressed by measuring the source current $i_S$ and calculating the beam current $i_B=f(i_S)$ from the measured value, in place of measuring the beam current $i_B$ in the flowchart of FIG. 18A or 18K.

Figure 18P:
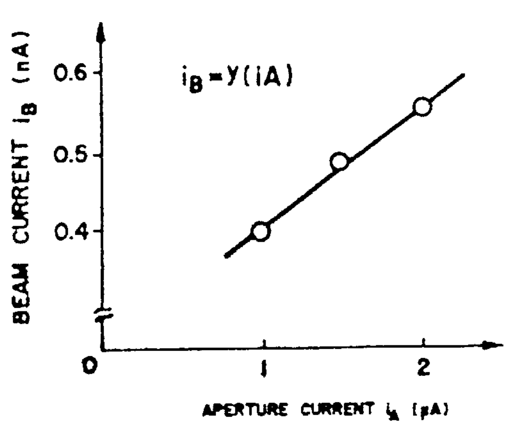
FIG. 18P is a graph showing an aperture current-beam current relation.
Figure 18N:
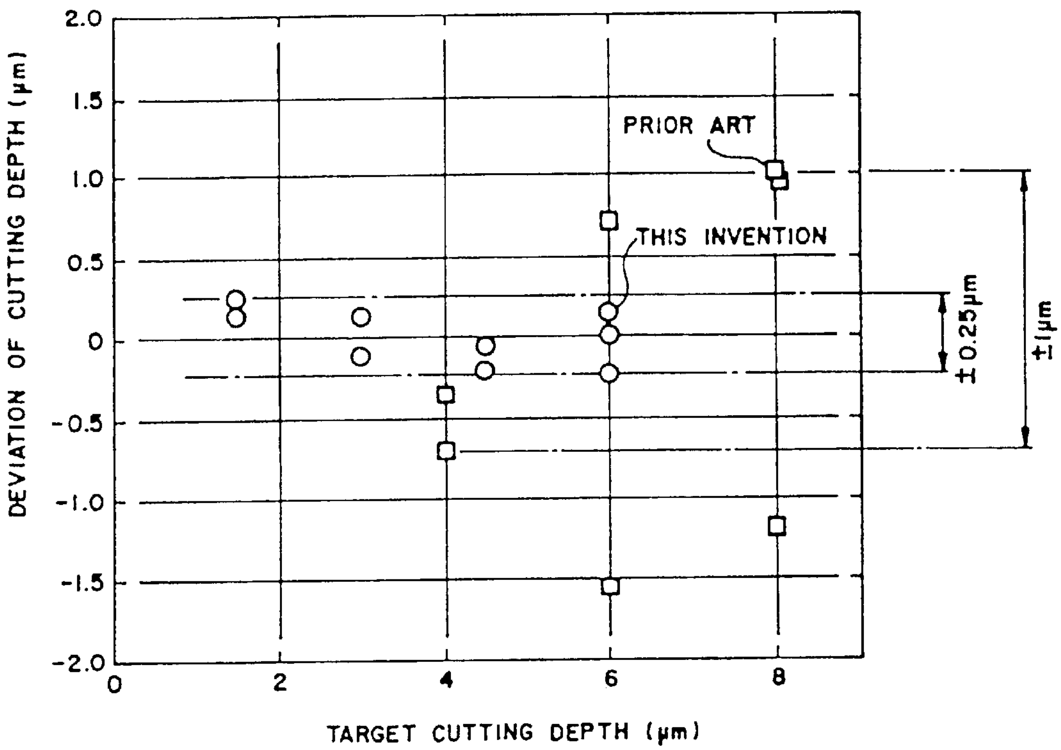
FIG. 18N is a diagram showing experimental results obtained in the embodiment 5-II.

FIG. 18N shows the results of an experiment conducted according to this embodiment. In this experiment, since the cutting rate is about 0.3 $\mu m^3/S$ and the cut-away hole is 5 $\mu m^2$, the time required for obtaining a cutting depth of 8 $\mu$m is about 11 minutes. Even during this period the beam current is drifting, so according to the prior art which controls the cutting time on the basis of a beam current value at the start of cutting, the deviation of the cutting depth from the target depth is ±1 $\mu$m.

On the other hand, when the source current $i_S$ was measured at a sampling time of 20 seconds according to the method of the present invention, the cutting depth deviation decreased to ±0.25 $\mu$m. The thickness of a wiring layer and that of an inter-layer insulating film in a common LSI are both 1 $\mu$m or so and therefore a sufficient accuracy can be attained by the present invention.

Figure 18O:
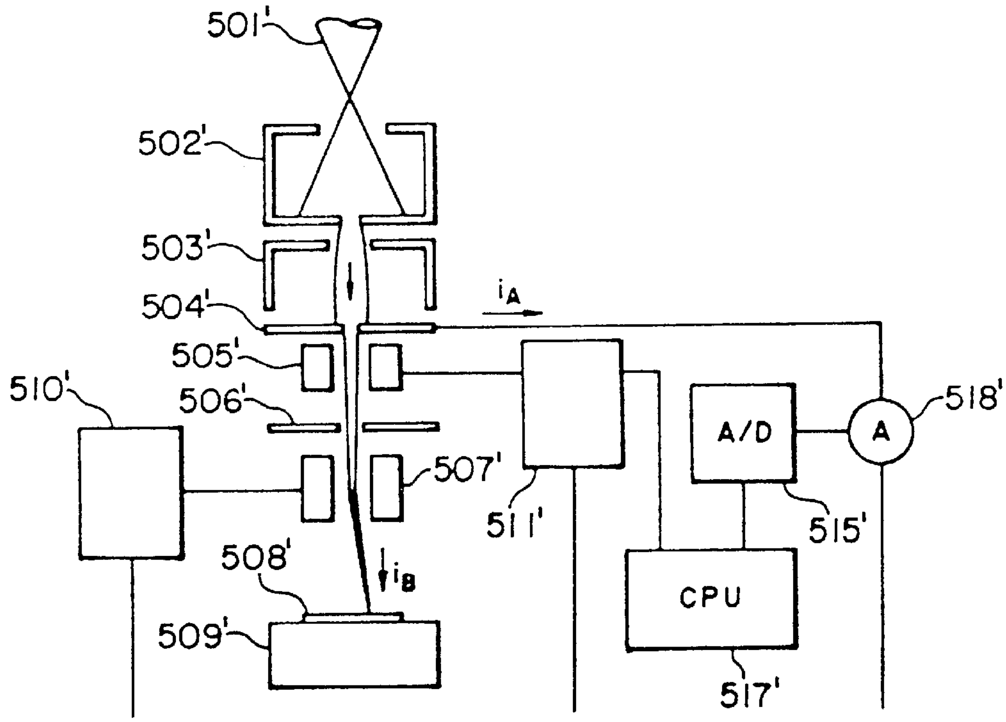
FIG. 18O is a system block diagram according to an embodiment 5-III of the second aspect of the present invention.

An embodiment 5-III of the invention will now be described with reference to FIGS. 18O and 18P. In FIG. 18O, an ammeter 518' is for measuring an aperture current $i_A$ flowing into the third electrode (beam limiting aperture) 504'. Since the beam current $i_B$ can be expressed as a function of the aperture current $i_A$:

$$i_B=g(i_A)$$

the cutting depth can be monitored in the same manner as in the embodiment 5-II. This function can also be expressed with a high accuracy in terms of the following linear function:

$$i_B=\alpha i_A+\beta$$

The current $i_S$ is flowing in the ion sofurce 501' shown in FIG. 18L can also be measured at portion A. Where the electrode 502' is in an enclosing shape from above as in FIG. 18L, the formation of secondary electrons by ion radiation is suppressed, so the source current can be measured accurately even in the position of the ammeter 514'. But where the electrode 502' is in the shape of a plate, secondary electrons are developed by ion radiation, so that the ammeter 514' will measure a larger current than the ion current which has entered the meter. In this case, it is desirable that the ammeter be placed in portion A of FIG. 18L.

Figure 18Q:
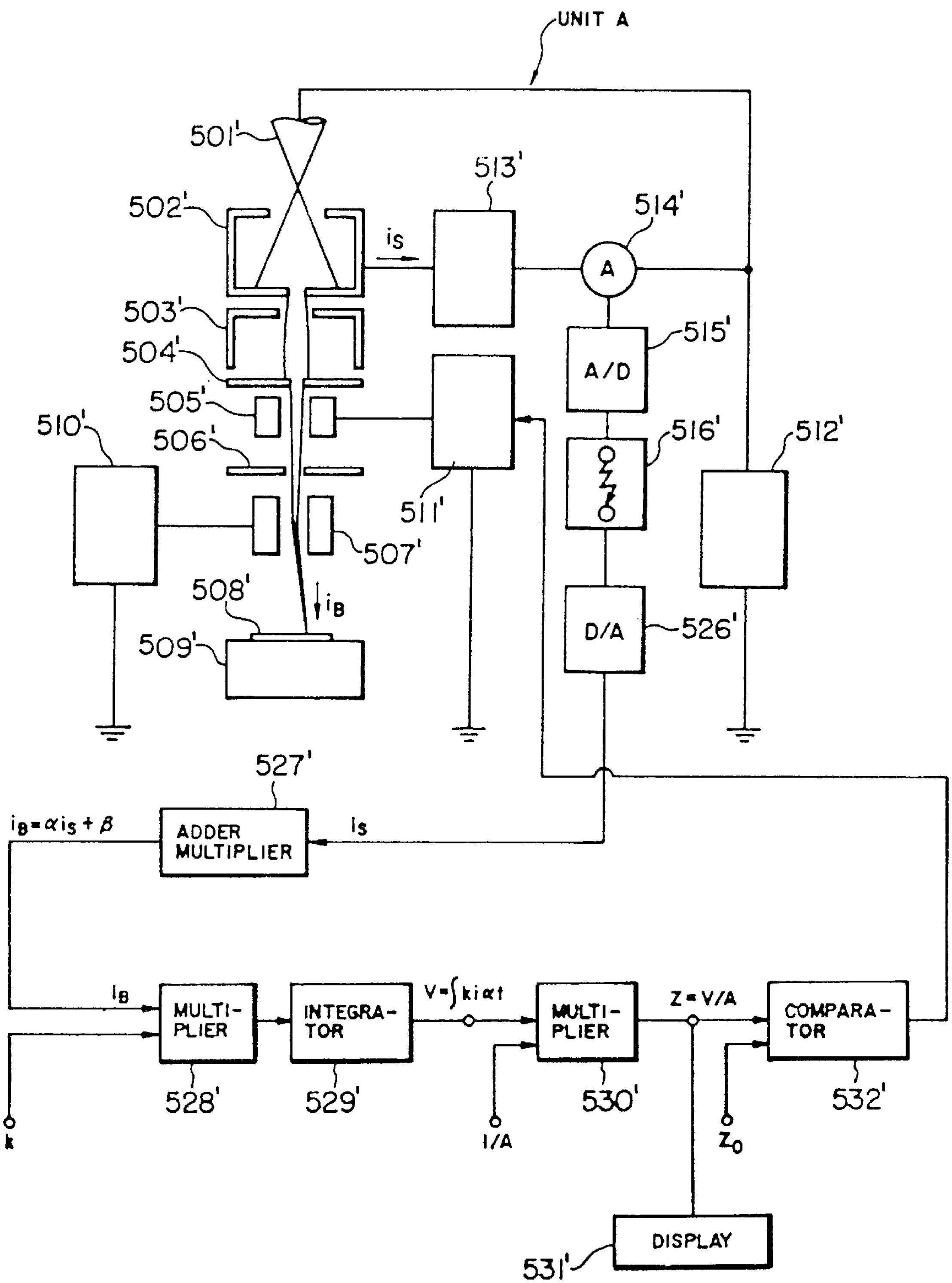
FIG. 18Q is a system block diagram according to an embodiment 5-IV of the second aspect of the present invention.

Further, an embodiment 5-IV will now be described with reference to FIG. 18Q. Like FIG. 18L, a source current $i_S$ is measured, then passes through the A/D converter, optical isolator 516' and D/A converter 526' to obtain an analog signal $i_S$ of an earth level. This analog signal is fed to an adder-multiplier 527', which in turn outputs a beam current value $i_B$. The beam current thus obtained passes through a multiplier 528' and an integrator 529' to obtain a cut-away volume V. The volume V thus obtained is divided by a beam scan area A in a multiplier 530' to obtain a depth Z, which is displayed on a display unit 531'.

Further, the depth Z is compared with a target depth $Z_O$ by a comparator 532', which outputs cutting end signal when $Z \geqq Z_O$. With this signal, the blanking controller 511' operates to blank the beam for termination of the cutting work.

According to this invention, even when cutting is performed over a period of time wherein a change in beam current is not negligible, the cutting depth can be monitored on the basis of current values measured at very short time intervals, so it is possible to form a hole with a high depth accuracy.

Embodiment 6

Figure 19A:
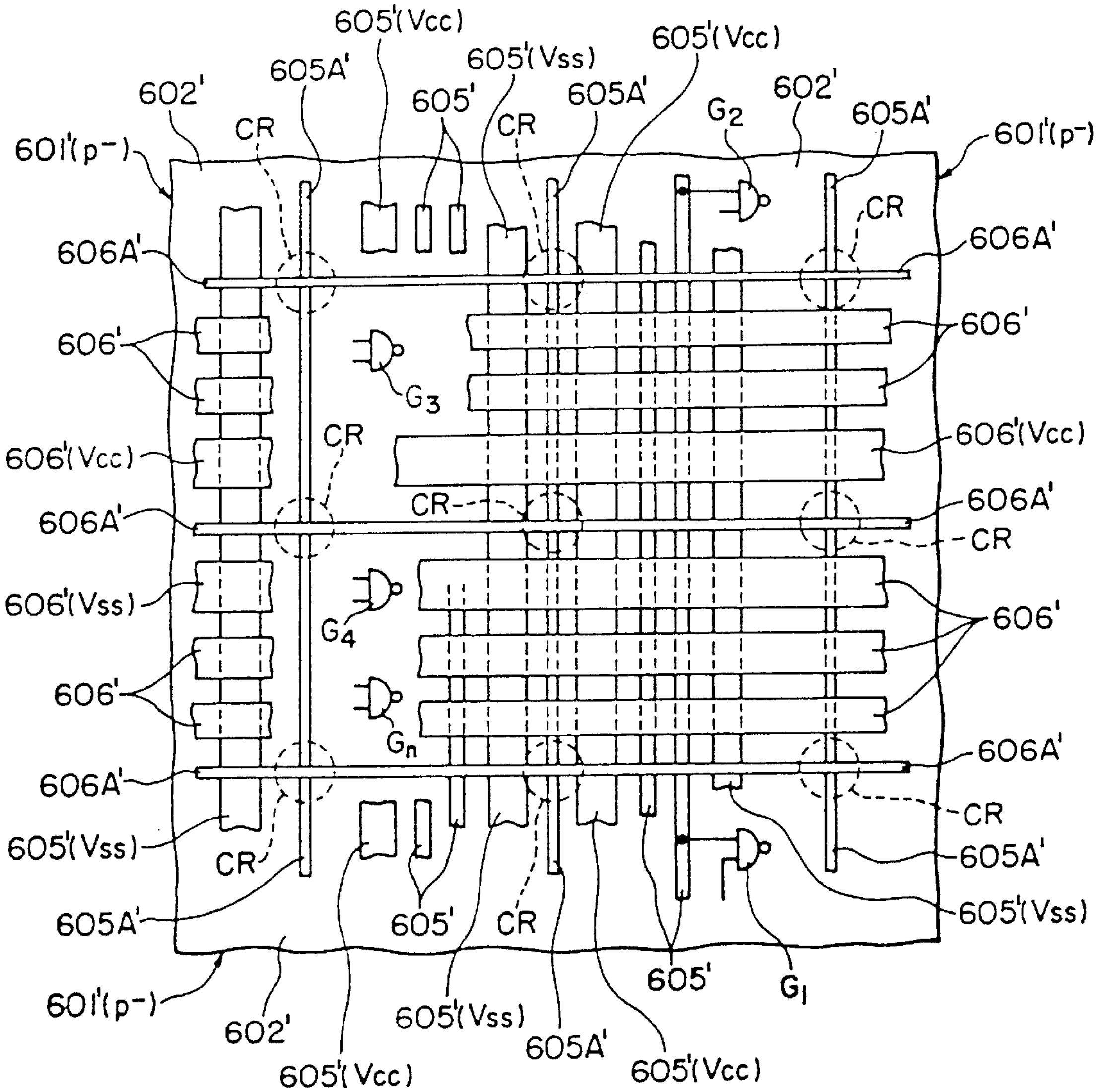
FIG. 19A is a plan view of a part of a logical gate region on a semiconductor substrate.
Figure 19B:
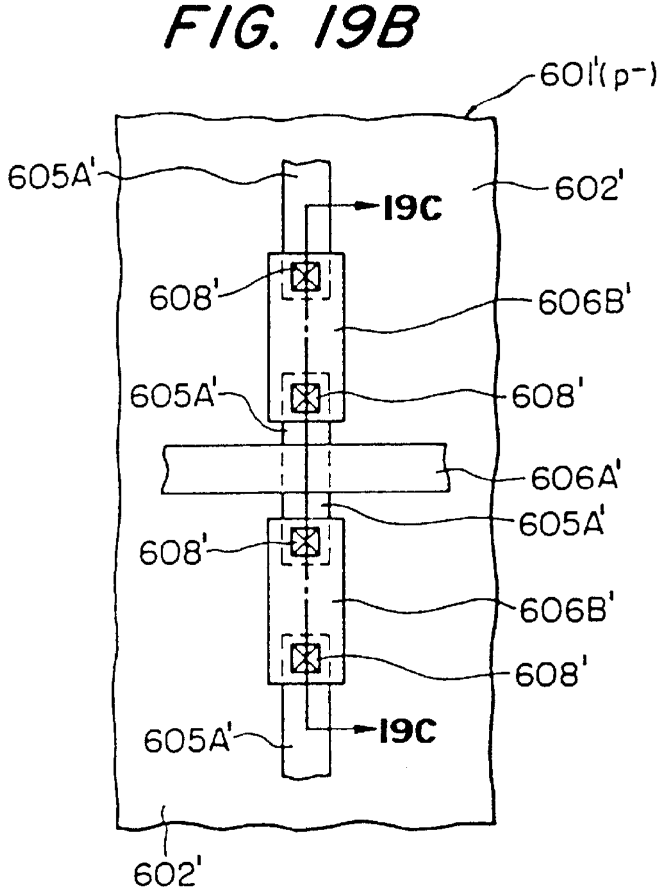
FIG. 19B is a plan view of a crossing portion of auxiliary wirings.
Figure 19C:
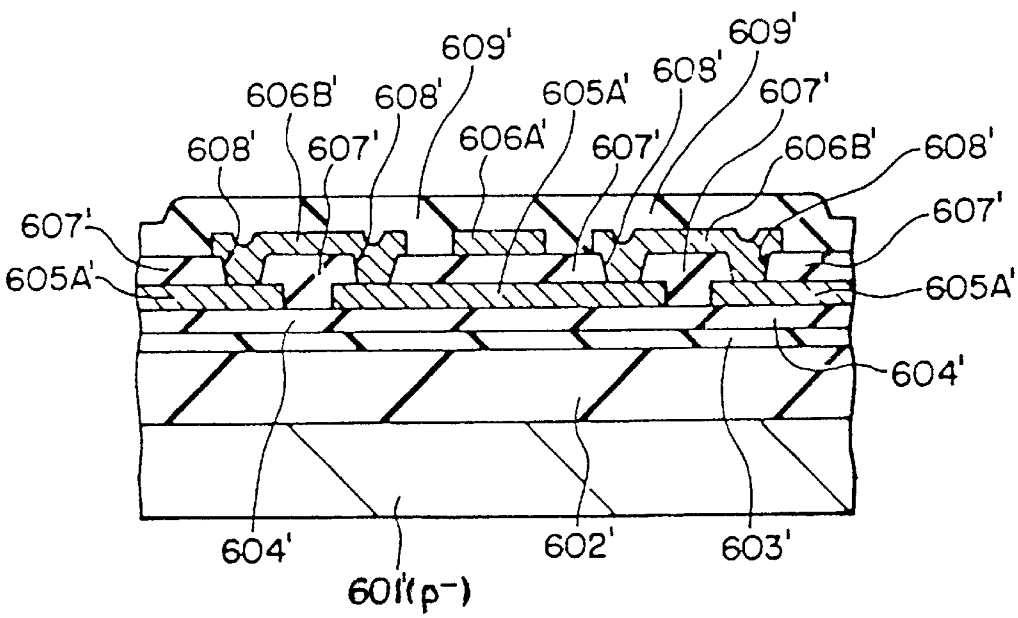
FIG. 19C is a sectional view taken on line A—A of FIG. 19B.

FIG. 19A is a plan view of various wirings extending on a region with logical gates constituted thereon of a semiconductor substrate; FIG. 19B is a plan view of a crossing portion of a lower auxiliary wiring and an overlying auxiliary wiring; FIG. 19C is a sectional view taken on line A—A of FIG. 19B. In FIGS. 19A and 19B there are not illustrated other insulating films than field insulating film in order to make the layout of wiring easy to understand.

In FIG. 19A, the marks $G_1$, $G_2$, $G_3$, $G_4$ and $G_n$ represent logical gates, which are each constituted in this embodiment by a bipolar transistor formed on a semiconductor substrate 601' comprising a p− type single crystal silicon, though not shown. The bipolar transistors are separated from each other by means of a field insulating film 602'.

Above the logical gates G there extend from above to below (a first direction) a plurality of signal lines 605', circuit earth potential Vss lines 605' and supply potential Vcc lines 605', comprising a second-layer aluminum film. The first-layer aluminum film is used as an electrode connecting to the base and collector of each bipolar transistor.

As to the lines 605', their layout and to which logical gates G they are to be connected, are decided at the time of designing wiring for a logical IC. If there is no change of logic or change of layout of the basic gate for implementing the logic, there will be made no correction for the connection. Therefore, the lines 605' will hereinafter be referred to as "normal lines".

In a direction (a second direction) intersecting the normal lines 605' there extend signal lines 606', circuit earth potential Vss lines 606' and supply potential Vcc lines 606'. Like the normal wirings 605', the layout of the lines 606' is made at the time of wiring design, so the lines 606' will hereinafter be referred to as "normal lines".

Auxiliary lines 605A' comprising the same layer of aluminum film as the normal lines 605', namely, the second-layer aluminum film, extend in parallel with the normal lines 605'. The auxiliary lines 605A' are disposed one for several of the normal lines 605'. Further, auxiliary lines 606A' comprising the same layer of aluminum film as the normal lines 606' extend in parallel with the normal lines 606'. The auxiliary lines 606A' are disposed one for several of the normal lines 606'.

The construction of each crossing portion (the portion of CR surrounded with dotted line) of an auxiliary line 605A' of a lower layer and an auxiliary line 606A' of an upper layer is as shown in FIGS. 19B and 19C. As illustrated therein, the auxiliary line 605A' is divided in three at the portion where it intersects the auxiliary line 606A'. The auxiliary line 605A' located above the auxiliary line 606A' and the auxiliary line 605A' just under the auxiliary line 606A' are connected through an electroconductive layer 606B'. Numeral 608' denotes a connection hole for the connection of the electroconductive layer 606B' with the auxiliary line 605A'. The auxiliary line 605A' located below the auxiliary line 606A' and the auxiliary line 605A' just under the auxiliary line 606A' are connected together by the electroconductive layer 606B' through the connection hole 608A'.

The sectional structure shown in FIG. 19C will now be explained. Numeral 603' denotes an insulating film which is a silicon oxide film formed by CVD for example. Though not shown, the insulating film 603' covers an electrode comprising a polycrystalline silicon film connected to the emitter of each bipolar transistor. Numeral 604' denotes an insulating film which is a silicon oxide film formed by CVD for example. The insulating film 604' covers an electrode comprising the first-layer aluminum film connected to the base and collector of the bipolar transistor. Above the insulting film 604 there extend the normal lines 605' and auxiliary lines 605A' of the lower layer. The normal lines 605' and auxiliary lines 605' of the lower layer are insulated from the normal lines 606' and auxiliary lines 606A' of the upper layer as well as the electroconductive layer 606B' through an insulating film 607' which is a phospho-silicate glass (PSG) formed by CVD for example. The normal lines 606' and auxiliary lines 606A' of the upper layer as well as the electroconductive layer 606B' are covered with a protective film 609' comprising a silicon nitride film and a PSG film formed by CVD for example.

The following description is now provided about how to correct connection between logical gates G in this embodiment.

Figure 19D:
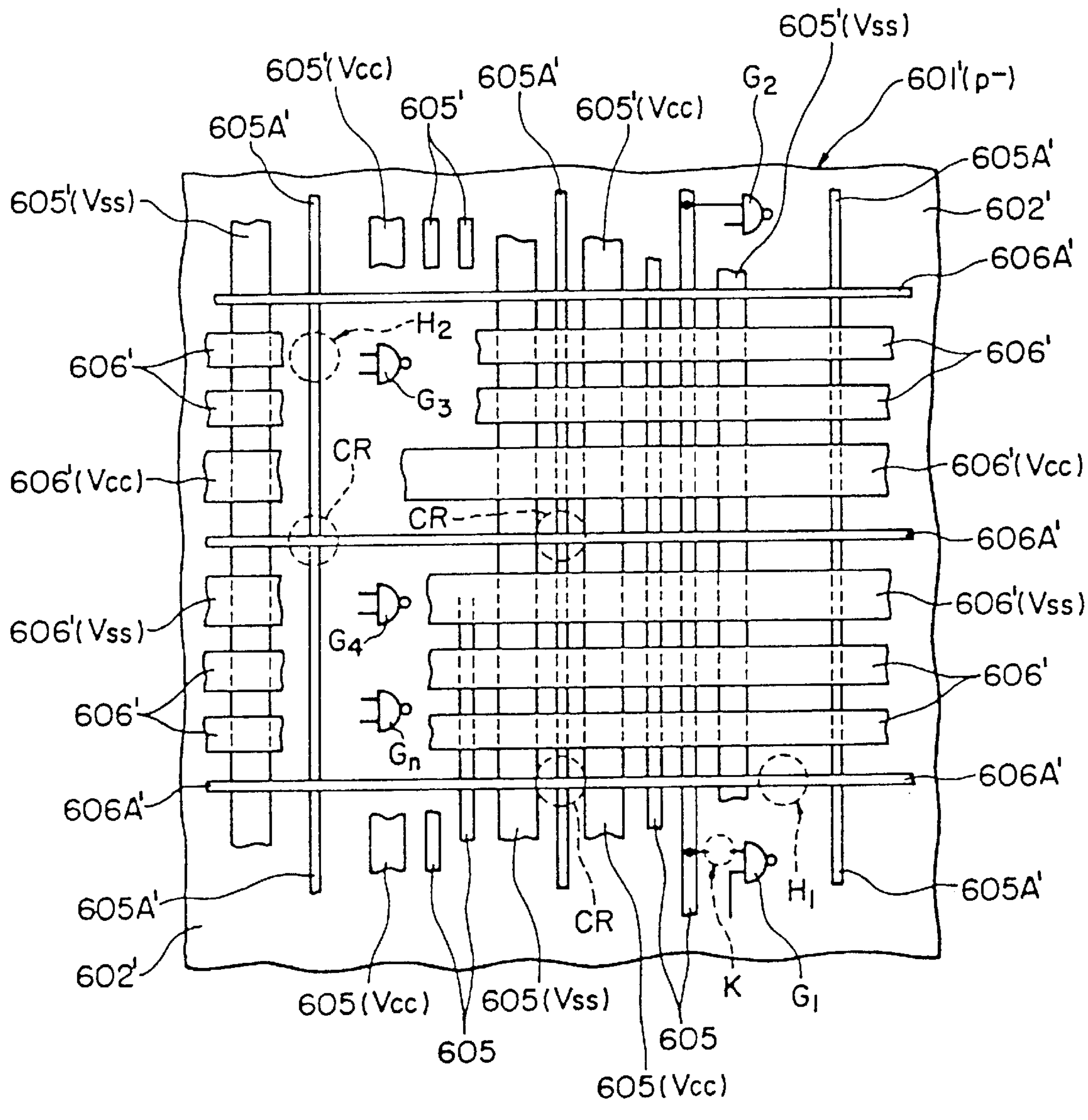
FIG. 19D is a plan view of a part of a logical gate region on a semiconductor substrate.

FIG. 19D is a plan view of the same portion as FIG. 19A for explaining correction of connection between logical gates.

In FIG. 19A the logical gates $G_1$ and $G_2$ are connected through a normal line (signal line) 605' of the lower layer. But, it is here assumed that according to the results of simulation the logical gate $G_1$ must be connected not to the logical gate $G_2$ but to the logical gate $G_3$.

Figure 19E:
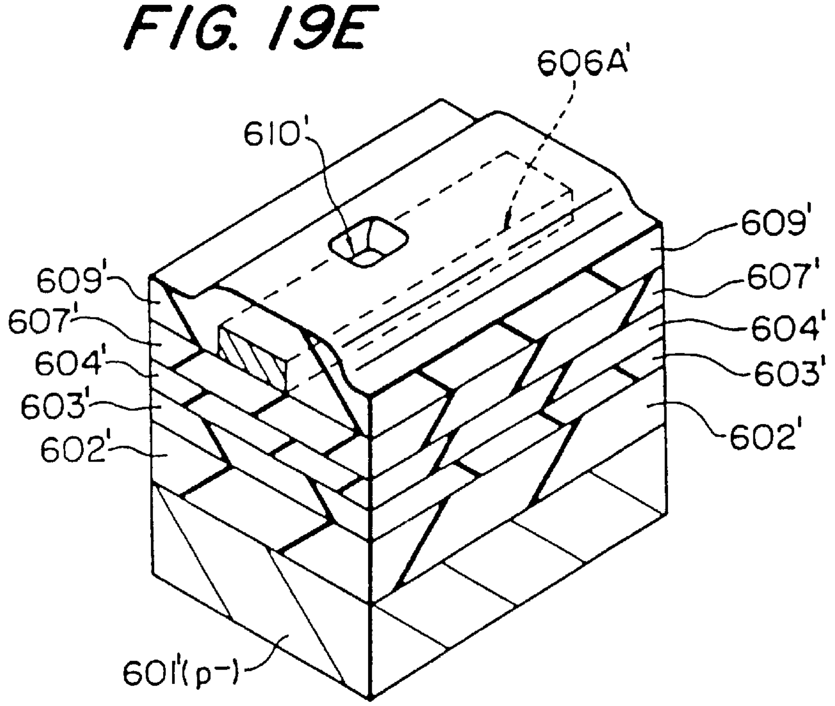
FIGS. 19E and 19F are each a perspective view of a part of an auxiliary wiring.
Figure 19F:
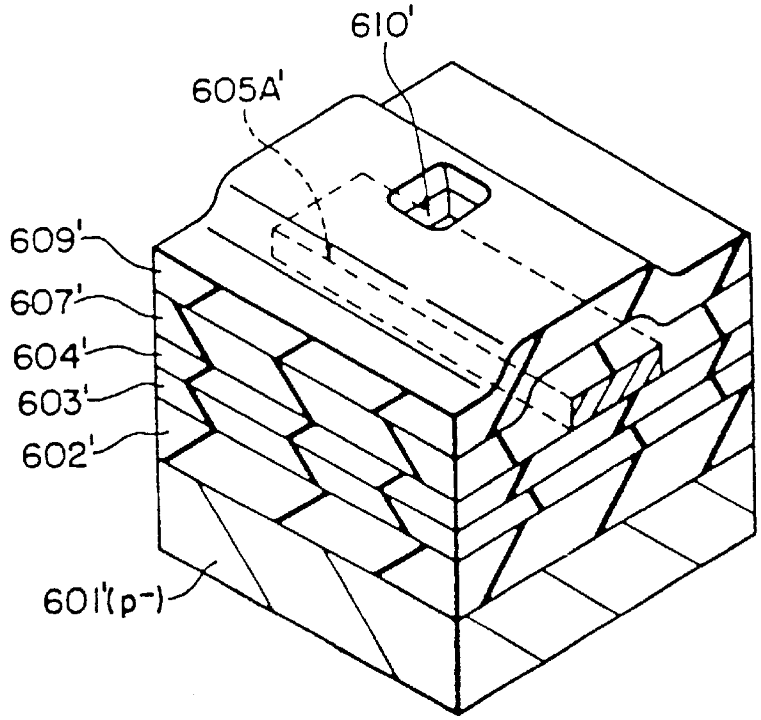
Figure 19G:
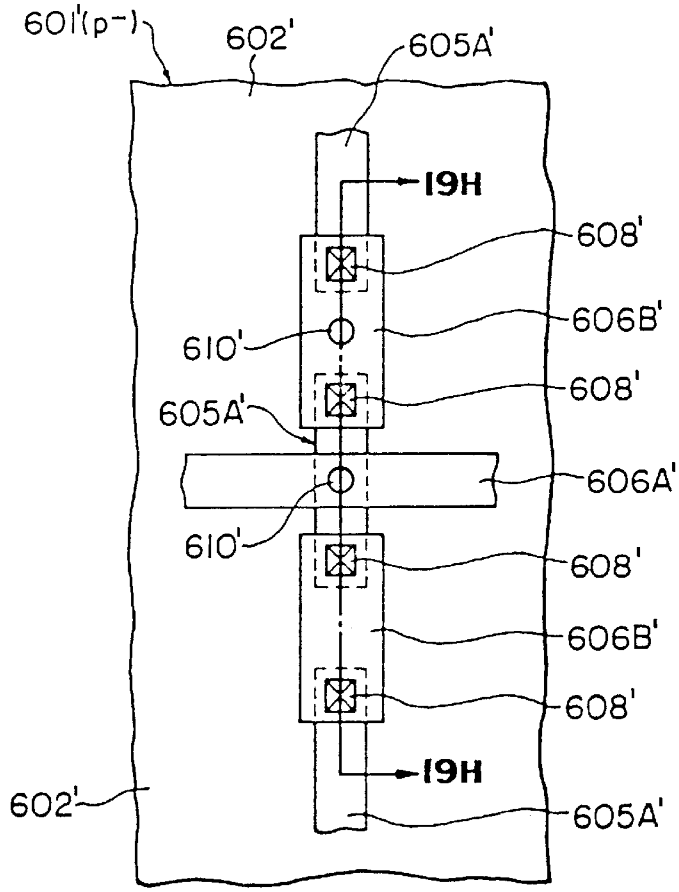
FIG. 19G is a plan view of a crossing portion of auxiliary wirings.
Figure 19H:
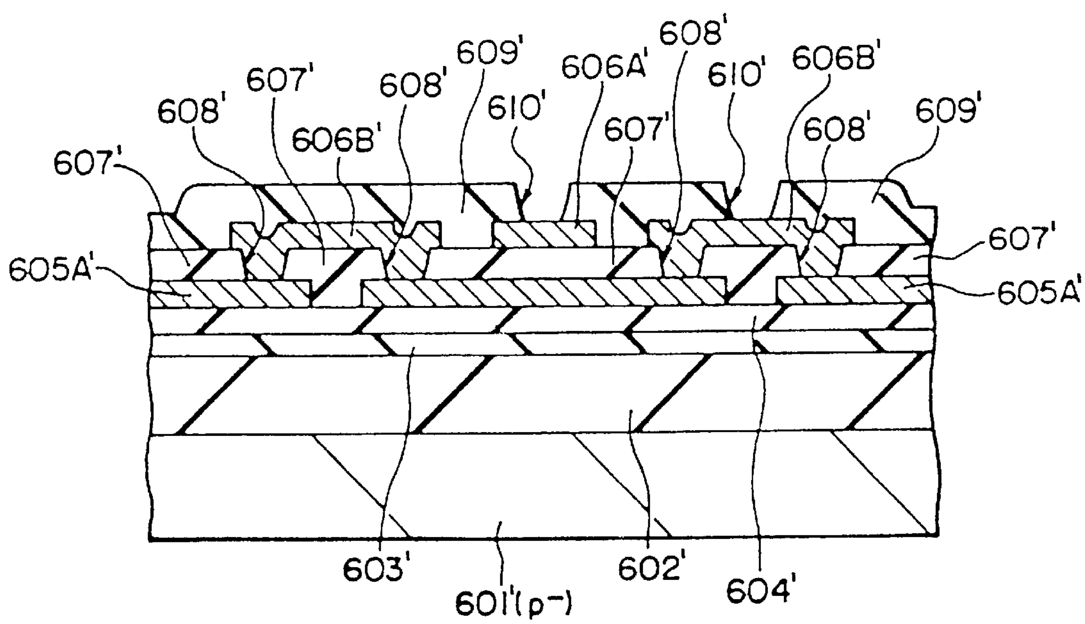
FIG. 19H is a sectional view taken on line A—A of FIG. 19G.

So, in this embodiment, first an aluminum line (indicated by solid line, not marked) of the second layer which connects the logical gate $G_1$ with the signal line 605' is cut at point K surrounded with dotted line. This is done by partially opening the protective film 609' and the third-layer insulating film 607' (see FIG. 19C) utilizing a sputter effect which is obtained when, for example, gallium ion ($Ga^+$) is accelerated by an electric field, and further by etching the second-layer aluminum film. As a result, the logical gates $G_1$ and $G_2$ are electrically separated from each other. Next, a connection hole 610' is formed in a position $H_1$ on the auxiliary line 606A' extending near the logical gate $G_1$, by etching the protective film 609' with a microion beam, as shown in FIG. 19E. The auxiliary line 605A' is exposed from the connection hole 610'. Likewise, a connection hole 610' is formed to expose the auxiliary line 605A' in a position $H_2$ on an auxiliary line 605A' extending near the logical gate G3, by etching the protective film 609' and the insulating film 607', as shown in FIG. 19F. Further, in the crossing portions indicated by CR out of the crossing portions of auxiliary lines 605A' and 606A' in FIG. 19D, a connection 610' is formed by etching the protective film 609' and the insulating film 607', as shown in FIGS. 19G and 19E, FIG. 19H being a sectional view taken on line A—A of FIG. 19G.

Figure 19I:
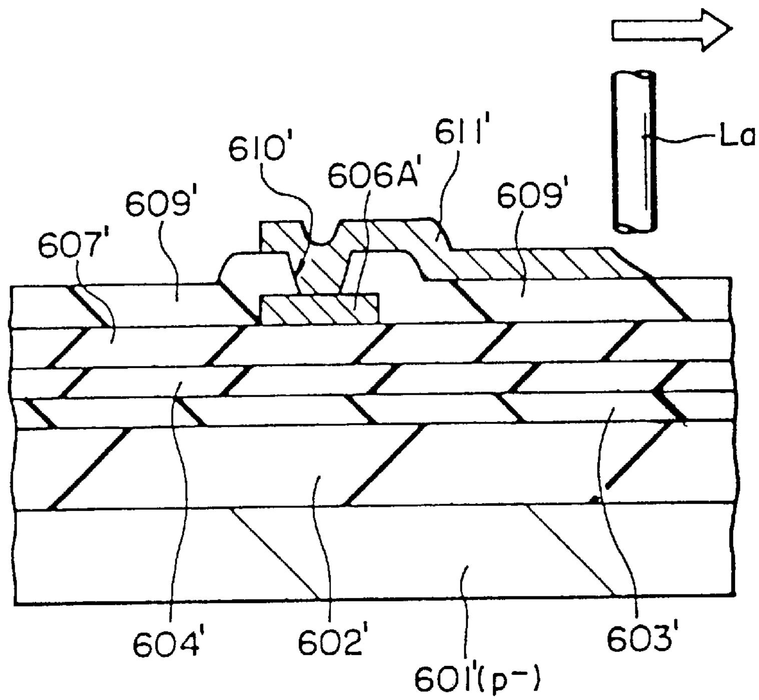
FIGS. 19I and 19J are each a sectional view of a part of an auxiliary wiring in a correction wiring forming step.

Next, at the portion shown in FIG. 19E, a correction line 611' comprising a molybdenum (Mo) film for example is formed from the upper surface of the auxiliary line 606A' exposed from the connection hole 610', to the upper surface of the protective film 609', as shown in FIG. 19I. In forming the correction line 611', the wafer (the semiconductor substrate 601') is placed, for example, in an $Mo(CO)_6$ gas atmosphere and laser La is applied to the portion where the correction line 611' is to be formed, resulting in that there occurs reaction of the above gas in the radiated portion of the laser La, allowing molybdenum (Mo) film to be deposited. Thus, by movement under radiation of the laser La there can be formed a correction line 611' (selective CVD). The correction line 611' is formed so that the upper surface exposed from the connection hole 610' of the auxiliary line 606A' is connected with the logical gate $G_1$, as shown in FIG. 19M. The reaction of $Mo(CO)_6$ gas in forming the correction line 611' is represented by the following formula (1):

$$Mo(CO)_6 \rightarrow 6CO + Mo \qquad (1)$$

As the correction line 611' there may be used a tungsten (W) film. In this case, the wafer (semiconductor substrate 601') is placed in a $W(CO)_6$ atmosphere and laser La is radiated, thereby allowing reaction to take place, which reaction is represented by the following formula (2):

$$W(CO)_6 \rightarrow 6CO + W \qquad (2)$$

Figure 19J:
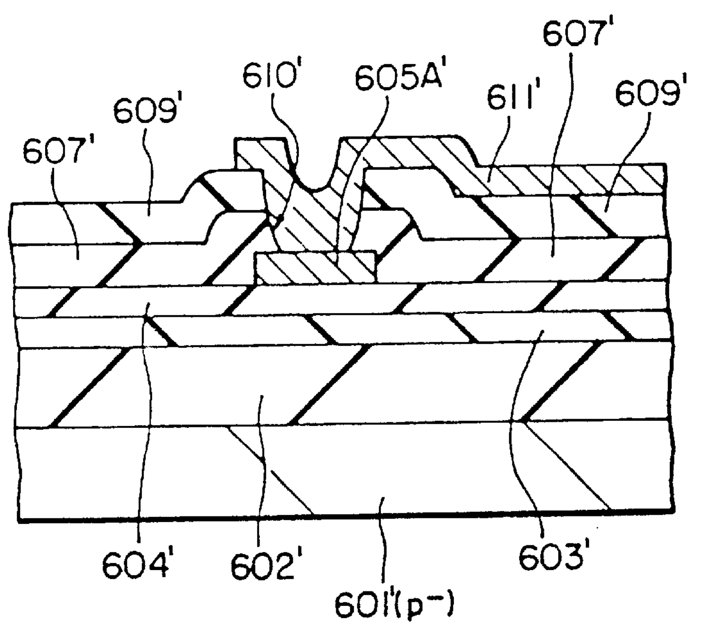

Then, as shown in FIG. 19J, a correction line 611' is formed at the portion shown in FIG. 19F in the same manner as above. This correction line 611' is formed so that the upper surface exposed from the connection hole 610' of the preliminary line 605A' shown in FIG. 19J is connected with the logical gate G3 as shown in FIG. 19M.

Figure 19K:
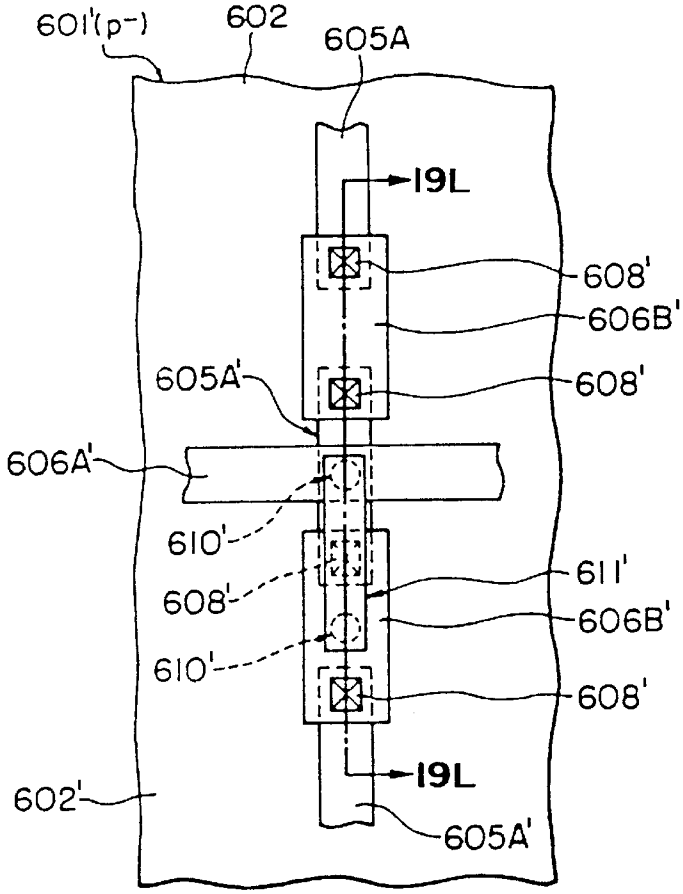
FIG. 19K is a plan view of a crossing portion of auxiliary wirings.
Figure 19L:
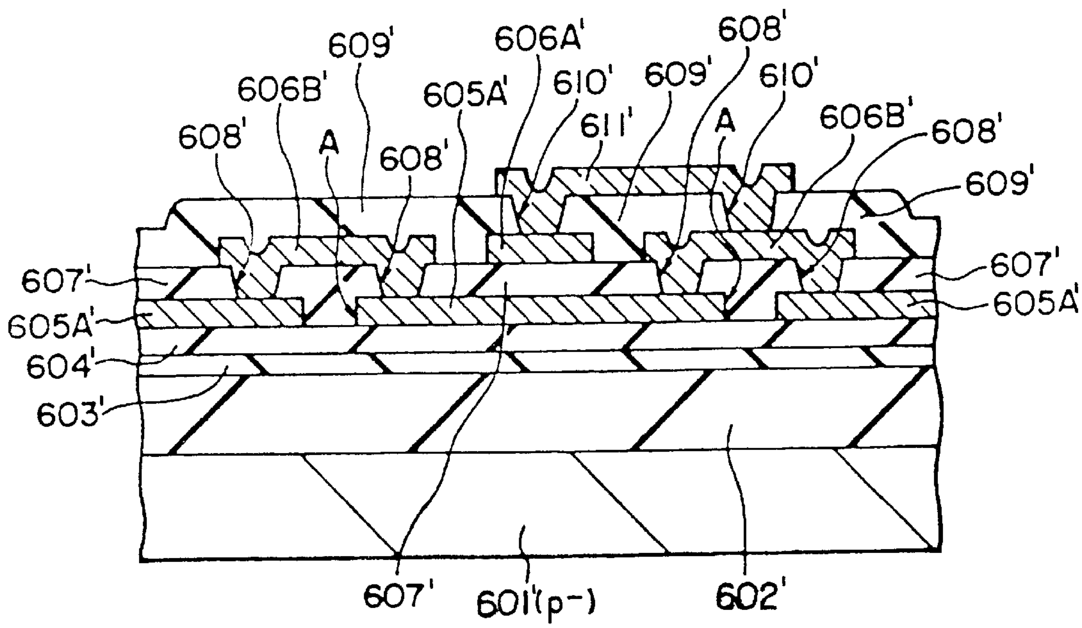
FIGS. 19L, 19M and 19N are each a plan view of a part of a logical gate region on a semiconductor substrate.
Figure 19M:
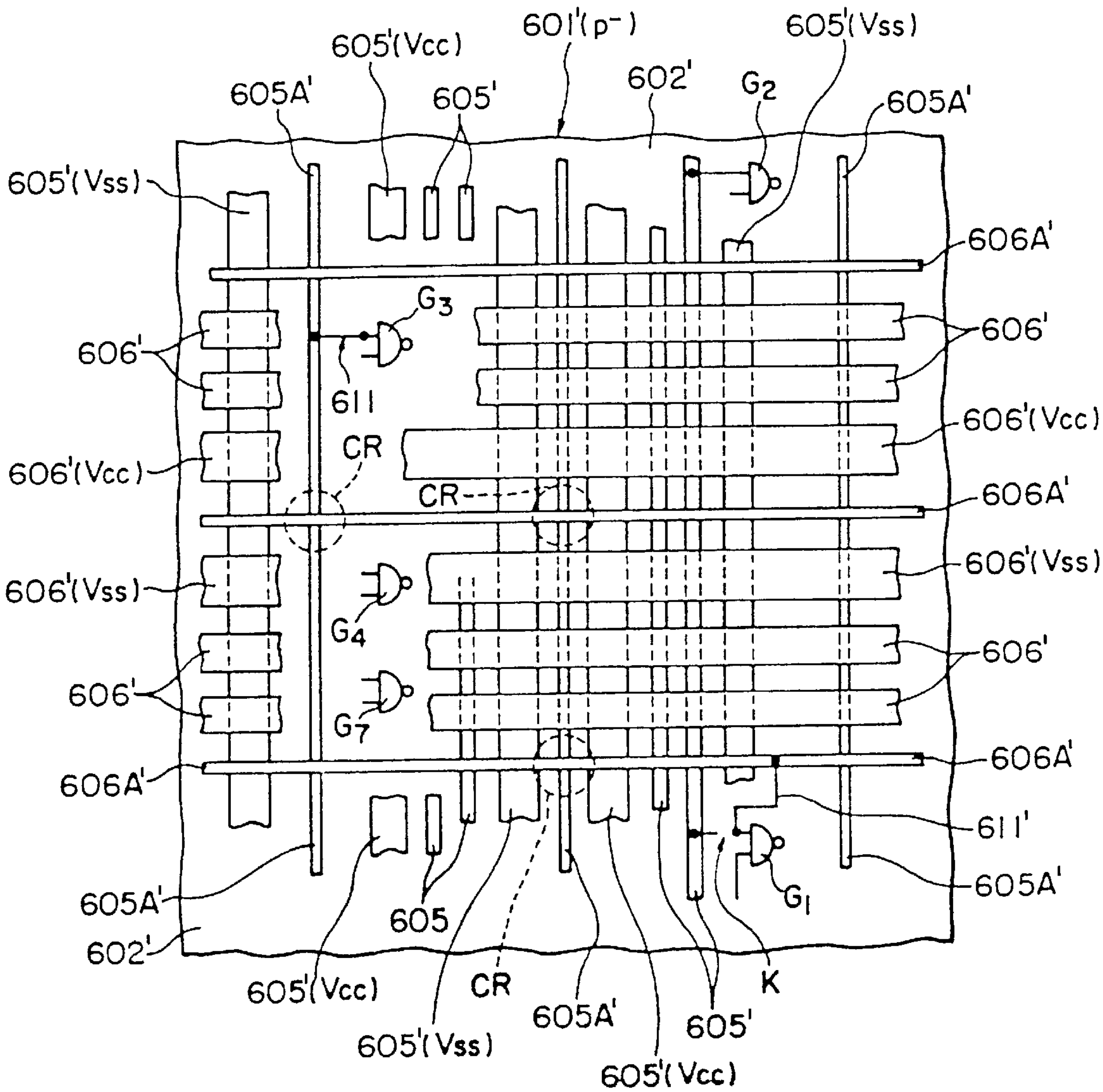

Next, as shown in FIGS. 19K and 19L, a correction line 611' is formed at a crossing portion of lower- and upper-layer auxiliary lines 605A' and 606A' so that the upper surface exposed from the connection hole 610' of the auxiliary line 606A' connected with the upper surface exposed from the connection hole 610' of the electroconductive layer 606B'. The correction line 611' for connecting the lower- and upper-layer auxiliary lines 605A' and 606A' is formed in the portion CR surrounded with dotted line.

In this way the logical gates $G_1$ and $G_3$ connected through the auxiliary lines 605A', 606A' and the correction line 611'.

Figure 19N:
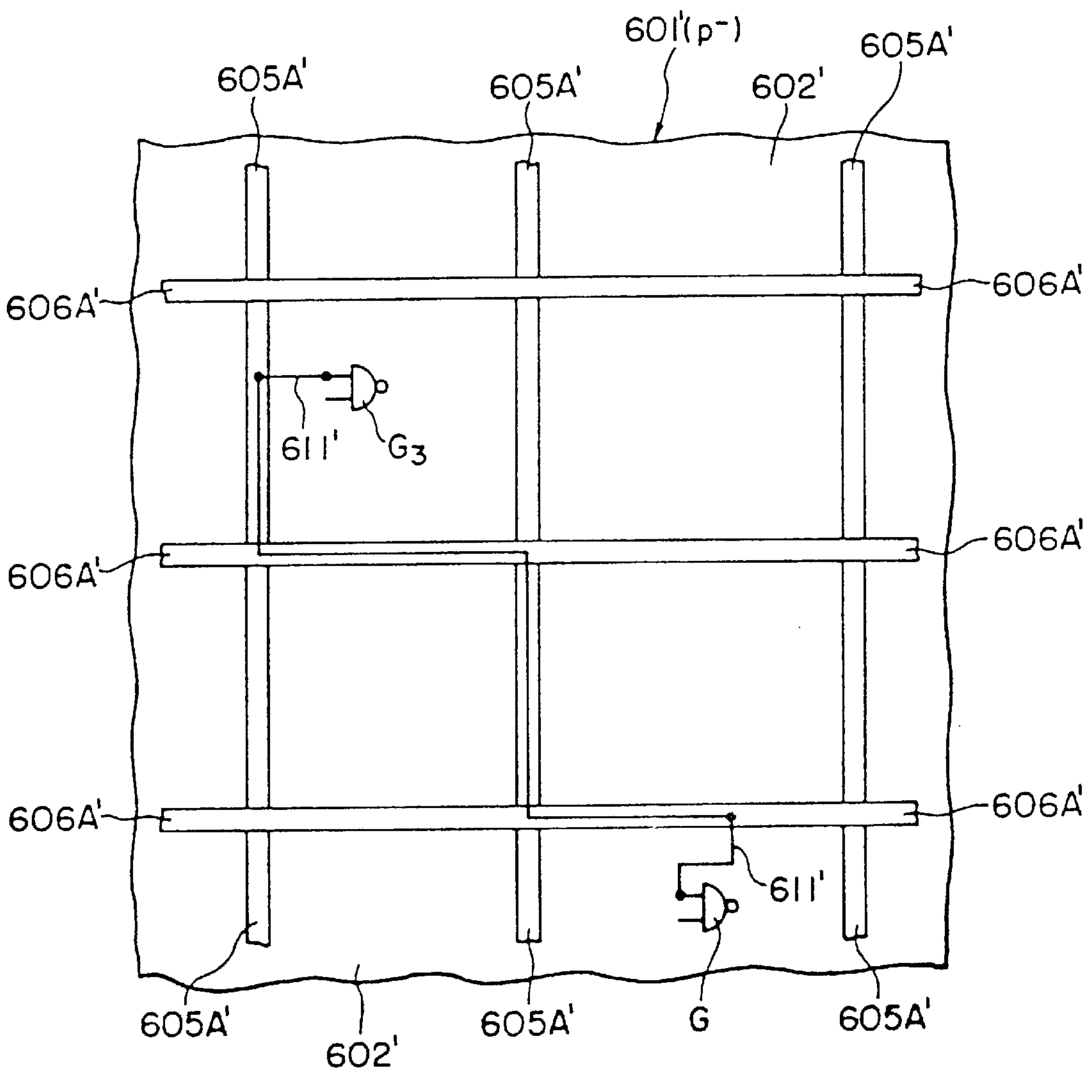

FIG. 19N shows connection between the logical gates $G_1$ and $G_3$ in an equivalent manner using a solid line.

According to this embodiment there can be obtained the following effects.

(1) Since the lower auxiliary line 605A' is provided with the electroconductive layer 606B' of the same layer as the upper auxiliary line 606A', the connection hole 610' on the auxiliary line 605A' can be made shallow. This means that the breaking of the correction line 611' in the connection hole 610' can be eliminated because the hole 610' is formed in a tapered shape wherein the deeper, the narrower. Consequently, the connection between the auxiliary lines 605A' and 606A' can be made more reliable, that is, the yield can be improved.

(2) In the presence of the auxiliary lines 605A' and 606A' the correction line 611' formed by selective CVD can be shortened. Consequently, the time required for forming the correction line 611' by selective CVD can be shortened and hence it is possible to shorten the time required for the correction of logic.

(3) As a result of the above (2), the correction line 611' comprising a high-melting metal film such as Mo or W film can be shortened, and since almost all portions of the logical gates $G_1$ and $G_3$ are connected through auxiliary lines 605A and 606A each comprising an aluminum film of small resistance, the operating speed between the logical gate $G_1$ and $G_2$ can be set at the same as the operating speed of the other logical gates not corrected in their connection. In other words, it is possible to enhance the reliability of logical correction.

(4) The freedom of connection between the logical gates G and the auxiliary lines 605A' or 606A' can be enhanced because the connection between an auxiliary line 605*a*' and the logical gate $G_3$ and that between an auxiliary line 606A' and the logical gate $G_1$ are performed at any desired points on the auxiliary line 605A' or 606A' through the correction line 611' formed by selective CVD and also because the correction line 611' is formed on the protective film 609' of the top layer.

In FIG. 19K, the electroconductive layer 606B' located above the auxiliary line 606A' may be cut using a microion beam, whereby the upper and lower auxiliary lines 605*a*' can be separated from each other. Although the upper auxiliary line 605*a*' is not used for logical correction, it may be used for correcting the connection between other logical gates.

As shown in FIG. 19L, moreover, the auxiliary lines 605A' located just under the auxiliary line 606A' and each auxiliary line 605A' spaced from the auxiliary line 606A' are separated at a lower portion A of the electroconductive layer 606B'. The auxiliary lines 605A' may together intersect the auxiliary line 606A' without separation into plural portions. In this case, there may be provided only one connecting hole 608' for connection between the electroconductive layer 606B' and the auxiliary line 605A'.

As mentioned above, the auxiliary line 605A' is separated at lower portion of the electroconductive layer 606B' and thus the separation of an unnecessary auxiliary line 606*a*' can be done at the overlaying electroconductive layer 606B'.

Although in this embodiment the auxiliary lines 605A' and 606*a*' comprising an aluminum film are provided to correct the connection of the lines 605' and 606', the logical gates $G_1$ and $G_2$ may be connected by only the correction line 611' formed by selective CVD without provision of the auxiliary lines 605A' and 606A'. In this case, the correction line 611 formed by CVD can extend at any desired pattern on the protective film 609' of the top layer, so the freedom of correction wiring for logical correction is extremely high.

The present invention has concretely been described on the basis of the above embodiment, but is goes without saying that the invention is not limited thereto and that various modifications may be made within the scope not departing the gist thereof.

For example, this embodiment is applicable not only to a logical correction for a logical IC but also to the correction of wiring on a printed circuit board.

The following is a brief description of an effect obtained by a typical invention disclosed herein. Since an electroconductive layer of the same layer as an upper-layer auxiliary line is provided on a lower-layer auxiliary line, a connection hole can be formed in the later shallowly and hence the connection between the lower- and upper-layer auxiliary lines can be done positively.

As set forth above, the present invention relates to a wiring technique and is particularly effective in its application to a technique for correcting the connection between wirings.

The following description is now provided about the usefulness of the invention. In the development stage of a logical IC used in a computer, there is often made a change of its logical construction. This is performed by changing the wiring pattern of the aluminum wiring which connects between logical gates.

However, if the change of logic is made by changing the wiring pattern, it will take two weeks or so to complete the IC. In view of this point it has been proposed by the present inventors to provide an auxiliary line beforehand between logical gate connecting lines and correct the connection using the said auxiliary line.

Having studied the above technique, the present inventors found out the following problem.

Like a normal wiring whose layout is for connecting between logical gates at the time of logical design, an auxiliary wiring comprises an aluminum film of a lower layer, e.g. the first layer, and an aluminum film of an upper layer, e.g. the second layer. Therefore, for connection between the lower- and upper-layer auxiliary lines it is necessary to form a deep connection hole by removing from the protective film of the top layer to the insulating film which covers the auxiliary line of the lower layer. Due to such a deep connection hole, the electroconductive layer which connects the lower- and upper-layer auxiliary lines deteriorates in its reliability of connection.

On the other hand, the present inventors found that the connection hole for the connection of a correction line could be made shallow by providing an electroconductive layer of the same layer as an upper-layer auxiliary line on a lower-layer auxiliary line in the vicinity of a crossing portion of both auxiliary lines and connecting the electroconductive layer to the lower-layer auxiliary line and that therefore the reliability of wiring correction could be improved.

Embodiment 7

An embodiment 7-I of the invention will now be described. Usually, a power line is disposed on an aluminum wiring of the top layer (e.g. the fourth layer) of an LSI. The power line has a large width as compared with a signal line of a lower layer in order to supply an electric power stably. So even if it is partially separated, the operation of the LSI will be scarcely influenced. Therefore, as shown in FIG. 20A, a part of a top-layer wiring 718' is notched using an FIB (focused ion beam).

Then, windows 709' are formed in two positions of the top-layer wiring. The portion of such a shape is formed at every position where CVD (laser CVD lines 705' are crossed.

Figure 20A:
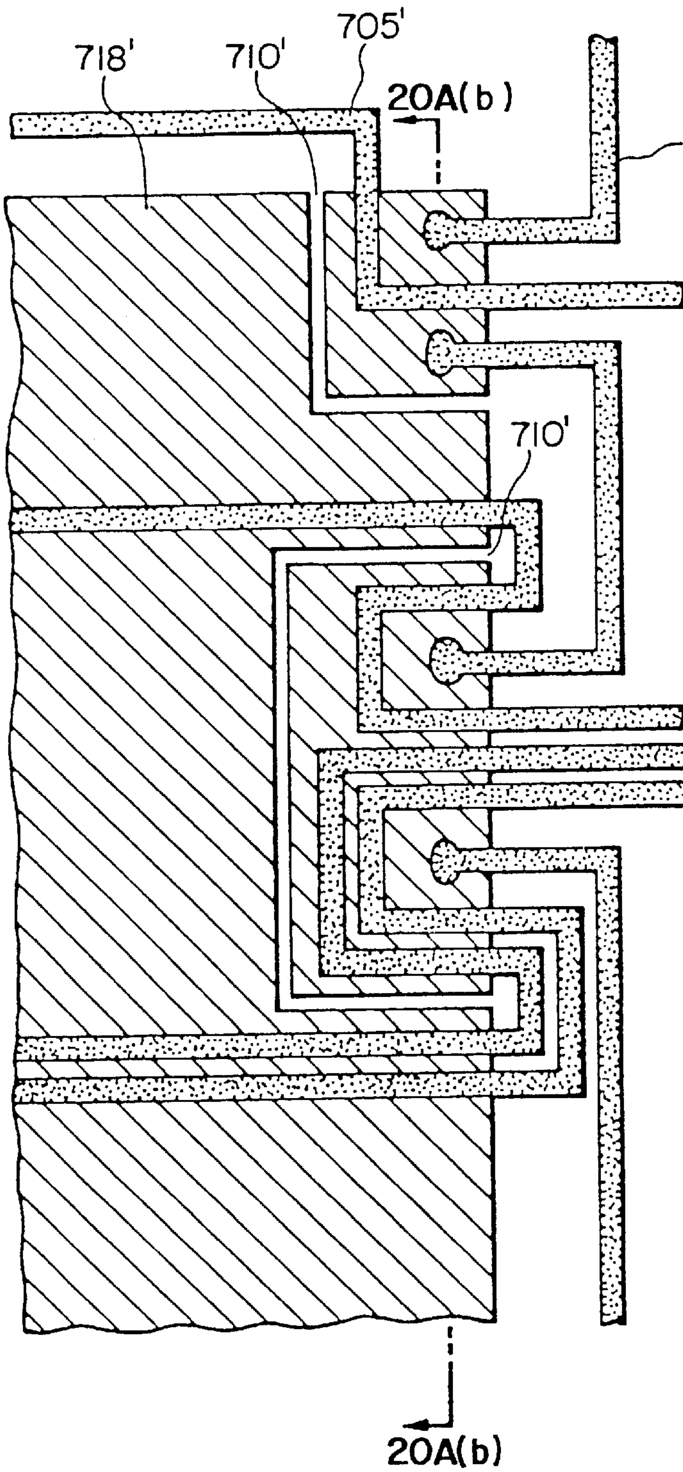
FIGS. 20A(*a*), (*b*) and 20B(*a*), (*b*) are plan and sectional views in a wired state according to an embodiment 7-I of the second aspect of the present invention.
Figure 20A:
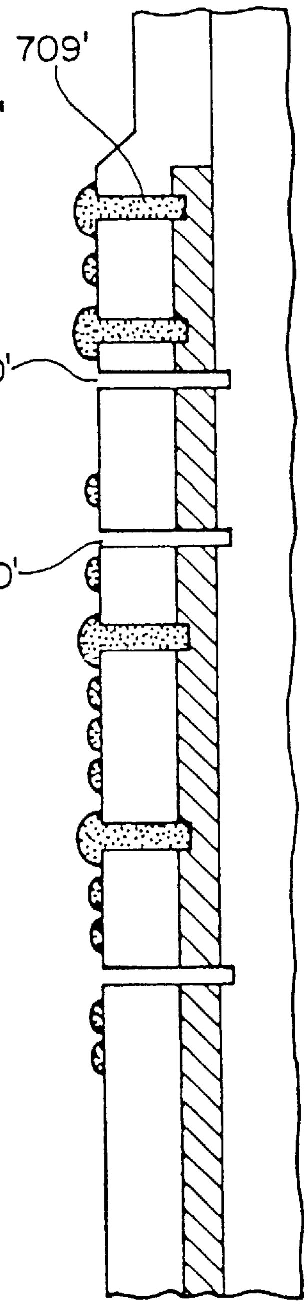

Next, in a CVD (laser CVD) wiring process there is formed a wiring as in FIG. 20A, whereby the CVD lines 705' are prevented from being short-circuited.

Figure 20B:
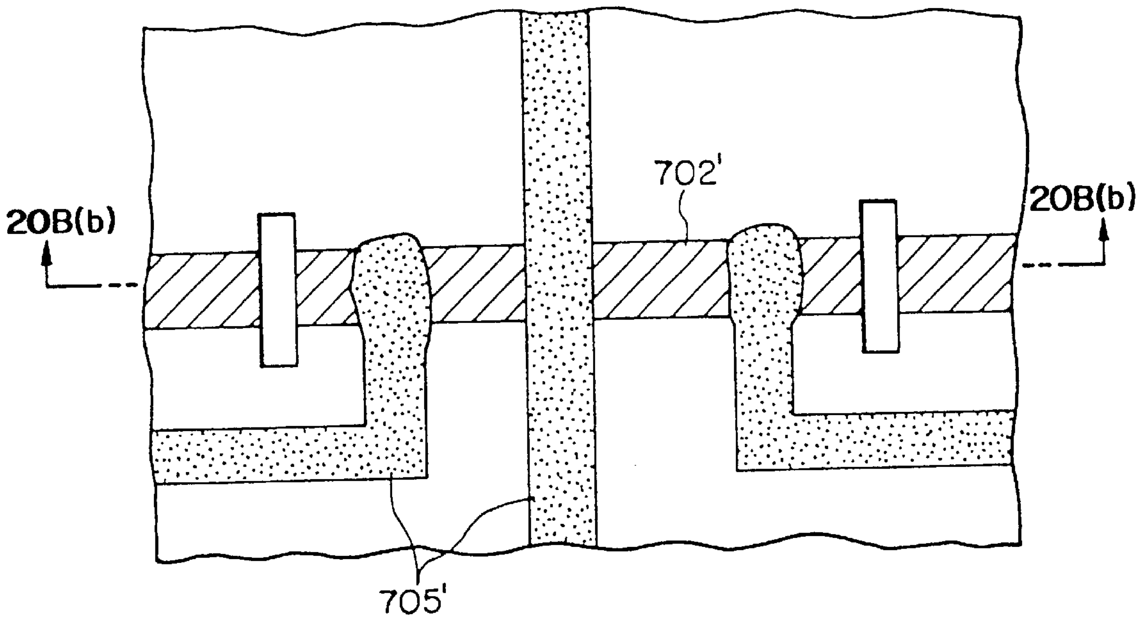
FIGS. 20C(*a*) and (*b*) are plan and sectional views showing a wired stated according to an embodiment 7-II of the second aspect of the present invention.
FIGS. 20D and 20E(*a*), (*b*), are plan and sectional views of a crossing structure according to an embodiment 7-III of the second aspect of the present invention.
FIG. 20F is a plan view showing a wired state according to a modification of the embodiment 7-III.
Figure 20B:
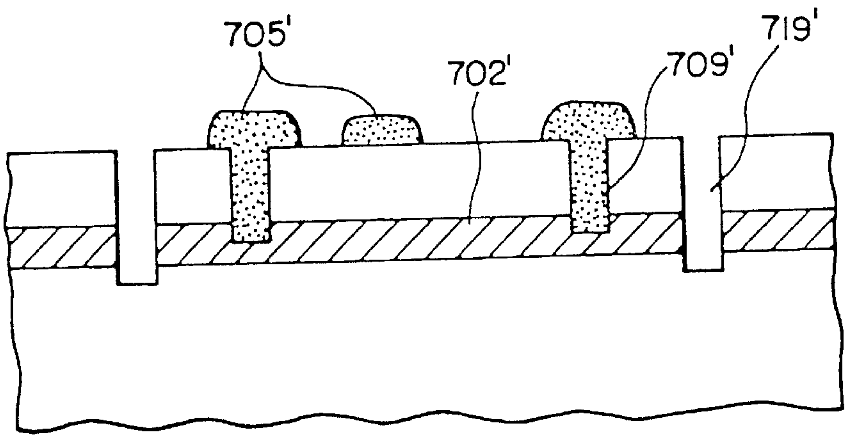
Figure 20C:
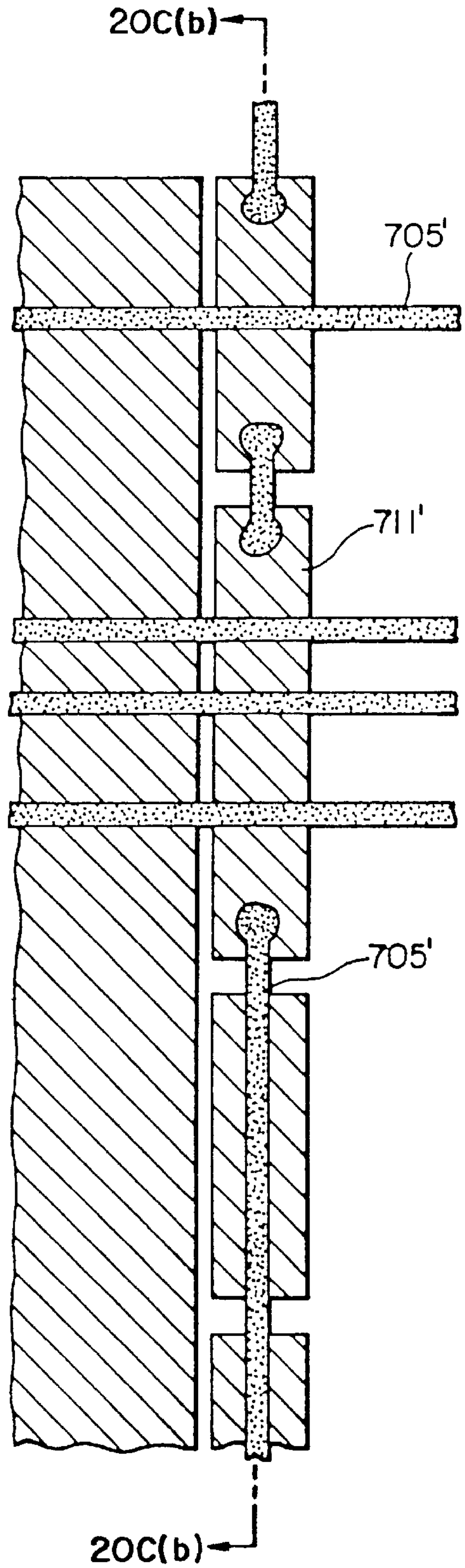
Figure 20C:
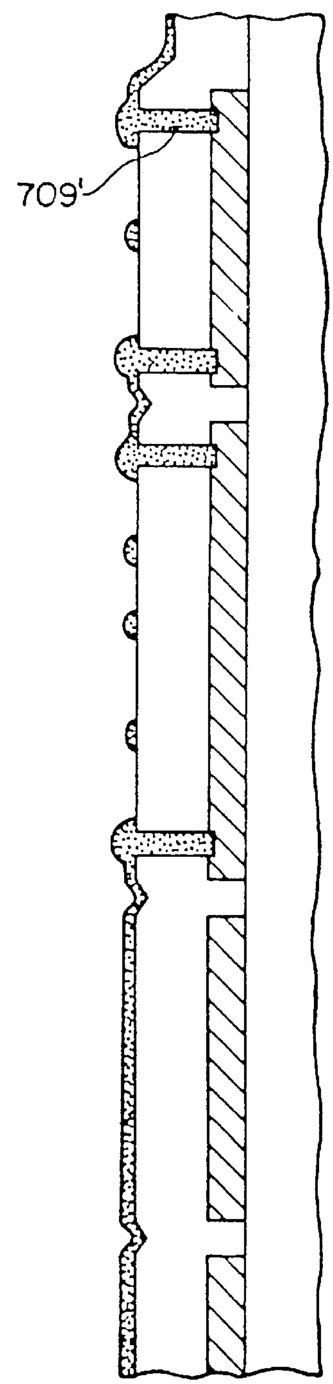

The above is an example of using the wide wiring 718' of the top layer, but if the LSI wiring of any other layer is cut and then window-formed as in FIG. 20B, this portion can be utilized as a crossing point of laser CVD lines.

Another embodiment 7-II of the invention will now be described. In the previous embodiment, the existing LSI wiring is cut off, window-formed and used as a crossing point of CVD lines. However, the separation of the LSI wiring is time-consuming; besides, in the cut-away part, e.g. a notch, the LSI wiring layer is exposed, so the laser CVD wiring must be laid while avoiding that portion, resulting in that the wiring forming path becomes complicated. In this embodiment, therefore, an initially isolated island region is incorporated on the LSI.

More specifically, for crossing the laser CVD lines 705', windows are formed at both ends of an island region 711' and a laser CVD line 705' is connected thereinto. Then, another CVD line 705' is laid in an overhead crossing fashion to pass therebetween. By so doing, the separation time can be saved and it is no longer necessary to bend wiring.

An embodiment 7-III of the invention will now be described. In the above embodiment 7-II there was used laser of FIB for forming windows, while in this embodiment there is fabricated an LSI in an initially-bored (completed) state of windows to save the window forming time.

Figure 20D:
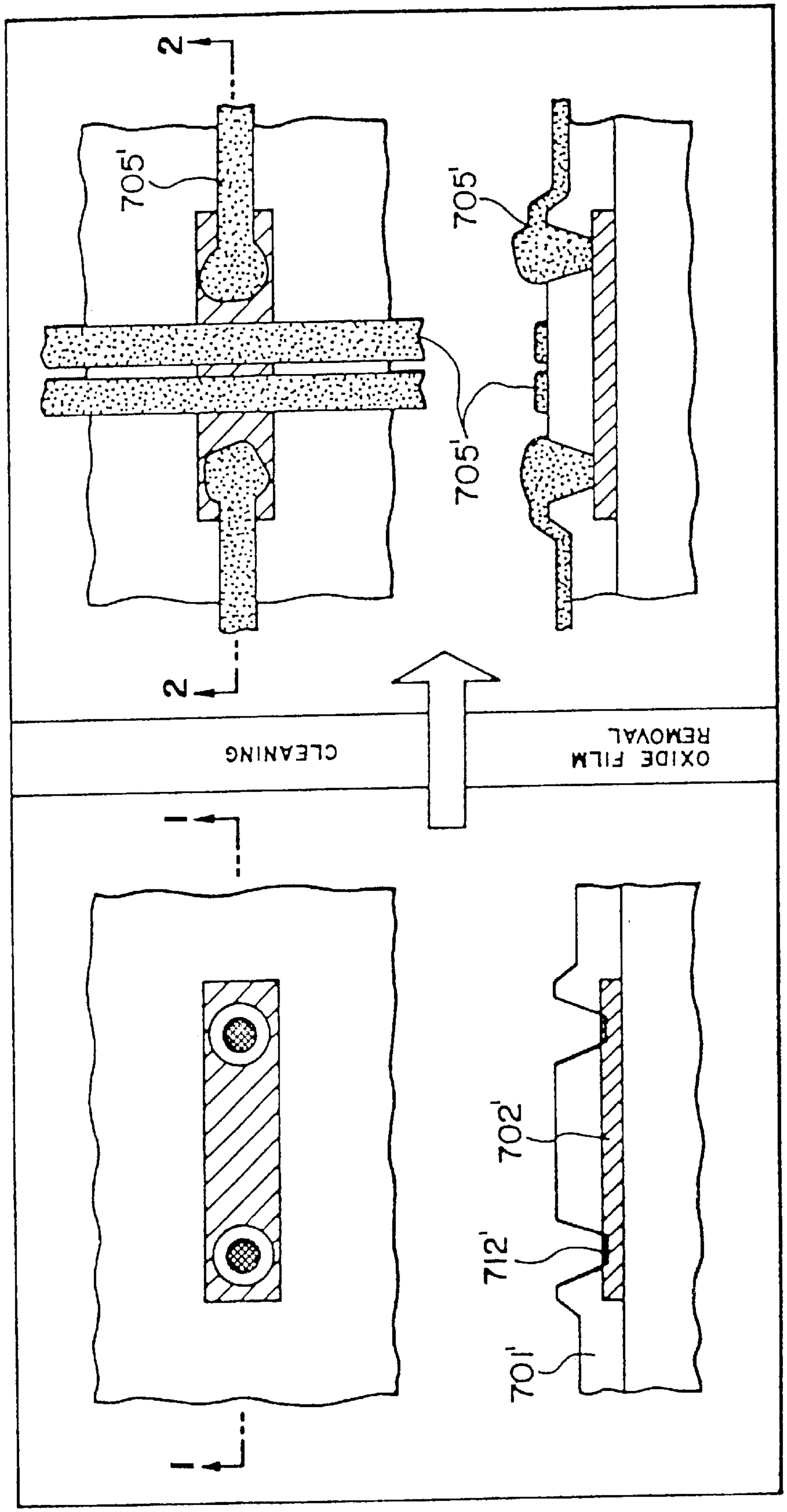
Figure 20E:
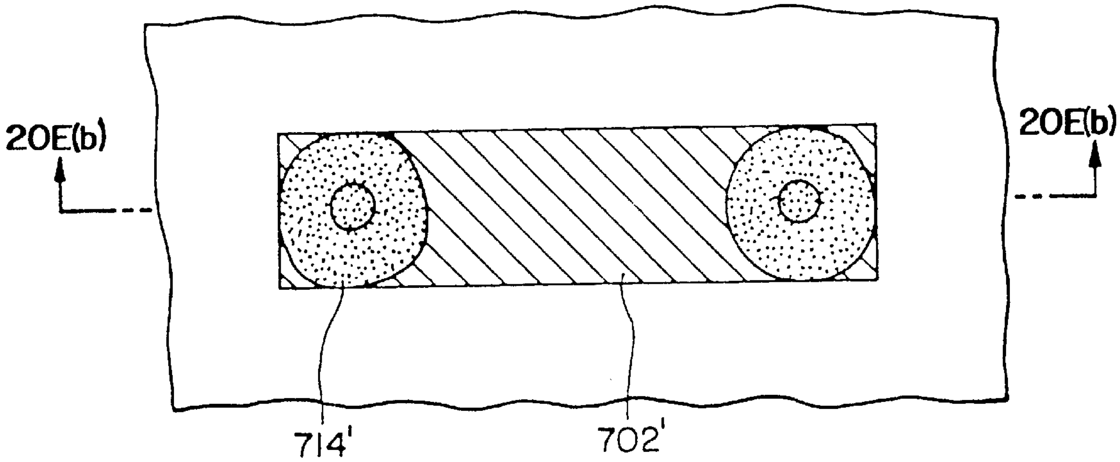
Figure 20E:
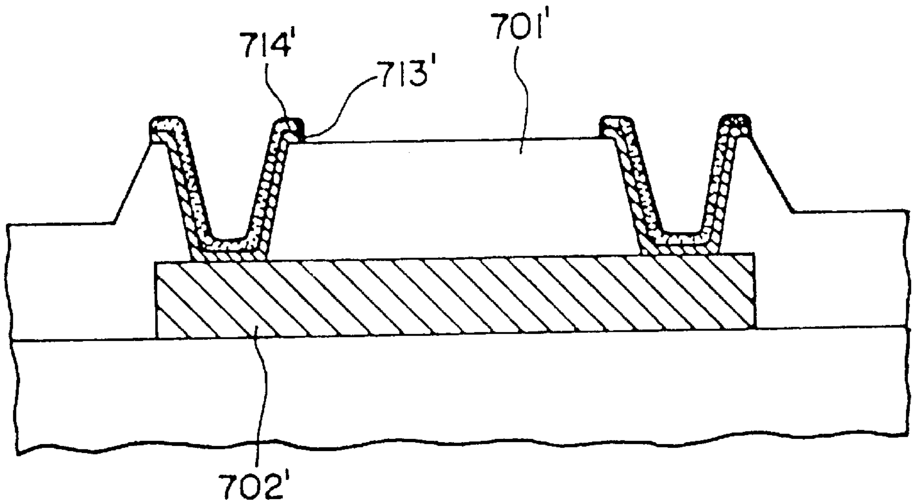

FIG. 20D shows a structure of crossing point of laser selective CVD lines utilizing a bonding pad for a bump electrode. As shown in the embodiment 4, the metal exposed to the bonding pad is aluminum. Aluminum is oxidized easily, with an alumina layer 712' formed on the surface. In this state, even if laser CVD lines 705' are attached thereto, the contact resistance is too high. Therefore, where a crossing utilizing this pad is used, it is necessary to either let alumina fly off by sputter-etching the aluminum surface of the pad just before the formation of laser CVD lines, or subject the exposed aluminum surface of the pad portion to a light sputtering treatment at the end of cutting or perforating step using FIB and passing to the next laser CVD line forming step without breaking vacuum.

Where the aluminum pad is exposed as above, cleaning of the surface is absolutely necessary. If the aluminum pad surface is coated with a noble metal such as gold, platinum or palladium, such cleaning becomes unnecessary. FIG. 20E shows a structure of a crossing pad having such a coating. In FIG. 20E, a gold (Au) film is formed on an aluminum pad portion 702' of an LSI wiring through a substrate barrier metal 713' comprising a Cr-Cu-Au alloy of a lower layer and a Pb-Sn alloy of an upper layer. A crossing can be realized effectively by using the crossing pad shown in FIGS. 20D and 20E in the same manner as in FIG. 20B.

Figure 20F:
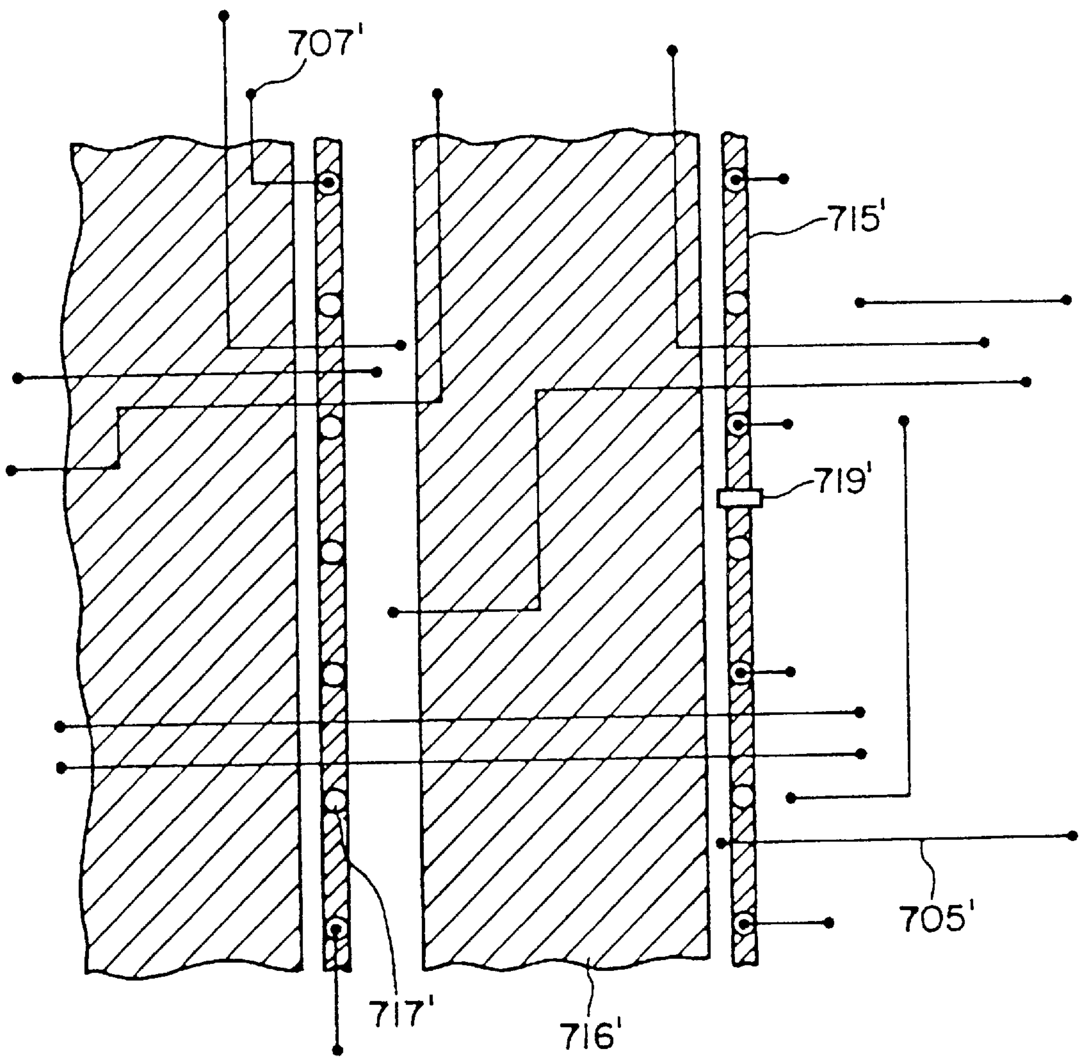

As shown in FIG. 20F, if an end portion of a long power line is cut off and plurality of perforated structures 715 are disposed along the line, it is easy to realize a crossing of many lines and even a long-distance connection can be effected using short CVD lines 705'. If necessary, the aluminum wiring of the above structure can be cut off with laser or FIB and used. The right-hand structure of FIG. 20F shows this example, wherein the central part is separated and utilized for the crossing of lines separately up and down.

Embodiment 8

The following is an explanation of an example wherein the above (1) to (7), namely, the embodiments 1 to 7, are applied to a GaAs-IC.

First, a manufacturing method for a GaAs-IC will be described below with reference to FIGS. 21A to 21R.

Figure 21A:
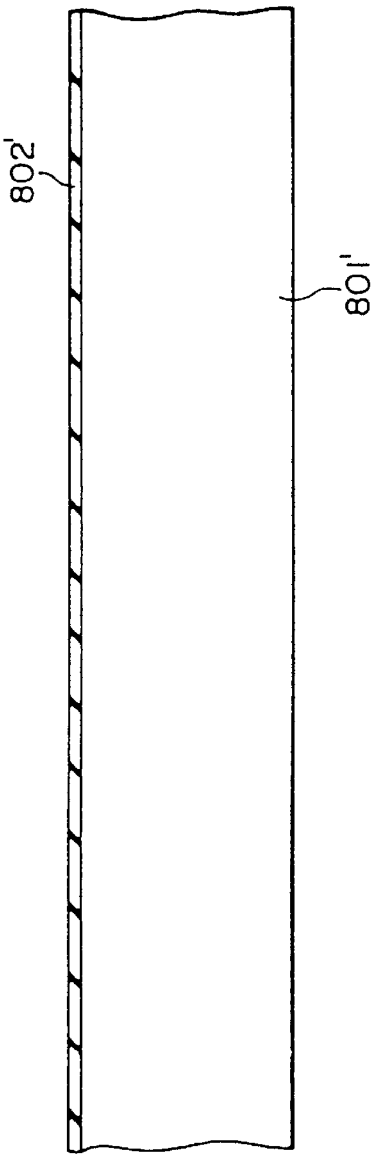
FIGS. 21A to 21U are diagrams showing a manufacturing process according to an embodiment 8 of the second aspect of the present invention.

As shown in FIG. 21A, a semi-insulative GaAs substrate 801' (generally disc-like) is prepared by slicing a 3-inch GaAu ingot which has been drawn up by an LEC (liquid Encapsulated Czochralski) method, into an approximately 700 $\mu$m thickness, and an $SiO_2$ film of about 500 Å is formed on the surface thereof by CVD (Chemical Vapor Deposition).

Figure 21B:
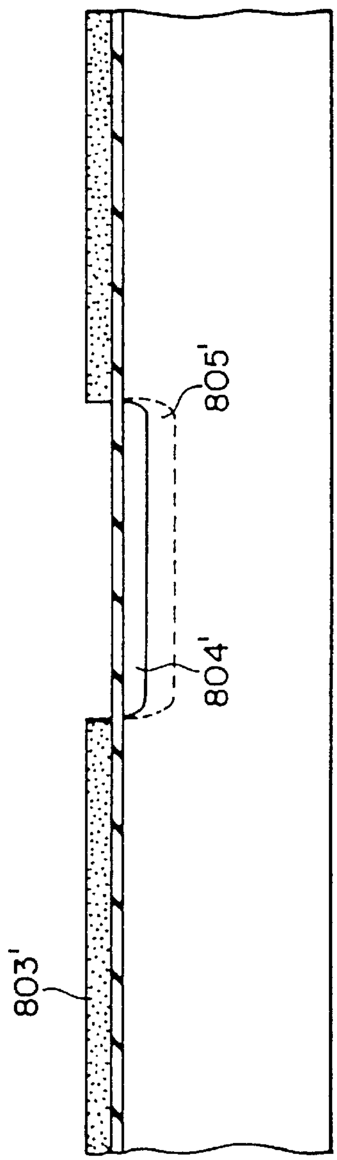

Next, as shown in FIG. 21B, a photo resist 803' having a thickness of 1 to several $\mu$m (spin application) is patterned to cover the other portion than a predetermined active element region by photolithography. To form an N-type channel with this result as a mask, Si (silicon) is dosed by ion implantation ($2\times10^{12}/cm^2$, 75 Kev) and thus there if formed an N- channel 804'. Further, using the same mask, Mg (magnesium) is dosed by ion implantation ($1\times10^{13}/cm^2$, 200 Kev) to form a P-well region 805'.

Figure 21C:
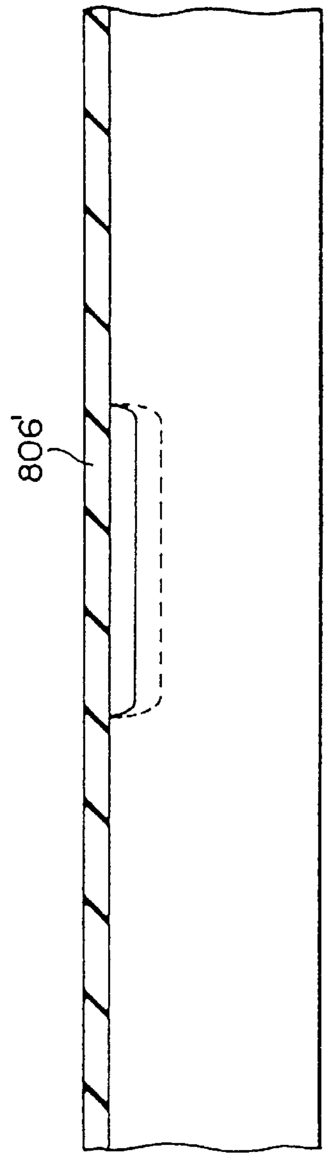

Then, as shown in FIG. 21C, the resist film 803' is removed by $O_2$ asher and ozonized sulfuric acid (sulfuric acid whose oxidation effect is enhanced by bubbling of ozone) and thereafter the $SiO_2$ film 802' is etched for about 60–120 seconds using a mixed solution (HP:$h_2O$=1:100) of HF and $H_2O$ to remove its surface a little. Then, by CVD there is formed an $SiO_2$ film 806' having a thickness of 2,000 Å in combination with the previous $SiO_2$ film 802'. In this state, annealing is made in an $H_2$ (hydrogen) atmosphere at 800° C. for 13 to 20 minutes to activate the ion implantation region.

Figure 21D:
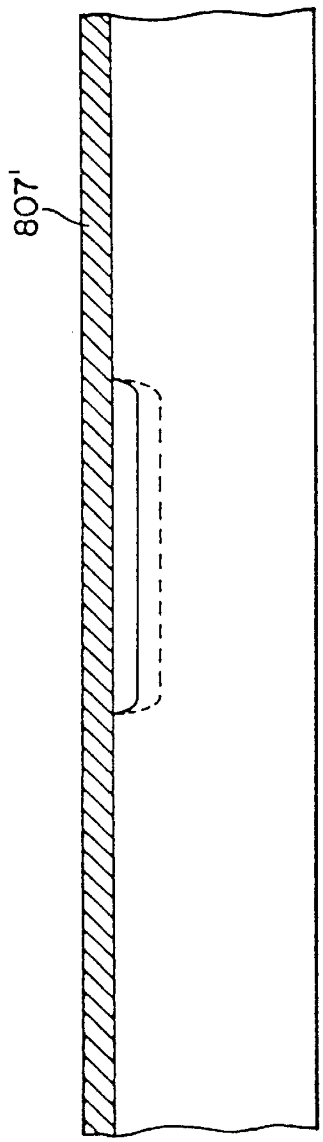

Next, as shown in FIG. 21D, the $SiO_2$ film 806' is removed throughout the whole surface thereof (using hydrofluoric acid), and while the surface is clean $WSi_X$, i.e. tungsten silicide, 807' (x=0.4~0.5) of 3,000 Å or so is formed on the entire surface by sputtering.

Figure 21E:
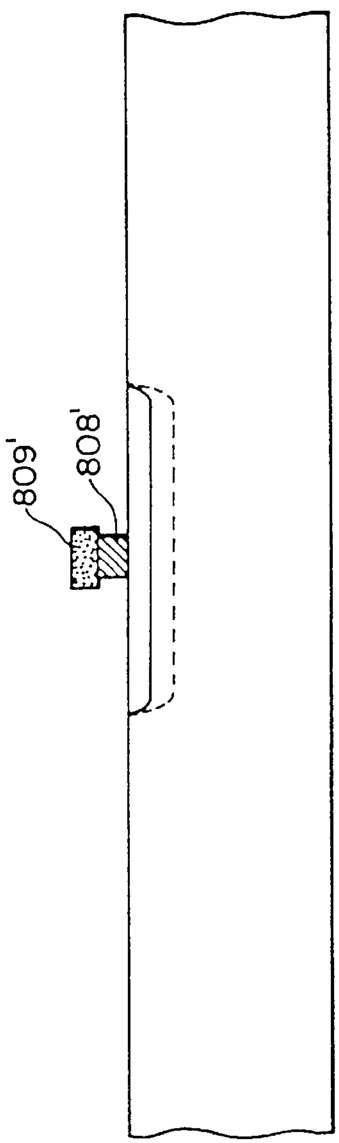

Then, as shown in FIG. 21E, using a mask a photo resist 809' which has been patterned by photolithography, a Schottky gate 808' is patterned by reactive ion etching (RIE).

Figure 21F:
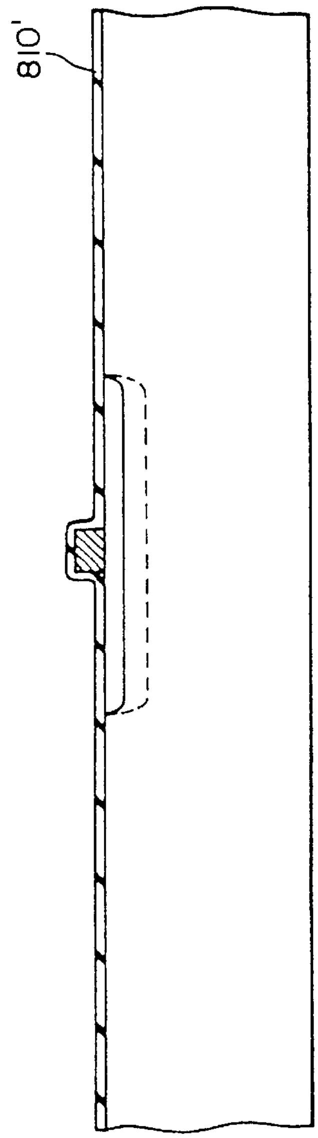

Next, as shown in FIG. 21F, the resist 809' is removed and an $SiO_2$ film 810' having a thickness of 500 Å is formed on the whole surface by plasma CVD (P-CVD).

Figure 21G:
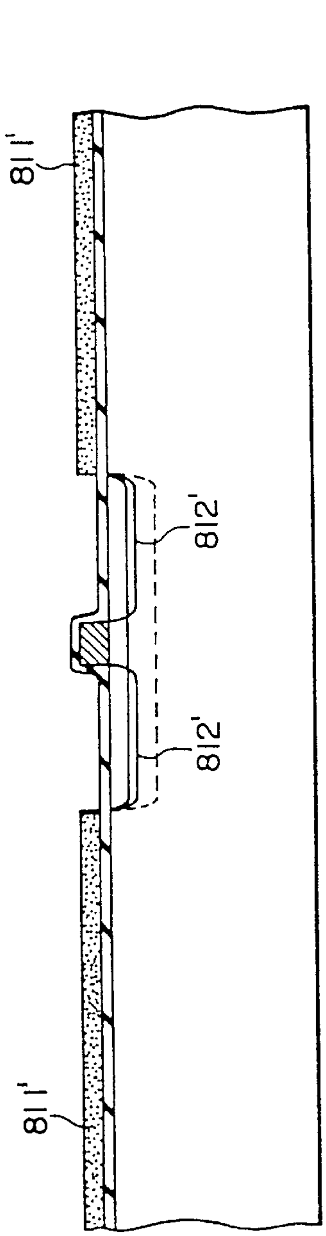

Then, as shown in FIG. 21G, a photo resist film 811' having a thickness of 1 to several $\mu$m is formed on the other portion than the active region by photolithography. Using this resist film and the gate 808' as a mask, Si as an N-type impurity corresponding to a light region of LDD (Lightly Doped Drain) is doped by ion implantation ($3\sim5\times10^{12}/cm^2$, 75 Kev) to form an N region 812'.

Figure 21H:
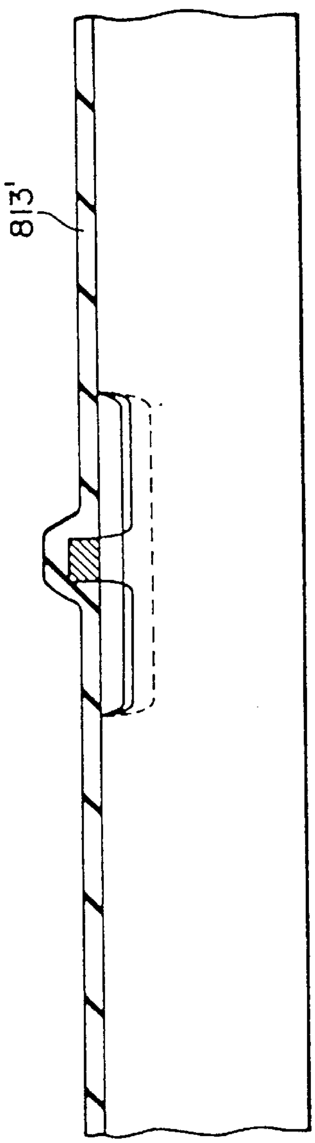

Next, as shown in FIG. 21H, the resist film 811' is removed throughout the whole surface thereof and thereafter a P-$SiO_2$ film 813' ($SiO_2$ film formed by plasma CVD) is formed on the entire surface at a thickness of about 3,000 Å in combination with the previous $SiO_2$ film.

Figure 21I:
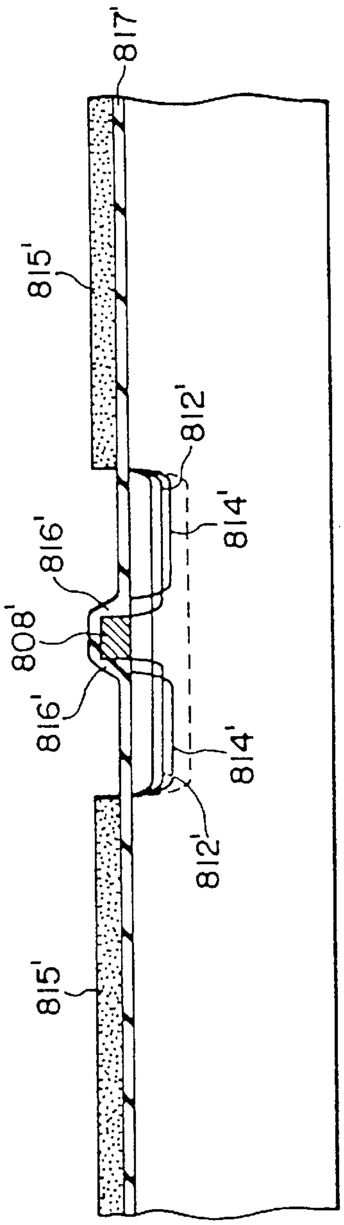

Then, as shown in FIG. 21I, the P-$SiO_2$ film 813' is subjected to anisotropic etching by RIE, leaving thick side walls 816' comprising P-$SiO_2$ on both sides of the gate and P-$SiO_2$ of about 1,000 Å on the whole surface. At this time, a photo resist film 815' having a thickness of 1 to several $\mu$m is patterned by photolithography to cover the whole surface of the other portion than the active region. Using the gate 808', side walls 816' and resist film 815' as a mask, Si for forming an N+ region deeper than the shallow region 812' of the LDD type source-drain is doped by ion implantation ($2\sim5\times10^{13}/cm^2$, 100 Kev) to form an N+ region 814'.

Figures 21J, 21K, 21L:
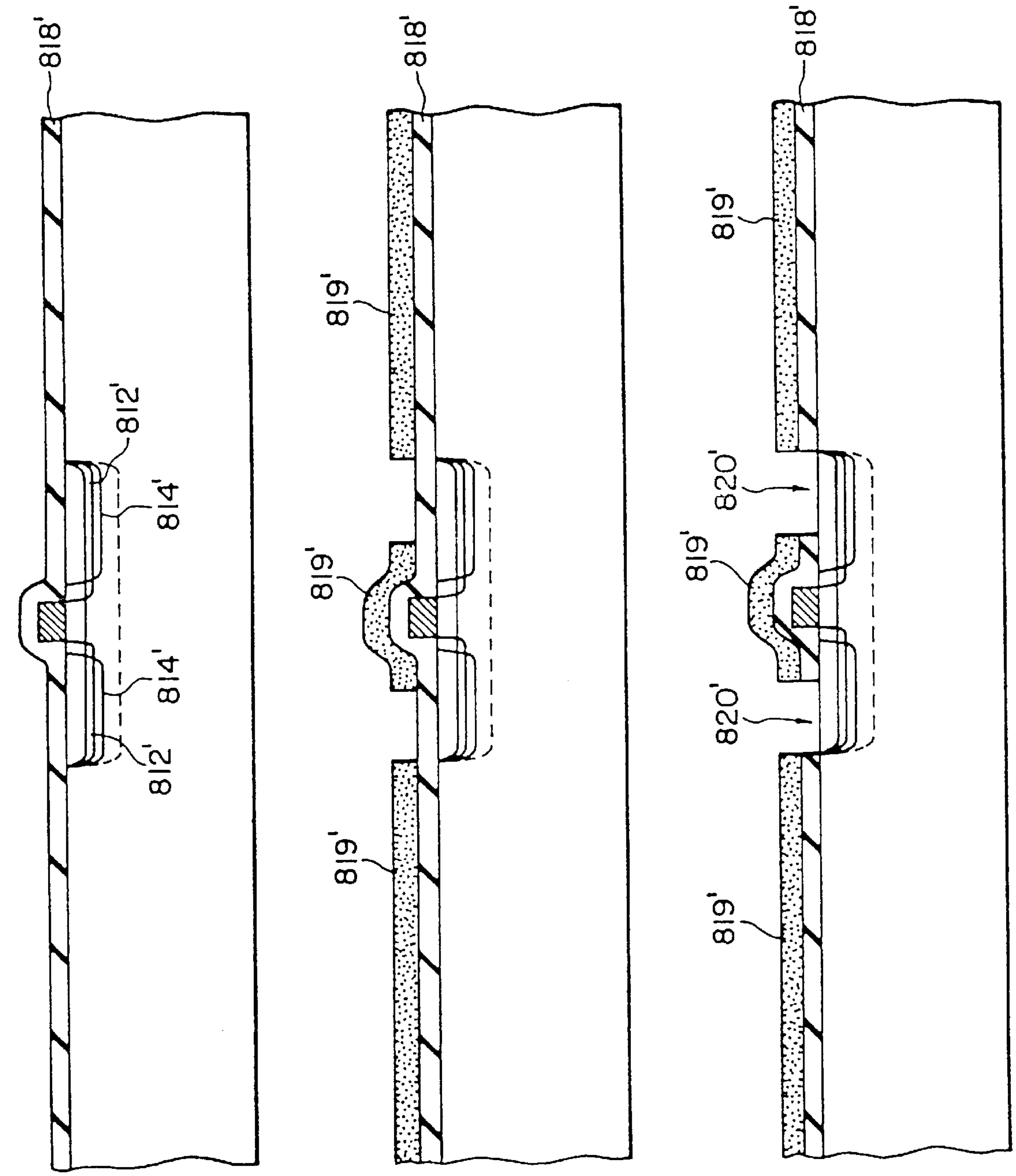

Next, as shown in FIG. 21J, the resist film 815' is removed throughout the entire surface thereof and an $SiO_2$ film 818' is formed by CVD at a thickness of about 3,000 Å in combination with the previous $SiO_2$ film 817'. At this time, annealing is performed in an $H_2$ atmosphere (800° C., 10 to 20 minutes) to activate the N region 812' and the N+ region 814'.

Then, as shown in FIG. 21K, a contact metal layer is formed by a lift-off method. More specifically, a photo resist film 819' having a thickness of 1 to several $\mu$m is patterned by photolithography.

Next, as shown in FIG. 21L, contact holes 820' are formed in the $SiO_2$ film 818' by dry etching, using the resist film 819' as a mask.

Figure 21M:
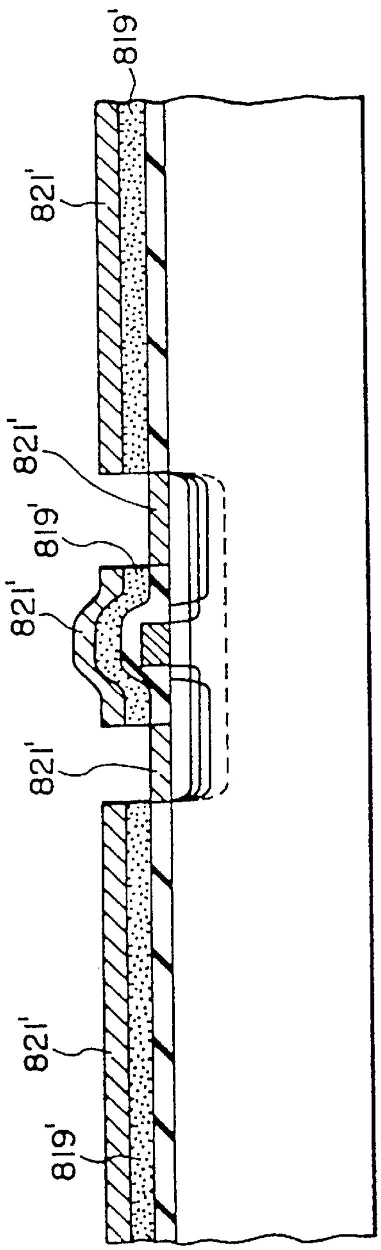

Then, as shown in FIG. 21M, a contact metal layer 821' is formed multilayerwise on the whole surface by sputtering. This multilayer film comprises, successively from lower to upper layers, an AuGe film of 400 to 800 Å, a W (tungsten) film of 80 to 150 Å, an Ni (nickel) film of 80 to 150 Å and an Au (gold) film of 1,200 to 1,500 Å.

Figure 21N:
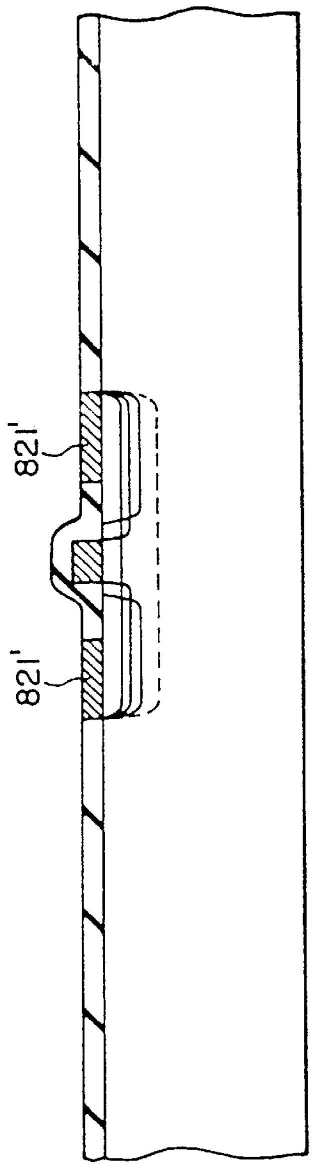

Next, as shown in FIG. 21N, only the contact metal layer 821' of the contact portion is allowed to remain by lift-off of the resist film 819'.

Figure 21O:
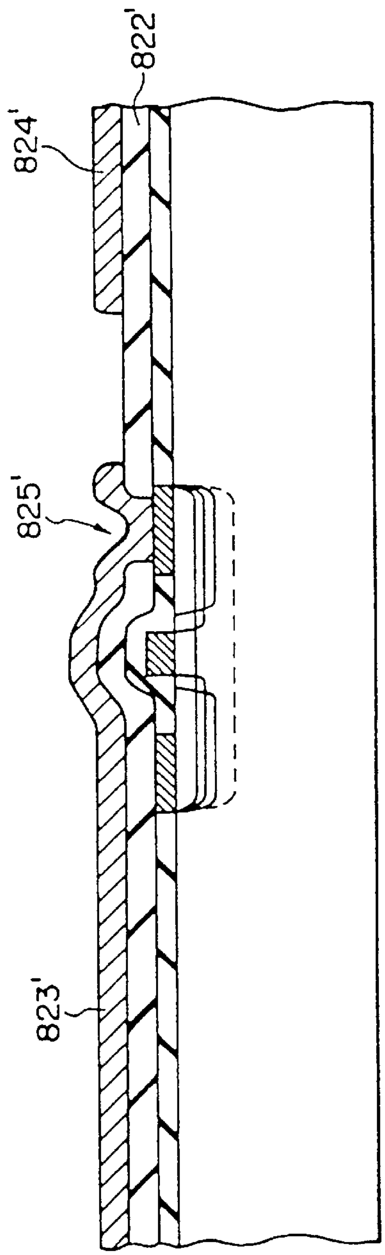

Then, as shown in FIG. 21O, a first inter-layer insulating film 822' is formed on the whole surface and through holes are formed by RIE using $CHF_3$ gas. Subsequently, multi-layer metal films 823' and 824' as a first wiring layers (WR-1) are formed by sputtering or vapor deposition and patterned by dry etching. The insulating film (IL-1) 822' comprises, successively from lower to upper layers, P-$SiO_2$ 500–1,500 Å, SOG (Spin-On-Glass) 1,000–2,000 Å and $P-SiO_2$ 2,000–5,000 Å. On the other hand, the multilayer metal film, i.e. WR-1, comprises Mo (molybdenum) 1,000–1,5000 Å, Au (gold) 3,000–5,000 Å and Mo (molybdenum) 500–1,000 Å successively from lower to upper layers.

Figure 21P:
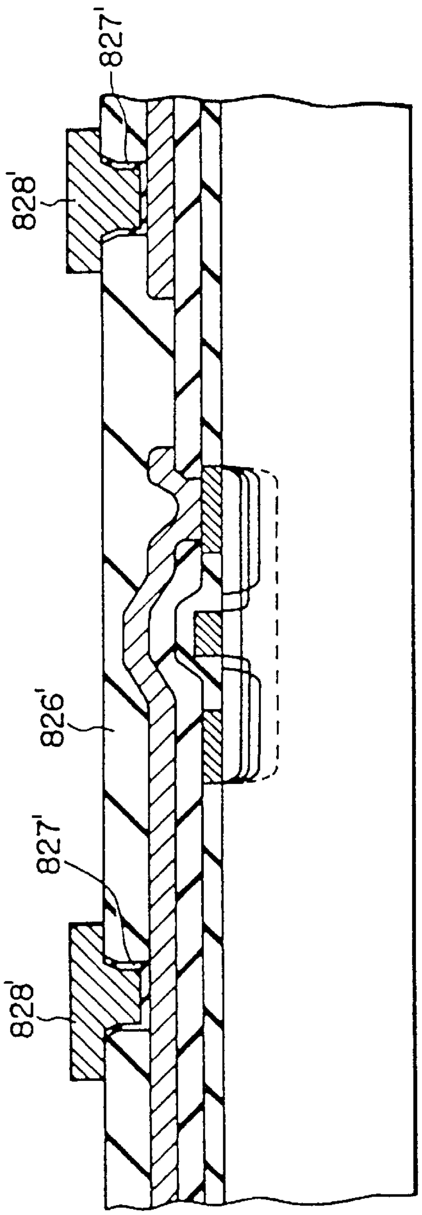

Next, as shown in FIG. 21P, a second inter-layer insulating film 826' is formed on the whole surface. This insulating film comprises a $P-SiO_2$ film of 500 to 1,500 Å, an SOG film of 2,000 to 3,000 Å and a $P-SiO_2$ film of 3,000 to 5,000 Å successively from lower to upper films. Further, through holes are formed in predetermined portions of the film IL-2. Then, an $Si_3N_4$ film 827' (P-SiN film) of 300 to 600 Å as a barrier member for the through hole portions is formed on the whole surface by plasma deposition and only the through hole is covered with a photo resist, while the P-SiN barrier of the other portion is removed. Further, a second wiring layer 828' or WR-2 is formed on the whole surface and patterned like the previous WR-1. The WR-2 film comprises Mo (molybdenum) of 1,000 to 2,000 Å, Au (gold) of 6,000 to 9,000 Å and Mo (molybdenum) of 300 to 600 Å successively from lower to upper layers.

Figure 21Q:
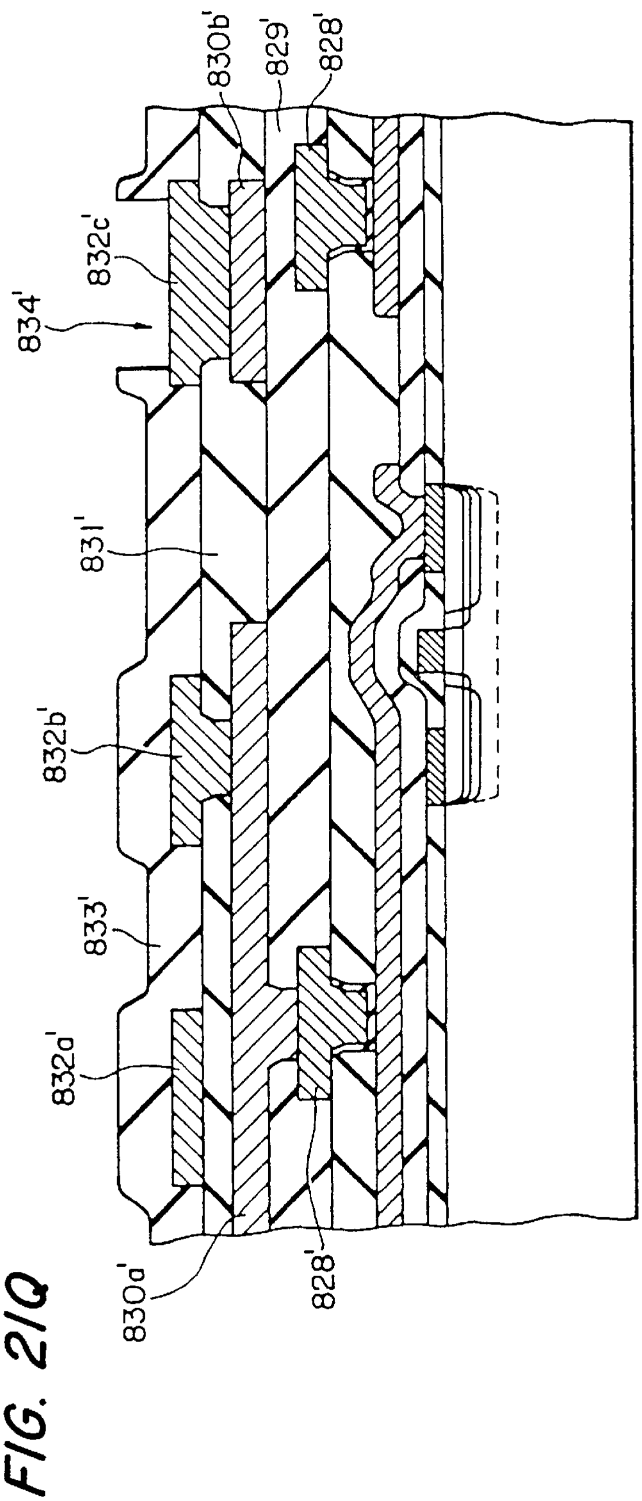

Then, as shown in FIG. 21Q, a third inter-layer insulating film 829' or IL-3 is formed on the whole surface and through holes are formed in the same manner as above, then a barrier layer is patterned (not shown). The IL-3 comprises $P-SiO_2$ of 500 to 1,000 Å, SOG of 2,000 to 3,000 Å and, $P-SiO_2$ of 3,000 to 4,000 Å successively from lower to upper layers. Further, a third wiring layer 830' or WR-3 is formed on the whole surface by sputtering. The WR-3 comprises Mo (molybdenum) of 1,500 Å, Au (gold) of 8,000 Å and Mo (molybdenum) of 500 Å successively from lower to upper layers. Further, the WR-3 is patterned like 830' in the same manner as above. Then, a fourth inter-layer insulating film 831 or IL-4 is formed on the whole surface and through-holes are formed in the same way as above. The IL-4 comprises films of $P-SiO_2$ of 1,000 Å, SOG of 3,000 Å and $P-SiO_2$ of 4,000 Å successively from lower to upper layers. An SiN barrier (not shown) is applied to the interior of each through hole in the same manner as above and a fourth wiring layers 832' or WR-4 is formed on the whole surface by sputtering. The WR-4 comprises Mo (molybdenum) of 1,500 Å, Au (gold) of 8,000 Å and Mo (molybdenum) of 500 Å successively from lower to upper layers. Further, a final passivation film 833' having a thickness of 1.2 $\mu$m is formed on the whole surface. The final passivation film 833' comprises, from lower to upper layers, a 1 $\mu$m thick PSG (Phospho-Silicate Glass) formed by CVD at a low temperature of 350° C. or so and at an atmospheric pressure and a 0.2 m$\mu$ thick P-SiN (Plasma $Si_3N_4$ film) or silicon nitride film formed by plasma CVD, successively from lower to upper layers. Further, bonding pad portions 834' are formed. In this state, probes are put on these bonding pads and each chip is checked for electrical characteristics and quality by means of a prober.

Figure 21R:
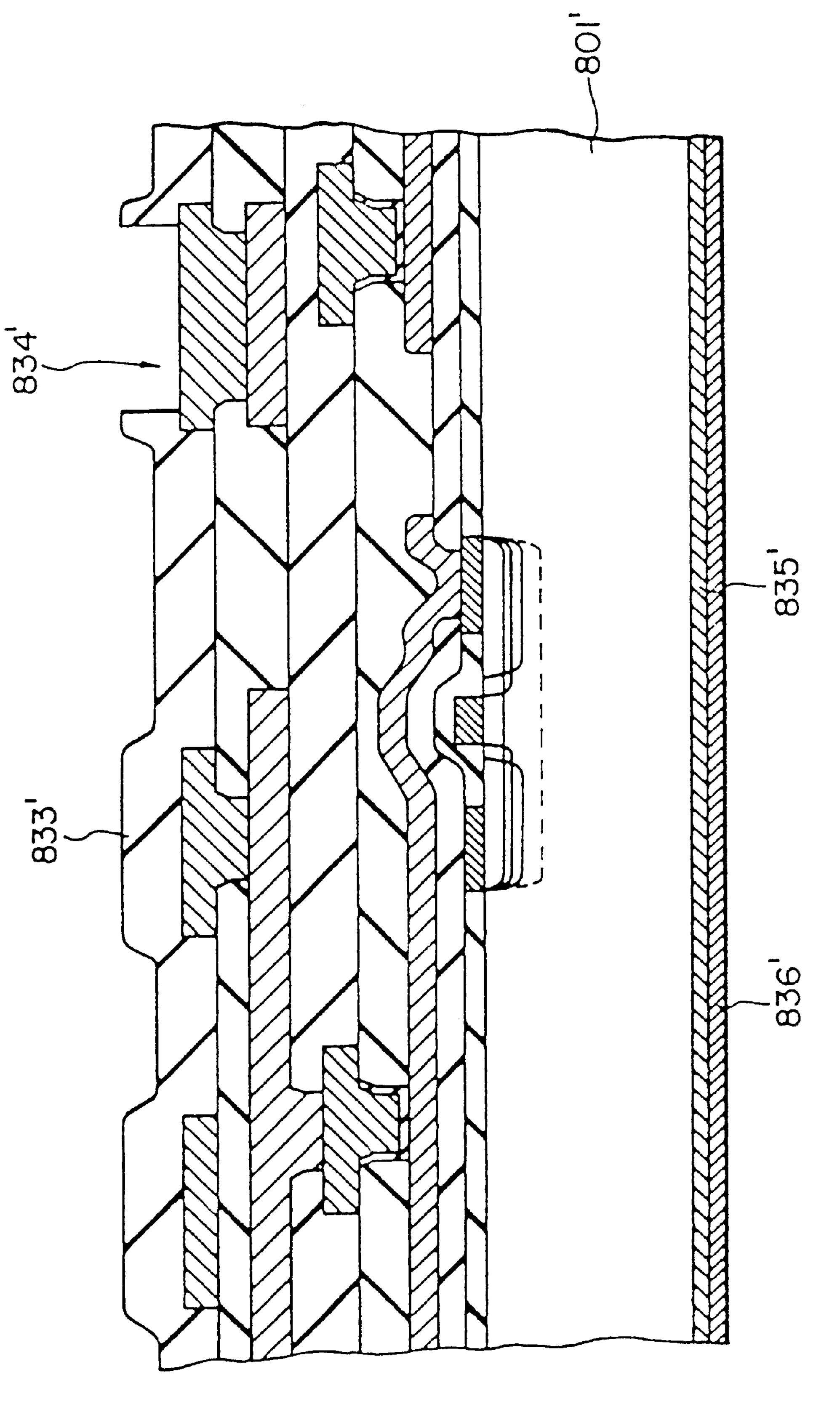

Next, as shown in FIG. 21R, the GaAs on the back of the wafer 801 is removed about 100 $\mu$m by chemical etching using an $NH_3$-based etching solution, then an AuGe layer (gold-germanium alloy layer) 835' of about 500 $\mu$ is formed by sputtering and thereafter an Au (gold) film 836 of about 1 $\mu$m is formed by vapor deposition or plating, followed by alloying treatment. Further, the wafer is divided into chips by dicing.

Figure 21S:
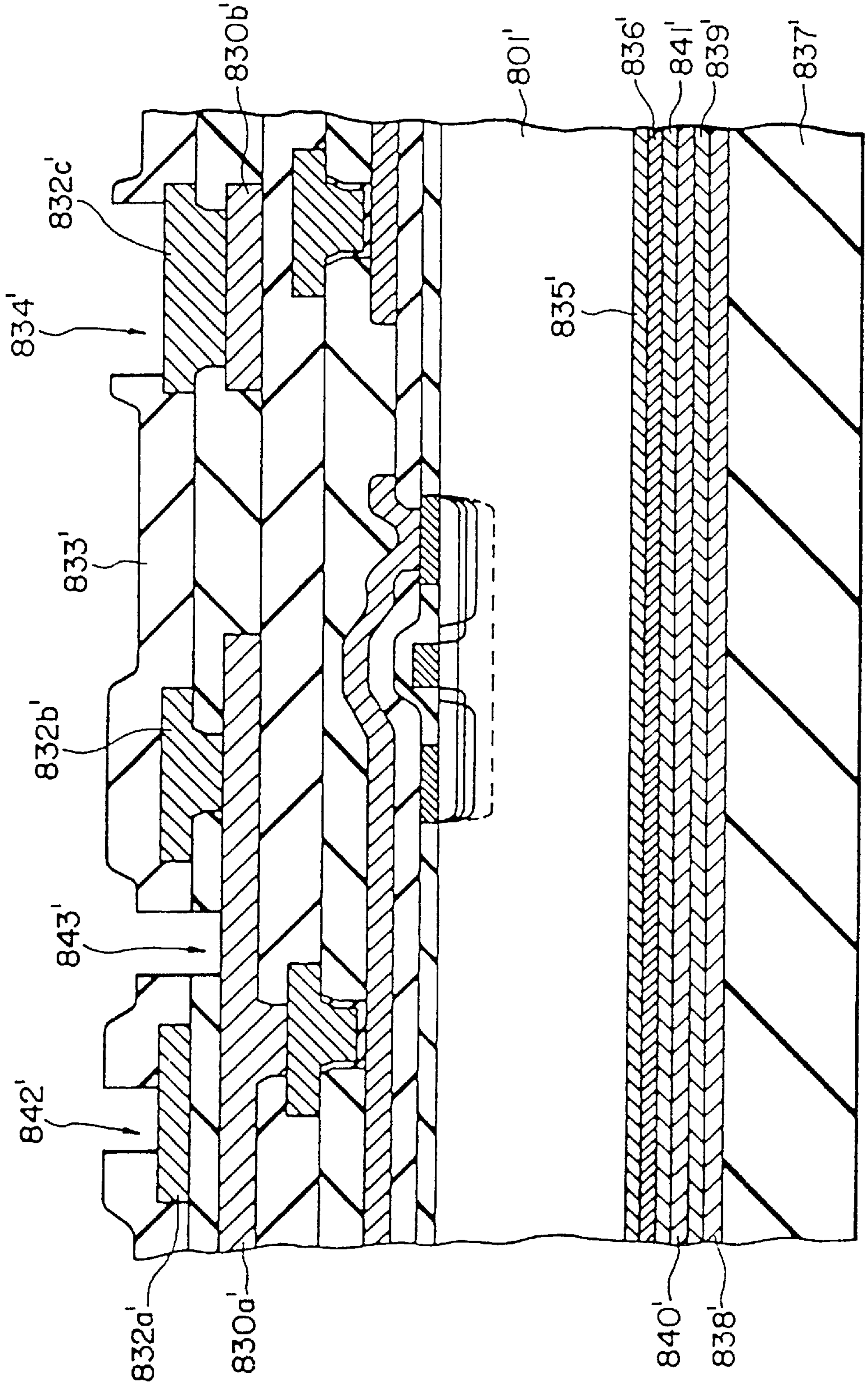

Then, as shown in FIG. 21S, a metallized pattern for die pad is formed centrally on the upper surface of a package substrate 837' comprising alumina-ceramics (by screen printing and plating). This metallized layer comprises a W (tungsten) film 838', an Ni (nickel) film 839' and an Au (gold) film 840' successively from lower to upper layers. In this state, each chip 801' is placed on the die pad through an Au-Sn (gold-tin) foil 841' of about the same size as the chip and die bonding is performed by Au-Sn eutectic. In this state, each device is stocked and the following circuit correction is made if necessary. The correction is performed using the FIB system and technique exemplified above as well as the system to be shown in a later-described embodiment 9. First, through-holes 842' and 843' are formed using FIB in a final passivation film and IL-4 thereunder on a portion 832*a*' of WR-4 and a portion 830*a*' of WR-3.

Figure 21T:
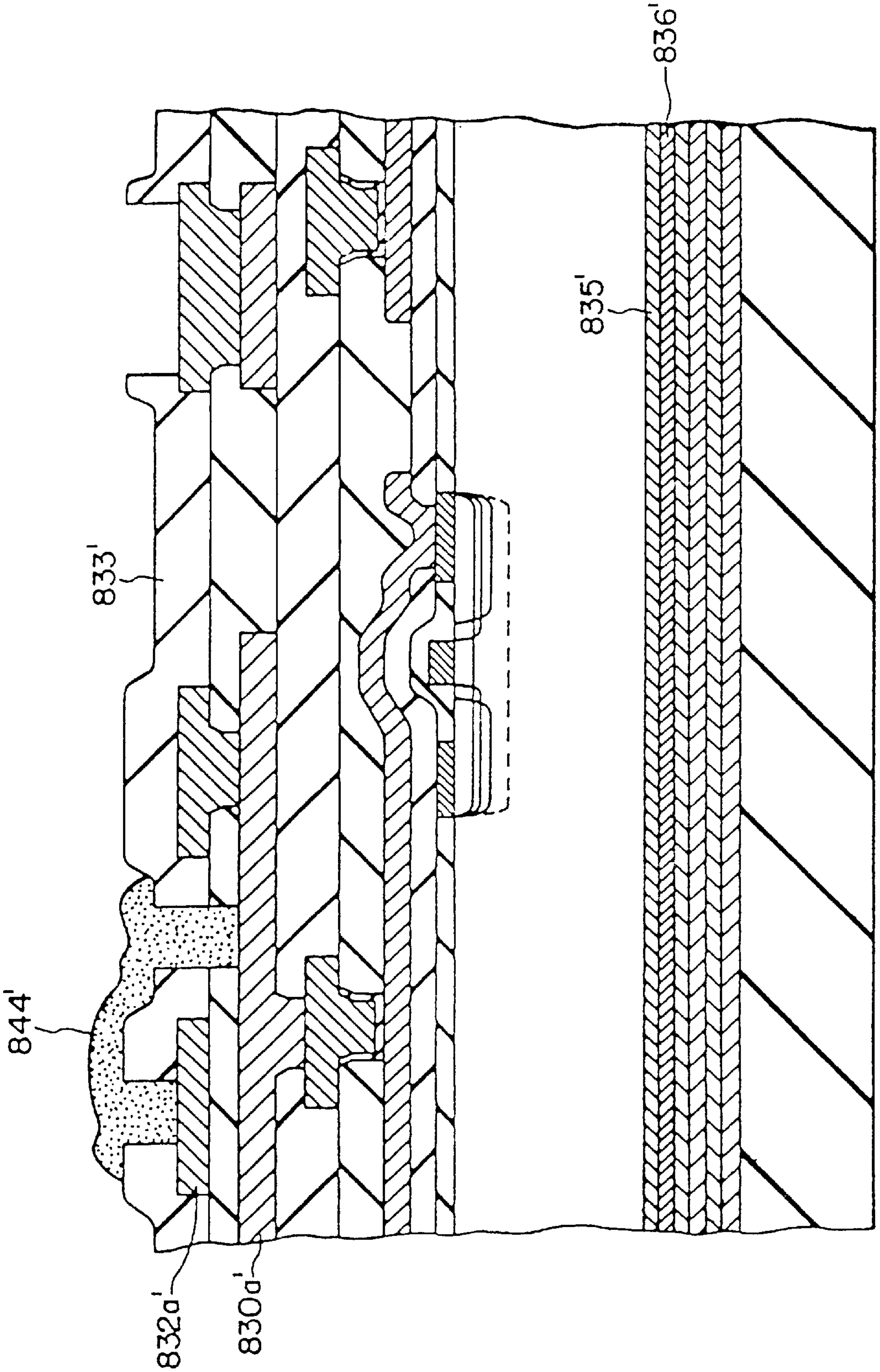
Figure 21U:
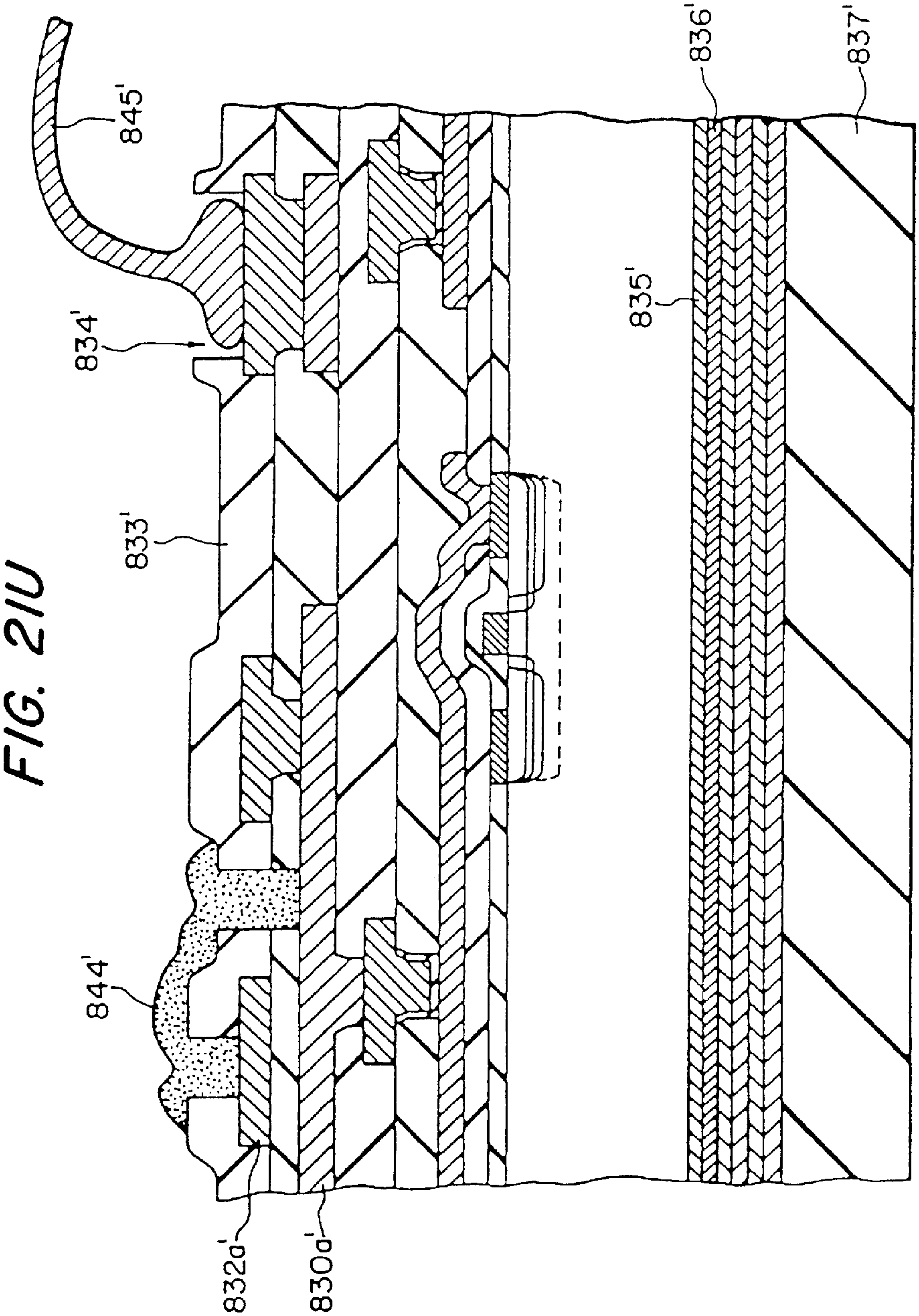

Next, as shown in FIG. 21T, an Mo (molybdenum) wiring 844' is formed selectively by laser CVD so as to connect the through-holes 842' and 843' with each other. More particularly, a Cr (chromium) film is formed below the Mo film to improve adhesion, though not shown.

Then, as shown in FIG. 21C, each bonding pad on the chip and each metallized lead provided at a part of the ceramic package 837' are connected together by ball wedge bonding using an Au (gold) wire about 30 $\mu$m in diameter.

The layout of component circuits on the chip as well as the arrangement and how to use of the correction system, auxiliary lines and auxiliary gates in this embodiment are almost the same as in their other embodiments described above, so will not be explained here.

Embodiment 9

Like the other embodiments, this embodiment constitutes a part of the invention concerning the technique of an IC manufacturing process using FIB. Inevitably, this embodiment premises application of the FIB systems of Embodiments 1 and 5 as well as the techniques shown in the other embodiments. But there may be used any other system or technique and object of application. In this embodiment, the foregoing embodiments 1 to 8 are synthesized into a single system for IC design, correction and manufacture. Since the invention is applicable substantially directly in conformity with the characteristics of the preceding embodiments, repeated explanations will be omitted. For example, as to the GaAs-IC of the embodiment 8, the system of the invention is applicable as necessary on the basis of the foregoing illustrative descriptions and the descriptions of the other embodiments, including this embodiment. So detailed explanations will be omitted.

The whole of an LSI and a manufacturing process according to this embodiment will be described below.

Figure 22A:
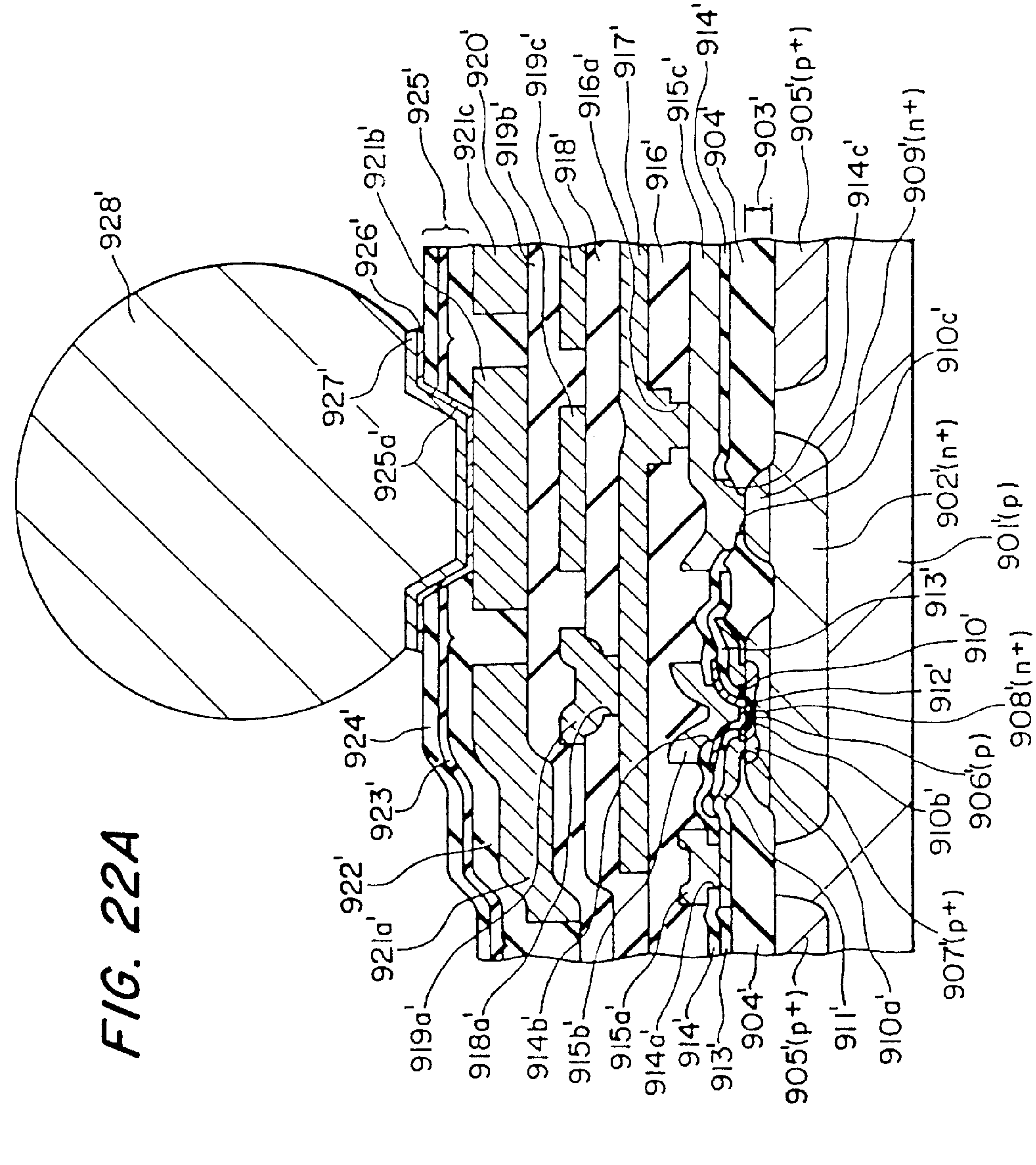
FIG. 22A is a sectional view showing a principal portion of a bipolar LSI according to an embodiment 9 of the second aspect of the present invention.

FIG. 22A is a sectional view showing a principal portion of a bipolar LSI according to an embodiment 9 of the invention.

In the bipolar LSI of this embodiment, as shown in FIG. 22A, a buried layer 902' of n+ type is provided in the surface of a semiconductor chip (substrate) 901' comprising p-type silicon, for example, and an epitaxial layer 903' of n-type silicon is formed on the semiconductor chip. Further, a field insulating film 904', e.g. $SiO_2$ film, is provided at a predetermined portion of the epitaxial layer 903', whereby there are effected inter- and intra-element separation. Below the field insulating film 904' is formed a channel stopper region 905' of p+ type. In the portion of the epitaxial layer 903' surrounded by the field insulating film 904' there are formed an intrinsic base region 906' of p type and a graft base region 907' of $p^+$type, and an emitter rgion 908' of $n^+$type is provided in the intrinsic base region 906'. An npn-type bipolar transitor is constituted by the emitter region 908', the intrinsic base region 906' and a collector region located below the intrinsic base region and comprising the epitaxial layer 903' and the buried layer 902'. Numeral 909' denotes a collector take-out region of $n^+$type connected with the buried layer 902'. Numeral 910' denotes an insulating film, e.g. $SiO_2$ film, which is contiguous to the field insulating film 904'. The insulating film 910' is formed with openings 910*a*' to 910*c*' in corresponding relation to the graft base region 907', emitter region 908' and collector take-out region 909'. A base draw-out electrode 911' comprising a polycrystalline silicon film is connected to the graft base region 907' through the opening 910*a*', while a polycrystalline silicon emitter electrode 912' is provided on the emitter region 908' through the opening 910*b*'. Numerals 913' and 914' represent insulating films such as $SiO_2$ films for example.

Numerals 915*a*' to 915*c*' each denote a first-layer wiring constituted by an aluminum film for example. The wiring 915*a*' is connected to the base draw-out electrode 911' through an opening 914*a*' formed in the insulating film 914'; the wiring 915*b*' is connected to the polycrystalline silicon emitter electrode 912' through an opening 914*b*'; and the wiring 915*c*' is connected to the collector take-out region 909' through an opening 914*c*' and the opening 910*c*'. Numeral 916 denotes an inter-layer insulating film comprising an SiN film formed by plasma CVD for example, a spin-on-glass (SOG) film and an SiO film formed by plasma CVD. On the inter-layer insulating film 916' is provided a second-layer wiring 917' constituted by an aluminum film for example. The wiring 917' is connected to the wiring 915*c*' through a through-hole 916*a*' formed in the inter-layer insulating film 916'. The through-hole 916*a*' has a stepped shape to thereby improve the step coverage of the wiring 917' in the through-hole 916*a*'. Numeral 918' denotes an inter-layer insulating film similar to the inter-layer insulating film 916'. Provided on the inter-layer insulating film 918' are third-layer wirings 919*a*' to 919*c*' each constituted by an aluminum film for example. The wiring 919*a*' is connected to the wiring 917' through a through-hole 918*a*' formed in the inter-layer insulating film 918'. Further, numeral 920' denotes an inter-layer insulating film similar to the inter-layer insulating films 916' and 918'. Provided on the inter-layer insulating film 920' are fourth-layer wirings 921*a*' to 921*c*' each constituted by an aluminum film for example. The wirings 921*a*' to 921*c*' are formed thicker than the lower-layer wirings so as to handle large amounts of current. For example, they have a thickness of 2 μm. The grooves formed among the wirings 921*a*'–921*c*' are 2 μm in thickness for example and hence the aspect ratio (depth to width) of the grooves is a large value, say, 1.

Numeral 922' denotes an insulating film for surface levelling such as, for example, an $SiO_2$ film, which is formed by bias sputtering of $SiO_2$ or by a combination of plasma CVD and sputter etching. The grooves among the wiring 921*a*'–921*c*' are completely filled up by the insulating film 922', so the surface of the film 922' is substantially flat. As the insulating film 922' there may be used a silicate glass film such as a PSG (phospho-silicate glass) film, a BSG (boro-silicate glass) film or a BPSG (boro-phospho-silicate) glass formed by, for example, a combination of atmosphere CVD and sputter etching. On the insulating film 922' is provided an SiN film 923' formed by plasma CVD for example. As well known, the SiN film 923' is moistureproof. In this case, the surface of the insulating film 922', including the groove portions among the wirings 921'–921*c*', is flat, so the surface of the SiN film 923' is also flat. Consequently, the thickness and quality of the SiN film 923' are uniform and hence the moistureproofness of a later-described protection film 925' can be improved as compared with the prior art. As a result, a non-hermetic seal type package can be used as an LSI package. Provided on the SiN film is an SiO film 924' formed by plasma CVD for example. A chip protecting film 925' is constituted by the insulating film 922', the SiN film 923' and the SiO film 924'. The SiO film functions to not only ensure the adhesion of a later-described chromium (Cr) film 926' to the protective film 925' but also prevent the SiN film 923' from being etched during dry etching of the Cr film 926'.

An opening 925*a*' is formed in the protective film 925' and the Cr film 926' provided on the wiring 921*b*' through the opening 925*a*'. Further, solder bumps 928' of a lead (Pb)—tin (Sn) alloy are provided on the Cr film 926 through a copper (Cu)—tin (Sn) intermetallic compound layer 927'.

Figure 22B:
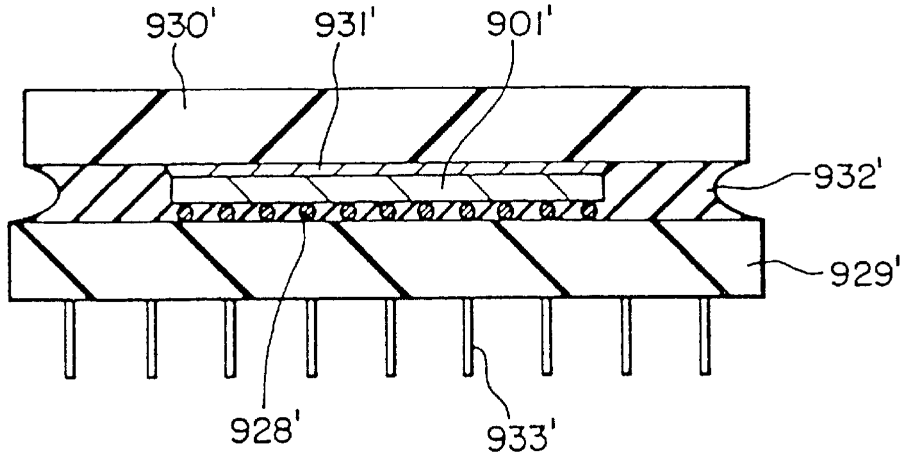
FIG. 22B is a sectional view showing a pin grip array-type package sealing the bipolar LSI shown in FIG. 22A.

FIG. 22B is a sectional view showing a pin grid array (PGA) type package sealing the bipolar LSI.

In this pin grip array type package, as shown in FIG. 22B, the semiconductor chip 901' is connected, using the solder bumps 928', onto a chip carrier 929' constituted by mullite ($3Al_2O_3 \cdot 2SiO_2$) for example. Numeral 930' denotes a cap constituted by silicon carbide for example. The back (element-free face) of the semiconductor chip 901' is in contact with the cap 930' through a solder material 931' for example, whereby heat dissipation from the semiconductor chip 901' to the cap 930' can be done effectively. In the case of mounting this package onto a module substrate or the like, radiation fins (not shown) are brought into contact with the cap 930' to effect the radiation of heat from the package effectively. Numeral 932' denotes a resin, e.g. epoxy resin, whereby the semiconductor chip 901' is sealed. This package is a non-hermetic seal type package. Since the protective film 925' is superior in moistureproofness as previously noted, it is possible to use such a non-hermetic seal type package, whereby the reduction in cost of the package can be attained. The elements indicated by the reference numeral 933' are input-output pins which are connected to the solder bumps 928' through a multilayer interconnection (not shown) formed on the chip carrier 929'.

The manufacturing method for the bipolar LSI shown in FIG. 22A will now be described. Explanation about the steps up to formation of the interlayer insulating film 920' will be omitted.

Figure 22C:
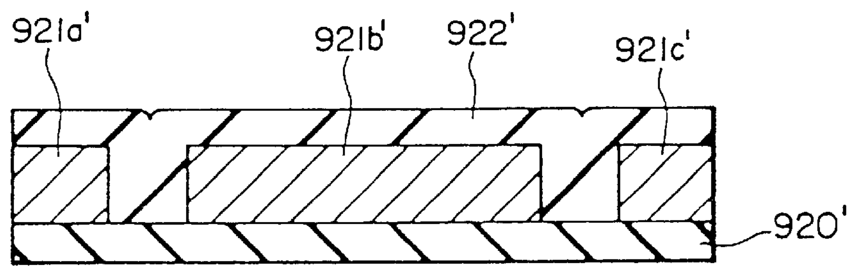
FIGS. 22C to 22G are sectional views for explaining step by step how to manufacture the bipolar LSI shown in FIG. 22A.

As shown in FIG. 22C, after formation of the wirings 921*a*' to 921*c*' on the inter-layer insulating film 920', an insulating film 922', e.g. $SiO_2$ film, is formed by, for example, bias sputtering of $SiO_2$ or a combination of plasma CVD and sputter etching. As previously noted, the surface of the insulating film 922' can be made substantially flat. If the depth and width of the grooves among the wirings 921*a*'–921*c*' are each 2 μm, a substantially flat surface is obtained at a thickness of the insulating film 922' of say 3.5 μm or so in the case of forming the same film by bias sputtering of $SiO_2$. Where the insulating film 922' is to be formed by a combination of plasma CVD and sputter etching, a substantially flat surface is obtained at a thickness of the film of say 1.5 μm or so.

Figure 22D:
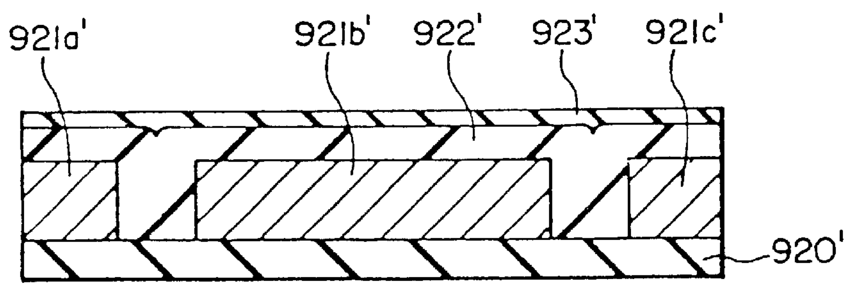

Next, as shown in FIG. 22D, an SiN film 923' having a thickness of say 5,000 Å is formed on the insulating film 922' by plasma CVD for example.

Figure 22E:
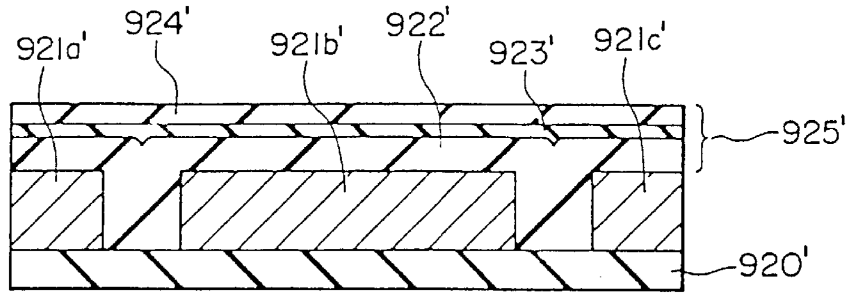

Then, as shown in FIG. 22E, an SiO film 924' having a thickness of say 1 μm is formed like the SiN film 923' by plasma CVD for example. In this way there is formed a protective film 925' superior in moistureproofness.

Figure 22F:
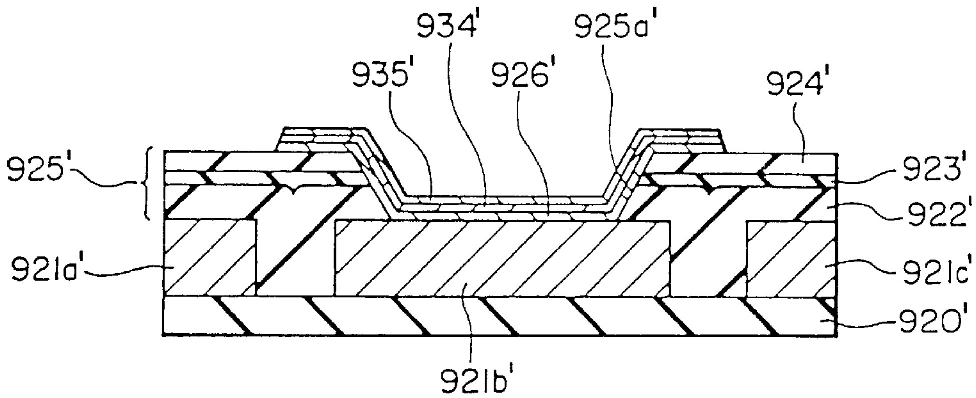

Next, as shown in FIG. 22F, a predetermined portion of the protective film 925' is removed by etching to form an opening 925*a*', allowing the surface of the wiring 921*b*' to be exposed to the opening thus formed. In this state, a Cr film 926' having a thickness of say 2,000 Å, a Cu film 934' having a thickness of say 500 Å and a gold (Au) film 935' having a thickness of say 1,000 Å are formed on the whole surface successively by vapor deposition for example. Thereafter, the Au film 935', Cu film 934' and Cr film 926' are patterned into a desired shape by etching. In this case, the Au film 935' is for preventing oxidation of the Cu film 934', while the Cu film 934' is for ensuring wetting characteristic with respect to the substrate of the solder bumps 928'. The etching for the Au film 935' and the Cu film 934' is performed, for example, according to a wet etching process, while the etching for the Cr film 926' is performed, for example, according to a dry etching process using a gaseous mixture of $CF_4$ and $O_2$. In dry etching, as noted above, the SiO film 924' acts as an etching stopper, so it is possible to prevent the SiN film 923' of the lower layer from being etched. The Au film 935', Cu film 934' and Cr film 926' are usually called BLM (Ball Limiting Metalization).

Figure 22G:
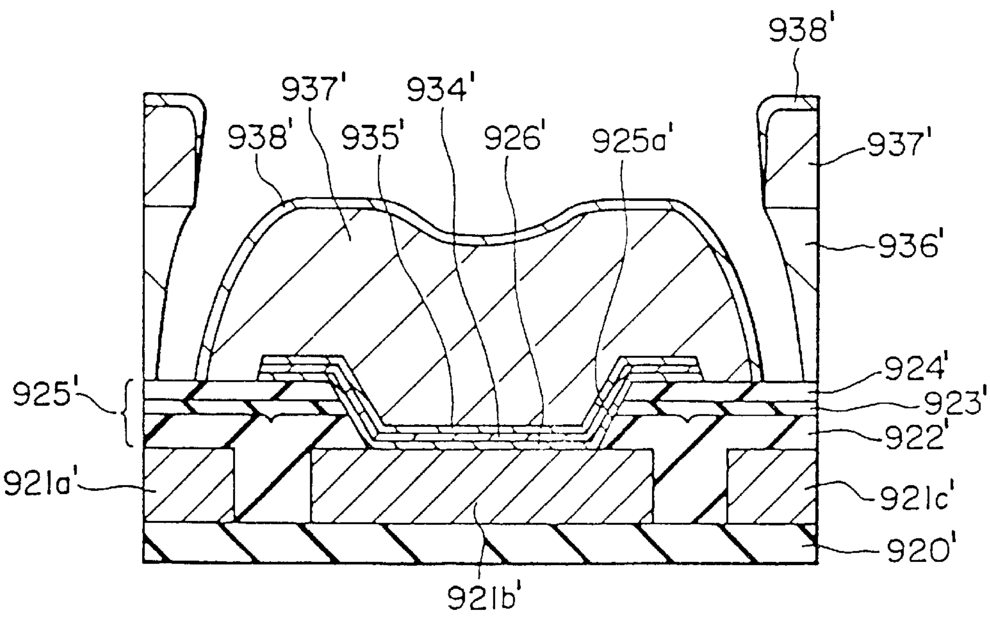

Then, as shown in FIG. 22G, a resist pattern 936' of a predetermined shape is formed on the SiO film 924' and thereafter a Pb film 937' and an Sn film 938' are formed successively on the whole surface by vapor deposition for example to cover the Au film 935', Cu film 934' and Cr film 926'. The thickness of the Pb film 937' and Sn film 938' is selected so that solder bumps 928' to be formed later have a predetermined value of Sn content.

Next, the resist pattern 936' is removed (so-called lift-off) together with the Pb film 937' and Sn film 938' formed thereon, followed by heat treatment at a predetermined temperature, whereby the Pb film 937' and the Sn film 938' are alloyed to form generally spherical solder bumps 928' of Pb—Sn alloy. In this alloying step, the Sn in the Sn film 938' is alloyed with the Cu in the Cu film 934', whereby an intermetallic compound layer 927' of Cu—Sn system is formed between the solder bumps 928' and the Cr film 926'. Actually, the Au from the Au film 935' is also contained in the solder bumps 928'.

The following description is now provided about an intra-chip construction of VLSI (Very Large Scale Integration) which is an application example of the present invention.

The chip referred to herein is used as a CPU section and other logical operation and memory elements of a main frame computer (ultra-high speed computer). Therefore, it is necessary for the chip to have a very large number of input and output terminals, so the chip is mounted or connected to an external package or circuit board by wire bonding up to 200 pins or so or by TAB (Tape Automated Bonding) or CCB (Controlled-Collapse Solder Bumps) for a larger number of pins.

The chip is in the form of a square or rectangular plate 10 to 20 mm in length of one side, and on its element-forming main surface there are formed ECL (Emitter-Coupled Logic) circuit and CMOS (Complementary MOS) circuit as necessary. There is selected an intra-chip construction corresponding to specifications required according to the same method (design and manufacturing method) as the so-called gate array.

Figure 22H:
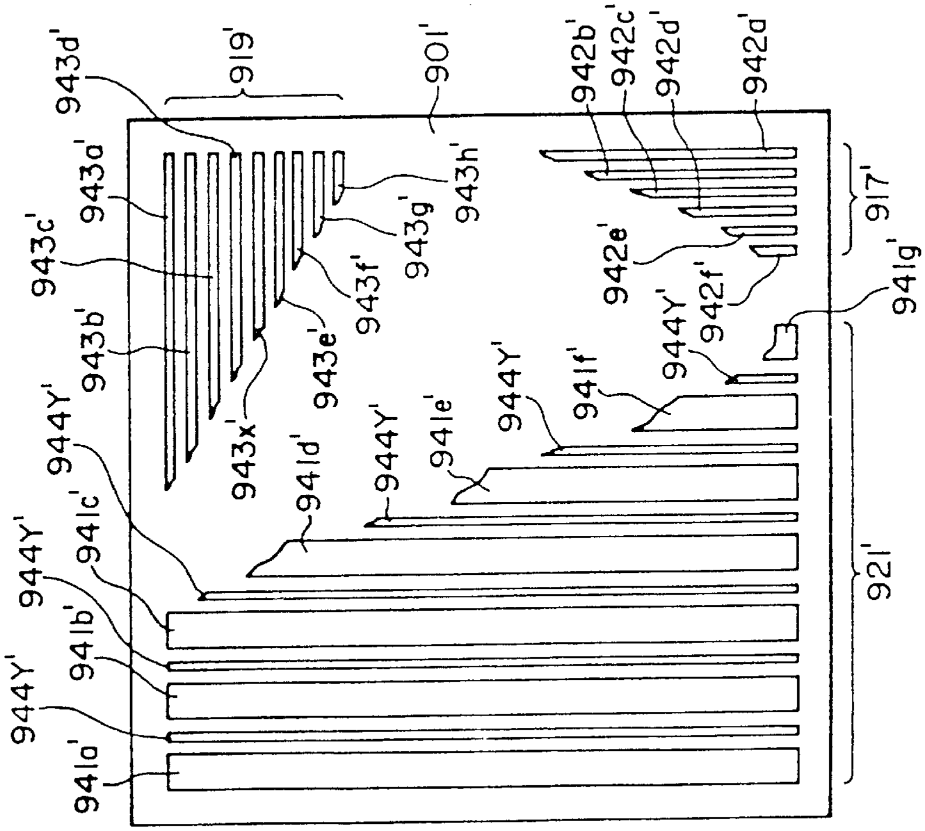
FIG. 22H is a plan layout view of second to fourth aluminum wirings in a logic chip used in the embodiment 9 of the second aspect of the present invention.

FIG. 22H is a schematic top view showing a construction of aluminum wirings of second to fourth layers on the chip. In the same figure, numeral 921' represents a fourth-layer metal wiring group or Al-4 (or WR-4). The wiring group 921' comprises a large number of lines extending mainly in the Y-axis direction so as to traverse the chip vertically. Numeral 919' represents a third-layer metal wiring group or Al-3 (or WR-3) extending mainly in the X-axis direction. Numeral 917' represents a second-layer metal wiring group or Al-2 (or WR-2) extending mainly in the Y-axis direction. Although these aluminum wiring groups are shown only partially, they are provided throughout the entire surface of the chip as necessary. Numerals 941a' to 941g' denote power lines or reference voltage lines 50–200 μm in width (in the case of ECL, $V_{KSL}$ . . . –4V, $V_{KE}$ . . . –3V, $V_{TT}$ . . . –2V; $V_{CC1}$, $V_{CC2}$ and $V_{CC3}$ . . . 0V). The lines indicated by 944Y' are fourth-layer auxiliary lines or AlS-4 having a width of 10 μm and extending so as to substantially traverse the upper surface of the chip 901' vertically. But they may be provided as in the other embodiments. Numerals 943a' to 943h' represent lines or Al-3 having a pitch of 5 μm and a width of 3.5 μm. Numerals 943x' represents third-layer auxiliary lines or AlS-3 disposed at every five pitch and extending so as to substantially traverse the upper surface of the chip laterally. These floating auxiliary lines AlS-3 and AlS-4 can substantially cover the whole area of the chip. Numerals 942a' to 942f' represent lines or Al-2 having a pitch of 5 μm and a width of 3.5 μm. Their layout is made automatically according to the necessity of interconnection in association with the wiring Al-3.

Figure 22I:
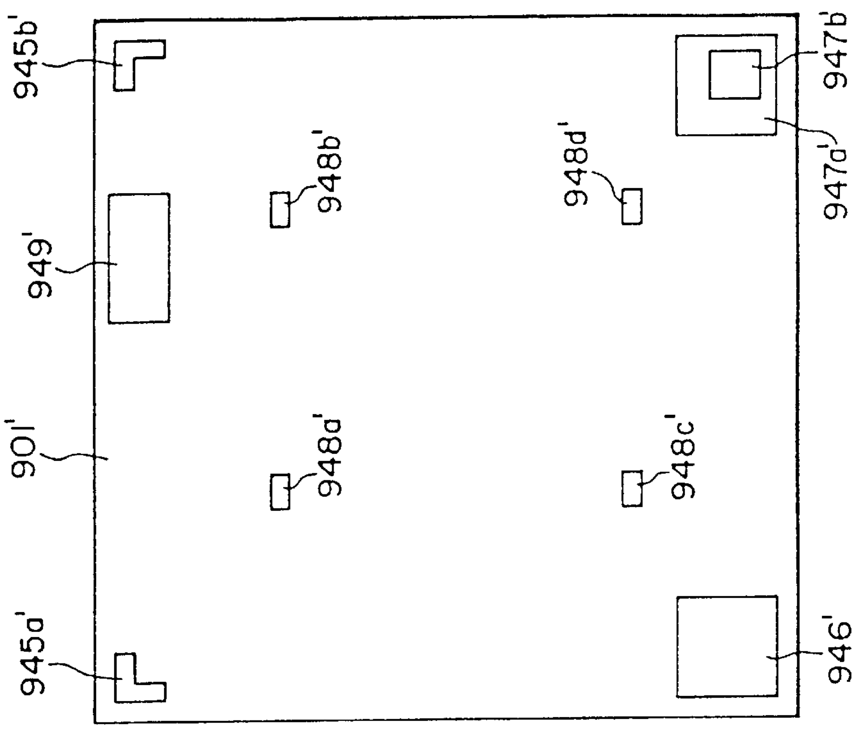
FIG. 22I is a layout diagram of various registering patterns and a wiring correction system tool used in the embodiment 9.

FIG. 22I is a layout diagram of wiring correction process supporting tools and others corresponding to the foregoing embodiments 2 and 3. In the same figure, numerals 945a' and 945b' each represent an origin detecting pattern for detecting an angle θ between an origin of a pattern on the chip 901' and a reference axis. They are formed by Al-4. Numeral 946' denotes a trial cutting region shown in the embodiment 3; numeral 947a' denotes a cutting reference mark or inter-layer deviation detecting metal pattern shown in the embodiment 2, constituted by Al-3; and numerals 947b' also represents the same inter-layer deviation detecting metal pattern, constituted by Al-4. The details thereof are as described in the embodiment. Numerals 948a' to 948d' represent auxiliary gate cells, and numeral 949' represents a region for the formation of a pattern or mark using FIB or by laser selection CVD in order to record wiring correction history, specification, name and type of article, etc.

Figure 22J:
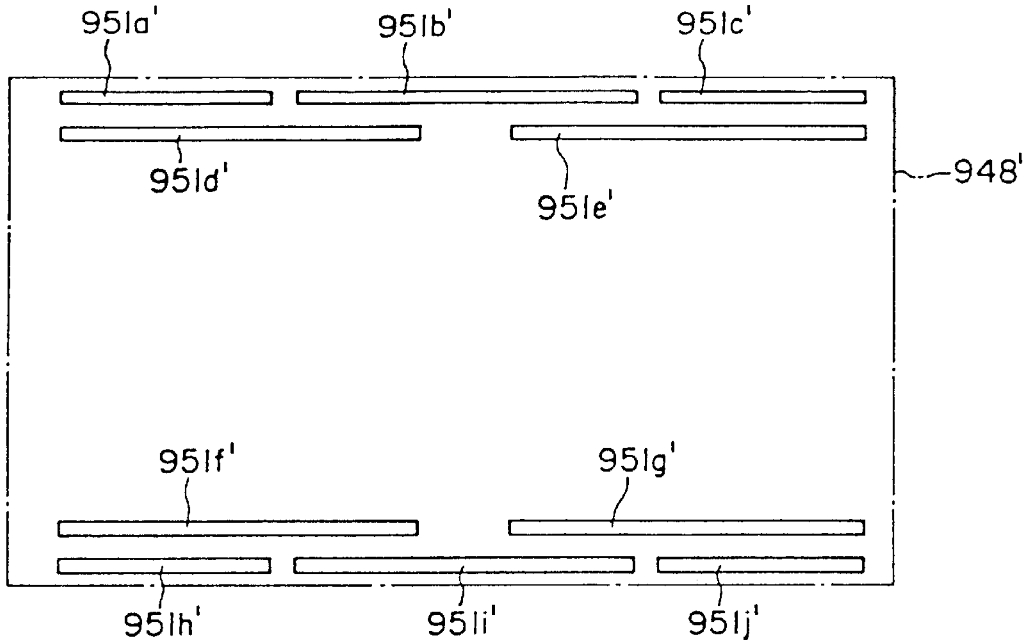
FIG. 22J is a plan layout view of an antenna wiring of an auxiliary gate cell in the embodiment 9.

FIG. 22J is a plan view showing only an antenna wiring constituted by Al-3 in the planar layout of the auxiliary gate cell. In the same figure, numerals 951a' to 951j' represent antenna lines or AlA-3.

Figure 22K:
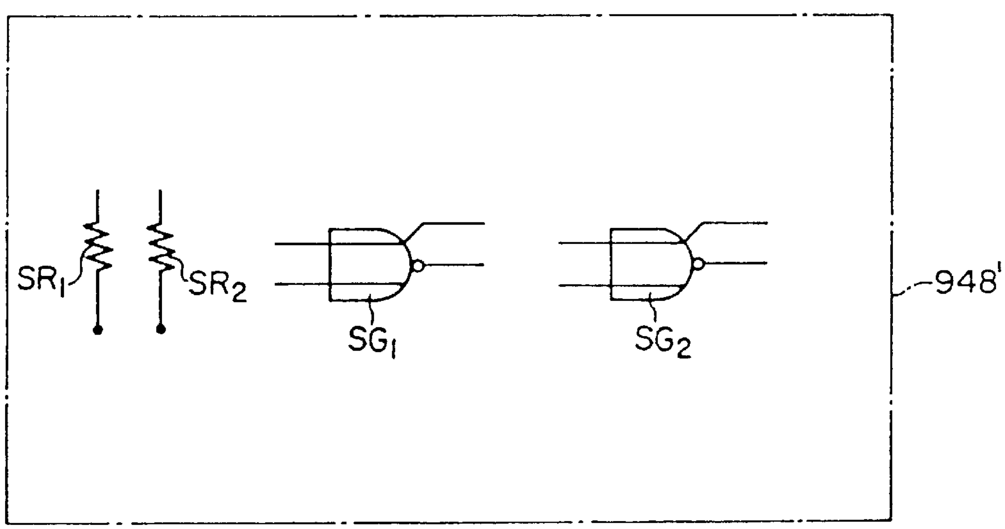
FIG. 22K is a circuit diagram showing an auxiliary device in the auxiliary gate cell.

FIG. 22K is a schematic circuit diagram of built-in elements and gates of the auxiliary gate cell. In the same figure, $SR_1$ and $SR_2$ denote auxiliary resistors, and $SG_1$ and $SG_2$ denoe ECL auxiliary gates.

The following is an explanation of various patterns used in the wiring correcting method of the invention. (The circuit shown below is an example of AN ECL circuit.)

Figure 22L:
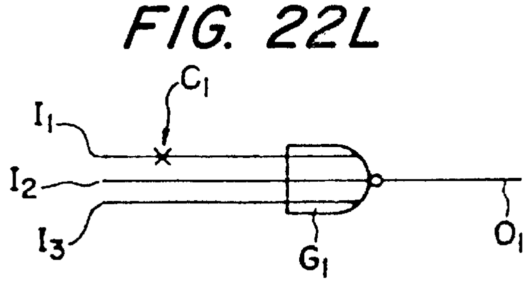
FIGS. 22L to 22O are circuit diagrams showing various correction patterns.

FIG. 22L is a schematic circuit diagram showing a correction pattern called "Input Low Clamp". In the same figure, $G_1$ denotes an already wired gate as one gate of the VLSI; $I_1$ to $I_3$ represent input lines thereof; $O_1$ represents an output line of the gate; and $C_1$ represents a part of the input line $I_1$ which has been cut using FIB.

Figure 22M:
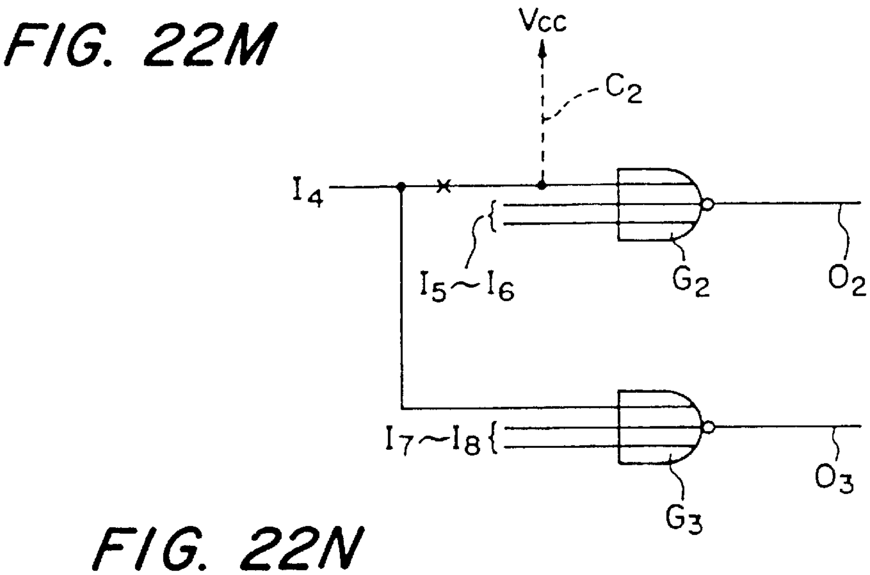

FIG. 22M is a schematic diagram showing a correction pattern called "Input High Clamp". In the same figure, $G_2$ and $G_3$ represent wired gates; $I_4$ to $I_8$ represent input lines of the gates; $O_2$ and $O_3$ represent output lines of the gates; $V_{CC}$ represents one of $V_{CC1}$ to $V_{CC3}$ and it is $V_{CC2}$ in the case of an internal gate; and $C_2$ represents a jumper line formed by laser CVD or vapor-phase selection CVD using FIB.

Figure 22N:
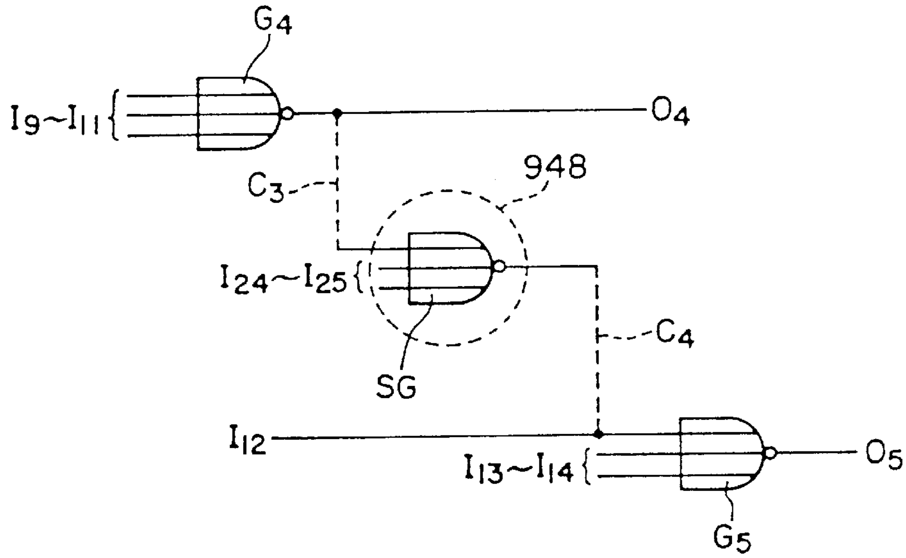

FIG. 22N denotes a schematic circuit diagram showing a correction pattern called "Use of Reverse Output". In the same figure, $G_4$ and $G_5$ represent wired gates; SG represents an auxiliary gate (corresponding to $SG_1$ and $SG_2$ in FIG. 22K) in the auxiliary gate cell 948' corresponding to one of 948*a'* to 948*d'* in FIG. 22I; $I_9$ to $I_{14}$, and $I_{24}$, $I_{25}$ represent input lines of the gates; $O_4$ and $O_5$ represent output lines of $G_4$ and $G_5$; and $C_3$ and $C_4$ represent jumper correction lines formed by vapor-phase selection laser CVD or other means like the foregoing.

Figure 22O:
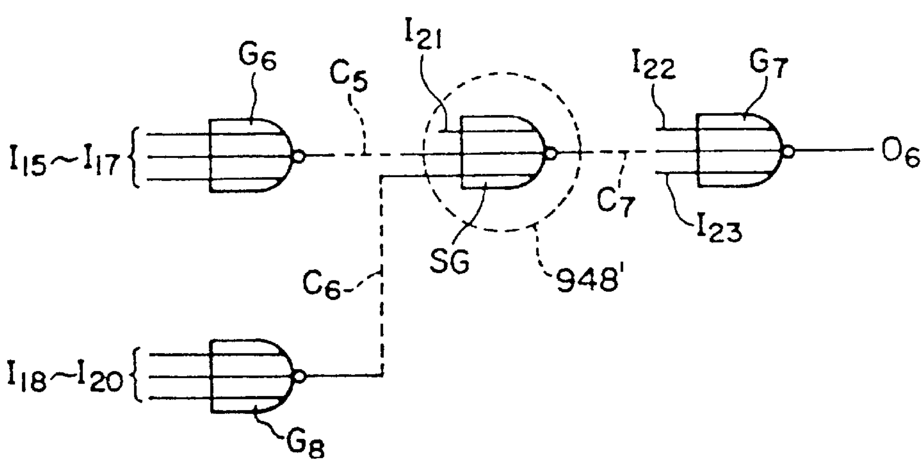

FIG. 22O is a schematic circuit diagram of a correction pattern called "Addition of Auxiliary Gate". In the same figure, G6 to G8 represent wired gates; SG represents an auxiliary gate in the auxiliary gate cell 948' like before; $I_{15}$ to $I_{23}$ represent gate input lines; $O_6$ represents an output line of the gate G; and $C_5$ to $C_7$ represent correction lines formed by, for example, laser CVD using Mo (molybdenum).

The process of this correction system will be described below.

In developing a main frame computer, it is necessary to develop several hundred kinds of logical LSIs at a time and made debugging and adjustment of the system using them. Where there is a logical defect or a changing point, it is necessary to again make LSIs immediately. In the present invention, LSIs in the form of a chip after dicing, with CCB electrode already formed (corresponding to FIG. 22A), are stocked and the foregoing correction patterns or such corrections as shown in the foregoing embodiments are applied to them, whereby the re-fabrication of LSIs can be completed in 5 to 30 hours.

The wiring correction can be done not only in the state of chip but also in the state of wafer and it is easy to make alignment, although the turnaround time until correction and refabrication becomes longer. Therefore, the correction in the state of wafer can be made in the field where such demerit is allowed. For example, it is useful in WSI (Wafter Scale Integration) because such demerit is avoided.

As to the correction in the state of chip, the wiring correction can be done not in a bare chip but also in a die-bonded state to a package base or in a completely wire-bonded state. In this case, it is possible to further shorten the turnaround time. This is also true of the case where the TAB technique is applied.

For example, as mentioned above, divided auxiliary chips in the state of FIG. 22A are stocked for various kinds and correction is made in response to the results of debugging.

First, for the trial cutting region 946 shown in FIG. 22I, there is performed trial cutting as shown in the embodiment 3 using FIB and detected data are stored. Further, using the inter-layer deviation detecting patterns 947*a'* and 947*b'* in the same figure, there is detected a registration error of Al-3 and Al-4 as shown in the embodiment 2 and the detected data is stored. Then, using the origin and 8 detecting patterns 945*a'* and 945*b'*, there is performed operation and calculation to make design pattern data and actual pattern on the chip coincident in origin and axis, and such corrections as shown in FIGS. 22Q to 22W are executed. Devices and conditions used in these processes as well as other correction techniques for wiring were already described in detail in the embodiments 1 to 8, so will not be repeated here.

Figure 22P:
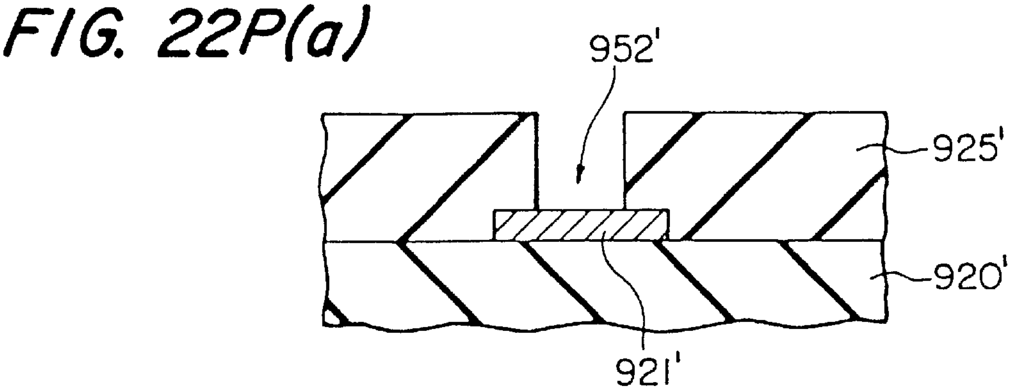
FIGS. 22P(*a*) to (*d*) are sectional views showing a process flow of correction by FIB and a laser CVD.
Figure 22P:
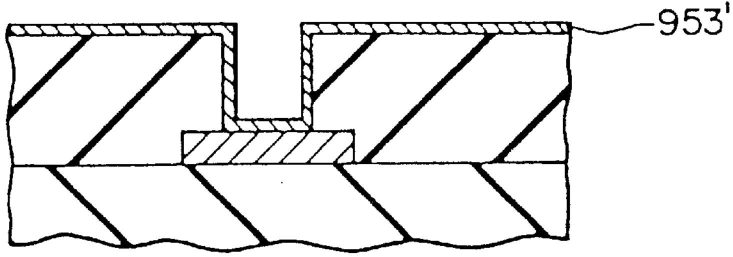
Figure 22P:
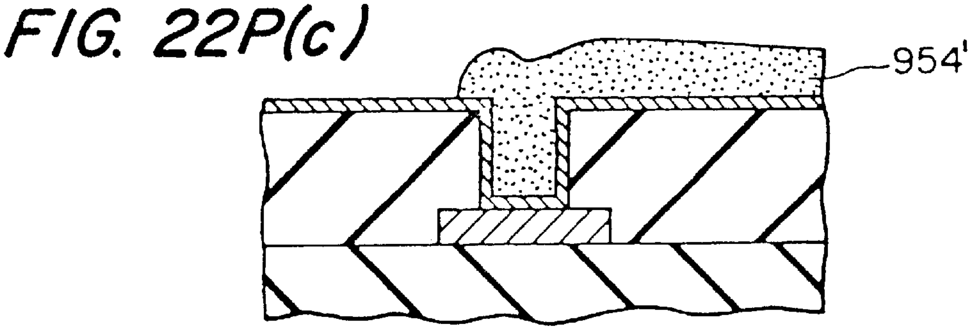
Figure 22P:
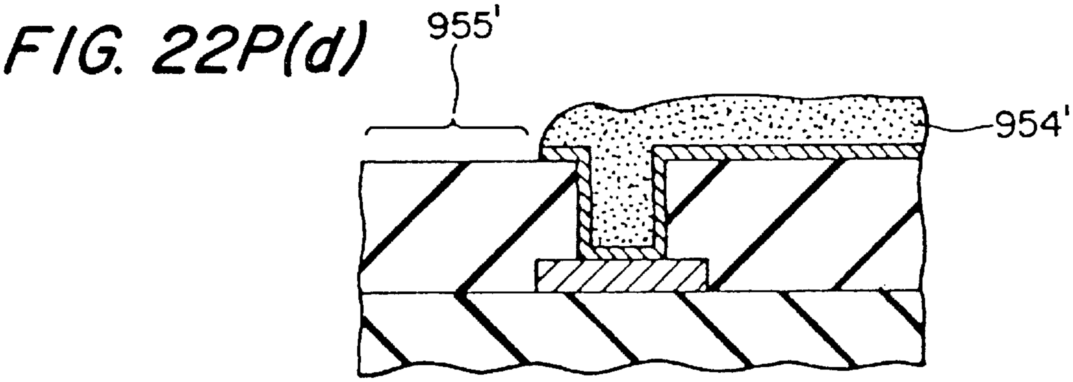
Figure 22Q:
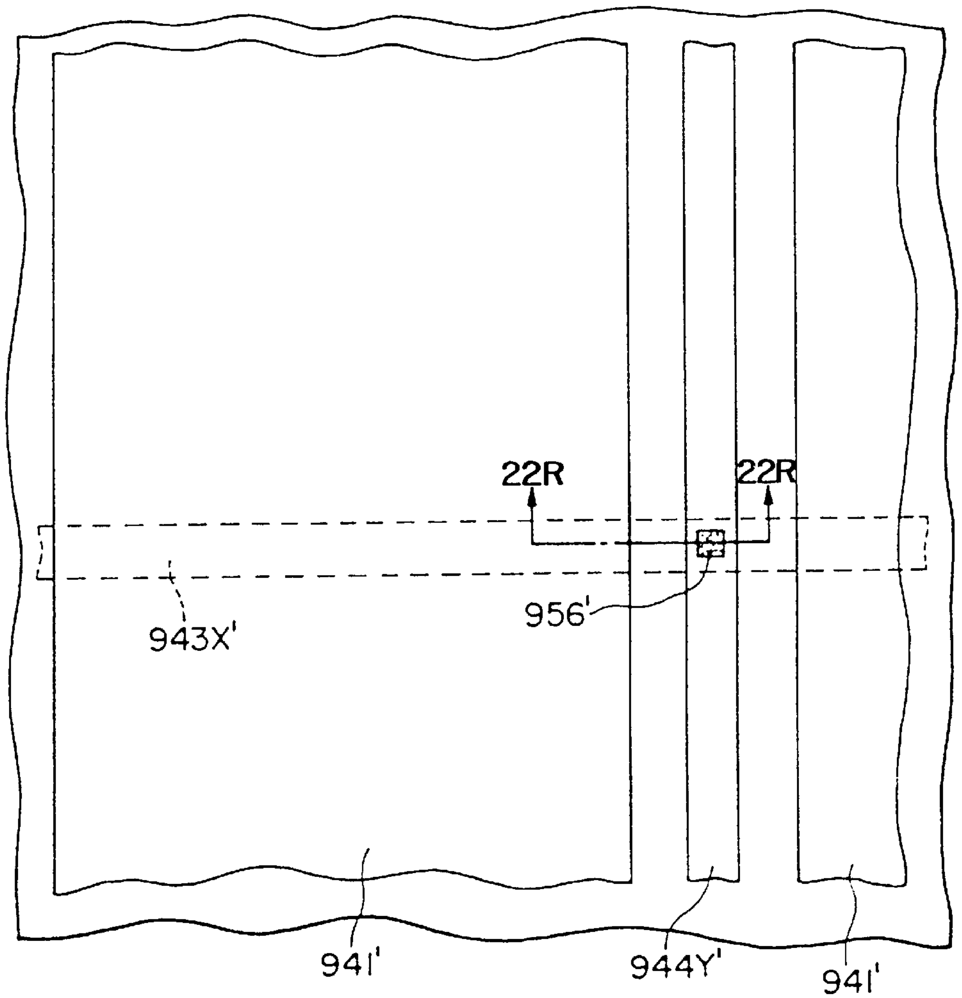
FIGS. 22Q to 22W are plan and sectional views of portions of wiring correction corresponding to various local correction techniques.
Figure 22R:
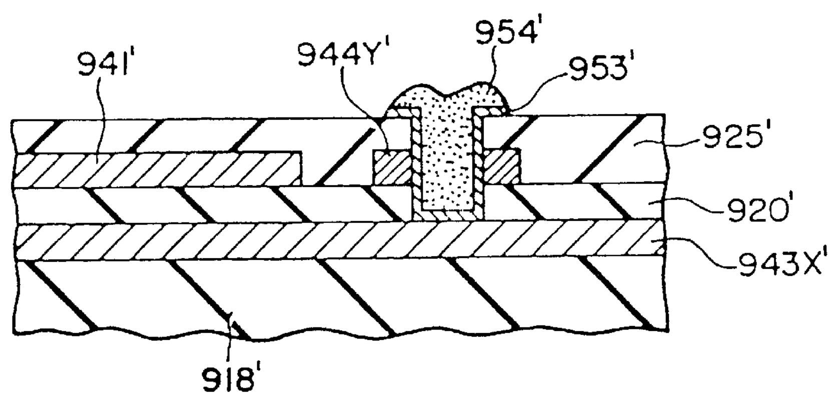

FIG. 22Q is an enlarged top view of a correction part on the main chip surface corresponding to FIGS. 22H and 22I In the same figure, numeral 941' denotes a wide, Al-4, power line (incl. reference power line); numeral 943X' denotes an AlS-3 or an auxiliary line using Al-3, extending in the X-axis direction, (this may be one of Al-3 or the third-layer aluminum wiring group already connected to elements); numeral 944Y' denotes an AlS-4 or a fourth-layer, auxiliary Al line extending in the Y direction; numeral 956' denotes an Mo (molybdenum) layer embedded by laser CVD in a vertical hole which has been formed using FIB.

FIG. 22B is a sectional view taken on line X—X of FIG. 22Q. In the same figure, numeral 918' denotes a third-layer, inter-layer insulating film; numeral 943X' represents the foregoing third-layer auxiliary line; numeral 920' represents IL-4 or a fourth-layer; inter-layer insulating film; numeral 941' represents a power line; numeral 925' represents a final passivation film; numeral 944Y' represents a fourth-layer auxiliary line; numeral 953' represents a substrate Cr (chromium) film; and numeral 954' represents an Mo laser CVD layer.

Figure 22S:
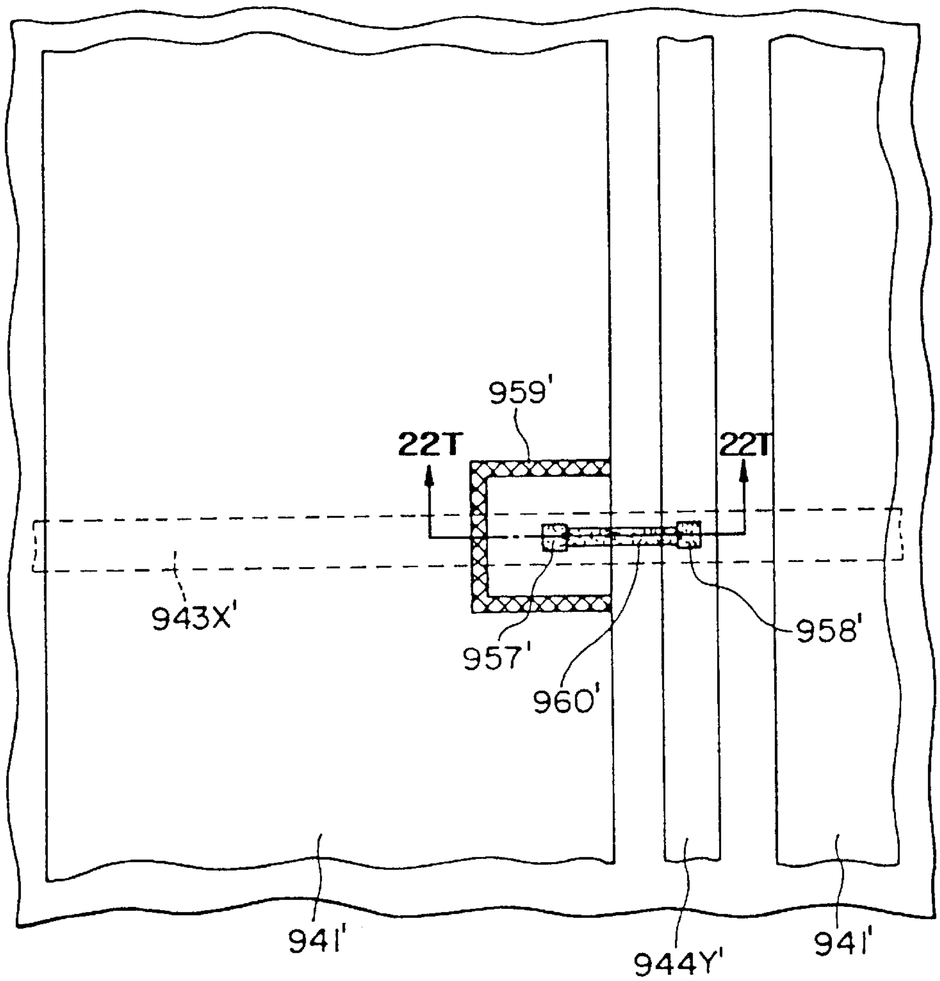

FIG. 22S is an enlarged top view of a portion to which was applied another correction technique. Only the portions different from FIGS. 22Q and 22R will now be explained. In FIG. 22S, numeral 959' represents a ⊃– shaped notch (formed using FIB) for preventing short-circuit of the Mo jumper line and the power line 941'; numerals 957' and 958' each represent an Mo layer formed in a vertical hole which has been formed using FIB; and numeral 960' represents an Mo jumper line same as the said Mo layer.

Figure 22T:
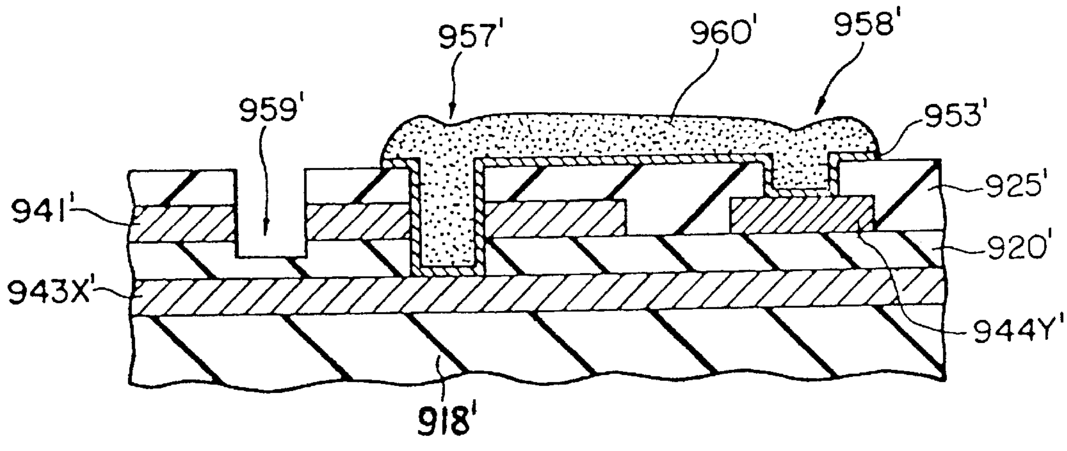

FIG. 22T is a sectional view taken on line X—X of FIG. 22S. The numerals shown therein are the same as those explained previously, so repeated explanation will be omitted. The technique illustrated therein is effective particularly when 943X' does not extend up to the position just under 944Y' or when 943X' is a conventional Al-3.

Figure 22U:
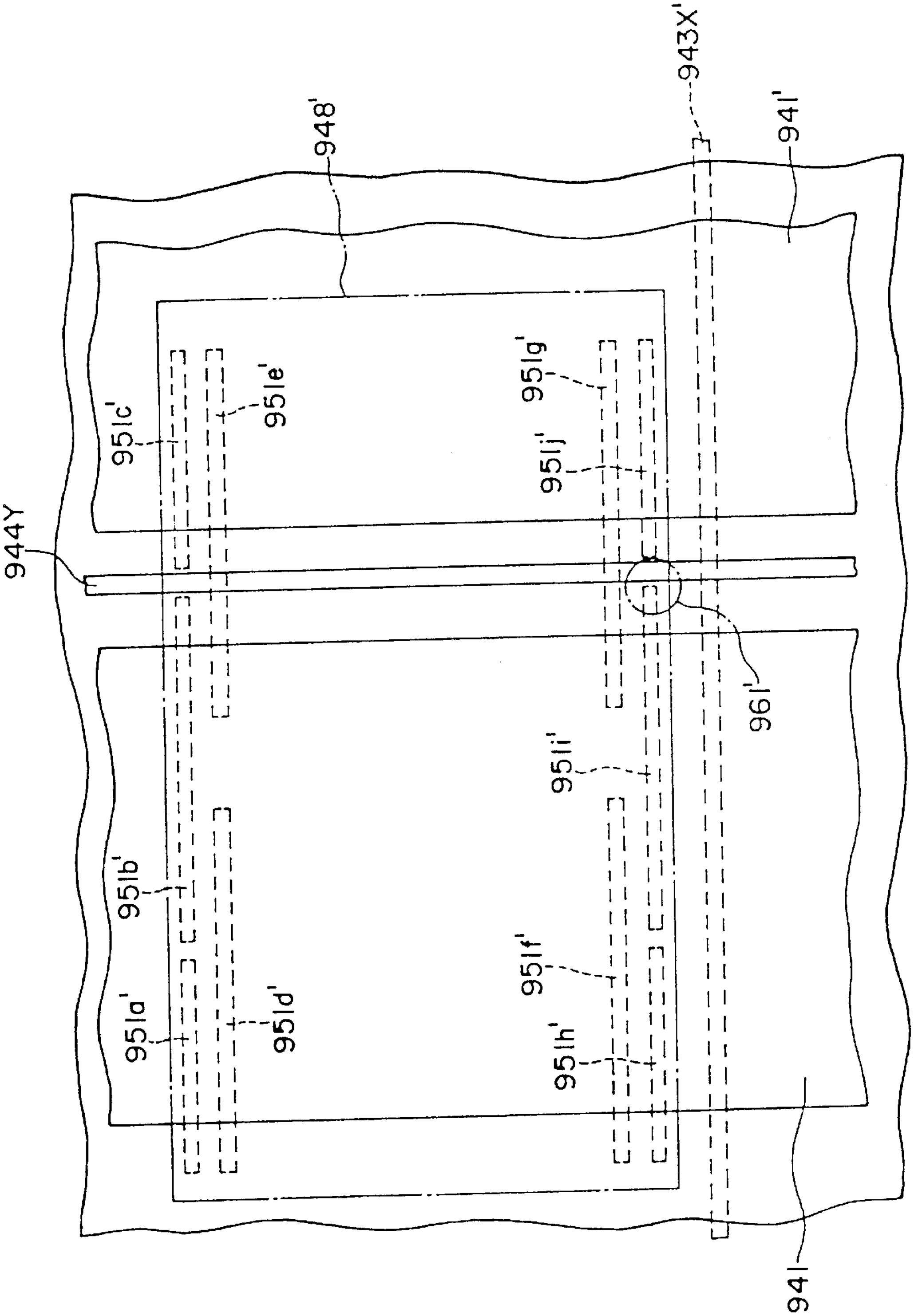
Figure 22V:
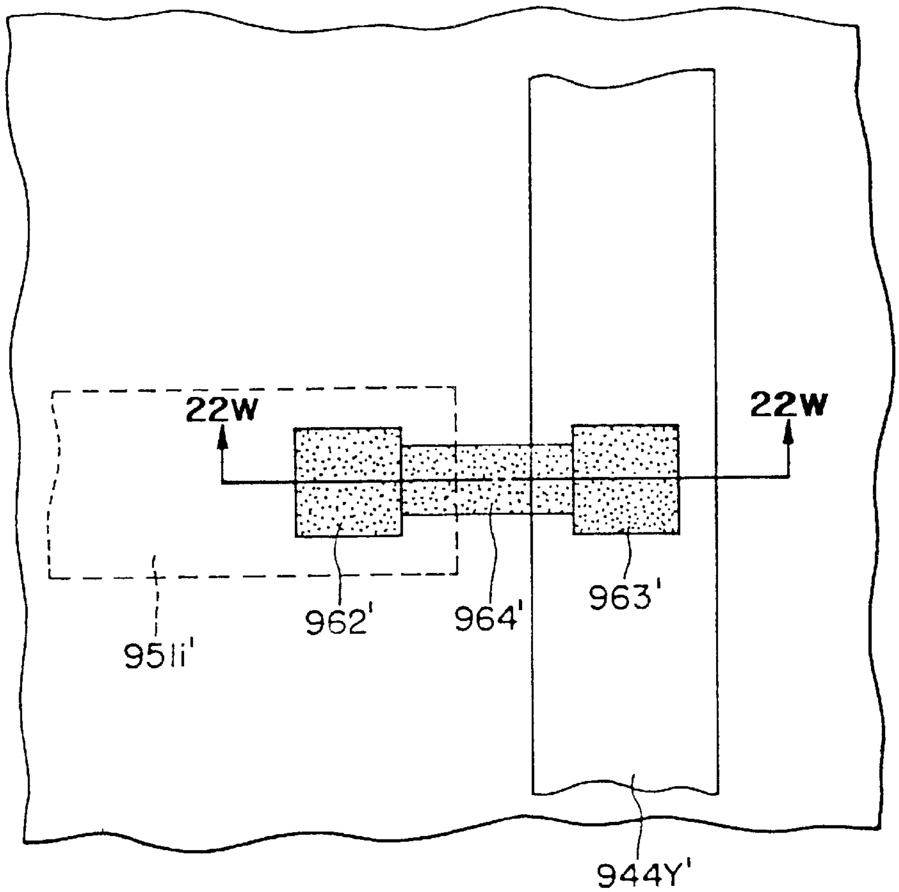
Figure 22W:
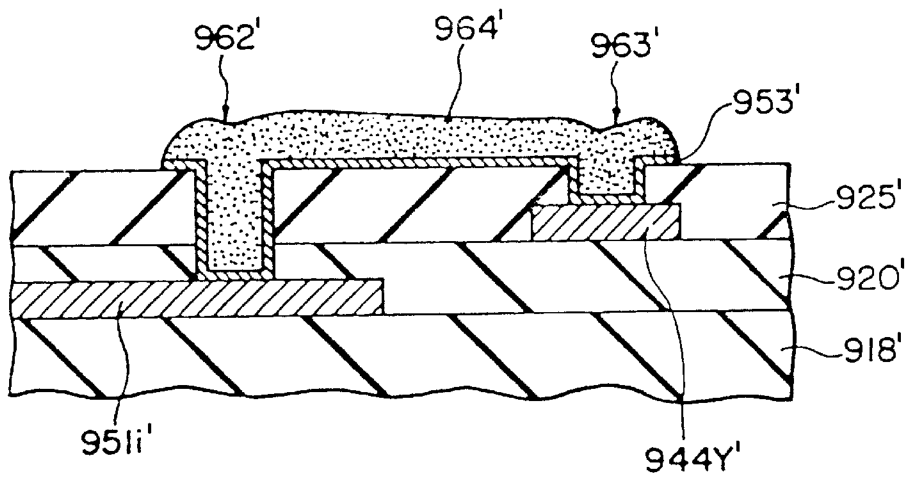

FIGS. 22U, 22V and 22W are a plan view, an enlarged view of a principal portion and an X—X sectional view thereof, respectively, showing an example of another correction technique, particularly using an auxiliary gate. In those figures, numeral 948' denotes an auxiliary gate cell, and numerals 951*a'* to 951*j'* denote antenna lines, which are connected to either $SG_{1-2}$ or $SR_{1-2}$ terminals through Al-2 and Al-1. Numeral 941' represents a wide power line constituted by Al-4; numeral 944Y' represents AlS-4; numeral 943X' represents AlS-3; and numeral 961' represents a principal portion for correction. Further, numerals 962' and 963' each represent an Mo (molybdenum) layer embedded by laser CVD in a vertical hole which has been formed using FIB; and numeral 964' represents an Mo jumper line formed by laser scanning contiguously to the layers 962' and 963'.

The following is an explanation about a process for perforating using FIB and for forming a jumper line by laser CVD.

FIGS. 22P(*a*) to (*d*) are sectional views of a principal portion showing a flow of that process. As shown in FIG. 22P(*a*) and as illustrated in the preceding embodiment, coordinates of the object for correction are determined on the basis of prestored data and hole 952' is formed using FIB (internal pressure of the processing chamber: $1\times10^{-5}$ Pa). Then, as shown in FIG. 22P(*b*), the aluminum surface and the surface of the final passivation film 925' are subjected to sputter etching in an Ar (argon) atmosphere. Thereafter, Cr is allowed to adhere about 100 Å to the whole surface by sputtering to form a Cr (chromium) substrate film 953'. Next, as shown in FIG. 22P(*c*), an Mo (molybdenum) correction line 954' of about 0.3–1 μm in thickness and 3–15 μm in width is formed in a sublimation phase atmosphere (gas phase) of approx. 10 Pa of molybdenum-carbonyl $[Mo(CO)_6]$ (for example, under the following conditions: laser output . . . 200 mW, laser scanning speed . . . 1 mm/sec, using a continuous oscillation, high output, Ar laser). Then, as shown in FIG. 22P(*d*), the Cr film of an unnecessary portion 955 is removed, using the line 954' as a mask, by sputtering in an Ar atmosphere.

In practicing the correction pattern of FIGS. 22L to 22O, as explained above, the techniques shown in FIGS. 22Q to 22W are combined together to execute wiring correction on the chip after completion of the final passivation. After or almost simultaneously with the completion of this correction, correction data, etc. are marked in the position of 949' in FIG. 22I by laser CVD (simultaneous processing in the correction system), or by metal film deposition using FIB, or by notching A-3, A-4 or Mo film. For this marking there may be used characters, numerals, suitable symbols, bar codes, and various other codes for computer recognition. In the case where a complicated high-density wiring is formed in the region of 949', it is effective to use a code in the form of a diffraction grating pattern formed by notching with FIB or a similar pattern formed by Mo laser CVD.

The entire layout, etc. in the case of making correction (FIGS. 22L to 22O) by combining the above partial (local) techniques (FIGS. 22Q to 22W) actually, has already been fully described in the embodiment 6, so will not be repeated.

References cited Supplementing the Descriptions of These Embodiments

Laser cutting, connection and laser CVD are described in Mader's U.S. Pat. No. 4,240,094; Uesugi et al, "Extended Abstracts of the 17th Conference of Solid State Devices and Materials", pp. 193–196; Black et al., "Appl. Phys. Lett. 50(15), Apr. 13, 1987, pp. 1016–1018; European Patent Publication EP 25347A2; Hall et al's U.S. Pat. No. 4,181, 751; and Kamioka et al's U.S. Pat. No. 4,503,315.

FIB processing technique at large is described in Musil let al, "IEEE Electron Device Letters", Vol. EDL-7, No. 5, May 1986 pp. 285–287; Shaver et al, "Journal of Vacuum Science and Technology", B(4), Jan./Feb. 1986 pp. 185–188; Mashiko et al, "International Reliability Physics Symposium", April 1987; and S. M. Sze, "VLSI Technology", pp. 426–429 Mcgraw-Hill (1983).

Further, in Chapman, "Glow Discharge Processes", pp. 231–249 John Wiley & Sons Inc. (1980) there are described bias sputtering (flattening) technique) and sputter etching technique.

On pages 93–129 of the above Sze's literature there are described various insulating film deposition techniques.

Further, dry etching techniques at large and the technique for forming metallized films are described on pages 303–384 of the above Sze's literature.

Ion beam diagnostic technique and sputtering technique are described in Townsend et al., "Ion Implantation Sputtering and their Applications" Academic Press (1976), pp. 181–261.

Further, in Soong, "Principles of Instrumental Analysis", CBS College Publishing, (1985), pp. 292–303, there are described method and apparatus for visible ray spectrochemical analysis to detect light emitted from a hole being formed using FIB which is used in the end point detection of the invention, namely, a spectrograph, a photomultiplier for spectral detection and other techniques.

Further, the wiring correction method involving notching a wide wiring (e.g. Al wiring) of an upper layer in U-shape or arcuately using FIB and making wiring correction using the FIB technique between an aluminum wiring of a lower layer and another wiring, is described in Takahashi et al's U.S. patent application Ser. No. 134,460 (filed Dec. 17, 1987) and corresponding Japanese Patent Application No. 298731/86 (filed Dec. 17, 1986) and No. 303719/86 (filed Dec. 22, 1986).

Third Aspect of the Present Invention

Embodiment 1

One embodiment of the third aspect of the present invention will be described hereinunder specifically with reference to the accompanying drawings.

It should be noted that, throughout the drawings for describing this embodiment, members or portions having the same functions are denoted by the same reference numerals and repetitive description thereof is omitted.

Figure 23:
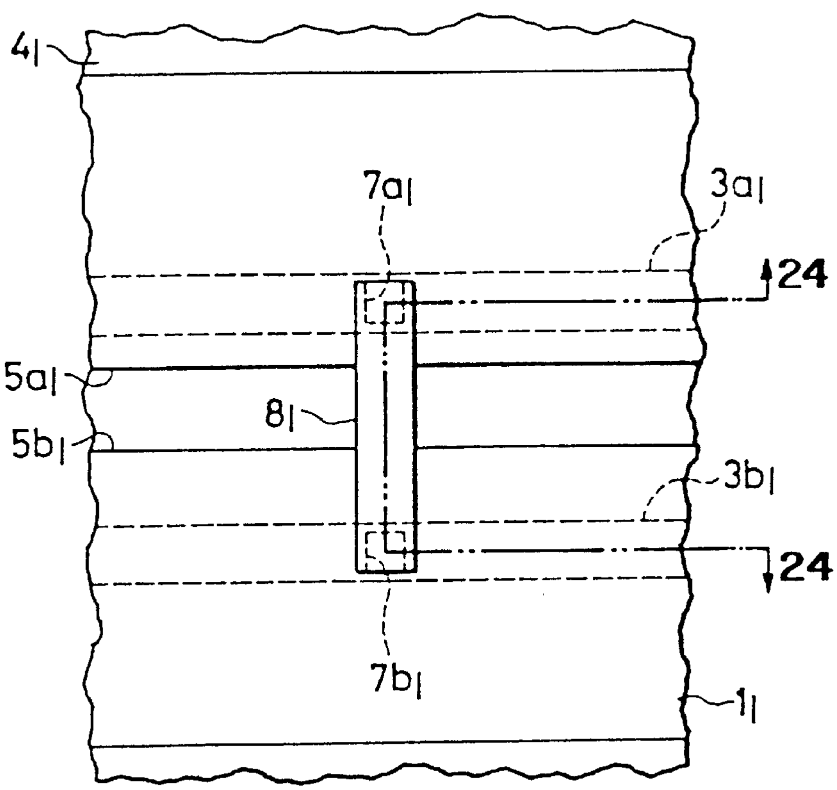
FIG. 23 is a plan view of an LSI having a double-layer wiring structure in accordance with one embodiment of the third aspect of the present invention.
Figure 24:
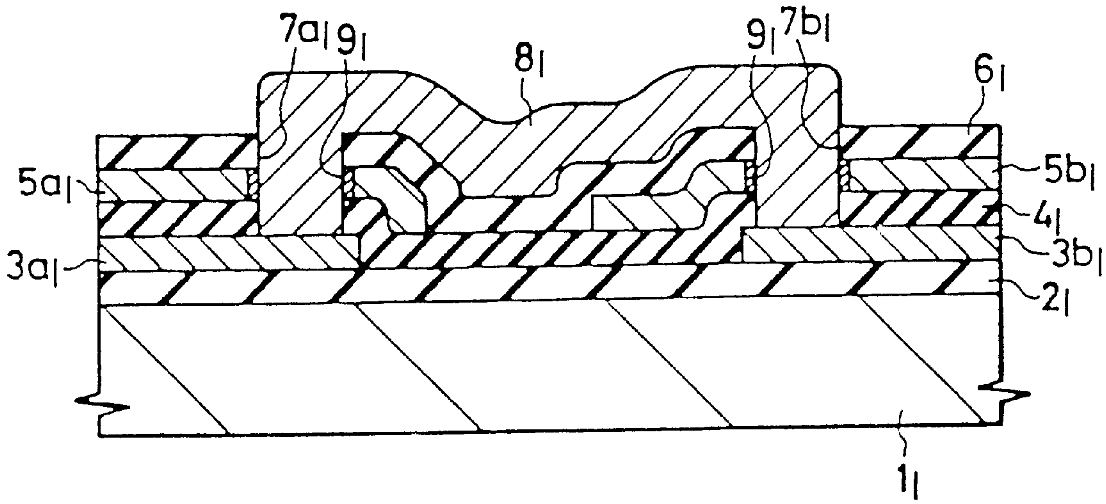
FIG. 24 is an enlarged sectional view taken along the line X—X of FIG. 23.

FIG. 23 is a plan view of an LSI having a double-layer wiring structure in accordance with one embodiment of the third aspect of the present invention, and FIG. 24 is an enlarged sectional view taken along the line X—X of FIG. 23.

As shown in FIGS. 23 and 24, the LSI in accordance with this embodiment has a semiconductor substrate (wafer) $\mathbf{1}_1$, for example, a silicon substrate, having a plurality of semiconductor elements such as transistors (not shown) fabricated thereon so as to form a semiconductor integrated circuit. An intermediate insulating film $\mathbf{2}_1$, for example, an $SiO_2$ film, is formed on the surface of the semiconductor substrate $\mathbf{1}_1$, and first-level wirings (i.e., lower-level wirings) $\mathbf{3}a_1$ and $\mathbf{3}b_1$ which are defined by, for example, an aluminum (Al) film, are provided on the intermediate insulating film $\mathbf{2}_1$. Another intermediate insulating film $\mathbf{4}_1$ which is defined by, for example, an $SiO_2$ film, is provided on the wirings $\mathbf{3}a_1$ and $\mathbf{3}b_1$, and second-level wirings (i.e., upper-level wirings) $\mathbf{5}a_1$ and $\mathbf{5}b_1$ which are defined by, for example, an aluminum (Al) film, are provided on the intermediate insulating film $\mathbf{4}_1$. The wirings $\mathbf{5}a_1$ and $\mathbf{5}b_1$ define, for example, power supply wirings for supplying a power supply current, and are widely laid out over the surface of the intermediate insulating film $\mathbf{4}_1$. An insulating film $\mathbf{6}_1$ (not shown in FIG. 23) is further provided on the wirings $\mathbf{5}a_1$ and $\mathbf{5}b_1$. Contact holes $\mathbf{7}a_1$ and $\mathbf{7}b_1$ are provided in such a manner as to extend through the insulating film $\mathbf{6}_1$, the wirings $\mathbf{5}a_1$, $\mathbf{5}b_1$ (respectively) and the intermediate insulating film $\mathbf{4}_1$, and a connecting wiring $\mathbf{8}_1$ which interconnects the lower-level wirings $\mathbf{3}a_1$ and $\mathbf{3}b_1$ is provided in such a manner as to extend through these contact holes $\mathbf{7}a_1$ and $\mathbf{7}b_1$. By using this connecting wiring $\mathbf{8}_1$, for example, a defect which is found after the completion of the LSI is repaired (or a logical design is changed). It should be noted that the contact holes $\mathbf{7}a_1$ and $\mathbf{7}b_1$ may be either vertical or tapered contact holes. The connecting wiring $\mathbf{8}_1$ is defined by a metal film such as a tungsten (W), molybdenum (Mo), cadmium (Cd) or aluminum (Al) film which is selectively formed by, for example, laser CVD.

The surfaces of the second-level wirings $\mathbf{5}a_1$ and $\mathbf{5}b_1$ which are exposed through the respective contact holes $\mathbf{7}a_1$ and $\mathbf{7}b_1$ are provided with respective insulating films $\mathbf{9}_1$, for example, alumina ($Al_2O_3$) films, which are formed by changing these surfaces into an insulator, thereby preventing contact between the connecting wiring $\mathbf{8}_1$ and the second-level wirings $\mathbf{5}a_1$, $\mathbf{5}b_1$. Accordingly, it is possible to form the connecting wiring $\mathbf{8}_1$ without any fear of the first-level wirings $\mathbf{3}a_1$, $\mathbf{3}b_1$ electrically conducting, or shorting, to the second-level wirings $\mathbf{5}a_1$, $\mathbf{5}b_1$. The thickness of the insulating films $\mathbf{9}_1$ is selected so as to be adequate to obtain a necessary dielectric breakdown strength in accordance with the potential difference between the first-level wirings $\mathbf{3}a_1$, $\mathbf{3}b_1$ and the second-level wirings $\mathbf{5}a_1$, $\mathbf{5}b_1$. For example, if the insulating films $\mathbf{9}_1$ are made of alumina (dielectric strength: about 500 V/$\mu$m) and the above-described potential difference is 5 V, the thickness of the films $\mathbf{9}_1$ may be selected so as to fall in the range from 1000 to 5000 Å.

The following is a description of a process for producing the LSI in accordance with this embodiment which is arranged as described above.

Figure 25:
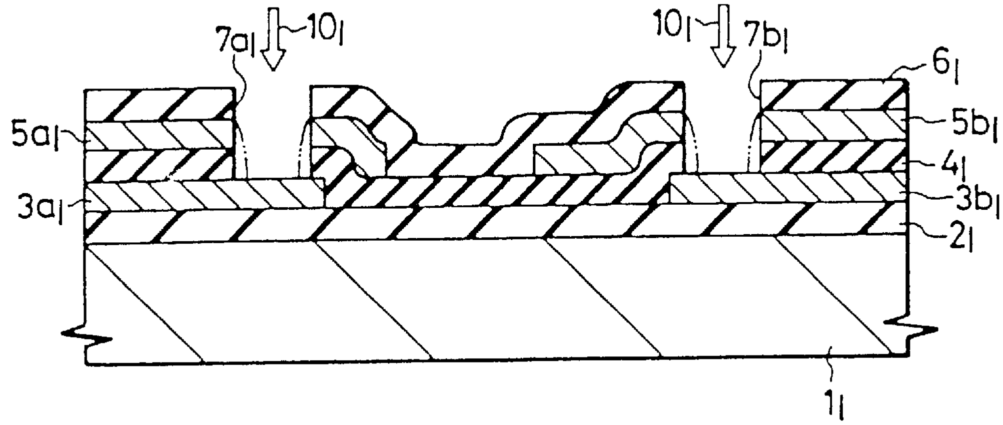
FIGS. 25 to 27 are sectional views showing successive steps in the process for producing the LSI shown in FIGS. 23 and 24.
Figure 28:
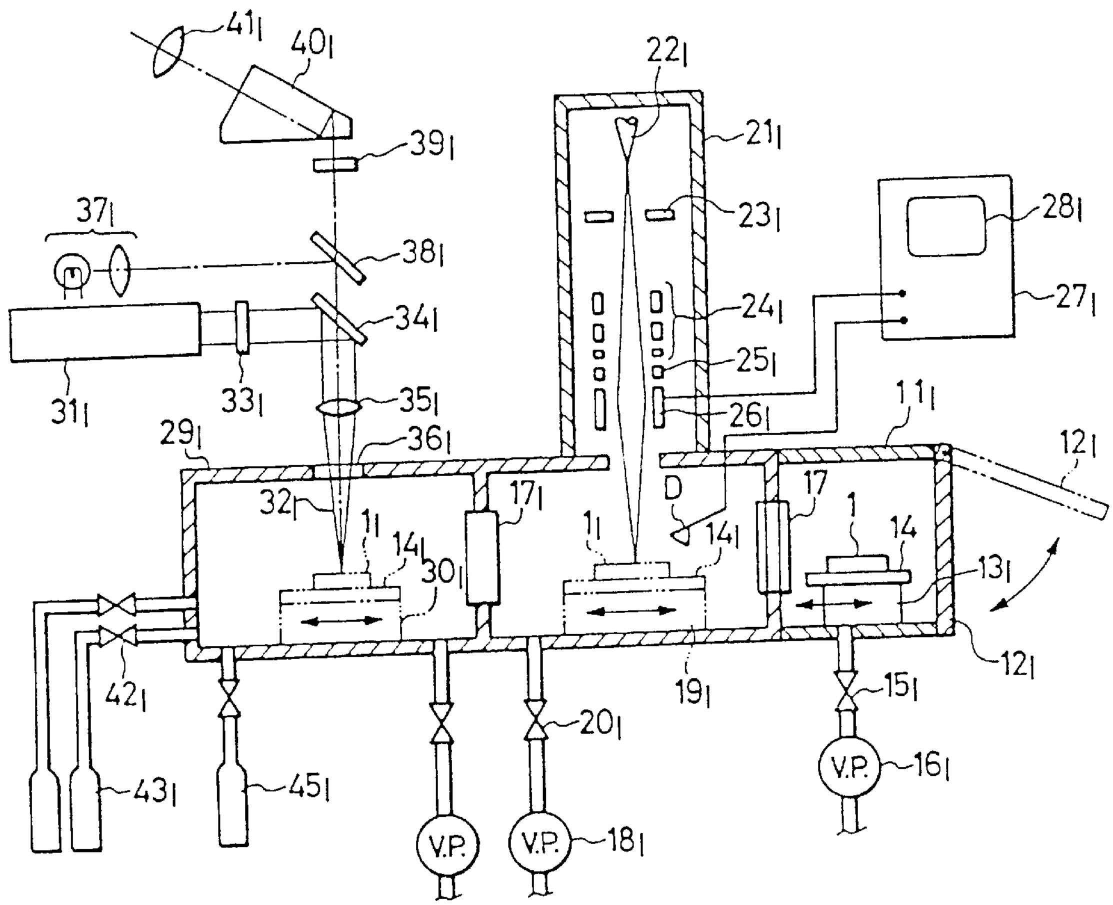
FIG. 28 shows an ion beam machining apparatus and a laser CVD apparatus.

Referring now to FIG. 25, a semiconductor integrated circuit is first formed on a silicon wafer $\mathbf{1}_1$ which serves as a starting material by carrying out diffusion of impurity ions, thermal oxidation of the silicon wafer $\mathbf{1}_1$, formation of thin films by CVD, formation of various patterns by the use of photolithographic techniques, etc. Then, an intermediate insulating film $\mathbf{2}_2$, first-level wirings $\mathbf{3}a_1$, $\mathbf{3}b_1$, an intermediate insulating film $\mathbf{4}_1$, second-level wirings $\mathbf{5}a_1$, $\mathbf{5}b_1$ and an insulating film $\mathbf{6}_1$ are formed to complete an LSI. When it is necessary to find a possible defective part of the wirings and repair it, contact holes $\mathbf{7}a_1$ and $\mathbf{7}b_1$ are formed (see FIG. 25) by irradiating predetermined portions of the surface of the insulating film $\mathbf{6}_1$ with a focused ion beam $\mathbf{10}_1$ having a high degree of machining accuracy by using, for example, an ion beam machining apparatus such as that shown in FIG. 28 which is proposed in the aforementioned Japanese Patent Application No. 70979/1986. The ion beam machining method will next be explained in detail. Referring to FIG. 28, a lid $\mathbf{12}_1$ of a preliminary evacuation chamber $\mathbf{11}_1$ which defines a sample replacing chamber is first opened, and the above-described semiconductor wafer $\mathbf{1}_1$ is placed on a mount $\mathbf{14}_1$ which is installed on a stage $\mathbf{13}_1$. Then, the lid $\mathbf{12}_1$ is closed, and a valve $\mathbf{15}_1$ is opened to evacuate the preliminary evacuation chamber $\mathbf{11}_1$ by means of a vacuum pump $\mathbf{16}_1$. Thereafter, a gate valve $\mathbf{17}_1$ is opened, and the mount $\mathbf{14}_1$ is moved onto an XY stage $\mathbf{19}_1$ within a vacuum chamber which has been evacuated in advance by means of a vacuum pump $\mathbf{18}_1$. It should be noted that the reference numeral $\mathbf{20}_1$ denotes a valve which is normally opened. After the gate valve $\mathbf{17}_1$ is closed, the inside of the vacuum chamber is sufficiently evacuated. Then, an ion beam $\mathbf{10}_1$ is drawn from a high-brightness ion source $\mathbf{22}_1$ such as a liquid metal ion source, e.g., gallium (Ga), which is provided within an ion beam lens tube $\mathbf{21}_1$ disposed at the upper side of the vacuum chamber by means of an extractor electrode $\mathbf{23}_1$ which is installed below the ion source $\mathbf{22}_1$, and the drawn ion beam $\mathbf{10}_1$ is then focused and deflected through electrostatic lenses $\mathbf{24}_1$, a blanking electrode $\mathbf{25}_1$, a deflector electrode $\mathbf{26}_1$, etc. so as to irradiate the semiconductor wafer $\mathbf{1}_1$. Then, secondary electrons which are generated by the irradiation with the ion beam $\mathbf{10}_1$ are detected by a secondary electron detector D to form a scanning ion beam image on a monitor $\mathbf{28}_1$ of a power supply $\mathbf{27}_1$ for the deflector electrode $\mathbf{26}_1$ on the basis of the secondary electron signal from the detector D. While observing the scanning ion beam image on the monitor $\mathbf{28}_1$, the operator moves the XY stage $\mathbf{19}_1$ to detect portions of the surface of the semiconductor wafer $\mathbf{1}_1$ where contact holes $\mathbf{7}a_1$ and $\mathbf{7}b_1$ are to be formed. Then, the detected surface portions of the water $\mathbf{1}_1$ alone are irradiated with the ion beam $\mathbf{10}_1$ to thereby form contact holes $\mathbf{7}a_1$ and $\mathbf{7}b_1$, as shown in FIG. 25. Thereafter, the semiconductor wafer $\mathbf{1}_1$ is once taken out of the ion beam machining apparatus.

Figure 26:
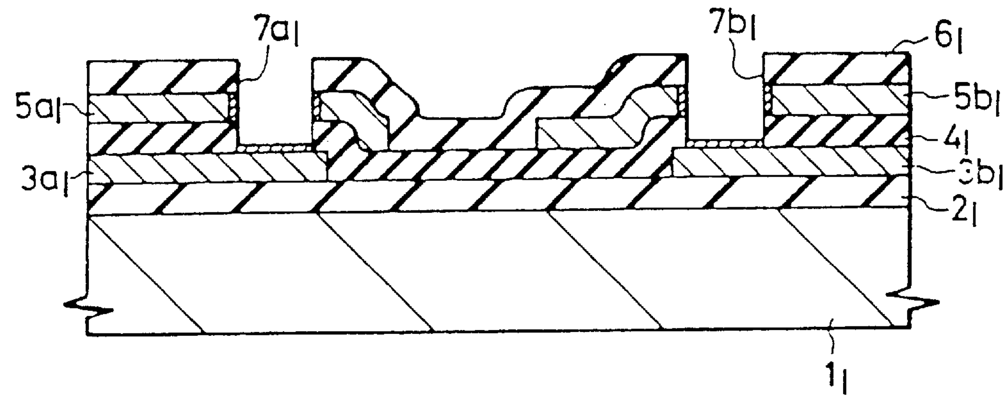

Next, the semiconductor wafer $\mathbf{1}_1$ is transferred to, for example, an anodizing apparatus (not shown) to anodize the surfaces of the second-level wirings $\mathbf{5}a_1$ and $\mathbf{5}b_1$ which are exposed through the contact holes $\mathbf{7}a_1$ and $\mathbf{7}b$formed as described above, thereby forming insulating films $\mathbf{9}_1$, e.g., alumina ($Al_2O_3$) films, in self-alignment with the contact holes $\mathbf{7}a$ and $\mathbf{7}b_1$, as shown in FIG. 26. When aluminum (Al) is employed as a wiring material, the anodizing process may be carried out using as a cathode platinum (Pt) and as an electrolyte a 5%-oxalic acid, phosphoric acid, chromic acid or sulfuric acid solution. It should be noted that, as the result of the anodizing process, insulating films $\mathbf{9}_1$ are also formed on the surface of the first-level wirings $\mathbf{3}a_1$ and $\mathbf{3}b_1$ within the contact holes $\mathbf{7}a_1$ and $\mathbf{7}b_1$. Thus, the surfaces of the second-level wirings $\mathbf{5}a_1$ and $\mathbf{5}b_1$ which are exposed through the contact holes $\mathbf{7}a_1$ and $\mathbf{7}b_1$ are changed into an insulator and it is therefore possible to prevent shorting between the first-level wirings $\mathbf{3}a_1$, $\mathbf{3}b_1$ and the second-level wirings $\mathbf{5}a_1$, $\mathbf{5}b_1$ by a simple process without the need for a complicated process such as a photolithographic process. It should be noted that the above-described alumina film may also be formed by, for example, $O_2$ plasma oxidation, in addition to anodizing. $O_2$ plasma oxidation technique is described, for example, in "Vacuum", Vol. 27, No. 12 (1984), p.901. When materials other than aluminum (Al), for example, refractory metals such as tungsten (W), molybdenum (Mo) or the like, are employed as a wiring material, oxides of these metals can be formed, for example, by subjecting the metals to a low-temperature heat treatment while irradiating them with ozone, and thus defining the insulating films $\mathbf{9}_1$. It should be noted that, as the result of irradiation of the surfaces of the first-level wirings $\mathbf{3}a_1$ and $\mathbf{3}b_1$ with the ion beam when the contact holes $\mathbf{7}a_1$ and $\mathbf{7}b_1$ are formed, a wiring material, e.g., aluminum, is deposited on the inner peripheral surfaces of the contact holes $\mathbf{7}a_1$ and $\mathbf{7}b_1$ as shown by the one-dot chain line in FIG. 25 and this may result in shorting between the first-level wirings $\mathbf{3}a$, $\mathbf{3}b$ and the second-level wirings $\mathbf{5}a_1$, $\mathbf{5}b_1$ when the contact holes $\mathbf{7}a_1$ and $\mathbf{7}b_1$ are formed. However, this problem can be eliminated by completely changing the aluminum deposited on the inner peripheral surfaces of the contact holes $\mathbf{7}a_1$ and $\mathbf{7}b_1$ into alumina by, for example, the above-described anodizing.

Figure 27:
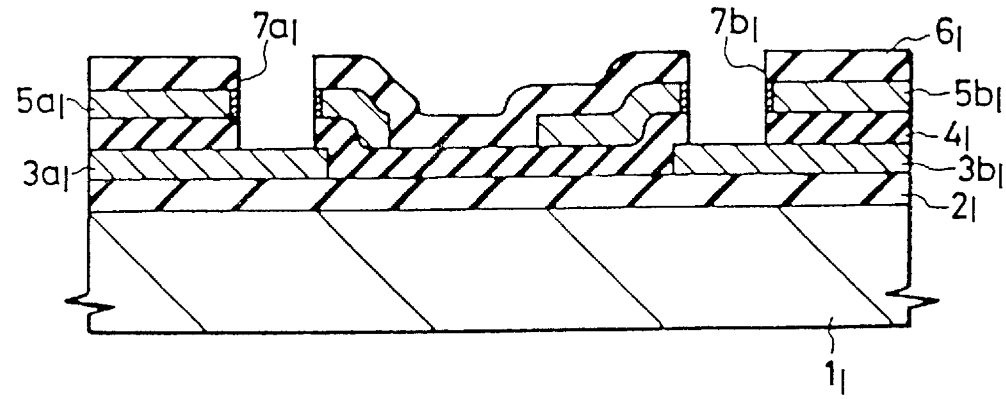

Next, the insulating films $\mathbf{9}_1$ which are formed on the surfaces of the first-level wirings $\mathbf{3}a_1$ and $\mathbf{3}b_1$ in the contact holes $\mathbf{7}a_1$ and $\mathbf{7}b_1$ as the result of the above-described anodizing are selectively removed by, for example, irradiation with a laser beam, thereby partially exposing the surfaces of the first-level wirings $\mathbf{3}a_1$ and $\mathbf{3}b_1$, as shown in FIG. 27.

Then, the semiconductor wafer $\mathbf{1}_1$ is replaced on the mount $\mathbf{14}_1$ provided on the XY stage $\mathbf{13}_1$ shown in FIG. 28 and the mount $\mathbf{14}_1$ is moved onto an XY stage $\mathbf{30}_1$ within a vacuum chamber $\mathbf{29}_1$ of the laser CVD apparatus. The semiconductor wafer $\mathbf{1}_1$ is then moved by the operation of the XY stage $\mathbf{30}_1$ to a position where the wafer $\mathbf{1}_1$ is to be irradiated with a laser beam $\mathbf{32}_1$ oscillated from a laser oscillator $\mathbf{31}_1$, for example, an argon laser, thereby positioning the defective part of the wirings which is to be repaired. Then, the laser beam $\mathbf{32}_1$ is passed through a shutter $\mathbf{33}_1$, reflected by a dichroic mirror $\mathbf{34}_1$ and focused by an objective lens $\mathbf{35}_1$ so as to irradiate said part of the wirings through a window $\mathbf{36}_1$ which is provided in the wall of the vacuum chamber $\mathbf{29}_1$. At this time, it is possible to effect alignment of the defective part with the laser irradiation position while observing said part through an illumination optical system $\mathbf{37}_1$, a half-mirror $\mathbf{38}_1$, a laser beam cut filter $\mathbf{39}_1$, a prism $\mathbf{40}_1$ and an ocular $\mathbf{41}_1$. Then, a valve $\mathbf{42}_1$ is opened to introduce a reaction gas consisting of an organic metal compound, e.g., $Mo(CO)_6$ or $W(CO)_6$, into the vacuum chamber $\mathbf{29}_1$ from a gas cylinder $\mathbf{43}_1$ which is connected to the chamber $\mathbf{29}_1$. At the same time, a valve $\mathbf{44}_1$ is opened to introduce an inert gas into the vacuum chamber $\mathbf{29}_1$ from a gas cylinder $\mathbf{45}_1$. In this state, the laser beam $\mathbf{29}_1$ is selectively applied to the defective part of the wirings, thereby decomposing the reaction gas and selectively depositing a metal on the part irradiated with the laser beam $\mathbf{32}_1$. Thus, the connecting wiring $\mathbf{8}_1$ which interconnects the wirings $\mathbf{3}a_1$and $\mathbf{3}b_1$ in the first-level layer through the contact holes $7a_1$ and $7b_1$ is formed as shown in FIGS. 23 and 24. In this case, it is possible to deposit a metal film having a thickness of, for example, about 0.5 to 1.0 μm by one scanning operation with the laser beam $32_1$.

Although the third aspect of the present invention has been specifically described by way of one embodiment, it should be noted here that this aspect is not necessarily limited to the described embodiment and various changes and modifications may, of course, be imparted thereto without departing from the gist of the invention.

For example, although in the foregoing embodiment the defective part is repaired when the LSI is in the form of the semiconductor wafer $1_1$, it is, of course, possible to repair the defective part after the semiconductor wafer $1_1$ has been divided into individual semiconductor chips. Although in the foregoing embodiment repair of a defective part of the wirings or change of the logical design is effected after the completion of the LSI, it is also possible to apply this aspect of the present invention to formation of wirings for realizing a desired logic in, for example, a master slice of a gate array. Further, the present invention may be applied to formation of a connection wiring which interconnects wirings in the same layer or different layers in the course of the process for producing, for example, an LSI having a multilayer wiring structure. This aspect of the present invention may also be applied to, for example, a printed board having a multilayer wiring structure.

Figure 29:
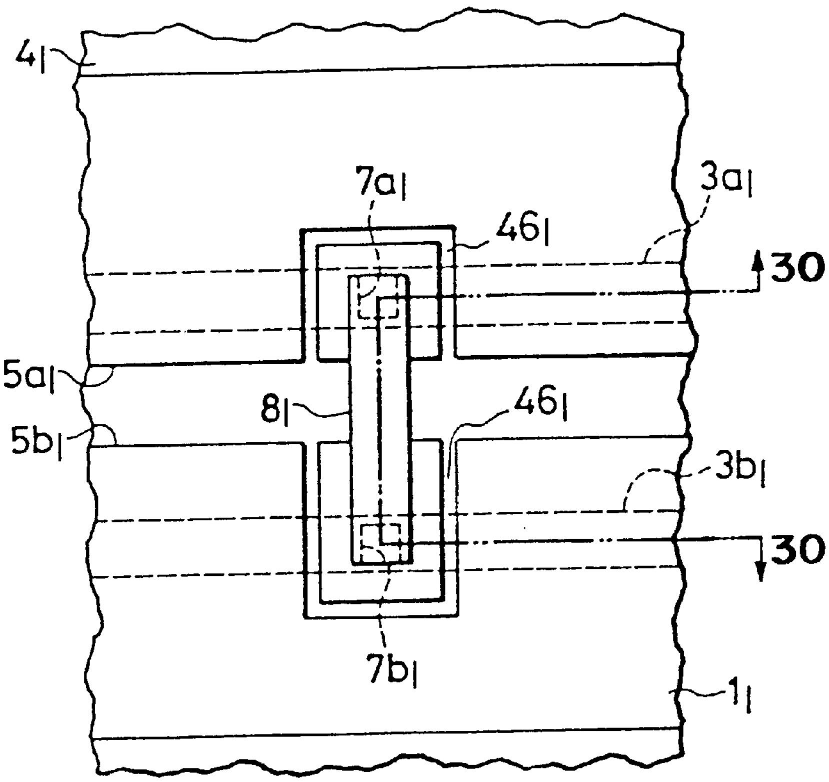
FIG. 29 is a plan view of an LSI, which shows another example of the structure for preventing shorting between wirings respectively located in the first- and second-level layers.
Figure 30:
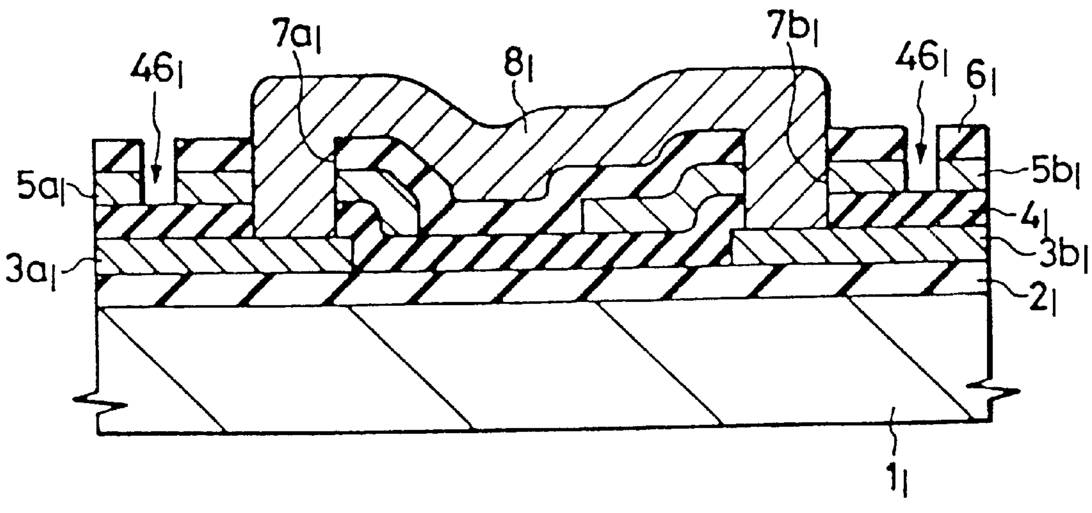
FIG. 30 is an enlarged sectional view taken along the line Y—Y of FIG. 29.

It should be noted that it is also possible to prevent contact between the connecting wiring $8_1$ and the upper-level wirings $5a_1$, $5b_1$ by means, for example, of grooves $46_1$ which are formed by selectively removing the upper-level wirings $5a_1$ and $5b_1$ around the contact holes $7a_1$ and $7b_1$, together with the insulating film $6_1$ provided thereon, by means, for example, of irradiation with an ion beam, as shown in FIGS. 29 and 30. In this way, it is also possible to prevent shorting between the wirings $3a_1$, $3b_1$ and the wirings $5a_1$, $5b_1$.

Embodiment 2

Figure 31:
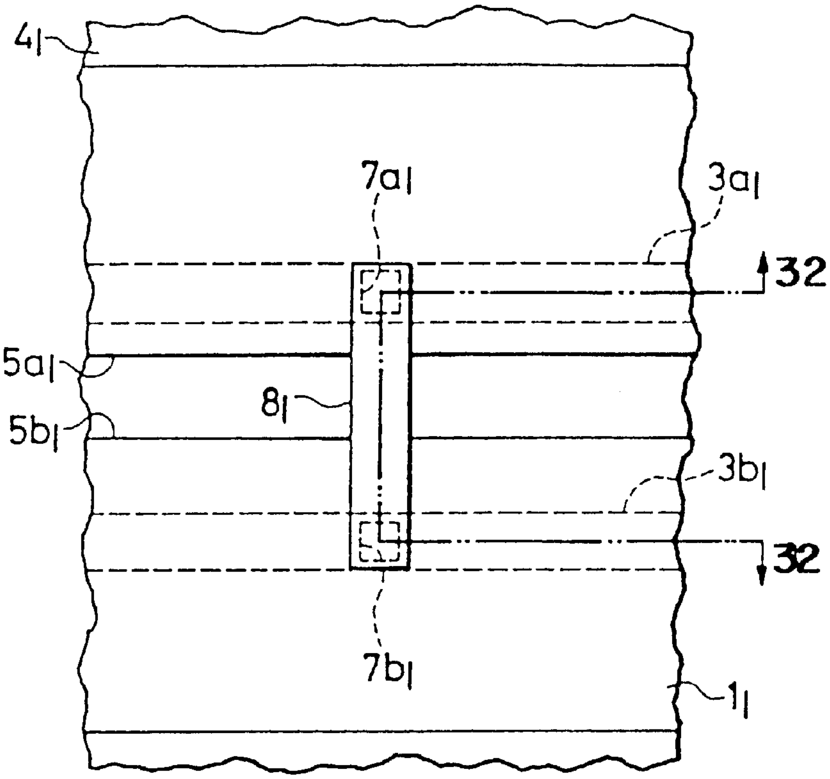
FIG. 31 is a plan view of an LSI in accordance with another embodiment of the third aspect of the present invention.
Figure 32:
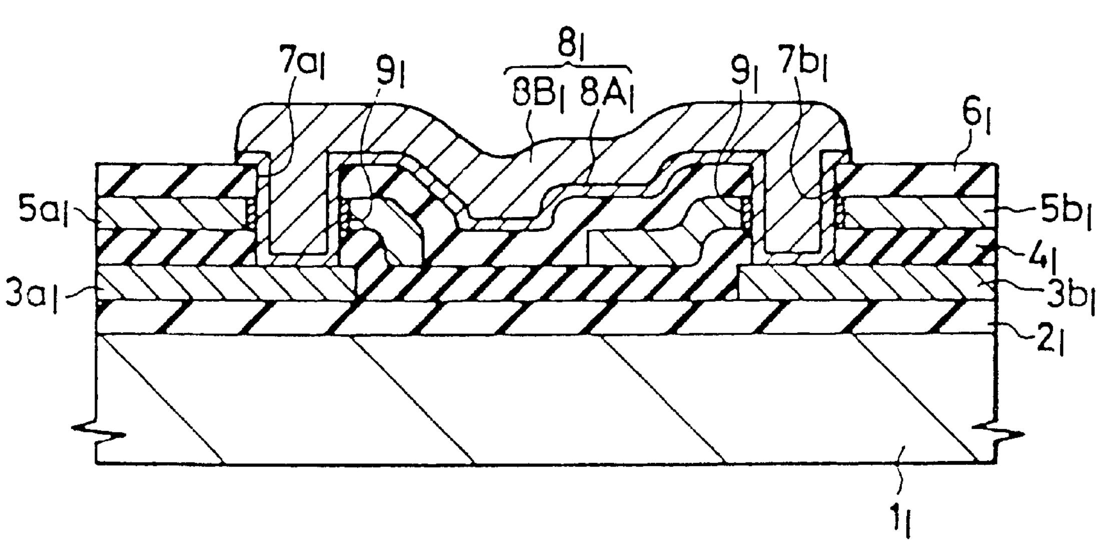
FIG. 32 is an enlarged sectional view taken along the line X—X of FIG. 31.

FIG. 31 is a plan view of an LSI having a double-layer wiring structure in accordance with another embodiment of the present invention, and FIG. 32 is an enlarged sectional view taken along the line X—X of FIG. 31.

As shown in FIGS. 31 and 32, the LSI in accordance with this embodiment has a semiconductor substrate (wafer) $1_1$, for example, a silicon substrate, having a plurality of semiconductor elements such as transistors (not shown) fabricated thereon so as to form a semiconductor integrated circuit. An intermediate insulating film $2_1$, for example, an $SiO_2$ film, is formed on the surface of the semiconductor substrate $1_1$, and first-level wirings (i.e., lower-level wirings) $3a_1$ and $3b_1$ which are defined by, for example, an aluminum (Al) film, are provided on the intermediate insulating film $2_1$. Another intermediate insulating film $4_1$ which is defined by, for example, an $SiO_2$ film, is provided on the wirings $3a_1$ and $3b_1$, and second-level wirings (i.e., upper-level wirings) $5a_1$ and $5b_1$ which are defined by, for example, an aluminum (Al) film, are provided on the intermediate insulating film $4_1$. The wirings $5a_1$ and $5b_1$ define, for example, power supply wirings for supplying a power supply current, and are widely laid out over the surface of the intermediate insulating film $4_1$. An insulating film $6_1$ (not shown in FIG. 31) is further provided on the wirings $5a_1$ and $5b_1$. Contact holes $7a_1$ and $7b_1$ are provided in such a manner as to extend through the insulating film $6_1$, the wirings $5a_1$, $5b_1$ (respectively) and the intermediate insulating film $4_1$, and a connecting wiring $8_1$ which interconnects the lower-level wirings $3a_1$ and $3b_1$ is provided in such a manner as to extend through these contact holes $7a_1$ and $7b_1$. By using this connecting wiring $8_1$, for example, a defect which is found after the completion of the LSI is repaired (or a logical design is changed). It should be noted that the contact holes $7a_1$ and $7b_1$ may be either vertical or tapered contact holes.

The connecting wiring $8_1$ consists of a buffer film $8A_1$ such as a chromium (Cr) film and a metal film $8B_1$ such as a tungsten film. The metal film $8B_1$ is defined by a single-layer film consisting of tungsten (W), molybdenum (Mo), cadmium (Cd) or aluminum (Al), or a multilayer film consisting of these metals, the single- or multi-layer film being selectively formed by means, for example, of laser CVD.

On the other hand, the buffer film $8A_1$ which is the other constituent element of the connecting wiring $8_1$ is formed specifically from a metal such as chromium (Cr), molybdenum (Mo), tungsten (W) or nickel (Ni), or a semiconductor, such as Si, Ge, GaAs or polysilicon, which contains an active impurity, or a silicide which is an alloy of a metal and silicon. These substances have excellent adhesion to a $SiO_2$ passivation film covering the surface of a semiconductor device and a wiring material which is deposited by laser CVD.

Accordingly, there is no fear of the wiring material separating from the surface of the semiconductor device nor risk of the deposited wiring material being cracked.

Since the buffer film $8A_1$ has a high rate of absorption of a laser beam which causes the CVD phenomenon, it is possible to deposit a wiring material without the need to increase the laser output, and it is therefore possible to effect CVD with excellent controllability. In other words, it is possible to provide a wiring even if scanning with the laser beam is effected at high speed.

Further, since the presence of the buffer film $8A_1$ makes is possible to lessen the effects of the material and structure of the ground on which a wiring material is to be provided, it is easy to maintain the width and thickness of the wiring deposited on the buffer film $8A_1$ at constant levels. At the same time, the buffer film $8A_1$ absorbs the greater part of the energy of the laser beam and reflects part of the laser beam, and it is therefore possible to reduce the thermal effect of the wiring on the ground. It has been experimentally confirmed that, as the buffer film $8A_1$, chromium (Cr) film is particularly preferable and practical.

It should be noted that the function and effects of the buffer film $8A_1$ and a process for producing the same are described in detail in the specification of Japanese Patent Application No. 245215/1986 filed on Oct. 17, 1986 by the same applicant.

The surfaces of the second-level wirings $5a_1$ and $5b_1$ which are exposed through the respective contact holes $7a_1$ and $7b_1$ are provided with respective insulating films $9_1$, for example, alumina ($Al_2O_3$) films, which are formed by changing the surfaces into an insulator, thereby preventing contact between the connecting wiring 8 and the second-level wirings $5a_1$, $5b_1$. Accordingly, it is possible to form the connecting wiring $8_1$ without any fear of the first-level wirings $3a_1$, $3b_1$ electrically conducting, or shorting, to the second-level wirings $5a_1$, $5b_1$. The thickness of the insulating films $9_1$ is selected so as to be adequate to obtain a necessary dielectric breakdown strength in accordance with the potential difference between the first-level wirings $3a_1$, $3b_1$ and the second-level wirings $5a_1$, $5b_1$. For example, if the insulating films $9_1$ are made of alumina (dielectric strength: about 500 V/$\mu$m) and the above-described potential difference is 5 V, the thickness of the films $9_1$ may be selected so as to fall in the range from 1000 to 5000 Å.

The LSI in accordance with this embodiment can be produced by appropriating the process for producing a buffer film disclosed in Japanese Patent Application No. 245215/1986 to the process for producing an LSI in accordance with the foregoing first embodiment.

Although this aspect of the present invention has been specifically described by way of one embodiment, it should be noted here that the present invention is not necessarily limited to the described embodiment and various changes and modifications may, of course, be imparted thereto without departing from the gist of the invention.

For example, although in the foregoing embodiment the defective part is repaired when the LSI is in the form of the semiconductor wafer $1_1$, it is, of course, possible to repair the defective part after the semiconductor wafer $1_1$ has been divided into individual semiconductor chips. Although in the foregoing embodiment repair of a defective part of the wirings or change of the logical design is effected after the completion of the LSI, it is also possible to apply the present invention to formation of wirings for realizing a desired logic in, for example, a master slice or a gate array. Further, the present invention may be applied to formation of a connecting wiring which interconnects wirings in the same layer or different layers in the course of the process for producing, for example, an LSI having a multilayer wiring structure. The present invention may also be applied to, for example, a printed board having a multilayer wiring structure.

It should be noted that it is also possible to prevent contact between the connecting wiring $8_1$ and the upper-level wirings $5a_1$, $5b_1$ by means, for example, of grooves $46_1$ which are formed by selectively removing the upper-level wirings $5a_1$ and $5b_1$ around the contact holes $7a_1$ and $7b_1$, together with the insulating film $6_1$ provided thereon, by means, for example, of irradiation with an ion beam, as shown in FIGS. 31 and 32. In this way, it is also possible to prevent shorting between the wirings $3a_1$, $3b_1$ and the wirings $5a_1$, $5b_1$.

Embodiment 3

Figure 33:
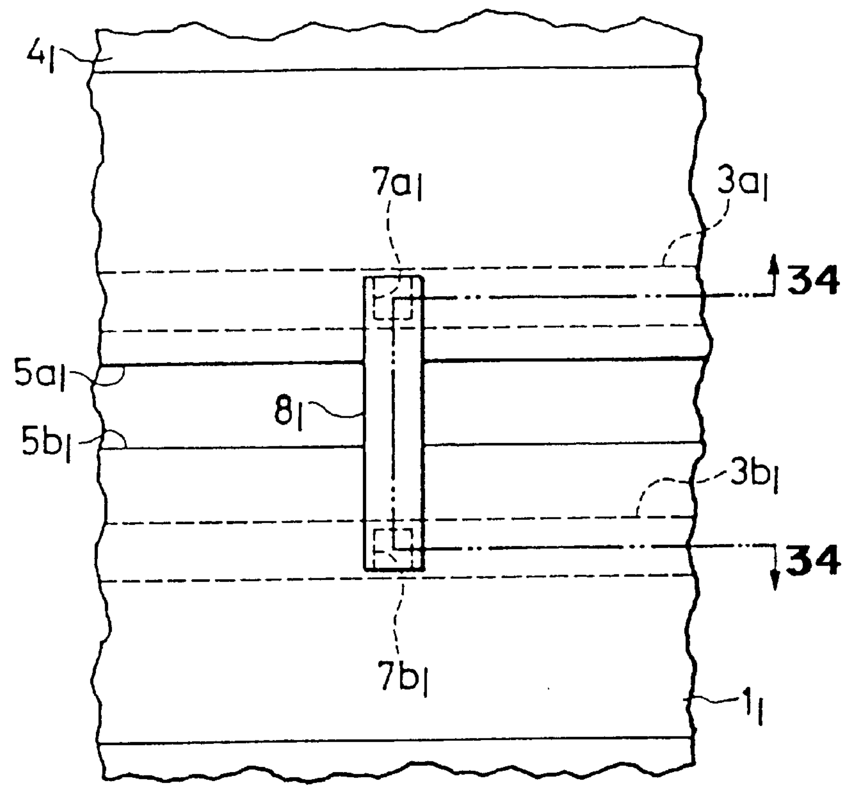
FIG. 33 is a plan view of an LSI in accordance with still another embodiment of the third aspect of the present invention.
Figure 34:
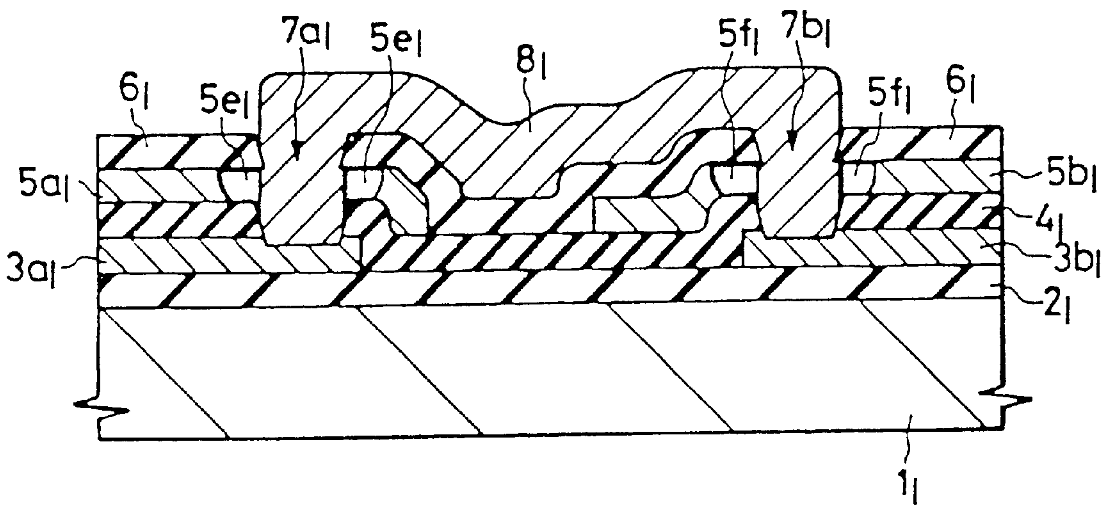

FIG. 33 is a plan view of an LSI having a double-layer wiring structure in accordance with still another embodiment of the present invention, and FIG. 34 is an enlarged sectional view taken along the line X—X of FIG. 33.

As shown in FIGS. 33 and 34, the LSI in accordance with this embodiment has a semiconductor substrate (wafer) $1_1$, for example, a silicon substrate, having a plurality of semiconductor elements such as transistors (not shown) fabricated thereon so as to form a semiconductor integrated circuit. An intermediate insulating film $2_1$, for example, an $SiO_2$ film, is formed on the surface of the semiconductor substrate $1_1$, and first-level wirings (i.e., lower-level wirings) $3a_1$ and $3b_1$ which are defined by, for example, an aluminum (Al) film are provided on the intermediate insulating film $2_1$. Another intermediate insulating film $4_1$ which is defined by, for example, an $Sio_2$ film is provided on the wirings $3a_1$ and $3b_1$, and second-level wirings (i.e., upper-level wirings) $5a_1$ and $5b_1$ which are defined by, for example, an aluminum (Al) film, are provided on the intermediate insulating film $4_1$. The wirings $5a_1$ and $5b_1$ define, for example, power supply wirings for supplying a power supply current, and are widely laid out over the surface of the intermediate insulating film $4_1$. An insulating film $6_1$ (not shown in FIG. 33) is further provided on the wirings $5a_1$ and $5b_1$. Contact holes $7a_1$ and $7b_1$ are provided in such a manner as to extend through the insulating film $6_1$, the wirings $5a_1$, $5b_1$ (respectively) and the intermediate insulating film $4_1$, and a connecting wiring $8_1$ which interconnects the lower-level wirings $3a_1$ and $3b_1$ is provided in such a manner as to extend through these contact holes $7a_1$ and $7b_1$. By using this connecting wiring $8_1$, for example, a defect which is found after the completion of the LSI is repaired (or a logical design is changed). It should be noted that the contact holes $7a_1$ and $7b_1$ may be either vertical or tapered contact holes. The connecting wiring $8_1$ is defined by a metal film such as a tungsten (W), molybdenum (Mo), cadmium (Cd) or aluminum (Al) film which is selectively formed by, for example, laser CVD.

The second-level wirings $5a_1$ and $5b_1$ which are exposed through the respective contact holes $7a_1$ and $7b_1$ are provided with respective bores $5c_1$ and $5d_1$ which have a larger diameter than that of the contact holes $7a_1$ and $7b_1$, as will be clear from FIG. 34, thereby preventing contact between the connecting wiring $8_1$ and the second-level wirings $5a_1$, $5b_1$. Accordingly, it is possible to form the connecting wiring $8_1$ without any fear of the first-level wirings $3a_1$, $3b_1$ electrically conducting, or shorting, to the second-level wirings $5a_1$, $5b_1$.

The method of forming the bores $5c_1$ and $5d_1$ will be described later in detail.

The following is a description of a process for producing the LSI in accordance with this embodiment which is arranged as described above.

Figure 35:
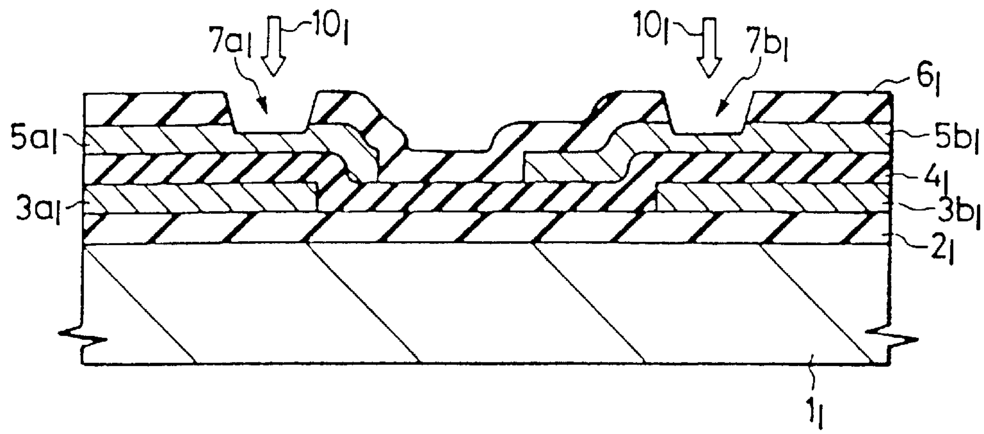

Referring now to FIG. 35, a semiconductor integrated circuit is first formed on a silicon wafer $1_1$ which serves as a starting material by carrying out diffusion of impurity ions, thermal oxidation of the silicon wafer $1_1$, formation of thin films by CVD, formation of various patterns by the use of photolithographic techniques, etc. Then, an intermediate insulating film $2_1$, first-level wirings $3a_1$, $3b_1$, an intermediate insulating film $4_1$, second-level wirings $5a_1$, $5b_1$ and an insulating film $6_1$ are formed to complete an LSI. When it is necessary to find a possible defective part of the wirings and repair it, contact holes $7a_1$ and $7b_1$ are formed by irradiating predetermined portions of the surface of the insulating film $6_1$ with a focused ion beam $10_1$ (see FIG. 35) having a high degree of machining accuracy by using, for example, an ion beam machining apparatus such as that shown in FIG. 28 which is proposed in the aforementioned Japanese Patent Application No. 70979/1986.

Since this ion beam machining method has already been explained in detail with reference to FIG. 28 in the description of the first embodiment, repetitive description thereof is omitted.

Figure 36:
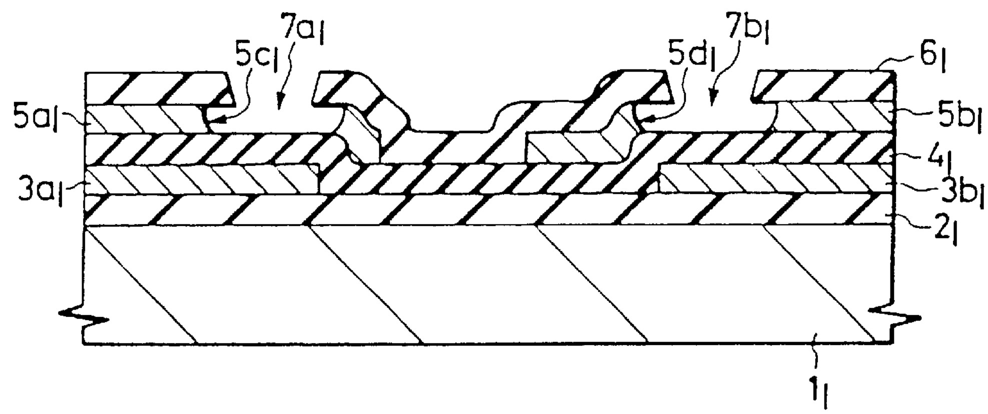

Next, as shown in FIG. 36, the second-level wirings $5a_1$ and $5b_1$, e.g., aluminum (Al) film, the surfaces of which are exposed through the contact holes $7a_1$ and $7b_1$ are etched by wet etching using the insulating film $6_1$ as an etching mask to thereby form bores $5c_1$ and $5d_1$ in the second-level wirings $5a_1$ and $5b_1$, the bores $5c_1$ and $5d_1$ having a larger diameter than that of the contact holes $7a_1$ and $7b_1$. In the formation of the bores $5c_1$ and $5d$, it is preferable to set the diameter A of the bores $5c_1$ and $5d_1$ at a value which is, for example, about 4 $\mu$m larger than the diameter B of the contact holes $7a_1$ and $7b_1$ so that the edge of each of the bores $5c_1$ and $5d_1$ provided in the second-level wirings $5a_1$ and $5b_1$ is located at a position about 2 $\mu$m recessed from the edge of the corresponding one of the contact holes $7a_1$ and $7b_1$. The above-described configuration of the bores $5c_1$ and $5d_1$ prevents the connecting wiring $8_1$ (described alter) from being electrically connected, or shorted, to the second-level wirings $5a_1$, $5b_1$.

In short, the dimensions of the bores $5c_1$ and $5d_1$ provided in the second-level wirings $5a_1$ and $5b_1$ may be so selected that the connecting wiring $8_1$ which is connected to the first-level wirings $3a_1$ and $3b_1$ through the contact holes $7a_1$ and $7b_1$ is prevented from electrically connected to the second-level wirings $5a_1$ and $5b_1$ by the presence of the bores $5c_1$ and $5d_1$.

As described above, the second-level wirings $5a_1$ and $5b_1$ are formed using, for example, aluminum or a material containing aluminum as its principal component, e.g., aluminum containing about 0.5 to 1.0% of silicon (Si). As a wet etching solution which may be employed to etch such a material containing aluminum as its principal component, it is preferable to use a mixed solution obtained by mixing together phosphoric acid, glacial acetic acid, nitric acid and water in the volume ratios 76:15:3:5. This etching solution is capable of etching not only aluminum but also alumina ($Al_2O_3$) which is an oxide of aluminum. Accordingly, it is possible to reliably remove only a desired portion even in the case of a wiring film which is made of a material containing aluminum as its principal component and which has a thin alumina film formed on its surface by oxidation of the surface of an aluminum film. It should be noted that various wet etching solutions other than that described above may also be employed to etch a wiring material containing aluminum as its principal component.

Figure 37:
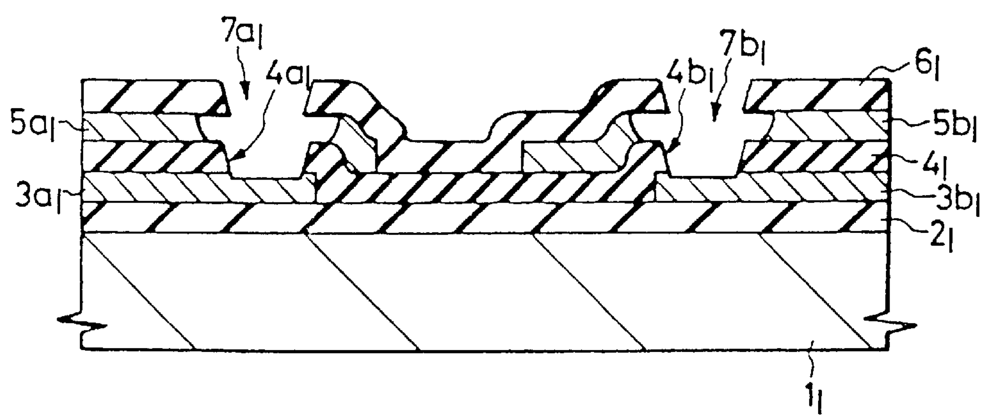

Subsequently, as shown in FIG. 37, the regions of the intermediate insulating film $4_1$, the surfaces of which are exposed through the contact holes $7a_1$ and $7b_1$ are irradiated with a focused ion beam of high degree of machining accuracy by the use of an ion beam machining apparatus to thereby form bores $4a$ and $4b_1$. At this time, by virtue of the rectilinear propagation nature of the focused ion beam, bores $4a_1$ and $4b_1$ which have substantially the same diameter as that of the contact holes $7a_1$ and $7b_1$ are formed thereunder.

Next, a metal film such as tungsten (W) or molybdenum (Mo) is formed in a predetermined pattern by scanning it with a laser beam by laser CVD which is an optically pumped CVD method, as shown in FIGS. 33 and 34.

It should be noted that the reference numerals $5e_1$ and $5f_1$ in FIG. 34 denote air gap regions. The connecting wiring $8_1$ and the second-level wirings $5a_1$, $5b_1$ are electrically isolated from each other by the air gap regions $5e_1$ and $5f_1$.

In this embodiment, electrical isolation of the connecting wiring $8_1$ from the second-level wirings $5a_1$, $5b_1$ is effected by the air gap regions $5e_1$ and $5f_1$ which are formed by partially removing the second-level wirings $5a_1$ and $5b_1$ by wet etching. Thus, this embodiment, which employs wet etching, has the merit that it is possible to provide an electrical isolation means in a simple operation and within a short period of time in comparison with the method described in the first embodiment. Since the isolation method by anodizing which has been described in the first embodiment is carried out by dipping the sample in an electrolytic bath containing an electrolyte, the electrolyte and various contaminants adhere to the sample, and a complicated process is needed to completely clean the attached electrolyte and contaminants. With an ordinary cleaning operation, it is impossible to completely remove the attached electrolyte and various contaminants, and they are unavoidably left on the sample. These residual substances may lead to lowering in reliability of LSI characteristics and deterioration in electrical characteristics of the device after it has been put to actual use. Further, when selective regions of the aluminum wiring is changed into alumina by anodizing, other regions of the sample may be undesirably anodized, and this may lead to deterioration in electrical characteristics of a sample, e.g., an LSI, generation of a failure and lowering in the reliability. There is one type of LSI for computers which has a large number of bump electrodes made of a solder material as external lead terminals and which is mounted on a circuit board through the bump electrodes by CCD (Controlled Collapse Bonding) method, and some of these LSIs have several hundreds of bump electrodes on the plane of an LSI chip of, for example, 10 mm×10 mm. In the case of a sample which has such bump electrodes, when the aluminum wiring is anodized, the bump electrodes may also be undesirably anodized, which gives rise to problems such as lowering in the electrical characteristics and occurrence of a failure.

In contrast to this, the isolation method by wet etching described in this embodiment enables the etching solution attached to the sample to be completely cleaned (removed) in a simple operation and within a short period of time and this isolation method is free from various problems which are experienced with the anodizing process. Therefore, it should be borne in mind that the isolation method in accordance with this embodiment is practical than the anodizing method and is a superior method which does not lead to deterioration in electrical characteristics nor lowering in reliability of the sample.

As the connecting wiring $8_1$ in this embodiment, it is possible to employ the composite film of the buffer film $8A_1$ and the metal film $8B_1$ which has been described in the second embodiment.

Although the present invention has been specifically described by way of one embodiment, it should be noted here that the present invention is not necessarily limited to the described embodiment and various changes and modifications may, of course, be imparted thereto without departing from the gist of the invention.

For example, although in the foregoing embodiment the defective part is repaired when the LSI is in the form of the semiconductor wafer $1_1$, it is, of course, possible to repair the defective part after the semiconductor wafer $1_1$ has been divided into individual semiconductor chips. Although in the foregoing embodiment repair of a defective part of the wirings or change of the logical design is effected after the completion of the LSI, it is also possible to apply the present invention to formation of wirings for realizing a desired logic in, for example, a master slice or a gate array. Further, the present invention may be applied to formation of a connecting wiring which interconnects wirings in the same layer or different layers in the course of the process for producing, for example, an LSI having a multilayer wiring structure. The present invention may also be applied to, for example, a printed board having a multilayer wiring structure.

Embodiment 4

Giving an outline of this embodiment, a hole is bored by means of a focused ion beam in that portion of an insulating film which is located above that portion of a wiring which is desired to be connected to another portion, and said portion of the wiring is irradiated with a focused laser or ion beam in a metal compound gas to deposit a metal in the above-described hole, thereby forming a wiring. In this case, the hole is machined so that the upper portion of the hole is widened, and the metal is buried in the hole in such a manner that a particularly large amount of metal is deposited in the upper portion of the hole, thereby enabling the deposited metal to be satisfactorily connected to the wiring at the lower side of the hole.

By virtue of this arrangement, the positions of a plurality of wirings which are to be interconnected are detected by employing a scanning ion microscope using a secondary electron or ion signal obtained from the sample, thereby positioning the sample and determining portions to be irradiated with an ion beam. Thereafter, said portions of the sample are irradiated with the ion beam to remove those portions of the insulating film which are located above said portions of the wirings. Since in this case a focused ion beam is employed instead of a laser beam, it is possible to effect machining on the order of 0.5 μm or less with the focused ion beam. Further, since the ion beam enables any kind of material to be uniformly machined, it is possible to machine a stack of insulating films such as $SiO_2$ and $Si_3N_4$ successively from the upper side thereof and thereby bore a hole therein to expose the surface of the wiring in the lower layer. Thereafter, a metal compound gas is introduced into the vacuum chamber through a nozzle or a pipe, and the sample table is moved relative to the vacuum chamber so that portion of the sample where a connecting wiring is to be farmed is irradiated with a focused ion or laser beam. Then, a metal wiring is formed by ion beam induced CVD process or laser DVD process. As a result, it is possible to interconnect wirings inside an IC after the completion thereof, so that it is possible to debug and repair the IC and effect a defect analysts. It should be noted that debugging of ICs herein includes finding and correcting an error in connection of the wirings in ICs and making a diagnosis of ICs.

The feature of this embodiment also resides in a method of notching that portion of the upper-level wiring which is in contact with the buried metal is order to prevent the metal which is buried to provide connection with the lower-level wiring from electrically conducting to the upper-level wiring.

Figure 38:
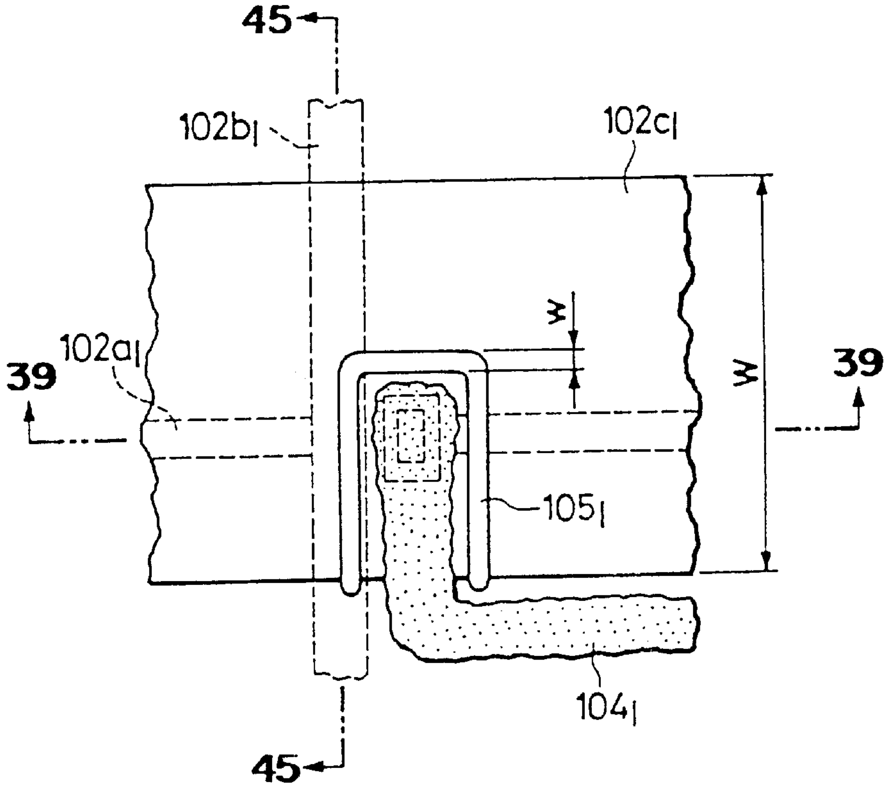
Figure 39:
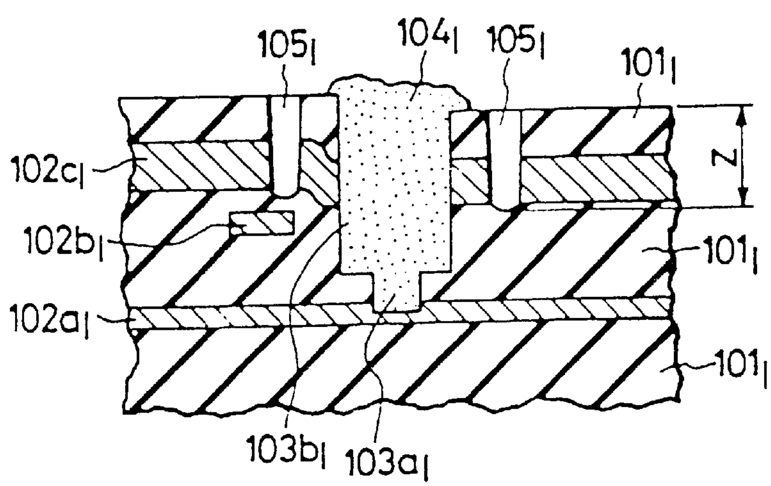

FIGS. 38 and 39 show in combination a method of forming a connecting wiring on an IC is accordance with one embodiment of the present invention.

Referring to FIG. 39, which is a sectional view of an IC chip, as insulating film (e.g., a $SiO_2$ film) 101$_1$ is provided on a substrate (e.g., a Si substrate), and wirings (e.g., Al wirings) 102$a_1$, 103$b_1$ and 102$c_1$ are formed on the insulating film 101$_1$ with an insulating film 101$_1$ interposed between each pair of adjacent wirings. Further, a protective film (e.g., a $SiO_2$ or $Si_3N_4$ film) 101$_1$ is formed on the uppermost wiring 102$c_1$.

When it is desired to electrically connect the lower-level wiring 102$a_1$ to another wiring (not shown), holes 103$a_1$ and 103$b_1$ are hosed in the insulating films 101$_1$ above the wiring 102$a_1$ by means of a focused ion beam to thereby expose a part of the wiring 102$a_1$. Thereafter, a metal wiring 104$_1$ is buried in the holes 103$a_1$ and 103$b_1$ by laser induced CVD or other similar means and the metal wiring 104$_1$ then formed so as to extend to a desired node or point of connection.

Prior to the formation of the metal wiring 104$_1$ it is also possible to form a structure is which a buffer film is provided under the natal wiring 104$_1$ as described in the second embodiment.

Since the IC has a multilayer wiring structure, it a connecting wiring is to be led from the first-level (lowermost) wiring 102$a_1$, the connecting wiring most be prevented from coming into contact with the upper-level wirings. In the arrangement shown in FIG. 38, a hole is bored at a position which is spaced apart from the second-level wiring 102$_1$. However, the third-level (uppermost) wiring 102$_c$, is usually used as a power supply wiring and therefore has a relatively wide width W as shown in FIG. 38. Accordingly, it is difficult to bore a hole for burying a connecting wiring at a position which is off the third-level wiring 102$c_1$. For this reason, in most cases the hole 103$b_1$ is inevitably provided so as to extend through the third-level wiring 102$c_1$, in such cases, if the metal wiring 104$_1$ is formed in this hole by laser CVD or other similar means, the first- and third-level wirings 102$a_1$, and 102$c_1$ undesirably short to each other. In order to avoid this problem, a notch 105$_1$ (having a width W) shown in FIG. 38 is cut outside the hole 103$b_1$ so that the depth Z of the notch 105$_1$ is slightly greater than the depth of the third-level wiring 102$c_1$, thereby electrically isolating that portion of the third-level wiring 102$c_1$ which is in contact with the metal wiring 104$_1$ from the other portion of the wiring 102$c_1$. Thereafter, a metal wiring is formed by laser CVD or other similar means so as to extend through the area defined between the two ends of the notch 105$_1$ having a U-shaped planar configuration.

Figure 40:
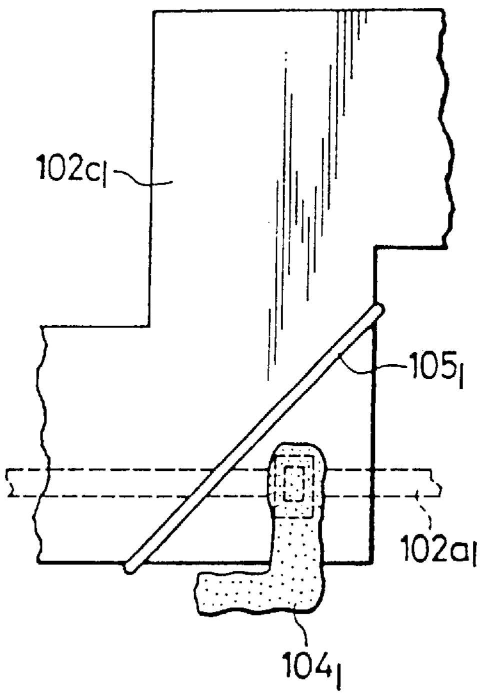

If the third-level wiring 102$c_1$ is curved as shown in FIG. 40, the wiring 102$c_1$ may be notched diagonally. By doing so, it is advantageously possible to simplify the scanning with the ion beam.

Figure 41:
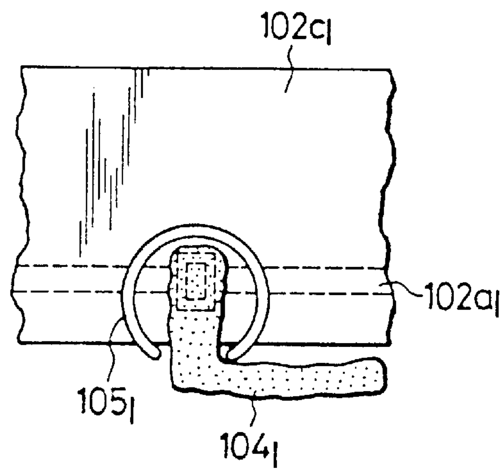

The notch 105$_1$ may be circular as shown in FIG. 41. In this case, it is possible to readily carry out scanning with the ion beam by superposing sine waves in the X- and Y-directions one upon the other.

In the case where the second-level wiring 102$b_1$ is present below the notch 105$_1$ as shown in FIG. 38, care must be taken of the following point. In such a case, the second-level wirings are often arranged at a pitch of, for example, 5 to 10 μm, because the integration density of ICs is increasing these days. Therefore, if the holes 103$a_1$ and 103$b_1$ are positioned so as to be spaced apart from the second-level wiring 102$b_1$, there is a goad possibility, that the notch 105$_1$ will overlap the wiring 102$b_1$. In such a case, it is important to, appropriately control the depth of the notch 105$_1$.

Figure 43:
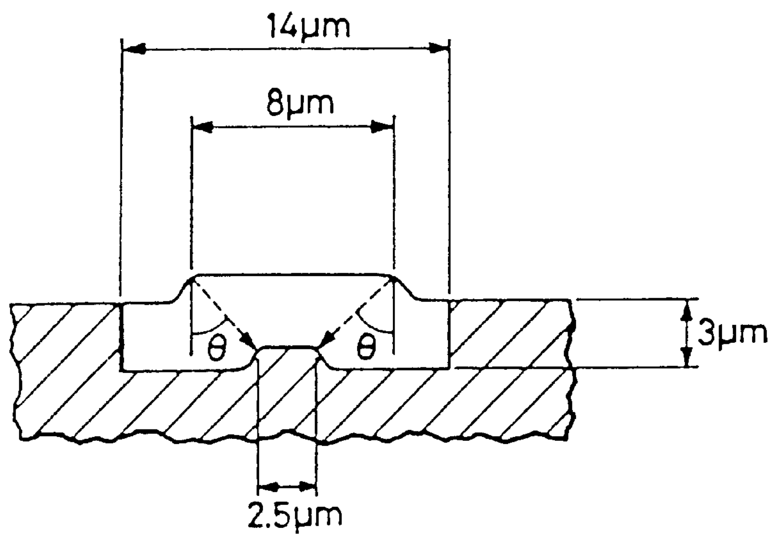
Figure 44:
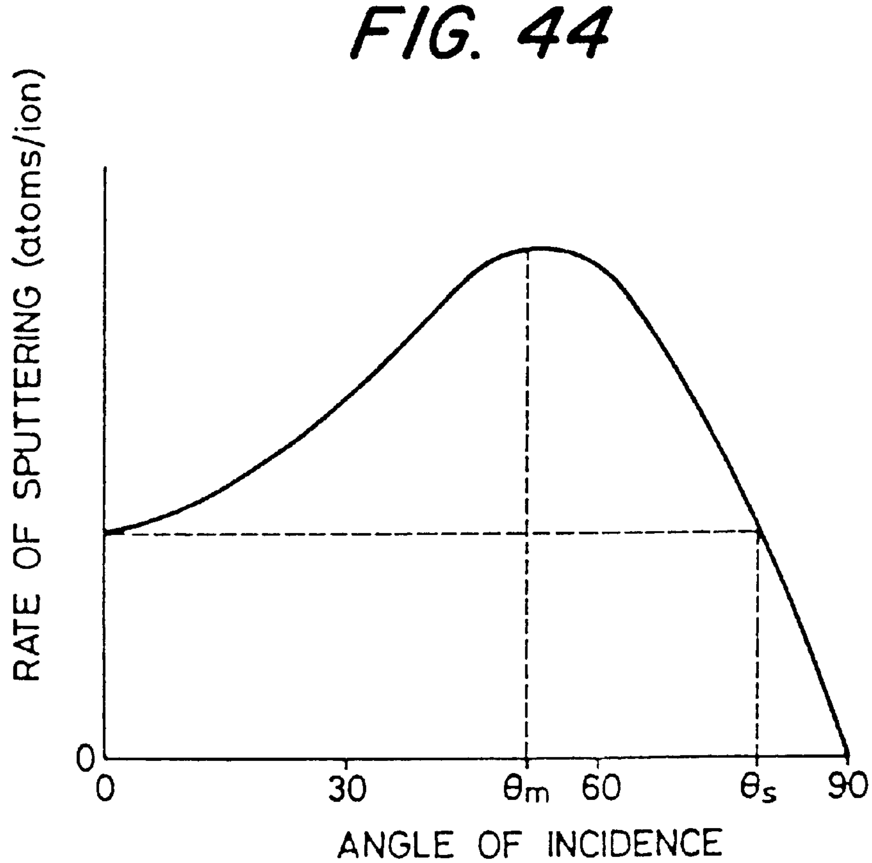

It is clear from the experimental results (see FIGS. 42 and 43) that if the surface of a workpiece which has a convex step is subjected to sputter etching by means of a focused ion beam, etching progresses toward the convex aids of the step configuration. This is because, as is well known, when the angle of incidence of the beam on the surface to be etched is near 40 to 70°, the rate of sputtering is 1.5 to 2 times that in the case where the angle of incidence is 0° (see FIG. 44). It will be understood from FIG. 43 that is this experiment the step progress with the angle a being about 45°.

Figure 42:
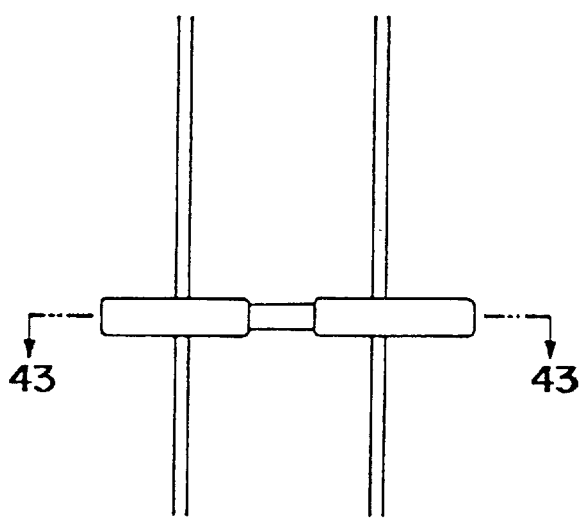
Figure 45:
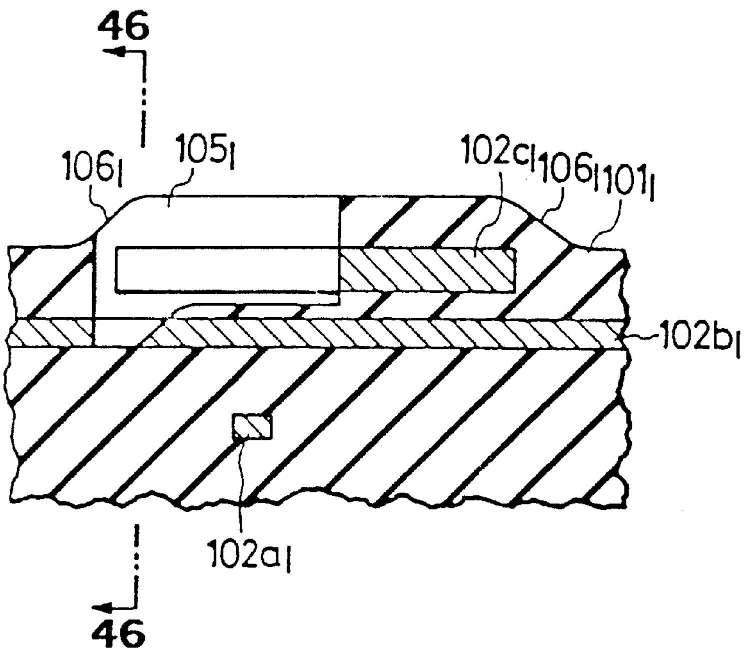
Figure 46:
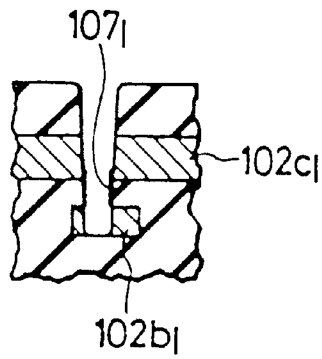
Figure 50:
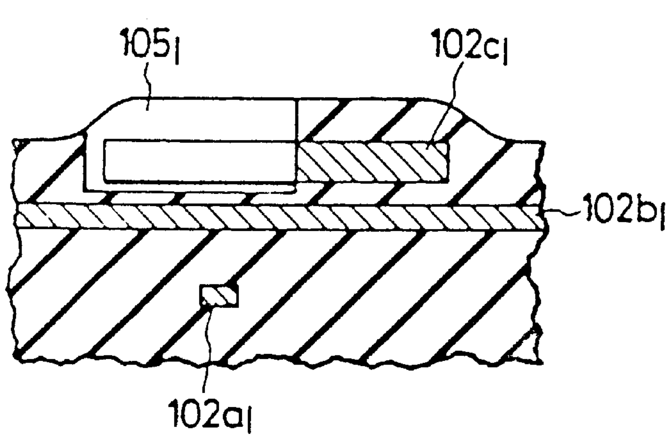
Figure 47:
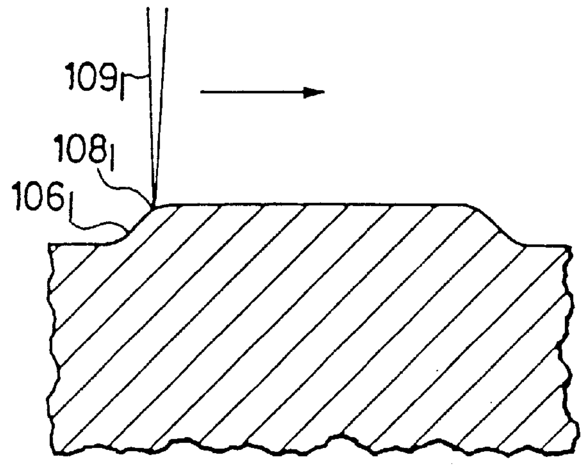
Figure 48:
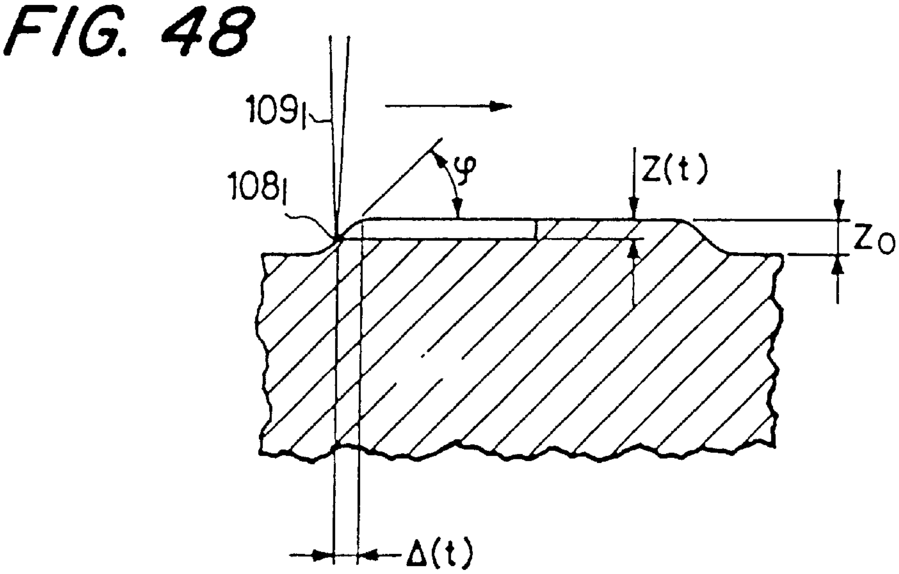
Figure 49:
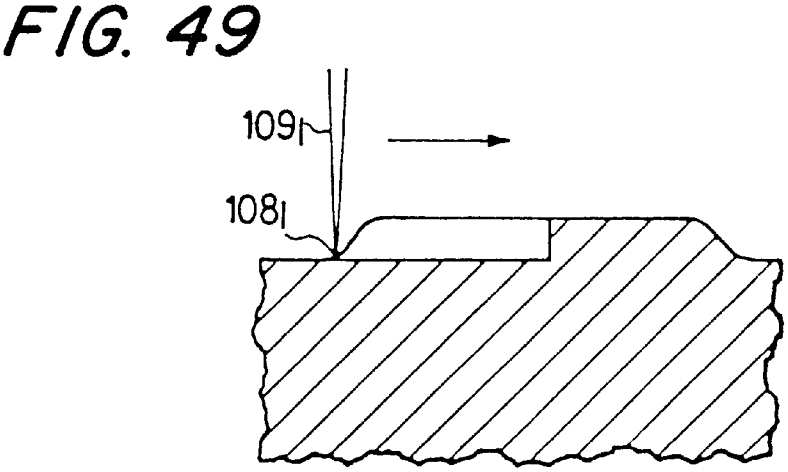

FIG. 45 is a sectional view taken along the line Y—Y of FIG. 38. Since the step of the third-level wiring 102$c_1$ causes the protective film 101$_1$ to have a step 106$_1$, the configuration of the step 106$_1$ is reflected on the bottom surface of the notch 105$_1$ as will be clear from the above-described experimental results, so that the second-level wiring 102$b_1$ is partially etched. As a result, as shown in FIG. 46 which is a sectional vises taken along the line Z—Z of FIG. 45, the cross-sectional area of the second-level wiring 102$b_1$ is reduced, which results in the reliability of the device being deteriorated, or when the second-level wiring 102$b_1$ is subjected to sputter etching, the wiring material adheres to the side walls of the notch 105$_1$ as shows by the reference numeral 107$_1$ and the wiring material 107$_1$ attached to the side walls may short the second- and third-level wiring To cope with the above-described problems, the edge portion 108$_1$ of the step 106$_1$ is detected with a secondary particle image as shown in FIG. 42, and scanning with a focused ion beam $\mathbf{109}_1$ is started from the edge portion $\mathbf{108}_1$ as shown in FIG. 47. Since the depth Z(t) of machining shown in FIG. 48 is proportional to the machining time t in the case where the inn current is adequately stable (within ±5% is the case of ordinary apparatus), the depth Z(t) is determined as a function of the time t. The angle $\phi$ of inclination of the step $\mathbf{6}_1$ is constant for the devices produced by the same film forming process and therefore can be known in advance. Accordingly, it is possible to start machining from the edge portion $\mathbf{108}_1$ shown in FIG. 48 at all times by shifting the starting position of scanning with the focused ion beam $\mathbf{109}_1$ leftward by $\Delta(t)=Z(t)/\tan\phi$ on the basis of Z(t) and $\phi$. The function is not necessarily fixed to the above-described one. If the above-described scanning start position is shifted until the height of the step is $Z_0-Z(t)$, the bottom surface of the notch $\mathbf{105}_1$ is flush with the surface of the element. By carrying out an ordinary machining operation thereafter, it is possible to complete a notch $\mathbf{105}_1$ having a flat bottom surface as shown in FIG. 50. Thus, it is possible to increase the yield at which the shorting of the third-level wiring is prevented by means of the notch.

As described above, after the boring of a contact hole in the sample and the machining to provide a short preventing notch, the metal wiring $\mathbf{104}_1$ is formed so as to extend between desired points of connection by laser or ion beam induced CVD, thereby interconnecting the lower level wiring $\mathbf{102}b_1$ and another wiring.

As has been described above, this third aspect of the invention makes it possible to interconnect as desired wirings which are located at different positions in an IC which has a high integration density and a multi-layer wiring structure, so that it is possible to readily carry out a defect analysis in any stage of fabrication of LSIs, i.e., designing, trial production and mass production of LSIs. Thus, it is advantageously possible to shorten the development step, reduce the period of time required to start mass production of LSIs, and increase the production yield.

Fourth Aspect of the Present Invention

This fourth aspect of the present invention will be illustrated, in the following, in various embodiments.

Embodiment 1

The present embodiment presents one improvement of the FIB (Focused Ion Beam) wiring correction Step (213" of FIG. 52) as the element process of the chip correction (IC Modification) system of Embodiment 2 and the IC developing and manufacturing system (of Embodiment 13).

The present invention naturally assumes the use in combination with the spare FF or gate disclosed in Embodiment 4. Moreover, the correction strategy of the present embodiment resorts to Embodiment 9.

FIG. 51A is an enlarged plan view of pertinent portions of a semiconductor wafer showing a semiconductor device manufacturing method according to Embodiment 1 of this fourth aspect of the present invention; FIG. 51B is an enlarged plan view showing pertinent portions of the semiconductor wafer; FIG. 51C is an enlarged plan view showing pertinent portions of the semiconductor wafer; FIG. 51D is a plan view showing the wiring pattern formed over the semiconductor wafer; FIG. 51E is a plan view showing a wiring pattern; FIG. 51F is a perspective view showing pertinent portions of a focused ion beam apparatus; FIG. 51G is a sectional view showing a part of the semiconductor wafers FIG. 51H is an enlarged plan view showing pertinent portions of the semiconductor wafer; FIG. 51I is a plan view showing a wiring pattern formed over the semiconductor wafer; FIG. 51J is a perspective view showing a pertinent portion of the laser CVD apparatus; FIG. 51K is a sectional view taken along line IX—IX of FIG. 51I; FIG. 51L is a plan view showing a wiring pattern formed over the semiconductor wafer; and FIG. 51M is a plan view of a semiconductor wafer shoving the connections of logic gates equivalently.

In FIG. 51D, characters $G_1$, $G_2$, $G_3$, $G_4$, . . . , and $G_n$ denote logic gates. Although not shown, this semiconductor device is composed of bipolar transistors which are formed over a semiconductor wafer made of, for example, a p-type silicon single crystal. The bipolar transistors are isolated from one another by a field insulating film 2".

The logic gates $G_1$–$G_n$ are overlaid by a second-layer conductive layer such as a signal wiring 3*a*". power source wirings 3*a*"(Vcc) and 3*a*"(Vss), which extend vertically of the figure. On this occasion, the not-shown first conductive layer is connected to the bases and collectors of the bipolar transistors. The first and second conductive layers are made of, for example, an alloy of Al—Si—Cu.

In the spare region shared with the wirings 3*a*"–3*c*", a plurality of spare wirings 3*d*" extend in parallel with the wirings 3*a*"–3*d*". The spare wirings 3*d*"are made of, for example, an alloy of Al—Si—Cu and are prepared with the same mask and at the same step as the wirings 3*a*"–3*c*".

Over the wirings 3*a*"–3*a*", there extend a third conductive layer such as a plurality of signal wirings 4*a*", power source wirings 4*b*" (Vcc) and 4*c*" (Vss), which extend in a (horizontal) direction to intersect the former at a right angle. These wirings 4*a*"–4*c*" are made of, for example, an alloy of Al—Si—Cu.

In the spare region shared with the wirings 4*a*–4*c*", a plurality of spare wirings 4*d*" extend in parallel with the wirings 4*a*"–4*d*". The spare wirings 4*d*" are also made of, for example, an alloy of Al—Si—Cu and are prepared with the same mask and at the same step as the wirings 4*a*"–4*c*".

The wirings 4*a*"–4*d* are overlaid by a not-shown fourth conductive layer which extends at a right angle with respect to the wirings 4*a*"–4*d*". The fourth conductive layer is made of, for example, as alloy of Al—Si—Cu to constitute power source wirings (Vcc and Vss) mainly.

Incidentally, FIG. 51D depicts no insulating film other than the field insulating film 2" so as to make the layout of the wirings 3*a*"–3*d*" and 4*a*"–4*d*" understandable.

Next, the logic correcting step of the present embodiment will be described in the following.

As shown is FIG. 51D, for example, the logic gates $G_1$ and $G_2$ are connected to each other through the signal wiring 3*a*. It is assumed that the result of a simulation (including a debug of Embodiment or the like) has revealed that the logic gate $G_3$ has to be connected between the logic gates $G_1$ and $G_2$.

In this case, as shown is FIG. 51E, the third-layer wiring 4*e*" connecting the logic gate $G_1$ and the signal wiring 3*a*" is cut at a point $K_1$ enclosed by a broken line. This cutting of the wiring 4*e*" is accomplished by using a focused ion beam.

As shown is FIG. 51F, more specifically, the wafer 1" is so placed on an X-Y table 5" of the focused ion beam apparatus that the point $K_1$ of the wiring 4*e*" comes just below as ion source 6". Then, the point $K_1$ is irradiated with as ion beam $I_B$ of gallium (Ga) ions, for example.

As shown is FIG. 51G a passivation film 7" and an interlayer insulating film 8" are etched by making use of the sputtering effect of the ion beam $I_B$ to expose the wiring 4e" to the outside, and this wiring 43" is further etched and cut. As a result, the logic gates $G_1$ and $G_2$ are electrically isolated.

Here will be described the sectional structure of FIG. 51G.

An insulating film 9" lying over the field insulating film 2" is made of, for example, silicon oxide ($SiO_2$) coated by the CVD. The insulating film 9" covers the polysilicon electrode which is connected with the emitter of the bipolar transistor.

A second insulating film 10" lying over the insulating film 9" is made of, for example, oxide silicon coated by the CVD and covers the first conductive layer which is connected with the base and collector of the bipolar transistor.

The insulating film 10 is overlaid by the second conductive layer (wiring 3a"), which in turn is overlaid by the third conductive layer (wiring 4e") extending at a right angle.

Between the wiring 3a" and the overlying wiring 4e", there is formed a first interlayer insulating film 11" which is made of PSG (Phospho Silicate Glass) coated by the CVD. Between the wiring 4e" and the overlying fourth conductive layer, moreover, there is formed the second interlayer insulating film 8" which is made of PSG coated by the CVD, for example.

Next, as shown is FIG. 51H, of the bipolar transistors constituting the logic gate $G_3$, for example, the layer lying over wirings 12a" and 12b" composed of the first conductive layer connected with the bases of two transistors $Q_1$ and $Q_2$ is etched to form through holes $Th_1$ and $Th_2$ extending to the wirings 12a" and 12b". Incidentally, letters E and C of the transistors $Q_1$ and $Q_2$ designate emitters and collectors thereof.

In order to forth the through-holes $Th_1$ and $Th_2$, the wirings 12a" and 12b" are irradiated just at a right angle with the ion beam $I_B$, which was used to cut the wiring 4e" of the logic gate $G_1$, to etch the passivation film 7", the interlayer insulating films 8" and 11" and the insulating film 10" thereby to expose the wirings 12a" and 12b" to the outside.

Next, as shown in FIG. 51I, the position $K_2$, as enclosed by broken line, over the spare wiring 3d" extending in the vicinity of the logic gate $G_3$ is irradiated with the ion beam $I_B$ to form a through-hole $Th_3$ extending to the spare wiring 3d". Likewise, the position $K_3$, as enclosed by broken line, over the spare wiring 4d" extending in the vicinity of the logic gate $G_3$ is irradiated with the ion beam $I_B$ to form a through-hole $Th_4$ extending to the spare tiring 4d". By a similar method, a through-hole $Th_5$ extending to the wiring 4f" is formed by irradiating the position $K_4$, which is enclosed by broken line and located over a wiring 4f" extending from the logic gate $G_3$, with the ion beam $I_B$, and a through-hole $Th_6$ extending to the spare wiring 4d" is formed by irradiating the position $K_5$, which is enclosed by broken line and located over the spare wiring 4d" extending in the vicinity of the logic gate $G_3$, with the ion beam $I_B$. By a similar method, a through-hole $Th_7$ extending to the wiring 4e" is formed by irradiating the position $K_6$, which is enclosed by broken line and located over a wiring 4e" extending from the logic gate $G_1$, with the ion beam $I_B$, and a through-hole $Th_8$ extending to the spare wiring 4d" is formed by irradiating the position $K_7$ which is enclosed by broken line and located over the spare wiring 4d" extending in the vicinity of the logic gate $G_1$, with the ion beam $I_b$. By a similar method, moreover, such a point $P_1$ of the intersections of the spare wiring 3d" and the spare wiring 4d" as is enclosed by broken line and such a point $P_2$ of the intersections of the wiring 3a" and the spare wiring 4d" as is enclosed by broken line are irradiated with the ion beam $I_B$ to form through-holes $Th_9$ and $Th_{10}$ extending to the underlying spare wiring 3d" and the wiring 3a".

Next, a conductive film 13" is selectively buried in the through-holes $Th_1$ and $Th_2$ thus formed.

in order to bury the conductive film 13", a laser CVD is used.

As shown in FIG. 51J, more specifically, a wafer 1" is so placed on an X-Y table 14"of a laser CVD that the through-hole $Th_1$, for example, is positioned just below a laser been source 15". After this, the through-hole $Th_1$ is irradiated with a laser beam $L_B$ of argon (Ar), for example, and the wafer 1" is supplied thereover with reactive gases, such as W $(CO_6)$ or Mo $(CO_6)$ through a supply pipe 16". Then, the internal temperature of the through-hole $Th_1$ rises to decompose the reactive gases so that the conductive film 13" of W or Mo is selectively buried into the through-hole $Th_1$, as shown in FIG. 51K. Here, FIG. 51K is a sectional view of the wafer 1" taken along line IX—IX of FIG. 51I.

Thus, the conductive film 13" is buried sequentially in the through-holes $Th_1$ $-Th_{10}$.

Next, conductive patterns 17a" and 17b", as shown in FIG. 51A are formed between the wiring 12a" connected with the base B of the transistor $Q_1$ and the spare wiring 4d" and between the wiring 12b" connected with the base B of the transistor $Q_2$ and the spare wiring 3d". The aforementioned CVD is used to form the conductive patterns 17a" and 17b".

As shown is FIG. 51J, more specifically, the wafer 1" is pieced on the X-Y table of the laser CVD apparatus and is positioned to bring the through-hole $Th_3$ over the wiring 3d" just below the laser beam source 15". Next, the surface of the wafer 1" is supplied with the reactive gases of the aforementioned composition, and the X-Y table 14" is moved leftward of FIG. 51B, while being irradiated with the laser beam $L_B$ focused to have a spot size of 1 μm. Then, a conductive pattern 18b" made of W or Mo and having a width of 2–3 μm is formed along the locus of movement on the surface of the passivation film 7" between the through hole $Th_3$ and the through-boles $Th_1$ and $Th_2$ of the wirings 12a" and 12b".

The reason for the conductive pattern 18b" to spread as wide as 2–3 μm even if the spot size of the laser beam $L_B$ is focused to 1 μm, will be described in the following. The thermal conduction of the passivation film 7" raises not only the temperature of the portion of the passivation film 7", where it is irradiated with the laser beam $L_B$, but also the temperature of the surrounding portions.

Next, after the wafer 1" has been positioned to bring the through-hole $Th_4$ of the wiring 4d" to just below the laser beam source 15", the X-Y table 14" is moved upward of FIG. 51C by the similar method. Then, a conductive pattern 18a" having a width of about 2–3 μm is selectively formed along the locus of movement between the through-hole $Th_4$ and the conductive pattern 18b". As a result, the logic gate $G_3$ is electrically connected with the wiring 3d" through the conductive pattern 18b" and with the wiring rd through the conductive pattern 18a".

In this state, however, the conductive pattern 18a" and the conductive pattern 18b " are short-circuited and have to be electrically isolated. For this isolation, the aforementioned focused ion beam is used.

More specifically, the wafer 1" is placed on the X-Y table 5" of the focused ion beam apparatus shown in FIG. 51F, and the X-Y table 5 is moved while having the conductive pattern 18$b$", for example, irradiated with the ion beam $I_B$ focused to have a spot size of 0.2 to 0.3 μm. Then, the conductive pattern 18$b$" is partially etched along the locus of, the X-Y table to have a shape of letter "L", for example, thereby to form two conductive pattern: 17$a$" and 17$b$" arranged close to each other, as shown in FIG. 51A. Incidentally, when the conductive pattern 18$b$" is etched with the ion beam $I_B$, the moving speed of the X-Y table 5" may be controlled so that the passivation film 7" lying under the conductive pattern 17$b$" may be etched so deep.

Finally, as shown in FIG. 51L, the aforementioned laser CVD is used to form a conductive pattern 19" of w or Mo selectively over the passivation film 7" between the through-hole $Th_5$ over the wiring 4$f$" extending from the logic gets $G_3$ and the through-hole $Th_6$ over the spare wiring 4$d$" extending in the vicinity of the logic gate $G_1$.

By the steps thus far described, as shown in FIG. 51M, the logic correcting step for connecting the logic gate $G_3$ between the logic gate $G_1$ and the logic gate $G_2$. is completed.

Thus, according to the present embodiment, the following effects can be attained:

(1) The wide conductive patterns 18$a$" and 18$b$" are formed by the laser CVD, and the two conductive patterns 17$a$" and 17$b$" arranged close to each other are then formed by etching the conductive pattern 18$b$" (or 18$a$") with the focused ion beam. As a result, the conductive patterns 17$a$" and 17$b$" finally obtained are not short-circuited to each other even if the conductive patterns 18$a$" and 18$b$" are formed by the laser CVD to have widths larger than necessary.

(2) Thanks to the item (1), the yield of the logic LSI is improved.

(3) Thanks to the item (1), the wiring pattern correction percentage is improved. Thus, the time period required for the mask correction can be shortened to promote the shortening the developing period of the logic LSI.

Although the invention conceived by us has been specifically described hereinbefore is connection with the embodiments thereof, it should not be limited to the, embodiments but can naturally be modified in various manners within the gist thereof.

In the embodiments, for example, the two conductive patterns arranged close to each other are formed by etching the wide conductive patterns with the focused ion beam, but three or more conductive patterns could be formed.

In the embodiments, moreover, the description has been made in case the logic corrections are accomplished by making use of the spare wirings, but the present invention can also be applied to the case in which the logic corrections are accomplished by making use of the spare gates, for example.

In the description thus far made, our invention has bean applied to the logic correcting technique providing the background thereof. However, the present invention should not be limited thereto but can be applied to the connection correcting technique of the wirings with a view to analyzing the malfunctions and correcting (debugging) the computer programs.

The effects to be obtained by the representative of the invention to be disclosed in the embodiments will be briefly described in the following:

According to this fourth aspect of the present invention, there is provided a method of manufacturing a semiconductor device, comprising the steps of: etching a passivation film of an integrated circuit formed over a wafer with a focused ion beam to expose a wiring to the outside at its portion to be cut away; cutting the wiring with the focused ion beam; selectively coating a wide conductive pattern between the wirings to be connected with a laser CVD; and etching said wide conductive pattern with said focused ion beam thereby to form a plurality of narrow conductive patterns. Thus, the plural conductive patterns can be effectively prevented from being short-circuited when they are arranged close to each other.

In the state of FIG. 51C, the step of separating into the two Mo jumper lines 17$a$" and 17$b$" by the cutting with the FIB, as shown is FIG. 51A, can be effectively executed at the stage 1283$b$" of cutting, anti-shortcircuit and most formation of FIG. 62B. As shown in FIGS. 54I($a$)–54I($d$) and FIG. 54M, more specifically, the processing efficiency and the reliability can be drastically improved by executing: the first step of boring fox connections; the second step of sputtering deposition of underlying barrier metal; the third step of burying and forming Mo jumper lines: the fourth step of self-alignment of unnecessary barrier metal: and the fifth step of cutting of Al interconnection wirings (of Embodiments 4, 8 and 9) and notching the ride power souses wirings for anti-shortcircuit (of Embodiments 2, 4, 7, 9 and 15–20) is the separating order of the Mo jumper lines with the FIB. Incidentally, these steps will be detailed in the descriptions of the following embodiments.

Embodiment 2 (General System Flow)

The general flow of a designing and developing system in the present invention rill be described with reference to FIG. 52, which is substantially similar to the general flow of the system described in Embodiment 2 in connection with the first aspect of the present invention.

Referring to the figure, numeral 201" designates the step of designing a large-sized computer or sap other information processing system or control system. The signal processing of the system is chiefly performed by semiconductor devices such as Si monolithic ICs or GaAs monolithic ICs (memory gate arrays). Numeral 202" designates the step of debugging the system, and numeral 203" designates the step of altering the design. The logic alterations, etc. of the semiconductor devices taking charge of the signal processing, etc. of the system are mode on the basis of the results of the debug. Numeral 204 designates the system assemblage step of assembling the altered semiconductor devices into the system. The above steps 201" to 204" shall be generally termed the "system development process".

Numeral 205" denotes the mask preparation step of preparing the manufacturing masks of the semiconductor devices on the basis of the system design, numeral 206" a wafer process for forming predetermined integrated circuits is a wafer by the use of the masks, and numeral 207" the bump formation step of forming solder bump electrodes on bonding pads which are provided on the parts of the wafer corresponding to pellets. By the way, instead of forming the bumps, pieces of bonding wire may well be directly connected to the bonding pads.

Numeral 208" denotes the wafer test step, at which electrical tests are conducted by bringing probes into direct touch with the solder bumps or the pads: numeral 209 the pelletizing step, at which the wafer having been tested is split into the chips (pellets): and numeral 210" the prober test step, at which the chip is electrically tested by a prober. A flow indicated by solid lines can be partly or wholly omitted.

Denoted at numeral 211 is the module assemblage step or sealing step of assembling the tented chip into a package.

The semiconductor device finished up here is supplied to the system debug step 202". Here, the steps 205"–211" shall be generically termed the "semiconductor device process".

Numeral 212" designates the chip stock step, at which, after the wafer has been split, some of the nondefective chips are kept in stock so as to make ready for the alteration of the specification of the system. At a wiring correction step, a chip subjected to the design alternation is taken out from among the stocked chips and is processed with a focused ion beam (hereinbelow, abbreviated to "FIB") or the like. The chip corrected here is tested by the method elucidated in Embodiment 1, whereupon it is packaged as the semiconductor device. As indicated by a broken line, this semiconductor device is supplied to the system assemblage.

On the other head, the flow may return to the debug step, as indicated by a broke line 220.

Incidentally, the specific description of the FIB process will be made is connection with the Example 4, etc.

Embodiment 3

This embodiment of the fourth aspect of the present invention is substantially similar to the third embodiment of the first aspect of the present invention, The present embodiment is the assemblage step (207" of FIG. 52) as one example of the process of the IC developing and fabricating system of the Embodiments 2 and 13. Here has been described the case in which the so-called "CCB technique" is used, but the present invention should not be limited thereto but can naturally be applied to the case using the TAB technique or the wire bonding technique.

Now, the whole construction and manufacturing process of as LSI (semiconductor device) is this embodiment will be described in the following.

FIG. 53A is a sectional view showing the essential portions of the bipolar LSI according to the embodiment of the present invention.

As shown in FIG. 53A, in the bipolar LSI according to this embodiment, a semiconductor chip (semiconductor substrate) 301" made of p-type silicon by way of example is provided is its front surface with a buried layer 302" of, for example, $n^+$-type and is overlaid with an epitaxial layer 303" of, for example, n-type silicon. A field insulator film, for example $SiO_2$ film 304" is provided at the predetermined pert of the epitaxial layer 303", thereby to effect the isolation among elements and isolation within each element. The field insulator film 304" is underlaid with a channel stopper region 305" of, for example, $p^+$-type. Besides, an intrinsic base region 306" of, for example, p-type and a graft base region 307" of, for example, p-type are provided in the part of the epitaxial layer 303 enclosed with the field insulator film 304", and en emitter region 308" of, for example, n-type is provided in the intrinsic base region 306". Thus, as n-p-n bipolar transistor is configured of the emitter region 308" the intrinsic base region 306", and a collector region which includes the epitaxial layer 303" and the buried layer 302" underlying the intrinsic base regions 306". In addition, numeral 309" indicates a collector take-out region of, for example, $n^+$-type which is connected with the buried layer 302". Numeral 310" indicates an insulator film, for example, $SiO_2$ film which is provided in continuation to the field insulator film 304". This insulator film 310" is provided with holes 310*a*", 310*b*" and 301*c*" respectively corresponding to the graft base region 307", emitter region 308" and collector take-out region 309". A base lead-out electrode 311" made of a polycrystalline silicon film is connected to the graft base region 307" through the hole 310*a*", while a polycrystalline silicon emitter electrode 312" is provided on the emitter region 308" through the bole 310*b*". Inci- dentally, numerals 313" and 314" denote insulator films, for example, $SiO_2$ films.

Characters 315*a*"–315*c*" designate first-layer wiring lines made of, for example, aluminum films. Of them, the wiring line 315*a*" is connected to the base lead-out electrode 311" through a hole 314*a*" provided in the insulator film 314", the wiring line 315*b*" to the polycrystalline silicon emitter electrode 312" through a similar hole 314*b*", and the wiring line 315*c*" to the collector take-out region 309" through a similar hole 314*c*" as well as the aforementioned hole 310*c*". In addition, numeral 316" indicates an inter-layer insulator film which is configured of, for example, an SiN film formed by plasma CVD, a spin-on-glass (SOG) film, and an SiO film formed by the plasma CVD. The inter-layer insulator film 316" is overlaid with second-layer wiring 317" which is made of, for example, an aluminum film. The wiring 317" is connected to the wiring 315*c*" via a through hole 316*a*" which is provided in the inter-layer insulator film 316". Incidentally, the through-hole 316*a*" has a stepped shape, thereby to enhance the step coverage of the wiring 317" in this through hole 316*a*". Numeral 318" indicates an inter-layer insulator film which is similar to the inter-layer insulator film 316". The inter-layer insulator film 318" is overlaid with third-layer wiring lines 319*a*"–319*c*" each of which is made of, for example, an aluminum film. Of them, the wiring line 319*a*" is connected to the wiring 317" via a through hole 318*a*" which is provided in the inter-layer insulator film 318". Further, numeral 320" indicates an inter-layer insulator film which is similar to each of the inter-layer insulator films 316" and 318". The inter-layer insulator film 320" is overlaid with four-layer wiring lines 321*a*"–321*c*" each of which is made of, for example, an aluminum film. Each of the wiring lines 321*a*"–321*c*" is constructed thicker than the wiring lines of the lower layers so as to be capable of causing a great current to flow therethrough, and it has a thickness of 2 μm by way of example. Besides, the width of a groove defined between the adjacent ones of these wiring lines 321*a*"–321*c*" is 2 μm by way of example. Accordingly, the aspect ratio (the depth of the groove/the width of the groove) of this groove is a large value of, for example, 1.

Designated at numeral 322" is a surface flattening insulator film made of, for example, an $SiO_2$ film. By way of example, the insulator film 322" is formed by the bias sputtering of $SiO_2$ or the combination of plasma CVD and sputter etching. Since the grooves between the wiring lines 321*a*"–321*c*" are completely filled up with the insulator film 322", the front surface of this insulator film 322" becomes substantially flat. As the insulator film 322", it is also possible to employ a silicate glass film, such as PSG (Phospho-Silicate Glass) film, BSG (Boro-Silicate Glass) film or BPSG (Boro-Phospho-Silicate Glass) film, which is formed by, for example, the combination of normal-pressure CVD and sputter etching. This insulator film 322" is overlaid with an SiN film 323" which is formed by, for example, plasma CVD. As is well known, the SiN film 323" has a resistance to moisture. In this case, the front surface of the insulator film 322" inclusive of the parts thereof corresponding to the grooves between the wiring lines 321*a*"–321*c*" is flat, so that the front surface of the SiN film 323" is also flat. In consequence, the thickness and quality of the SiN film 323" are uniform. Accordingly, the moisture resistance of a protective film 325" to be described below can be enhanced over the prior art. Thus, a non-airtight sealing type package can be employed as the package of the LSI. The SiN film 323" is overlaid with an SiO film 324" which is formed by, for example, plasma CVD. The protective film 325" for protecting the chip is configured of the insulator film 322", the SiN film 323" and the SiO film 324". In this case, the SiO film 324" plays the roles of ensuring the adhesion of a chromium (Cr) film 326", to be mentioned below, to the protective film 325" and preventing the SiN film 323" from being etched at the dry etching of this Cr film 326".

The protective film 325" is formed with a hole 325*a*", through which the Cr film 326", for example, provided on the wiring 321*b*". The Cr film 326" is over-laid with a solder bump 328" of lead (Pb)—tin (Sn) alloy system through, for example, an intermetallic compound layer 327" of copper (Cu)—Sn alloy system.

FIG. 53B is a sectional view showing a pin grid array (PGA) type package with which the bipolar LSI illustrated in FIG. 53A is sealed.

As shown in FIG. 53B, in the pin grid array type package, the semiconductor chip 301" is connected onto a chip carrier 329" made of, for example, mullite ($3Al_2O_3.2SiO_2$) by the use of the solder bumps 328". In addition, numeral 330" designates a cap which is made of, for example, silicon carbide (SiC). The rear surface of the semiconductor chip 301" (the surface in which no element is formed) is held in contact with the cap 330" through a brazing material, for example, solder 331", whereby heat can be effectively radiated from the semiconductor chip 301" to this cap 330". By the way, in case of installing the package on a module board or the like, radiation fins (not shown) are held in contact with the cap 330", whereby the radiation of heat from the package is effectively performed. Besides, numeral 332" indicates a resin, for example, epoxy resin, which which the semiconductor chip 301" is sealed. That is, the package is a non-airtight sealing type package. Since, in this case, the moisture resistance of the protective film 325" is excellent as already stated, the non-airtight sealing type package can be employed in this manner, whereby curtailment in the cost of the package can be attained. Numeral 333" designates input/output pins, which are connected to the solder bumps 328" by multilayer wiring (not shown) laid in the chip carrier 329".

Now, a method of manufacturing the bipolar LSI shown in FIG. 53A will be described. Steps till the formation of the inter-layer insulator film 320" shall be omitted from description.

Figure 53C:
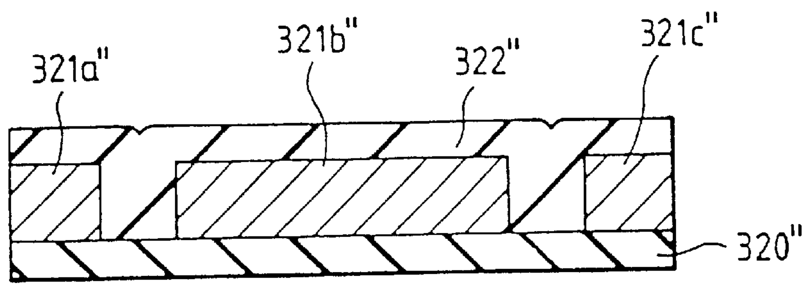

As shown in FIG. 53C, wiring lines 321*a*"–321*c*" are formed on the inter-layer insulator film 320", whereupon an insulator film, for example, $SiO_2$ film 322" is formed by, for example, the bias sputtering of $SiO_2$ or the combination of plasma CVD and sputter etching. As already stated, the front surface of the insulator film 322" can be made substantially flat. Here, it is assumed by way of example that the depth and width of each groove defined between the adjacent ones of the wiring lines 321*a*"–321*c*" are 2 $\mu$m, respectively. Then, in the case where the insulator film 322" is formed using the bias sputtering of $SiO_2$, it may have a thickness of, for example, about 3.5 $\mu$m in order to present the substantially flat surface. On the other hand, in the case where the insulator film 322" is formed by the combination of plasma CVD and sputter etching, it may have a thickness of, for example, about 1.5 $\mu$m in order to present the substantially flat surface.

Figure 53D:
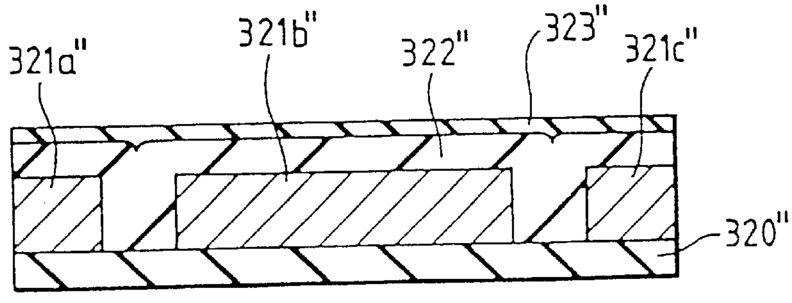

Subsequently, as shown in FIG. 53D, an SiN film 323" which is 5,000 Å thick by way of example is formed on the insulator film 322" by, for example, plasma CVD.

Figure 53E:
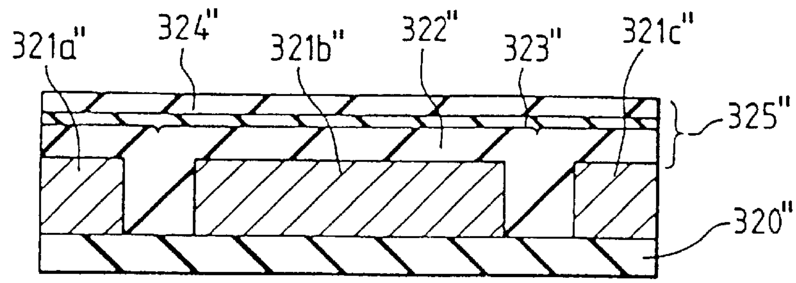

Subsequently, as shown in FIG. 53E, an $SiO_2$ film 324" which is 1 $\mu$m thick by way of example is formed on the SiN film 323" by, for example, plasma CVD. In this way, a protective film 325" of superior moisture resistance is formed.

Figure 53F:
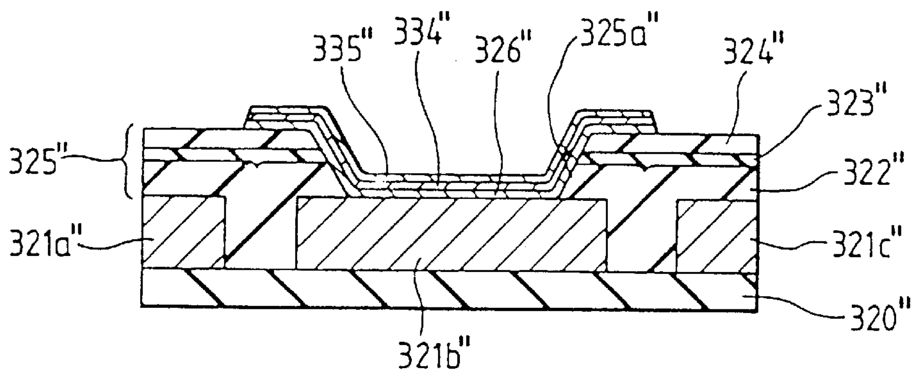

Next, as shown in FIG. 53F, the predetermined part of the protective film 325" is etched and removed, thereby to form a hole 325*a*" to which the front surface of the wiring line 321*b*" is exposed. Under this state, the whole front surface of the resultant structure is overlaid with a Cr film 326" having a thickness of, for example, 2000 Å, a Cu film 334" having a thickness of, for example, 500 Å and a gold (Au) film 335" having a thickness of, for example, 1,000 Å, in succession by, for example, evaporation. Thereafter, the Au film 335", Cu film 334" and Cr film 326" are patterned into predetermined shapes by etching. In this case, the Au film 335" serves to prevent the oxidation of the Cu film 334", and this Cu film 334" serves to secure the wettability of a solder bump 328" with its underlying layer. In addition, the etching operations of the Au film 335" and the Cu film 334" are carried out with, for example, wet etching, while the etching operation of the Cr film 326" is carried out with, for example, dry etching which employs a gaseous mixture consisting of $CF_4$ and $O_2$. As already state, during the dry etching, the SiO film 324" functions as an etching stopper, so that the underlying SiN film 323" can be prevented from being etched. Incidentally, the Au film 335", Cu film 334" and Cr film 326" are usually called the “BLM (Ball Limiting Metalization)”.

Figure 53G:
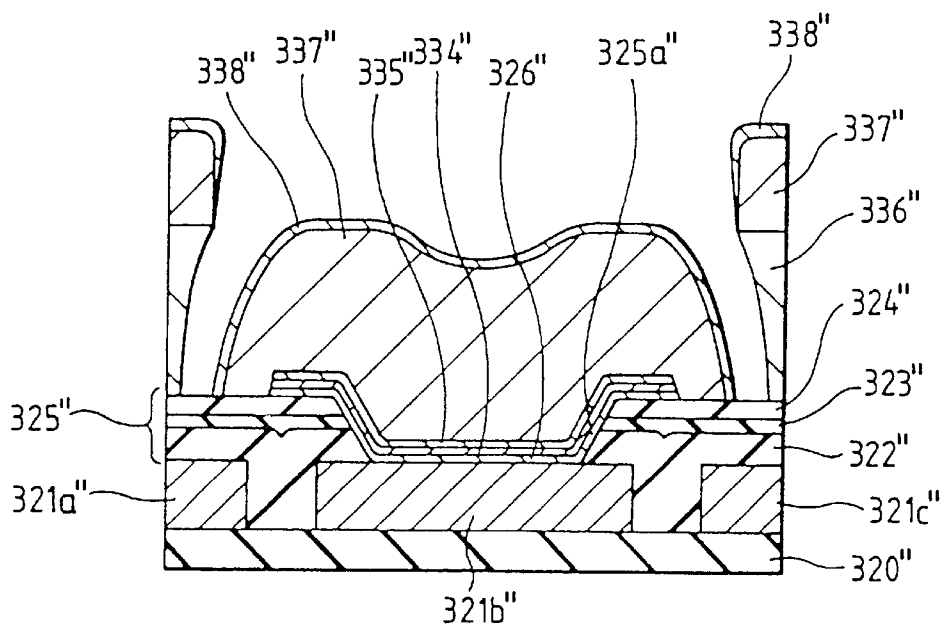

Next, as shown in FIG. 53G, a resist pattern 336" of predetermined shape is formed on the SiO film 324", whereupon the whole front surface of the resultant structure is formed with a Pb film 337" and an Sn film 338" in succession by, for example, evaporation. Thus, the Au film 335", Cu film 334" and Cr film 326" are covered with the Pb film 337" and Sn film 338". The thickness of the Pb film 337" and Sn film 338" are selected so that the Sn content of the solder bump 328" to be formed later may become a predetermined value.

Subsequently, the resist pattern 336" is removed along with the parts of the Pb film 337" and Sn film 338" formed thereon (by the so-called “lift-off”), whereupon the resultant structure is annealed at a predetermined temperature. Thus, the Pb film 337" and the Sn film 338" are alloyed, and the solder bump 328" of Pb—Sn alloy system which is substantially global is formed as shown in FIG. 53A. In the alloying process, Sn in the Sn film 338" is alloyed with Cu in the Cu film 334", whereby a layer of intermetallic compound of Cu—Sn system 327" is formed between the solder bump 328" and the Cr film 326". In actuality, Au from the Au film 335 is also contained in the solder bump 328".

Embodiment 4

This embodiment 4 is substantially similar to embodiment 4 of the first aspect of the present invention.

The present embodiment corresponds to the fundamental technique and device in the FIB correcting steps or the element process of the embodiment 2 or 3. This embodiment is naturally premised on the use of the working apparatus, the positioning technique, the trial digging, the information processing system of the embodiments 10 to 12.

Now, the inner construction of a chip of VLSI (Very Large Scale Integration) which is an example of an object to be handled in the present invention will be described.

The chip referred to here is used as the CPU or any other logical processing unit and the memory device of a main frame computer (ultrahigh speed computer). Accordingly, it needs to have a very large number of input/output terminals.

In general, it is installed on or connected to an external package or circuit board by wire bonding when it has up to about 200 pins, and by TAB (Tape Automated Bonding), CCB (Controlled-collapse Solder Bumps) or the like when it has more pins.

The chip is in the shape of a square or oblong plate which is 10 mm–20 mm long. The principal surface of the chip for forming circuit elements is formed with ECL (Emitter-Coupled Logic) circuits and other required CMOS (Complementary MOS) circuits, and the internal chip construction corresponding to a requested specification is selected according to a system (designing and manufacturing system) similar to that of a so-called gate array.

FIG. 54A is a top model diagram showing the layout of second–fourth layers of Al (aluminum) wiring on the chip. Referring to the figure, numeral 421" designates the fourth-layer metal wiring lines which shall be termed "Al-4" (or "ER-4") and which are laid in a large number so as to chiefly extend substantially over the full vertical length of the chip in the direction of a Y-axis. Numeral 419" designates the third-layer metal wiring lines which shall be termed "Al-3" (or "WR-3") and which chiefly extend in the direction of an X-axis. Numeral 417" designates the second-layer metal wiring lines which shall be termed "Al-2" (or "WR-2") and which chiefly extend in the Y-axial direction. Although the Al wiring lines of each of the layers are shown only partly, they are laid on the entire upper surface of the chip as may be needed. Each of characters 441_a_"–441_g_" denotes a power source wiring line or a reference voltage wiring line having a width of 50 to 200 μm (in the case of the ECL, $E_{ESL}$ . . . −4 V, $V_{EE}$ . . . −3 V, $V_{TT}$ . . . −2 V, and $V_{CC1}$, $V_{CC2}$ and $V_{CC3}$ . . . 0 V). Characters 444Y" denote fourth-layer space wiring lines termed "AlS-4", each of which has a width of 10 μm and which are laid so as to extend substantially over the full vertical length of the chip 401" on the upper surface thereof here. Characters 443_a_"–4443_h_" denote the third-layer wiring lines Al-3 which have pitches of 5 μm and widths of 3.5 μm, and which are automatically laid out as required by interconnections. Characters 443X" represents a third-layer space wiring line termed "AlS-3", which is laid every fifth pitch and which extend substantially over the full lateral length of the chip 401" on the upper surface thereof. The floating spare wiring lines AlS-3 and AlS-4 can cover substantially the whole area of the chip 401". Characters 442_a_"–442_f_" denote the second-layer wiring lines Al-2 which have pitches of 5 um and widths of 3.5 μm, and which are automatically laid out as required by the interconnections in association with the third layer wiring lines Al-3.

FIG. 54B is a chip layout diagram concerning a wiring correction process, supporting tools, etc. Referring to the figure, characters 445_a_" and 445_b_" denote origin detecting patterns which serve to detect the angle θ between the origin and reference axis of a pattern on a chip 401", and which are formed by the fourth-layer wiring Al-4. Numeral 446" designates a trial digging region. Characters 447_a_" denote a processing reference mark, namely, a metal pattern for detecting an inter-layer deviation, which is formed by the third-layer wiring Al-3, which characters 447" denote a similar metal pattern for detecting an inter-layer deviation, which is formed by the fourth-layer wiring Al-4. Characters 448_a_"–448_d_" denote spare gate cells, respectively. Designated at numeral 449" is a region where marks or patterns are formed using an FIB or by laser selective CVD in order to record the wiring correction history, specification, product name, type etc. of the chip.

FIG. 54C is a plan view showing only antenna wiring formed by the third-layer wiring Al-3, in the plan layout of the spare gate cell. In the figure, characters 451_a_"–451_j_" denote the antenna wiring lines of the spare gate cell 448" as termed "AlA-3", respectively.

FIG. 54D is a model circuit diagram of the built-in elements and gates of the spare gate cell 448". In the figure, characters $SR_1$ and $SR_2$ denote spare resistors, and characters $SG_1$ and $SG_2$ denote the ECL spare gates.

Now, several patterns in the wiring correction method of the present invention will be described (examples for the ECL circuit will be explained below).

FIG. 54E is a model circuit diagram showing a correctional pattern called "input low clamp". Referring to the figure, characters $G_1$ denote a wired gate which is already wired as one of the gates of the VLSI, and which has input wiring lines $I_1$–$I_3$ and an output wiring line $O_1$. Characters $C_1$ denote that part of the input wiring line $I_1$ which has been cut with the FIB.

FIG. 54F is a model circuit diagram showing a correctional pattern called "input high clamp". Referring to the figure, characters $G_2$ and $G_3$ denote wired gates which have input wiring lines $I_4$–$I_8$ and output wiring lines $O_2$ and $O_3$. A voltage $V_{CC}$ is one of the voltages $V_{CC1}$–$V_{CC3}$, and it is the voltage $V_{CC2}$ in the case of the internal gate. Characters $C_2$ denote a piece of jumper wire which is formed by laser CVD or vapor selective CVD employing an FIB.

FIG. 54G is a mode circuit diagram showing a correctional pattern called "reverse output use". Referring to the figure, characters $G_4$ and $G_5$ denote wired denote wired gates, and letters SG denote spare gates (corresponding to those $SG_1$ and $SG_2$ in FIG. 54D) included in the spare gate cell 448" which is one of those 448_a_"–448_d_" in FIG. 54B. Characters $I_9$–$I_{14}$ and $I_{24}$, $I_{25}$ denote the input wiring lines of the gates $G_4$, $G_5$ and SG, and characters $O_4$ and $O_5$ denote the output wiring lines of the respective gates $G_4$ and $G_5$. Characters $C_3$ and $C_4$ denote pieces of correctional jumper wire formed by vapor selective laser CVD or the like similar to the above.

FIG. 54H is a model circuit diagram of a correctional pattern called "spare gate addition". Referring to the figure, characters $G_6$–$G_8$ denote wired gates, and letters SG denote spate gates in the spare gate cell 448" similarly to the foregoing. Characters $I_{15}$–$I_{23}$ denote the input wiring lines of the gates $G_6$–$G_8$ and SG, and characters $O_6$ denote the output wiring line of the gate $G_7$. Correctional wiring lines $C_5$–$C_7$ are made of Mo (molybdenum) or the like, and are formed by laser CVD or the like.

Next, the process of this correctional system will be described in the following.

In developing a large-sized system, for example, main frame computer, several hundred sorts of logic LSIs are simultaneously developed, and the system is debugged and adjusted by the use of the logic LSIs. Besides, in the presence of any logical defect or any point of alteration, each LSI must be remade promptly. In the present invention, therefore, the LSI articles formed with the CCB electrodes (corresponding to FIG. 53A) and diced into the chip states are kept in stock, and they are subjected to corrections as indicated by the aforementioned correctional patterns and the preceding embodiments, whereby the LSI can be completely remade in 5–30 hours.

Here, the wiring corrections are possible, not only in the chip state, but also in the wafer state. In the wafer state, alignment etc. are easier, whereas a turnaround time expended in correcting and remaking the LSI becomes longer. Accordingly, the wafer corrections are also possible in field where such a demerit is allowed. In, for example, WSI (Wafer Scale Integration), the demerit is avoided, and hence, the wafer corrections are useful.

Regarding the corrections in the chip state, the wiring can be corrected, not only in the state of the chip per se, but also in the state in which the chip is die-bonded to a package base or in the state in which the wire bonding of the chip has been completed. In this case, the turnaround time can be shortened more. This also holds true of the case of applying the TAB technique.

As stated above, the spare chips each of which has been split in the state of FIG. 53A by way of example are kept in stock for each sort of products, and they are corrected in correspondence with the results of the debug.

First, the trial digging region 446" in FIG. 54B is dug with an FIB by way of trial, and the detection data of the digging is stored. Further, the misregistration between the wiring layers Al-3 and Al-4 is detected using the inter-layer deviation detecting patterns 447*a*" and 447*b*" in the same figure, and the data of the detection is stored. Subsequently, the operations or calculations or bringing designed pattern data on the chip 401" and the origins and axes of actual patterns into agreement are executed using the origin and θ detecting patterns 445*a*" and 445*b*" in the same figure. In accordance with the operations or calculations, the following corrections as shown in FIGS. 54J–54P are made:

FIG. 54J is an enlarged top view of the correctional part of the principal surface of the chip 401 corresponding to FIGS. 54A and 54B. In FIG. 54J, numerals 441" designate the broad Al-4 power source wiring (including the reference voltage wiring) lines, respectively. Characters 443X" denote the spare wiring line AlS-3 extending in the X-axial direction and formed by the third-layer wiring Al-3 (otherwise, this spare wiring line may well be replaced with one of the third-layer wiring lines Al-3 coupled with any element). Characters 444Y" denote the spare wiring line AlS-4 extending in the Y-axial direction and formed by the fourth-layer Al wiring. Numeral 456" designates an Mo (molybdenum) layer which is formed by laser CVD in a vertical hole provided by an FIB.

FIG. 54K is a sectional view taken along X—X in FIG. 54J. Referring to FIG. 54K, numeral 418" designates a third-layer inerlayer insulating film IL-3. Numeral 420" designates a fourth-layer interlayer insulating film IL-4. Numeral 441" designates the power source wiring line. Numeral 425" designates a final passivation film, i.e., a top protective film. Characters 444Y" designate the fourth-layer spare wiring line. Numeral 453" designate an underlying Cr (chromium) film. Numeral 454" designates the laser CVD layer of Mo.

FIG. 54L is an enlarged plan view of a part subjected to another correcting technique. Only points different from the correction in FIGS. 54J and 54K will be described below. Referring to FIG. 54L, numeral 459" designates a U-shaped notch (formed by an FIB) which serves to prevent an Mo jumper wiring line and the power source wiring line 441" from being short-circuited. Further, numerals 457" and 458" denote Mo layers with which vertical holes formed by an FIB are filled up. Numeral 460" denotes the Mo jumper wiring line which is formed simultaneously with the Mo layers 457" and 458".

FIG. 54M is a sectional view taken along X—X in FIG. 54L, and various characters shall not be repeatedly explained as they have already been described. This technique is effective particularly in a case where the spare wiring line 443X" does not extend to directly under the spare wiring line 444Y", a case where the spare wiring line 443X" is replaced with the ordinary wiring line Al-3, and so forth.

On this occasion, the molybdenum jumper wire 460" is formed and is used as a mask for sputtering and removing the entire unnencessary parts of the underlying Cr film, whereupon the short-circuiting preventive notch 459" is formed by the use of the FIB. Then, a favorable result is obtained without leaving the Cr film in the notch 459". That is, after the completion of a step in FIG. 54I(*d*) to be referred to later, the short-circuiting preventive notch 459" is formed by milling. More specifically, contact holes are previously formed by the FIB, the underlying Cr film is thereafter deposited, the holes are subsequently filled up so as to selectively form the jumper wire by the laser CVD, the unnecessary parts of the Cr film are removed using the jumper wire as the mask, and the notching operation is thereafter carried out.

FIGS. 54N–54P are a plan view, an enlarged view of essential portions and a sectional view taken along X—X in FIG. 54O, respectively, showing another correctional technique, especially an example which employs the spare gates. Referring to the figures, numeral 448" designates the spare gate cell, and characters 451*a*"–451*j*" denote the antenna wiring lines which are formed by the third-layer wiring Al-3 and which are respectively connected through the second-layer and first-layer wiring lines Al-2 and Al-1 to any terminals of the elements $SG_1$, $SG_2$, $SR_1$ and $SR_2$ in FIG. 54D. Further, numerals 441" designate the broad power source wiring lines formed by the fourth-layer wiring Al-4, respectively. Characters 444Y" denote the spare wiring line AlS-4, and characters 443X" denote the spare wiring line AlS-3. Numeral 461" designates a part to be corrected. Besides, numerals 462" and 463" designate Mo (molybdenum) layers with which vertical holes formed by an FIB are filled up by laser CVD, and numeral 464" designates an Mo jumper wiring line which is formed in continuation to the Mo layers 462" and 463" by laser scanning.

There will now be described a process for providing a hole by an FIB and forming a jumper wiring line by laser CVD.

FIGS. 54I(*a*)–54I(*d*) are sectional views of essential portions showing the flow of the process. As shown in FIG. 54I(*a*), the coordinates of an object to be corrected are determined on the basis of data stored beforehand, and a hole 452" is formed using an FIB (with the internal pressure of a processing chamber held at $1\times10^{-5}$ Pa). Subsequently, as shown in FIG. 54I(*b*), the exposed surfaces of an Al wiring line 421" and a final passivation film 425" are subjected to sputter etching in an Ar (argon) atmosphere (under 1 Pa), whereupon Cr (chromium) is deposited on the whole surface of the resultant structure to a thickness of about 100 Å by sputtering, thereby to form an underlying Cr film 453". Subsequently, as shown in FIG. 54I(*c*), a correctional wiring line of Mo (molybdenum) 454" having a thickness of about 0.3–1 $\mu$m and a width of about 3–15 $\mu$m is formed in the sublimation-phase atmosphere (gasenous phase) of molybdenum carbonyl ($Mo(CO)_6$) under about 10 Pa (by way of example, under the condition that a high-power Ar laser of continuous oscillation is operated at a laser output of 200 mW and a laser scanning rate of 1 mm/second). Thereafter, as shown in FIG. 54I(*d*), the unnecessary part 455" of the Cr film 453" is removed by sputtering in an Ar atmosphere and using the wiring line 454" as a mask.

As described above, in executing the wiring corrections of the correctional patterns in FIGS. 54E–54H, the techniques illustrated in FIGS. 54J–54P are combined with one another, whereby the wiring lines on the chip after the completion of the final passivation are corrected. After the end of the corrections or substantially simultaneously therewith, the correctional data etc. are marked at the position 449" in FIG. 54B by, for example, the deposition of a metal film based on laser CVD (the marking is simultaneously effected in the correcting apparatus) or an FIB or cutting away the wiring layers Al-3 and Al-4 and the Mo film. For the marking, it is possible to use letters, numerals and suitable characters and also various recognizing codes for computers, including bar codes etc. Besides, in a case where complicated wiring of high density is formed in the region 449", a diffraction grating pattern by cutting away the wiring layer Al-4 with a laser or an FIB or a code based on a similar pattern formed by Mo laser CVD if effective.

Further, a modification of the spare cell will be described. FIG. 54Q is a layout diagram of spare gate (or spare flips-flops which shall be abbreviated to "spare FFs" below) cells being the modification of the spare gate cells in FIG. 54B. FIG. 54R is a layout diagram of the practicable wiring of the spare gate cell, and FIG. 54S is a model circuit diagram of elements in the spare gate cell. Referring to these figures, characters 448*a*"–448*d*" denote the spare gate cells, and characters 471*a*"–471*d*" denote spare FFs, namely, spare latches. Numeral 401" designates an Si (silicon) semiconductor chip. Vertical broken lines (single-line characters) indicate spare wiring lines 444Y" formed by fourth-layer wiring Al-4, and stripe regions 441*a*"–441*d*" enclosed with broken lines are broad Al power source wiring lines by the fourth-layer wiring Al-4, respectively. Circles with, for example, numeral 481" affixed thereto denote through-holes I provided between wiring layers Al-1 and Al-2, while squares with, for example, numeral 482" affixed thereto denote through-holes II provided between wiring layers Al-2 and Al-3. Vertical solid lines with, for example, numeral 483" affixed thereto indicate interconnection wiring lines formed by the second-layer wiring Al-2 in order to couple the through-holes I and II, while lateral solid lines with, for example, numeral 451" affixed thereto denote antenna wiring lines formed by the third-layer wiring Al-3 so as to extend from the through holes II. The numerals of the through-holes I correspond to those of terminals in FIG. 54S. Incidentally, since each of the spare latch cells has substantially the same wiring layout as described above, the detailed description thereof shall be omitted.

Thus, the latches, gates, resistors etc. can be utilized as required without an operation for the prevention of short-circuiting ascribable to notching. That is, the intersection point between any of the spare wiring lines 444Y" and the antenna of the element of the spare cell desired to be led out is provided with a hole by an FIB, whereby a desired spare device can be readily raised up to the level of the fourth-layer wiring Al-4.

Embodiment 5

This embodiment 3 is substantially similar to the description in connection with embodiment 5 of the first aspect of the present invention.

Like the foregoing embodiments, this embodiment presents one technique for correcting the FIB wiring as the element process of the embodiment 2 or 13.

Hence, the specific method and procedures of forming the Mo jumper wiring lines resort to the embodiments 4 and 9 or their modifications.

There will be described the technique for intersecting the jumper wiring lines (Mo wiring lines) as is used in the wiring correction process.

FIG. 55A is a top view showing the intersection of jumper wiring lines, while FIG. 55B is a schematic sectional view taken along A—A of FIG. 55A. Referring to the figures, numerals 541" designate broad power source Al wiring lines (fourth-layer Al) extending in the direction of a Y-axis. Characters 544Y" denote a spare wiring line (fourth-layer Al), and characters 559*a*" and 559*b*" denote notches which are formed by the use of an FIB and which serve to isolate one part of the spare wiring line 544Y" from the other parts. Numeral 560" designates a first Mo wiring line which runs in the direction of an X-axis, and numerals 561" to 562" designate second Mo wiring lines which run in the Y-axis direction and which are to intersect the first Mo wiring line 560". Numeral 520" designates an inter-layer insulator film interposed between the third-layer Al wiring and the fourth-layer Al wiring. Numeral 525" designates a final passivation film. Numeral 553" designates an underlying Cr layer for the Mo wiring. Through-holes 557" and 558" serve to connect the respective second Mo wiring lines 561" and 562" with the fourth-layer spare Al wiring line 544Y".

In this manner, when the jumper lines are to be intersected each other on the final passivation film, the jumper lines extending in the Y-axial direction are crossed-under through the fourth-layer spare wiring line. In this case, when a floating spare wiring line of suitable length is existent, it may well be used as it is. Moreover, in such a case where the spare wiring line is unnecessarily long or where it is to be utilized for any other purpose, the notches or notch are/is formed on both or one of the sides of the spare wiring line as shown in FIG. 5A by the process explained before.

Embodiment 6

This embodiment 6 is substantially similar to the sixth embodiment of the first aspect of the present invention.

The present embodiment concerns a device for the Al wiring layout as the element process of the IC developing and manufacturing process of the embodiment 2 or 13. The present embodiment is a modification of FIGS. 54A and 54B and will be utilized in all other embodiments.

This embodiment concerns a modification of the spare wiring layout illustrated before, for use in FIB and laser CVD wiring corrections.

FIG. 56 is a top view of a semiconductor chip in the present invention, schematically showing only fourth-layer spare wiring lines 644" and third-layer spare wiring lines 643". In the figure, fourth-layer Al power source wiring lines which run in parallel with the fourth-layer Al spare wiring lines 644" are omitted as they have been illustrated in the preceding embodiments.

In this embodiment, the chip 601" is divided in four, and the spare wiring lines are laid in each division so as to extend substantially over the full lateral and vertical length of the corresponding sion. Thus, stray capacitances are reduced, and the utility of the spare wiring is enhanced. That is, some or all of notches for isolation are dispensed with. Incidentally, the details of these wiring lines have been explained in the foregoing embodiments.

The power source wiring lines (fourth-layer Al) are extended substantially over the full length of the chip without being divided. One spare wiring line (fourth-layer Al) may be laid between the adjacent ones of all the power source wiring lines, or may well be laid every third-fifth power source wiring line as is required. Besides, the way of dividing the spare wiring lines is not restricted to the division by two, but spare wiring lines extended over the full lengths of the chip, divided by two and divided by three may well be combined.

Embodiment 7

This embodiment is substantially similar to the seventh embodiment of the first aspect of the present invention.

The present embodiment concerns the details or modification of the Al notching step as the lower-rank element process of the FIB correcting process in the total system of the embodiment 2 or 13.

This technique is used for forming the notched groove in the broad Al wiring of the embodiments 4 and 9 and so forth, as designated at 459" in FIG. 54L.

There will be described an FIB processing technique which is applied to the connection between an Al wiring line of any lower layer, for example, the third layer and a jumper line while preventing short-circuiting ascribable to the notching of a board power source wiring line as described before. Hereinbelow, this technique shall be called "pre-milling".

As explained in the foregoing embodiments, in a case where the third-layer Al wiring line directly under the fourth layer is to be led out onto the fourth-layer broad power source wiring line by the Mo jumper line (formed by the combination of the provision of holes by an FIB and the deposition of Mo by laser CVD), a notch needs to be provided around the connecting through hole lest the Mo wiring line and the fourth-layer Al wiring line should short-circuit in the through hole. Since that upper surface of the chip which is not flat is processed for forming the notch, the technique to be described below is required. Now, the technique will be concretely explained by taking the layout as an example.

FIG. 57A is a top view of a chip showing a notch forming region. Referring to the figure, numerals 741" designate fourth-layer Al broad power source wiring lines, between which a fourth-layer Al spare wiring line 744Y" is laid. Symbol 759*a*" denotes a pre-milling region, and symbol 759*b*" denotes a main milling region.

FIGS. 57B–57E are sectional views of part A—A showing a process flow for forming a flattened notch. Referring to these figures, numeral 741" designates the part of the fourth-layer power source wiring line around a region where a through hole is to be formed. Designated at numeral 725" is a final passivation and inter-layer insulation film. A third-layer Al wiring line 743X" passes directly under the notch. An inter-layer insulator film 718" is interposed between third-layer and second-layer Al wiring lines. As stated before, characters 759*a*" denote the pre-milling region, and characters 759*b*" denote the main milling region.

The process will be described on the basis of these figures. In order to form the notch in a part corresponding to the main milling region, the pre-milling region 759*a*" is first milled in correspondence with the thickness of the underlying Al wiring line 741" as shown in FIG. 57C, by scanning an FIB. Subsequently, the whole area of the main milling region 759*b*" is repeatedly scanned by the FIB. Thus, owing to spontaneous flattening based on the variation (chiefly in angle) of a topographical structure, the notch which is flat over its full length is formed as shown in FIG. 57E.

In this way, it is possible to prevent the underlying Al wiring (mainly, the third layer) from being exposed or cut carelessly.

Here will be described a practicable scanning method for the milling FIB. FIG. 57F is a top view of a scanning region concretely showing the situation of the scanning of the FIB for processing the notch 759" (regions 759*a*" and 759*b*").

In the figure, arrows 762" in solid lines indicate the sequence of raster scans. In this regard, since an ordinary notch is about 2 μm wide, it can be formed in such a way that the scans are repeated about 10–20 times along a single path (with a beam having a diameter of 2 um) including a return path 763" (numeral 764" designates a start point), thereby to dig the insulator film 725" about 6 μm.

Embodiment 8

This embodiment 8 is substantially similar to the eighth embodiment of the first aspect of the present invention.

The present embodiment corresponds to the detail or modification of the mutual wiring and cutting step of the lower element process like the embodiment 7. This cutting is specifically the "cutting" described with reference to FIG. 59A.

There will be described a technique according to which, in a process for correcting wiring with an FIB, a third-layer Al interconnection wiring line directly under a fourth-layer broad Al power source wiring line is cut without short-circuiting the upper and lower wiring lines or without exposing or cutting the lower wiring line undesirably. Incidentally, since the structure, materials, specification, intended uses, etc. of a device concerned are the same as in the foregoing, they shall not be repeated here.

By way of example, let's consider a case where an interconnection wiring line 819" of third-layer Al wiring Al-3 under a broad wiring line (power source) 841" of fourth-layer Al wiring Al-4 as illustrated in FIG. 58B is cut by the use of an FIB. In this case, in order to prevent short-circuiting ascribable to a film redeposited on a milled wall, two stages of milling are carried out as indicated by a broken line and a dot-and-dash line in the figure. Even with this measure, however, the parts of the fourth-layer wiring Al-4 remaining in stage parts 891" as shown in FIG. 58D might short-circuit with the part of the third-layer wiring Al-3 exposed to the front of the chip of the device (the exposed part is not shown), through the undeposited metal 892" at the front surface of a lower hole, depending upon the undulation or nonuniform thickness of the Al wiring or the like. The technique to be described below is effective for preventing this drawback.

FIGS. 58A, 58C and 58E are sectional flow diagrams showing the process for cutting the third-layer Al interconnection wiring line. FIG. 58F is a top view of the chip showing a processing region in the cutting process. Referring to these figures, numeral 825" designates a final passivation film, under which the fourth-layer broad Al power source wiring line 841" runs in the direction of a Y-axis. Numeral 820" designates a fourth inter-layer Al interconnection wiring line 819" to be cut runs in the direction of an X-axis by way of example. Numeral 818" designates a third inter-layer insulator film. Numeral 817" designates a second-layer Al wiring line. Numeral 816" designates a second inter-layer insulator film. Characters 860*a*" denote peripheral milling parts in the operation of digging the upper surface of the chip into the shape of a table-land (hereinbelow, termed "angular milling") at the first step of the two-stage milling, while characters 860*b*" denote a main milling part in the angular milling. Designated at numeral 859" is a second-step milling region which corresponds to the second step of the two-stage milling process for cutting the lower-layer Al.

In FIG. 58G, characters 860*bx*" denote an FIB scanning region which corresponds to the main milling region 860*b*", while in FIG. 58H, characters 860*ax*" denote FIB scanning regions which correspond to the peripheral milling regions 860*a*". In raster scan paths indicated by arrows, solid-line parts signify that the amount of ion doping (dose) is a predetermined uniform value. On the other hand, broken-line parts signify that the amount of doping is "0" (null). The operation of smearing up the desired region with the beam one time in this manner shall hereinafter be called "one frame".

Referring not to these figures, the milling process will be elucidated.

When, as indicated by a broken line 860*b*" in FIG. 58A, the bottom of the milled hole is so shaped that the difference between the levels of the tableland part and peripheral flatland parts of the hole is set sufficiently great, the proportions of the fourth-layer wiring Al-4 to remain on the stage parts can be made small. Therefore, the peripheral scans as shown in FIG. 58H and the overall scans as shown in FIG. 58G are repeated 10–20 frames at a ratio of 1:5 or so. Then, the chip surface can be processed into a shape as shown in FIG. 58C, at a high probability.

Subsequently, as illustrated in FIG. 58C, an ion beam doping area 859*x*" corresponding to the lower hole processing region 859" is entirely and uniformly irradiated with the ion beam (by repeating raster scans as in the foregoing), whereby the interconnection wiring line 819" formed by the third-layer wiring Al-3 can be cut as shown in FIG. 58E.

Embodiment 9

This embodiment is substantially similar to the ninth embodiment of the first aspect of the present invention.

The present embodiment corresponds to the fundamental strategy of the FIB wiring correcting process as the element process of the IC developing and manufacturing system of the embodiment 2 or 13.

Now, the fundamental strategy of on-chip wiring corrections will be described by taking the fourth-layer Al wiring of the foregoing ECL logic as an example.

FIG. 59A tabulates the fundamental strategy of the on-chip wiring corrections. FIG. 59B exemplifies the basic patterns of the corrections. In FIG. 59B, each bold solid line indicates a correctional wiring line which is formed of an Mo jumper line or the like. By way of example, the "inversion of output" is processing in which, in order to invert the output of an FF, namely, flip-flop, an interconnection line is cut on the output side of the FF (with an FIB), and an inverter being a spare gate is connected to the input side of a succeeding gate by two jumper lines.

The fundamental strategy will be described with reference to the figures.

"Policy 1" is that an interconnection line is cut in the shape of Al-4 power source wiring as far as possible. This is intended to prevent the broad power source Al line and underlying Al wiring from short-circuiting due to redeposition. "Policy 2" is that, when the quality of the processing of the FIB is considered, cutting an Al-2 interconnection line lower than an Al-3 interconnection line is more advantageous than cutting the Al-3 interconnection line which is closer to the Al-4 wiring and is more liable to short-circuit. According to "Policy 3", in the case of cutting the Al-3 interconnection line, two-stage processing as in the foregoing will be necessitated in order to prevent the short-circuiting thereof with the second-layer wiring Al-2 or the fourth-layer wiring Al-4, and hence, the flat place of the underlying layer (subbing layer) of the Al-3 interconnection line needs to be selected.

"Policy 4" concerns connection, and has the content that, in order to dispense with the step of cutting away the Al-4 power source line as occupies the greater part of a processing period of time, lines are connected in the Al-4 power source line space as far as possible. This policy is further advantageous in that, since a spare wiring line is often laid in the power source line space, a jumper line need not be extended long. "Policy 5" is that, insofar as the policy 4 is observed, the short-circuiting with the Al-4 power source line is not apprehended, so the Mo jumper line or a through hole burying line is formed between the pertinent line and the Al-3 interconnection line as to which a hole is favorably filled up by Mo laser CVD.

"Policy 6" is that, when lines are inevitably connected under the Al-4 power source wiring, a place where a length to be cut away can be shortened to the utmost is selected. This is the second best policy in the case where the policy 4 or 5 cannot be conformed to.

According to "Policy 7", since the jumper line (wiring line of Mo formed by laser CVD) has a comparatively high resistivity of 20 Ω/mm, it is shortened as far as possible, or an Al spare wiring line having a low resistivity of 2 Ω/mm is positively utilized. Especially in a correctional pattern which takes wired OR, the resistance between a source and a spare terminating resistor needs to be lowered to the utmost.

Incidentally, for executing the Policy 6, the slit or the like of the embodiment 17 can be advantageously utilized, as will be detailed hereinbelow.

The order and procedure of executing those steps will be described in the following. Of the working of the whole chip, the "connection" through-hole for changing the interconnection is first cut. Next, the chip surface is sputtered in its entirety with the underlying Cr metal. At a third step, the desired Mo jumper line is formed by the laser CVD, and the through-hole is buried, thus completing the interconnection. At a fourth step, the unnecessary underlying Cr film is removed by the Ar sputtering using the Mo jumper line as a mask in the CVD chamber, to expose the underlying passivation film to the outside. At a fifth step, the FIB working apparatus is used to execute the cutting of the short-circuit preventing notched groove and the interconnection of the wide power source Al wiring by the technique of the embodiments 7 and 8.

Embodiment 10

This embodiment is substantially similar to the tenth embodiment of the first aspect of the present invention.

The present embodiment corresponds to the trial digging technique to be used for the trial digging region shown in FIG. 54B of the embodiment 4. The present technique is the preparatory process of the FIB wiring correctional process as the element process of the embodiment 2 or 13. At the instant when it is communicated through communications systems that a predetermined IC chip has to be corrected in the system debugging, the corrections are executed, and the data are utilized for preparing the working files, as will be described in the embodiment 12.

FIG. 60A is a block diagram showing the essential portions of an ion beam processing apparatus for use in the performance of the present invention. FIG. 60B is a plan view of an example of the semiconductor device of the present invention to be subjected to ion beam processing. FIGS. 60C and 60D are sectional views of parts of the semiconductor device.

On an X-Y table 1001" which is movable within a horizontal plane, a semiconductor wafer 1002" (workpiece) is detachably placed in a predetermined attitude, the semiconductor wafer being formed with a plurality of semiconductor devices 1002*a*" in such a way that thin films made of predetermined substances are deposited by repeating photolighographic steps.

In this case, the semiconductor device 1002*a*" formed in the semiconductor chip 1002" includes a trial processing region 1002*c*" (first portion) along with an element region 1002*b*" (second portion).

In the element region 1002*b*" of the semiconductor device 1002*a*", there is formed a logic element having a multilayer wiring structure in which a first layer of aluminum wiring 1002*e*", an inter-layer insulator film 1002*f*", a second layer of aluminum wiring 1002*g*", an inter-layer insulator film 1002*h*", a third layer of aluminum wiring 1002*i*", an inter-layer insulator film 1002*j*", a fourth layer of aluminum wiring 1002*k*", an a final passivation film 1002*l*" are stacked on an insulator substrate 1002*d*". On the other hand, the trial processing region 1002*c*" is the same as the element region 1002*b*" in the deposition structure of the substances in the depth direction thereof, the history of the formation of the deposition structure, and so forth.

The X-Y table 1001" is constructed so as to be driven through a servomotor 1001*a*" and to have its displacement detected by a lower interferometer 1001*b*". The displacement can be precisely controlled in a closed loop by an X-Y table controller 1001*c*".

An ion source 1003" facing down is provided over the X-Y table 1001", and an ion beam 1004" formed of the ions of, for example, gallium (Ga) is radiated toward the semiconductor wafer 1002" placed on the X-Y table 1001".

Along the path of the ion beam 1004" extending from the ion source 1003" to the semiconductor chip 1002", there is disposed an ion-beam optical system 1005" which includes an extraction electrode 1005*a*", converging lenses 1005*b*", electrostatic deflection lenses 1005*c*", etc., and which functions, e.g., to accelerate converge and select the ions constituting the ion beam 1004" and also to control the position of incidence of the ion beam 1004" on the semiconductor wafer 1002".

Further, ion beam current-detection means 1006" for detecting an ion beam current $I_B$ is provided in the path of the ion beam 1004".

In the vicinity of the X-Y table 1001" on which the semiconductor chip 1002" is placed, there is disposed detection means 1007" for detecting charged particles, such as secondary ions or secondary electrons, or emission spectra 1004*a*" which are produced from the semiconductor chip 1002" during the incidence of the ion beam 1004". The detection means 1007" is connected to a dose calculator 1008" together with the ion beam current-detection means 1006 mentioned above.

The dose calculator 1008" measures the required periods of time of the processing steps of the respective layers constituting the multilayer wiring structure of the semiconductor device 1002*a*" formed in the semiconductor chip 1002", on the basis of, for example, the changes of the species of the secondary ions, the fluctuations of the amounts of the secondary electrons and the changes of the emission spectra from the semiconductor chip 1002" as detected through the detection means 1007", and it also integrates the ion beam currents $I_B$ in accordance with the individual required periods of time, thereby to calculate doses which are needed for processing the unit areas of the respective layers constituting the multilayer wiring structure of the semiconductor device 1002*a*". The calculated doses are stored in a dose memory 1009".

The X-Y table 1001", ion source 1003", ion-beam optical system 1005", ion beam current-detection means 1006", detection means 1007", etc. are accommodated within a vacuum vessel 1010".

Evacuation means 1011" which is constructed by, for example, joining predetermined vacuum pumps etc. in multistage fashion is connected to the vacuum vessel 1010", the interior of which can thus be evacuated to a desired degree of vacuum.

Further, a preliminary evacuation chamber 1014" furnished with an outer door 1013" is connected to the vacuum vessel 1010" through a gate valve 1012". Thus, the semiconductor chip 1002" placed or to be placed on the X-Y table 1001" can be taken out or in without spoiling the degree of vacuum of the interior of the vacuum vessel 1010".

In addition, the X-Y table controller 1001*c*", ion-beam optical system 1005", dose calculator 1008", evacuation means 1011", etc. are generally controlled by a main controller 1015" which includes a control computer etc.

Now, the operation of this embodiment will be described.

First, the X-Y table 1001" is properly moved, whereby the trial processing region 1002*c*" of the semiconductor chip 1002" is positioned directly under the ion source 1003".

Subsequently, the ion beam 1004" is projected, thereby to start the operation of processing the trial processing region 1002*c*" in the area $A_0$ [$\mu m^2$] of a processing plane.

This area $A_0$ is set sufficiently large relative to a required processing depth in order that the aspect ratio of a recess in the processed portion may become small, in other words, that the charged particles or emission spectra 1004*a*" appearing from the processed portion may be sufficiently detected by the detection means 1007".

On this occasion, the dose calculator 1008" measures the periods of time $t_i$ (i=1, 2, 3, - - - ) [sec] respectively required for processing the final passivation film 1002*l*", fourth aluminum wiring layer 1002*k*", inter-layer insulator film 1002*j*", - - - , in accordance with the times at which the species of the secondary ions of the charged particles or emission spectra 1004*a*" detected through the detection means 1007" change-over, the intensities of the secondary electrons, the times at which the emission spectra change, or the like. Simultaneously, it measures the ion beam currents $I_B$. [nA] through the ion beam current-detection means 1006".

Here, letting $K_i$ [$\mu m^2 \cdot sec^{-1} \cdot nA^{-1}$] denote the sputtering rate of the substance forming each layer, a processed depth $Z_i$ [$\mu m$] at the processing time $t_i$ is given by:

$$Z_i = K_i A_0^{-1} \int_0^{t_i} I_B \, dt.$$

Accordingly, the dose $D_i$ [$nA \cdot sec \cdot \mu m^{-2}$] which is needed for processing the unit area of each layer is grasped by:

$$\begin{aligned} D_i &= Z_i / K_i \\ &= 1 / A_0^{-1} \int_0^{t_i} I_B \, dt. \end{aligned}$$

That is, the dose calculator 1008" computes the doses $D_i = Z_i / K_i$ required for the processing of the unit areas of the respective layers, on the basis of the processing periods of time $t_i$ expended on the processing of the individual layers and the ion beam currents $I_B$ during the processing, and it stores the computed doses in the dose memory 1009". (First State)

Subsequently, the main controller 1015" reads out the doses $D_i$ required for processing the unit areas of the individual layers as stored in the dose memory 1009", and it computed a target dose $D_{TOT}$ in the processing of the element region 1002".

Now, let's consider a case of processing where a hole of area $A_1$ [$\mu m^2$] which penetrates six layers from the uppermost layer of final passivation film 1002*l*" to the second layer of aluminum wiring 1002*g*" is provided in the element region 1002*b*" so as to cut the second-layer aluminum wiring line 1002*g*". Then, the dose D [$nA \cdot sec \cdot um^{-2}$] required per unit area becomes:

$$D = D_1 + \cdots + D_6 + D_7 C_1$$
$$= Z_1/K_1 + \cdots + Z_6/K_6 + (Z_7/K_7)C_1.$$

Here, $C_1$ denotes an excess processing coefficient which is determined in consideration of the dispersion of a processing depth in the final processing layer. In this case, it is set at about 0.2 by way of example.

Besides, $Z_1/K_1$+ - - - +$Z_6/K_6$ denotes a processing component of predetermined amount, and $(Z_7/K_7) \cdot C_1$ denote an excess processing component.

Then, the target does $D_{TOT}$ [nA·sec] which is needed for processing the whole processed hole to be provided in the element region 1002*b*" is obtained as:

$$D_{TOT} = D \cdot A_1 \cdot (1/f(a)).$$

Here, f(a) is a coefficient indicative of a processing efficiency which changes in accordance with the aspect ration a of the processed hole to be provided in the element region 1002*b*", and f(a)=1 holds.

That is, as the aspect ration a is greater, the processing efficiency becomes lower, and the coefficient f(a) decreases more, so that the target does $D_{TOT}$ increases more.

Simultaneously with the computation of the dose $D_{TOT}$, the X-Y table 1001" is properly driven, whereby the intended element region 1002*b*" is positioned directly under the ion source 1003".

Then, the processing of the region of the processing area $A_1$ is started and conducted while the ion beam current $I_B$ and the processing period of time $t_i$ which can be measured easily without the influences of the aspect ratio of the processed portion, etc. are being observed. The processing is continued until the dose obtained by integrating the ion beam current $I_B$ with the processing period of time $t_i$ reaches the target does $D_{TOT}$. When the processing had ended, the hole of exact depth having the area $A_1$ is provided in the element region 1002*b*", and the second-layer aluminum wiring line 1002*g*" is reliably cut. By way of example, the logic correction of the semiconductor device 1002*a*", a countermeasure for the inferior design thereof, or the analysis of the defect thereof can be accurately made or taken without damaging the lower insulator layer, etc., by the cutting of the second-layer aluminum wiring line 1002*g*". (Second State)

Thus, according to this embodiment, the following effects can be attained:

(1) A semiconductor device 1002*a*" formed in a semiconductor chip 1002" is provided with a trail processing region 1002*c*" along with an element region 1002*b*", whereupon processing is carried out via a first state at which, in the trial processing region 1002*c*", doses $D_i$ required for the processing per-unit-area of respective layers constituting a multilayer wiring structure of the like are measured while charged particles or emission spectra 1004*a*" developed from a processed portion in a processing area sufficiently large in comparison with a depth are being detected in sufficient amounts, and a target does $D_{TOT}$ is grasped on the basis of the doses $D_i$, and a second stage at which the intended element forming region 1002*b*" is irradiated with an ion beam 1004" while doses are being measured on the basis of an ion beam current $I_B$ and a processing period of time $t_i$ which can be measured easily irrespective of the aspect ratio of the processed portion, etc., and the irradiation is continued until the doses in the processing reaches the target does $D_{TOT}$. Therefore, the depth of the hole of high aspect ratio to be provided in the element forming region 1002*b*" by the irradiation with the ion beam 1004" can be precisely controlled.

(2) As a result of the item (1), in the semiconductor device 1002*a*" such as a logic element of high integration density, a logic correction, a countermeasure for an interior design, the analysis of a defect, etc. can be aaccurately made or taken by the cutting, exposure, etc. of a wiring layer based on the ion beam processing.

(3) The ion beam processing in which a processed depth is precisely controlled can be performed even for the semiconductor device 1002*a*" as to which the thicknesses $Z_i$ of the respective layers in a depth direction and the sputtering rates $K_i$ of the ion beam 1004" for substances making up the respective layers are not known.

(4) As the results of the items (1)–(3), in a logic element of high integration density, etc., the productivities of the operations of a logic correction, a countermeasure for an inferior design, the analysis of a defect, etc., based on the ion beam processing can be enhanced.

In order to control the processed depth more precisely, doses in somewhat larger amounts are set on the basis of the data of the receding trial digging beforehand, whereupon automatic processing may be performed in such a way that end points are automatically detected by monitoring the secondary ions of Al and Si be means of the detector. Thus, the depth can be monitored during the actual processing, so that a hole can be accurately processed even when Al and $SiO_2$ films involve deviations. Moreover, the processing is not affected by the size and topographical structure of the hole.

Embodiment 11

This embodiment is substantially similar to the description of the eleventh embodiment of the first aspect of the present invention.

In the present embodiment, like the Embodiment 10, the positional deviations are detected before making the operation files by the Al processing reference marks 447*a*" and 447*b*" and the origin detecting patterns 445*a*" and 445*b*" and transferred to prepare the processing data (of the Embodiment 12).

FIG. 61A is an enlarged partial sectional view of a wafer for explaining an ion beam processing method which is an embodiment of the present invention, FIG. 61B is a schematic constructional view showing a processing apparatus which is used in the ion beam processing method, and FIG. 61C is a schematic perspective view showing the sample stage of the processing apparatus on an enlarged scale. In addition, FIG. 61D(*a*) is a schematic explanatory view showing the scanning state of an ion beam on the surface of a processing reference mark, while FIG. 61D(*b*) is an explanatory diagram showing the detection intensity of secondary electrons during the scanning of the ion beam.

Further, FIGS. 61E(*a*)–61E(*d*) show modifications of the plan pattern of the processing reference mark, and FIGS. 61F(*a*)–61F(*b*) show modifications of the sectional shape of the processing reference mark. Besides, FIG. 61G(*a*) is an enlarged partial sectional view showing another example of the processing reference mark, while FIG. 61G(*b*) a schematic plan view of this example.

The processing apparatus for use in the ion beam processing method of this embodiment includes constitutes 1101"–1132" as shown in FIG. 61B.

Referring to FIG. 61B, the constituent 1101" provided at the upper part of the apparatus proper is an ion source emitter. Although not shown, an ion source such as molten liquid metal is accommodated in the ion source emitter 1101". An extraction electrode 1102" is provided below the ion source emitter 1101" so as to emit ions into vacuum. Located still below the extraction electrode 1102" are a first lens electrode 1108" which functions as an electrostatic lens, and a first aperture electrode 1103" which functions as an aperture mask. Below the first aperture electrode 1103", there are disposed a second lens electrode 1104", a second aperture electrode 1109", a blanking electrode 1105" for controlling the ON/OFF of beam projection, and a third aperture electrode 1106" as well as a deflection electrode 1107".

Owing to such arrangement of the electrodes, an ion beam B emitted from the ion source emitter 1101" is formed as a focused beam, and it is controlled by the blanking electrode 1105" and the deflection electrode 1107" so as to be projected on a chip 1112" which is a workpiece.

The chip 1112" is placed on a sample holder 1113" mounted on a sample stage 1115", which is positioned by a stage driving motor 1117" while its position is being recognized by a laser interferometer 1116" through laser mirrors 1114" disposed nearby.

A secondary ion/secondary electron detector 1111" is arranged above the semiconductor chip 1112" so as to detect the generation of second ions and secondary electrons from the workpiece 1112".

In addition, the constituent 1110" located above the secondary ion/secondary electron detector 1111" is an electron shower, which prevents the chip 1112" from being electrified.

The interior of the processing system thus far described is kept in a vacuum state by a vacuum pump which is indicated at numeral 1118" in the figure. Besides, the individual processing means have their operations controlled by respective controllers 1119"–1123" which are disposed outside, and which are, in turn, controlled by a control computer 1129" through corresponding interfaces 1124"–1128". Incidentally, the control computer 1129" inputs/outputs data and records data by means of a terminal 1130", a magnetic disk 1131" and an MT deck 1132".

In the processing apparatus, the sample stage 1115" can be moved predetermined distances in X- and Y-directions by the drive motor 1117" which is controlled by the controller 1122", on the basis of, for example, positional data stored in the magnetic disk 1131". The minute deviations between the actual movement distances and the positional data items on that occasion are found by utilizing the fact that, as illustrated in FIG. 61C, a laser beam A projected from the laser interferometer 1116" is reflected from the X-directional wall and Y-directional wall of the sample stage 1115" via the laser mirrors 1114", whereupon the reflected beams enter the laser interferometer 1116" again and interfere with each other. The information items of the positional deviations are properly input to the deflection controller 1120" for controlling the deflection electrode 1107", whereby the irradiation position of the ion beam B can be finely corrected.

Part of the chip 1112" being a sample is enlargedly shown in FIG. 61A. The chip 1112" includes a semiconductor substrate 1112*a*" whose body is made of silicon (Si) single crystal or the like. The semiconductor substrate 1112*a*" is formed with multilayer wiring configured of three layers. More specifically, there are stacked a first wiring layer 1135" at the lowermost layer as includes first wiring 1133" and a first insulator layer 1134" deposited and formed thereon, a second wiring layer 1135*a*" at the middle layer as includes second wiring 1133*a*" and a second insulator layer 1134*a*" deposited and formed thereon, and a third wiring layer 1135*b*" at the uppermost layer as includes third wiring 1133*b*" and a third insulator layer 1134*b*" deposited and formed thereon.

In the multilayer wiring structure, the first, second and third wiring layers 1135", 1135*a*" and 1135*b*" are respectively provided with processing reference marks 1136", 1137" and 1138" which are used for processing the corresponding layers. Although not restricted thereto, the processing reference marks 1136" can have any of plan shapes shown in FIGS. 61E(*a*)–61E(*d*) by way of example. Also the sectional shape of this reference mark 1136" can be made a salient shape (FIG. 61F(*a*)) similar to the shape of the mark shown in FIG. 61A, or a notch shape as shown in FIG. 61F(*b*). In addition, as a material for forming the processing reference mark 1136" at this time, any of various substances such as aluminum (Al) can be used, and a substance which affords a uniform layer thickness is desirable. By the way, each of the processing reference marks 1136" etc. is formed simultaneously with the formation of the wiring of the corresponding layer.

Referring to FIG. 61A, the first insulator layer 1134", second wiring 1133*a*", second insulator layer 1134*a*" and third wiring 1133*b*" are further stacked and formed in succession on the processing reference mark 1136", and the third wiring 1133*b*" at the uppermost layer is exposed to the exterior. The individual layers mentioned above have uniform thicknesses of high precision. Accordingly, the shape of the processing reference mark 1136" of the lower layer is accurately reflected as it is, in the front surface of such third wiring 1136*b*" lying directly over the processing reference mark 1136", and the left and right edges of the upper end of the processing reference mark 1136" are respectively reflected as edge parts $E_1$ and $E_2$ in the third wiring 1133*b*" lying at the top level. As compared with the edges of the processing reference mark 1136", the edge parts $E_1$ and $E_2$ exhibit certain spreads in the planar direction of the chip. However, the spreads are proportional to the number of the stacked layers, and the center between both the edges of the processing reference mark 1136" is in accurate agreement with the center between the edge parts $E_1$ and $E_2$ even when the intermediate layers involve some planar positional deviations. Accordingly, if the positions of the edge parts $E_1$ and $E_2$ can be specified, naturally the center of the processing reference mark 1136" lying at the lowermost layer can be accurately specified.

Such a technique for specifying the positions will now be described in more detail.

In the ensuring description, there will be explained a case where the processing reference mark 1136" is used for positioning and where the first wiring 1133" of the first wiring layer 1135" is subjected to cutting processing by irradiating it with the ion beam B.

First, the wafer 1112" is set on the predetermined position of the sample stage 1115" of the processing apparatus, whereupon the vacuum pump 1118" is operated to bring the interior of the apparatus into a predetermined vacuum state. Subsequently, on the basis of positional data stored in the magnetic disk 1131", the stage driving motor 1117" is operated to move the sample stage 1115 to a position where the ion beam B comes over the processing reference mark 1136" of the first wiring layer 1135". Then, as sketched in FIG. 61D(*a*), the ion beam B is scanned over a range extending beyond the edge parts $E_1$ and $E_2$, on that front surface of the third wiring 1133*b*" of the uppermost layer in which the processing reference mark 1136" is reflected. Secondary electrons C generated on that occasion are detected, and the position of the underlying processing reference mark 1136" is grasped from variation in the detected amount of the secondary electrons C. The detection state of the secondary electrons C at this time is illustrated in FIG. 61D(*b*), and the amount of the secondary electrons increases to peak values at the positions of the edge parts $E_1$ and $E_2$ of the third wiring 1133*b*. The positional coordinates of the edges of the processing reference mark 1136", in turn, the positional coordinates of the center of this processing reference mark 1136" can be calculated from from the peak positions of the detection intensity of the secondary electrons.

Herein, according to this embodiment, the processing reference mark 1136" is not directly exposed to the front surface of the chip 1112", but the shape thereof is reflected at the steps, namely, edge parts of the third wiring 1133*b*" of the uppermost layer accurately in proportion to the number of the stacked layers, so that the central position of the processing reference mark 1136 intrinsically located at the lowermost layer can be calculated at high precision.

In this way, the central position of the processing reference mark 1136" at the lowermost layer can be specified, whereby the positional relationship of the wiring formed in this lowermost layer can be accurately calculated.

Subsequently, on the basis of the positional information obtained as described above, the positional coordinates of a processing position stored in the magnetic disk 1131" or the like beforehand are input to the controller 1122", and the stage driving motor 1117" is actuated, whereby the cutting processing of the first wiring 1133" of the lowermost layer can be carried out. In FIG. 61A, a case is illustrated where the position spaced a distance l from the processing reference mark 1136" is subjected to the cutting processing. In executing the cutting processing of the wiring 1133" at the lowermost layer in this manner, the wiring 1133" can be positioned with reference to those edge parts $F_1$ and $E_2$ of the third wiring 1133*b*" of the uppermost layer at which the processing reference mark 1136" lying at the lowermost layer similarly to the wiring 1133" is accurately reflected, so that the positional recognition of very high precision is realized to effectively prevent the erroneous cutting, etc. of the wiring 1133".

The processing technique with the ion beam B at this time will be briefly described. The ion beam B is projected with a predetermined scanning width for a fixed period of time while the irradiated amount and irradiation time interval of the ion beam B, an acceleration voltage or a voltage applied to the deflection electrode 1107", and so forth are being adjusted on the basis of information stored in the magnetic disk 1131" or the like beforehand. Thus, the wiring layer is etched and processed at a desired depth and width.

The above description has referred to the case where the positioning is effected by recognizing those edge parts $E_1$ and $E_2$ of the wiring 1133*b*" of the uppermost layer at which the shape of the processing reference mark 1136" lying at the lowermost layer is reflected. However, this is not restrictive, but the layers overlying the processing reference mark 1136" may well be etched and removed within a predetermined extent into the state in which this processing reference mark 1136" is directly exposed to the exterior, so as to perform the cutting processing of the wiring 1133" of the lowermost layer with reference to the exposed mark.

In addition, the processing reference mark 1136" may well have a structure as shown in FIG. 61G, unlike the single form as shown in FIG. 61A. More specifically, a first pattern is so formed that two processing reference marks 1136" and 1139" are juxtaposed at the same depth as that of the first wiring 1133". A second pattern 1140" is deposited and formed on the first pattern without interposing the first insulator layer 1134". Further, a third pattern 1141" is deposited and formed directly on the second pattern 1140'. The first pattern 1136" and 1139', the second pattern 1140" and the third pattern 1141" can be respectively formed by the same steps as those of the wiring lines (not shown) identical in depth to the corresponding layers. At that time, the parts of the first, second and third insulator layers 1134", 1134*a*" and 1134*b*" overlying the processing reference marks 1136" and 1139" are etched and removed, so that the third pattern 1141" falls into an exposed state. Owing to such a structure in which no insulator layer is interposed between the respectively adjacent layers, the processing reference marks 1136" and 1139" at the lowermost layer can be reflected in the shape of the uppermost layer at a still higher precision.

In the case of using the processing parallel reference marks 1136" and 1139", the right edge of the processing reference mark 1136" located at the left as viewed in FIG. 61G is accurately reflected at the edge part $E_1$ of the third pattern 1141", while the left edge of the processing reference mark 1139" located at the right is accurately reflected at the edge part $E_2$ of the third pattern 1141". Accordingly, the central position between the edge parts $E_1$ and $E_2$ corresponds accurately to the central position between the processing reference marks 1136" and 1139". Therefore, when the ion beam is scanned on the front surface of the third pattern 1141", the detection intensity of the secondary electrons changes greatly at the edge parts $E_1$ and $E_2$ as in the case illustrated in FIG. 61A, and hence, the positional coordinates of the edge parts $E_1$ and $E_2$ can be accurately found. As a result, the central position between the processing reference marks 1136" and 1139" can be accurately specified from the positional coordinates of the edge parts $E_1$ and $E_2$, and a portion to-be-processed can be positioned with reference to this central position. In consequence, the position of the portion to-be-disposed can be specified very accurately, and the portion to-be-processed can be processed at high precision as in the case illustrated in FIG. 61A.

In this manner, according to this embodiment, the following effects can be attained:

(1) In ion beam processing, the same layer as first wiring which is a portion to-be-processed is provided with a processing reference mark 1136 which is intended for the positioning of the portion to-be-processed, and the portion to-be-processed is positioned with reference to that shape of wiring 1133*b*" at the uppermost layer in which the shape of the processing reference mark 1136 is accurately reflected. Thus, even when horizontal positional deviations are involved between respectively adjacent layers, the portion to-be-processed can be positioned at a very high precision. Therefore, the accurate position can be adjusted to the beam processing at the high precision.

(2) An ion beam is scanned on that front surface of the third wiring 1133*b*" which is formed with the edge parts $E_1$ and $E_2$ reflecting the edges of the processing reference mark 1136" mentioned in the item (1), and the positional coordinates of the edge parts $E_1$ and $E_2$ are specified from the changes of the detection intensity of secondary electrons generated during the scanning. Thus, the coordinates of the central position of the processing reference mark 1136" can be specified at high precision. Therefore, the precision of the cutting processing which employs the ion beam can be enhanced more.

(3) Two processing reference marks 1136" and 1139" are juxtaposed, and a second pattern and a third pattern are stacked and formed on the marks 1136" and 1139" without interposing any inter-layer insulator film. Thus, the edges of the opposing positions of the two marks can be reflected as the edge parts $E_1$ and $E_2$ of the third pattern at the uppermost layer more accurately. Therefore, the central position between the processing reference marks 1136" and 1139" can be accurately specified from the positional coordinates of the edge parts $E_1$ and $E_2$, and the processing precision of a portion to-be-processed can be further heightened.

Embodiment 12

This embodiment is substantially similar to the description of the twelfth embodiment of the first aspect of the present invention.

In the whole construction of the on-chip correction system debug of Embodiment 2 or 3 of the present invention, the processing of data will be chiefly described.

FIG. 62A is a block diagram showing the hardware architecture of the entire system, FIG. 62B is a schematic block diagram of the entire processing flow of this system, and FIG. 62C is a block diagram showing the details of the data flow of this system. Referring to FIG. 62A" numeral 1201" designates a stocked chip. Numeral 1283" designates an FIB wiring correction apparatus or the step of processing with this apparatus. Numeral 1284" designates a laser selective CVD apparatus or the step of forming an Mo wiring line (jumper line) with this apparatus. Numeral 1285" designates a laser microscope with a confocal memory. These apparatus are connected with a host computer or the like by a data communication circuit, such as "Ethernet" (registered trademark), 1291". The host computer (microcomputer) 1292" controls the on-chip correction system. Numeral 1261" denotes a large-sized computer which receives design alteration data and which converts the data so as to match with other layout information within the chip 1201", and numeral 1251" a system debugging information processor. These system debug apparatus and thus foregoing correction system are connected by the aforementioned communication circuit or any other communication circuit or any other communication circuit (e.g., a telephone circuit).

Referring to FIG. 62B, numeral 1261" designates a process for merging and transferring the underlying pattern data of the chip and correctional data originated as the result of the system debug. A processing film preparation process 1282" is such that, on the basis of the transferred data, the host computer 1292" of the correction system determined concrete processing by referring to the data of trial digging etc. A contact hole providing process 1283*a*" is such that, in the FIB apparatus 1283", the control computer thereof executes FIB processing on the basis of an instruction from the host computer 1292". In a container transportation process 1286", the chip to-be-processed is transported from the FIB apparatus 1283" to the laser CVD apparatus 1284" by a load lock system while a degree of vacuum of at least $5\times10^{-6}$ Torr is held. Characters 1284*a*" denote a laser CVD process (employing an Ar laser of 200 mW) for the selective formation of an Mo jumper line or the like. In a cutting, anti-short-circuiting or moat forming FIB process 1283*b*", the chip having completed a desired connection by the jumper line or based on filling up the hole with Mo has a desired interconnection cut or is formed with a notch. A microscope inspection process 1285*a*" is such that, on the basis of an instruction from the host computer 1292", the control computer of the apparatus automatically inspects predetermined processed coordinates. A chip probing process 1210" is carried out with a wafer prober.

Referring to FIG. 62C, numeral 1251" designates a system and process for the system debug and logic design correction of an electron device. Numeral 1252" designates a design alteration process. Numeral 1253" designates a correctional data origination apparatus and process for originating and inputting the correctional data, such as coordinate data, of the chip to-be-corrected on the basis of the result of the debug. Numeral 1261" designates a chip correction data originating large-sized computer system or process for converting the above correctional data so as to merge it with the other data of the chip. Numeral 1262" designates a process for the conversion. Numeral 1263" designates chip layout data except direct correction parts such as underlying Al wiring lines. Numeral 1264" designates a process for originating chip correction data from the preceding data items.

Numeral 1271" designates an imaging apparatus or process for imaging the chip correction data so as to acknowledge a part to-be-corrected. Numeral 1272" designates a process for converting the chip correction data into graphic data. Numeral 1273" designates a library for various cells. Numeral 1274" designates a graphic apparatus for originating and controlling the graphic data. Numeral 1275" designates a displaying CRT. Numeral 1276" designates an inverse conversion process for reconverting the graphic data into the format of the original chip correction data.

Numeral 1281" denotes a chip correction system or process, numeral 1282" a host computer for controlling the system, numeral 1283" an FIB milling apparatus, numeral 1284" a laser CVD apparatus, and numeral 1285" an inspecting microscope apparatus. These apparatus have their control computers, respectively, and job instructions, processed result data, etc. are transferred between the control computers and the host computer through the communication circuit.

Now, the whole system will be described centering on the flow of data with reference to FIG. 62C.

When a design alteration is determined by the result of system debug, data items such as wiring cutting coordinates, a layer to-be-cut, connection coordinates, a layer to-be-connected, the coordinates of a connection wiring path as digitized according to the strategy of Embodiment 9 are input as correctional data 1253". The correctional data items are transferred in on-line fashion into a chip design/manufacture data managing computer system 1261" which controls chip design and manufacture data, and in which the data items are converted into the same format as in this system. Thereafter, other chip layout data stored in the system and required for processing the underlying Al wiring pattern etc. of a chip to-be-processed is added to the converted data, to originate chip correction data 1264". These operations are performed for the following reason: Data for developing a system is basically logic design data corresponding to logic diagrams. Therefore, in originating concrete chip correction data, it needs to be converted into chip design/manufacture data corresponding to an actual mask pattern.

The chip correction data 1264" is transferred to a graphic apparatus 1271", and is displayed as an image on a CRT 1275". On this occasion, if the correction plan has no problem, the data left intact is transferred to a chip correction system 1281" (after inverse conversion). In contrast, when the correction plan includes improvement, change, addition or the like, it is revised in such a way that data items on a fundamental processing pattern, a spare cell, spare wiring, etc. are read out from a cell library 1273" or the like on the graphic apparatus, and the data is thereafter transferred to the correction system 1281".

Here, instead of inputting the correctional data by means of the information processing system 1253" for managing the system development, correctional data may well be input at an image level upon directly acknowledging an image in a graphic terminal 1274".

The chip correction data transferred from the graphic apparatus 1271" is loaded in a host computer 1282" and is merged with other processing data, whereby a complete set of processing data is originated. More specifically, in accordance with produce short data in the chip correction data, the host computer 1282" instructs processing apparatus and an inspection apparatus to perform preliminary operations such as trial digging of the Embodiment 10 and inter-layer misregistration measurement (laser microscope 1285") and to transfer the results back to the host computer. Subsequently, the host computer originates the actual processing data on the basis of the chip correction data and the preliminary operation data as well as other processing reference data, and it transfers the instructions of processing and inspection to the processing and inspection apparatus in on-line fashion on the basis of the originated processing data.

For the purpose of ensuring the processing precision and positioning precision (±0.5 μm) thereof, such a chip correction system needs to be placed in an environment having a temperature of 23±1° C., vibrations of at most 0.1 μm, and a dust degree of "Class 100" or below.

Embodiment 13

This embodiment is substantially similar to the description in connection with the thirteenth embodiment of the first aspect of the present invention.

The present embodiment corresponds to another example of the whole structure of the IC development and manufacture system like the embodiment 2. Hence, the other individual embodiments are these element processes or modifications thereof. FIG. 52 is a fundamental process flow of fourth aspect of the present invention, and the overlapped portions will be omitted from description.

In this embodiment, the application of the on-chip wiring correction system of the present invention will be described. The system and method are applicable to the logic corrections of bipolar custom logic LSIs and other CMOS logic LSIs and to the pattern corrections and defect analyses of bipolar, MOS and CaAs memory LSIs, etc. as concretely mentioned in the foregoing embodiments. They are also applicable to the pattern corrections of a mask, a printed-wiring circuit board, a multilayer ceramic circuit board, etc.

Here will be taken an example applied to a gate-array master slice IC.

A gate array is a kind of semiconductor integrated circuit whose functions can be freely set by altering the Al wiring lines of a large number of basic gates and memories. Such a gate array should desirably be perfect at the stage of a logic specification prepared by a customer. However, when the number of the gates exceeds a certain value, debugging the gate array perfectly at the logic level is not always efficient, and moreover, it is sometimes impossible. In such cases, a gate array developing/mass-producing (manufacturing) system or method to be explained below can speed up the development of a system through the utilization of FIB wiring corrections.

FIG. 63 is a diagram showing the entire flow of the system or method. Referring to the figure, a broken line at numeral 1301" indicates a process flow on the side of a customer, while a broken line at numeral 1302" indicates a process flow on the side of a chip manufacture. At a step 1303", the trial manufacture specification of an IC is determined by the customer. Numeral 1304" designates a master slice wafer which is kept in stock before an Al process in order to shorten the turnaround time of the gate array. Designated at numeral 1305" is an Al multilayer process as described in the foregoing embodiments, which is performed according to the trial manufacture specification. As a wafer probing step 1306", electrical tests are conducted in the wafer state by the use of a prober. A primary chip splitting/assemblage step 1307" is such that the wafer including nondefective articles are split into chips by dicing, and that the chip is assembled to a testable extent. At a step 1308", the customer debugs the pertinent system on the basis of the chip. Thereafter, the customer alters the specification on the basis of the debug at a step 1309" and originates correctional data at a logic diagram level and transfers it in on-line fashion at a step 1310". At a step 1312", the correctional data is input with a graphic terminal as described in the Embodiment 12. A step 1311" is such that the finished chips or the sort identical to the primary chips mentioned before are kept in stock. At a step 1313", the stocked chips are subjected to FIB wiring corrections on the basis of processing data as described in the foregoing embodiments, and at a step 1314", the corrected chips are probes in the chip states as described in the foregoing embodiments. The probed chips are assembled at a step 1315", and the system is redebugged by the customer at a step 1316". Numeral 1317" designates a mass-production Al process corresponding to the IC whole final specification has been determined by the redebug step 1316". Here, the stocked wafer is subjected to the Al process so as to finish up the gate array.

Thus, with this method, the period of time which is taken for the finish of the corrected chip (to be tested) since the debugged result of the customer has been transferred to the chip manufacturer in on-line fashion is as short as 1 day–3 days. Therefore, the development (or manufacture) period of the gate array of high integration density can be sharply shortened.

The supplementary explanation of the whole process flow is as follows: The stocked wafer 1304" from which the primary chips 1307" are prepared has regions corresponding to the spare gates and spare FFs in the foregoing embodiments. The Al process 1305" at this time is the process of the four Al layers having the spare wiring, antenna wiring etc. as described in the foregoing embodiments (for example, Embodiments 4–6, 9–11 and 16–19). Since such primary chips are kept in stock, the wiring corrections with an FIB can be promptly made in correspondence with the logic alteration. The Al process 1317" for the mass production after the redebug 1316" may well be the same as the above process 1305". However, in a case where the quantity of production is very large, masks may well be corrected or remade.

Embodiment 14

The description in connection with this embodiment is substantially similar to the description in connection with the first embodiment of the first aspect of the present invention.

The present embodiment corresponds to the chip testing step 210" by the prober of embodiment 2 or 13.

FIG. 64A is a perspective view showing an example of the testing jig of the present invention. FIG. 64B is a vertical sectional view showing an example of a wafer prober with which the testing method of the present invention is performed; FIG. 64C is a plan view of the wafer prober; and FIG. 64D is a plan view of a wafer chuck in the wafer prober.

In addition, FIG. 64E is a flow chart showing an example of that method of manufacturing a semiconductor integrated circuit device which is an embodiment of the present invention, and FIG. 64F is an explanatory diagram showing part of the manufacturing method in more detail.

First, examples of the construction of a wafer prober and a testing jig for use in a testing method which is an embodiment of the present invention will be described with reference to FIGS. 64A–64D.

As shown in FIG. 64B, the wafer prober 1401" in this embodiment comprises an X-Y table 1402" which is capable of a rectilinear movement within a horizontal plane, a rotational displacement, and ascent and descent operations in the vertical direction, and a wafer chuck 1403" which is supported by the X-Y table 1402".

The front surface of the wafer chuck 1403" is formed with a plurality of concentric suction grooves 1403*a*", as shown in FIG. 64D.

Further, a plurality of suction ports 1403*c*" are provided in the wafer chuck 1403", and they communicate with a suction pipe 1403*b*", one end of which is open to the bottom parts of the suction grooves 1403*a"* and the other end of which is connected to a vacuum pump or the like, not shown, outside the wafer prober 1401". Thus, a flat test piece such as a semiconductor wafer, not shown, which is placed on the wafer chuck 1403" is stably held on this wafer chuck 1403" in detachable fashion by vacuum suction.

Meanwhile, a probe card 1404" is disposed over the wafer chuck 1403" in an attitude parallel to the plane of this wafer chuck 1403".

On the surface of the probe card 1404" confronting the wafer chuck 1403", a plurality of probes 1405" the base end sides of which are fixed to this probe card 1404" are arranged in such an attitude that the flexible and sharp distal ends of the probes 1405" concentrate centrally of the probe card 1404" in predetermined positional relations.

Through the appropriate positioning operation of the X-Y table 1402", the probes 1405" are individually depressed on and electrically connected with the external electrodes or the like, not shown, of each of a plurality of semiconductor integrated circuit elements which are constructed in the unshown semiconductor wafer fixed to the wafer chuck 1403".

Besides, an observation window 1404*a*" is provided in the central part of the probe card 1404". The window 1404*a*" makes it possible to observe from above the probe card 1404", the touched states, positioned states etc. of the plurality of probes 1405" with respect to the external electrodes or the like, not shown, of each of the plurality of semiconductor integrated circuit elements which are constructed in the unshown semiconductor wafer fixed to the wafer chuck 1403".

Further, each of the probes 1405" mounted on the probe card 1404" is connected to a tester 1406" including a control computer by way of example, though a wiring structure 1405*a*" provided within this probe card 1404", a cable 1405*b*" connected to the wiring structure 1405*a*", etc.

The tester 1406" transfers operating test signals and supplies operating electric power to the external electrodes or the like, not shown, provided on each of the semiconductor integrated circuit elements constructed in the unshown semiconductor wafer fixed to the wafer chuck 1403", through the probes 1405" individually connected to the external electrodes or the like.

In this case, a jig 1407" including a base plate 1407*a*" which presents substantially the same shape as that of a conventional semiconductor wafer is put on the upper surface of the wafer chuck 1403".

In the base plate 1407*a*" of the jig 1407", a rectangular window 1407*b*" penetrating this base plate 1407*a*" is formed as shown in FIG. 64B in a position where it overlaps any of the plurality of suction grooves 1403*a*" engraved in the wafer chuck 1403" on which this jig 1407" is put.

Further, in a region surrounding the rectangular window 1407*b*", a rectangular step portion 1407*c*" is formed to be lower than the front surface of the base plate 1407*a*". Rectangular pellets 1408" each including a large-scale logic integrated circuit device therein are formed by cutting the semiconductor wafer, such a rectangular pellet 1408" is accommodated in the step portion 1407*c*" under the state under which it completely conceals the window 1407*b*" located centrally of this step portion 1407*c"*.

Moreover, substantially similar indents 1407*d*" are respectively formed in the middle parts of side walls defining the rectangular step portion 1407*c*". Thus, the operations of setting the pellet 1408" on and taking it out of the step portion 1407*c*" by the use of a pincette or the like are easily carried out without damaging this pellet 1408".

Besides, an orientation flat 1407*e*" is provided at a part of the outer periphery of the base plate 1407*a*", and it is formed by cutting off the outer peripheral part rectilinearly in a direction parallel to one side of the rectangular step portion 1407*c*". By way of example, it is used as a reference plate in the operation of positioning the jig 1407" to the wafer chuck 1403".

In addition, the front surface of the base plate 1407*a*" of the jig 1407" is formed with both positioning scribed lines 1407*f*" parallel to the extending direction of the orientation flat 1407*e*" and positioning scribed lines 1407*g*" orthogonal to the extending direction of the orientation flat 1407*e*". The positioning scribed lines 1407*f*" and 1407*g*" are used for, e.g., the positioning of the pellet 1408" to the plurality of probes 1405" fixed to the probe card 1404".

Now, an example of a method of manufacturing a semiconductor integrated circuit device with the probing technique as stated above will be described with reference to the flow charts of FIGS. 64E and 64F, etc.

First, an unshown master slice in a wafer state, which is formed with basic cells including such active elements as transistors via diffusion processes etc., is formed by photolithography with multilayer wiring structures for connecting the basic cells to one another so as to realize desired logical operations. Thus, a plurality of articles of a large-scale logic integrated circuit device having the same functions are simultaneously formed within the unshown semiconductor wafer.

Further, each of the plurality of articles of the large-scale logic integrated circuit device having the same functions and lying in the wafer state is formed with solder bumps 1408*a*" which function as electrodes for, e.g., transferring operation signals from and to the exterior of the circuit device (Step 1481").

Subsequently, the unshown semiconductor wafer formed with the plurality of articles of the semiconductor integrated circuit device having the same functions is cut, whereby the plurality of articles of the large-scale logic integrated circuit device having the same functions and lying in the wafer state are respectively split into individual pellets 1408" (Step 1482").

Further, the plurality of pellets 1408" which are respectively the articles of the large-scale logic integrated circuit device having the same logical functions are assorted into a first group to be mounted in a system such as general-purpose electronic computer, and a second group to be kept in custody (Step 1483).

Thereafter, the first group of pellets 1408 are mounted in the system via a predetermined assemblage process, etc. (Step 1484").

Next, in the system in which the first group of pellets 1408" are mounted, the functions of some or all of the pellets are tested (Step 1485").

It is decided if the first group of pellets 1408" mounted have any logical or physical functional defect, and if the whole system requires the alteration of the specification thereof (Step 1486"). In the absence of the functional defect in the pellets 1408", the specification alternation as the system, or the like, the system is put into its ordinary operation (Step 1487").

In contrast, in the presence of the functional defect in the first group of pellets 1408" mounted in the system or the specification alteration of the system at the step 1486", wiring correction information for coping with the pertinent functional defect or specification alteration and diagnostic data in a probe test after corrections are first determined (Step 1488").

Thereafter, the second group of pellets 1408" having the same structures and logical functions as those of the first group of pellets 1408" and kept in stock since the step 1483" are subjected to rewiring operations on the basis of the wiring correction information determined (Step 1489").

Here, an example of the rewiring operations of the second group of pellets 1408" at the Step 1489" is illustrated in FIG. 64F.

First, using a focused ion beam apparatus or the like not shown, an insulator film 1408*c*" which covers a pertinent wiring structure 1408*b*" in the pellet 1408" is provided with a through hole 1408*d*" in order to expose the wiring structure 1408*b*" (Substep 1489*a*").

Thereafter, the pellet 1408" formed with the through hole 1408*d*" is transported into a CVD apparatus not shown (Substep 1489*b*").

During the transportation at the Substep 1489*b*", a natural oxidation film is formed on the wiring structure 1408*b*" exposed to the exterior via the through hole 1408*d*". In order to remove the natural oxidation film and to clean the exposed surface, the wiring structure 1408*b*" is subjected to a light degree of sputter etching (Substep 1489*c*").

Subsequently, an underlying film 1408*e*" made of a conductor such as chromium (Cr) is formed to a thickness of several tens Å on the whole front surface of the pellet 1408" and in the through hole 1408*d*" which exposed the wiring structure 1408*b*" to be exterior (Substep 1489*d*").

Further, correctional wiring 1408*f*" which connects the wiring structure 1408*b*" exposed from the through-hole 1408*d*" and another wiring structure 1408*b*" similarly exposed, or the like is selectively formed into a predetermined shape by local photochemical vapor deposition in which a laser beam or the like, not shown, is employed as excitation light and the reaction gas of which is molybdenum carbonyl ($Mo(CO)_6$) or the like (Substep 1489*e*").

Thereafter, that unnecessary part of the underlying film 1408*e*" which does not underlie the correctional wiring 1408*f*" is removed by selective etching (Substep 1489*f*").

In the above, for the sake of brevity, the case of electrically connecting the wiring structures 1408*b*" to each other had been explained as one example of the wiring corrections. However, the operation of merely cutting the wiring structure 1408*b*" at a desired position with a focused ion beam or the like at the Substep 1949*a*", etc. are also combined and performed properly.

Owing to such a series of rewiring operations, the second group of pellets 1408" are subjected to the wiring corrections for coping with the functional defect in the first group of pellets 1408" or the specification alteration of the system as has been found out at the Step 1486".

Thereafter, the second group of pellets 1408 rewired as stated above are subjected to probing for discriminating whether or not the results of the wiring corrections are appropriate (Step 1480").

Here, the probing in this embodiment is carried out as follows:

First, the wafer-shaped jig 1407" described before is put on the wafer chuck 1403" of the conventional wafer prober 1401" so that the surface formed with the positioning scribed lines 1407*f*" and 1407*g*" may line above and that the window 1407*b*" may be located directly over the suction groove 1403*a"*.

Further, the rewired pellet 1408" of the second group to be tested is set in the step portion 1407*c*" of the jig 1407" in the attitude in which its surface formed with the plurality of solder bumps 1408*a*" faces upwards, and it is brought into close contact with one corner of the step portion 1407*c*" whose size is slightly larger than this rectangular pellet 1408".

On this occasion, the window 1407*b*" of the jig 1407" directly overlying the suction groove 1403*a*" is completely concealed by the pellet 1408".

Under this state, the interiors of the plurality of suction grooves 1403*a*" tightly closed by the lower surface of the jig 1407" are evacuated through the suction pipe 1403*b*" as well as the suction ports 1403*c*". Thus, the jig 1407" and the pellet 1408", which is set on the step portion 1407*c*" of this jig 1407" and which is exposed to the suction groove 1403*a*" through the window 1407*b*", are reliably fixed to the wafer chuck 1403" by the atmospheric pressure.

Thereafter, the pellet 1408" set on the step portion 1407*c*" of the jig 1407" and the plurality of probes 1405" fixed to the probe card 1405" are subjected to paralleling etc. in such a way that the positioning scribed lines 1407*f*" and 1407*g*" engraved in the front surface of the jig 1407" are observed with the eye or with a positioning control system, not shown, included in the wafer prober 1401".

Further, the X–Y table 1402" is properly driven so that the respective solder bumps 1408*a*" provided on the pellet 1408" may be located directly under the corresponding probes 1405".

Under this state thus established, the wafer chuck 1403" is raised to a predetermined height. Then, the pointed ends of the respective probes 1405" are depressed under a predetermined contact pressure against the corresponding solder bumps 1408$a$" formed on the pellet 1408", and both are electrically connected as shown in FIG. 64C.

Under this state, the tester 1406" executes operating tests for the rewired pellets 1408" of the second group of the basis of, e.g., the diagnostic data determined at the Step 1488".

In this manner, in the probe test of this embodiment, the jig 1407" of sample structure and easy fabrication as stated above is used, whereby each individual pellet 1408" can be probed with ease and at high precision without subjecting the conventional wafer prober 1401" to any of remodeling etc.

Therefore, it is unnecessary to develop a testing apparatus anew or remodel the wafer chuck 1403" for the purpose of probing the individual pellets 1408" different from the wafer state, and it is realizable to shorten a required period of time and curtail a cost in the probing of the rewired pellets 1408".

As regards the jig 1407", in a case, for example, where merely a window 1407$b$" is formed slightly larger than the pellet 1408" so as to hold this pellet 1408" in direct touch with the wafer chuck 1403", a vacuum suction force acting on the pellet 1408" is apprehended to be spoilt by the open air which makes inroads through a clearance appearing between the inner periphery of the window 1407$b$" and the outer periphery of the pellet 1408".

In contrast, in the case of this embodiment, the jig 1407" is provided with the step portion 1407$c$" around the window 1407$b$" formed penetrating the base plate 1407$a$", and the pellet 1408" is held on this step portion 1407$c$" in the state in which the window 1407$b$" is completely concealed, so that the pellet 1408" is held airtight with respect to the jig 1407". Accordingly, the drawback as stated above is reliably prevented, and the jig 1407" and the pellet 1408" can be fixed to the wafer chuck 1403" more stably.

Moreover, the substantially semicircular indents 1407$d$" are respectively formed centrally of the lateral of the rectangular step portion 1407$c$". Thus, in setting or removing the pellet 1408" on or from the step portion 1407$c$" with a pincette or the like, the operation can be readily executed without damaging this pellet 1408".

Meanwhile, in a case where the probing at the foregoing Step 1481 has decided that the required logic operation or operating performance is impossible because the wiring correcting operation stated before is imperfect, the flow of the manufacturing method returns to the wiring correcting operation of the Step 1489", at which the same pellet 1408 or another new pellet 1408" belonging to the second group is rewired.

Besides, in a case where the results of the probing have been decided proper at the step 1481", the rewired pellet 1408" of the second group is assembled instead of the defective pellet 1408" of the first group mounted in the system (Step 1482"). Thereafter the aforementioned series of operations of the Steps 1485" et seq. are repeated.

Here, in developing an electronic computer system or pellets 1408" each of which is a large-scale logic integrated circuit device for use in the system, a functional defect or specification alteration arising after the assemblage or the pellet 1408" into the system has heretofore been usually coped with by, e.g., a method wherein multilayer wiring structures are partly or wholly formed again for a master slide in a wafer state by a conventional wafer process. This method has posed the problem that, as logical operations required of the pellets 1408" become more complicated and the number of wiring layers increases more, an unreasonable time is expended till the completion of the correction of the functional defect or a measure for the specification alteration.

In this regard, in the assembling system wherein solder bumps are adopted in lieu of conventional wire bonding with increase in the number of input/output terminals in each pellet 1408", also the solder bumps need to be formed by evaporation or any other process requiring a long time, after the formation of the multilayer wiring, and increase in the expended time becomes particularly conspicuous.

In contrast, according to the manufacturing method in this embodiment as stated above, the second group of pellets 1408" in the finished states in which the wiring structures and solder bumps requiring long time for fabrication have already been formed may merely be subjected to the minimum required wiring corrections, so that the period of time expended till the completion of the correction of the functional defect or the measure for the specification alteration can be sharply shortened.

This brings forth the effect that the development period of the large-scale logic integrated circuit device and the general-purpose electronic computer system employing the circuit device can be sharply shortened.

Further, the test of the chip 1408" which produces a large amount of heat is executed while this chip 1408" is being indirectly cooled by forcibly circulating water or a coolant such as Fluorinert through a cooling pipe formed within the stage 1403" in FIG. 64B.

Besides, the chip 1408" may well be drawn by suction on the stage 1403" directly without the intervention of the wafer 1407".

Effects which are attained by typical aspects of performance of the present invention are briefly explained as follows:

According to a method of manufacturing a semiconductor integrated circuit device in the present invention, each of a plurality of articles of the identical sort of semiconductor integrated circuit device formed via a wafer process is split into pellets, which are thereafter assorted into a first group and a second group; the pellets belonging to the first group are assembled into an intended system, while the pellets belonging to the second group are kept in stock; when any functional defect has been found out in the first group of pellets assembled in the system, the second group of pellets are subjected to wiring corrections for eliminating the functional defect and are thereafter assembled into the system; and these steps are repeated. Therefore, when the functional defect has been found out in the first group of pellets assembled in the actual system, the second group of pellets already finished up are subjected to the wiring corrections for eliminating the functional defect of the first group of pellets and are thereafter exchanged for the first group of pellets, thereby making it possible to eliminate the functional defect of the first group of pellets or to take measures coping with a specification alteration etc. more promptly than in, for example, a case where multilayer wiring structures are partly or wholly remade from the beginning by the wafer process in order to eliminate the functional defect.

Thus, the development periods of the semiconductor integrated circuit device and the system employing it can be sharply shortened.

In addition, according to a method of testing a semiconductor integrated circuit device in the present invention, the semiconductor integrated circuit device in a pellet state can be probed without any remodeling of a conventional wafer prober, so that a probing apparatus dedicated to the pellet, for example, need not be prepared a new, thereby making it possible to shorten a required period of time and to curtail a cost in the process for probing the pellet.

Besides, according to a testing jig in the present invention, a semiconductor integrated circuit device in a pellet state can be probed without any remodeling of a conventional wafer prober, so that a probing apparatus dedicated to the pellet, for example, need not be prepared anew, thereby making it possible to shorten a required period of time and to curtail a cost in the probing of the semiconductor integrated circuit device in the pellet state.

Moreover, the pellet can be positioned to the testing system stably and highly accurately, so that the test accuracy of the probing can be enhanced.

Embodiment 15

The present embodiment corresponds to improvements in the formation of the Mo jumper lines by the laser CVD and the boring of contact holes as the lower element one of the FIB wiring correcting process.

In the FIB wiring correcting step, we have found out the following two problems:

Firstly, when wirings are to be formed over the sample surface, the irradiation of the laser beam is generally accomplished by scanning in parallel to the extending direction of the deposited film (new wiring). The sample surface is sometimes formed with steps or the like by the reflection of the underlying wiring. In this portion, cracks are liable to run in the orthogonal direction to the extending direction of the deposited wiring, to cause a malfunction in the deposited wiring such as a disconnection. In other words, it has been found that the deposited wiring by the irradiation with the laser beam has a low mechanical strength orthogonally to the extending direction of the wire so that it is liable to be cracked.

Secondly, when the underlying wiring is to be led out, i.e., when the deposited layer is to be formed in the through hole, it is seriously difficult to detect the terminal of deposition. This makes it impossible to control the wiring led-out height due to the metal deposited layer, i.e., the thickness of the deposited film to a constant level. A step is established in the boundary region merging from the continuing new wiring to invite the cracking state so that the wiring cannot be led out in electrically high reliability.

The present invention has been conceived noting the above-specified problems and has an object to prevent any cracking from being caused not only in the wiring by the deposited film formed in the sample surface but also in the boundary region between the wiring led-out portion and the wiring by ensuring the terminal detection at the deposition of the metal layer in the through hole, thereby to improve the reliability of the wiring correcting technique with the laser beam.

Representatives of the invention to be disclosed in the present embodiment will be described in brevity in the following:

Firstly, the wiring is formed by repeating the scans of the laser beam orthogonally to the extending direction of the wiring when the wiring is to be formed on the sample surface.

Secondly, when the metal is to be deposited on the sample by the irradiation of the laser beam, the thickness of the deposited film is controlled by measuring the alteration of the amount of irradiation of the sample with the laser beam.

According to the above-specified first means, the bonding strength of the metallic molecular bonds in the extending direction can be increased by scanning the laser beam orthogonally to the extending direction of the deposited wiring, i.e., in parallel to the direction to cause the cracking easily, thereby to prevent the high resistance due to the disconnection or partial deficiency of the deposited wiring.

According to the second means, moreover, the change in the amount of deposition can be measured by measuring the change in the irradiation sound of the laser beam so that the terminal direction can be easily grasped in the formation of the deposited layer. Thus, it is possible to effect prevent the unevenness of the thickness of the deposited layer due to the difficulty in the terminal detection and accordingly the cracking in the boundary region between the deposited film and the deposited wiring.

FIG. 65A is a block diagram showing the structure of a laser CVD apparatus according to Embodiment 15 of the present invention.

A laser CVD apparatus 1501" according to the present embodiment is constructed of a processing system and a control system, the former of which is equipped in the upper portion of the figure with a processing chamber 1504" having a laser beam source 1502". This laser beam source 1502" is of continuous oscillation argon (Ar) type having a laser output of 200 mW and has its output or the like controlled by an laser optical system controller 1503" disposed outside.

The processing chamber 1504" can have its inside controlled to a predetermined vacuum condition (e.g., about 10 Pa) by a turbo molecular pump 1506" controlled by a vacuum controller 1505". The processing chamber 1504 is arranged therein with an XY stage 1507" which is enabled to more horizontally in a predetermined direction by an XY stage controller 1508" and an XY stage driver 1510" disposed outside of the chamber. The XY stage 1507" is equipped therein with heating means 1509" such as a heater for setting the surface of a sample 1513" to a high temperature of about 300° C. On the surface of the XY state 1507", there is mounted the sample 1513 which is supplied from a later-described spare chamber 1514" onto the XY stage 1507" by an automatic conveyor system 1511" which is controlled by an automatic conveyor system controller 1512". Here, the sample 1513" to be used in the present embodiment may be exemplified by a semiconductor chip, a semiconductor wafer or a semiconductor device in a package assemblage state, if it can have its wiring corrected, i.e., its surface forming face exposed to the outside. Such sample 1513" is mounted on the XY stage 1507" through the aforementioned automatic conveyor system 1511" from the spare chamber 1514" which is formed in the side of the processing chamber 1504". These spare chamber 1504" and processing chamber 1504" are made independent of each other by a shutter mechanism 1515" such that the spare chamber 1514" is enabled to establish a vacuum state independent of the processing chamber 1504" by the turbo molecular pump 1506" which is disposed independently. While the processing chamber 1504" is being held in the vacuum state, the spare chamber 1504" is boosted to a normal pressure, and the sample 1513" is supplied from the outside. After this, the spare chamber 1514" is held air-tight to establish a vacuum state equal to that of the processing chamber 1504". After this, the sample 1513" can be conveyed through the shutter mechanism 1515" from the spare chamber 1514" to the processing chamber 1504".

A modulation unit 1516" is arranged midway of the optical path of the laser beam LB between the laser beam source 1502" arranged above the processing chamber 1504" and the aforementioned XY stage 1507". This modulation unit 1516" is exemplified in the present embodiment by an AO modulator (Acoustic-Optical Modulator). The modulation principle using the AO modulator will be briefly described in the following. The AO modulator gives amplitudes of predetermined period to the laser beam LB from the laser beam source 1502', as shown in FIG. 65D. Specifically, a glass member 1517" transparent to the laser beam LB is arranged at an angle θ of incidence with respect to the laser beam LB. If, in this state, a piezoelectric element 1518" arranged at one end of the glass member 1517" is electrically vibrated by applying an AC current of a predetermined frequency, the glass member 1517" is vibrated to have periodic changes in the waves of condensation and rarefaction, i.e, in the refractive index so that it functions as a diffraction grating to generate a diffracted optical beam having a predetermined amplitude. In the present embodiment, upon the irradiation of the sample 1513" with the laser beam LB, the scanning width of the laser beam in the X direction is determined by the aforementioned modulation unit 1516", and the movement in the Y direction is realized by the control of the XY stage 1507" in the Y direction. Here, the modulation unit 1516 is controlled by an AO scan controller 1520" disposed outside.

In the processing chamber 1504", there is arranged at an inclination toward the upper surface of the XY stage 1507" a gas gun 21" (reactive gas supply means) which is controlled by a gas gun controller 1519" to supply the sample 1503" placed on the XY stage 1507" with the reactive gases GS such as molybdenum carbonyl ($Mo(CO)_6$). Here will be briefly described the principle of the laser CVD. The sample placed under a predetermined vacuum has its surface filled up with the reactive gases GS made of organic metal containing carbonyl radical such as $Mo(CO)_6$ and has its predetermined portion irradiated with the laser beam LB. The reactive gases Gs are optically decomposed to deposit their metal component (molybdenum (Mo)) deposited on the irradiated portion of the sample 1513". The Mo having electrical conductivity is useful for the wiring material over the semiconductor chip. By making use of this technique, it is possible to form a later-described Mo deposited layer 1596" and to realize the logic change in the logic elements and the bit retrieval of the memory element.

Incidentally, the laser CVD apparatus 1501" of the present embodiment is characterized in that an AE sensor 1522" is arranged at the side over the surface of the XY stage 1507" whereas a microphone 1523" is arranged above the AE sensor 1522". These AE sensor 1522" and microphone 1523" are used to collect the irradiation sounds of the sample 1513" with the laser beam LB. The sounds detected by the AD sensor 1522" and the microphone 1523" are amplified by an outside AE amplifier 1524" and have their noises filtered out by a band-pass filter 1525". The sounds cleared of the noises are converted into digital signals by an A/D converter 1526" and are sent to a control computer system 1527".

The so-called "photoacoustic emission" phenomenon, in which sounds are generated when an object is irradiated with an optical beam, is well known in the art. It is also empirically known that processing sounds are generated when the sample 1513" is processed with the pulse laser or the like. The microphone 1523" used in the present embodiment has frequency characteristics within a range of 10 Hz–10 KHz so that it may collect the detection sounds of relatively low frequencies. On the other hand, the AE sensor 1522" has frequency characteristics within a range of 100 KHz–1 MHz so that it may collect the detection sources in a high frequency range. These detection sounds are sent out as the digital signals, as above, to the aforementioned control computer system 1527". In this control computer system 1527", the signals from the actual detection sounds described above are compared with the threshold value, which is obtained by the detection signal sampled in advance, to detect the terminal point during the growth of the Mo deposited layer 1596".

Incidentally, the control computer system 1527" for the main control of the aforementioned individual parts is provided with input/output means such as a CRT 1528". a keyboard 1529", a mouse 1530" and a floppy disk 1531". Through these input/output means, the instruction of the operator can be inputted, and the processing execution results can be displayed and recorded.

FIG. 65E is a sectional view showing the essential portions of the bipolar LSI manufactured by the present Embodiment, which is similar to the bipolar LSI described in the ninth embodiment of the second aspect of the present invention.

In the bipolar LSI of the present embodiment, as shown, a semiconductor chip (semiconductor substrate) 1541" of, for example, p-type silicon is formed in its surface with an $n^+$-type buried layer 1542" and thereover with an epitaxial layer 1543" of, for example, n-type silicon. This epitaxial layer 1543" is formed in its predetermined portion with a field insulating film 1544" of, for example, $SiO_2$ film so that the elements and the individual characteristic portions of the elements may be separated. The field insulating film 1544" is underlaid by a channel stopper region 1545" of, for example, $p^+$-type. In the portion of the epitaxial layer 1543" surrounded by the field insulating film 1544", there are formed an intrinsic base region 1546" of, for example, p-type and a graft base region 1547" of, for example, $p^+$-type. The intrinsic base region 1546" is formed therein with an $n^+$-type emitter region 1548". This emitter region 1548", the intrinsic base region 1546" and the collector region composed of the epitaxial layer 1543" and the buried layer 1542" below the intrinsic base region 1546" constitute together an npn-type bipolar transistor. In the same figure, numeral 1549" designates an $n^+$-type collector take-out region which is connected with the buried layer 1542". Numeral 1550" designates an insulating film such as $SiO_2$ film merging with the aforementioned field insulating film 1544". The insulating film 1550" is formed with holes 1550a"–1550c" corresponding to the graft base region 1547", the emitter region 1548" and the collector take-out region 1549". Through these holes 1550a"–1550c", a base lead-out electrode 1551" made of a polycrystalline silicon film is connected with the graft base region 1547", and the emitter region 1548" is equipped thereover with a polycrystalline silicon emitter electrode 1552". Incidentally, numerals 1553" and 1554" designate insulating films made of, for example, $SiO_2$ films.

Characters 1555a"–1555c" designate first-layer wiring Al films, of which: the wiring 1555a" is connected with the base lead-out electrode 1551" through the hole 1554a" formed in the insulating film 1554"; the wiring 1555b" is connected with the polycrystalline silicon emitter electrode 1552" through the hole 1554b"; and the wiring 1555c" is connected with the collector take-out region 1549" through the holes 1554c" and the aforementioned hole 1550c". On the other hand, numeral 1556" designates an interlayer insulating film composed of an SiN film, a spin-on glass (SOG) film and an $SiO_2$ film, which are formed by the plasma CVD method. This interlayer insulating film 1556" is overlaid by a second wiring 1557" made of, for example, an Al film, which in turn is connected with the aforementioned wiring 1555c" via a through hole 1556a" formed in the interlayer insulating film 1556". Incidentally, the through-hole 1556a" has a stepped form for improving the step coverage of the wiring 1557" in the through-hole 1556a". Numeral 1558" designates an interlayer insulating film similar to the foregoing interlayer insulating film 1556". This interlayer insulating film 1558" is overlaid by third-layer wiring Al films 1559a"–1559c". Of these, the wiring 1559a" is connected with the aforementioned wiring 1557" through the through hole 1558a" formed in the interlayer insulating film 1558". Numeral 1560" designates an inter-layer insulating film similar to the aforementioned interlayer insulating films 1556" and 1558". This interlayer insulating film 1560" is overlaid by fourth-layer wiring Al films 1561a"–1561c". These wiring films 1561a"–1561c" are made thicker than the underlying wirings described above so that they can supply large currents. In the present embodiment, for example, the layer thickness is 2 μm, and the groove widths between the wirings 1561a", 1561b" and 1561c" are 2 μm. Thus, these grooves have a relatively large aspect ratio (groove depth/groove width) of 1.

Numeral 1562" designates a surface flattening insulating film such as an $SiO_2$ film, which is formed, for example, by the bias sputtering of the $SiO_2$ film or by combining the plasma CVD and the sputter etching. Since the grooves between the aforementioned wirings 1561a", 1561b" and 1561c" are buried by the insulating film 1562", this film 1562" has a generally flat surface. Incidentally, the insulating film 1562" may be made of a silicate glass film such as the PSG (Phospho-Silicate Glass) film, BSG (Boro-Silicate Glass) film, BPS (Boro-Phospho-Silicate Glass) film, which are formed by combining the low-pressure CVD and the sputter etching. This insulating film 1562" is overlaid by an SiN film 1563" which is formed by the plasma CVD method. Here, the surface of the insulating film 1562" is flattened so far as the grooves between the wirings 1561a"–1561c" so that the SiN film 1563" also has its surface flattened. As a result, the SiN film 1563" has its thickness and quality relatively homogenized. As a result, a later-described uppermost passivation film 1565" is also relatively flattened to provide a semiconductor chip structure which has a high moisture resistance. This makes it possible to use a non-airtight sealing type package as that for the LSI.

An $SiO_2$ film 1564" formed over the aforementioned SiN film 1563" is formed by the plasma CVD method so that the two films 1563" and 1564" constitute together the chip protecting passivation film 1565". In this case, the aforementioned $SiO_2$ film 1564" not only retains the adhesive properties of a later-described chromium (Cr) film 1566" to the aforementioned passivation film 1565" but also has a function as a mask for preventing the aforementioned SiN film 1563" from being etched during the dry etching of the Cr film 1566".

The aforementioned passivation film 1565" is formed in its portion with a hole 1565a", through which the aforementioned wiring 1561" is formed thereover with the Cr film 1566". This Cr film 1566" is overlaid by a solder bump 1568" which is made of a lead (Pb)-Sn alloy and which is mounted on an intermetallic compound layer 1567" of copper (Cu)-Tin (Sn).

FIG. 65F is a sectional view showing a pin grid array (PGA) type package sealing the bipolar LSI shown in FIG. 65E, similar to that shown in connection with the ninth embodiment of the second aspect of the present invention.

As shown, in said PGA package, the semiconductor chip 1541" is connected onto a chip carrier 1569" made of, for example, mullite ($3Al_2O_3.2SiO_2$) by the use of the solder bumps 1568". In addition, a cap 1570" made of silicon carbide (SiC) is arranged over the semiconductor chip 1541" through brazing material, for example, a solder 1571" so that the semiconductor chip 1541" is sealed up by filling a resin 1572" such an epoxy resin between the cap 1570" and the chip carrier 1569". The cap 1570" is held in contact with the rear surface of the semiconductor chip 1541" (the surface in which no element is formed) through the brazing material 1571", whereby heat can be effectively radiated from the semiconductor chip 1541" to the cap 1570". By the way, in the case of installing the package on the not-shown module board or the like, radiation fins may be mounted on the upper surface of the cap 1570". Incidentally, input/output pins, as designated at 1573", which are projected from the lower surface of the cap carrier 1569", are connected to the aforementioned solder bumps 1568" by the multilayer wiring (not shown) lain in the chip carrier 1569". As a result, the semiconductor chip 1541" can input and output the driving powers and the signals through the aforementioned input/output pins 1573".

Now, a method of manufacturing the bipolar LSI described above will be described by way of example. Steps till the formation of the inter-layer insulator film 1560" shall be omitted from the description.

As shown in FIG. 65G, wiring lines 1561a"–1561c" are formed on the inter-layer insulator film 1560", whereupon an insulator film, for example, $SiO_2$ film 1562" is formed by, for example, the bias sputtering of $SiO_2$ or the combination of plasma CVD and sputter etching. As already state, the front surface of the insulator film 1562" can be made substantially flat. Here, it is assumed by way of example that the depth and width of each groove defined between the adjacent ones of the wiring lines 1561a"–1562c" are 2μ, respectively. Then, in the case where the insulator film 1562" is formed using the bias sputtering of $SiO_2$, it may have a thickness of, for example, about 3.5 μm in order to prevent the substantially flat surface. On the other hand, in the case where the insulator film 1562" is formed by the combination of plasma CVD and sputter etching, it may have a thickness of, for example, about 1.5 μm in order to prevent the substantially flat surface.

Subsequently, as shown in FIG. 65H, an SiN film 1563" which is 5,000 Å thick by way of example is formed on the insulator film 1562" by, for example, plasma CVD.

Subsequently, as shown in FIG. 65I, an $SiO_2$ film 1564" which is 1 μm thick by way of example is formed by, for example, the plasma CVD. In this way, a protective film 1565" is formed.

Next, as shown in FIG. 65J, the predetermined part of the protective film 1565" is etched and removed, thereby to form a hole 1565a" to which the front surface of the wiring line 1561b" is exposed. Under this state, the whole front surface of the resultant structure is overlaid with a Cr film 1566" having a thickness of, for example, 2,000 Å, a Cu film 1574" having a thickness of, for example, 500 Å and a gold (Au) film 1575" having a thickness of, for example, 1,000 Å, in succession by, for example, evaporation. Thereafter, the Au film 1575", Cu film 1574" and Cr film 1566" are patterned into predetermined shapes by etching. The reasons why such three-layered films are required will be explained in the following. The Au film 1575" serves to prevent the oxidation of the Cu film 1574", and this Cu film 1574" serves to secure the wettability of a solder bump 1568" with its underlying layer. In addition, the etching operations of the Au film 1575" and the Cu film 1574" are carried out with, for example, wet etching, while the etching operation of the Cr film 1566" is carried out with, for example, dry etching which employs a gaseous mixture containing $CF_4$ and $O_2$. As already stated, during the dry etching, the $SiO_2$ film 1564" functions as an etching stopper, so that the underlying SiN film 1563" can be prevented from being etched.

Next, as shown in FIG. 65K, a resist pattern 1576" of predetermined shape is formed on the $SiO_2$ film 1564", whereupon the whole front surface of the resultant structure is formed with a Pb film 1577" and an Sn film 1578" in succession by, for example, evaporation. Thus, the Au film 1575", Cu film 1574" and Cr film 1576" are covered with the Pb film 1577" and Sn film 1578". The thickness of the Pb film 1577" and Sn Film 1578" are selected so that the Sn content of the solder bump 1568" to be formed later may become a predetermined value.

Subsequently, the resist pattern 1576" is removed along with the parts of the Pb film 1577" and Sn film 1578" formed thereon (by the so-called "lift-off", whereupon the resultant structure is annealed at a predetermined temperature. Thus, the Pb film 1577" and the Sn film 1578" are alloyed, and the solder bump 1568" of Pb-Sn alloy system which is substantially global is formed as shown in FIG. 65E. In the alloying process, Sn in the Sn film 1578" is alloyed with Cu in the Cu film 1574", whereby a layer of intermetallic compound of Cu-Sn system 1567" is formed between the solder bump 1568" and the Cr film 1566". As a result, the bonding strength of the solder bump 1568" to the semiconductor chip 1541" is enhanced. In actuality, Au from the Au film 1575" is also contained, although minute, in the solder bump 1568".

Next, the inner construction of a semiconductor chip of VLSI (Very Large Scale Integration) which is an example of an object to be inhaled in the present invention will be described.

The semiconductor chip 1541" is used as the CPU or any other logical processing unit and the memory device of a main frame computer (ultrahigh speed computer). Accordingly, it needs to have a very large number of input/output terminals. In general, it is installed on or connected to an external package or circuit board by wire bonding when it has up to above 200 pins, and by CCB (Controlled-collapse Solder Bumps) or the like when it has more pins.

The semiconductor chip 1541" is in the shape of a square or oblong plate whose later are 10 mm–20 mm long. The principal surface of the chip for forming circuit elements is formed with ECL (Emitter-Coupled Logic) circuits and other required CMOS (Complementary MOS) circuits, and the internal chip construction corresponding to a requested specification is selected to a designing and manufacturing system similar to that of a so-called gate array.

FIG. 65L is a top model diagram showing the layout of second–fourth layers of A1 wiring on the semiconductor chip. Referring to the figure, numeral 1561" designates the fourth-layer metal wiring lines which shall be termed "A1–3" and which are laid in a large number so as to chiefly extend substantially over the full vertical length of the chip in the direction of a Y-axis. Numeral 1559" designates the third-layer metal wiring lines which shall be termed "A1–2" and which chiefly extend in the direction of an X-axis. Numeral 1557" designates the second-layer metal wiring lines which shall be termed "A1–2" and which chiefly extend in the Y-axial direction. Although the A1 wiring lines of each of the layers are shown only partly, they are laid on the entire upper surface of the chip as may be needed. Each of characters 1581*a*"–1581*g*" denotes a power source wiring line or z reference voltage wiring line having a width of 50 to 200 μm (in the case of the ECL, $E_{ESL}$=−4 V, $V_{EE}$=−3 V, $V_{TT}$=−2 V, and $V_{CC1}$, $V_{CC2}$ and $V_{CC3}$=0 V). Characters 1584Y" denote fourth-layer space wiring lines termed "A1S-4", each of which has a width of 10 μm and which are laid so as to extend substantially over the full vertical length of the chip 1541" on the upper surface thereof here.

Characters 1583*a*"–1583*h*" denote the third-layer wiring lines A1-3 which have pitches of 5 μm and widths of 3.5 μm, and which are automatically laid out as required by interconnections. Characters 1583*X*" represents a third-layer space wiring line termed "A1S-3", which is laid every fifth pitch and which extend substantially over the full lateral length of the chip on the upper surface thereof. The floating spare wiring lines A1S-3 and A1S-4 can cover substantially the whole area of the chip. Characters 1582*a*"–1582*f*" denote the second-layer wiring lines A1-2 which have pitches of 5 μm and width of 3.5 μm, and which are automatically laid out as required by the interconnection in association with the third layer wiring lines A1-3.

FIG. 65M is a chip layout diagram concerning a wiring correction process, supporting tools, etc. Referring to the figure, characters 1585*a*" and 1585*b*" denote origin detecting patterns which serve to detect the angle θ between the origin and reference axis of a pattern on a chip 1541", and which are formed by the fourth-layer wiring A1-4. Numeral 1586" designates a trial digging region for testing the formed state of the under layer. Characters 1587*a*" denote a processing reference mark, namely, a metal pattern for detecting an inter-layer deviation, which is formed by the third-layer wiring A1-3, while characters 1587*b*" denote a similar metal pattern for detecting an inter-layer deviation, which is formed by the fourth-layer wiring A1-4.

Characters 1588*a*"–1588*d*" denotes spare gate cells, respectively. Designated at numeral 1589" is a region where marks or patterns are formed to record the wiring correction history, specification, product namer, type etc. with letters or symbols by, for example, the laser CVD described with reference to FIG. 65A.

FIG. 65N is a plan view showing only antenna wiring formed by the third-layer wiring A1-3, in the plan layout of the spare gate cell.

In the figure, characters 1591*a*"–1591*j*" denote the antenna wiring lines as termed "A1A-3", respectively.

FIG. 65O is a model circuit diagram of the built-in elements and gates of the aforementioned spare gate cell.

In the figure, characters $SR_1$ and $SR_2$ denote spare resistors, and characters $SG_1$ and $SG_2$ denote the ECL spare gates.

Now, several patterns in the wiring correction method of the present invention will be described. Here, all the figures to be described are directed to examples of the ECL circuit.

FIG. 65P is a model circuit diagram showing a correctional pattern called "input high clamp". Referring to the figure, characters $G_2$ and $G_3$ denote wired gates (OR gates) which have input wiring lines $I_4$–$I_8$ and output wiring lines $O_2$ and $O_3$. A voltage $V_{CC}$ is one of the aforementioned voltages $V_{CC1}$–$C_{CC3}$. As shown, the input wiring line $I_4$ is broken at $C_1$ but is connected to $V_{CC}$ through the jumper correcting wiring $C_2$ made of molybdenum (Mo) so that the input wiring $I_4$ of the gate $G_2$ is clamped at the "High state". The jumper correcting wire $C_2$ is formed by the aforementioned laser CVD apparatus, as will be described in detail hereinafter.

FIG. 65Q is a mode circuit diagram showing a correctional pattern called "reverse output use". Referring to the figure, characters $G_4$ and $G_5$ denote wired gates, and letters SG denote spare gates (corresponding to those $SG_1$ and $SG_2$ in FIG. 15O) included in the spare gate cell 1588 which is one of those 1588*a*"–1588*d*" in FIG. 54B. Characters $I_9$–$I_{14}$ and $I_{24}$, $I_{25}$ denote the input wiring lines of the gates, and characters $O_4$ and $O_5$ denote the output wiring lines of the respective gates $G_4$ and $G_5$. Characters $C_3$ and $C_4$ denote correctional jumper wires similar to those which have been with reference to FIG. 65P.

FIG. 65R is a model circuit diagram of a correctional pattern called "spare gate addition". Referring to the figure, characters $G_6$–$G_8$ denote wired gates, and letters SG or broken line 1548" denote spare gates in the spare gate cell 1588" similarly to the foregoing. Characters $I_{15}$–$I_{23}$ denote the input wiring lines of the gates, and characters $O_5$ denote the output wiring line of the gate $G_7$. Characters $C_5$–$C_7$ denote jumper correctional wiring lines, respectively.

Next, the formation of the jumper correctional wiring lines $C_1$–$C_7$, namely, the process of this correctional system will be described in the following.

In developing a large-sized system, for example, main frame computer, several hundred sorts of logic LSIs are simultaneously developed, and the system is debugged and adjusted by the use of the logic LSIs. Besides, in the presence of any logical defect or any point of alteration, each LSI must be remade promptly. In the present invention, therefore, the semiconductor chips 1541" (LSI) formed with the CCB electrodes (solder bump 1568") (as shown in FIG. 65E) and diced (split) into the chip states are kept in stock, and they are subjected to corrections as indicated by the aforementioned correctional patterns and the preceding embodiments, whereby the LSI can be completely remade in 5–30 hours.

Here, the wiring corrections are possible, not only in the chip state, but also in the wafer state, as has been described in FIGS. 65P–65R. In the wafer state, positioning (alignment) etc. are easier, whereas a turnaround time expanded in correcting and remaking the LSI becomes longer. Accordingly, the wafer corrections are also possible in field where such a demerit is allowed. In, for example, WSI (Wafer Scale Integration), where the LSI is formed of a single wafer, the wiring corrections are effective in the wafer state.

Regarding the corrections in the chip state, the wiring can be corrected, not only in the state of the chip per se, but also in the state in which the chip is die-bonded to a package base or in the state in which the wire bonding of the chip has been completed. In this case, the turnaround time can be shortened more. This also holds true of the case of applying the TAB (Tape Automated Bonding) techniques.

For these wiring corrections, the spare chips each of which has been split in the state of FIG. 65E by way of example are kept in stock for each sort of products, and they are corrected in correspondence with the results of the debug.

First, the trial digging region 1586" in FIG. 65M is dug with an FIB (Focus Ion Beam) by way of trial, and the detection data of the digging is stored. Further, the misregistration between the wiring layers A1-3 and A1-4 is detected using the inter-layer deviation detecting patterns 1587*a*" and 1587*b*" in the same figure, and the data of the detection is stored. Subsequently, the operations or calculations of bringing designed pattern data on the chip and the origins and axes of actual patterns into agreement are executed using the origin and θ detecting patterns 1585*a* and 1585*b* in the same figure. In accordance with the operations or calculations, the following corrections as shown in FIGS. 65S–65Y are made:

FIG. 65S is an enlarged top view of the correctional part of the principal surface of the chip 401" corresponding to FIGS. 65L and 65M. In FIG. 65S, numerals 1581" designate the broad A1-4 power source wiring (including the reference voltage wiring) lines, respectively. Characters 1583X" denote the spare wiring line A1S-3 extending in the X-axial direction and formed by the third-layer wiring A1-3 coupled with any element). Characters 1584Y" denote the spare wiring line A1S-4 extending in the Y-axial direction and formed by the fourth-layer A1 wiring. Numeral 1596" designates a molybdenum (Mo) layer which is formed by laser CVD in a vertical hole provided by an FIB. The formation of this Mo layer 1596" will be described hereinafter.

FIG. 65T is a sectional view taken along line X—X of FIG. 65S. In FIG. 65T: numeral 1588" denotes a third-layer interlayer insulating film; characters 1583X" a third-layer spare wiring line; numeral 1560" a fourth-layer interlayer insulating film; numeral 1581" a power supply wiring line; numeral 1565" a final passivation or protective film; characters 1584Y" a fourth-layer spare wiring line; and numeral 1593" an underlying Cr (chromium) film.

FIG. 65U is an enlarged plan view showing the portion subjected to another correcting technique. Only the portions different from those of FIGS. 65S and 65T will be described in the following.

In the same figure (FIG. 65U): numeral 1599" denotes a short-circuit preventing notch processed by the FIB; numerals 1597" and 1598" Mo layers, as will be detailed hereinafter; and numeral 1520" a jumper correcting wiring line connecting the Mo layers 1587" and 1598".

FIG. 65V is a sectional view taken along X—X in FIG. 65U, and various characters shall not be repeatedly explained as they have already been described. This technique is effective particularly in a case where the spare wiring line 1583X" does not extend to directly under the spare wiring line 1584Y", a case where the spare wiring line 1583X" is replaced with the ordinary wiring line A1-3, and so forth.

In FIGS. 65W–65Y showing another correctional technique: FIG. 65W is a plan view showing an example which employs the spare gates; FIG. 65X is an enlarge view showing a pertinent portion of the same; and FIG. 65Y is a sectional view taken along line X—X of FIG. 65X.

Referring to the figures, numeral 1588" designates the spare gate cell, and characters 1591*a*"–1591*j*" denote the antenna wiring lines which are formed by the third-layer wiring A1-3 and which are respectively connected through the second-layer and first-layer wiring lines A1-2 and A1-1 to any terminals of the elements $SG_1$, $SG_2$, $SR_1$ and $SR_2$ in FIG. 65O. Further, numerals 1581" designate the broad power source wiring lines formed by the fourth-layer wiring A1-4, respectively. Characters 1584Y" denote the spare wiring line A1S-4, and characters 1583X" denote the spare wiring line A1S-3. Numeral 1521", as enclosed by single-dotted circle, designates an essential part to be corrected, as shown in FIGS. 65X and 65Y.

Numerals 1522" and 1523" in FIGS. 65X and 65Y designate Mo layers, and numeral 1524" designate a jumper correcting wiring line.

Next, the process for forming the Mo layers 1596", 1587", 1598", 1522" and 1523" and the jumper correcting wiring lines 1520" and 1524" explained above with reference to the drawings will be described in detail in the following.

FIG. 65B is a sectional view showing the essential portions showing the process for forming the Mo layer and the jumper correcting wiring line.

First of all, as shown at (a) in FIG. 65B, the coordinates of a portion to be corrected are determined on the basis of the data confirmed in the preceding testing step. After this, a through-hole 1592" is formed through the protective film 1565" by the FIB. This through-hole 1592" has a diameter of about 5 μm and a depth of about 10 μm to lead out the wiring line 1561" formed over the interlayer insulating film 1560" to the upper layer. The wiring line 1561" has its surface exposed to the bottom of said through hole 1592".

Next, as shown at (b) in the same figure, the inner circumferences of the protective film 1565" and the through-hole 1592" and the exposed surface of the wiring line 1561" are sputter-etched in the atmosphere (of 1 Pa) of argon (Ar). After this, all the surfaces are sputtered with a film of chromium (Cr) having a thickness of 200–300 Å to form the underlying Cr film 1593".

The sample 1513" (such as the semiconductor chip, semiconductor wafer or package) thus formed with the underlying Cr film 1593" is supplied to the laser CVD apparatus 1501", as shown in FIG. 65A. At this time, the sample 1513" is once stocked in the spare chamber 1514" held in the normal pressure state and is then conveyed over the XY stage 1507" through the automatic conveyor system 1511" from the spare chamber 1514" which has been under the same pressure state (about 10 Pa) as the processing chamber 1504". If the sample 1513" is positioned in this state, the sample 1513" in the processing chamber 1504" is covered by the action of the gas gun 1521" with the atmosphere of the reactive gases GS made of molybdenum carbonyl ($Mo(Co)_6$). If the laser beam source 1502" is subsequently operated by the laser optical system controller 1503", the wiring line 1561" on the bottom of the aforementioned through hole 1592" is irradiated with the laser beam LB which has a diameter focused to about 3 μm. At this time, the $Mo(Co)_6$ is decomposed with the laser beam LB to deposit the component Mo on the surface of the wiring line 1561" (as shown at (c) in FIG. 65B). With this irradiation of the laser beam LB, the Mo layer 1596" on the wiring line 1561" gradually grows to bury the through-hole 1593" completely. If the irradiation of the laser beam LB is continued in this state, the Mo layer 1596" further grows. With an excessive growth, the boundary region with the jumper correcting wiring line 1594" to be formed later is liable to be cracked. If the growth is deficient, on the contrary, the electrical connection with the jumper correcting wiring line 1594" becomes difficult. This makes it desirable to control the height of the Mo layer over the through-hole 1592" to a range within h=0.3 μm–1.0 μm. This control of the height h of the Mo layer 1596" has been accomplished, in the prior art, by the predicted value which has been obtained by measuring the depth of the through-hole 1592" and the period of time for the irradiates of the laser beam LB in advance so that a precise control is hard to achieve. In this regard, according to the present embodiment, the irradiation sounds of the laser beam LB are detected by means of the AE sensor 1522" and the microphone 1523", as has been described with reference to FIG. 65A. In terms of the change in the detected sounds, the thickness of the Mo layer 1596", i.e., the distance h appearing at (d) in FIG. 65B can be measured so that the distance h can be controlled to a proper value. For this control, in the control computer system 1537" of FIG. 65A, for example, the detected sound signals in the digital form are always compared with the threshold value sampled in advance. The instant, which the signals of the detected sounds exceed the threshold value, is determined to be the terminal point of generating the Mo layer 1596". When this generation terminal is detected, the control computer system 1577" sends an instruction to the laser optical system controller 1503" to stop the operations of the laser beam source 1502" thereby stop the generation of the Mo layer 1596".

Subsequently, the jumper correcting wiring line 1594" having a thickness of about 0.3 μm–1.0 μm and a width of about 3.0 μm–15 μm, as shown at (e) in FIG. 65B, is formed to cover the Cr film 1593" coating the upper surface of the protective film 1565". At this time, in the present embodiment, the height h of the deposited layer is accurately controlled so that no step is established between the Mo layer 1596" and the jumper correcting wiring line 1594" to provide generally a flatness inbetween. The formation of the jumper correcting wiring line 1594" is accomplished in the present embodiment by scanning the laser beam LB at a right angle with respect to the extending direction of the jumper correcting wiring line 1594", as shown in FIG. 65C. In this case, the scan of the laser beam LB in the orthogonal direction (X direction) is realized with the amplitude which is generated by the modulation unit 1516", i.e., the A0 modulator described with reference to FIG. 6A. On the other hand, the movement of the laser beam LB in the Y direction is relatively realized by moving the XY stage 1507" carrying the sample 1513" at a low speed in the Y direction. In the present embodiment, for forming the jumper correcting wiring line 1594", a high metallic bonding strength of the metallic molecules in the direction orthogonal to the extending direction of the wiring can be attained by scanning the laser beam LB in the orthogonal direction. Even if the protective film 1565" has a stepped surface, according to the present embodiment, the wiring can be corrected highly reliably while preventing its course from being cracked. According to the present embodiment, moreover, the sample 1513" has its surface heated to as high as 300° C. by the heating means 1509" built in the XY stage 1507" while the jumper correcting wiring line 1594" is being formed. As a result, the Mo deposited by the irradiation with the laser beam LB is annealed by the heating to raise an effect that the interlayer resistance in the jumper correcting wiring line 1594" is dropped.

After the formation of the jumper correcting wiring line 1594", the underlying Cr film 1593" at the unnecessary portion is sputtered out in the Ar atmosphere by using the jumper correcting wiring line 1594" as a mask.

As has been described hereinbefore, the on-chip wiring corrections after the formation of the protective film 1565" are executed by combining the techniques shown in FIGS. 65S–65Y when the correcting patterns of FIGS. 65P–65R are to be executed. After or substantially simultaneously with these corrections, the recording region 1589" shown in FIG. 65M is recorded with the wiring correction history, specification, product name, type etc. with letters or symbols by scanning the laser beam LB of the laser CVD apparatus 1501" of the present embodiment. For these records, not only letters, numerals or suitable symbols but also bar codes or other various codes for computer recognitions can be used.

Although our invention has been specifically described in connection with the embodiment thereof, it should not be limited thereby but can naturally be modified in various manner within the range of the scope thereof.

For example, the modulation unit may be exemplified by another optical means although the foregoing description is directed to the case the AO modulator is used.

The description thus far made is directed mainly to the case in which our invention is applied to its field of application, i.e., the wiring corrections when the logics of the so-called logical elements are to be altered. However, the present invention should not be limited thereto but can be applied to the wiring corrections when the bits of memory elements or the like are to be retrieved.

The effects obtainable form the representative of the invention disclosed in the present embodiment will be briefly described in the following:

By scanning the laser beam in a direction perpendicularly to the extending direction of the deposited wiring, i.e., in parallel to the direction to cause the cracks easily, the mechanical strength in said direction can be enhanced to prevent the disconnection of the deposited wiring or the high resistance due to the partial disconnection.

By measuring the change in the irradiation sounds of the laser beam, moreover, the change in the deposition can be measured to facilitate the detection of the terminal point at the deposition. As a result, it is possible to effectively prevent both the unevenness of the thickness of the deposited film due to the difficulty in the terminal control and the cracking in the deposited wiring line.

Thus, it is possible to realize the highly reliable wiring corrections.

Embodiment 16

The present embodiment corresponds to another improvement in the device for the A1 wiring on a chip according to Embodiments 4, 5 and 6.

In the aforementioned connection correcting method of the wiring lines by the FIB, if a wiring layer is present over the lower wiring lines to be corrected, the wiring lines will be short-circuited through the conductive film formed by the laser CVD.

Therefore, it has been revealed by us that the spare regions of the upper wiring lines, i.e., the insulating film regions existing between the upper wiring lines should be corrected.

In the BIP logic LSI, for example, the uppermost wiring layer provides the power source wiring lines, which are made thick to prevent the electromigration. In case, therefore, the LSI is to be corrected, the insulating film regions between the upper wiring lines should be corrected, as has been revealed by us.

In case the insulating film regions between the upper wiring lines are to be corrected, moreover, it has also been revealed that the following problem will arise if the insulating film regions have different widths.

Since the wiring layer has a high thermal conductivity whereas the insulating layer has a low thermal conductivity, the wiring layer has its temperature hard to rise whereas the insulating layer has its temperature easy to rise in case the wiring layer and the insulating layer are irradiated with laser beams of the same output from the laser CVD.

Between the wiring layer and the insulating layer, there is established a temperature difference makes it easy for the conductive film to be deposited on the insulating layer at a higher temperature but hard for the conductive film to be deposited on the wiring layer at a lower temperature.

This phenomenon is also experienced in the case of the corrections in the insulating film regions between the upper wiring lines.

In other words, the portion of the narrow insulating film regions to be corrected and the portion of the wide insulating film regions to be corrected are at different distances to the adjacent upper wiring lines so that their temperature rises are different with the irradiation of the laser beam.

Because of this temperature differences, the portion of the narrow insulating film regions to be corrected has a small temperature rise so that the conductive film is hard to be deposited, whereas the portion of the wide insulating film regions to be corrected has a large temperature rise so that the conductive film is easy to be deposited.

As a result, if the insulating film regions has different widths to be corrected, the depositions of the conductive film in the individual portions to be corrected are dispersed so that the conductive film cannot be made uniform.

In order to make the conductive film uniform, therefore, there is conceivable a correcting method, by which the width of the insulating film regions in the portion to be corrected is recognized so that the laser beam may be irradiated under the recognition by finely adjusting the output of the laser beam for each insulating film region to be corrected.

According to this correcting method, however, the wiring correctional operations are complicated together with the wiring correction processing system.

In addition, the improvement in the yield of the wiring correctional operations is obstructed.

An object of the present invention is to provide a semiconductor device technique capable of facilitating the correcting operations of wiring lines, simplifying the wiring correcting system and improving the yield of the wiring correcting operations.

A representative of the invention to be disclosed in the present embodiment will be briefly described in the following:

According to the present invention, there is provided a semiconductor device manufacturing method comprising the steps of: generally equalizing the widths of a plurality of or all of insulating film regions to be interposed between adjacent upper wiring lines; forming through holes extending to lower wiring lines in said insulating film regions; and burying conductive films in said through holes by the laser CVD.

There is also provided a semiconductor device in which through-holes extending to a lower wiring layer is formed in insulating film regions interposed between adjacent upper wiring lines and in which a conductive film by the laser CVD is buried in said through holes, wherein the improvement resides in that the width of the insulating film regions formed with said through-holes is substantially equalized.

According to the semiconductor device manufacturing method of the present invention, the laser beam by the laser CVD is caused to irradiate the through-holes in the insulating film regions of the substantially equal width so that the temperature rise of the insulating film regions can be equalized by the irradiation with the laser beam of the equal output thereby to equalize the deposition of the conductive film.

Thus, the deposition of the conductive film can be equalized without any fine adjustment of the output of the laser beam of the laser CVD for each insulating film regions to be corrected, thereby to facilitate the corrections of the wiring lines, simplify the wiring correcting system and improve the yield of the wiring corrections.

According to the above-specified semiconductor device, moreover, the insulating film regions to be formed with the through-holes, in which the conductive film is to be buried, are made to have the substantially equal width so that the laser beam by the laser CVD is enabled to irradiate the through-holes in the insulating film regions of the substantially equal width, thereby to equalize the temperature rise of the insulating film regions by the irradiation with the laser beam of the equal power and accordingly the deposition of the conductive film.

As a result, the deposition of the conductive film can be equalized without finely adjusting the output of the laser beam of the laser CVD for each insulating film region to be corrected, thereby to facilitate the corrections of the wiring lines, simplify the wiring corrections and improve the yield of the wiring corrections.

FIG. 66A is an enlarged plan view showing the portion of a wiring pattern over a semiconductor wafer in the semiconductor device according to Embodiment 16 of the present invention; FIG. 66B is a sectional view of the portion taken along line II—II of FIG. 66A; FIG. 66C is a perspective view showing a pertinent portion of a focusing ion beam apparatus; FIG. 66D is a sectional view showing the portion at the wiring correcting step of the semiconductor device shown in FIG. 66A; FIG. 66E is a perspective view showing a pertinent portion of a laser CVD apparatus; FIG. 66F is a sectional view showing a portion at the wiring correcting step of the semiconductor device shown in FIG. 66A FIG. 66G is a plan view showing a portion of a wiring pattern over the semiconductor wafer shown in FIG. 66A; FIG. 66H is a plan view showing a portion of a wiring pattern over a semiconductor wafer in the semiconductor device according to another embodiment of the present invention; and FIG. 66I is a plan view showing a portion of a wiring pattern over a semiconductor wafer in the semiconductor device according to still another embodiment of the present invention.

The semiconductor device of the present embodiment is a BIP logic LSI, the semiconductor chip 1601" of which has its individual insulating film regions 1602", 1603", 1604" and 1605" made of a material such as $SiO_2$ (silicon oxide) or $SiN_4$ (silicon nitride), as shown in FIG. 66B.

A plurality of uppermost wiring lines (upper wiring lines) 1606" are power source wiring layers which are made of a material such as an alloy of Al (aluminum), Si (silicon) and Cu (copper) or an alloy of Al (aluminum) and Si (silicon) and extended in a plurality vertically of FIG. 66A.

The wiring width of each wiring line 1606" is made thick to prevent the electromigration.

Below the wiring lines 1606", a plurality of predetermined wiring lines 1607" (upper wiring lines 1606") are made of a material such as an alloy of Al (aluminum), Si (silicon) and Cu (copper) or an alloy of Al (aluminum) and Si (silicon) and extended in a plurality orthogonally to the wiring lines 1606".

Incidentally, for example, the insulating film region 1603" has a thickness of about 1.5 μm; the insulating film region 1604" and the wiring line 1606" have a thickness of about 2 μm; the insulating film region 1605" has a thickness of about 2 μm; and the wiring line 1607" has a thickness of about 1.2 μm.

As shown in FIGS. 66A and 66B, the insulating film regions 1604" interposed between the adjacent wiring lines 1606" have a substantially equal width W.

In the present embodiment, the insulating film regions 1604" interposed between the wiring lines 1606" of the semiconductor chip 1601" also have a substantially equal width W.

Next, the method of correcting the wiring lines of the semiconductor device according to the present invention will be described in the following.

First of all, as shown in FIG. 66C, a semiconductor wafer 1609" arrayed with the semiconductor chips 1601" is placed on an X-Y table 1608" of a focusing ion beam apparatus, and the semiconductor wafers 1609" are positioned such that a desired portion 1610" to be corrected comes to just below an ion source 1611".

In this case, the desired portion 1610" to be corrected is located, as shown in FIG. 66A, generally at the centers of the width W of the insulating film regions 1604" or the spare regions of the wiring lines 1606" while avoiding the regions of the wiring lines 1606".

Then, through-holes $Th_1$ and $Th_2$ extending to the wiring lines 1607" are formed generally at the centers of the widths W of the insulating film regions 1604" by irradiating the general centers of the widths W of the insulating film regions 1604", i.e., the corrected portions 1610" with the ion beam $I_B$ of Ga (gallium) ions, for example, and by etching the insulating film regions 1603", 1604" and 1605" to expose the wiring lines 1607" by making use of the sputtering effect of the ion beam $I_B$, as shown in FIG. 66D.

For example, the through-holes $Th_1$ and $Th_2$ have a diameter of about 2–3 μm.

Thus, the three through-holes $Th_1$ and $Th_2$ are positioned generally at the centers of the widths W of the desired insulating film regions 1604". The reason why the portions to be formed with the through-holes $Th_1$ and $Th_2$, i.e., the desired portions 1610" to be corrected are positioned generally at the centers of the widths W of the insulating film region 1604" is to prevent the wiring lines 1606" from being short-circuited through conductive films 1612" (as shown in FIG. 66F) to be formed in the through-holes $Th_1$ and $Th_2$.

Then, the conductive films 1612" are buried in the desired through holes $Th_1$ and $Th_2$ thus formed.

The laser CVD is used for burying the conductive films 1612" in the through-holes $Th_1$ and $Th_2$.

As shown in FIG. 66E, for example, the semiconductor wafer 1609" is placed on the X-Y table 1613" of the laser CVD apparatus such that the predetermined through-holes $Th_1$ and $Th_2$ come to just below a laser beam source 1614.

Then, the through-holes $Th_1$ and $Th_2$ are irradiated with the laser beam $L_B$ at Ar (argon), for example, to supply the semiconductor wafer 1609" with reactive gases such as $Mo(CO_6)$ or $W(CO_6)$ through a reactive gas supply pipe 1615".

The insides of the through-holes $Th_1$ and $Th_2$ are heated by the irradiation with the laser beam $L_B$ so that the reactive gases are decomposed by the heat to bury the conductive films 1612" of Mo (molybdenum) or W (tungsten) in the through-holes $Th_1$ and $Th_2$, as shown in FIG. 66F.

In this case of the present embodiment, the through-holes $Th_1$ and $Th_2$ positioned in the insulating regions 1604" having the substantially equal width are irradiated with the laser beam $L_B$ of the laser CVD thereby to bury the conductive films 1612.

In case, on the contrary, the conductive films are buried by irradiating the individual through holes of the insulating film regions of different widths with the laser beam $L_B$ of the laser CVD, the temperature rises of the individual corrected portions by the irradiation with the laser beam $L_B$ of the same output are not equalized due to the difference in the widths so that the deposition of the conductive film is not equalized. According to the correcting method of the present embodiment, however, the conductive films are buried by the irradiating the through-holes $Th_1$ and $Th_2$, which are positioned generally at the centers of the insulating film regions 1604" having the substantially equal width W, with the laser beam $L_B$ of the laser CVD so that the temperature rises of the individual corrected portions 1610" can be equalized by the irradiation of the laser beam $L_B$ of the same output thereby to equalize the depositions of the conductive films 1612".

As a result, the depositions of the conductive films 1612" can be equalized without finely adjusting the output of the laser beam $L_B$ of the laser CVD for each of the portions 1610" to be processed, thereby to facilitate the corrections of the wiring lines, simplify the wiring correcting system and improve the yield of the wiring corrections.

In the present embodiment, moreover, all the insulating film regions 1604" between the wiring lines 1606" of the semiconductor chip 1601" have the substantially equal width W.

No matter what of the insulating film regions 1604" might be the desired portions 1610" to be corrected, the aforementioned individual effects can be attained, and the portions 1610" affording the effects are not limited to the predetermined insulating film regions 1604".

From this point, too, it is possible to facilitate the correcting operations of the wiring lines, to simplify the wiring correcting system and to improve the yield of the wiring corrections.

In the semiconductor device thus far described, as shown in FIG. 66G, the insulating film regions 1604" having the equal width W extend only in the XY directions such that straight lines $l_1$ extending middle of the width W of the insulating film regions 1604" are positioned to fall in grid points P.

Moreover, the grid points P on the straight lines $l_1$ are the correctable portions, i.e., the portions which can be formed with both the through-holes $Th_1$ and $Th_2$ by the aforementioned focusing ion beam apparatus and the conductive films 1612" by the aforementioned laser CVD apparatus.

In the semiconductor device shown in FIG. 66H, on the contrary, there are formed both the insulating film regions 1604", which extend in the XY directions like before, and the insulating film regions 1604" which extend at an angle of inclination of 45 degrees with respect to the XY axes. Both the insulating film regions 1604" also have the equal width W.

Moreover, the straight lines $l_1$ extending middle of the width W of the insulating film regions 1604" extending in the XY directions are located at the grid points P. On the contrary, the straight lines $l_2$, which are located at middle of the width W of the insulating film regions 1604" and inclined at the angle of 45 degrees, are spaced from the grid points P.

In the semiconductor device shown in FIG. 66H, therefore, the straight lines $l_2$ at the inclination angle of 45 degrees and at the middle of the width W of the insulating film region 1604" are spaced from the grid points P, thus making it considerably difficult to form the through-holes $Th_1$ and $Th_2$ by the aforementioned focusing ion beam apparatus and to systemize the formation of the conductive films 1612" by the aforementioned laser CVD apparatus. Since, on the contrary, the width W of the insulating film regions 1604" extending in the XY directions and the width W of the insulating film regions 1604" extending at the inclination angle of 45 degrees are equalized, the temperature rises can be equalized without fail by the irradiation with the laser beam of the equal output at any corrected portion on the straight lines $l_1$ and $l_2$ of the insulating film regions 1604" of the two types.

Next, in the semiconductor device shown in FIG. 66I, there are formed both the insulating film regions 1604" extending in the XY directions and the insulating film regions 1604" extending at the inclination angle of 45 degrees, both of which have slightly different widths W.

Specifically, the width W of the insulating film regions 1604" extending at the inclination angle of 45 degrees is $\sqrt{2}$ times as large as the width W of the insulating film regions 1604" extending in the XY directions so that the insulating film regions 1604" of the two types have their width W substantially equalized.

In the semiconductor device shown in FIG. 66I, moreover, the straight lines $l_2$ at the middle of the width W of the insulating film regions 1604" at the inclination of angle of 45 degrees are also made to extend at the grid points P. Thanks to this structure, it is easy to systemize both the formation of about through holes $Th_1$ and $Th_2$ with the aforementioned focused ion beam and the formation of the conductive film 1621" by the aforementioned laser CVD.

Although our invention has been specifically described in connection with the embodiments thereof, it should not be limited thereto but can naturally be modified in various manners without departing from the gist thereof.

In the foregoing embodiments, for example, all the insulating film regions 1604" interposed between the wiring lines 1606" over the semiconductor chip 1601" are made to have the equal of substantially equal width W. In the present invention, moreover, at least those of the insulating film regions 1604", which are highly probably corrected, may be identical or substantially identical.

The description thus far made is directed to the case in which our invention has been applied to the logic correcting technique providing its background. Despite of this fact, however, the present invention should not be limited thereby but can be applied to the connection correcting technique of the wiring lines with a view to analyzing the malfunctions and correcting (debugging) the computer program.

The effects to be obtained by the representative of the invention to be disclosed in the present embodiment will be briefly described in the following.

Since the through-holes of the insulating film regions having the substantially equal width are irradiated with the laser beam by the laser CVD, the irradiation with the laser beam of the equal output can equalize the temperature rises of the insulating film regions and accordingly the depositions of the conductive films.

As a result, the depositions of the conductive films can be equalized without finely adjusting the output of the laser beam of the laser CVD for each of the insulating film regions to be corrected, to facilitate the correcting operations of the wiring lines, to simplify the wiring correcting system and to improve the yield of the wiring corrections.

According to the semiconductor device thus far described, the insulating film regions to be formed with the through holes, in which the conductive films are to be built, are made to have the substantially equal width so that the laser beam of the laser CVD is caused to irradiate the through holes in the insulating film regions of the substantially equal width. The irradiation with the laser beam of the equal output can equalize the temperature rises of the insulating film regions and accordingly the depositions of the conductive films.

As a result, without finely adjusting the output of the laser beam of the laser CVD for each insulating film region at its corrected portion, the depositions of the conductive films can be equalized to facilitate the correcting operations of the wiring lines, to simplify the wiring correcting system and to improve the yield of the wiring corrections.

Embodiment 17

Like the preceding embodiment, the present embodiment corresponds to an improvement in the formation of notched grooves in Al wiring lines, i.e., the lower-rank element process of the FIB corrections.

In the ultra-high speed logic LSI of recent years, as has been described hereinbefore, the multi-layering of the wiring lines is an essential technique with a view to improving the degree of freedom of the wiring design and reducing the delay in the wiring lines. As a result, the logic LSI composed of bipolar transistors, for example, is realized by an Al multilayer wiring structure of four or more layers.

In the logic LSI having such multilayer wiring structure, a wide power source wiring lines having a width of about 100–200 um is usually arranged as the uppermost layer, and fine signal wiring lines having a width of about several microns are arranged as the lower layers. In other to alter the pattern of the lower signal wiring lines, therefore, the lower wiring lines have to be extracted to the surface of a substrate by forming connection holes extending through the uppermost power source wiring lines to the lower wiring lines and by burying conductive films of Mo or W in the connection holes. At this time, there follows a step of notching the power source wiring lines around the connection holes by the FIB to invite the floating state, so as to prevent the uppermost wiring lines and the lower wiring lines from being short-circuited through the conductive films in the connection holes.

In order to bring the power source wiring lines around the connection holes into the floating state, it is necessary to form a generally C-shaped notch which extends from the side wall of a predetermined power source wiring line around the connection hole until it returns to the side wall.

Since, however, the power source wiring lines are very wide, as has been described above, the notch is so elongated to take much time in case the connection hole is formed generally at the center of the power source wiring line. Then, there arises a problem that the throughput of the logic correcting step is seriously dropped. If the notch is long, the notching accuracy is accordingly dropped to form a defective notch, thus raising another problem that the yield of the logic correcting step is dropped.

The present invention has been conceived in view of the problems specified above and has an object to provide a technique capable of improving the throughput of the logic correction step using the FIB and the laser CVD.

Another object of the present invention is to provide a technique capable of improving the yield of the logic correcting step using the FIB and the laser CVD.

Still another object of the present invention is to provide a technique capable of effectively preventing the drop of the electromigration resistance of the power source wiring lines.

A representative of the invention to be disclosed in the present embodiment will be briefly described in the following.

According to one invention of the present embodiment, wide power source wiring lines arranged in the uppermost layer of multilayer wiring lines are formed in advance with a number of grooves. In case the connections of the lower signal wiring lines below the power source wiring lines are to be corrected by making use of the FIB and the laser CVD, connection holes are formed by the FIB to extend through the power source wiring lines to the signal wiring lines, and the power source wiring lines in the vicinity of the connection holes are partially notched to bring the power source wiring lines around the connection holes, which are surrounded by the notches and the grooves, into the floating state. After this, conductive films are deposited in the connection holes by the laser CVD to extract the signal wiring lines to the surface of the semiconductor substrate.

According to another invention of the present embodiment, on the other hand, the longitudinal direction of the aforementioned grooves is aligned with the extending direction of the power source wiring lines.

Thanks to the grooves formed in the power source wiring lines, according to the aforementioned means, when the power source wiring lines around the connection holes are to be notched by the FIB so that they may be brought into the floating state, the notches are so short that they can be formed within a short time and in an improved accuracy. Since, moreover, the longitudinal direction of the grooves is aligned with the extending direction of the power source wiring lines, the flow direction of the electric current through the power source wiring lines is aligned with the longitudinal direction of the grooves. As a result, it is possible to effectively prevent the drop in the electromigration resistance of the power source wiring lines due to the formation of the grooves.

Embodiment 17 of the present invention will be specifically described in the following with reference to the accompanying drawings. Throughput the figures, incidentally, the parts having the common functions are designated at the common reference characters, and their repeated explanations will be omitted.

The semiconductor integrated circuit device of the present embodiment is exemplified by an ECL (Emitter Coupled Logic) gate array having an Al four-layer wiring structure. FIG. 67D is a plan layout view showing a semiconductor chip (semiconductor substrate) 1701" formed with the ECL gate array.

The semiconductor chip 1701" is arranged in its periphery with a predetermined number of bonding pads 1702" made of a conductive material such as Al. Inside of the bonding pads 1702", there are arranged a number of I/O cells 1703" in the array direction of the bonding pads 1702". Each of these I/O cells 1703" is composed of a not-shown input/output buffer circuit. Inside of the I/O cells 1703", there is arranged an internal logic circuit. This internal logic circuit is composed of a number of fundamental cells 1704" which are arranged in a matrix form. Each of the fundamental cells 1704" is composed of an ECL three-input OR gate, as shown in FIG. 67E.

FIG. 67A shows fourth-layer Al wiring lines 1705" (1705*a*", 1705*b*", 1705*c*", - - - ) or the uppermost wiring lines of the aforementioned internal logic circuit. The fourth-layer Al wiring lines 1705" constitute power supply wiring lines for supplying the powers ($V_{EE}$, $V_{CC}$ or the like) to the ECL gate array and have a width of 100–200 $\mu$m, for example. These fourth-layer Al wiring lines 1705 are formed to cover substantially all over the area of the internal logic circuit.

Each (1705*a*", 1705*b*", 1705*c*", - - - ) of the fourth-layer Al wiring lines 1705" is formed all over its area with a number of thin grooves 1706" which are arranged at a predetermined spacing. These grooves 1706" are formed at the common step by the common mask shared with the fourth-layer Al wiring lines 1705" and have a size of the several hundreds microns long and several microns wide.

The grooves 1706" have their longitudinal direction aligned with the extending direction of the fourth-layer Al wiring lines 1705". Since the longitudinal direction of the grooves 1706" and the current flow direction are thus aligned, it is possible to effectively prevent that drop in the electromigration resistance of the fourth-layer Al wiring lines 1705", which might otherwise be caused by the grooves 1706".

These fourth Al wiring lines 1705" are underlaid by third-layer Al wiring lines 1707" (1707a", 1707b", - - - , 1707g", - - - ) which extend in the horizontal directions of the drawing. These third-layer Al wiring lines 1707" constitute the signal wiring lines for connecting the ECL gates and have a width of several microns. Although not shown in FIG. 67A, the fourth-layer Al wiring lines 1705" are overlaid by a passivation film 1708" for protecting the surface of the semiconductor chip 1701", and an interlayer insulating film 1709" is formed between the fourth-layer Al wiring lines 1705" and the third-layer Al wiring lines 1707".

The internal logic circuit is formed in its predetermined region with connection holes 1710a" and 1710b" which are formed by the FIB (Focused Ion Beam). For example, one connection hole 1710a" is formed generally at the center of the fourth-layer Al wiring line 1705a", and the other connection hole 1710b" is formed generally at the center between the fourth-layer Al wiring lines 1705a" and 1705b". The connection hole 1710a" extends through the passivation film 1706", the fourth-layer Al wiring line 1705a" and the interlayer insulating film 1709" to the third-layer Al wiring line 1707b". On the other hand, the connection hole 1707b" extends through the passivation film 1708" and the interlayer insulating film 1709" so far as it reaches the third layer Al insulating line 1707c".

The passivation film 1708" between the connection holes 1710a" and 1710b" is overlaid by a conductive pattern 1711 for connecting the third-layer Al wiring lines 1707b" and 1707c". This conductive pattern 1711" alters the pattern (or corrects the logic) of the signal wiring lines for connecting the ECL gates. The conductive pattern 1711" is composed of a conductive film 1712" which is selectively formed of Mo or W by the laser CVD. The conductive film 1712" is also deposited in the connection holes 1710a" and 1710b".

The fourth-layer Al wiring line 1705a" is in a floating state around the connection hole 1710a". The fourth-layer Al wiring line 1705a" in the oblong region, which is surrounded by the two grooves 1706a" and 1706b" and two notches 1713a" and 1713b" formed in the vicinity of the connection hole 1710a", is electrically insulated from the fourth-layer Al wiring line 1705a" in the remaining region so that it is not supplied with the the power supply current. This is to prevent the fourth-layer Al wiring line 1705a" and the third-layer Al wiring line 1707b" from being short-circuited through the conductive film 1712" in the connection hole 1710a" because the connection hole 1710a" extends through the fourth-layer Al wiring line 1705a" to the third-layer Al wiring line 1707b". The notches 1713a" and 1713b" are so formed by cutting off the passivation film 1708" between the grooves 1706a" and 1706b" and the underlying fourth-layer Al wiring line 1705a" by the FIB as to has a width of several microns, for example.

FIG. 67B shows a section of the semiconductor chip 1701" in the vicinity of the aforementioned connection hole 1710a". The semiconductor chip 1701" is made of a p-type semiconductor single crystal, for example, and has its principal plane formed with an n-type collector buried layer 1714". This collector buried layer 1714" is overlaid by an epitaxial layer 1715" made of n-type silicon. The epitaxial layer 1715" is formed in its predetermined region with a field insulating film 1716" which is made of $SiO_2$ to isolate the elements from one another and the insides of the elements. The element separating field insulating film 1716" is underlaid by a $p^+$-type channel stopper layer 1717".

In the epitaxial layer 1715" of the active region surrounded by the field insulating film 1716", there are formed a p-type intrinsic region 1718" and a $p^+$-type graft base region 1719", the former of which is formed therein with an $n^+$-type emitter region 1720". Moreover, the collector buried layer 1714" is formed in its portion with an $n^+$-type collector take-out region 1721". Thus, the aforementioned emitter region 1721", the intrinsic base region 1718", and the underlying collector region composed of the epitaxial layer 1715" and the collector buried layer 1714" constitute altogether an npn type bipolar transistor. A plurality of npn type bipolar transistors and a plurality of not-shown resistors are used to constitute the fundamental cell 1704" such as the aforementioned ECL three-input OR gate.

The field insulating film 1716" is formed with contact holes 1722a", 1722b" and 1722c" which are positioned to correspond to the aforementioned graft base region 1719", emitter region 1720" and collector take-out region 1721", respectively. With the graft base region 1719", there is connected through the contact hole 1722a" a base lead-out electrode 1723 which is made of p-type silicon. With the emitter region 1720", on the other hand, there is connected through the contact hole 1722b" an emitter lead-out electrode 1724" which is made of n-type polysilicon.

Numerals 1725" and 1726" designate insulating films of $SiO_2$, which are overlaid by first-layer Al wiring lines 1727" (1727a", 1727b", 1727c", 1727d", - - - ). The first-layer Al wiring line 1727" has such a laminated structure that an Al—Si—Cu alloy, for example, is underlaid by a barrier metal such as TiN (titanium nitride), and has a width of several microns, for example. The Al wiring line 1727a" is connected with the base lead-out electrode 1723" through a through-hole 1728a" which is opened in the insulating film 1726".

The Al wiring line 1727b" is connected with the emitter lead-out electrode 1724" through a through-hole 1728b". The Al wiring line 1727c" is connected with the collector take-out region 1721" through a through-hole 1728c" and the aforementioned contact hole 1722c". In other words, the first-layer Al wiring lines 1727a", 1727b" and 1727c" constitute the base, emitter and collector electrodes of the aforementioned bipolar transistor, respectively.

The first-layer Al wiring line 1727" is overlaid by a first interlayer insulating film 1729" which is formed by laminating an $Si_3N_4$ film formed by the plasma CVD, for example, an SOG (Spin On Glass) film and a $SiO_2$ film formed by the plasma CVD. This interlayer insulating film 1729" is overlaid by second-layer Al wiring lines 1730" (1730a", 1730b", - - - ) made of an Al—Si—Cu alloy, for example.

The second-layer Al wiring line 1730" has a width of several microns, for example. The second-layer Al wiring line 1730a" is connected with the first-layer Al wiring line 1727a" through a through-hole 1731a" formed in the interlayer insulating film 1729". The second-layer Al wiring line 1730b" is connected with the first-layer Al wiring line 1727d" through a through-hole 1731b".

The second-layer Al wiring line 1730" is overlaid by a second interlayer insulating film 1732" which has a similar structure to the aforementioned first interlayer insulating film 1729", for example. The interlayer insulating film 1732"

is overlaid by the third-layer Al wiring line 1707*b*" which is made of an Al—Si—Cu alloy, for example. This third-layer Al wiring line 1707*b*" is connected with the second-layer Al wiring line 1730" through a not-shown through-hole. Thus, the first-layer Al wiring line 1727", the second-layer Al wiring line 1730" and the third-layer Al wiring line 1707" constitute the signal wiring lines connecting the ECL gates.

The third-layer Al wiring line 1707*b*" is overlaid by the third interlayer insulating film 1709" which has a structure similar to that of the aforementioned interlayer insulating films 1739" and 1732". The interlayer insulating film 1709" is overlaid by the wide fourth-layer Al wiring line 1705*a*" which is formed with the grooves 1706*a*" and 1706*b*". The fourth-layer Al wiring line 1705*a*" is made of an Al-Si-Cu alloy, for example. This fourth-layer Al wiring line 1905*a*" is overlaid by the passivation film 1708" which is made of $SiO_2$ by the bias sputtering, for example.

The fourth-layer Al wiring line 1705*a*" is formed at its center with the aforementioned connection hole 1710*a*". This connection hole 1710*a*" extends to the third-layer Al wiring line 1707*b*" through the passivation film 1708", the fourth-layer Al wiring line 1705*a*" and the interlayer insulating film 1709" and has a deposition of the conductive film 1712" therein. Moreover, the passivation film 1708" between the connection 1710*a*" and the connection hole 1710*b*", although not shown in FIG. 67B, is overlaid by the conductive pattern 1711" which is formed of the conductive film 1712" to connect the connection holes 1710*a*" and 1710*b*" electrically.

Next, the logic correcting step of the present embodiment making use of the FIB and the laser CVD will be described in the following. The logic corrections are accomplished by the use of an ion beam processing apparatus, as shown in FIG. 67C, for example.

First of all, a lid 1742" of a spare exhaust chamber 1741" constituting a sample exchanging chamber is opened, and the semiconductor chip 1701" to be logically corrected is placed on a table 1744" over a stage 1743". Next, the lid 1742" is closed, and a valve 1745" is opened to evacuate the spare exhaust chamber 1741" to the vacuum by a vacuum pump 1746". After this, a gate valve 1747" is opened to convey the table 1744" onto an XY stage 1750" in a vacuum container 1749" which is evacuated in advance by a vacuum pump 1748". Incidentally, numeral 1751" designates a valve which is usually in an open state.

Next, the gate valve 1747" is closed, and the vacuum chamber 1749" is sufficiently scavenged. From a high-intensity ion source 1753" or a liquid metal ion source such as Ga (gallium) disposed in an ion beam mount 1752" above the vacuum container 1749", an ion beam $I_B$ is extracted by an extraction electrode 1754" disposed below the ion source 1753". The ion beam $I_B$ thus extracted is focused and deflected by an electrostatic lens 1755", a blanking electrode 1756" and a deflector electrode 1757" to irradiate the semiconductor chip 1701". Next, the secondary electrons generated by the irradiation with the ion beam $I_B$ are detected by a secondary electron detector 1758" so that the XY stage is moved while observing the ion beam image scanned by the second electron signals in a monitor 1760" of a deflecting electrode power source 1759, thereby to detect the portions of the semiconductor chip 1701" to be formed with the connection holes 1710*a*" and 1701*b*". Then, the semiconductor chip 1701" is irradiated with the ion beam $I_B$ to open the connection holes 1710*a*" and 1710*b*" having a diameter of several microns, for example. Subsequently, by similar procedures, the portions of the semiconductor chip 1701" to be formed with the notches 1713*a*" and 1713*b*" are detected, and notches 1713*a*" and 1713*b*" are formed between grooves 1706*a*" and 1706*b*" by moving the XY stage 1750" in a predetermined direction with the semiconductor chip 1701" being irradiated with the ion beam $I_B$. As a result, and the fourth-layer Al wiring line 1705*a*" in the oblong region surrounded the notches 1713*a*" and 1713*b*" around the connection hole 1710*a*" and by the grooves 1706*a*" and 1706*b*" is isolated from the fourth-layer Al wiring line 1705*a*" of the remaining region into a floating state. Incidentally, in place of the aforementioned procedures, the connection holes 1710*a*" and 1710*b*" may be opened after the notches 1713*a*" and 1713*b*".

After the semiconductor chip 1701" has thus been formed with the connection holes 1710*a*" and 1710*b*" and the notches 1713*l*" and 1713*b*", the table 1744" of FIG. 67C is conveyed onto an XY stage 1762" in a vacuum chamber 1761" of the laser CVD apparatus.

Next, the XY stage 1762" is moved to bring the semiconductor chip 1701" to the irradiation position of the laser beam L, which is oscillated by a laser oscillator 1763" such as Ar (argon) laser, so that the portions to be wiring-corrected may be located. Next, the laser beam L is reflected through a shutter 1764" by a dichroic mirror 1765" and condensed by an objective lens 1766" so that it may irradiate the portions of the semiconductor chip 1701" to be corrected through an aperture 1767" formed in the vacuum container 1761". On this occasion, the location of the portions to be wiring-corrected is accomplished by observing the portions through an illumination optical system 1768", a half mirror 1769", a laser beam cut filter 1770", a prism 1771" and an eyepiece lens 1772".

Next, a valve 1773" is opened to introduce the reactive gases of an organic metallic compound such as $W(CO)_6$ or $Mo(CO)_6$ into the vacuum 1761" from a bomb 1774" connected to the vacuum chamber 1761", and a valve 1775" is opened to introduce inert gases from a bomb 1776".

In this state, the connection hole 1710*a*", for example, is irradiated with the laser beam L to deposite the conductive film 1712" of W or Mo in the connection hole 1710*a*", and the XY stage 1762" is moved in the predetermined direction to form the conductive pattern 1711" of the conductive film 1712" on the passivation film 1708" between the connection holes 1710*a*" and 1710*b*". Finally, the conductive film 1712" is deposited in the connection hole 1710*b*", thus producing the semiconductor chip 1701" in the state shown in FIGS. 67A and 67B.

The following effects can be attained by the present embodiment thus far described.

(1) Since the fourth-layer Al wiring line 1705*a*" is formed with a number of grooves 1706", the fourth-layer Al wiring line 1705*a*" around the connection hole 1710*a*" can be brought into the floating state merely by forming the notches 1713*a*" and 1713*b*" between the grooves 1706*a*" and 1706*b*" in the vicinity of the connection hole 1710*a*" so that the period of time required for the notches can be drastically shortened. As a result, the throughput of the logic correcting step using the FIB and the laser CVD can be improved.

Since the system debug time period of the gate array can be accordingly shortened, the period (TAT) for gate array development can be shortened.

(2) Since the fourth-layer Al wiring lines 1705*a*" is formed with the numerous grooves 1706", the distance of the notches 1713*a*" and 1713*b*" can be shortened to improve the notching accuracy and to prevent the defectiveness in the notches. This makes it possible to improve the yield of the logic correcting step using the FIB and the laser CVD and accordingly to improve the production yield of the gate array.

(3) Since the longitudinal direction of the grooves 1706" is aligned with the extending direction of the fourth-layer Al wiring lines 1705", it is aligned with the flow direction of the electric current. Thus, it is possible to effectively prevent the drop in the electromigration resistance of the fourth-layer Al wiring lines 1705" due to the formation of the grooves 1706". As a result, it is possible to prevent the drop in the electric characteristics of the gate array.

Although out invention has been specifically described in connection with the embodiment thereof, it should not be limited thereto but can naturally be modified in various manners without departing from the gist thereof.

Although, in the foregoing embodiment, the longitudinal direction of the grooves is aligned with the extending direction of the fourth-layer Al wiring lines, the alignment should not be limited thereto but may be modified such that the longitudinal direction of the grooves is orthogonal to the extending direction of the fourth-layer Al wiring lines. Moreover, the length, width and extending direction of the grooves can be suitably modified.

Although the foregoing embodiment thus far described is directed to the case in which the present invention is applied to the logic corrections to be accomplished in the semiconductor chip, the invention can also be applied to the logic corrections to be accomplished in the wafer state.

Although the embodiment is directed to the case in which the present invention is applied to the ECL gate array having the fourth-layer Al wiring structure, the invention can be applied to a variety of LSIs which have a multi-layered wiring structure having wide power source wiring lines in its uppermost layer.

The effects to be obtained by a representative of the invention disclosed in the present embodiment will be briefly in the following.

(1) Since the wide power source wiring lines arranged in the uppermost layer of the multi-layered wiring lines, the lengths of the notches can be shortened when the power source wiring lines around the connection hole are notched into the floating state by the FIB. As a result, the notching be accomplished within a short time to improve the throughput of the logic corrections using the FIB and the laser CVD.

Since, moreover, the notches are made shorter to improve the notching accuracy, it is possible to improve the yield of the logic corrections using the FIB and the laser CVD.

(2) Since the longitudinal direction of the grooves formed in the power source wiring lines is aligned with the extending direction of the power source wiring lines, it is possible to effectively prevent the drop in the electromigration resistance due to the formation of the grooves.

Embodiment 18

The present embodiment relates to an improvement in the notching step like the preceding Embodiment 17.

In the ultra-high speed logic LSI of recent years, as has been described hereinbefore, the multi-layering of the wiring lines is an essential technique with a view to improving the degree of freedom of the wiring design and reducing the delay in the wiring lines. The logic LSI composed of bipolar transistors, for example, is realized by an Al multilayer wiring structure of four or more layers.

In the logic LSI having such multilayer wiring structure, a wide power source wiring lines having a width of about 100–200 μm is usually arranged as the uppermost layer, and fine signal wiring lines having a width of about several microns are arranged as the lower layers. Therefore, the alterations of the pattern of the signal wiring lines just below the power source wiring lines is accompanied, in accordance with the following steps (1) to (3), by the step of leading out the signal wiring lines to the surface of the substrate.

(1) First of all, connection holes are formed to extend through the power source wiring lines to the lower signal wiring lines by irradiating the predetermined portions of the power source wiring lines with an FIB from above the semiconductor substrate.

(2) Next, the power source wiring lines around the connection holes are brought into the floating state by forming notches in the power source wiring lines around the connection holes by the use of the FIB. This is intended to prevent the power source wiring lines and the lower signal wiring lines from being short-circuited through the conductive films to be buried in the connection holes.

(3) The conductive films of Mo or W are buried in the connection holes by irradiating the connection holes with a laser beam while supplying the substrate with the reactive gases such as $Mo(CO)_6$ or $W(CO)_6$. After this, the laser beam is moved on the substrate to form a conductivity pattern along the locus.

Since the power source wiring lines are far wider than the signal wiring lines, the length of notches to be formed around connections holes in case these connection holes are to be formed in the vicinity of the centers of the power source wiring lines. If the notches are elongated, the notching operations takes a long time to drop the throughput of the logic correcting operations. Moreover, the defective notches are liable to occur so that the yield of the logic correcting steps drops. In case, therefore, the notches are to be formed around the connection holes, it is necessary to make the notch lengths as short as possible, i.e., the area of the region enclosed by the notches as small as possible.

Despite of this fact, however, the conductivity pattern has to be widened so as to have a low resistance, and there is a limit in reducing the area of the region surrounded by the notches. If the notches are positioned close to the connection holes, the conductivity pattern will extend partially into the notches, when it is formed in the region surrounded by the notches, thus causing a defect that the power source wiring lines and the underlying the signal wiring lines are short-circuited through the conductivity pattern.

The present invention has been conceived in view of the problems specified above and has an object to provide a technique capable of improving the throughput of the logic correction step using the FIB and the laser CVD.

Another object of the present invention is to provide a technique capable of improving the yield of the logic correcting step using the FIB and the laser CVD.

Still another object of the present invention is to provide a technique for promoting the automations of the logic correcting step using the FIB and the laser CVD.

According to the invention of the present embodiment, the is provided a method of manufacturing a semiconductor integrated circuit device, characterized in that, when logic corrections are to be accomplished while being followed by at least: the step (a) of opening connection holes extending through power source wiring lines to lower signal wiring lines with a focused ion beam; the step (b) of forming notches in the power source wiring lines around the connection holes with the focused ion beam to bring the power source wiring lines in the region surrounded by the notches into a floating state; and the step (c) of burying conductive films in the connection holes by a laser CVD and then forming a conductivity pattern of said conductive films in the surface of a semiconductor substrate, the line width of the conductivity pattern of the region surrounded by said notches is smaller than that of the conductivity pattern of the remaining region.

Since the area of the region surrounded by the notches can be reduced by narrowing the lines of the conductivity pattern of the region surrounded by the notches, the length of the notches can be reduced. If, on the other hand, the conductivity pattern is narrowed, its resistance is augmented. Since, however, the length of the conductivity pattern of the region surrounded by the notches is far smaller than the total length of the conductivity pattern, the increase in the resistance of the whole conductivity pattern is remarkably small. According to the present invention, the passage of the notch can be shortened without any substantially increase in the resistance of the conductivity pattern.

Embodiment 18 of the present invention will be specifically described in the following with reference to the accompanying drawings. Throughout the figures, incidentally, the parts having the common functions are designated at the common reference characters, and their repeated explanations will be omitted.

The semiconductor integrated circuit device of the present embodiment is exemplified by an ECL (Emitter Coupled Logic) gate array having an Al four-layer wiring structure.

FIG. 68C is a plan layout view showing a semiconductor chip (semiconductor substrate) 1801" formed with the ECL gate array.

The semiconductor chip 1801" is arranged in its periphery with a predetermined number of bonding pads 1802" made of a conductive material such as Al. Inside of the bonding pads 1802", there are arranged a number of I/O cells 1803" in the array direction of the bonding pads 1802". Each of these I/O cells 1803" is composed of a not-shown input/output buffer circuit. Inside of the I/O cells 1803", there is arranged an internal logic circuit. This internal logic circuit is composed of a number of fundamental cells 1804" which are arranged in a matrix form. Each of the fundamental cells 1804" is composed of an ECL three-input OR gate, as shown in FIG. 68D.

FIG. 68A shows fourth-layer Al wiring lines 1805" (fourth-layer Al wiring lines 1805_a_" and 1805_b_"). The fourth-layer Al wiring lines 1805" constitute power supply wiring lines for supplying the powers ($V_{EE}$, $V_{CC}$ or the like) to the ECL gate array and have a width of 100–200 μm, for example. These fourth-layer Al wiring lines 1805 are formed to cover substantially all over the area of the internal logic circuit.

These fourth Al wiring lines 1805" are underlaid by third-layer Al wiring lines 1806" (1806_a_", 1806_b_", 1806_c_", 1806_d_", 1806_e_", - - - ) which extend in the horizontal directions of the drawing. These third-layer Al wiring lines 1806" constitute the signal wiring lines for connecting the ECL gates and have a width of several microns. Although not shown in FIG. 68A, the fourth-layer Al wiring lines 1805" are overlaid by a passivation film 1807" for protecting the surface of the semiconductor chip 1801", and an interlayer insulating film 1708" is formed between the fourth-layer Al wiring lines 1805" and the third-layer Al wiring lines 1806".

The internal logic circuit is formed in its predetermined region with connection holes 1809_a_" and 1809_b_" which are formed by the FIB (Focused Ion Beam). One connection hole 1809_a_– extends to the third-layer Al wiring line 1806_b_" through the passivation film 1807", the fourth-layer Al wiring line 1805_a_" and the interlayer insulating film 1808", whereas the other connection hole 1809_b_" extends to the third-layer Al wiring line 1806_d_" through the passivation film 1807" and the interlayer insulating film 1808". Inside of the connection holes 1809_a_" and 1809_b_", there is burned a conductive film 1801" which is made of Mo or W by the laser CVD.

The passivation film 1807" between the connection holes 1809_a_" and 1809_b_" is overlaid by a conductivity pattern 1811" for connecting the third-layer Al wiring lines 1806_b_" and 1806_d_". This conductive pattern 1811" alters the pattern (or corrects the logic) of the signal wiring lines for connecting the ECL gates. The conductivity pattern 1811" is composed of a conductive film 1810" which is selectively formed of Mo or W by the laser CVD. The conductivity pattern 1811" has a line width of about 15 μm or more so as to drop its resistance to 20 Ω/mm or less.

The fourth-layer Al wiring line 1805_a_" is in the floating state around the connection hole 1809_a_". Specifically, the fourth-layer Al wiring line 1805_a_" around the connection hole 1809_a_" is electrically insulated from the fourth-layer Al wiring line 1805_a_" of another region through a C-shaped notch 1812" which extends from the side wall of the former Al wiring 1805_a_" around the connection hole 1809_a_" to the same side wall. This is to prevent the fourth-layer Al wiring line 1805_a_" and the third-layer Al wiring line 1806_b_" from being short-circuited through the conductive film 1810" in the connection hole 1809_a_", because the connection hole 1809_a_" extends through the fourth-layer Al wiring line 1805_a_" to the third-layer Al wiring line 1806_b_". The notch 1812" is formed by notching the passivation film 1807" around the connection hole 1809_a_" and the underlying fourth-layer Al wiring line 1805_a_" with the FIB and has a line width of several microns, for example.

The passivation film 1807" of the region surrounded by the notch 1812" is overlaid by the aforementioned conductivity pattern 1811". This conductivity pattern 1811" formed in this region has a line width of several microns, for example, smaller than that of the remaining region. If the line of the conductivity pattern 1811" is narrowed, the signal current to flow pattern the third-layer Al wiring lines 1806_b_" and 1806_d_" is delayed because of the increase in the resistance of the conductivity pattern 1811". Since, however, the length of the conductivity pattern 1811" of the region surrounded by the notch 1812" is far smaller than the whole length of the conductivity pattern 1811", the increase in the resistance of the conductivity pattern 1811" in its entirety is so small that the delay in the signal current is remarkably small.

FIG. 68B shows a section of the semiconductor chip 1801" between the aforementioned connection holes 1809_a_" and 1809_b_". The semiconductor chip 1801" is made of a p-type semiconductor single crystal, for example, and has its principal plane formed with an n-type collector buried layer 1813". This collector buried layer 1813" is overlaid by an epitaxial layer 1814" made of n-type silicon. The epitaxial layer 1814" is formed in its predetermined region with a field insulating film 1815" which is made of $SiO_2$ to isolate the elements from one another and the insides of the elements. The element separating field insulating film 1815" is underlaid by a $p^+$-type channel stopper layer 1816".

In the epitaxial layer 1814" of the active region surrounded by the field insulating film 1815", there are formed a p-type intrinsic region 1817" and a $p^+$-type graft base region 1818", the former of which is formed therein with an $n^+$-type emitter region 1819". Moreover, the collector buried layer 1813" is formed in its portion with an $n^+$-type collector take-out region 1820". Thus, the aforementioned emitter region 1819", the intrinsic base region 1817", and the underlying collector region composed of the epitaxial layer 1814" and the collector buried layer 1813" constitute altogether an npn type bipolar transistor. A plurality of npn type bipolar transistors and a plurality of not-shown resistors are used to constitute the fundamental cell 1804" such as the aforementioned ECL three-input OR gate.

The field insulating film 1815" is formed with contact holes 1821*a*", 1821*b*" and 1821*c*" which are positioned to correspond to the aforementioned graft base region 1818", emitter region 1819" and collector take-out region 1820", respectively. With the graft base region 1818", there is connected through the contact hole 1821*a*" a base lead-out electrode 1822" which is made of p-type silicon. With the emitter region 1819", on the other hand, there is connected through the contact hole 1821*b* an emitter lead-out electrode 1823" which is made of n-type polysilicon.

Numerals 1824" and 1825" designate insulating films of $SiO_2$, which are overlaid by first-layer Al wiring lines 1826" (1826*a*", 1826*b*", 1826*c*", 1826*d*", - - - ). The first-layer Al wiring line 1826 has such a laminated structure that an Al-Si-Cu alloy, for example, is underlaid by a barrier metal such as TiN (titanium nitride), and has a width of several microns, for example. The Al wiring line 1826*a*" is connected with the base lead-out electrode 1822" through a through hole 1827*a*" which is opened in the insulating film 1825". The Al wiring line 1823*c*" is connected with the emitter lead-out electrode 1823" through a through-hole 1827*b*". The Al wiring line 1823*c* is connected with the collector take-out region 1820" through a through-hole 1827*c*" and the aforementioned contact hole 1821*c*". In other words, the first-layer Al wiring lines 1826*a*", 1826*b*" and 1286*c*" constitute the base, emitter and collector electrodes of the aforementioned bipolar transistor, respectively.

The first-layer Al wiring line 1826" is overlaid by a first interlayer insulating film 1828" which is formed by laminating an $Si_3N_4$ film formed by the plasma CVD, for example, an SOG (Spin On Glass) film and a $SiO_2$ film formed by the plasma CVD. This interlayer insulating film 1828" is overlaid by second-layer Al wiring lines 1829" (1829*a*", 1829*b*", - - - ) made of an Al-Si-Cu alloy, for example. The second-layer Al wiring line 1829" has a width of several microns, for example. The second-layer Al wiring line 1829*a*" is connected with the first-layer Al wiring line 1826*a*" through a through-hole 1830*a*" formed in the interlayer insulating film 1828". The second-layer Al wiring line 1289*b*" is connected with the first-layer Al wiring line 1826*d*" through a through hole 1830*b*".

The second-layer Al wiring line 1829" is overlaid by a second interlayer insulating film 1831" which has a similar structure to the aforementioned first interlayer insulating film 1828", for example. The interlayer insulating film 1831" is overlaid by the third-layer Al wiring line 1806*b*" which is made of an Al-Si-Cu alloy, for example. This third-layer Al wiring line 1806*b*" is connected with the second-layer Al wiring line 1730" through a not-shown through-hole. Thus, the first-layer Al wiring line 1826", the second-layer Al wiring line 1829" and the third-layer Al wiring line 1806" constitute the signal wiring lines connecting the ECL gates.

The third-layer Al wiring line 1806" is overlaid by the third interlayer insulating film 1808" which has a structure smaller to that of the aforementioned interlayer insulating films 1828" and 1831". The interlayer insulating film 1808" is overlaid by the wide fourth-layer Al wiring line 1805*a*" which is formed with the notch 1821". The fourth-layer Al wiring line 1805*a*" is made of an Al-Si-Cu alloy, for example. This fourth-layer Al wiring line 1805*a*" is overlaid by the passivation film 1807" which is made of $SiO_2$ by the bias sputtering, for example.

The passivation film 1807" is formed in its predetermined region with the connection holes 1809*a*" and 1809*b*", in which the conductive films 1801" are buried, and between the connection holes 1809*a*" and 1809*b*" with the conductivity pattern 1811" made of the conductive film 1810". Moreover, the pattern of the third-layer Al wiring line 1806" is altered by electrically connecting the third-layer Al wiring lines 1806*a*" and 1806*b*" through the conductive films 1810" in the connection holes 1809*a*" and 1809*b*" and the conductivity pattern 1811".

Next, the logic correcting step of the present embodiment making use of the FIB and the laser CVD will be described in the following. In the present embodiment, the wiring correcting system, as shown in FIG. 68E, is used to accomplish a series of logic correcting operations fully automatically. The wiring correcting system is constructed of a computer, a minicomputer for wiring correction, an FIB apparatus, a laser CVD apparatus and a laser microscope.

The designer inputs the wiring correcting data to the minicomputer for wiring correction. The wiring correcting data are composed, as shown in FIG. 68F, (1) notched coordinates, (2) connection hole coordinates, and (3) conductivity pattern coordinates. The wiring correction minicomputer takes correspondences of those coordinate data between the notched coordinates and the connection hole coordinates, between the notched coordinates and the conductivity pattern coordinates, and between the connection coordinates and the conductivity pattern coordinates. As to the connection hole (A) in the region surrounded by the notches, moreover, the conductivity pattern coordinate data connecting the connection holes (A–B) are divided. In the connection hole (A) in the region surrounded by the notches, specifically, the connection hole coordinates (A)=the start (or end) point of the conductivity pattern coordinates=the start point (the connection hole coordinates A) of the narrow conductivity pattern, and the point, at which the narrow conductivity pattern passes through the opening of the notch, is the end point (the connection holes coordinates A'). In the connection hole (C) of the region not surrounded by the notches, on the other hand, the connection hole coordinates (C)=the start (or end) point of the conductivity pattern=the start point (the connection hole coordinates C) of the narrow conductivity pattern=the end point (the connection hole coordinates C') of the narrow conductivity pattern. The coordinates of the whole conductivity pattern is the start point (the connection hole coordinates=the start point of the narrow conductivity pattern)—the point A' (the end point of the narrow conductivity pattern)—the turning point B—the point C' (the end point of the narrow conductivity pattern)—the end point C (the connection hole coordinates=the start point of the narrow conductivity pattern).

The laser CVD apparatus is set in advance with the processing conditions such as the connection hole burying conditions or the conductivity pattern forming conditions. As to these conductivity pattern forming conditions, there are set the forming conditions (such as the laser power or the conductivity pattern forming rate) of the narrow conductivity pattern and the wide conductivity pattern. Moreover, correspondences are made between all the processing data including the aforementioned coordinate data prepared by the wiring correction minicomputer and the aforementioned processing conditions so that the individual processing operations may be automated.

the burying of the connection holes and the formation of the conductivity pattern are accomplished by the following procedures, for example.

(1) The laser beam is positioned to irradiate the connection hole (A or C) to bury it with the conductive film. This burying with the conductive film is accomplished with the notch. In the connection hole A (≠A') of the region surrounded by the notches, the conductivity pattern is formed subsequent to the burying step in accordance with the conditions for forming the narrow conductivity pattern. On the other hand, the connection hole C (=C') of the region not surrounded by the notches is buried but not formed with the conductivity pattern.

(2) The conductivity pattern is formed in accordance with the conditions for the wide conductivity pattern. The region to be formed with the wide conductivity pattern is located in the whole conductivity pattern within the range of the point A' (the end point of the narrow conductivity pattern)—the turning point B—the point C' (the end point of the narrow conductivity pattern=the point C).

(3) In order to drop the resistance of the conductivity pattern, the whole conductivity pattern formed between the connection hole A—the point C is annealed with the laser beam.

Thus, according to the present embodiment, the designer for the logic corrections determines the notched coordinates, the connection hole coordinates and the conductivity pattern coordinates. After this, the processing data and the processing conditions are made to correspond at the side of the apparatus so that the individual processing operations are automatically accomplished. This enables the designer to determine the coordinates promptly without considering the processing conditions.

A specific example of the logic correcting method using an ion beam processing apparatus 1840" shown in FIG. 68G will be described in the following.

First of all, a lid 1842" of a space exhaust chamber 1841" constituting a sample exchanging chamber is opened, and the semiconductor chip 1801" to be logically corrected is placed on a table 1844" over a stage 1843". Next, the lid 1842" is closed, and a valve 1845" is opened to evacuate the spare exhaust chamber 1841" to the vacuum by a vacuum pump 1846". After this, a gate valve 1847" is opened to convey the table 1844" onto an XY stage 1850" in a vacuum container 1849" which is evacuated in advance by a vacuum pump 1848". Incidentally, numeral 1851" designates a valve which is usually in an open state.

Next, the gate valve 1847" is closed, and the vacuum chamber 1849" is sufficiently scavenged. From a high-intensity ion source 1853" or a liquid metal ion source such as Ga (gallium) disposed in an ion beam mount 1852" above the vacuum container 1849", an ion beam $I_B$ is extracted by an extraction electrode 1854" disposed below the ion source 1853". The ion beam $I_B$ thus extracted is focused and deflected by an electrostatic lens 1855", a blanking electrode 1856" and a deflector electrode 1857" to irradiate the semiconductor chip 1801". Next, the secondary electrons generated by the irradiation with the ion beam $I_B$ are detected by a secondary electron detector 1858" so that the XY stage is moved while observing the ion beam image scanned by the second electron signals in a monitor 1860" of a deflecting electrode power source 1859", thereby to detect the portions of the semiconductor chip 1801" to be formed with the connection holes 1809*a*" and 1809*b*". Then, as shown in FIG. 68H, the semiconductor chip 1801" is irradiated with the ion beam $I_B$ to open the connection holes 1809*a*" and 1809*b*".

Subsequently, by similar procedures, the portions of the semiconductor chip 1801" to be formed with the notches 1812" are detected, and notches 1812" are formed around the connection hole 1809*a*" by moving the XY stage 1850" in a predetermined direction with the semiconductor chip 1801" being irradiated with the ion beam $I_B$, as shown in FIG. 68I. As a result, and the fourth-layer Al wiring line 1805*a*" in the region surrounded the notches 1812" is isolated from the fourth-layer Al wiring line 1805*a*" of the remaining region into a floating state.

After the semiconductor chip 1801" has thus been formed with the connection holes 1809*a*" and 1809*b*" and the notch 1812", the table 1844" is conveyed onto an XY stage 1862" in a vacuum chamber 1861" of the laser CVD apparatus. Next, the XY stage 1862" is moved to bring the semiconductor chip 1801" to the irradiation position of the laser beam L, which is oscillated by a laser oscillator 1863" such as Ar (argon) laser, so that the portions to be wiring-corrected may be located. Next, the laser beam L is reflected through a shutter 1864" by a dichroic mirror 1865" and condensed by an objective lens 1866" so that it may irradiate the portions of the semiconductor chip 1801" to be corrected through an aperture 1867" formed in the vacuum container 1861". On this occasion, the location of the portions to be wiring-corrected is accomplished by observing the portions through an illumination optical system 1868", a half mirror 1869", a laser beam cut filter 1870", a prism 1871" and an eyepiece lens 1872".

Next, a valve 1873" is opened to introduce the reactive gases of an organic metallic compound such as $W(CO)_6$ or $Mo(CO)_6$ into the vacuum chamber 1861" from a bomb 1874" connected to the vacuum chamber 1861", and a valve 1875" is opened to introduce inert gases from a bomb 1876".

In this state, as shown in FIG. 68J, the connection hole 1809*a*" is irradiated with the laser beam L to bury the conductive film 1810" of W or Mo in the connection hole 1809*a*". After this, the XY stage 1862" is moved in a predetermined direction to cause the laser beam L of a low power to irradiate the passivation film 1807" in the region surrounded by the notch 1812", thereby to form the fine conductivity pattern 1811" having a line width of several microns, for example. Next, at the instant when the fine conductivity pattern 1811" passes over the opening of the notch 1812", the laser beam L is switched to the high power. The passivation film 1807" from the point to the connection hole 1809*b*" is overlaid by the wide conductivity pattern 1811". In order to drop the resistance of the conductivity pattern 1811", the whole conductivity pattern 1811" between the connection holes 1809*a*" and 1809*b*" is annealed with the laser beam to manufacture the semiconductor chip 1801" in the state shown in FIGS. 68A and 68B.

According to the present embodiment thus far described, the following effects can be attained:

(1) Since the line of the conductivity pattern 1811" of the region surrounded by the notch 1812" is narrowed, it is possible to reduce the area of the region surrounded by the notch 1812". Since, on the other hand, the line of the conductivity pattern 1811" is narrowed, its resistance is augmented. Since, however, the length of the conductivity pattern 1811" of the region surrounded by the notch 1812" is far shorter than the total length of the conductivity pattern 1811", the increase in the resistance of the whole conductivity pattern 1811" can be suppressed to a remarkably small value. Thus, the passage of the notch 1812" can be shortened without any substantial increase in the resistance of the conductivity pattern 1811".

(2) When the wiring correcting data are to be inputted to the wiring correction minicomputer, the formation of the conductivity pattern can be easily automated by dividing the coordinate data of the conductivity pattern 1811" as to the connection hole 1809*a*" of the region surrounded by the notch 1812".

(3) Thanks to the items (1) and (2), the throughput of the logic correcting step using the FIB and the laser CVD can be improved. Since the system debug time period of the gate array can be accordingly shortened, the period (TAT) for gate array development can be shortened.

(4) Since the passage of the notch 1812" can be shortened, it is possible to improve the notching accuracy by the FIB and to prevent the defectiveness in the notches. This makes it possible to improve the yield of the logic correcting step using the FIB and the laser CVD and accordingly to improve the production yield of the gate array.

Although our invention has been specifically described in connection with the embodiment thereof, it should not be limited thereto but can naturally be modified in various manners without departing from the gist thereof.

Although the foregoing embodiment thus far described is directed to the case in which the present invention is applied to the logic corrections to be accomplished in the semiconductor chip, the invention can also be applied to the logic corrections to be accomplished in the wafer state.

Although the embodiment is directed to the case in which the present invention is applied to the ECL gate array having the four-layer Al wiring structure, the invention can be applied to a variety of LSIs which have a multi-layered wiring structure having wide power source wiring lines in its uppermost layer.

The effects to be obtained from a representative of the invention disclosed in the present embodiment will be briefly described in the following.

When logic corrections are to be accomplished while being followed by at least: the step (a) of opening connection holes extending through power source wiring lines to lower signal wiring lines with a focused ion beam; the step (b) of forming notches in the power source wiring lines around the connection holes with the focused ion beam to bring the power source wiring lines in the region surrounded by the notches into a floating state; and the step (c) of burying conductive films in the connection holes by a laser CVD and then forming a conductivity pattern of said conductive films in the surface of a semiconductor substrate, the line width of the conductivity pattern of the region surrounded by said notches is smaller than that of the conductivity pattern of the remaining region. According to the present invention, the passage of the notch can be shortened without any substantial increase in the resistance of the conductivity pattern thereby to improve the throughput and yield of the logic correcting step.

Embodiment 19

The present embodiment relates to connections of wide Al wiring lines and Mo jumper lines at the instant of the FIB wiring corrections. Although not especially described, the chip to be subjected to the corrections of the present invention (although limited to that of the present embodiment) is naturally provided with not only the Al projections of the present embodiment but also the devices (such as spare wiring lines or gates) on another Al layout or another layout.

In the ultra-high speed logic LSI of recent years, as has been described hereinbefore, the multi-layering of the wiring lines is an essential technique with a view to improving the degree of freedom of the wiring design and reducing the delay in the wiring lines. The logic LSI composed of bipolar transistors, for example, is realized by an Al multiplayer wiring structure of four or more layers. In such a logic LSI, 100- to 200-micron-wide power lines are laid on top whereas several-micron-wide signal lines are on lower layers.

Here will be considered the case in which the logic corrections are to be accomplished by forming a conductivity pattern between the power source wiring lines and the signal wiring lines. In this case, connection holes respectively extending to the power source wiring lines and the signal wiring lines are opened by irradiating the semiconductor substrate with the FIB. Next, the connection holes are individually irradiated with the laser beam, while supplying the reactive gases such as $Mo(CO)_6$ or $W(CO)_6$ onto the semiconductor substrate, to bury conductive films of Mo or W in the connection holes. After this, the conductive pattern is formed by irradiating the semiconductor substrate between the connection holes with the laser beam.

We have found that the conductive films are not sufficiently buried in the connection holes formed in the wide wiring lines (power source wiring lines) under the conditions of a constant laser beam output, in case the conductive films are to be buried in the connection holes formed in the wiring lines having different widths. If the wide wiring lines exist in the connection holes, the heat of the laser beam is liable to escape into the wiring lines so that the temperature rise in the connection holes is insufficient for depositing the conductive films.

On the other hand, the above-specified problem can be avoided by altering the output of the laser beam in accordance with the wiring line width below the connection holes such that the connection hole formed in the wider wiring line is irradiated with a laser beam of higher output whereas the connection hole formed in the narrower wiring line is irradiated with a laser beam of lower output. Then, there arises another problem that the burying step of the connection holes is complicated. Since, especially in recent years, the burying operations of the connection holes are automated by the control of a computer, processing data have to be prepared for the laser CVD apparatus to discriminate whether the wiring lines below the connection holes are the signal wiring lines or the power source wiring lines, in case the output of the laser beam is to be altered in accordance with the wiring line widths below the connection holes. This raises another problem that the file specifications are complicated to drop the throughput of the logic correcting step.

A representative of the invention to be disclosed in the present embodiment will be briefly described in the following.

In case the logic corrections are to be accomplished according to the present embodiment by connecting a narrow lead-out wiring line with a portion of a power source wiring line and forming a conductivity pattern between the power source wiring line and a predetermined signal wiring line, the FIB is first used to open a connection hole extending to the lead-out wiring line and a connection hole extending to the predetermined signal wiring line, and conductive films are then buried in the respective connection holes by the laser CVD. After this, a conductivity pattern of the aforementioned conductive films are formed over the semiconductor substrate between the aforementioned connection holes by the laser CVD.

Since both the lead-out wiring line and the signal wiring line are made narrow, according to the above-specified means, the temperatures of the two connections holes, which are opened in the lead-out wiring line and the signal wiring line, are made substantially equal when the connection holes have their insides irradiated with the laser beam. As a result, the conductive films can be evenly deposited in the two connection holes with the output of the laser beam being unchanged. Thus, the yield of the burying step of the connection holes can be improved without dropping the throughput of the logic correcting step.

Embodiment 19 of the present invention will be specifically described in the following with reference to the accompanying drawings. Throughout the figures, incidentally, the parts having the common functions are designated at the common reference characters, and their repeated explanations will be omitted.

The semiconductor integrated circuit device of the present embodiment is exemplified by an ECL (Emitter Coupled Logic) gate array having an Al four-layer wiring structure. FIG. 69C is a plan layout view showing a semiconductor chip (semiconductor substrate) 1901" formed with the ECL gate array.

The semiconductor chip 1901" is arranged in its periphery with a predetermined number of bonding pads 1902" made of a conductive material such as Al. Inside of the bonding pads 1902", there are arranged a number of I/O cells 1903" in the array direction of the bonding pads 1902". Each of the I/O cells 1903" is composed of a not-shown input/output buffer circuit. Inside of the I/O cells 1903", there is arranged an internal logic circuit. This internal logic circuit is composed of logic gates 1904" such as ECL three-input OR gates 1935", as shown in FIG. 69D.

FIG. 69A shows a fourth-layer Al wiring line 1905" which is formed in the uppermost wiring layer of the aforementioned internal logic circuit. The wider four-layer Al wiring lines 1905_a_" and 1905_b_" constitute power supply wiring lines for supplying the powers ($V_{EE}$, $V_{CC}$ or the like) to the ECL gate array and have a width of 100 to 200 μm, for example. These power source wiring lines are formed to cover substantially all over the area of the internal logic circuit at a predetermined spacing. The spare region of the wiring layer shared with the power source wiring lines 1905_a_" and 1905_b_" is formed with narrower fourth-layer Al wiring lines 1905_c_" and 1905_d_". These fourth-layer Al wiring lines 1905_c_" and 1905_d_" constitute the signal wiring lines for connecting the ECL gates (or the spare signal wiring lines) and have a width of several microns, for example.

The power source wiring lines 1905_a_" and 1905_b_" are formed on their side walls with a number of L-shaped lead-out wiring lines 1906" which are arranged at a predetermined spacing. These lead-out wiring lines 1906" are integrated with the power source wiring lines 1905_a_" (1905_b_") and are manufactured at the common step using the common mask shared with the fourth-layer Al wiring lines 1905". The lead-out wiring lines 1906" have a width of several microns, for example, which is equal to that of the signal wiring lines 1905_c_" and 1905_d_".

The fourth-layer Al wiring lines 1905" are under-laid by third-layer Al wiring lines 1907" (1907_a_", 1907_b_", 1907_c_" and 1907_d_") which extend horizontally of the drawing. Like the fourth-layer Al wiring lines 1905_c_" and 1905_d_", the third-layer Al wiring lines 1907" constitute the signal wiring lines for connecting the ECL gates and have a width of several microns, for example. Although not shown in FIG. 69A, the fourth-layer Al wiring lines 1905" are overlaid by a passivation film 1908" for protecting the surface of the semiconductor chip 1901". An interlayer insulating film 1909" is formed between the fourth-layer Al wiring lines 1905" and the third-layer Al wiring lines 1907".

In the Figure, characters 1904_a_" and 1904_b_" designate logic gates which are composed of ECL three-input NOR gates, for example. The logic gate 1904_a_" has its output connected with the input of the logic gate 1904_b_" through the connection hole $T_1$—the third-layer Al wiring line 1907_a_"—the connection hole $T_2$—the fourth-layer Al wiring line 1905_d_"—the connection hole $t_3$—the third-layer Al wiring line 1907_d_"—the connection hole $T_4$. In other words, the logic gate 1904_a_" forms part of the front gate of the logic gate 1904_b_".

The fourth-layer Al wiring line 1905_d_" between the connection holes $T_2$ and $T_3$ is formed with a connection hole $T_5$. The connection hole $T_5$ is formed by using the FIB (Focused Ion Base) to extend to the fourth-layer Al wiring line 1905_d_" through the passivation film 1908". Moreover, the power source wiring line 1905_a_" is formed at its predetermined lead-out wiring line 1906" with a connection hole $T_6$. This connection hole $T_6$ is opened like the connection hole $T_5$ by the FIB to extend to the lead-out wiring line 1906" through the passivation film 1908".

In the connection holes $T_5$ and $T_6$, although not shown in FIG. 69A, there are buried conductive films 1910" which are made of a metal of high-melting point such as Mo or W deposited by the laser CVD. Moreover, the passivation film 1908" between the connection holes $T_5$ and $T_6$ is overlaid by a conductivity pattern 1911" which is made of the conductive films 1910" for connecting the fourth-layer Al wiring line 1905_d_" and the power source wiring line 1905_a_". In the present embodiment, the output signal wiring line of the logic gate 1904_a_" is connected through the conductivity pattern 1911" with the power source wiring line 1905_a_" at the GND potential (at 0 V) to clamp the output signal of the logic gate 1904_b_" at the "H" level so that the pattern of the signal wiring lines connecting the logic gates 1904_a_" and 1904_b_" is altered (or logically corrected). Incidentally, the conductivity pattern 1911" is made to have a line width of about 15 μm or more so as to drop its resistance to 20 Ω/mm or less.

FIG. 69B is a sectional view showing the semiconductor chip 1901" between the connection holes $T_5$ and $T_6$. This semiconductor chip 1901" is made of a single crystal of p-type silicon and is formed on its principal plane with an n-type collector buried layer 1913". This collector buried layer 1913" is overlaid by an epitaxial layer 1914" made of n-type silicon. This epitaxial layer 1914" is formed in its predetermined region with a file insulating film 1915" made of $SiO_2$ to separate the elements and the insides of the element. The element separating field insulating film 1915" is underlaid by a $p^+$-type channel stopper layer 1916".

The epitaxial layer 1914" in the active region surrounded by the field insulating film 1915" is formed with a p-type intrinsic base region 1917" and a $p^+$-type graft base region 1918". The intrinsic base region 1917" is formed therein with an $n^+$-type emitter region 1919". On the other hand, the collector buried layer 1913" is formed in its portion with an $n^+$-type collector take-out region 1920". Moreover, the aforementioned emitter region 1919", the intrinsic base region 1917", and the collector region composed of the underlying the epitaxial layer 1914" and collector buried layer 1913" constitute altogether an npn type bipolar transistor. A plurality of these npn type bipolar transistors and not-shown resistors are used to constitute the logic gates 1904" such as the aforementioned ECL three-input OR (NOR) gates.

The field insulating film 1915" is formed with contact holes 1921_a_", 1921_b_" and 1921_c_" which correspond to the aforementioned graft base region 1918", emitter region 1919" and collector take-out region 1920", respectively. The graft base region 1918" is connected through the contact hole 1921*a*" with a base lead-out electrode 1922" which is made of p-type polysilicon. On the other hand, the emitter region 1919" is connected through the contact hole 1921*b*" with an emitter lead-out electrode 1923" which is made of n-type polysilicon.

Numerals 1924" and 1925" designate insulating films made of $SiO_2$, which are overlaid by first-layer Al wiring lines 1926" (1926*a*", 1926*b*", 1926*c*" and 1926*d*"). These first-layer Al wiring lines 1926" have a laminated structure, in which an Al-Si-Cu alloy, for example, is underlaid by a barrier metal such as TiN (titanium nitride), and have a width of several microns, for example. The Al wiring line 1926*a*" is connected with the base lead-out electrode 1922" through a through-hole 1927*a*" which is opened in the insulating film 1925". The Al wiring line 1926*b*" is connected with the emitter lead-out electrode 1923" through a through-hole 1927*b*". The Al wiring line 1926*c*" is connected with the collector take-out region 1920" through a through-hole 1927*c*" and the aforementioned contact hole 1921*c*". In other words, the first-layer Al wiring lines 1926*a*", 1926*b*" and 1926*c*" constitute the base electrode, emitter electrode and collector electrode o the aforementioned bipolar transistor, respectively.

The first-layer Al wiring line 1926" is overlaid by a first interlayer insulating film 1928" which is a lamination of a $Si_3N_4$ film formed by the plasma CVD, an SOG (Spin On Glass) film and a $SiO_2$ film formed by the plasma CVD, for example. This interlayer insulating film 1928" is overlaid by second-layer Al wiring lines 1929" (1929*a*" and 1929*b*") made of an Al-Si-Cu alloy, for example. The second-layer Al wiring line 1929" has a width of several microns, for example. The second-layer Al wiring line 1929*a*" is connected with the first-layer Al wiring line 1926*a*" through a through-hole 1930*a*" which is opened in the interlayer insulating film 1928". The second-layer Al wiring line 1929*b*" is connected with the first-layer Al wiring line 1926*d*" through a through-hole 1930*b*".

The second-layer Al wiring line 1929" is overlaid by a second interlayer insulating film 1931" which has a structure like the aforementioned first interlayer insulating film 1928". The interlayer insulating film 1931" is overlaid by the third-layer Al wiring line 1907" which is not shown in FIG. 69B. The third-layer Al wiring line 1907" is made of an Al-Si-Cu alloy, for example, and is connected with the second-layer Al wiring line 1930" through the not-shown through hole.

The third-layer Al wiring line 1907" is overlaid by the third interlayer insulating film 1909" which has a structure similar to that of the aforementioned interlayer insulating films 1928" and 1931", for example. The interlayer insulating film 1909" is overlaid by the fourth-layer Al wiring lines 1905" (i.e., the power source wiring line 1905*a*" having the lead-out wiring lines 1906" and the signal wiring lines 1905*c*" and 1905*c*"). The fourth-layer Al wiring line 1905" is made of an Al-Si-Cu alloy, for example.

The lead-out wiring lines 1906" and the signal wiring line 1905*d*" are formed thereover with the connection holes $T_5$ and $T_6$, respectively. These connection holes $T_5$ and $T_6$ are formed by opening the passivation film 1908" which is made of $SiO_2$ by the bias sputtering, and have the conductive film 1910" buried therein. The passivation film 1908" between the connection holes $T_5$ and $T_6$ is overlaid by the conductivity pattern 1911" which is formed of the conductive film 1910" connecting the signal wiring line 1905*d*" and the lead-out wiring lines 1906" (i.e., the power source wiring line 1905*a*"), so that the pattern of the signal wiring line connecting the logic gates 1904*a*" and 1904*b*" is altered (for logic corrections).

Next, the logic correcting step of the present embodiment making use of the FIB and the laser CVD will be described in the following. In the present embodiment, a series of logic correction operations are accomplished fully automatically by the wiring correcting system, as shown in FIG. 69E. The wiring correcting system is composed of a computer, a minicomputer for wiring correction, an FIB apparatus, a laser CVD apparatus, a confocal type laser and a microscope.

The wiring correction minicomputer inputs the processing data including the wiring correction data. At the side of the apparatus (e.g., the FIB apparatus and the laser CVD apparatus), there are set the processing conditions such as the conditions for opening the connection holes, burying the connection holes or forming the conductivity pattern. Then, the individual processing operations are accomplished automatically by taking correspondences between the processing data and the processing conditions.

A logic correcting method using an ion beam processing apparatus 1940" shown in FIG. 69F will be specifically described in the following.

First of all, a lid 1942" of a spare exhaust chamber 1941" constituting a sample exchanging chamber is opened, and the semiconductor chip 1901" to be logically corrected is placed on a table 1944" over a stage 1943". Next, the lid 1742" is closed, and a valve 1945" is opened to evacuate the spare exhaust chamber 1741" to the vacuum by a vacuum pump 1746". After this, a gate valve 1947" is opened to convey the table 1944" onto an XY stage 1950" in a vacuum container 1949" which is evacuated in advance by a vacuum pump 1948". Incidentally, numeral 1951" designates a valve which is usually in an open state.

Next, the gate valve 1947" is closed, and the vacuum chamber 1949" is sufficiently scavenged. From a high-intensity ion source 1953" or a liquid metal ion source such as Ga (gallium) disposed in an ion beam mount 1952" above the vacuum container 1949", an ion beam $L_B$ is extracted by an extraction electrode 1954" disposed below the ion source 1953". The ion beam $L_B$ thus extracted is focused and deflected by an electrostatic lens 1955", a blanking electrode 1956" and a deflector electrode 1957" to irradiate the semiconductor chip 1901". Next, the secondary electrons generated by the irradiation with the ion beam $L_B$ are detected by a secondary electron detector 1958" so that the XY stage is moved while observing the ion beam image scanned by the second electron signals in a monitor 1960" of a deflecting electrode power source 1959", thereby to detect the portions of the semiconductor chip 1901" to be formed with the connection holes $T_5$ and $T_6$. Then, the semiconductor chip 1901" is irradiated with the ion beam $L_B$ to open the connection holes $T_5$ and $T_6$.

After the semiconductor chip 1901" has thus been formed with the connection holes $T_5$ and $T_6$, the table 1944" is conveyed onto an XY stage 1962 in a vacuum chamber 1961" of the laser CVD apparatus. Next, the XY stage 1962" is moved to bring the semiconductor chip 1901" to the irradiation position of the laser beam $L_B$, which is oscillated by a laser oscillator 1963" such as Ar (argon) laser, so that the portions to be wiring-corrected may be located. Next, the laser beam $L_B$ is reflected through a shutter 1964" by a dichroic mirror 1965" and condensed by an objective lens 1966" so that it may irradiate the portions of the semiconductor chip 1901" to be corrected through an aperture 1967" formed in the vacuum chamber 1961". On this occasion, the location of the portions to be wiring-corrected is accomplished by observing the portions through an illumination optical system 1968", a half mirror 1969", a laser beam cut filter 1970", a prism 1971" and an eyepiece lens 1972".

Next, a valve 1973" is opened to introduce the reactive gases of an organic metallic compound such as $W(CO)_6$ or $Mo(CO)_6$ into the vacuum chamber 1961" from a bomb 1974" connected to the vacuum chamber 1961", and a valve 1975" is opened to introduce inert gases from a bomb 1976".

In this state, as shown in FIG. 69H, the connection holes $T_5$ and $T_6$ for example, are irradiated with the laser beam $L_B$ to bury the conductive film 1910" of W or Mo in the connection holes $T_5$ and $T_6$. Since, at this time, the lead-out wiring lines 1906" and the signal wiring line 1905*d*" have an equal width, the temperatures in the connection holes $T_5$ and $T_6$ are equalized in case the insides of the connection holes $T_5$ and $T_6$ are irradiated with the laser beam $L_B$. As a result, the conductive films 1901" can be uniformly deposited in the two connection holes $T_5$ and $T_6$ with the output of the laser beam $L_B$ being constant. Then, XY stage 1962" is moved in the predetermined direction to form the conductive pattern 1911" on the passivation film 1908" between the connection holes $T_5$ and $T_6$. Finally, in order to drop the resistance of the conductivity pattern 1911", this pattern 1911" is annealed with the laser beam $L_B$ to manufacture the semiconductor chip 1901" in the state shown in FIGS. 69A and 69B.

Thus, according to the present embodiment, the conductive films 1910" can be equally deposited in the two connection holes $T_5$ and $T_6$ with the output of the laser beam $L_B$ being constant. This makes it possible to improve the yield of the connection hole burying step without any drop in the throughput of the logic correcting step.

Although our invention has been specifically described in connection with the embodiment thereof, it should not be limited thereto but can naturally be modified in various manners without departing from the gist thereof.

For example, the shape of the lead-out wiring lines to be connected with the power source wiring lines may be suitably modified.

Although the foregoing embodiment is directed to the case in which the present invention is applied to the logic corrections to be accomplished in the semiconductor chip, the invention can also be applied to the logic corrections in the wafer state.

Although the foregoing embodiment is directed to the case in which the present invention is applied to the ECL gate array having the Al four-layer wiring structure, it can also be applied to a variety of LSIs.

The effects obtainable obtainable from the present embodiment will be briefly described in the following.

According to the present invention having the narrow lead-out wiring line connected with a portion of the power source wiring line, the connection hole formed in the lead-out wiring line and the connection hole formed in the signal wiring line have their inside temperatures substantially equalized, in case they are irradiated therein with the laser beam, so that the conductive films can be equally deposited in the two connection holes with the output of the laser beam being held constant. As a result, the yield of the connection hole burying step can be improved without any drop in the throughput of the logic correcting step.

Embodiment 20

The aforementioned FIB wiring correcting technique is effective to cut a mere underlying wiring structure. In case, however, the correcting wiring structure is to be connected from the outside by a method for depositing a conductive substance selectively by exposing the lower wiring structure and by a technique such as the photochemical vapor phase growth, the correcting wiring structure is liable to be short-circuited to the upper wiring structure, thus raising a problem that the target wiring correction is difficult to realize.

In order to solve this problem, it is conceivable to prevent the short-circuiting between the upper wiring structure and the correcting wiring structure, by re-adhering the interlayer insulating film between the upper and lower wiring structures to the section of the upper wiring structure exposed to the inner circumference of a bored processing hole by the sputtering action of a focused ion beam. This method finds it difficult to control the dispersion direction of the substance to be sputtered by the ion beam in a predetermined direction toward the target position for the re-adhesion. In order to achieve a sufficient insulating effect from the re-adhesion, therefore, the interlayer insulating film has to be sputtered in a large quantity, thus raising another problem that the method cannot be applied to the case of a thin interlayer insulating film.

Therefore, an object of the present invention is to provide an ion beam processing method capable of reliably preventing the short-circuiting in the wiring corrections of first and second wiring structures to be laminated through a second insulating film.

Another object of the present invention is to provide a semiconductor integrated circuit device in which the short-circuiting in the wiring corrections of first and second wiring structures to be laminated through a second insulating film is reliably prevented.

Still another object of the present invention is to provide a wiring correcting method capable of reliably preventing the short-circuiting in the wiring corrections of first and second wiring structures to be laminated through a second insulating film.

A further object of the present invention is to provide a main frame computer developing method which is enabled to shorten the development period of a semiconductor integrated circuit device by reliably preventing the short-circuiting in the wiring corrections of first and second wiring structures to be laminated through a second insulating film.

Representatives of the invention to be disclosed in the present embodiment will be briefly described in the following.

According to the present invention, there is provided an ion beam processing method for processing a semiconductor integrated circuit device, which includes: first and second wiring structures laminated through a second insulating film; and a first insulating film for shielding the upper first wiring structure, in a desirable manner by a sputtering operation with an ion beam, comprising: a first step of forming a groove extending to a second insulating film, in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure.

According to the present invention, there is also provided a semiconductor integrated circuit device comprising; first and second wiring structure laminated through a second insulating film; and a first insulating film for shielding the upper first wiring structure, wherein the improvement resides in that it is subjected to wiring corrections including: a first step of forming a groove extending to a second insulating film, in a manner to surround at least a portion of a target region for the desired processing, by a sputtering operation with an ion beam, to expose the section of said first wiring structure to the outside; a second step of irradiating said first insulating film in the vicinity of said grooves with the ion beam to adhere the insulating substance comprising said first insulating film again to the exposed section of said first warning structure thereby to shield the section of said second first wiring structure; and a third step of irradiating the target region surrounded by said groove with the ion beam to perform a boring operation to cut or expose said second wiring structure.

According to the present invention, there is also provided a wiring correcting method for altering the operation specifications or correcting the functions of a semiconductor integrated circuit device, which includes: first and second wiring structures laminated through a second insulating film; and a first insulating film for shielding the upper first wiring structure, wherein the improvement comprises: a first step of forming a groove extending to a second insulating film in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure.

According to the present invention, there is also provided a main frame computer developing method for repeating the steps of: separating each of a plurality of identical sort of semiconductor integrated circuit device, each of which includes: first and second wiring structures laminated through a second insulating film; and a first insulating film for shielding the upper first wiring structure, into pellets and then into first and second groups; assembling the pellets belonging to the first group into a target system and storing the pellets belonging to the second group; and correcting the wirings of the pellets belonging to the second group in a manner to cope with the defective functions and the specification alterations and assembling the same in the system in case the defective functions and the specification alterations occur in the pellets belonging to the first group and assembled in the system, wherein the improvement resides in that said semiconductor integrated circuit devices are subjected to the wiring corrections after: a first step of forming a groove extending to a second insulating film, in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure.

According to the aforementioned ion beam processing method of the present invention, by irradiating the ion beam along the open edge of the groove formed at the first step, for example, the position of the section of the first wiring structure exposed to the inside, as seen from the position of incidence of the ion beam, is come close to the direction, in which the amount of the first insulating film sputtered by the ion beam is the most, so that the first wiring structure can be effectively shielded by the re-adhesion of the first insulating film scattered.

As a result, in case the corrected wiring structure is to be connected by the photochemical vapor growth with the lower second wiring structure exposed at the third step, for example, it is possible to prevent the short-circuiting between the first and second wiring structures and the correcting wiring structure without fail.

According to the aforementioned semiconductor integrated circuit device of the present invention, moreover, since the insulating substance composing the upper first insulating film to be sputtered with the ion beam has a structure, in which it is effectively re-adhered to shield of the first wiring structure exposed to the inner periphery of the groove, it is possible to prevent the short-circuiting between the lower second wiring structure or the correcting wiring structure, which is connected from the outside with said lower second wiring structure, and the upper first wiring structure without fail.

According to the aforementioned wiring correcting method of the invention, still moreover, by irradiating the ion beam along the open edge of the groove formed at the first step, for example, the position of the section of the first wiring structure exposed to the inside, as seen from the position of incidence of the ion beam, is come close to the direction, in which the amount of the first insulating film sputtered by the ion beam is the most, so that the first wiring structure can be effectively shielded by the re-adhesion of the first insulating film scattered.

As a result, in case the corrected wiring structure is to be connected by the photochemical vapor growth with the lower second wiring structure exposed at the third step, for example, it is possible to prevent the short-circuiting between the first and second wiring structures and the correcting wiring structure without fail.

According to the aforementioned main frame computer developing method of the present invention, furthermore, in the wiring correcting operations of the plurality of semiconductor integrated circuit devices composing the main frame computer under consideration, it is possible to eliminate the defects of the wiring corrections, which might otherwise be caused by the short-circuiting between the lower second wiring structure aiming at constituting the semiconductor integrated circuit device and the correcting wiring structure to be connected with the second wiring structure and the upper first wiring structure, so that the frequency of repeating the wiring correcting operations is reduced. This makes it possible to shorten the time period for developing the main frame computer.

One example of the LSI wiring corrections by the ion beam processing operations in the development of the main frame computer according to the Embodiment 20 of the present invention will be described in detail with reference to the accompanying drawings.

FIG. 70A is a perspective view showing at some instant of the wiring correcting step of the LSI with the ion beam processing operation; and FIG. 70B(*a*)–70B(*c*), FIG. 70C(*a*)–70C(*c*), FIG. 70D(*a*)–70D(*c*), FIG. 70E(*a*)–70E(*c*), FIG. 70F(*a*)–70F(*c*) and 70G are plan views and sectional view showing the wiring correcting procedures in the order of steps.

FIG. 70M is a block diagram showing one example of the structure of an ion beam processing apparatus to be used in the wiring correcting steps of the present embodiment; and FIG. 70N is a flow chart showing one example of the developing steps of the main frame computer.

First of all, the structure of the ion beam processing apparatus will be briefly described with reference to FIG. 70M.

The ion beam processing apparatus according to the present embodiment is composed of: a sampler chamber 2010"; a lens tube 2020" connected to the sample chamber 2010"; a plurality of control units 2030"–2034" for controlling the later-described mechanisms mounted in the sample chamber 2010" and the lens tube 2020"; a control computer 2040" for controlling these control units 2030"–2034" through a plurality of interfaces 2030*a*"–2034*a*"; a display for displaying the running state of the apparatus for the operator; and a magnetic disk device 2060" and a magnetic tape deck 2070" acting as an external memory units to be stored with the control data or program of the apparatus.

Inside of the sample chamber 2010", there is disposed a sample table 2011" such as an X-Y table, which is disposed just below the lens tube 2020" for placing a later-described pellet 2100" (2100*a*") thereon.

The sample table 2011" is driven by its drive motor 2012", and its displacement is detected by a range finding system, which is composed of a laser mirror 2013" mounted on the side of the sample table 2011" and a laser interferometer 2014" fixed on the wall of the sample chamber 2010", so that it is under the closed loop control by the control unit 2033".

Above and in the vicinity of the sample table 2011", there are arranged: a charged particle detector 2015" for detecting charged particles such as a secondary electrons or ions generated from the pellet 2100" upon the irradiation of a later-described ion beam $I_B$; and an electron beam shower 2016", so that the secondary electron or ion image of the target portion of the pellet 2100" (2100*a*") to be processed can be observed while suitably damping the charged state of the pellet 2100", which is caused by the irradiation with the ion beam $I_B$, by the irradiation with the electron beam.

To the lower portion of the sample chamber 2010", moreover, there is connected a vacuum pump 2017" which can evacuate the insides of said simple chamber 2010" and the lens tube 2020" connected to the former to a desired vacuum level.

On the other hand, the lens tube 2020" is equipped at its top with an ion source 2021" and a lead-out electrode 2022" so that the ion beam $I_B$ of ions of metal such as gallium may be emitted toward the pellet 2100" placed on the sample table 2100".

In the lens tube 2020" and in the passage of the ion beam $I_B$ extending from the ion source 2021" to the sample table 11", there is disposed an ion optical system which is composed of: a first aperture 2023" for shaping the sectional shape of the ion beam $I_B$; a first lens 2024" and a second lens 2025" disposed between the first apparatus 2023" for controlling the passage of the ion beam $I_B$ with respect to the first aperture 2023"; a blanking electrode 2026" and a second aperture electrode 2027" for controlling the introduction of the ion beam $I_B$ into the sample chamber 2010"; and a deflecting electrode 2028" for controlling the incidence position of the ion beam $I_B$ upon the pellet 2100".

By the operation of positioning the desired portion of the pellet 2100" placed on the sample table 2011" on the axis of the aforementioned ion optical system by suitably displacing the sample table 2011", and by the control of the incidence position of the ion beam $I_B$ by the deflecting electrode 2028", the later-described wiring corrections of the desired portion of the pellet 2100" are accompanied by the irradiation with the ion beam $I_B$ focused to a desired spot diameter.

On the other hand, one example of the main frame computer developing step by the wiring corrections of the present embodiment will be described with reference to FIG. 70N.

First of all, LSIs such as a plurality of memory elements or logic elements to be built in the system constituting the not-shown target main frame computer are formed altogether in a not-shown semiconductor wafer by a well-known process, and the individual LSI in the wafer state are formed (at Step 3001") with not-shown solder bumps which function as connection electrodes to be constructed with the external wiring lines when they are mounted.

After this, the plural LSIs in the wafer state are individually split (at Step 3002") into the pellets 2100" by the well-known dicing technique.

Moreover, the pellets 2100" of identical sort are assorted (at Step 3003") into first and second groups, and the pellets 2100" of the first group are assembled into the system whereas the pellets 2100" of the second group are stored (at Step 3004").

Then, the system assembled with the pellets 2100" of the first group is actually operated to test (at Step 3005") the functions of the pellets 2100" of the first group assembled to decide (at Step 3006") whether or not there are functional defects of the individual pellets 2100" assembled in the system due to the design or production process and whether or not it is necessary to alter the specifications in the logic operations.

If NO, i.e., without any functional defect or the specification alteration, the routine advances to the system operations (at Step 3007").

If YES, on the contrary, namely, in case, at the step 3006", the functional defect is found or it is necessary to alter the specification, the wiring correction information for corresponding to the corrections of the functional defect and the specification alteration and the diagnostic data for confirming the operations after the wiring corrections are determined (at Step 3008") by the well-known automatic designing technique.

On the basis of the aforementioned wiring correction information, the stored pellets 2100" of the second group corresponding to the defective pellets 2100" of the first group are subjected to a series of wiring correcting operations (at Step 3009"), as will be described hereinafter.

Then, the pellets 2100" of the second group having been subjected to the aforementioned wiring correction operations are probed (at Step 3010") on the basis of the diagnostic data predetermined at the foregoing Step 3008".

Then, the propriety of the test results is decided (at Step 3011"). If the test results are not OK, the routine is returned to the Step 3009" to execute the wiring connecting operations and the probing tests again.

If the test results are decided OK at the Step 3011, on the contrary, the pellets 2100" of the second group, which have been relieved from the functional defects and altered in the specification by the wiring correcting operations at the Step 3009", are assembled (at Step 3112") into the system in place of the pellets 2100" of the first group, and the steps on and after 3005" are repeated.

The relations among the FIGS. 70B(*a*)–70B(*c*) are similar to those of the subsequent FIGS. 70C–70E.

The pellet 2100" of the present embodiment is constructed to function as a memory or logic element having a multi-layered wiring structure. A semiconductor substrate 2101" formed of an element structure such as a not-shown transistor is overlaid by a plurality of a first-layer wiring structure 2102", a second-layer wiring structure 2103", a third-layer wiring structure 2104" (or second wiring structure) and a fourth-layer wiring structure 2105" (or first wiring structure), which are made of a metallic material such as aluminum (Al) for connecting those not-shown element structures to each other and exchanging electric signals with the outside. Those wiring structures 2102"–2105" are laminated such that they are insulated from one another by an interlayer insulating film 2106", an interlayer insulating film 2107" and an interlayer insulating film 2108" (or second insulating film).

The uppermost fourth-layer wiring structure 2105" functions as a power source wiring line, for example, and is made wider than the remaining lower wiring structures so as to retain a sectional area. The fourth-layer wiring structure 2105" is covered with a protective insulating film 2109" (the first insulating film) extending all over the surface of the pellet 2100" and having a larger thickness than the remaining interlayer insulating films.

Incidentally, in FIG. 70B(*a*), the uppermost wider fourth wiring structure 2105" has only its outer edge shown for convenience of illustration.

Moreover, the present embodiment corrects the error of the logic function of the pellet 2100" and alters the operating specifications by irradiating the pellet 2100" with the ion beam $T_B$ from the surface side to form the processing hole by the sputtering action thereby to expose the target portion of the third-layer wiring structure 2104" positioned below the fourth wiring structure 2105" and by connecting it with another through a later-described correcting wiring structure 2200".

One example of the wiring correcting method according to the ion beam processing method of the present embodiment will be described in the following.

First of all, as shown in FIG. 70B, a target portion just above the target third-layer wiring structure 2104" is irradiated in a surrounding manner with the ion beam $I_B$ to form a processing groove 2110 which extends through the fourth wiring structure 2105" to the lower interlayer insulating film 2108", thereby to expose the section 2105*a*" of the fourth wiring structure 2105" to the outside.

At this time, the fourth wiring structure 2105" inside of the processing groove 2110" is electrically isolated from the fourth wiring structure 2105" at the outside.

Next, in the case of the present embodiment, as shown in FIGS. 70C and 70A, the protective insulating film 2109" left in the region surrounded by the processing groove 2110" is irradiated along its outer edge with the ion beam $I_B$ so that it may be sputtered.

At this time, from the positional relation between the outer edge of the protective insulating film to be irradiated with the ion beam $I_B$ and the section 2105*a*" of the fourth wiring structure 2105" exposed to the inside of the processing groove 2100", an insulating substance 2109*a*" composing the protective insulating film 2109" is sputtered inside of the processing groove 2110" concentrically toward the section 2105*a*" of the fourth wiring structure 2105" exposed to the side so that it is efficiently re-adhered thereto.

Immediately before the fourth wiring structure 2105" shielded by the protective insulating film 2109" in the region surrounded by the processing groove 2110" is exposed, the same outer edge region is irradiated with the ion beam $I_B$. After this, the operations of shifting the irradiation position sequentially inward are repeated till the state shown in FIGS. 70D(*a*)–70D(*c*) comes.

At this time, as shown in FIGS. 70D(*b*)–70D(*c*), the section 2105*a*" of the fourth wiring structure 2105" exposed to the outer side of the inside of the processing groove 2105" is completely shielded with the effectively adhered insulating substance 2109*a*" constituting the protective insulating film 2109" which is sputtered by the irradiation with the ion beam $I_B$.

Next, as shown in FIG. 70E, both the protecting insulating film 2109" left thin in the region surrounded by the processing groove 2110" and the fourth wiring structure 2105" shielded with the former are irradiated with the ion beam $I_B$ and sputtered to expose the lower interlayer insulating film 2108" to the outside.

At this time, in the present embodiment, as shown in FIGS. 70E(*b*) and 70E(*c*), the protective insulating film 2109" left thin and the underlying fourth wiring structure 2105" are left in a wall form along the shape of the processing grooves 2110" by scanning the relatively narrow range at the center of the left portion with the ion beam $I_B$.

As a result, thanks to the shielding effect of the protective insulating film 2109" left in the wall form and the underlying fourth wiring structure 2105", the conductive structure 2105*b*" composing the fourth wiring structure 2105" sputtered is re-adhered to the upper edge portion of the protective insulating film 2109" outside of the processing groove 2100", thus eliminating the fear of the later-described short-circuiting which might otherwise be caused the re-adhesion of the conductive substance 2105*b*" to the region at the same height as that of the section 2105*a*" of the fourth-layer wiring structure 2105".

After the interlayer insulating film 2108" beneath the fourth wiring structure 2105" has been exposed, the scanning range of the ion beam $I_B$ is widened to sputter off both the protective insulating film 2109" left in the wall form and the underlying fourth wiring structure 2105".

Moreover, the interlayer insulating film 2108", which is exposed to the region surrounded by the processing groove 2110", is sputtered off by the irradiation with the ion beam $I_B$ to expose the target portion of the lower third-layer wiring structure 2104" to the outside. The insulating substance 2108*a*" composing the interlayer insulating film 2108" sputtered is adhered again to the outer wall surface of the processing groove 2110", as shown in FIGS. 70F(*a*)–70F(*c*).

After this, by the method of the chemical vapor growth using the excitations of reactive gases by the irradiation of the laser, the protective insulating film 2109" is coated with the correcting wiring mechanism 2200" which is composed of an underlying film 2201" made of a metal such as chromium and a wiring film 2202" of molybdenum or the like. Thus, the target third-layer wiring structure 2104" exposed from the protective insulating film 2109" and another not-shown wiring structure exposed by a similar method are electrically connected, as shown in FIG. 70F.

At this time, in the present embodiment, that section 2105*a*" of the fourth wiring structure 2105" above the target third-layer wiring structure 2104", which is exposed to the inside of the processing groove 2110, is completely shielded by the effective re-adhesion of the insulating substance 2109*a*" composing the protective insulating film 2109", which is caused by the sputtering of protective insulating film 2109", as has been described hereinbefore. As a result, even if the correcting wiring structure 2200" is formed, as shown in FIG. 70G, it is possible to reliably prevent the short-circuiting between the third-layer wiring structure 2104" and the correcting wiring structure 2200", and the fourth wiring structure 2105" positioned above the third-layer wiring structure 2104".

This eliminates the failure of the wiring correcting operations due to the short-circuiting between the third-layer wiring structure 2104" and the correcting wiring structure 2200", and the fourth wiring structure 2105" having no relation to the wiring corrections.

This eliminates the spare time for repeating the wiring corrections so that the time period required for the wiring correcting step 3009" for developing the main frame computer shown in FIG. 70N is shortened to shorten the time period for developing the main frame computer.

FIG. 70H is a perspective view showing one example of the LSI wiring correcting method according to the ion beam method of Embodiment 20 of the present invention, and FIGS. 70I(*a*), (*b*) and (*c*)–FIGS. 70K(*a*), (*b*) and (*c*), and FIG. 70L are explanatory views showing the wiring correcting method in the order of steps.

Here, the relations among (*a*), (*b*) and (*c*) of FIGS. 70I–FIG. 70K are similar to those of FIGS. 70B–FIGS. 70F of the foregoing Embodiment 20I.

In the case of the present Embodiment 20II, the thickness of the uppermost protective insulating film 2109" in the pellet 2100*a*" is relatively small.

In the case of the present Embodiment 20II, the procedure till the protective insulating film 2109" left in the region surrounded by the working groove 2110" is sputtered with the ion beam $I_B$ is similar to that of the foregoing embodiment. In case the protective insulating film 2109" is thin, on the other hand, the adhesion of the insulating substance 2109*a*" composing the protective insulating film 2109" to the section 2105*a*" of the fourth wiring structure 2105" exposed to the inside of the processing groove 2100" by the sputtering is so reduced as to raise a fear that the sufficient insulating effect by the shield of the insulating substance 2109*a*" cannot be expected.

In the case of the present Embodiment 20II, therefore, as shown in FIGS. 70H and 70I(*a*)–70I(*c*), the protective insulating film 2109" at the outside of the processing groove 2110" is irradiated therealong with the ion beam $I_B$ to scatter the insulating substance 1209*b*" composing the protective insulating film 2109" inside of the processing groove 2110" to bury the processing groove 2110". This processing groove may have a void therein.

This clearly eliminates the fear that the shield of the section 2105*a*" of the fourth wiring structure 2105" is insufficient due to the small thickness of the protective insulating film 2109".

After this, both the protective insulating film 2109" left thin in the region surrounded by the processing groove 2110" and the fourth wiring structure 2105" shielded by the former are irradiated with and sputtered by the ion beam $I_B$ to expose the lower interlayer insulating film 2108" to the outside.

At this time, like the case of the foregoing Embodiment 20I, as shown in FIGS. 70J(*b*) and 70J(*c*), the relatively narrow range of the center of the left portion is scanned with the ion beam $I_B$ to leave both the thin protective insulating film 2109" and the underlying fourth wiring structure 2105' in the form of a wall along the shape of the processing groove 2110".

As a result, thanks to the shielding effects of both the protective insulating film 2109" left in the wall form and the underlying fourth wiring structure 2105", it is possible to prevent the insulating substance 2109*b*", which is daringly caused to bury the inside of the processing groove 2110" by the foregoing operation, from being damaged by the sputtering. At the same time, the conductive substance 2105*b*" composing the sputtered fourth wiring structure 2105" is re-adhered to the upper side of the processing groove 2110" which is buried with the insulating substances 2109*a*" and 2109*b*" composing the protective insulating film 2109".

After this, as shown in FIGS. 70K(*a*)–70K(*c*), the interlayer insulating film 2108" exposed to the region surrounded by the processing groove 2110" is removed by the sputtering of the irradiation with the ion beam $I_B$ to the target portion of the lower third layer wiring structure 2104" to the outside.

After this, by the method similar to the case of the foregoing Embodiment 20I, the correcting wiring structure 2200" is connected with the third-layer wiring structure 2104" exposed to the region surrounded by the processing groove 2110", thus completing the wiring corrections.

Thus, in the case of the present Embodiment 20II, even if the uppermost protective insulating film 2109" is relatively thin, the section 2105*a*" of the fourth wiring structure 2105" exposed to the inside of the processing groove 2100" can be reliably shielded with the insulating substances 2109*a*" and 2109*b*" composing the protective insulating film 2109", which are sputtered by irradiating the edge portion of the protective insulating film 2109" with the ion beam $I_B$ at the region surrounded by the processing groove 2110" and at the outside region. When the target third-layer wiring structure 2104" and the correcting wiring structure 2200" are to be connected, it is possible to reliably prevent said third-layer wiring structure 2104" and the connecting wiring structure 2200", and the upper fourth wiring structure 3205" having no relation.

This eliminates the spare time for repeating the wiring corrections, which is invited due to the short-circuiting between the third-layer wiring structure 2104" and the correcting wiring structure 2200", and the fourth wiring structure 2105" having no relation to the wiring correction. Thus, the time period required for the wiring correction Step 3009" at the main frame computer developing step, as shown in FIG. 70N, is shortened to shorten the main frame computer developing time period.

Although our invention has been specifically described in connection with the embodiments thereof, it should not be limited thereto but can naturally be modified in various manners without departing from the gist thereof.

For example, the shape of the processing groove should not be limited to the closed oblong shape, as exemplified in the foregoing embodiments, but can naturally be modified into an arbitrary shape such as a C-shape or L-shape in accordance with the positional relation of the vertical wiring structure in the portion to be subjected to the wiring corrections.

By increasing the depth of the processing groove, moreover, it is arbitrary to effect the exposure of the second-layer wiring structure far below the third-layer wiring structure and the connection of the correcting wiring structure.

The effect obtainable from the present embodiments will be briefly described in the following.

According to the present invention, specifically, there is provided an ion beam processing method for processing a semiconductor integrated circuit device, which includes: first and second wiring structures laminated through a second insulating film; and a first insulating film for shielding the upper first wiring structure, in a desirable manner by a sputtering operation with an ion beam, comprising: a first step of forming a groove extending to a second insulating film, in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure. As a result, by irradiating the ion beam along the open edge of the groove formed at the first step, for example, the position of the section of the first wiring structure exposed to the inside, as seen from the position of incidence of the ion beam, is come close to the direction, in which the amount of the first insulating film sputtered by the ion beam is the most, so that the first wiring structure can be effectively shielded by the re-adhesion of the first insulating film scattered.

As a result, in case the corrected wiring structure is to be connected by the photochemical vapor growth with the lower second wiring structure exposed at the third step, for example, it is possible to prevent the short-circuiting between the first and second wiring structures and the correcting wiring structure without fail.

According to the present invention, there is provided a semiconductor integrated circuit device comprising: first and second wiring structures laminated through a second insulating film; and a first insulating film for shielding the upper first wiring structure, wherein the improvement resides in that it is subjected to wiring corrections including: a first step of forming a groove extending to a second insulating film, in a manner to surround at least a portion of a target region for the desired processing, by a sputtering operation with an ion beam, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure. As a result, since the insulating substance composing the upper first insulating film to be sputtered with the ion beam has a structure, in which it is effectively re-adhered to shield of the first wiring structure exposed to the inner periphery of the groove, it is possible to prevent the short-circuiting between the lower second wiring structure or the correcting wiring structure, which is connected from the outside with said lower second wiring structure, and the upper first wiring structure without fail.

According to the present invention, there is also provided a wiring correcting method for altering the operation specifications or correcting the functions of a semiconductor integrated circuit device, which includes: first and second wiring structures laminated through a second insulating film; and a first insulating film for shielding the upper first wiring structure, wherein the improvement comprises: a first step of forming a groove extending to a second insulating film, in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure. As a result, by irradiating the ion beam along the open edge of the groove formed at the first step, for example, the position of the section of the first wiring structure exposed to the inside, as seen from the position of incidence of the ion beam, is come close to the direction, in which the amount of the first insulating film sputtered by the ion beam is the most, so that the first wiring structure can be effectively shielded by the re-adhesion of the first insulating film scattered.

As a result, in case the corrected wiring structure is to be connected by the photochemical vapor growth with the lower second wiring structure exposed at the third step, for example, it is possible to prevent the short-circuiting between the first and second wiring structures and the correcting wiring structure without fail.

According to the present invention, furthermore, a main frame computer developing method for repeating the steps of: separating each of a plurality of the same kind of semiconductor integrated circuit device, each of which includes: first and second wiring structures laminated through a second insulating film; and a first insulating film for shielding the upper first wiring structure, into pellets and then into first and second groups; assembling the pellets belonging to the first group into a target system and storing the pellets belonging to the second group; and correcting the wirings of the pellets belonging to the second group in a manner to cope with the defective functions and the specification alterations and assembling the same in the system in case the defective functions and the specification alterations occur in the pellets belonging to the first group and assembled in the system, wherein the improvement resides in that said semiconductor integrated circuit devices are subjected to the wiring corrections after: a first step of forming a groove extending to a second insulating film, in a manner to surround at least a portion of a target region for the desired processing, to expose the section of said first wiring structure to the outside; a second step of irradiating said first insulating film in the vicinity of said grooves with the ion beam to adhere the insulating substance composing said first insulating film again to the exposed section of said first wiring structure thereby to shield the section of said second first wiring structure; and a third step of irradiating the target region surrounded by said groove with the ion beam to perform a boring operation to cut or expose said second wiring structure. As a result, in the wiring correcting operations of the plurality of semiconductor integrated circuit devices composing the main frame computer under consideration, it is possible to eliminate the defects of the wiring corrections, which might otherwise be caused by the short-circuiting between the lower second wiring structure aiming at constituting the semiconductor integrated circuit device and the correcting wiring structure to be connected with the second wiring structure and the upper first wiring structure, so that the frequency of repeating the wiring correcting operations is reduced. This makes it possible to shorten the time period for developing the main frame computer.

References for Supplementing Embodiments

Techniques for processing a chip with an FIB are explained in detail by Takahashi et al. in U.S. patent application Ser. No. 07/134,460 (filed on Dec. 17, 1987) and Japanese Patent Application No. 63-172722 (filed on Jul. 13, 1988). The contents of this U.S. patent application and of this Japanese patent application are each incorporated herein by reference in their entirety.

A chip radiation structure (a heat radiation structure in the installed state of a chip) omitted from the foregoing embodiments is explained by Kawanabe et al. in U.S. patent application Ser. No. 285,581 (filed on Dec. 6, 1988).

The details of CCB (Controlled-collapse Solder Bumps) and packages are explained by Sahara et al. in U.S. patent application Ser. No. 07/174,371 (filed on Mar. 28, 1988).

The details of the laser microscope are described on pp. 163–173 of "Semiconductor World" of May, 1989.

The focused ion beam (FIB) apparatus is described on pp. 94–99 of "Electronic Materials, extra issue of 1988" (issued on Dec. 19, 1988).

Moreover, the details of the structure of the clean room disclosed in the tail of the Embodiment 12 are described on pp. 77–108 of "Clean Room Handbook" edited by Japanese Air Cleaning Association and issued by Ohm Corp. on Jan. 15, 1989.

The contents of the above-referred-to portions of U.S. patent application Ser. No. 285,581, filed Dec. 6, 1988; U.S. patent application Ser. No. 07/174,371, filed Mar. 28, 1988; pages 163–173 of "Semiconductor World" of May 1989; pages 94–99 of "Electronic Materials"; and pages 77–108 of "Clean Room Handbook", are each incorporated herein by reference in its entirety.

What is claimed is:

1. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

- providing a semiconductor substrate having an integrated circuit formed thereon, said integrated circuit including a semiconductor element having a PN junction, said substrate further having the multilayer wiring structure formed on its surface, said wiring structure being electrically connected to said integrated circuit;
- selectively removing the second insulating film in said multilayer wiring structure, by machining with a focused ion beam, to form a contact hole which exposes a surface of the upper-level wiring in this region;
- selectively removing the upper-level wiring, the surface of which is exposed through said contact hole, by an isotropic etching process using said second insulating film as an etching mask, to form an opening region in said upper-level wiring, so as to expose a surface of the first insulating film, said opening region having a larger diameter than that of said contact hole;
- selectively removing said first insulating film, the surface of which is exposed through said contact hole and said opening region, by machining with a focused ion beam to form an opening portion which exposes a surface of said lower-level wiring; and
- forming a connecting wiring by a selective CVD method so as to extend over from the inside of said contact hole to a selective region on the surface of said second insulating film, said connecting wiring being electrically connected to said lower-level wiring the surface of which is exposed through said contact hole, said opening region and said opening portion, and said connecting wiring being spaced from said upper-level wiring.

2. A process for producing a semiconductor integrated circuit device according to claim 1, wherein said upper-level wiring is made of a material which contains aluminum as its principal component.

3. A process for producing a semiconductor integrated circuit device according to claim 1, wherein said selective CVD method is a CVD method that utilizes a laser beam, said connecting wiring being made of a material selected from the group consisting of tungsten (W), molybdenum (Mo), cadmium (Cd) and aluminum (Al).

4. A process for producing a semiconductor integrated circuit device according to claim 1, wherein said connecting wiring is provided with a buffer film as an underlying conductor, which is made of a material selected from the group consisting of chromium (Cr), molybdenum (Mo), tungsten (W) and nickel (Ni).

5. A process for producing a semiconductor integrated circuit device according to claim 1, wherein said substrate is in the form of either (1) a semiconductor wafer which has a plurality of semiconductor integrated circuits formed thereon both lengthwise and cross-wise, or (2) a semiconductor integrated circuit chip which is formed by dividing said semiconductor wafer into individual semiconductor integrated circuit chips (pellets).

6. A process for producing a semiconductor integrated circuit device according to claim 2, wherein said selective CVD method is a CVD method that utilizes a laser beam.

7. A process for producing a semiconductor integrated circuit device according to claim 6, wherein said connecting wiring is made of a material selected from the group consisting of tungsten (W), molybdenum (Mo), cadmium (Cd) and aluminum (Al).

8. A process for producing a semiconductor integrated circuit device according to claim 7, wherein said connecting wiring is provided with a buffer film as its underlying conductor which is made of a material selected from the group consisting of chromium (Cr), molybdenum (Mo), tungsten (W) and nickel (Ni).

9. A process for producing a semiconductor integrated circuit device according to claim 8, wherein said substrate is in the form of either (1) a semiconductor wafer which has a plurality of semiconductor integrated circuits formed thereon both lengthwise and cross-wise, or (2) a semiconductor integrated circuit chip which is formed by dividing said semiconductor wafer into individual semiconductor integrated circuit chips (pellets).

10. A process for producing a semiconductor integrated circuit device according to claim 1, wherein said opening portion has substantially a same diameter as that of the contact hole.

11. A process for producing a semiconductor integrated circuit device according to claim 1, wherein said air gap electrically isolates the connecting wiring from the upper-level wiring, whereby electrical shorting between the connecting wiring and the upper-level wiring is prevented.

12. A process for producing a semiconductor integrated circuit device according to claim 1, wherein said opening region has a larger diameter than that of said contact hole and of said opening portion.

13. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

- providing a semiconductor substrate having an integrated circuit formed thereon, said substrate having the multilayer wiring structure formed on its surface, said wiring structure being electrically connected to said integrated circuit;

selectively removing the second insulating film in said multilayer wiring structure, to form a contact hole;

selectively removing the upper-level wiring, exposed after selective removal of the second insulating film, to form an opening region in said upper-level wiring, said opening region having a larger diameter than that of said contact hole;

selectively removing said first insulating film, exposed after selective removal of the upper-level wiring, to form an opening portion which exposes a surface of said lower-level wiring; and forming a connecting wiring so as to extend over from the inside of said contact hole to a selective region on the surface of said second insulating film, said connecting wiring being electrically connected to said lower-level wiring the surface of which is exposed through said contact hole, said opening region and said opening portion, the connecting wiring being spaced from said upper-level wiring at the opening region.

14. A process for producing a semiconductor integrated circuit device according to claim 13, wherein the second insulating film is selectively removed by machining with a focused ion beam; wherein the first insulating film is selectively removed by machining with a focused ion beam; wherein said upper-level wiring is selectively removed by etching comprising an isotropic etching process; and wherein the connecting wiring is formed by a selective CVD method.

15. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

providing a semiconductor substrate having an integrated circuit formed thereon, said integrated circuit including a semiconductor element having a PN junction, said substrate further having the multilayer wiring structure formed on its surface, said wiring structure being electrically connected to said integrated circuit;

selectively removing the second insulating film in said multilayer wiring structure, by machining with a focused ion beam, to form a contact hole which exposes a surface of the upper-level wiring in this region;

selectively removing the upper-level wiring, the surface of which is exposed through said contact hole, by an isotropic etching process using said second insulating film as an etching mask, to form an opening region in said upper-level wiring, so as to expose a surface of the first insulating film, said opening region having a larger diameter than that of said contact hole, wherein the step of selectively removing said first insulating film is performed subsequent to the step of selectively removing the upper-level wiring by an isotropic etching process to form the opening region;

selectively removing said first insulating film, the surface of which is exposed through said contact hole and said opening region, by machining with a focused ion beam to form an opening portion which exposes a surface of said lower-level wiring; and forming a connecting wiring by a selective CVD method so as to extend over from the inside of said contact hole to a selective region on the surface of said second insulating film, said connecting wiring being electrically connected to said lower-level wiring the surface of which is exposed through said contact hole, said opening region and said opening portion, and said connecting wiring being spaced from said upper-level wiring.

16. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

providing a semiconductor substrate having an integrated circuit formed thereon, said integrated circuit including a semiconductor element having a PN junction, said substrate further having the multilayer wiring structure formed on its surface, said wiring structure being electrically connected to said integrated circuit;

selectively removing the second insulating film in said multilayer wiring structure, by machining with a focused ion beam, to form a contact hole which exposes a surface of the upper-level wiring in this region;

selectively removing the upper-level wiring, the surface of which is exposed through said contact hole, by an isotropic etching process using said second insulating film as an etching mask, to form an opening region in said upper-level wiring, so as to expose a surface of the first insulating film, said opening region having a larger diameter than that of said contact hole;

selectively removing said first insulating film, the surface of which is exposed through said contact hole and said opening region, by machining with a focused ion beam to form an opening portion which exposes a surface of said lower-level wiring, wherein said opening portion has substantially a same diameter as that of the contact hole; and forming a connecting wiring by a selective CVD method so as to extend over from the inside of said contact hole to a selective region on the surface of said second insulating film, said connecting wiring being electrically connected to said lower-level wiring the surface of which is exposed through said contact hole, said opening region and said opening portion, and said connecting wiring being spaced from said upper-level wiring, wherein the connecting wiring is formed so as to contact edges of the first and second insulating films respectively providing the opening region and the contact hole, and to be spaced from the edges of the upper-level wiring forming said opening region so as to provide an air gap between said connecting wiring and said edges of the upper-level wiring forming said opening region.

17. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

providing a semiconductor substrate having an integrated circuit formed thereon, said integrated circuit including a semiconductor element having a PN junction, said substrate further having the multilayer wiring structure formed on its surface, said wiring structure being electrically connected to said integrated circuit;

selectively removing the second insulating film in said multilayer wiring structure, by machining with a focused ion beam, to form a contact hole which exposes a surface of the upper-level wiring in this region;

selectively removing the upper-level wiring, the surface of which is exposed through said contact hole, by an isotropic etching process using said second insulating film as an etching mask, to form an opening region in said upper-level wiring, so as to expose a surface of the first insulating film, said opening region having a larger diameter than that of said contact hole;

selectively removing said first insulating film, the surface of which is exposed through said contact hole and said opening region, by machining with a focused ion beam to form an opening portion which exposes a surface of said lower-level wiring; and forming a connecting wiring by a selective CVD method so as to extend over from the inside of said contact hole to a selective region on the surface of said second insulating film, said connecting wiring being electrically connected to said lower-level wiring the surface of which is exposed through said contact hole, said opening region and said opening portion, and said connecting wiring being spaced from said upper-level wiring, wherein the connecting wiring is formed so as to be spaced from the edges of the upper-level wiring forming said opening region such that an air gap is provided between said connecting wiring and edges of the upper-level wiring forming said opening region.

18. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

providing a semiconductor substrate having an integrated circuit formed thereon, said integrated circuit including a semiconductor element having a PN junction, said substrate further having the multilayer wiring structure formed on its surface, said wiring structure being electrically connected to said integrated circuit;

selectively removing the second insulating film in said multilayer wiring structure, by machining with a focused ion beam, to form a contact hole which exposes a surface of the upper-level wiring in this region;

selectively removing the upper-level wiring, the surface of which is exposed through said contact hole, by an isotropic etching process using said second insulating film as an etching mask, to form an opening region in said upper-level wiring, so as to expose a surface of the first insulating film, said opening region having a larger diameter than that of said contact hole, wherein said isotropic etching process is a wet etching process, using a mixed solution, comprising phosphoric acid, glacial acetic acid and water, as an etchant;

selectively removing said first insulating film, the surface of which is exposed through said contact hole and said opening region, by machining with a focused ion beam to form an opening portion which exposes a surface of said lower-level wiring; and forming a connecting wiring by a selective CVD method so as to extend over from the inside of said contact hole to a selective region on the surface of said second insulating film, said connecting wiring being electrically connected to said lower-level wiring the surface of which is exposed through said contact hole, said opening region and said opening portion, and said connecting wiring being spaced from said upper-level wiring.

19. A process for producing a semiconductor integrated circuit device having a multilayer wiring structure in which a first insulating film is interposed between an upper-level wiring and a lower-level wiring and the surface of said upper-level wiring has thereon a second insulating film, said method comprising the steps of:

providing a semiconductor substrate having an integrated circuit formed thereon, said substrate having the multilayer wiring structure formed on its surface, said wiring structure being electrically connected to said integrated circuit;

selectively removing the second insulating film in said multilayer wiring structure, to form a contact hole;

selectively removing the upper-level wiring, exposed after selective removal of the second insulating film, to form an opening region in said upper-level wiring, said opening region having a larger diameter than that of said contact hole;

selectively removing said first insulating film, exposed after selective removal of the upper-level wiring, to form an opening portion which exposes a surface of said lower-level wiring; and forming a connecting wiring so as to extend over from the inside of said contact hole to a selective region on the surface of said second insulating film, said connecting wiring being electrically connected to said lower-level wiring the surface of which is exposed through said contact hole, said opening region and said opening portion, the connecting wiring being spaced from the upper-level wiring at the opening region, wherein the connecting wiring is spaced from the upper-level wiring by an air gap therebetween.

* * * * *